US011885034B2

(12) United States Patent
Mills

(10) Patent No.: US 11,885,034 B2
(45) **Date of Patent: *Jan. 30, 2024**

(54) ELECTRICAL POWER GENERATION SYSTEMS AND METHODS REGARDING SAME

(71) Applicant: BRILLIANT LIGHT POWER, INC., Cranbury, NJ (US)

(72) Inventor: Randell L. Mills, Cranbury, NJ (US)

(73) Assignee: BRILLIANT LIGHT POWER, INC., Cranbury, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/546,478

(22) Filed: Dec. 9, 2021

(65) Prior Publication Data

US 2022/0098744 A1 Mar. 31, 2022

Related U.S. Application Data

(63) Continuation of application No. 16/567,689, filed on Sep. 11, 2019, now Pat. No. 11,230,776, which is a (Continued)

(51) Int. Cl.

*C25B 13/04* (2021.01)
*H02S 40/22* (2014.01)

(Continued)

(52) U.S. Cl.

CPC ................ *C25B 13/04* (2013.01); *C25B 1/04* (2013.01); *H01L 31/0725* (2013.01);

(Continued)

(58) Field of Classification Search

CPC . C25B 13/04; C25B 1/04; H02S 40/22; H02S 40/32; H02S 40/38; H02S 40/42;

(Continued)

(56) References Cited

U.S. PATENT DOCUMENTS

| | | | |
|---|---|---|---|
| 3,820,767 | A | 6/1974 | Metz |
| 4,182,650 | A | 1/1980 | Fischer |

(Continued)

FOREIGN PATENT DOCUMENTS

| | | | |
|---|---|---|---|
| JP | H04 62396 | A | 2/1992 |
| WO | 20110116236 | A2 | 9/2011 |

(Continued)

OTHER PUBLICATIONS

Suede, M., "Blacklight Power Announces Continuous Power Generation," Thunderbolts info, Apr. 1, 2014, pp. 1-3.

(Continued)

*Primary Examiner* — Xiuyu Tai
(74) *Attorney, Agent, or Firm* — Greenberg Traurig, LLP

(57) ABSTRACT

A solid or liquid fuel to plasma to electricity power source that provides at least one of electrical and thermal power comprising (i) at least one reaction cell for the catalysis of atomic hydrogen to form hydrinos, (ii) a chemical fuel mixture comprising at least two components chosen from: a source of $H_2O$ catalyst or $H_2O$ catalyst; a source of atomic hydrogen or atomic hydrogen; reactants to form the source of $H_2O$ catalyst or $H_2O$ catalyst and a source of atomic hydrogen or atomic hydrogen; one or more reactants to initiate the catalysis of atomic hydrogen; and a material to cause the fuel to be highly conductive, (iii) a fuel injection system such as a railgun shot injector, (iv) at least one set of electrodes that confine the fuel and an electrical power source that provides repetitive short bursts of low-voltage, high-current electrical energy to initiate rapid kinetics of the hydrino reaction and an energy gain due to forming hydrinos to form a brilliant-light emitting plasma, (v) a product recovery system such as at least one of an augmented plasma railgun recovery system and a gravity recovery system, (vi) a fuel pelletizer or shot maker comprising a smelter, a source (Continued)

or hydrogen and a source of $H_2O$, a dripper and a water bath to form fuel pellets or shot, and an agitator to feed shot into the injector, and (vii) a power converter capable of converting the high-power light output of the cell into electricity such as a concentrated solar power device comprising a plurality of ultraviolet (UV) photoelectric cells or a plurality of photoelectric cells, and a UV window.

4 Claims, 66 Drawing Sheets

Related U.S. Application Data continuation of application No. 15/314,196, filed as application No. PCT/US2015/033165 on May 29, 2015, now Pat. No. 10,443,139.

(60) Provisional application No. 62/165,340, filed on May 22, 2015, provisional application No. 62/159,230, filed on May 9, 2015, provisional application No. 62/149,501, filed on Apr. 17, 2015, provisional application No. 62/141,079, filed on Mar. 31, 2015, provisional application No. 62/113,211, filed on Feb. 6, 2015, provisional application No. 62/092,230, filed on Dec. 15, 2014, provisional application No. 62/087,234, filed on Dec. 4, 2014, provisional application No. 62/083,029, filed on Nov. 21, 2014, provisional application No. 62/068,592, filed on Oct. 24, 2014, provisional application No. 62/058,844, filed on Oct. 2, 2014, provisional application No. 62/041,026, filed on Aug. 22, 2014, provisional application No. 62/037,152, filed on Aug. 14, 2014, provisional application No. 62/026,698, filed on Jul. 20, 2014, provisional application No. 62/023,586, filed on Jul. 11, 2014, provisional application No. 62/021,699, filed on Jul. 7, 2014, provisional application No. 62/016,540, filed on Jun. 24, 2014, provisional application No. 62/012,193, filed on Jun. 13, 2014, provisional application No. 62/004,883, filed on May 29, 2014.

(51) Int. Cl.

| | |
|---|---|
| ***H02S 40/32*** | (2014.01) |
| ***H02S 40/38*** | (2014.01) |
| ***H02S 40/42*** | (2014.01) |
| ***C25B 1/04*** | (2021.01) |
| ***H01L 31/0725*** | (2012.01) |
| ***H01L 31/0735*** | (2012.01) |
| ***H05H 1/00*** | (2006.01) |

(52) U.S. Cl.

CPC .......... *H01L 31/0735* (2013.01); *H02S 40/22* (2014.12); *H02S 40/32* (2014.12); *H02S 40/38* (2014.12); *H02S 40/42* (2014.12); *H05H 1/01* (2021.05); *H05H 2277/13* (2013.01)

(58) Field of Classification Search

CPC .. H05H 1/01; H05H 2277/13; H01L 31/0725; H01L 31/0735; C23C 16/27; C23C 16/277; C01B 3/00; G21B 1/00; G21B 3/00; G21B 1/15; G21D 7/00; G21K 1/00; B01J 19/088; B01J 2219/0894; B01J 2219/0875; B01J 2219/0892; Y02E 30/00; Y02E 60/32; Y02E 30/10; Y02E 70/30; Y02E 10/544; Y02E 10/549; Y02E 60/36; Y02E 10/52; Y02E 60/10; Y02E 60/50; H01M 8/22; H01M 8/065; H01M 10/399; H01M 4/9016; H01M 8/18; H01M 2250/402; H01M 4/94; H02N 11/008; Y02B 90/10

See application file for complete search history.

(56) References Cited

U.S. PATENT DOCUMENTS

| | | | |
|---|---|---|---|
| 4,603,043 | A | 7/1986 | Douglas et al. |
| 7,559,494 | B1 | 7/2009 | Yadav et al. |
| 2002/0150694 | A1 | 10/2002 | Ye et al. |
| 2004/0237499 | A1 | 12/2004 | Yogev et al. |
| 2004/0247522 | A1 | 12/2004 | Mills |
| 2005/0031870 | A1 | 2/2005 | Liu et al. |
| 2007/0041897 | A1 | 2/2007 | Eickhoff et al. |
| 2009/0196801 | A1 | 8/2009 | Mills |
| 2013/0084474 | A1 | 4/2013 | Mills |
| 2017/0104426 | A1 | 4/2017 | Mills |

FOREIGN PATENT DOCUMENTS

| | | | |
|---|---|---|---|
| WO | 2012138576 | A1 | 10/2012 |
| WO | 2015075566 | A1 | 5/2015 |

OTHER PUBLICATIONS

Wang, B., "Move over Rossi, Blacklight Power is claiming megawatts from their super-controversal hydrino process and devices," Internet Citation, Jan. 14, 2014, pp. 1-7.

International Search Report for corresponding PCT Patent Application No. PCT/US2015/0331665, dated Sep. 14, 2015, (3 pages).

Barkhordarian et al. "Catalytic Mechanism of Transition-Metal Compounds on Mg Hydrogen Sorption Reaction," J. Phys. Chem. B, vol. 110, (2006): 11020-11024.

Santjojo et al., "Ellipsometric characterization on multi-layered thin film systems during hydrogenation," Materials Transactions, vol. 48, No. 6 (2007): 1380-1386.

Watkins et al. "Reaction of Alkali Metal hydrides with Zinc Halides with Zinc Halides in Tetrahydrofuran. A Convenient and Economical Preparation of Zinc Hydride," Inorganic Chemistry, vol. 13, No. 10, (1974): 2350-2354.

Wu et al. "Effect of carbon/noncarbon addition on hydrogen storage behaviors of magnesium hydride," Journal of Alloys and Compounds, 414 (2006) 259-264.

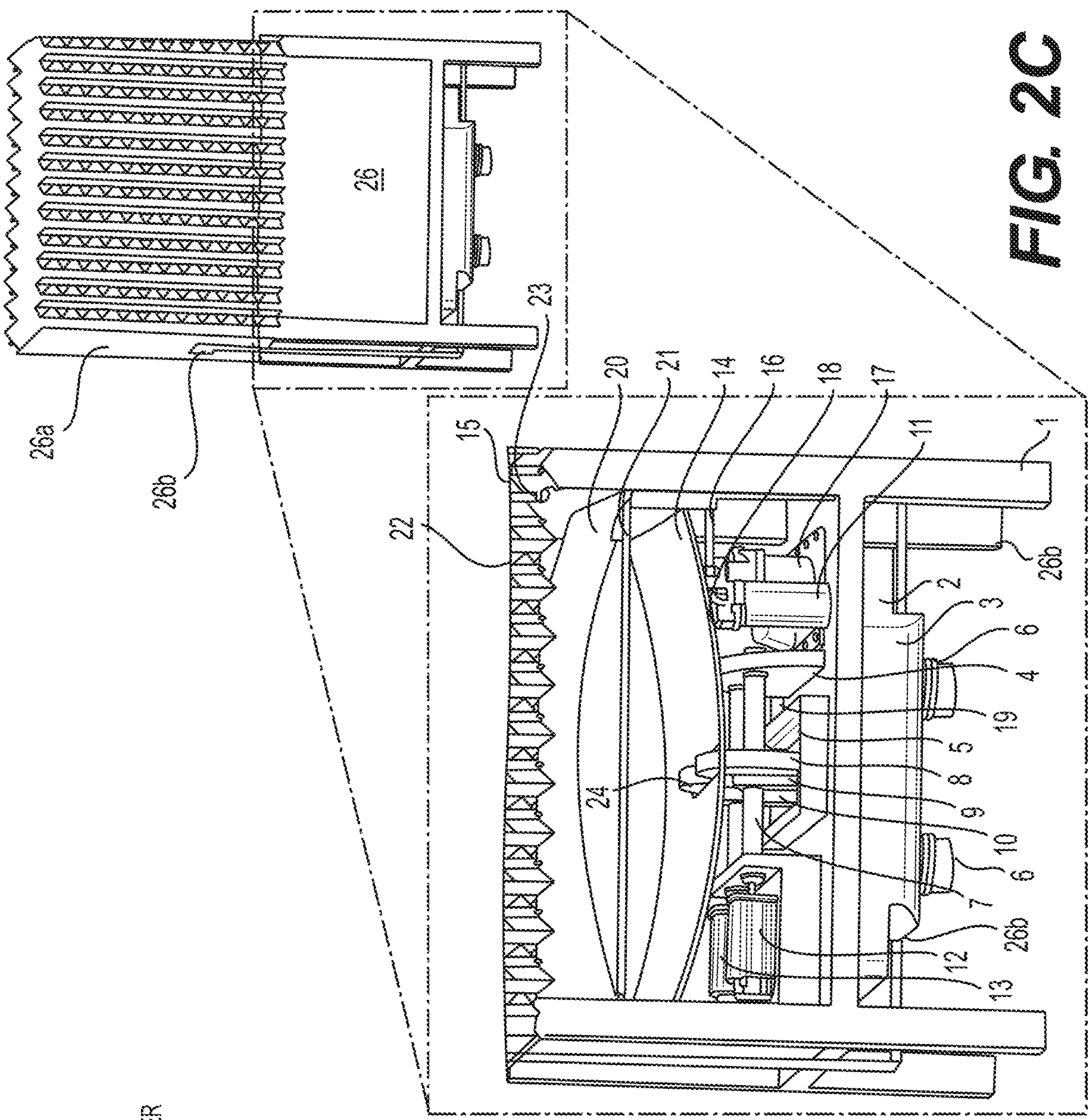

FIG. 2C

1. STRUCTURAL SUPPORT
2. SOURCE OF ELECTRICAL POWER
3. OUTPUT POWER CONTROLLER/CONDITIONER
4. BEARING SUPPORT FOR ROLLER SHAFT
5. TROUGH
6. OUTPUT POWER TERMINAL
7. ROLLER SHAFT
8. ROLLER ELECTRODE
9. NEGATIVE ELECTRODE BUS BAR
10. POSITIVE ELECTRODE BUS BAR
11. WATER RESERVOIR
12. ROLLER MOTOR 1
13. ROLLER MOTOR 2
14. PARABOLIC MIRROR
15. PHOTOVOLTAIC PANEL
16. JET WATER LINE
17. WATER EJECTION PUMP
18. WATER SUCKING PUMP
19. WATER SUCKING LINE
20. WINDOW
21. RINSING LINE WITH JETS
22. MIRROR FASTENER
23. SEMI-TRANSPARENT MIRROR
24. SCRAPER AND COLLECTION AREA
26. CELL
26a. OPTICAL DISTRIBUTION AND PHOTOVOLTAIC CONVERSION SYSTEM
26b. PV BUS BAR

1. STRUCTURAL SUPPORT
2. SOURCE OF ELECTRICAL POWER
3. OUTPUT POWER CONTROLLER/CONDITIONER
4. BEARING SUPPORT FOR ROLLER SHAFT
5. TROUGH
6. OUTPUT POWER TERMINAL
7. ROLLER SHAFT
8. ROLLER ELECTRODE
9. NEGATIVE ELECTRODE BUS BAR
10. POSITIVE ELECTRODE BUS BAR
11. WATER RESERVOIR
12. ROLLER MOTOR 1
13. ROLLER MOTOR 2
14. PARABOLIC MIRROR
15. PHOTOVOLTAIC PANEL
16. JET WATER LINE
17. WATER EJECTION PUMP
18. WATER SUCKING PUMP
19. WATER SUCKING LINE
20. WINDOW
21. RINSING LINE WITH JETS
22. MIRROR FASTENER
23. SEMI-TRANSPARENT MIRROR
24. SCRAPER AND COLLECTION AREA
26. CELL
26a. OPTICAL DISTRIBUTION AND PHOTOVOLTAIC CONVERSION SYSTEM
26b. PV BUS BAR
27. BATTERY
28. STARTER CIRCUIT
29. ARGON SUPPLY
30. ARGON DISTRIBUTION
31. COOLING SYSTEM
32. DC POWER SUPPLY
33. DC REGENERATOR
34. DC POWER STORAGE
35. DC/AC POWER INVERTER
36. VFD DRIVE
37. GAS PUMP
38. GAS PUMP RETURN LINE

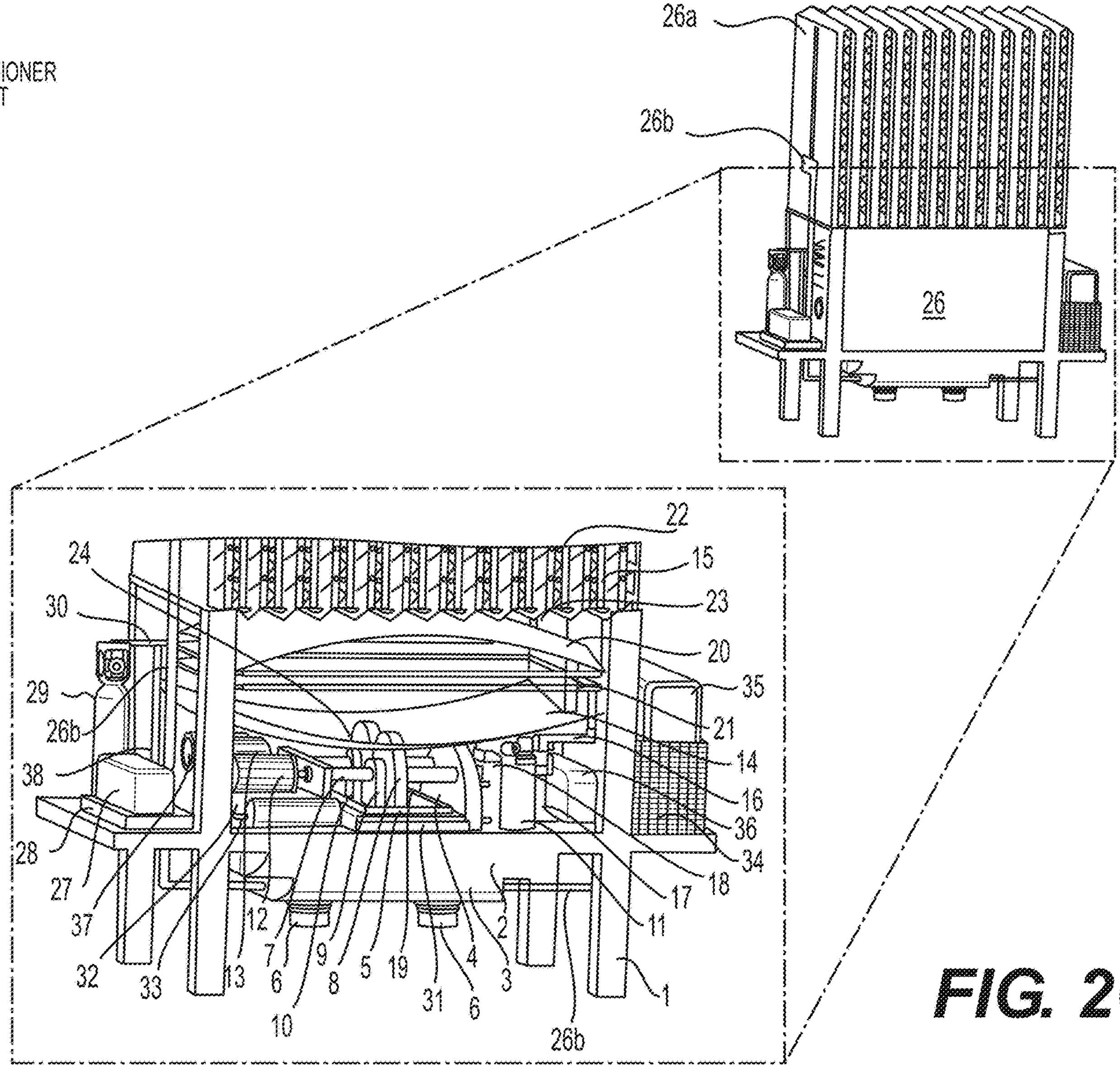

FIG. 2C1

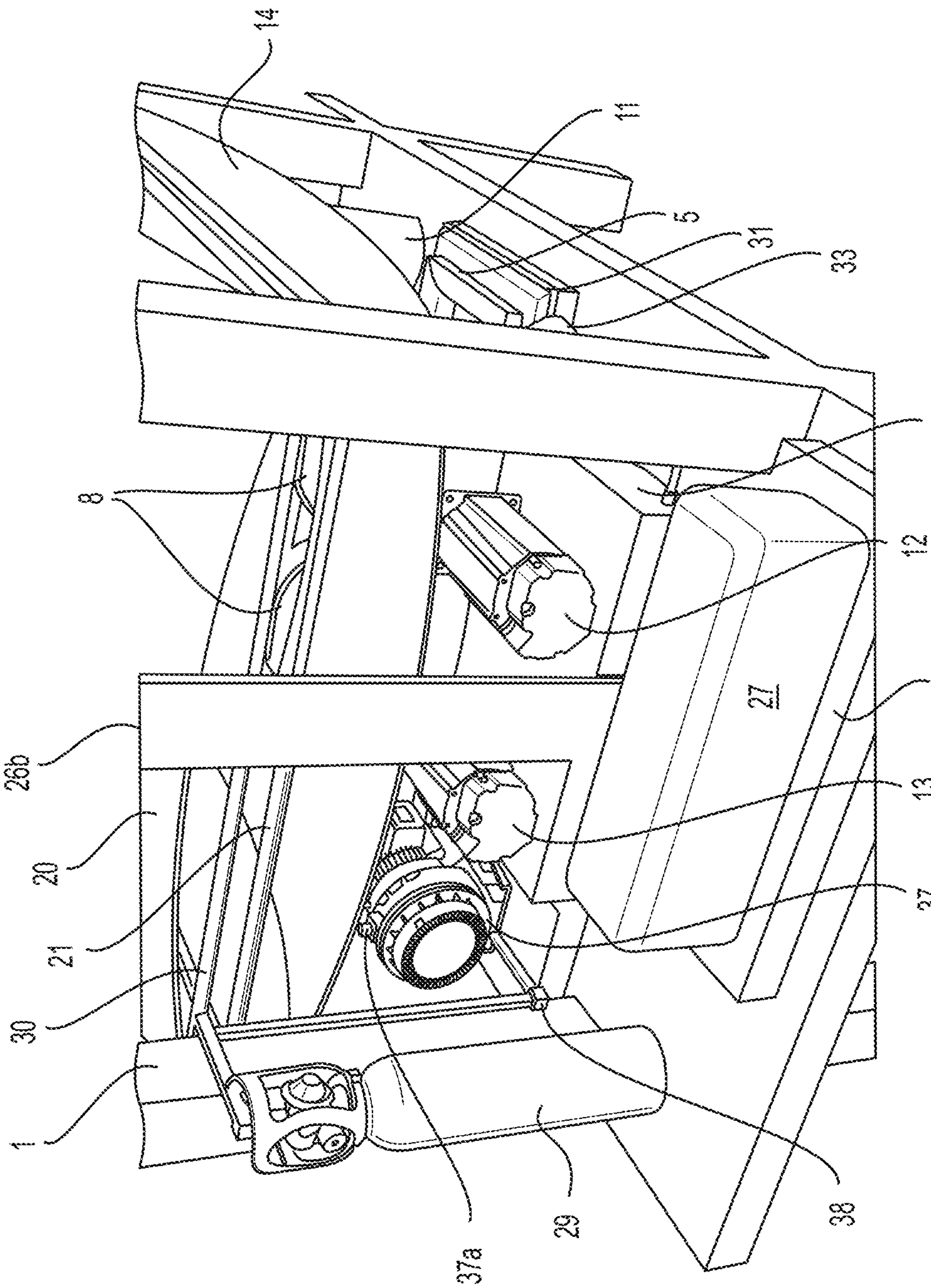

FIG. 2C2

1. STRUCTURAL SUPPORT
2. SOURCE OF ELECTRICAL POWER
3. OUTPUT POWER CONTROLLER/CONDITIONER
4. BEARING SUPPORT FOR ROLLER SHAFT
5. TROUGH
6. OUTPUT POWER TERMINAL
7. ROLLER SHAFT
8. ROLLER ELECTRODE
9. NEGATIVE ELECTRODE BUS BAR
10. POSITIVE ELECTRODE BUS BAR
11. WATER RESERVOIR
12. ROLLER MOTOR 1
13. ROLLER MOTOR 2
14. PARABOLIC MIRROR
15. PHOTOVOLTAIC PANEL
16. JET WATER LINE
17. WATER EJECTION PUMP
18. WATER SUCKING PUMP
19. WATER SUCKING LINE
20. WINDOW
21. RINSING LINE WITH JETS
22. MIRROR FASTENER
23. SEMI-TRANSPARENT MIRROR
24. SCRAPER AND COLLECTION AREA
26. CELL
26a. OPTICAL DISTRIBUTION AND PHOT OVOLTAIC CONVERSION SYSTEM
26b. PV BUS BAR
27. BATTERY
28. STARTER CIRCUIT
29. ARGON SUPPLY
30. ARGON DISTRIBUTION
31. COOLING SYSTEM
32. DC POWER SUPPLY
33. DC REGENERATOR
34. DC POWER STORAGE
35. DC/AC POWER INVERTER
36. VFD DRIVE
37. GAS PUMP
37a. GAS PUMP INLET
38. GAS PUMP RETURN LINE

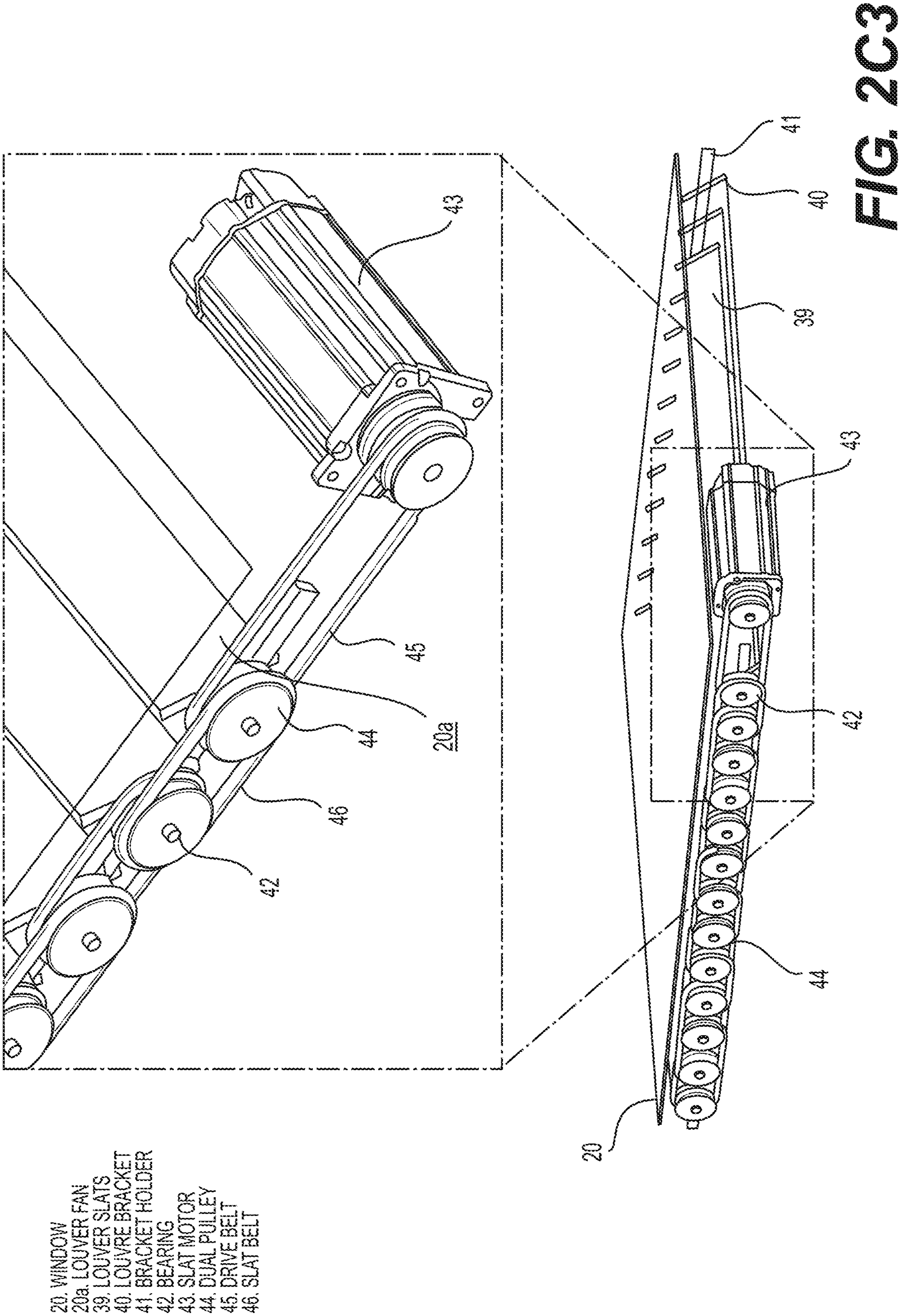
FIG. 2C3
20. WINDOW
20a. LOUVER FAN
39. LOUVER SLATS
40. LOUVRE BRACKET
41. BRACKET HOLDER
42. BEARING
43. SLAT MOTOR
44. DUAL PULLEY
45. DRIVE BELT
46. SLAT BELT 1. STRUCTURAL SUPPORT
2. SOURCE OF ELECT RICAL POWER
3. OUTPUT POWER CONTROLLER/CONDITIONER
4. BEARING SUPPORT FOR ROLLER SHAFT
4a. BEARING
5. TROUGH
7. ROLLER SHAFT
12. ROLLER MOTOR 1
13. ROLLER MOTOR 2
19. WATER SUCKING LINE
25. CHUTE
27. APPLICATOR WHEEL
28. APPLICATOR FLAPS
29. APPLICATOR SHAFT
30. APPLICATOR WHEEL MOTOR 1. STRUCTURAL SUPPORT
5. TROUGH
7. ROLLER SHAFT
8. ROLLER ELECTRODE
9. NEGATIVE ELECTRODE BUS BAR
10. POSITIVE ELECTRODE BUS BAR
12. ROLLER MOTOR 1
13. ROLLER MOTOR 2
40. TILTED MIRROR
41. PLANE MIRROR 1. STRUCTURAL SUPPORT
4. BEARING SUPPORT FOR ROLLER SHAFT
7. ROLLER SHAFT
8. ROLLER ELECTRODE
11. WATER RESERVOIR
12. ROLLER MOTOR 1
13. ROLLER MOTOR 2
14. PARABOLIC MIRROR
16. JET WATER LINE
17. WATER EJECTION PUMP
18. WATER SUCKING PUMP
19. WATER SUCKING LINE
20b. ELECTRODE HOUSING
21. RINSING LINE WITH JETS

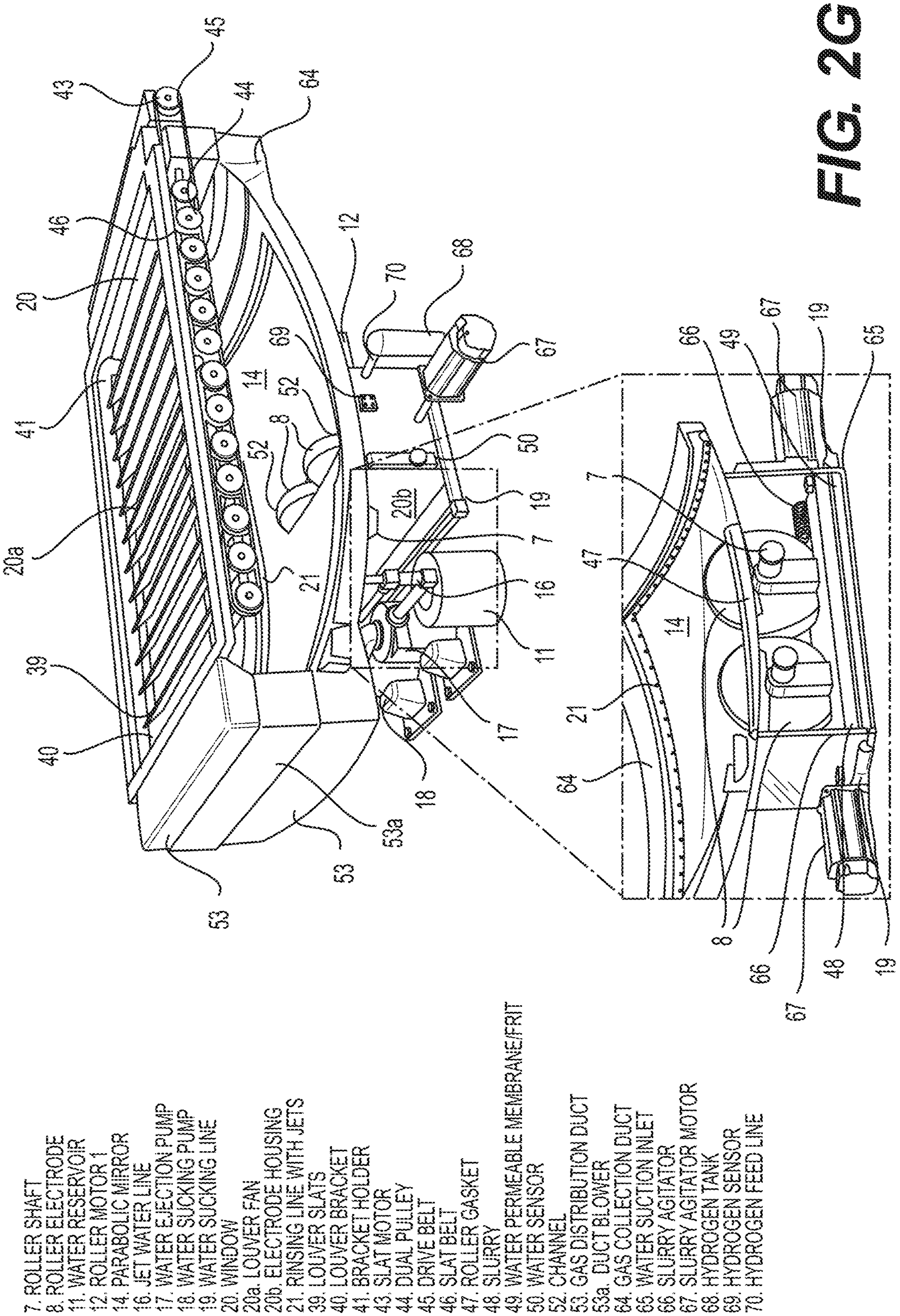

FIG. 2G1

7. ROLLER SHAFT
8. ROLLER ELECTRODE
11. WATER RESERVOIR
12. ROLLER MOTOR 1
14. PARABOLIC MIRROR
16. JET WATER LINE
17. WATER EJECTION PUMP
18. WATER SUCKING PUMP
19. WATER SUCKING LINE
20. WINDOW
20a. LOUVER FAN
20b. ELECTRODE HOUSING
21. RINSING LINE WITH JETS
39. LOUVER SLATS
40. LOUVER BRACKET
41. BRACKET HOLDER
43. SLAT MOTOR
44. DUAL PULLEY
45. DRIVE BELT
46. SLAT BELT
47. ROLLER GASKET
48. SLURRY
49. WATER PERMEABLE MEMBRANE/FRIT
50. WATER SENSOR
52. CHANNEL
53. GAS DISTRIBUTION DUCT
53a. DUCT BLOWER
64. GAS COLLECTION DUCT
65. WATER SUCTION INLET
66. SLURRY AGITATOR
67. SLURRY AGITATOR MOTOR
68. HYDROGEN TANK
69. HYDROGEN SENSOR
70. HYDROGEN FEED LINE

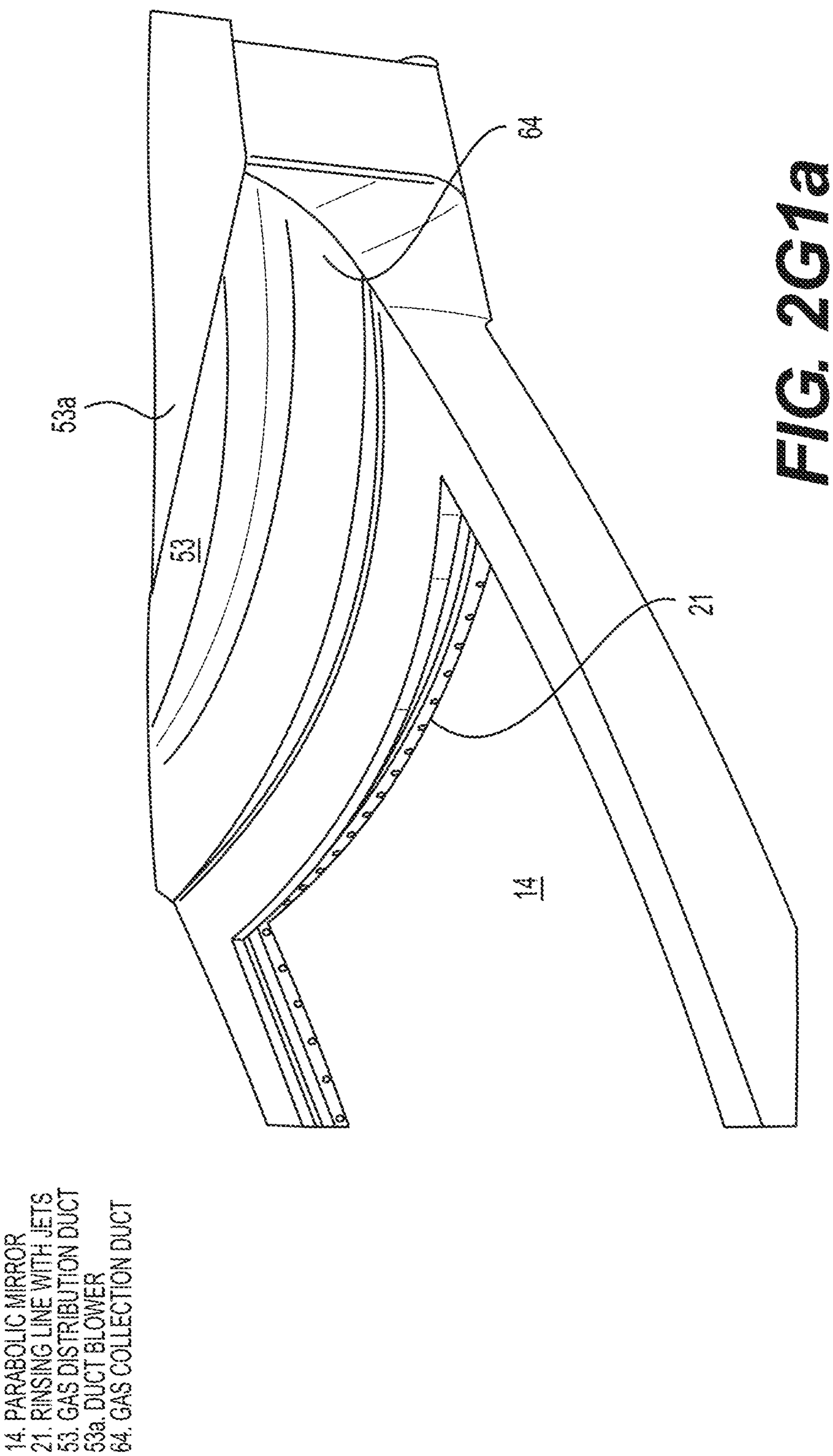
FIG. 2G1a
14. PARABOLIC MIRROR
21. RINSING LINE WITH JETS
53. GAS DISTRIBUTION DUCT
53a. DUCT BLOWER
64. GAS COLLECTION DUCT 7. ROLLER SHAFT
8. ROLLER ELECTRODE
11. WATER RESERVOIR
12. ROLLER MOTOR 1
14. PARABOLIC MIRROR
16. JET WATER LINE
17. WATER EJECTION PUMP
18. WATER SUCKING PUMP
19. WATER SUCKING LINE
20. WINDOW
20b. ELECTRODE HOUSING
20c. PERFORATED WINDOW
21. RINSING LINE WITH JETS
47. ROLLER GASKET
48. SLURRY
49. WATER PERMEABLE MEMBRANE/FRIT
50. WATER SENSOR
52. CHANNEL
53. GAS DISTRIBUTION DUCT
53a. DUCT BLOWER
64. GAS COLLECTION DUCT
65. WATER SUCTION INLET
66. SLURRY AGITATOR
67. SLURRY AGITATOR MOTOR
68. HYDROGEN TANK
69. HYDROGEN SENSOR
70. HYDROGEN FEED LINE

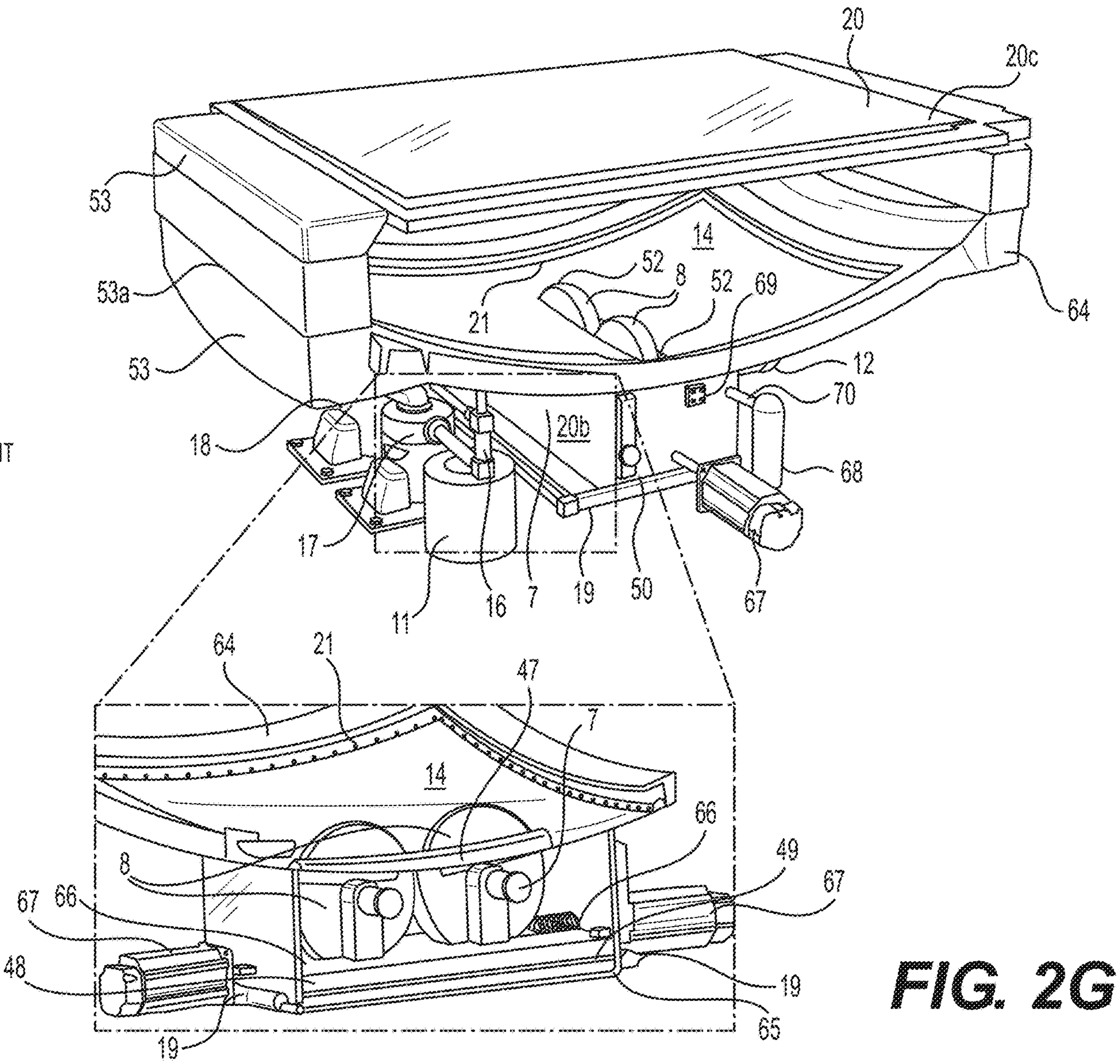

FIG. 2G1b

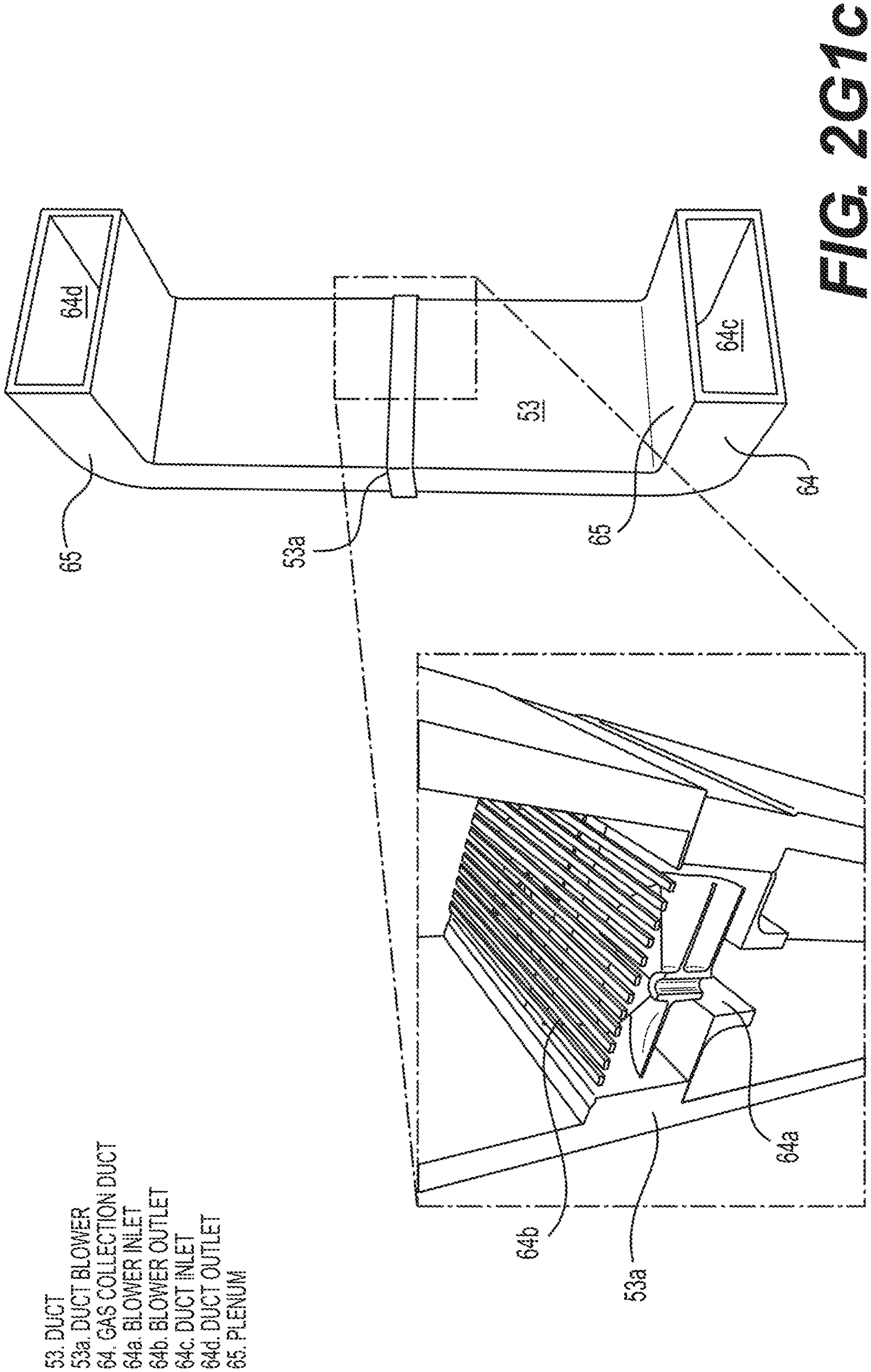
FIG. 2G1c
53. DUCT
53a. DUCT BLOWER
64. GAS COLLECTION DUCT
64a. BLOWER INLET
64b. BLOWER OUTLET
64c. DUCT INLET
64d. DUCT OUTLET
65. PLENUM

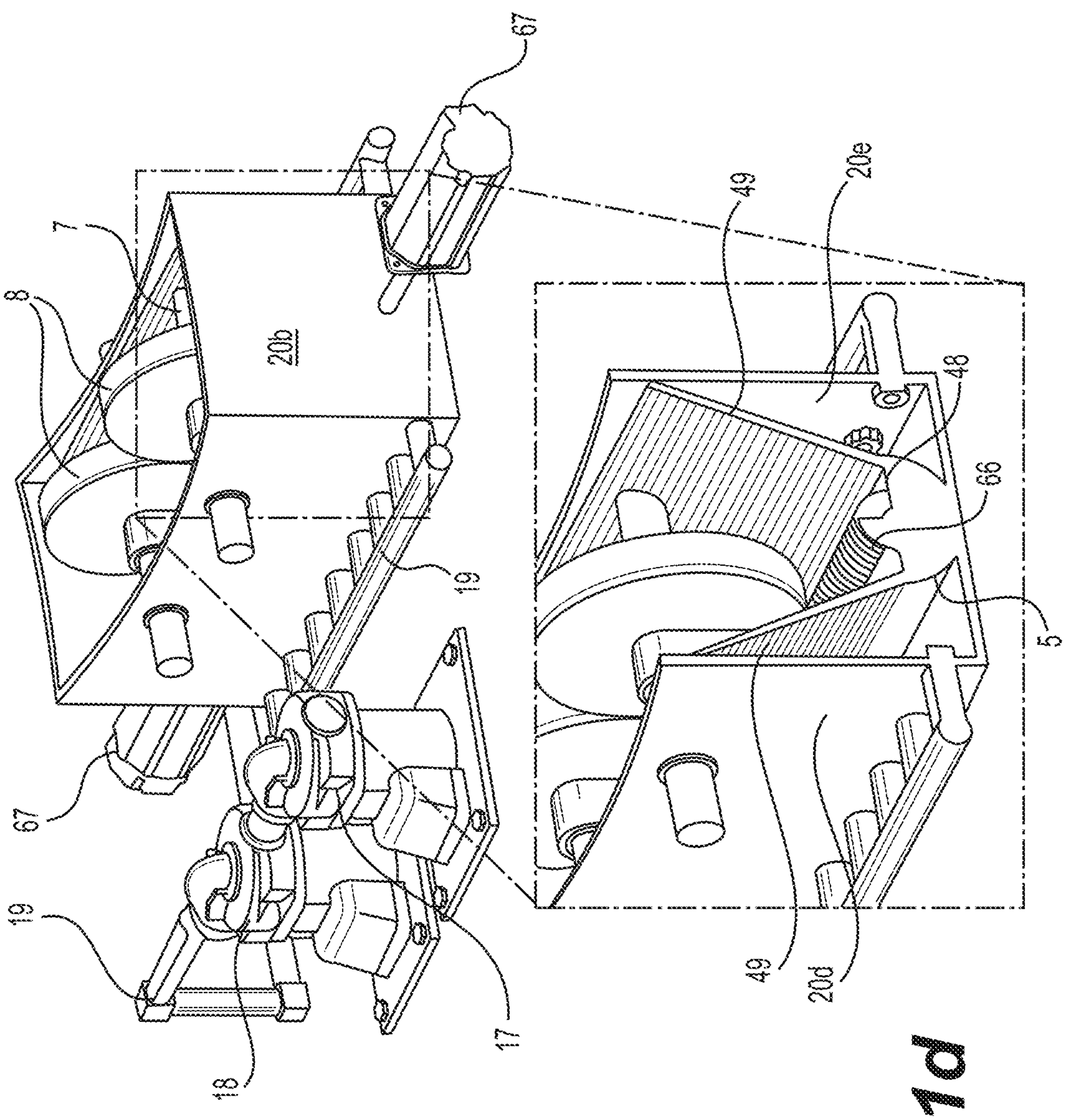
FIG. 2G1d
5. TROUGH
7. ROLLER SHAFT
8. ROLLER ELECTRODE
17. WATER EJECTION PUMP
18. WATER SUCKING PUMP
19. WATER SUCKING LINE
20b. ELECTRODE HOUSING
20d. EXTERNAL HOUSING WALLS
20e. CHAMBER
48. SLURRY
49. WATER PERMEABLE MEMBRANE/FRIT
66. SLURRY AGITATOR
67. SLURRY AGITATOR MOTOR

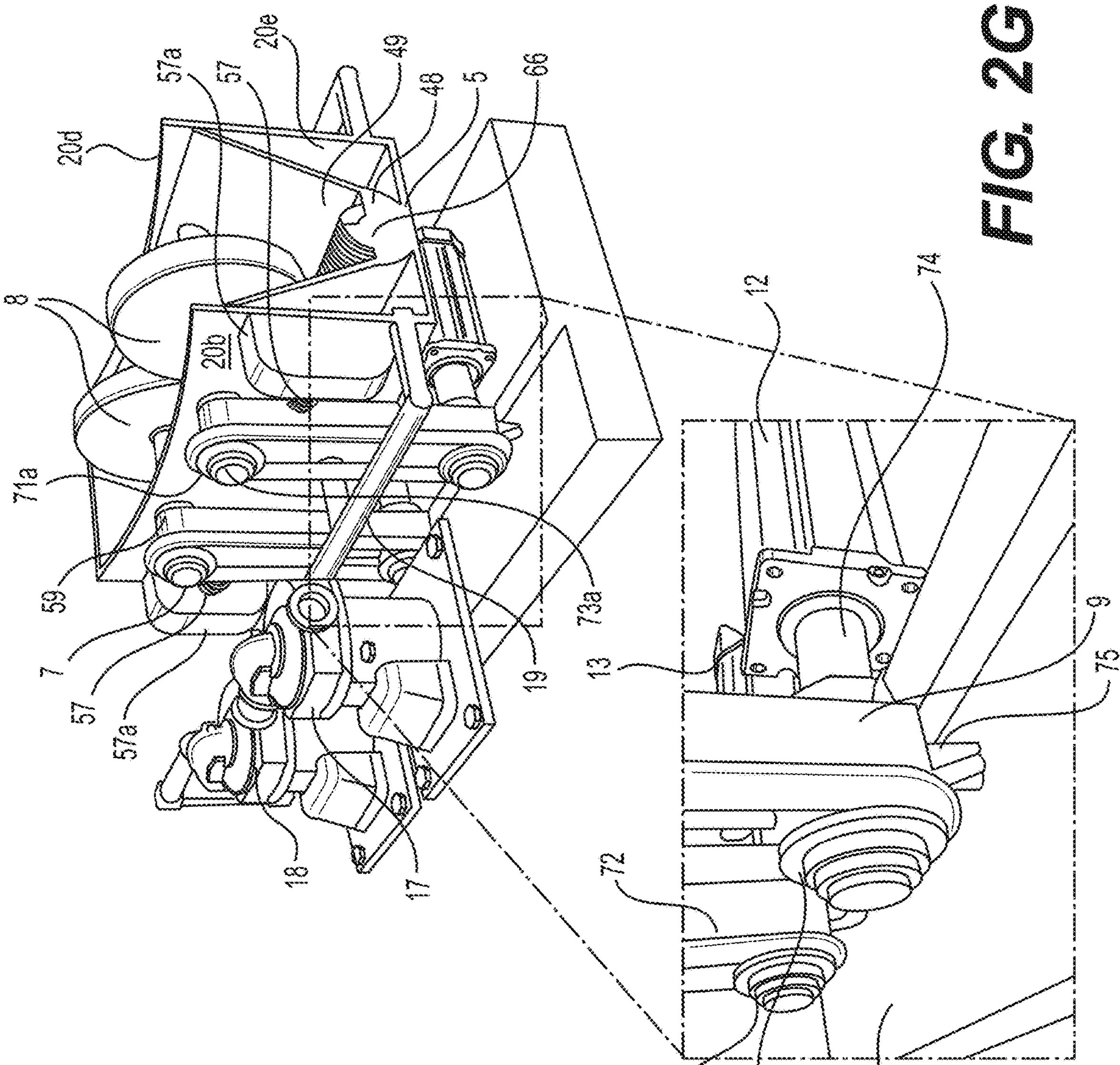

FIG. 2G1d1

2. SOURCE OF ELECTRICAL POWER
5. TROUGH
7. ROLLER SHAFT
8. ROLLER ELECTRODE
9. PIVOTING BUS BAR
12. ROLLER MOTOR 1
13. ROLLER MOTOR 2
17. WATER EJECTION PUMP
18. WATER SUCKING PUMP
19. WATER SUCKING LINE
20b. ELECTRODE HOUSING
20d. EXTERNAL HOUSING WALLS
20e. CHAMBER
48. SLURRY
49. WATER PERMEABLE MEMBRANE/FRIT
57. TENSION SPRING
57a. SPRING MOUNT
59. DRIVE SHAFT GASKET
66. SLURRY AGITATOR
67. SLURRY AGITATOR MOTOR
71. BOTTOM INDIRECT DRIVE PULLEY
71a. TOP INDIRECT DRIVE PULLEY
72. SHAFT DRIVE BELT
73. DRIVE SHAFT BEARING
73a. PLANE BEARING
74. DRIVE SHAFT
75. WIRE CONNECTOR

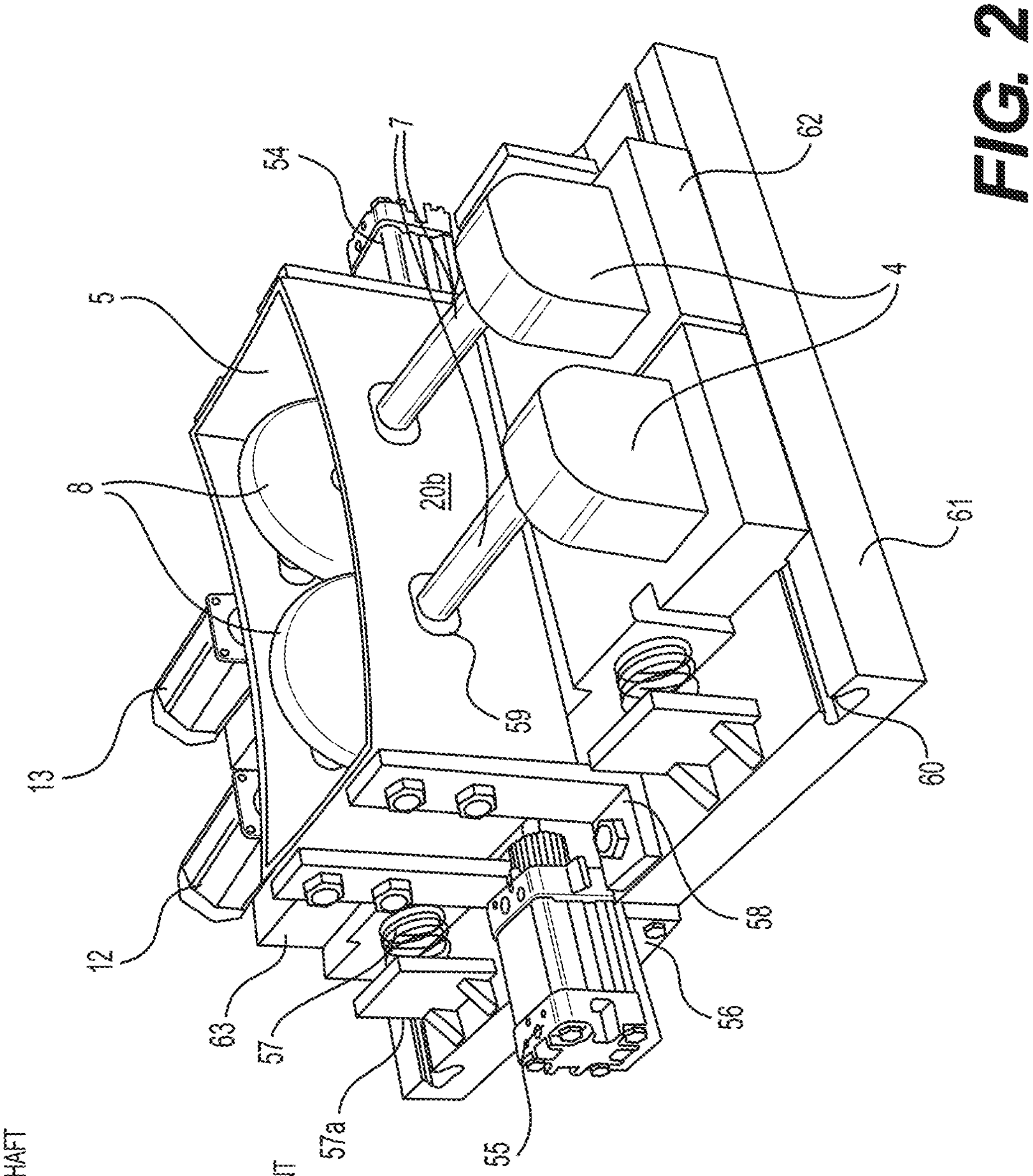
FIG. 2G1e
4. BEARING SUPPORT FOR ROLLER SHAFT
5. SLURRY TROUGH
7. ROLLER SHAFT
8. ROLLER ELECTRODE
12. ROLLER MOTOR 1
13. ROLLER MOTOR 2
20b. ELECTRODE HOUSING
54. PIEZOELECTRIC ACTUATOR 1
55. PIEZOELECTRIC ACTUATOR 2
56. PIEZOELECTRIC ACTUATOR MOUNT
57. TENSION SPRING
57a. TENSION SPRING MOUNT
58. ELECTRODE HOUSING BRACKET
59. FLEXIBLE GASKET
60. SLIDE TRACK
61. BASE SUPPORT
62. MOVABLE TABLE
63. MOTOR MOUNTS

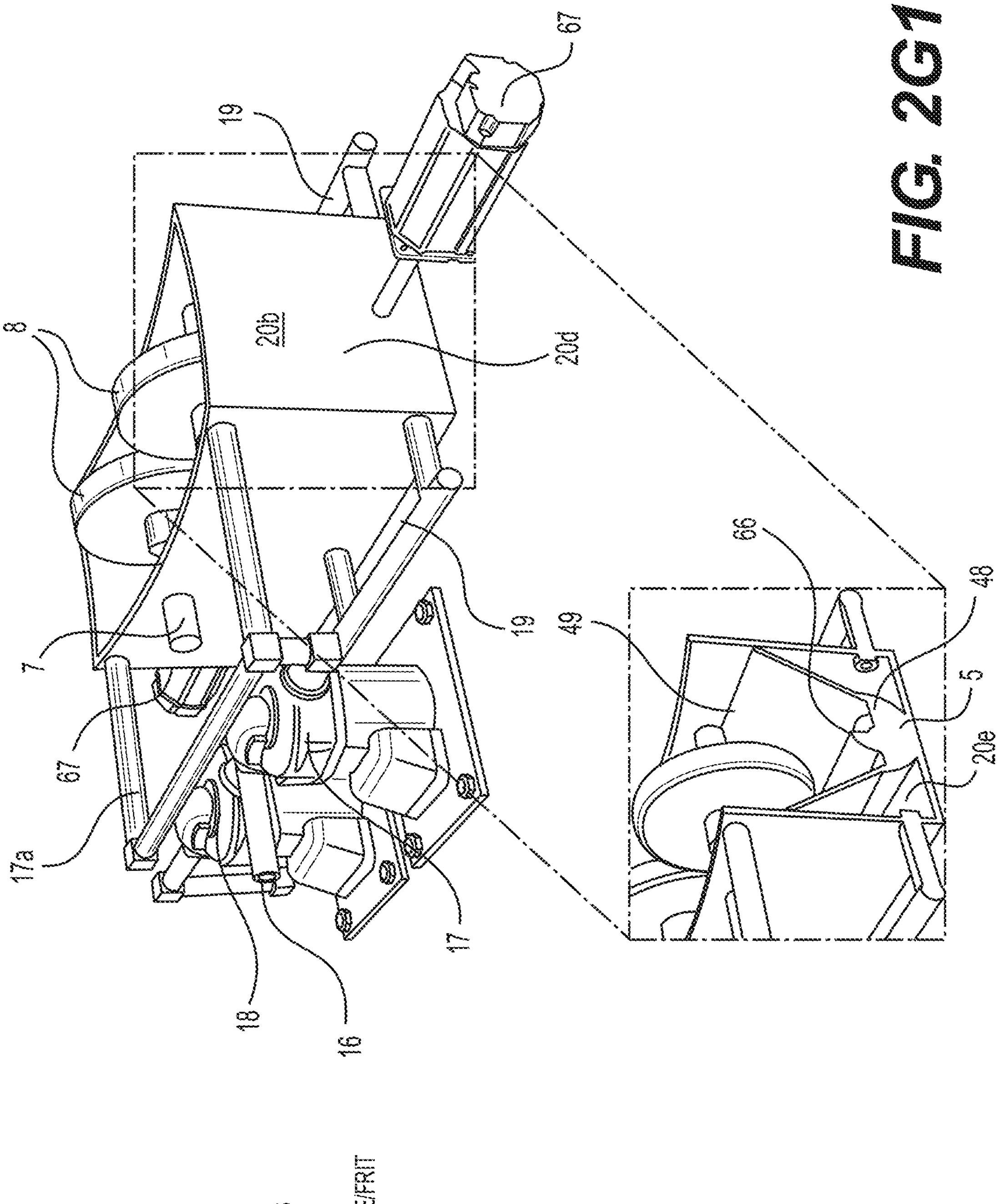
FIG. 2G1e1
5. TROUGH
7. ROLLER SHAFT
8. ROLLER ELECTRODE
16. JET GAS LINE
17. RECIRCULATION BLOWER
17a. GAS SUCTION LINE
18. AGITATOR BLOWER
19. GAS INJECTION LINE
20b. ELECTRODE HOUSING
20d. EXTERNAL HOUSING WALLS
20e. CHAMBER
48. FUEL POWDER
49. GAS PERMEABLE MEMBRANE/FRIT
66. POWDER AGITATOR
67. POWDER AGITATOR MOTOR

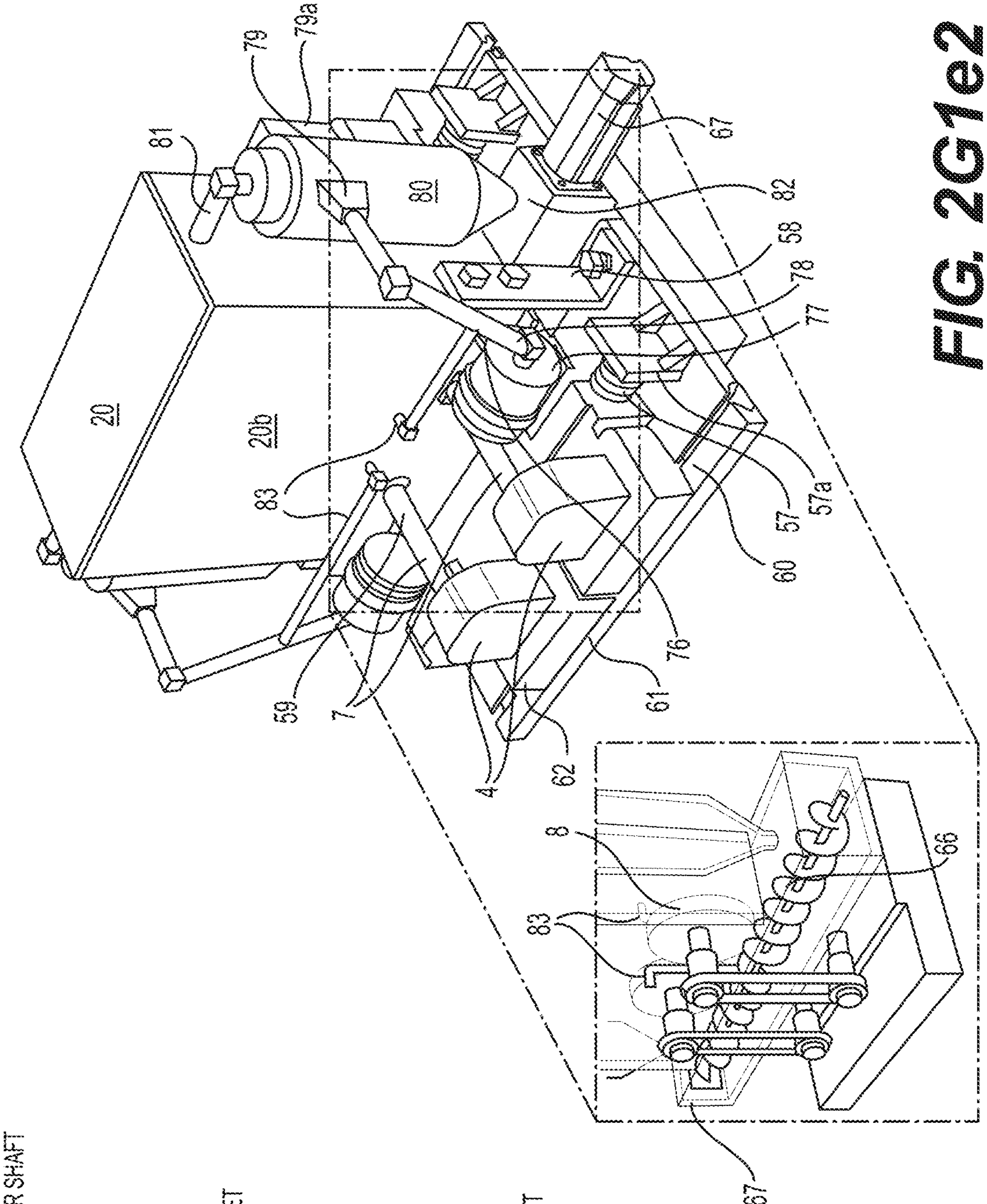

FIG. 2G1e2

4. BEARING SUPPORT FOR ROLLER SHAFT
5. TROUGH
7. ROLLER SHAFT
8. ROLLER ELECTRODE
20. WINDOW
20b. ELECTRODE HOUSING
57. TENSION SPRING
57a. TENSION SPRING MOUNT
58. ELECTRODE HOUSING BRACKET
59. FLEXIBLE GASKET
60. SLIDE TRACK
61. BASE SUPPORT
62. MOVABLE TABLE
66. AUGER
67. AUGER MOTOR
76. BLOWER INLET DUCT
77. BLOWER
78. BLOWER OUTLET DUCT
79. CYCLONE SEPARATOR INLET
79a. CYCLONE SEPARATOR MOUNT
80. CYCLONE SEPARATOR
81. GAS RETURN DUCT
82. OUTLET CHUTE
83. GAS JETS

4. BEARING SUPPORT FOR ROLLER SHAFT
5. TROUGH
7. ROLLER SHAFT
8. ROLLER ELECTRODE
12. ROLLER MOTOR 1
13. ROLLER MOTOR 2
20. WINDOW
20b. ELECTRODE HOUSING
57. TENSION SPRING
57a. TENSION SPRING MOUNT
58. ELECTRODE HOUSING BRACKET
59. FLEXIBLE GASKET
60. SLIDE TRACK
61. BASE SUPPORT
62. MOVABLE TABLE
67. AUGER MOTOR
71. INDIRECT DRIVE PULLEY
72. SHAFT DRIVE BELT
73. DRIVE SHAFT BEARING
74. DRIVE SHAFT
75. WIRE CONNECTOR
77. BLOWER
78. BLOWER OUTLET DUCT
79. CYCLONE SEPARATOR INLET
79a. CYCLONE SEPARATOR MOUNT
80. CYCLONE SEPARATOR
81. GAS RETURN DUCT
82. OUTLET CHUTE
83. GAS JETS

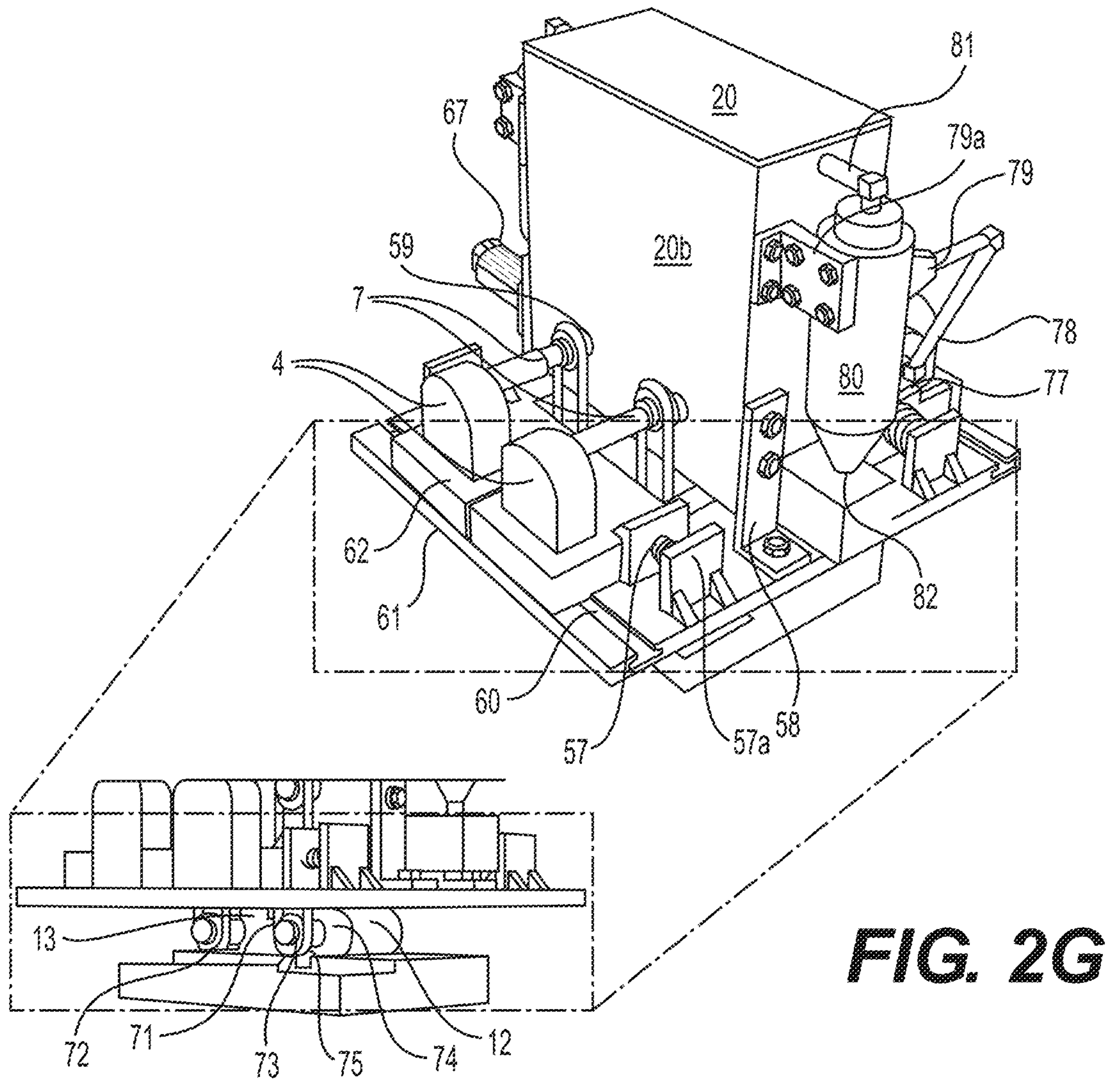

FIG. 2G1e3

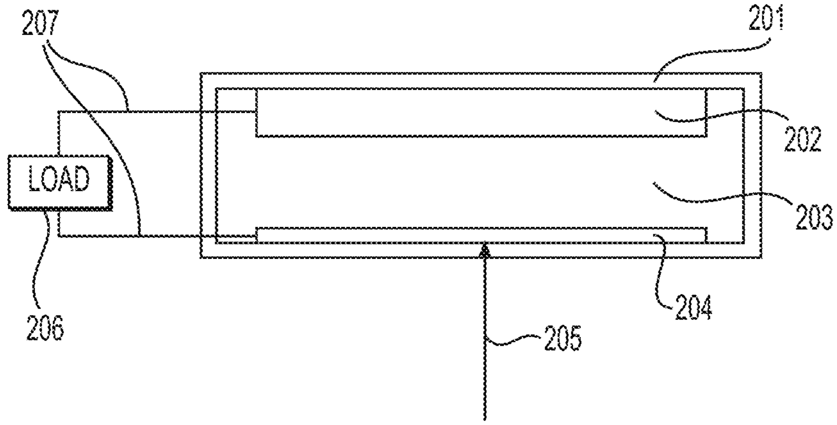
FIG. 2G1e4
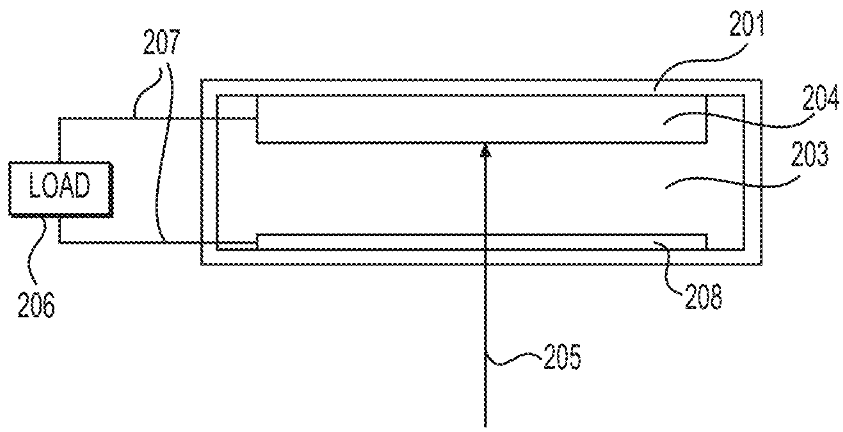
FIG. 2G1e5
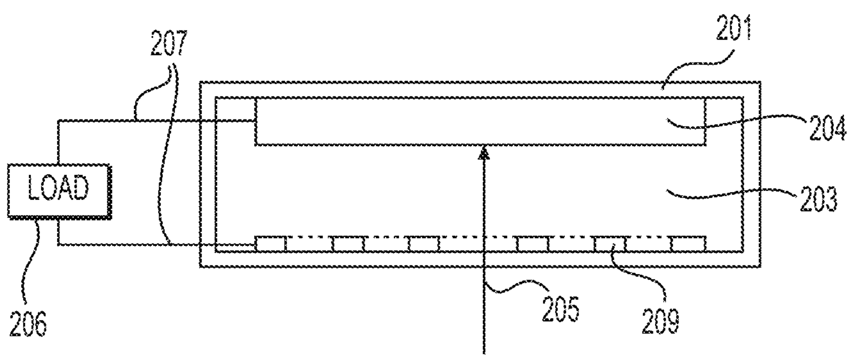
FIG. 2G1e6

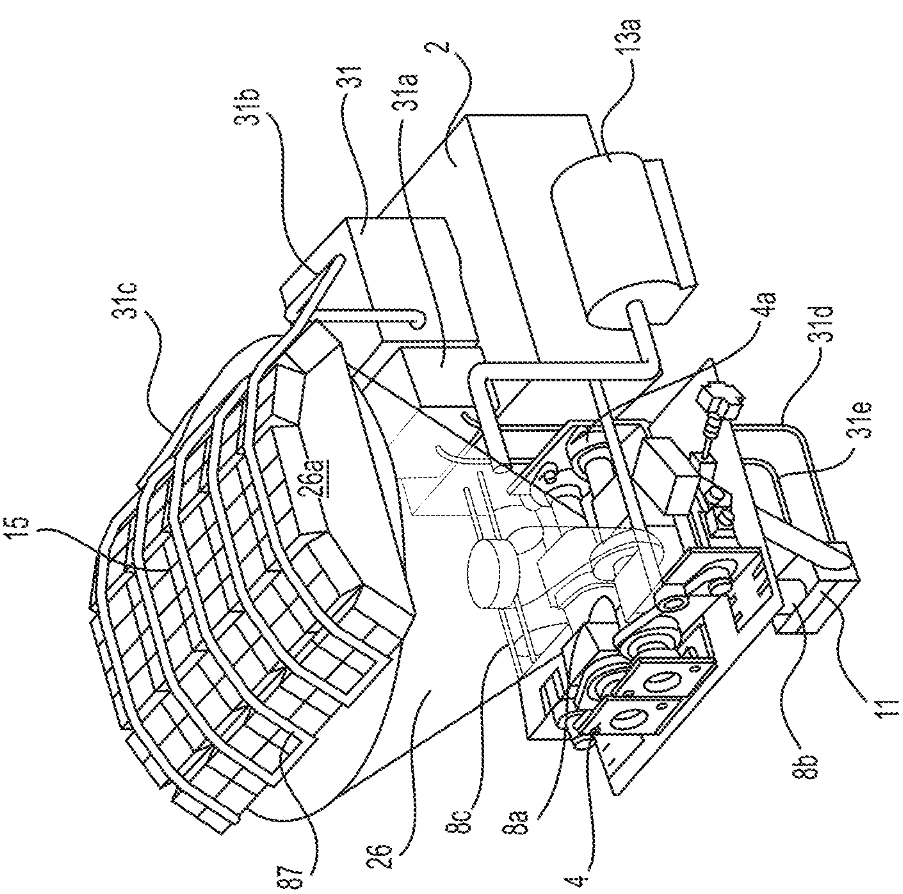
FIG. 2H1

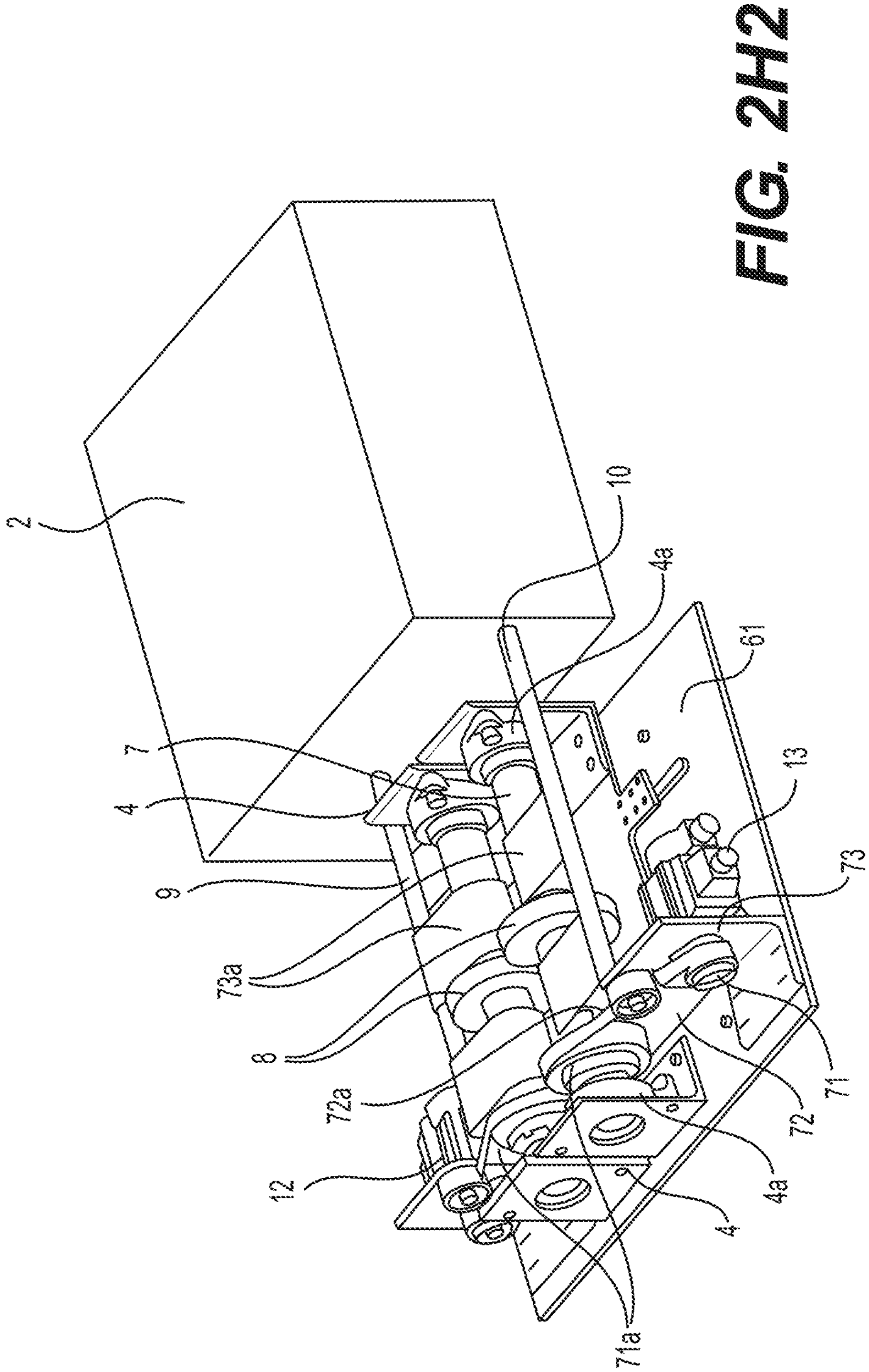
FIG. 2H2

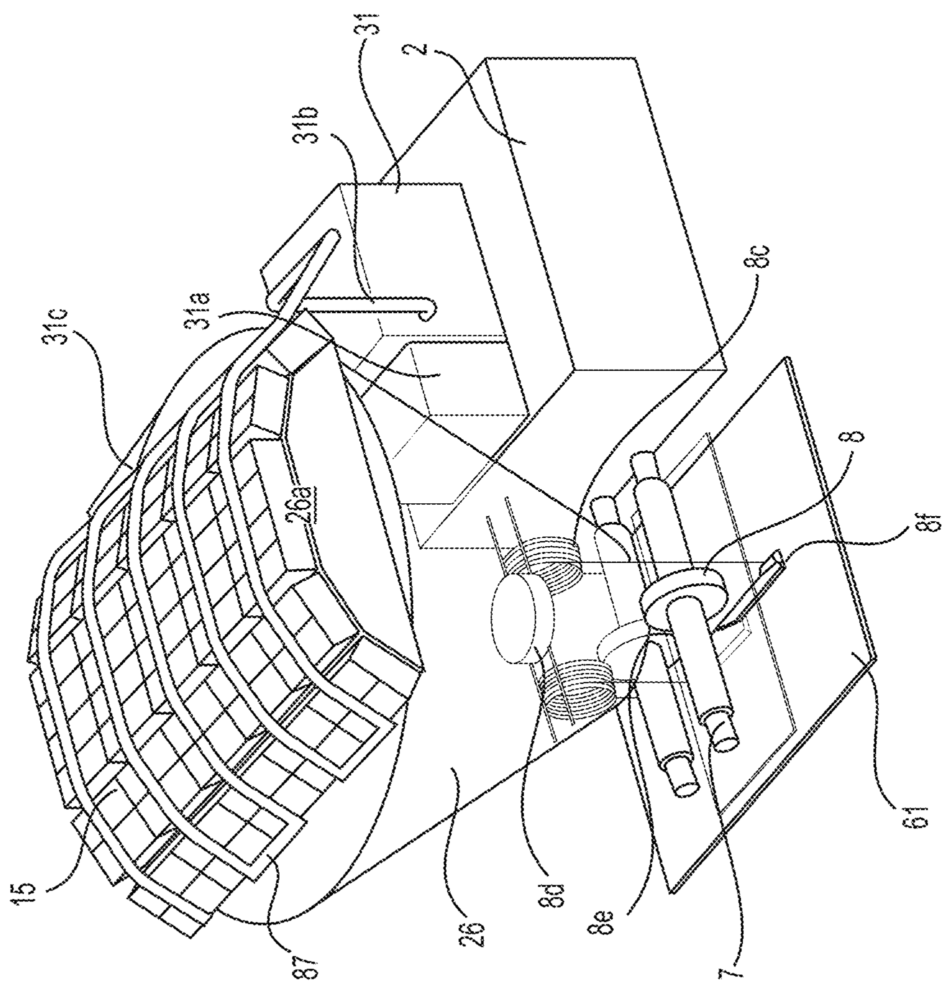
FIG. 2H3

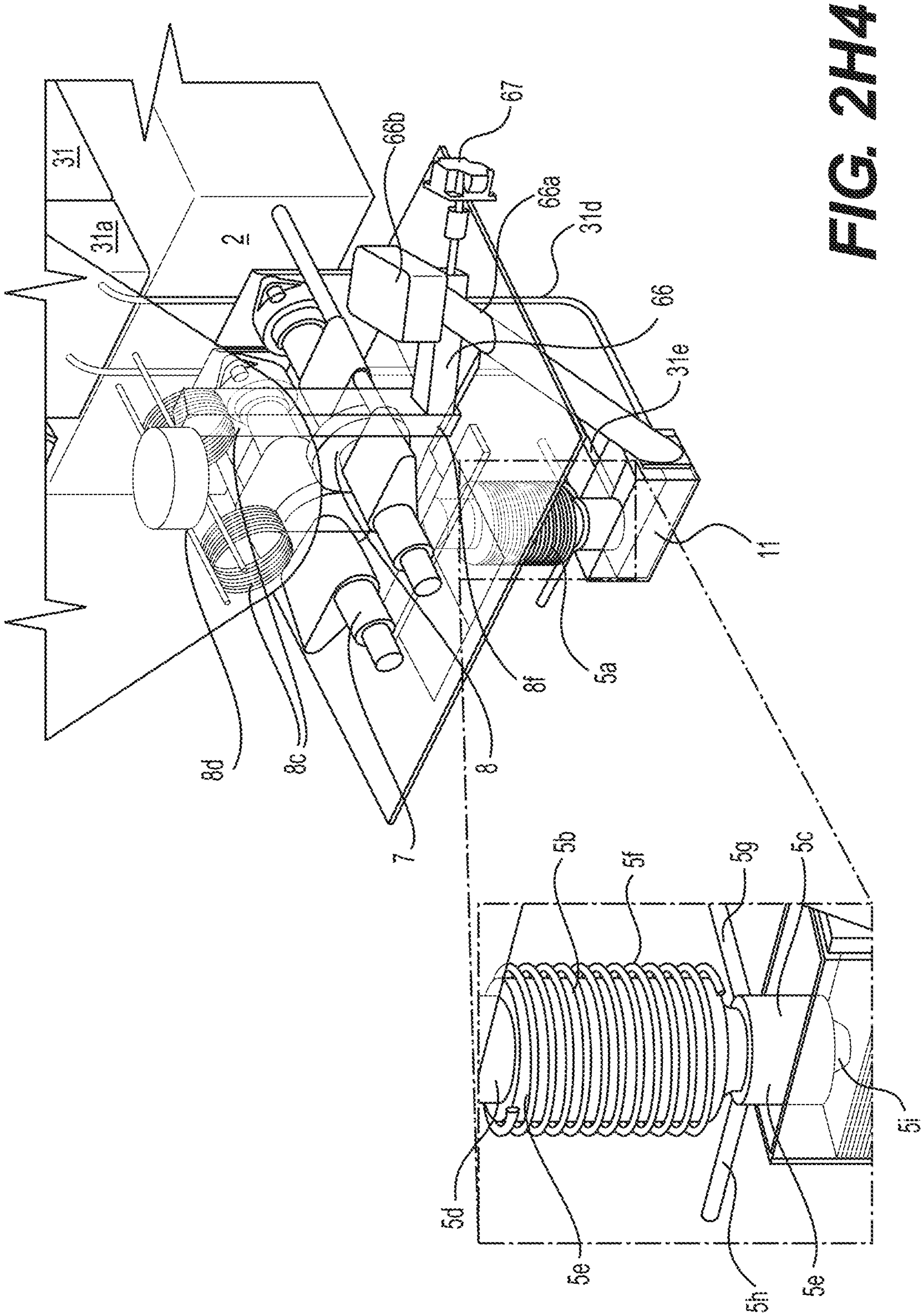
FIG. 2H4

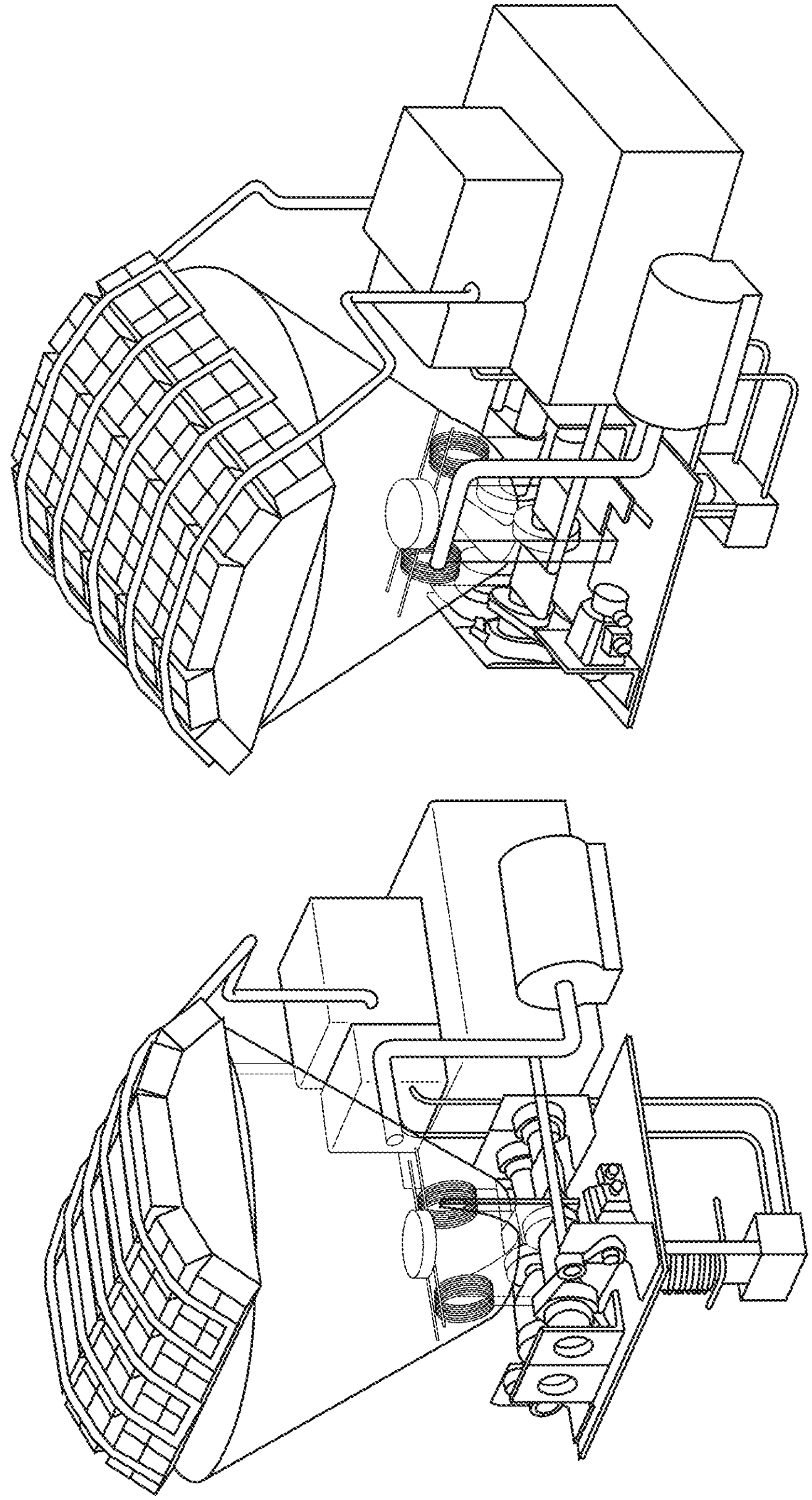
FIG. 2I1

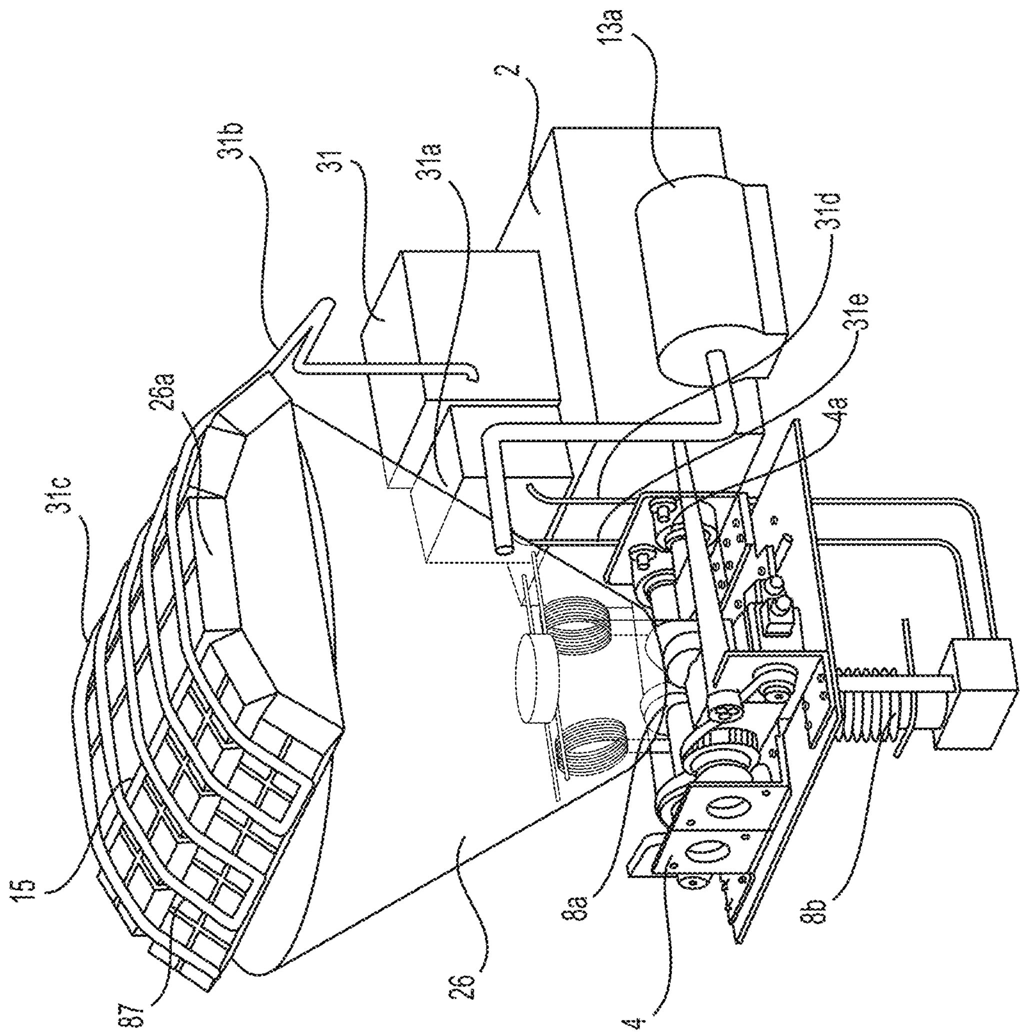
FIG. 2I2

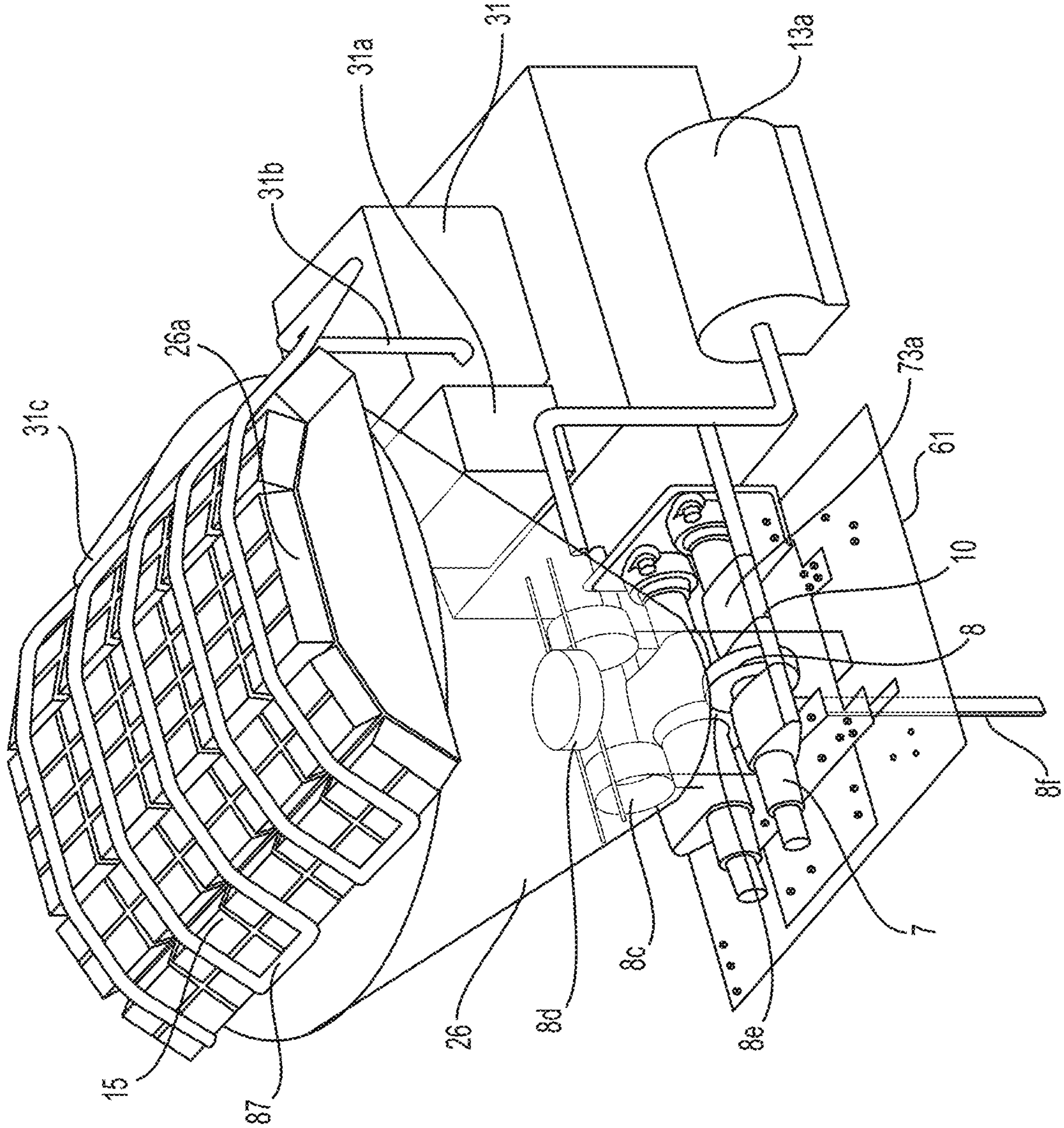
FIG. 2I3

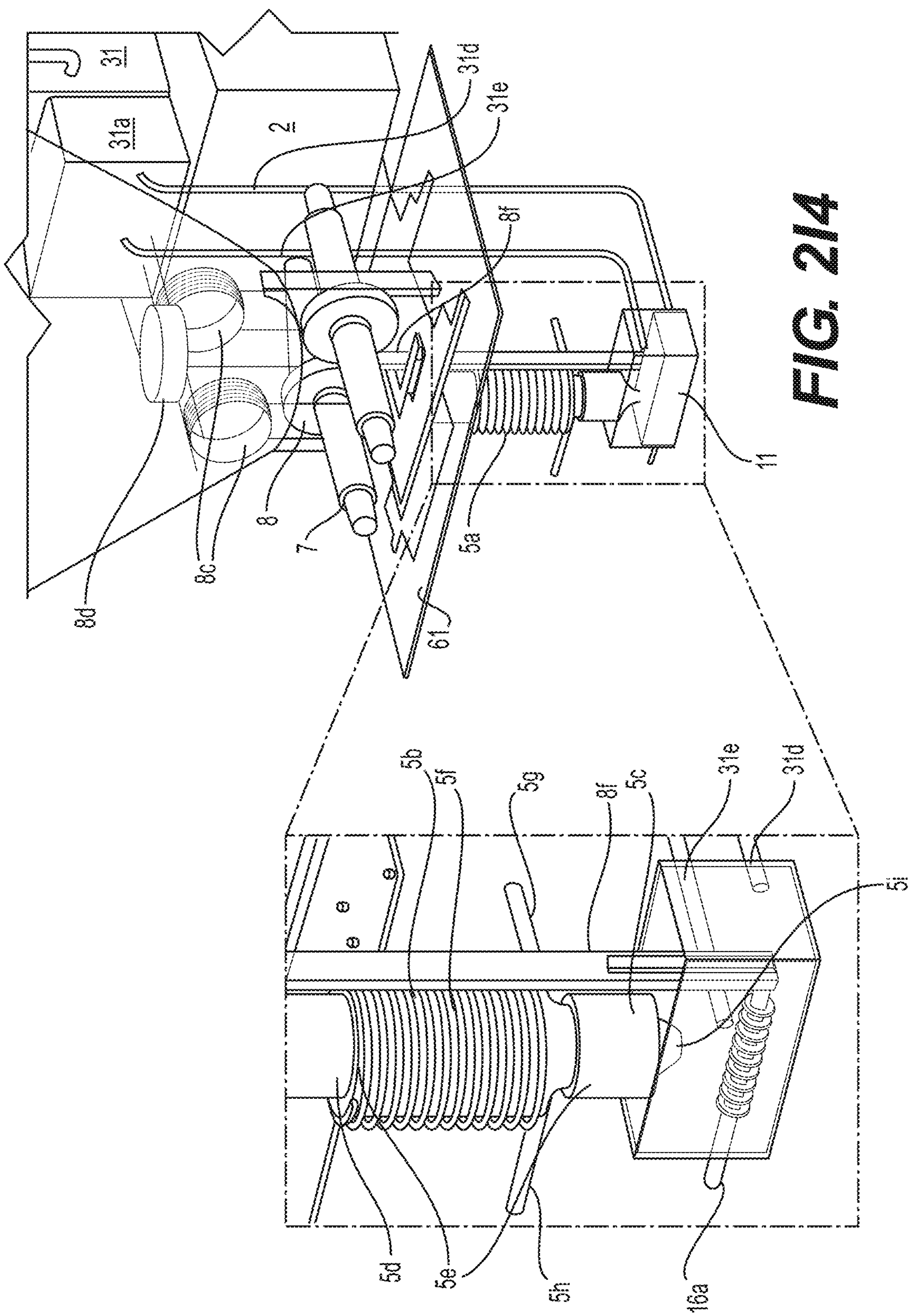
FIG. 2I4

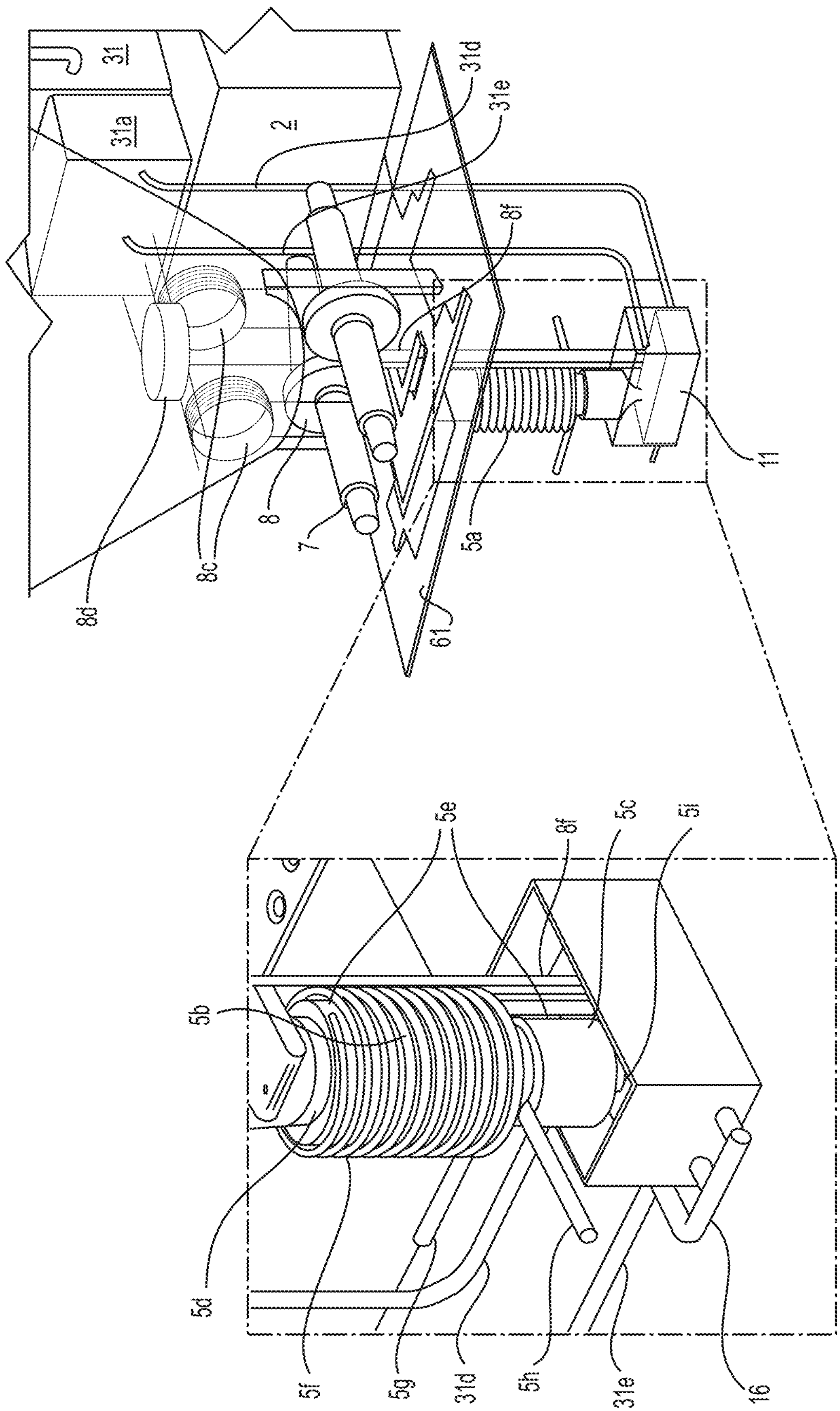
FIG. 2I5

2. SOURCE OF ELECTRICAL POWER
9. PIVOTING BUS BAR
17. WATER EJECTION PUMP
18. WATER SUCKING PUMP
19. WATER SUCKING LINE
67. SLURRY AGITATOR MOTOR
71. BOTTOM INDIRECT DRIVE PULLEY
71a. TOP INDIRECT DRIVE PULLEY
72. SHAFT DRIVE BELT
73. DRIVE SHAFT BEARING
74. DRIVE SHAFT
75. WIRE CONNECTOR
84. COOLANT INLET LINE
85. COOLANT OUTLET LINE
86. HEAT EXCHANGER, BOILER, TURBINE, GENERATOR
87. HEAT EXCHANGER

1. CALORIMETER COVER
2. THERMISTOR
3. ELECTRODES
4. POSITVE PROBE CONNECTOR
5. NEGATIVE PROBE CONNECTOR
6. STIRRING ASSEMBLY
7. STIRRER DRIVE BELT
8. MOTOR PULLEY
9. MOTOR
10. MOTOR CONNECTOR
11. IMPELLER
12. HEAT FINS
13. ELECTRODE FEED-THROUGH
14. BOMB CELL
15. INSULATING FERRULE SEAL
16. SAMPLE FASTENING BOLT
17. FASTENER SWIVEL
18. SOLID FUEL
19. WATER BUCKET
20. BUCKET STAND
21. CALORIMETER JACKET

ELECTRICAL POWER GENERATION SYSTEMS AND METHODS REGARDING SAME

CROSS-REFERENCES TO RELATED APPLICATIONS

This application is a continuation application of, and claims priority under 35 U.S.C. § 120 to U.S. application Ser. No. 16/567,689, filed on Sep. 11, 2019 which is a continuation application of, and claims priority under 35 U.S.C. § 120 to U.S. application Ser. No. 15/314,196, filed on Nov. 28, 2016, which is a national stage entry under 35 U.S.C. § 371 of PCT International Application No.: PCT/US2015/033165, filed May 29, 2012, which claims the benefit of U.S. Provisional Application No. 62/004,883, filed May 29, 2014; 62/012,193, filed Jun. 13, 2014; 62/016,540, filed Jun. 24, 2014; 62/021,699, filed Jul. 7, 2014; 62/023,586, filed Jul. 11, 2014; 62/026,698, filed Jul. 20, 2014; 62/037,152, filed Aug. 14, 2014; 62/041,026, filed Aug. 22, 2014; 62/058,844, filed Oct. 2, 2014; 62/068,592, filed Oct. 24, 2014; 62/083,029, filed Nov. 21, 2014; 62/087,234, filed Dec. 4, 2014; 62/092,230, filed Dec. 15, 2014, 62/113,211, filed Feb. 6, 2015; 62/141,079, filed Mar. 31, 2015; 62/149,501, filed Apr. 17, 2015; 62/159,230, filed May 9, 2015 and 62/165,340, filed May 22, 2015.

SUMMARY

The present disclosure relates to the field of power generation and, in particular, to systems, devices, and methods for the generation of power. More specifically, embodiments of the present disclosure are directed to power generation devices and systems, as well as related methods, which produce optical power, plasma, and thermal power and produces electrical power via an optical to electric power converter, plasma to electric power converter, photon to electric power converter, or a thermal to electric power converter. In addition, embodiments of the present disclosure describe systems, devices, and methods that use the ignition of a water or water-based fuel source to generate optical power, mechanical power, electrical power, and/or thermal power using photovoltaic power converters. These and other related embodiments are described in detail in the present disclosure.

Power generation can take many forms, harnessing the power from plasma. Successful commercialization of plasma may depend on power generation systems capable of efficiently forming plasma and then capturing the power of the plasma produced.

Plasma may be formed during ignition of certain fuels. These fuels can include water or water-based fuel source. During ignition, a plasma cloud of electron-stripped atoms is formed, and high optical power may be released. The high optical power of the plasma can be harnessed by an electric converter of the present disclosure. The ions and excited state atoms can recombine and undergo electronic relaxation to emit optical power. The optical power can be converted to electricity with photovoltaics.

Certain embodiments of the present disclosure are directed to a power generation system comprising: a plurality of electrodes configured to deliver power to a fuel to ignite the fuel and produce a plasma; a source of electrical power configured to deliver electrical energy to the plurality of electrodes; and at least one photovoltaic power converter positioned to receive at least a plurality of plasma photons.

In one embodiment, the present disclosure is directed to a power system that generates at least one of electrical energy and thermal energy comprising:

at least one vessel capable of a pressure of below atmospheric;

shot comprising reactants, the reactants comprising:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix;

at least one shot injection system comprising at least one augmented railgun, wherein the augmented railgun comprises separated electrified rails and magnets that produce a magnetic field perpendicular to the plane of the rails, and the circuit between the rails is open until closed by the contact of the shot with the rails;

at least one ignition system to cause the shot to form at least one of light-emitting plasma and thermal-emitting plasma, at least one ignition system comprising:

a) at least one set of electrodes to confine the shot; and b) a source of electrical power to deliver a short burst of high-current electrical energy;

wherein the at least one set of electrodes form an open circuit, wherein the open circuit is closed by the injection of the shot to cause the high current to flow to achieve ignition, and the source of electrical power to deliver a short burst of high-current electrical energy comprises at least one of the following:

a voltage selected to cause a high AC, DC, or an AC-DC mixture of current that is in the range of at least one of 100 A to 1,000,000 A, 1 kA to 100,000 A, 10 kA to 50 kA;

a DC or peak AC current density in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$;

the voltage is determined by the conductivity of the solid fuel or energetic material wherein the voltage is given by the desired current times the resistance of the solid fuel or energetic material sample;

the DC or peak AC voltage is in the range of at least one of 0.1 V to 500 kV, 0.1 V to 100 kV, and 1 V to 50 kV, and the AC frequency is in range of at least one of 0.1 Hz to 10 GHz, 1 Hz to 1 MHz, 10 Hz to 100 kHz, and 100 Hz to 10 kHz.

a system to recover reaction products of the reactants comprising at least one of gravity and an augmented plasma railgun recovery system comprising at least one magnet providing a magnetic field and a vector-crossed current component of the ignition electrodes;

at least one regeneration system to regenerate additional reactants from the reaction products and form additional shot comprising a pelletizer comprising a smelter to form molten reactants, a system to add $H_2$ and $H_2O$ to the molten reactants, a melt dripper, and a water reservoir to form shot, wherein the additional reactants comprise:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix; and at least one power converter or output system of at least one of the light and thermal output to electrical power and/or thermal power comprising at least one or more of the group of a photovoltaic converter, a photoelectronic converter, a plasmadynamic converter, a thermionic converter, a thermoelectric converter, a Sterling engine, a Brayton cycle engine, a Rankine cycle engine, and a heat engine, and a heater.

In another embodiment, the present disclosure is directed to a power system that generates at least one of electrical energy and thermal energy comprising:

at least one vessel capable of a pressure of below atmospheric;

shot comprising reactants, the reactants comprising at least one of silver, copper, absorbed hydrogen, and water;

at least one shot injection system comprising at least one augmented railgun wherein the augmented railgun comprises separated electrified rails and magnets that produce a magnetic field perpendicular to the plane of the rails, and the circuit between the rails is open until closed by the contact of the shot with the rails;

at least one ignition system to cause the shot to form at least one of light-emitting plasma and thermal-emitting plasma, at least one ignition system comprising:

a) at least one set of electrodes to confine the shot; and b) a source of electrical power to deliver a short burst of high-current electrical energy;

wherein the at least one set of electrodes that are separated to form an open circuit, wherein the open circuit is closed by the injection of the shot to cause the high current to flow to achieve ignition, and he source of electrical power to deliver a short burst of high-current electrical energy comprises at least one of the following:

a voltage selected to cause a high AC, DC, or an AC-DC mixture of current that is in the range of at least one of 100 A to 1,000,000 A, 1 kA to 100,000 A, 10 kA to 50 kA;

a DC or peak AC current density in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$;

the voltage is determined by the conductivity of the solid fuel or energetic material wherein the voltage is given by the desired current times the resistance of the solid fuel or energetic material sample;

the DC or peak AC voltage is in the range of at least one of 0.1 V to 500 kV, 0.1 V to 100 kV, and 1 V to 50 kV, and the AC frequency is in range of at least one of 0.1 Hz to 10 GHz, 1 Hz to 1 MHz, 10 Hz to 100 kHz, and 100 Hz to 10 kHz.

a system to recover reaction products of the reactants comprising at least one of gravity and a augmented plasma railgun recovery system comprising at least one magnet providing a magnetic field and a vector-crossed current component of the ignition electrodes;

at least one regeneration system to regenerate additional reactants from the reaction products and form additional shot comprising a pelletizer comprising a smelter to form molten reactants, a system to add $H_2$ and $H_2O$ to the molten reactants, a melt dripper, and a water reservoir to form shot, wherein the additional reactants comprise at least one of silver, copper, absorbed hydrogen, and water;

at least one power converter or output system comprising a concentrator ultraviolet photovoltaic converter wherein the photovoltaic cells comprise at least one compound chosen from a Group III nitride, GaAlN, GaN, and InGaN.

In another embodiment, the present disclosure is directed to a power system that generates at least one of electrical energy and thermal energy comprising:

at least one vessel;

shot comprising reactants, the reactants comprising:

e) at least one source of catalyst or a catalyst comprising nascent $H_2O$;

f) at least one source of $H_2O$ or $H_2O$;

g) at least one source of atomic hydrogen or atomic hydrogen; and h) at least one of a conductor and a conductive matrix;

at least one shot injection system;

at least one shot ignition system to cause the shot to form at least one of light-emitting plasma and thermal-emitting plasma;

a system to recover reaction products of the reactants;

at least one regeneration system to regenerate additional reactants from the reaction products and form additional shot, wherein the additional reactants comprise:

e) at least one source of catalyst or a catalyst comprising nascent $H_2O$;

f) at least one source of $H_2O$ or $H_2O$;

g) at least one source of atomic hydrogen or atomic hydrogen; and h) at least one of a conductor and a conductive matrix; and at least one power converter or output system of at least one of the light and thermal output to electrical power and/or thermal power.

In another embodiment, the present disclosure is directed to a power system that generates at least one of electrical energy and thermal energy comprising:

at least one vessel;

slurry comprising reactants, the reactants comprising:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix;

at least one slurry injection system comprising rotating roller electrodes comprising a rotary slurry pump;

at least one slurry ignition system to cause the shot to form light-emitting plasma;

a system to recover reaction products of the reactants;

at least one regeneration system to regenerate additional reactants from the reaction products and form additional slurry, wherein the additional reactants comprise:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix; and at least one power converter or output system of at least one of the light and thermal output to electrical power and/or thermal power.

Certain embodiments of the present disclosure are directed to a power generation system comprising: a plurality of electrodes configured to deliver power to a fuel to ignite the fuel and produce a plasma; a source of electrical power configured to deliver electrical energy to the plurality of electrodes; and at least one photovoltaic power converter positioned to receive at least a plurality of plasma photons.

In one embodiment, the present disclosure is directed to a power system that generates at least one of direct electrical energy and thermal energy comprising:

at least one vessel;

reactants comprising:

a) at least one source of catalyst or a catalyst comprising nascent $H_2O$;

b) at least one source of atomic hydrogen or atomic hydrogen;

c) at least one of a conductor and a conductive matrix; and at least one set of electrodes to confine the hydrino reactants, a source of electrical power to deliver a short burst of high-current electrical energy;

a reloading system;

at least one system to regenerate the initial reactants from the reaction products, and at least one plasma dynamic converter or at least one photovoltaic converter.

In one exemplary embodiment, a method of producing electrical power may comprise supplying a fuel to a region between a plurality of electrodes; energizing the plurality of electrodes to ignite the fuel to form a plasma; converting a plurality of plasma photons into electrical power with a photovoltaic power converter; and outputting at least a portion of the electrical power.

In another exemplary embodiment, a method of producing electrical power may comprise supplying a fuel to a region between a plurality of electrodes; energizing the plurality of electrodes to ignite the fuel to form a plasma; converting a plurality of plasma photons into thermal power with a photovoltaic power converter; and outputting at least a portion of the electrical power.

In an embodiment of the present disclosure, a method of generating power may comprise delivering an amount of fuel to a fuel loading region, wherein the fuel loading region is located among a plurality of electrodes; igniting the fuel by flowing a current of at least about 2,000 A/$cm^2$ through the fuel by applying the current to the plurality of electrodes to produce at least one of plasma, light, and heat; receiving at least a portion of the light in a photovoltaic power converter; converting the light to a different form of power using the photovoltaic power converter; and outputting the different form of power.

In an additional embodiment, the present disclosure is directed to a water arc plasma power system comprising: at least one closed reaction vessel; reactants comprising at least one of source of $H_2O$ and $H_2O$; at least one set of electrodes; a source of electrical power to deliver an initial high breakdown voltage of the $H_2O$ and provide a subsequent high current, and a heat exchanger system, wherein the power system generates arc plasma, light, and thermal energy, and at least one photovoltaic power converter.

Certain embodiments of the present disclosure are directed to a power generation system comprising: an electrical power source of at least about 2,000 A/$cm^2$ or of at least about 5,000 kW; a plurality of electrodes electrically coupled to the electrical power source; a fuel loading region configured to receive a solid fuel, wherein the plurality of electrodes is configured to deliver electrical power to the solid fuel to produce a plasma; and at least one of a plasma power converter, a photovoltaic power converter, and thermal to electric power converter positioned to receive at least a portion of the plasma, photons, and/or heat generated by the reaction. Other embodiments are directed to a power generation system, comprising: a plurality of electrodes; a fuel loading region located between the plurality of electrodes and configured to receive a conductive fuel, wherein the plurality of electrodes are configured to apply a current to the conductive fuel sufficient to ignite the conductive fuel and generate at least one of plasma and thermal power; a delivery mechanism for moving the conductive fuel into the fuel loading region; and at least one of a photovoltaic power converter to convert the plasma photons into a form of power, or a thermal to electric converter to convert the thermal power into a nonthermal form of power comprising electricity or mechanical power. Further embodiments are directed to a method of generating power, comprising: delivering an amount of fuel to a fuel loading region, wherein the fuel loading region is located among a plurality of electrodes; igniting the fuel by flowing a current of at least about 2,000 A/$cm^2$ through the fuel by applying the current to the plurality of electrodes to produce at least one of plasma, light, and heat; receiving at least a portion of the light in a photovoltaic power converter; converting the light to a different form of power using the photovoltaic power converter; and outputting the different form of power.

Additional embodiments are directed to a power generation system, comprising: an electrical power source of at least about 5,000 kW; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a photovoltaic power converter configured to convert plasma generated from the ignition of the fuel into a non-plasma form of power. Additionally provided in the present disclosure is a power generation system, comprising: an electrical power source of at least about 2,000 A/$cm^2$; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a photovoltaic power converter configured to convert plasma generated from the ignition of the fuel into a non-plasma form of power.

Another embodiments is directed to a power generation system, comprising: an electrical power source of at least about 5,000 kW or of at least about 2,000 A/$cm^2$; a plurality of spaced apart electrodes, wherein at least one of the plurality of electrodes includes a compression mechanism; a fuel loading region configured to receive a fuel, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the fuel received in the fuel loading region to ignite the fuel; a delivery mechanism for moving the fuel into the fuel loading region; and a photovoltaic power converter configured to convert photons generated from the ignition of the fuel into a non-photon form of power. Other embodiments of the present disclosure are directed to a power generation system, comprising: an electrical power source of at least about 2,000 A/$cm^2$; a plurality of spaced apart electrodes, wherein at least one of the plurality of electrodes includes a compression mechanism; a fuel loading region configured to receive a fuel, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the fuel received in the fuel loading region to ignite the fuel; a delivery mechanism for moving the fuel into the fuel loading region; and a plasma power converter configured to convert plasma generated from the ignition of the fuel into a non-plasma form of power.

Embodiments of the present disclosure are also directed to power generation system, comprising: a plurality of electrodes; a fuel loading region surrounded by the plurality of electrodes and configured to receive a fuel, wherein the plurality of electrodes is configured to ignite the fuel located in the fuel loading region; a delivery mechanism for moving the fuel into the fuel loading region; a photovoltaic power converter configured to convert photons generated from the ignition of the fuel into a non-photon form of power; a removal system for removing a byproduct of the ignited fuel; and a regeneration system operably coupled to the removal system for recycling the removed byproduct of the ignited fuel into recycled fuel. Certain embodiments of the present disclosure are also directed to a power generation system, comprising: an electrical power source configured to output a current of at least about 2,000 A/cm$^2$ or of at least about 5,000 kW; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; and a photovoltaic power converter configured to convert a plurality of photons generated from the ignition of the fuel into a non-photon form of power. Certain embodiments may further include one or more of output power terminals operably coupled to the photovoltaic power converter; a power storage device; a sensor configured to measure at least one parameter associated with the power generation system; and a controller configured to control at least a process associated with the power generation system. Certain embodiments of the present disclosure are also directed to a power generation system, comprising: an electrical power source configured to output a current of at least about 2,000 A/cm$^2$ or of at least about 5,000 kW; a plurality of spaced apart electrodes, wherein the plurality of electrodes at least partially surround a fuel, are electrically connected to the electrical power source, are configured to receive a current to ignite the fuel, and at least one of the plurality of electrodes is moveable; a delivery mechanism for moving the fuel; and a photovoltaic power converter configured to convert photons generated from the ignition of the fuel into a different form of power.

Additional embodiments of the present disclosure are directed to a power generation system, comprising: an electrical power source of at least about 5,000 kW or of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; a photovoltaic power converter configured to convert a plurality of photons generated from the ignition of the fuel into a non-photon form of power; a sensor configured to measure at least one parameter associated with the power generation system; and a controller configured to control at least a process associated with the power generation system. Further embodiments are directed to a power generation system, comprising: an electrical power source of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region; a delivery mechanism for moving the fuel into the fuel loading region; a plasma power converter configured to convert plasma generated from the ignition of the fuel into a non-plasma form of power; a sensor configured to measure at least one parameter associated with the power generation system; and a controller configured to control at least a process associated with the power generation system.

Certain embodiments of the present disclosure are directed to a power generation system, comprising: an electrical power source of at least about 5,000 kW or of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region, and wherein a pressure in the fuel loading region is a partial vacuum; a delivery mechanism for moving the fuel into the fuel loading region; and a photovoltaic power converter configured to convert plasma generated from the ignition of the fuel into a non-plasma form of power. Some embodiments may include one or more of the following additional features: the photovoltaic power converter may be located within a vacuum cell; the photovoltaic power converter may include at least one of an antireflection coating, an optical impedance matching coating, or a protective coating; the photovoltaic power converter may be operably coupled to a cleaning system configured to clean at least a portion of the photovoltaic power converter; the power generation system may include an optical filter; the photovoltaic power converter may comprise at least one of a monocrystalline cell, a polycrystalline cell, an amorphous cell, a string/ribbon silicon cell, a multi junction cell, a homojunction cell, a heterojunction cell, a p-i-n device, a thin-film cell, a dye-sensitized cell, and an organic photovoltaic cell; and the photovoltaic power converter may comprise at multi junction cell, wherein the multi junction cell comprises at least one of an inverted cell, an upright cell, a lattice-mismatched cell, a lattice-matched cell, and a cell comprising Group III-V semiconductor materials.

Additional exemplary embodiments are directed to a system configured to produce power, comprising: a fuel supply configured to supply a fuel; a power supply configured to supply an electrical power; and at least one gear configured to receive the fuel and the electrical power, wherein the at least one gear selectively directs the electrical power to a local region about the gear to ignite the fuel within the local region. In some embodiments, the system may further have one or more of the following features: the fuel may include a powder; the at least one gear may include two gears; the at least one gear may include a first material and a second material having a lower conductivity than the first material, the first material being electrically coupled to the local region; and the local region may be adjacent to at least one of a tooth and a gap of the at least one gear. Other embodiments may use a support member in place of a gear, while other embodiments may use a gear and a support member. Some embodiments are directed to a method of producing electrical power, comprising: supplying a fuel to rollers or a gear; rotating the rollers or gear to localize at least some of the fuel at a region of the rollers or gear; supplying a current to the roller or gear to ignite the localized fuel to produce energy; and converting at least some of the energy produced by the ignition into electrical power. In some embodiments, rotating the rollers or gear may include rotating a first roller or gear and a roller or second gear, and supplying a current may include supplying a current to the first roller or gear and the roller or second gear.

Other embodiments are directed to a power generation system, comprising: an electrical power source of at least about 2,000 A/cm$^2$; a plurality of spaced apart electrodes electrically connected to the electrical power source; a fuel loading region configured to receive a fuel, wherein the fuel loading region is surrounded by the plurality of electrodes, and wherein the plurality of electrodes is configured to supply power to the fuel to ignite the fuel when received in the fuel loading region, and wherein a pressure in the fuel loading region is a partial vacuum; a delivery mechanism for moving the fuel into the fuel loading region; and a photovoltaic power converter configured to convert plasma generated from the ignition of the fuel into a non-plasma form of power.

Further embodiments are directed to a power generation cell, comprising: an outlet port coupled to a vacuum pump; a plurality of electrodes electrically coupled to an electrical power source of at least about 5,000 kW; a fuel loading region configured to receive a water-based fuel comprising a majority $H_2O$, wherein the plurality of electrodes is configured to deliver power to the water-based fuel to produce at least one of an arc plasma and thermal power; and a power converter configured to convert at least a portion of at least one of the arc plasma and the thermal power into electrical power. Also disclosed is a power generation system, comprising: an electrical power source of at least about 5,000 A/cm$^2$; a plurality of electrodes electrically coupled to the electrical power source; a fuel loading region configured to receive a water-based fuel comprising a majority $H_2O$, wherein the plurality of electrodes is configured to deliver power to the water-based fuel to produce at least one of an arc plasma and thermal power; and a power converter configured to convert at least a portion of at least one of the arc plasma and the thermal power into electrical power. In an embodiment, the power converter comprises a photovoltaic converter of optical power into electricity.

Additional embodiments are directed to a method of generating power, comprising: loading a fuel into a fuel loading region, wherein the fuel loading region includes a plurality of electrodes; applying a current of at least about 2,000 A/cm$^2$ to the plurality of electrodes to ignite the fuel to produce at least one of an arc plasma and thermal power; performing at least one of passing the arc plasma through a photovoltaic converter to generate electrical power; and passing the thermal power through a thermal-to-electric converter to generate electrical power; and outputting at least a portion of the generated electrical power. Also disclosed is a power generation system, comprising: an electrical power source of at least about 5,000 kW; a plurality of electrodes electrically coupled to the power source, wherein the plurality of electrodes is configured to deliver electrical power to a water-based fuel comprising a majority $H_2O$ to produce a thermal power; and a heat exchanger configured to convert at least a portion of the thermal power into electrical power; and a photovoltaic power converter configured to convert at least a portion of the light into electrical power. In addition, another embodiment is directed to a power generation system, comprising: an electrical power source of at least about 5,000 kW; a plurality of spaced apart electrodes, wherein at least one of the plurality of electrodes includes a compression mechanism; a fuel loading region configured to receive a water-based fuel comprising a majority $H_2O$, wherein the fuel loading region is surrounded by the plurality of electrodes so that the compression mechanism of the at least one electrode is oriented towards the fuel loading region, and wherein the plurality of electrodes are electrically connected to the electrical power source and configured to supply power to the water-based fuel received in the fuel loading region to ignite the fuel; a delivery mechanism for moving the water-based fuel into the fuel loading region; and a photovoltaic power converter configured to convert plasma generated from the ignition of the fuel into a non-plasma form of power.

BRIEF DESCRIPTION OF THE DRAWINGS

The accompanying drawings, which are incorporated in and constitute a part of this specification, illustrate several embodiments of the disclosure and together with the description, serve to explain the principles of the disclosure. In the drawings:

FIG. 2C is a schematic drawing of a SF-CIHT cell power generator showing an optical distribution and the photovoltaic converter system in accordance with an embodiment of the present disclosure.

FIG. 2C1 is a schematic drawing of a SF-CIHT cell power generator showing an optical distribution and the photovoltaic converter system and auxiliary system elements in accordance with an embodiment of the present disclosure.

FIG. 2C2 is a schematic drawing of a SF-CIHT cell power generator showing the ignition system and auxiliary system elements in accordance with an embodiment of the present disclosure.

FIG. 2C3 is a schematic drawing of a SF-CIHT cell power generator showing a louver fan accordance with an embodiment of the present disclosure.

FIG. 2G1 is a schematic drawing of a SF-CIHT cell power generator showing the placement of motors, pumps, and other components outside of the region housing the roller electrodes and further showing a fuel recirculation system with a louver fan in accordance with an embodiment of the present disclosure.

FIG. 2G1*a* is a schematic drawing of a SF-CIHT cell power generator showing details of the rinsing line with jets and gas distribution ducts of a fuel recirculation system in accordance with an embodiment of the present disclosure.

FIG. 2G1*b* is a schematic drawing of a SF-CIHT cell power generator showing the ducts of a fuel recirculation system with a perforated window gas diffuser in accordance with an embodiment of the present disclosure.

FIG. 2G1*c* is a schematic drawing of a SF-CIHT cell power generator showing details of the gas distribution ducts and duct blower of a fuel recirculation system in accordance with an embodiment of the present disclosure.

FIG. 2G1*d* is a schematic drawing of a SF-CIHT cell power generator showing details of a V-shaped screen in the walls of the slurry trough in accordance with an embodiment of the present disclosure.

FIG. 2G1*d*1 is a schematic drawing of a SF-CIHT cell power generator showing details of a pivoting bus bar ignition system in accordance with an embodiment of the present disclosure.

FIG. 2G1*e* is a schematic of a piezoelectric actuator system in accordance with an embodiment of the present disclosure.

FIG. 2G1*e*1 is a schematic drawing of a SF-CIHT cell power generator showing details of fuel powder injection and ignition system in accordance with an embodiment of the present disclosure.

FIG. 2G1*e*2 is a schematic drawing of a SF-CIHT cell power generator showing details of fuel powder injection and ignition system with a blower and cyclone separator fuel recirculation-regeneration system in accordance with an embodiment of the present disclosure.

FIG. 2G1*e*3 is a schematic drawing of a SF-CIHT cell power generator showing details of fuel powder injection and ignition system with a blower and cyclone separator fuel recirculation-regeneration system in accordance with an embodiment of the present disclosure.

FIG. 2G1*e*4 is a schematic drawing of a photoelectronic cell of the transmission or semitransparent type in accordance with an embodiment of the present disclosure.

FIG. 2G1*e*5 is a schematic drawing of a photoelectronic cell of the reflective or opaque type in accordance with an embodiment of the present disclosure.

FIG. 2G1*e*6 is a schematic drawing of a photoelectronic cell of the reflective or opaque type comprising a grid anode or collector in accordance with an embodiment of the present disclosure.

FIG. 2H1 is a schematic drawing of a SF-CIHT cell power generator showing a cell capable of maintaining a vacuum, an ignition system having a railgun shot injection system fed by two transporters, augmented plasma railgun and gravity recovery systems, a pelletizer, and a photovoltaic converter system in accordance with an embodiment of the present disclosure.

FIG. 2H2 is a schematic drawing of a SF-CIHT cell power generator showing a cell capable of maintaining a vacuum, an ignition system having a railgun shot injection system fed by two transporters, augmented plasma railgun and gravity recovery systems, a pelletizer, and a photovoltaic converter system showing the details of the ignition system and it power supply in accordance with an embodiment of the present disclosure.

FIG. 2H3 is a schematic drawing of a SF-CIHT cell power generator showing a cell capable of maintaining a vacuum, an ignition system having a railgun shot injection system fed by two transporters, augmented plasma railgun and gravity recovery systems, a pelletizer, and a photovoltaic converter system showing the details of the ignition system and the photovoltaic converter system in accordance with an embodiment of the present disclosure.

FIG. 2H4 is a schematic drawing of a SF-CIHT cell power generator showing a cell capable of maintaining a vacuum, an ignition system having a railgun shot injection system fed by two transporters, augmented plasma railgun and gravity recovery systems, a pelletizer, and a photovoltaic converter system showing the details of the ignition and injection systems, the ignition product recovery systems, and the pelletizer to form shot fuel in accordance with an embodiment of the present disclosure.

FIG. 2I1 is a schematic drawing of a SF-CIHT cell power generator showing two views of a cell capable of maintaining a vacuum, an ignition system having a railgun shot injection system fed directly from a pelletizer, augmented plasma railgun and gravity recovery systems, the pelletizer, and a photovoltaic converter system in accordance with an embodiment of the present disclosure.

FIG. 2I2 is a schematic drawing of a SF-CIHT cell power generator showing a cell capable of maintaining a vacuum, an ignition system having a railgun shot injection system fed directly from a pelletizer, augmented plasma railgun and gravity recovery systems, the pelletizer, and a photovoltaic converter system in accordance with an embodiment of the present disclosure.

FIG. 2I3 is a schematic drawing of a SF-CIHT cell power generator showing a cell capable of maintaining a vacuum, an ignition system having a railgun shot injection system fed directly from a pelletizer, augmented plasma railgun and gravity recovery systems, the pelletizer, and a photovoltaic converter system showing the details of the railgun injector and ignition system and the photovoltaic converter system in accordance with an embodiment of the present disclosure.

FIG. 2I4 is a schematic drawing of a SF-CIHT cell power generator showing a cell capable of maintaining a vacuum, an ignition system having a railgun shot injection system fed directly from a pelletizer, augmented plasma railgun and gravity recovery systems, the pelletizer, and a photovoltaic converter system showing the details of the injection system having a mechanical agitator, the ignition system, the ignition product recovery systems, and the pelletizer to form shot fuel in accordance with an embodiment of the present disclosure.

FIG. 2I5 is a schematic drawing of a SF-CIHT cell power generator showing a cell capable of maintaining a vacuum, an ignition system having a railgun shot injection system fed directly from a pelletizer, augmented plasma railgun and gravity recovery systems, the pelletizer, and a photovoltaic converter system showing the details of the injection system having a water jet agitator, the ignition system, the ignition product recovery systems, and the pelletizer to form shot fuel in accordance with an embodiment of the present disclosure.

FIG. 3 is the absolute spectrum in the 120 nm to 450 nm region of the ignition of a 80 mg shot of silver comprising absorbed $H_2$ and $H_2O$ from gas treatment of silver melt before dripping into a water reservoir showing an average optical power of 172 kW, essentially all in the ultraviolet spectral region according to a fuel embodiment.

FIG. 4 is the setup of the Parr 1341 calorimeter used for the energy balance determination.

FIG. 5 shows brilliant-light emitting expanding plasma formed from the high-current detonation of the solid fuel $Cu+CuO+H_2O$ filmed at 6500 frames per second.

FIG. 6 shows the temporal full width half maximum light intensity of the ignition event of solid fuel $Cu+H_2O$ measured with a fast photodiode was 0.7 ms.

DETAILED DESCRIPTION

Figure 1:
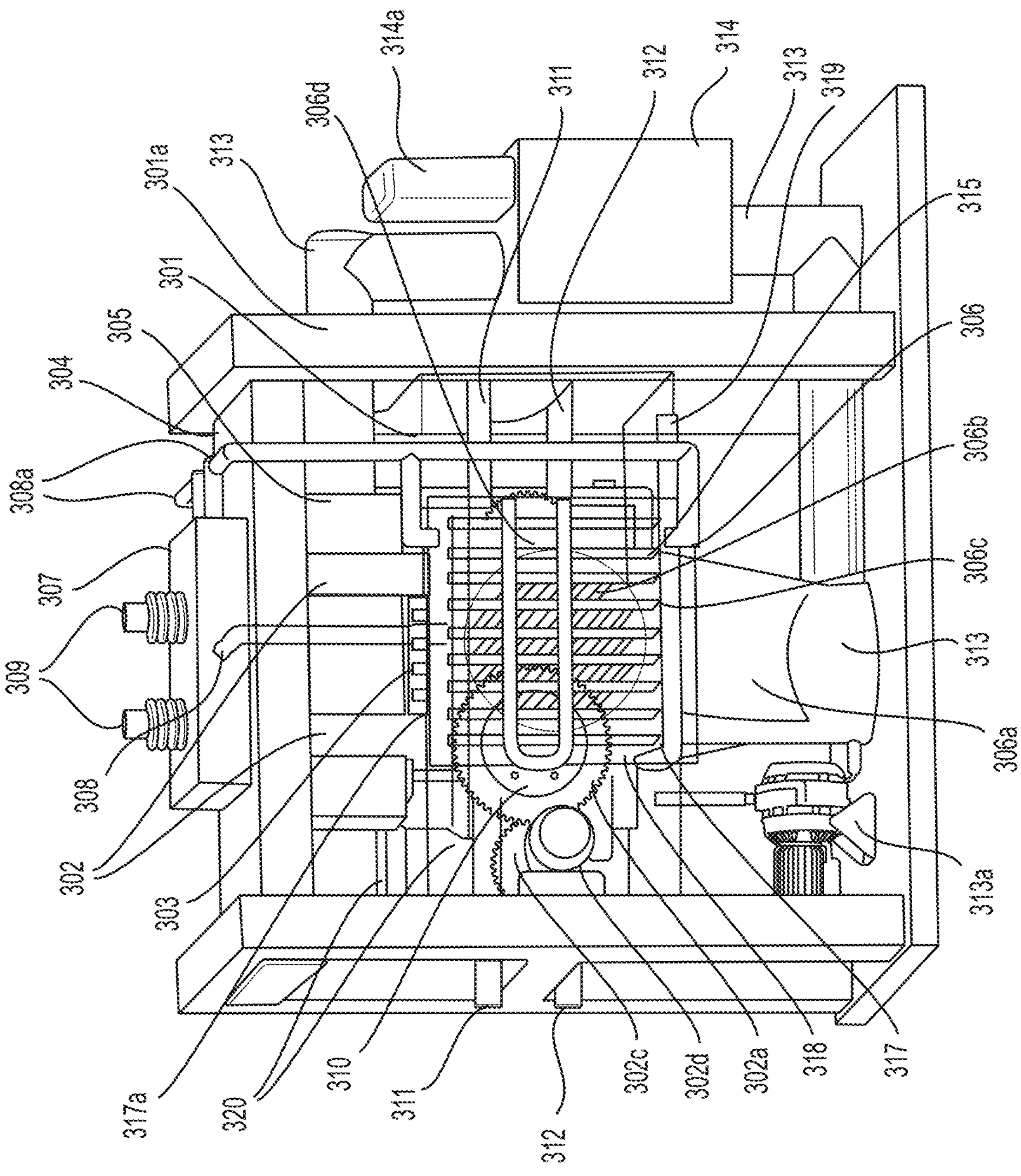
FIG. 1 is a schematic drawing of a SF-CIHT cell power generator showing a plasmadynamic converter in accordance with an embodiment of the present disclosure.

Disclosed here in are catalyst systems to release energy from atomic hydrogen to form lower energy states wherein the electron shell is at a closer position relative to the nucleus. The released power is harnessed for power generation and additionally new hydrogen species and compounds are desired products. These energy states are predicted by classical physical laws and require a catalyst to accept energy from the hydrogen in order to undergo the corresponding energy-releasing transition.

Classical physics gives closed-form solutions of the hydrogen atom, the hydride ion, the hydrogen molecular ion, and the hydrogen molecule and predicts corresponding species having fractional principal quantum numbers. Using Maxwell's equations, the structure of the electron was derived as a boundary-value problem wherein the electron comprises the source current of time-varying electromagnetic fields during transitions with the constraint that the bound n=1 state electron cannot radiate energy. A reaction predicted by the solution of the H atom involves a resonant, nonradiative energy transfer from otherwise stable atomic hydrogen to a catalyst capable of accepting the energy to form hydrogen in lower-energy states than previously thought possible. Specifically, classical physics predicts that atomic hydrogen may undergo a catalytic reaction with certain atoms, excimers, ions, and diatomic hydrides which provide a reaction with a net enthalpy of an integer multiple of the potential energy of atomic hydrogen, $E_h=27.2$ eV where $E_h$ is one Hartree. Specific species (e.g. $He^+$, $Ar^+$, $Sr^+$, K, Li, HCl, and NaH, OH, SH, SeH, nascent $H_2O$, nH (n=integer)) identifiable on the basis of their known electron energy levels are required to be present with atomic hydrogen to catalyze the process. The reaction involves a nonradiative energy transfer followed by q·13.6 eV continuum emission or q·13.6 eV transfer to H to form extraordinarily hot, excited-state H and a hydrogen atom that is lower in energy than unreacted atomic hydrogen that corresponds to a fractional principal quantum number. That is, in the formula for the principal energy levels of the hydrogen atom:

$$E_n = -\frac{e^2}{n^2 8\pi\varepsilon_o a_H} = -\frac{13.598\text{ eV}}{n^2}. \tag{1}$$

$$n = 1, 2, 3, \ldots \tag{2}$$

where $a_H$ is the Bohr radius for the hydrogen atom (52.947 pm), e is the magnitude of the charge of the electron, and $\varepsilon_o$ is the vacuum permittivity, fractional quantum numbers:

$$n = 1, \frac{1}{2}, \frac{1}{3}, \frac{1}{4}, \ldots, \frac{1}{p}; \tag{3}$$

where $p \leq 137$ is an integer replace the well known parameter n=integer in the Rydberg equation for hydrogen excited states and represent lower-energy-state hydrogen atoms called "hydrinos." Then, similar to an excited state having the analytical solution of Maxwell's equations, a hydrino atom also comprises an electron, a proton, and a photon. However, the electric field of the latter increases the binding corresponding to desorption of energy rather than decreasing the central field with the absorption of energy as in an excited state, and the resultant photon-electron interaction of the hydrino is stable rather than radiative.

The n=1 state of hydrogen and the $$n = \frac{1}{\text{integer}}$$

states of hydrogen are nonradiative, but a transition between two nonradiative states, say n=1 to n=1/2, is possible via a nonradiative energy transfer. Hydrogen is a special case of the stable states given by Eqs. (1) and (3) wherein the corresponding radius of the hydrogen or hydrino atom is given by $$r = \frac{a_H}{p}, \tag{4}$$

where p=1, 2, 3, . . . . In order to conserve energy, energy must be transferred from the hydrogen atom to the catalyst in units of $$m \cdot 27.2\text{ eV}, \tag{5}$$

and the radius transitions to $$\frac{a_H}{m+p}.$$

The catalyst reactions involve two steps of energy release: a nonradiative energy transfer to the catalyst followed by additional energy release as the radius decreases to the corresponding stable final state. It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications. In the case of the catalysis of hydrino atoms to lower energy states, the enthalpy of reaction of m·27.2 eV (Eq. (5)) is relativistically corrected by the same factor as the potential energy of the hydrino atom.

Thus, the general reaction is given by $$m\cdot 272\ \text{eV} + Cat^{q+} + H\left[\frac{a_H}{p}\right] \rightarrow Cat^{(q+r)+} + re^- + H^*\left[\frac{a_H}{(m+p)}\right] + m\cdot 27.2\ \text{eV} \tag{6}$$

$$H^*\left[\frac{a_H}{(m+p)}\right] \rightarrow H\left[\frac{a_H}{(m+p)}\right] + [(m+p)^2 - p^2]\cdot 13.6\ \text{eV} - m\cdot 27.2\ \text{eV} \tag{7}$$

$$Cat^{(q+r)+} + re^- \rightarrow Cat^{q+} + m\cdot 27.2\ \text{eV and} \tag{8}$$

the overall reaction is $$H\left[\frac{a_H}{p}\right] \rightarrow H\left[\frac{a_H}{(m+p)}\right] + [(m+p)^2 - p^2]\cdot 13.6\ \text{eV} \tag{9}$$

q, r, m, and p are integers.

$$H^*\left[\frac{a_H}{(m+p)}\right]$$

has the radius of the hydrogen atom (corresponding to 1 in the denominator) and a central field equivalent to (m+p) times that of a proton, and $$\text{H}\left[\frac{a_H}{(m+p)}\right]$$

is the corresponding stable state with the radius of $$\frac{1}{(m+p)}$$

that of H. As the electron undergoes radial acceleration from the radius of the hydrogen atom to a radius of $$\frac{1}{(m+p)}$$

this distance, energy is released as characteristic light emission or as third-body kinetic energy. The emission may be in the form of an extreme-ultraviolet continuum radiation having an edge at $[(p+m)^2-p^2-2m]\cdot 13.6$ eV or $$\frac{91.2}{[(m+p)^2 - p^2 - 2m]}\ \text{nm}$$

and extending to longer wavelengths. In addition to radiation, a resonant kinetic energy transfer to form fast H may occur. Subsequent excitation of these fast H(n=1) atoms by collisions with the background $H_2$ followed by emission of the corresponding H(n=3) fast atoms gives rise to broadened Balmer α emission. Alternatively, fast H is a direct product of H or hydrino serving as the catalyst wherein the acceptance of the resonant energy transfer regards the potential energy rather than the ionization energy. Conservation of energy gives a proton of the kinetic energy corresponding to one half the potential energy in the former case and a catalyst ion at essentially rest in the latter case. The H recombination radiation of the fast protons gives rise to broadened Balmer α emission that is disproportionate to the inventory of hot hydrogen consistent with the excess power balance.

In the present disclosure the terms such as hydrino reaction, H catalysis, H catalysis reaction, catalysis when referring to hydrogen, the reaction of hydrogen to form hydrinos, and hydrino formation reaction all refer to the reaction such as that of Eqs. (6-9)) of a catalyst defined by Eq. (5) with atomic H to form states of hydrogen having energy levels given by Eqs. (1) and (3). The corresponding terms such as hydrino reactants, hydrino reaction mixture, catalyst mixture, reactants for hydrino formation, reactants that produce or form lower-energy state hydrogen or hydrinos are also used interchangeably when referring to the reaction mixture that performs the catalysis of H to H states or hydrino states having energy levels given by Eqs. (1) and (3).

The catalytic lower-energy hydrogen transitions of the present disclosure require a catalyst that may be in the form of an endothermic chemical reaction of an integer m of the potential energy of uncatalyzed atomic hydrogen, 27.2 eV, that accepts the energy from atomic H to cause the transition. The endothermic catalyst reaction may be the ionization of one or more electrons from a species such as an atom or ion (e.g. m=3 for $Li \rightarrow Li^{2+}$) and may further comprise the concerted reaction of a bond cleavage with ionization of one or more electrons from one or more of the partners of the initial bond (e.g. m=2 for $NaH \rightarrow Na^{2+} + H$). $He^+$ fulfills the catalyst criterion—a chemical or physical process with an enthalpy change equal to an integer multiple of 27.2 eV since it ionizes at 54.417 eV, which is 2·27.2 eV. An integer number of hydrogen atoms may also serve as the catalyst of an integer multiple of 27.2 eV enthalpy. Hydrogen atoms H (1/p) p=1, 2, 3, . . . 137 can undergo further transitions to lower-energy states given by Eqs. (1) and (3) wherein the transition of one atom is catalyzed by one or more additional H atoms that resonantly and nonradiatively accepts m·27.2 eV with a concomitant opposite change in its potential energy. The overall general equation for the transition of H(1/p) to H(1/(m+p)) induced by a resonance transfer of m·27.2 eV to H(1/p') is represented by $$\mathrm{H}(1/p') + H(1/p) \to \mathrm{H} + \mathrm{H}(1/(m+p)) + [2pm + m^2 - p'^2 + 1]\cdot 13.6\ \mathrm{eV} \quad (10)$$

Hydrogen atoms may serve as a catalyst wherein m=1, m=2, and m=3 for one, two, and three atoms, respectively, acting as a catalyst for another. The rate for the two-atom-catalyst, 2H, may be high when extraordinarily fast H collides with a molecule to form the 2H wherein two atoms resonantly and nonradiatively accept 54.4 eV from a third hydrogen atom of the collision partners. By the same mechanism, the collision of two hot $H_2$ provide 3H to serve as a catalyst of 3·27.2 eV for the fourth. The EUV continua at 22.8 nm and 10.1 nm, extraordinary (>100 eV) Balmer α line broadening, highly excited H states, the product gas $H_2$(¼), and large energy release is observed consistent with predictions.

H(¼) is a preferred hydrino state based on its multipolarity and the selection rules for its formation. Thus, in the case that H(⅓) is formed, the transition to H(¼) may occur rapidly catalyzed by H according to Eq. (10). Similarly, H(¼) is a preferred state for a catalyst energy greater than or equal to 81.6 eV corresponding to m=3 in Eq. (5). In this case the energy transfer to the catalyst comprises the 81.6 eV that forms that H*(¼) intermediate of Eq. (7) as well as an integer of 27.2 eV from the decay of the intermediate. For example, a catalyst having an enthalpy of 108.8 eV may form H*(¼) by accepting 81.6 eV as well as 27.2 eV from the H*(¼) decay energy of 122.4 eV. The remaining decay energy of 95.2 eV is released to the environment to form the preferred state H(¼) that then reacts to form $H_2$(¼).

A suitable catalyst can therefore provide a net positive enthalpy of reaction of m·27.2 eV. That is, the catalyst resonantly accepts the nonradiative energy transfer from hydrogen atoms and releases the energy to the surroundings to affect electronic transitions to fractional quantum energy levels. As a consequence of the nonradiative energy transfer, the hydrogen atom becomes unstable and emits further energy until it achieves a lower-energy nonradiative state having a principal energy level given by Eqs. (1) and (3). Thus, the catalysis releases energy from the hydrogen atom with a commensurate decrease in size of the hydrogen atom, $r_n = na_H$ where n is given by Eq. (3). For example, the catalysis of H(n=1) to H(n=¼) releases 204 eV, and the hydrogen radius decreases from $$a_H \frac{1}{4} a_H.$$

The catalyst product, H(1/p), may also react with an electron to form a hydrino hydride ion $H^-(1/p)$, or two H(1/p) may react to form the corresponding molecular hydrino $H_2(1/p)$. Specifically, the catalyst product, H(1/p), may also react with an electron to form a novel hydride ion $H^-(1/p)$ with a binding energy $E_B$:

$$E_B = \frac{\hbar^2\sqrt{s(s+1)}}{8\mu_e a_0^2\left[\frac{1+\sqrt{s(s+1)}}{p}\right]^2} - \frac{\pi\mu_0 e^2\hbar^2}{m_e^2}\left(\frac{1}{a_H^3} + \frac{2^2}{a_0^3\left[\frac{1+\sqrt{s(s+1)}}{p}\right]^3}\right) \quad (11)$$

where p=integer>1, s=1/2, ℏ is Planck's constant bar, $\mu_o$ is the permeability of vacuum, $m_e$ is the mass of the electron, $\mu_e$ is the reduced electron mass given by $$\mu_e = \frac{m_e m_p}{\frac{m_e}{\sqrt{\frac{3}{4}}} + m_p}$$

where $m_p$ is the mass of the proton, $a_o$ is the Bohr radius, and the ionic radius is $$r_1 \frac{a_0}{p}\left(1+\sqrt{s(s+1)}\right).$$

From Eq. (11), the calculated ionization energy of the hydride ion is 0.75418 eV, and the experimental value is 6082.99±0.15 $cm^{-1}$ (0.75418 eV). The binding energies of hydrino hydride ions may be measured by X-ray photoelectron spectroscopy (XPS).

Upfield-shifted NMR peaks are direct evidence of the existence of lower-energy state hydrogen with a reduced radius relative to ordinary hydride ion and having an increase in diamagnetic shielding of the proton. The shift is given by the sum of the contributions of the diamagnetism of the two electrons and the photon field of magnitude p (Mills GUTCP Eq. (7.87)):

$$\frac{\Delta B_T}{B} = -\mu_0 \frac{pe^2}{12 m_e a_0\left(1+\sqrt{s(s+1)}\right)}(1+p\alpha^2) = -(p29.9 + p^2 1.59\times 10^{-3})\ ppm \quad (12)$$

where the first term applies to $H^-$ with p=1 and p=integer>1 for $H^-(1/p)$ and α is the fine structure constant. The predicted hydrino hydride peaks are extraordinarily upfield shifted relative to ordinary hydride ion. In an embodiment, the peaks are upfield of TMS. The NMR shift relative to TMS may be greater than that known for at least one of ordinary $H^-$, H, $H_2$, or $H^+$ alone or comprising a compound. The shift may be greater than at least one of 0, −1, −2, −3, −4, −5, −6, −7, −8, −9, −10, −11, −12, −13, −14, −15, −16, −17, −18, −19, −20, −21, −22, −23, −24, −25, −26, −27, −28, −29, −30, −31, −32, −33, −34, −35, −36, −37, −38, −39, and −40 ppm. The range of the absolute shift relative to a bare proton, wherein the shift of TMS is about −31.5 relative to a bare proton, may be $-(p29.9+p^2 2.74)$ ppm (Eq. (12)) within a range of about at least one of ±5 ppm, ±10 ppm, ±20 ppm, ±30 ppm, ±40 ppm, ±50 ppm, ±60 ppm, ±70 ppm, ±80 ppm, ±90 ppm, and ±100 ppm. The range of the absolute shift relative to a bare proton may be $-(p29.9+p^2 1.59\times10^{-3})$ ppm (Eq. (12)) within a range of about at least one of about 0.1% to 99%, 1% to 50%, and 1% to 10%. In another embodiment, the presence of a hydrino species such as a hydrino atom, hydride ion, or molecule in a solid matrix such as a matrix of a hydroxide such as NaOH or KOH causes the matrix protons to shift upfield. The matrix protons such as those of NaOH or KOH may exchange. In an embodiment, the shift may cause the matrix peak to be in the range of about −0.1 ppm to −5 ppm relative to TMS. The NMR determination may comprise magic angle spinning $^1H$ nuclear magnetic resonance spectroscopy (MAS $^1H$ NMR).

H (1/p) may react with a proton and two H(1/p) may react to form $H_2(1/p)^+$ and $H_2(1/p)$, respectively. The hydrogen molecular ion and molecular charge and current density functions, bond distances, and energies were solved from the Laplacian in ellipsoidal coordinates with the constraint of nonradiation.

$$(\eta-\zeta)R_\xi\frac{\partial}{\partial\xi}\left(R_\xi\frac{\partial\phi}{\partial\xi}\right)+(\zeta-\xi)R_\eta\frac{\partial}{\partial\eta}\left(R_\eta\frac{\partial\phi}{\partial\eta}\right)+(\xi-\eta)R_\zeta\frac{\partial}{\partial\zeta}\left(R_\zeta\frac{\partial\phi}{\partial\zeta}\right)=0 \quad (13)$$

The total energy $E_T$ of the hydrogen molecular ion having a central field of +pe at each focus of the prolate spheroid molecular orbital is $$E_T=-p^2\left\{\begin{array}{l}\frac{e^2}{8\pi\varepsilon_o a_H}(4\ln 3-1-2\ln 3)\left[1+p\sqrt{\frac{2\hbar\sqrt{\frac{2e^2}{4\pi\varepsilon_o(2a_H)^3}}{m_e}}{m_ec^2}}\right]\\-\frac{1}{2}\hbar\sqrt{\frac{\frac{pe^2}{4\pi\varepsilon_o\left[\frac{2a_H}{p}\right]^3}-\frac{pe^2}{8\pi\varepsilon_o\left(\frac{3a_H}{p}\right)^3}}{\mu}}\end{array}\right\} \quad (14)$$
$$=-p^2 16.13392\text{ eV}-p^3 0.118755\text{ eV}$$

where p is an integer, c is the speed of light in vacuum, and μ is the reduced nuclear mass. The total energy of the hydrogen molecule having a central field of +pe at each focus of the prolate spheroid molecular orbital is $$E_T=-p^2\left\{\begin{array}{l}\frac{e^2}{8\pi\varepsilon_o a_0}\left[\left(2\sqrt{2}-\sqrt{2}+\frac{\sqrt{2}}{2}\right)\ln\frac{\sqrt{2}+1}{\sqrt{2}-1}-\sqrt{2}\right]\left[1+p\sqrt{\frac{2\hbar\sqrt{\frac{e^2}{4\pi\varepsilon_o a_0^3}}{m_e}}{m_ec^2}}\right]\\-\frac{1}{2}\hbar\sqrt{\frac{\frac{pe^2}{8\pi\varepsilon_o\left(\frac{a_0}{p}\right)^3}-\frac{pe^2}{8\pi\varepsilon_o\left(\frac{\left(1+\frac{1}{\sqrt{2}}\right)a_0}{p}\right)^3}}{\mu}}\end{array}\right\} \quad (15)$$
$$=-p^2 31.351\text{ eV}-p^3 0.326469\text{ eV}$$

The bond dissociation energy, $E_D$, of the hydrogen molecule $H_2(1/p)$ is the difference between the total energy of the corresponding hydrogen atoms and $E_T$ $$E_D=E(2H(1/p))-E_T \quad (16)$$

where $$E(2H(1/p))=-p^2 27.20\text{ eV} \quad (17)$$

-continued $E_D$ is given by Eqs. (16-17) and (15):

$$\begin{aligned}E_D&=-p^2 27.20\text{ eV}-E_T\\&=-p^2 27.20\text{ eV}-(-p^2 31.351\text{ eV}-p^3 0.326469\text{ eV})\\&=-p^2 4.151\text{ eV}+p^3 0.326469\text{ eV}\end{aligned} \quad (18)$$

$H_2(1/p)$ may be identified by X-ray photoelectron spectroscopy (XPS) wherein the ionization product in addition to the ionized electron may be at least one of the possibilities such as those comprising two protons and an electron, a hydrogen (H) atom, a hydrino atom, a molecular ion, hydrogen molecular ion, and $H_2(1/p)^+$ wherein the energies may be shifted by the matrix.

The NMR of catalysis-product gas provides a definitive test of the theoretically predicted chemical shift of $H_2(1/p)$. In general, the $^1H$ NMR resonance of $H_2(1/p)$ is predicted to be upfield from that of $H_2$ due to the fractional radius in elliptic coordinates wherein the electrons are significantly closer to the nuclei. The predicted shift, $$\frac{\Delta B_T}{B},\text{ for }H_2(1/p)$$

is given by the sum of the contributions of the diamagnetism of the two electrons and the photon field of magnitude p (Mills GUTCP Eqs. (11.415-11.416)):

$$\frac{\Delta B_T}{B}=-\mu_0\left(4-\sqrt{2}\ln\frac{\sqrt{2}+1}{\sqrt{2}-1}\right)\frac{pe^2}{36a_0m_e}(1+p\alpha^2) \quad (19)$$

$$\frac{\Delta B_T}{B}=-(p28.01+p^2 1.49\times10^{-3})\ ppm \quad (20)$$

where the first term applies to $H_2$ with p=1 and p=integer>1 for $H_2(1/p)$. The experimental absolute $H_2$ gas-phase resonance shift of −28.0 ppm is in excellent agreement with the predicted absolute gas-phase shift of −28.01 ppm (Eq. (20)). The predicted molecular hydrino peaks are extraordinarily upfield shifted relative to ordinary $H_2$. In an embodiment, the peaks are upfield of TMS. The NMR shift relative to TMS may be greater than that known for at least one of ordinary $H^-$, H, $H_2$, or $H^+$ alone or comprising a compound. The shift may be greater than at least one of 0, −1, −2, −3, −4, −5, −6, −7, −8, −9, −10, −11, −12, −13, −14, −15, −16, −17, −18, −19, −20, −21, −22, −23, −24, −25, −26, −27, −28, −29, −30, −31, −32, −33, −34, −35, −36, −37, −38, −39, and −40 ppm. The range of the absolute shift relative to a bare proton, wherein the shift of TMS is about −31.5 ppm relative to a bare proton, may be $-(p28.01+p^2 2.56)$ ppm (Eq. (20)) within a range of about at least one of ±5 ppm, ±10 ppm, ±20 ppm, ±30 ppm, ±40 ppm, ±50 ppm, ±60 ppm, ±70 ppm, ±80 ppm, ±90 ppm, and ±100 ppm. The range of the absolute shift relative to a bare proton may be $-(p28.01+p^2 1.49\times 10^{-3})$ ppm (Eq. (20)) within a range of about at least one of about 0.1% to 99%, 1% to 50%, and 1% to 10%.

The vibrational energies, $E_{vib}$, for the υ=0 to υ=1 transition of hydrogen-type molecules $H_2(1/p)$ are $$E_{vib} = p^2 0.515902 \text{ eV} \tag{21}$$

where p is an integer.

The rotational energies, $E_{rot}$, for the J to J+1 transition of hydrogen-type molecules $H_2(1/p)$ are $$E_{rot} = E_{J+1} - E_J = \frac{\hbar^2}{I}[J+1] = p^2(J+1)0.01509 \text{ eV} \tag{22}$$

where p is an integer and I is the moment of inertia. Ro-vibrational emission of $H_2(1/4)$ was observed on e-beam excited molecules in gases and trapped in solid matrix.

The $p^2$ dependence of the rotational energies results from an inverse p dependence of the internuclear distance and the corresponding impact on the moment of inertia I. The predicted internuclear distance 2c' for $H_2(1/p)$ is $$2c' = \frac{a_0\sqrt{2}}{p} \tag{23}$$

At least one of the rotational and vibration energies of $H_2(1/p)$ may be measured by at least one of electron-beam excitation emission spectroscopy, Raman spectroscopy, and Fourier transform infrared (FTIR) spectroscopy. $H_2(1/p)$ may be trapped in a matrix for measurement such as in at least one of MOH, MX, and $M_2CO_3$ (M=alkali; X=halide) matrix.

I. Catalysts $He^+$, $Ar^+$, $Sr^+$, Li, K, NaH, nH (n=integer), and $H_2O$ are predicted to serve as catalysts since they meet the catalyst criterion—a chemical or physical process with an enthalpy change equal to an integer multiple of the potential energy of atomic hydrogen, 27.2 eV. Specifically, a catalytic system is provided by the ionization of t electrons from an atom each to a continuum energy level such that the sum of the ionization energies of the t electrons is approximately m·27.2 eV where m is an integer. Moreover, further catalytic transitions may occur such as in the case wherein H(½) is first formed:

$$n = \frac{1}{2} \to \frac{1}{3}, \quad \frac{1}{3} \to \frac{1}{4}, \quad \frac{1}{4} \to \frac{1}{5},$$

and so on. Once catalysis begins, hydrinos autocatalyze further in a process called disproportionation wherein H or H(1/p) serves as the catalyst for another H or H(1/p') (p may equal p').

Hydrogen and hydrinos may serves as catalysts. Hydrogen atoms H(1/p) p=1, 2, 3, . . . 137 can undergo transitions to lower-energy states given by Eqs. (1) and (3) wherein the transition of one atom is catalyzed by a second that resonantly and nonradiatively accepts m·27.2 eV with a concomitant opposite change in its potential energy. The overall general equation for the transition of H(1/p) to H(1/(m+p)) induced by a resonance transfer of m·27.2 eV to H(1/p') is represented by Eq. (10). Thus, hydrogen atoms may serve as a catalyst wherein m=1, m=2, and m=3 for one, two, and three atoms, respectively, acting as a catalyst for another. The rate for the two- or three-atom-catalyst case would be appreciable only when the H density is high. But, high H densities are not uncommon. A high hydrogen atom concentration permissive of 2H or 3H serving as the energy acceptor for a third or fourth may be achieved under several circumstances such as on the surface of the Sun and stars due to the temperature and gravity driven density, on metal surfaces that support multiple monolayers, and in highly dissociated plasmas, especially pinched hydrogen plasmas. Additionally, a three-body H interaction is easily achieved when two H atoms arise with the collision of a hot H with $H_2$. This event can commonly occur in plasmas having a large population of extraordinarily fast H. This is evidenced by the unusual intensity of atomic H emission. In such cases, energy transfer can occur from a hydrogen atom to two others within sufficient proximity, being typically a few angstroms via multipole coupling. Then, the reaction between three hydrogen atoms whereby two atoms resonantly and nonradiatively accept 54.4 eV from the third hydrogen atom such that 2H serves as the catalyst is given by $$54.4 \text{ eV} + 2\text{ H} + \text{H} \to 2\text{ H}^+_{fast} + 2e^- + \text{H}*\left[\frac{a_H}{3}\right] + 54.4 \text{ eV} \tag{24}$$

$$\text{H}*\left[\frac{a_H}{3}\right] \to \text{H}\left[\frac{a_H}{3}\right] + 54.4 \text{ eV} \tag{25}$$

$$2\text{ H}^+_{fast} + 2e^- \to 2\text{ H} + 54.4 \text{ eV} \tag{26}$$

And, the overall reaction is $$\text{H} \to \text{H}\left[\frac{a_H}{3}\right] + [3^2 - 1^2]\cdot 13.6 \text{ eV} \tag{27}$$

wherein $$\text{H}*\left[\frac{a_H}{3}\right]$$

has the radius of the hydrogen atom and a central field equivalent to 3 times that of a proton and $$\text{H}\left[\frac{a_H}{3}\right]$$

is the corresponding stable state with the radius of ⅓ that of H. As the electron undergoes radial acceleration from the radius of the hydrogen atom to a radius of ⅓ this distance, energy is released as characteristic light emission or as third-body kinetic energy.

In another H-atom catalyst reaction involving a direct transition to $$\left[\frac{a_H}{4}\right]$$

state, two hot $H_2$ molecules collide and dissociate such that three H atoms serve as a catalyst of 3·27.2 eV for the fourth. Then, the reaction between four hydrogen atoms whereby three atoms resonantly and nonradiatively accept 81.6 eV from the fourth hydrogen atom such that 3H serves as the catalyst is given by $$81.6 \text{ eV} + 3\text{ H} + \text{H} \rightarrow 3\text{ H}^+_{fast} + 3e^- + \text{H}*\left[\frac{a_H}{4}\right] + 81.6 \text{ eV} \quad (28)$$

$$\text{H}*\left[\frac{a_H}{4}\right] \rightarrow \text{H}\left[\frac{a_H}{4}\right] + 122.4 \text{ eV} \quad (29)$$

$$3\text{ H}^+_{fast} + 3e^- \rightarrow 3\text{ H} + 81.6 \text{ eV} \quad (30)$$

And, the overall reaction is $$\text{H} \rightarrow \text{H}\left[\frac{a_H}{4}\right] + [4^2 - 1^2]\cdot 13.6 \text{ eV} \quad (31)$$

The extreme-ultraviolet continuum radiation band due to the $$\text{H}*\left[\frac{a_H}{4}\right]$$

intermediate of Eq. (28) is predicted to have short wavelength cutoff at 122.4 eV (10.1 nm) and extend to longer wavelengths. This continuum band was confirmed experimentally. In general, the transition of H to $$\text{H}\left[\frac{a_H}{p = m + 1}\right]$$

due by the acceptance of m·27.2 eV gives a continuum band with a short wavelength cutoff and energy $$E_{\left(H \rightarrow H\left[\frac{a_H}{p=m+1}\right]\right)}$$

given by $$E_{\left(H \rightarrow H\left[\frac{a_H}{p=m+1}\right]\right)} = m^2 \cdot 13.6 \text{ eV} \quad (32)$$

$$\lambda_{\left(H \rightarrow H\left[\frac{a_H}{p=m+1}\right]\right)} = \frac{91.2}{m^2} \text{ nm} \quad (33)$$

and extending to longer wavelengths than the corresponding cutoff. The hydrogen emission series of 10.1 nm, 22.8 nm, and 91.2 nm continua were observed experimentally in interstellar medium, the Sun and white dwarf stars.

The potential energy of $H_2O$ is 81.6 eV (Eq. (43)) [Mills GUT]. Then, by the same mechanism, the nascent $H_2O$ molecule (not hydrogen bonded in solid, liquid, or gaseous state) may serve as a catalyst (Eqs. (44-47)). The continuum radiation band at 10.1 nm and going to longer wavelengths for theoretically predicted transitions of H to lower-energy, so called "hydrino" states, was observed only arising from pulsed pinched hydrogen discharges first at BlackLight Power, Inc. (BLP) and reproduced at the Harvard Center for Astrophysics (CfA). Continuum radiation in the 10 to 30 nm region that matched predicted transitions of H to hydrino states, were observed only arising from pulsed pinched hydrogen discharges with metal oxides that are thermodynamically favorable to undergo H reduction to form HOH catalyst; whereas, those that are unfavorable did not show any continuum even though the low-melting point metals tested are very favorable to forming metal ion plasmas with strong short-wavelength continua in more powerful plasma sources.

Alternatively, a resonant kinetic energy transfer to form fast H may occur consistent with the observation of extraordinary Balmer α line broadening corresponding to high-kinetic energy H. The energy transfer to two H also causes pumping of the catalyst excited states, and fast H is produced directly as given by exemplary Eqs. (24), (28), and (47) and by resonant kinetic energy transfer.

II. Hydrinos

A hydrogen atom having a binding energy given by $$\text{Binding Energy} = \frac{13.6 \text{ eV}}{(1/p)^2} \quad (34)$$

where p is an integer greater than 1, preferably from 2 to 137, is the product of the H catalysis reaction of the present disclosure. The binding energy of an atom, ion, or molecule, also known as the ionization energy, is the energy required to remove one electron from the atom, ion or molecule. A hydrogen atom having the binding energy given in Eq. (34) is hereafter referred to as a "hydrino atom" or "hydrino." The designation for a hydrino of radius $$\frac{a_H}{p},$$

where $a_H$ is the radius of an ordinary hydrogen atom and p is an integer, is $$\text{H}\left[\frac{a_H}{p}\right].$$

A hydrogen atom with a radius $a_H$ is hereinafter referred to as "ordinary hydrogen atom" or "normal hydrogen atom." Ordinary atomic hydrogen is characterized by its binding energy of 13.6 eV.

Hydrinos are formed by reacting an ordinary hydrogen atom with a suitable catalyst having a net enthalpy of reaction of $$m \cdot 27.2 \text{ eV} \quad (35)$$

where m is an integer. It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications.

This catalysis releases energy from the hydrogen atom with a commensurate decrease in size of the hydrogen atom, $r_n = na_H$. For example, the catalysis of H(n=1) to H(n=½) releases 40.8 eV, and the hydrogen radius decreases from $$a_H \text{ to } \frac{1}{2}a_H.$$

A catalytic system is provided by the ionization of t electrons from an atom each to a continuum energy level such that the sum of the ionization energies of the t electrons is approximately m·27.2 eV where m is an integer. As a power source, the energy given off during catalysis is much greater than the energy lost to the catalyst. The energy released is large as compared to conventional chemical reactions. For example, when hydrogen and oxygen gases undergo combustion to form water $$H_2(g) + \frac{1}{2}O_2(g) \to H_2O(l) \tag{36}$$

the known enthalpy of formation of water is $\Delta H_f = -286$ kJ/mole or 1.48 eV per hydrogen atom. By contrast, each (n=1) ordinary hydrogen atom undergoing catalysis releases a net of 40.8 eV. Moreover, further catalytic transitions may occur:

$$n = \frac{1}{2} \to \frac{1}{3}, \frac{1}{3} \to \frac{1}{4}, \frac{1}{4} \to \frac{1}{5},$$

and so on. Once catalysis begins, hydrinos autocatalyze further in a process called disproportionation. This mechanism is similar to that of an inorganic ion catalysis. But, hydrino catalysis should have a higher reaction rate than that of the inorganic ion catalyst due to the better match of the enthalpy to m·27.2 eV.

III. Hydrino Catalysts and Hydrino Products

Hydrogen catalysts capable of providing a net enthalpy of reaction of approximately m·27.2 eV where m is an integer to produce a hydrino (whereby t electrons are ionized from an atom or ion) are given in TABLE 1. The atoms or ions given in the first column are ionized to provide the net enthalpy of reaction of m·27.2 eV given in the tenth column where m is given in the eleventh column. The electrons, that participate in ionization are given with the ionization potential (also called ionization energy or binding energy). The ionization potential of the n th electron of the atom or ion is designated by $IP_n$ and is given by the CRC. That is for example, $Li + 5.39172\ eV \to Li^+ + e^-$ and $Li^+ + 75.6402\ eV \to Li^{2+} + e^-$. The first ionization potential, $IP_1 = 5.39172$ eV, and the second ionization potential, $IP_2 = 75.6402$ eV, are given in the second and third columns, respectively. The net enthalpy of reaction for the double ionization of Li is 81.0319 eV as given in the tenth column, and m=3 in Eq. (5) as given in the eleventh column.

TABLE 1

| Hydrogen Catalysts. | | | | | | | | | | |
|---|---|---|---|---|---|---|---|---|---|---|
| Catalyst | IP1 | IP2 | IP3 | IP4 | IP5 | IP6 | IP7 | IP8 | Enthalpy | m |
| Li | 5.39172 | 75.6402 | | | | | | | 81.032 | 3 |
| Be | 9.32263 | 18.2112 | | | | | | | 27.534 | 1 |
| Mg | 7.646235 | 15.03527 | 80.1437 | 109.2655 | 141.27 | | | | 353.3607 | 13 |
| K | 4.34066 | 31.63 | 45.806 | | | | | | 81.777 | 3 |
| Ca | 6.11316 | 11.8717 | 50.9131 | 67.27 | | | | | 136.17 | 5 |
| Ti | 6.8282 | 13.5755 | 27.4917 | 43.267 | 99.3 | | | | 190.46 | 7 |
| V | 6.7463 | 14.66 | 29.311 | 46.709 | 65.2817 | | | | 162.71 | 6 |
| Cr | 6.76664 | 16.4857 | 30.96 | | | | | | 54.212 | 2 |
| Mn | 7.43402 | 15.64 | 33.668 | 51.2 | | | | | 107.94 | 4 |
| Fe | 7.9024 | 16.1878 | 30.652 | | | | | | 54.742 | 2 |
| Fe | 7.9024 | 16.1878 | 30.652 | 54.8 | | | | | 109.54 | 4 |
| Co | 7.881 | 17.083 | 33.5 | 51.3 | | | | | 109.76 | 4 |
| Co | 7.881 | 17.083 | 33.5 | 51.3 | 79.5 | | | | 189.26 | 7 |
| Ni | 7.6398 | 18.1688 | 35.19 | 54.9 | 76.06 | | | | 191.96 | 7 |
| Ni | 7.6398 | 18.1688 | 35.19 | 54.9 | 76.06 | 108 | | | 299.96 | 11 |
| Cu | 7.72638 | 20.2924 | | | | | | | 28.019 | 1 |
| Zn | 9.39405 | 17.9644 | | | | | | | 27.358 | 1 |
| Zn | 9.39405 | 17.9644 | 39.723 | 59.4 | 82.6 | 108 | 134 | 174 | 625.08 | 23 |
| Ga | 5.999301 | 20.51514 | | | | | | | 26.5144 | 1 |
| As | 9.8152 | 18.633 | 28.351 | 50.13 | 62.63 | 127.6 | | | 297.16 | 11 |
| Se | 9.75238 | 21.19 | 30.8204 | 42.945 | 68.3 | 81.7 | 155.4 | | 410.11 | 15 |
| Kr | 13.9996 | 24.3599 | 36.95 | 52.5 | 64.7 | 78.5 | | | 271.01 | 10 |
| Kr | 13.9996 | 24.3599 | 36.95 | 52.5 | 64.7 | 78.5 | 111 | | 382.01 | 14 |
| Rb | 4.17713 | 27.285 | 40 | 52.6 | 71 | 84.4 | 99.2 | | 378.66 | 14 |
| Rb | 4.17713 | 27.285 | 40 | 52.6 | 71 | 84.4 | 99.2 | 136 | 514.66 | 19 |
| Sr | 5.69484 | 11.0301 | 42.89 | 57 | 71.6 | | | | 188.21 | 7 |
| Nb | 6.75885 | 14.32 | 25.04 | 38.3 | 50.55 | | | | 134.97 | 5 |
| Mo | 7.09243 | 16.16 | 27.13 | 46.4 | 54.49 | 68.8276 | | | 220.10 | 8 |
| Mo | 7.09243 | 16.16 | 27.13 | 46.4 | 54.49 | 68.8276 | 125.664 | 143.6 | 489.36 | 18 |
| Ru | 7.3605 | 16.76 | 28.47 | 50 | 60 | | | | 162.5905 | 6 |
| Pd | 8.3369 | 19.43 | | | | | | | 27.767 | 1 |
| Sn | 7.34381 | 14.6323 | 30.5026 | 40.735 | 72.28 | | | | 165.49 | 6 |
| Te | 9.0096 | 18.6 | | | | | | | 27.61 | 1 |
| Te | 9.0096 | 18.6 | 27.96 | | | | | | 55.57 | 2 |
| Cs | 3.8939 | 23.1575 | | | | | | | 27.051 | 1 |
| Ba | 5.211664 | 10.00383 | 35.84 | 49 | 62 | | | | 162.0555 | 6 |

TABLE 1-continued

| Hydrogen Catalysts. | | | | | | | | | | |
|---|---|---|---|---|---|---|---|---|---|---|
| Catalyst | IP1 | IP2 | IP3 | IP4 | IP5 | IP6 | IP7 | IP8 | Enthalpy | m |
| Ba | 5.21 | 10 | 37.3 | | | | | | | |
| Ce | 5.5387 | 10.85 | 20.198 | 36.758 | 65.55 | | | | 138.89 | 5 |
| Ce | 5.5387 | 10.85 | 20.198 | 36.758 | 65.55 | 77.6 | | | 216.49 | 8 |
| Pr | 5.464 | 10.55 | 21.624 | 38.98 | 57.53 | | | | 134.15 | 5 |
| Sm | 5.6437 | 11.07 | 23.4 | 41.4 | | | | | 81.514 | 3 |
| Gd | 6.15 | 12.09 | 20.63 | 44 | | | | | 82.87 | 3 |
| Dy | 5.9389 | 11.67 | 22.8 | 41.47 | | | | | 81.879 | 3 |
| Pb | 7.41666 | 15.0322 | 31.9373 | | | | | | 54.386 | 2 |
| Pt | 8.9587 | 18.563 | | | | | | | 27.522 | 1 |
| $He^+$ | | 54.4178 | | | | | | | 54.418 | 2 |
| $Na^+$ | | 47.2864 | 71.6200 | 98.91 | | | | | 217.816 | 8 |
| $Mg^{2+}$ | | | 80.1437 | | | | | | 80.1437 | 3 |
| $Rb^+$ | | 27.285 | | | | | | | 27.285 | 1 |
| $Fe^{3+}$ | | | | 54.8 | | | | | 54.8 | 2 |
| $Mo^{2+}$ | | | 27.13 | | | | | | 27.13 | 1 |
| $Mo^{4+}$ | | | | | 54.49 | | | | 54.49 | 2 |
| $In^{3+}$ | | | | 54 | | | | | 54 | 2 |
| $Ar^+$ | | 27.62 | | | | | | | 27.62 | 1 |
| $Sr^+$ | | 11.03 | 42.89 | | | | | | 53.92 | 2 |

The hydrino hydride ion of the present disclosure can be formed by the reaction of an electron source with a hydrino, that is, a hydrogen atom having a binding energy of about $$\frac{13.6\text{ eV}}{n^2},$$

where $$n = \frac{1}{p}$$

and p is an integer greater than 1. The hydrino hydride ion is represented by $H^-(n=1/p)$ or $H^-(1/p)$:

$$H\left[\frac{a_H}{p}\right] + e^- \rightarrow H^-(n = 1/p) \tag{37}$$

$$.H\left[\frac{a_H}{p}\right] + e^- \rightarrow H^-(1/p).. \tag{38}$$

The hydrino hydride ion is distinguished from an ordinary hydride ion comprising an ordinary hydrogen nucleus and two electrons having a binding energy of about 0.8 eV. The latter is hereafter referred to as "ordinary hydride ion" or "normal hydride ion." The hydrino hydride ion comprises a hydrogen nucleus including proteum, deuterium, or tritium, and two indistinguishable electrons at a binding energy according to Eqs. (39) and (40).

The binding energy of a hydrino hydride ion can be represented by the following formula:

$$\text{Binding Energy} = \frac{\hbar^2\sqrt{s(s+1)}}{8\mu_e a_0^2\left[\frac{1+\sqrt{s(s+1)}}{p}\right]^2} - \frac{\pi\mu_0 e^2\hbar^2}{m_e^2}\left(\frac{1}{a_H^3} + \frac{2^2}{a_0^3\left[\frac{1+\sqrt{s(s+1)}}{p}\right]^3}\right) \tag{39}$$

where p is an integer greater than one, s=1/2, π is pi, ℏ is Planck's constant bar, $\mu_o$ is the permeability of vacuum, $m_e$ is the mass of the electron, $\mu_e$ is the reduced electron mass given by $$\mu_e = \frac{m_e m_p}{\frac{m_e}{\sqrt{\frac{3}{4}}} + m_p}$$

where $m_p$ is the mass of the proton, $a_H$ is the radius of the hydrogen atom, $a_o$ is the Bohr radius, and e is the elementary charge. The radii are given by $$r_2 = r_1 = a_0\left(1 + \sqrt{s(s+1)}\right);\ s = \frac{1}{2}. \tag{40}$$

The binding energies of the hydrino hydride ion, $H^-(n=1/p)$ as a function of p, where p is an integer, are shown in TABLE 2.

TABLE 2

| The representative binding energy of the hydrino hydride ion $H^-$ (n = 1/p) as a function of p, Eq. (39). | | | |
|---|---|---|---|
| Hydride Ion | $r_1$ $(a_0)^a$ | Binding Energy $(eV)^b$ | Wavelength (nm) |
| $H^-$ (n = 1) | 1.8660 | 0.7542 | 1644 |
| $H^-$ (n = 1/2) | 0.9330 | 3.047 | 406.9 |
| $H^-$ (n = 1/3) | 0.6220 | 6.610 | 187.6 |
| $H^-$ (n = 1/4) | 0.4665 | 11.23 | 110.4 |
| $H^-$ (n = 1/5) | 0.3732 | 16.70 | 74.23 |
| $H^-$ (n = 1/6) | 0.3110 | 22.81 | 54.35 |
| $H^-$ (n = 1/7) | 0.2666 | 29.34 | 42.25 |
| $H^-$ (n = 1/8) | 0.2333 | 36.09 | 34.46 |
| $H^-$ (n = 1/9) | 0.2073 | 42.84 | 28.94 |
| $H^-$ (n = 1/10) | 0.1866 | 49.38 | 25.11 |
| $H^-$ (n = 1/11) | 0.1696 | 55.50 | 22.34 |
| $H^-$ (n = 1/12) | 0.1555 | 60.98 | 20.33 |
| $H^-$ (n = 1/13) | 0.1435 | 65.63 | 18.89 |
| $H^-$ (n = 1/14) | 0.1333 | 69.22 | 17.91 |
| $H^-$ (n = 1/15) | 0.1244 | 71.55 | 17.33 |

TABLE 2-continued

The representative binding energy of the hydrino hydride ion $H^-$ (n = 1/p) as a function of p, Eq. (39).

| Hydride Ion | $r_1$ $(a_0)^a$ | Binding Energy $(eV)^b$ | Wavelength (nm) |
|---|---|---|---|
| $H^-$ (n = 1/16) | 0.1166 | 72.40 | 17.12 |
| $H^-$ (n = 1/17) | 0.1098 | 71.56 | 17.33 |
| $H^-$ (n = 1/18) | 0.1037 | 68.83 | 18.01 |
| $H^-$ (n = 1/19) | 0.0982 | 63.98 | 19.38 |
| $H^-$ (n = 1/20) | 0.0933 | 56.81 | 21.82 |
| $H^-$ (n = 1/21) | 0.0889 | 47.11 | 26.32 |
| $H^-$ (n = 1/22) | 0.0848 | 34.66 | 35.76 |
| $H^-$ (n = 1/23) | 0.0811 | 19.26 | 64.36 |
| $H^-$ (n = 1/24) | 0.0778 | 0.6945 | 1785 |

[a]Eq. (40)
[b]Eq. (39)

According to the present disclosure, a hydrino hydride ion ($H^-$) having a binding energy according to Eqs. (39) and (40) that is greater than the binding of ordinary hydride ion (about 0.75 eV) for p=2 up to 23, and less for p=24 ($H^-$) is provided. For p=2 to p=24 of Eqs. (39) and (40), the hydride ion binding energies are respectively 3, 6.6, 11.2, 16.7, 22.8, 29.3, 36.1, 42.8, 49.4, 55.5, 61.0, 65.6, 69.2, 71.6, 72.4, 71.6, 68.8, 64.0, 56.8, 47.1, 34.7, 19.3, and 0.69 eV. Exemplary compositions comprising the novel hydride ion are also provided herein.

Exemplary compounds are also provided comprising one or more hydrino hydride ions and one or more other elements. Such a compound is referred to as a "hydrino hydride compound."

Ordinary hydrogen species are characterized by the following binding energies (a) hydride ion, 0.754 eV ("ordinary hydride ion"); (b) hydrogen atom ("ordinary hydrogen atom"), 13.6 eV; (c) diatomic hydrogen molecule, 15.3 eV ("ordinary hydrogen molecule"); (d) hydrogen molecular ion, 16.3 eV ("ordinary hydrogen molecular ion"); and (e) $H_3^+$, 22.6 eV ("ordinary trihydrogen molecular ion"). Herein, with reference to forms of hydrogen, "normal" and "ordinary" are synonymous.

According to a further embodiment of the present disclosure, a compound is provided comprising at least one increased binding energy hydrogen species such as (a) a hydrogen atom having a binding energy of about $$\frac{13.6\,\text{eV}}{\left(\frac{1}{p}\right)^2},$$

such as within a range of about 0.9 to 1.1 times $$\frac{13.6\,\text{eV}}{\left(\frac{1}{p}\right)^2}$$

where p is an integer from 2 to 137; (b) a hydride ion ($H^-$) having a binding energy of about $$\text{Binding Energy} = \frac{\hbar^2\sqrt{s(s+1)}}{8\mu_e a_0^2\left[\frac{1+\sqrt{s(s+1)}}{p}\right]^2} - \frac{\pi\mu_0 e^2\hbar^2}{m_e^2}\left(\frac{1}{a_H^3} + \frac{2^2}{a_0^3\left[\frac{1+\sqrt{s(s+1)}}{p}\right]^3}\right),$$

such as within a range of about 0.9 to 1.1 times the binding energy, where p is an integer from 2 to 24; (c) $H_4^+(1/p)$; (d) a trihydrino molecular ion, $H_3^+(1/p)$, having a binding energy of about $$\frac{22.6}{\left(\frac{1}{p}\right)^2}\ \text{eV}$$

such as within a range of about 0.9 to 1.1 times $$\frac{22.6}{\left(\frac{1}{p}\right)^2}\ \text{eV}$$

where p is an integer from 2 to 137; (e) a dihydrino having a binding energy of about $$\frac{15.3}{\left(\frac{1}{p}\right)^2}\ \text{eV}$$

such as within a range of about 0.9 to 1.1 times $$\frac{15.3}{\left(\frac{1}{p}\right)^2}\ \text{eV}$$

where p is an integer from 2 to 137; (f) a dihydrino molecular ion with a binding energy of about $$\frac{16.3}{\left(\frac{1}{p}\right)^2}\ \text{eV}$$

such as within a range of about 0.9 to 1.1 times $$\frac{16.3}{\left(\frac{1}{p}\right)^2}\ \text{eV}$$

where p is an integer, preferably an integer from 2 to 137.

According to a further embodiment of the present disclosure, a compound is provided comprising at least one increased binding energy hydrogen species such as (a) a dihydrino molecular ion having a total energy of about $$E_T = -p^2\left\{\frac{\frac{e^2}{8\pi\varepsilon_o a_H}(4\ln 3 - 1 - 2\ln 3)\left[1 + p\sqrt{\frac{2\hbar\sqrt{\frac{\frac{2e^2}{4\pi\varepsilon_o(2a_H)^3}}{m_e}}}{m_ec^2}}\right] -}{\frac{1}{2}\hbar\sqrt{\frac{\frac{pe^2}{4\pi\varepsilon_o\left(\frac{2a_H}{p}\right)^3} - \frac{pe^2}{8\pi\varepsilon_o\left(\frac{3a_H}{p}\right)^3}}{\mu}}}\right\} = -p^2 16.13392\text{ eV} - p^3 0.118755\text{ eV} \quad (41)$$

such as within a range of about 0.9 to 1.1 times the total energy $E_T$, where p is an integer, $\hbar$ is Planck's constant bar, $m_e$ is the mass of the electron, c is the speed of light in vacuum, and μ is the reduced nuclear mass, and (b) a dihydrino molecule having a total energy of about $$E_T = -p^2\left\{\begin{matrix}\frac{e^2}{8\pi\varepsilon_o a_0}\left[\left(2\sqrt{2} - \sqrt{2} + \frac{\sqrt{2}}{2}\right)\ln\frac{\sqrt{2}+1}{\sqrt{2}-1} - \sqrt{2}\right] \\ \left[1 + p\sqrt{\frac{2\hbar\sqrt{\frac{\frac{e^2}{4\pi\varepsilon_o a_0^3}}{m_e}}}{m_ec^2}}\right] \\ -\frac{1}{2}\hbar\sqrt{\frac{\frac{pe^2}{8\pi\varepsilon_o\left(\frac{a_0}{p}\right)^3} - \frac{pe^2}{8\pi\varepsilon_o\left(\frac{\left(1+\frac{1}{\sqrt{2}}\right)a_0}{p}\right)^3}}{\mu}}\end{matrix}\right\} = -p^2 31.351\text{ eV} - p^3 0.326469\text{ eV} \quad (42)$$

such as within a range of about 0.9 to 1.1 times $E_T$, where p is an integer and $a_o$ is the Bohr radius.

According to one embodiment of the present disclosure wherein the compound comprises a negatively charged increased binding energy hydrogen species, the compound further comprises one or more cations, such as a proton, ordinary $H_2^+$, or ordinary $H_3^+$.

A method is provided herein for preparing compounds comprising at least one hydrino hydride ion. Such compounds are hereinafter referred to as "hydrino hydride compounds." The method comprises reacting atomic hydrogen with a catalyst having a net enthalpy of reaction of about $$\frac{m}{2}\cdot 27\text{ eV},$$

where m is an integer greater than 1, preferably an integer less than 400, to produce an increased binding energy hydrogen atom having a binding energy of about $$\frac{13.6\text{ eV}}{\left(\frac{1}{p}\right)^2}$$

where p is an integer, preferably an integer from 2 to 137. A further product of the catalysis is energy. The increased binding energy hydrogen atom can be reacted with an electron source, to produce an increased binding energy hydride ion. The increased binding energy hydride ion can be reacted with one or more cations to produce a compound comprising at least one increased binding energy hydride ion.

The novel hydrogen compositions of matter can comprise:

(a) at least one neutral, positive, or negative hydrogen species (hereinafter "increased binding energy hydrogen species") having a binding energy
  - (i) greater than the binding energy of the corresponding ordinary hydrogen species, or
  - (ii) greater than the binding energy of any hydrogen species for which the corresponding ordinary hydrogen species is unstable or is not observed because the ordinary hydrogen species' binding energy is less than thermal energies at ambient conditions (standard temperature and pressure, STP), or is negative; and (b) at least one other element. The compounds of the present disclosure are hereinafter referred to as "increased binding energy hydrogen compounds."

By "other element" in this context is meant an element other than an increased binding energy hydrogen species. Thus, the other element can be an ordinary hydrogen species, or any element other than hydrogen. In one group of compounds, the other element and the increased binding energy hydrogen species are neutral. In another group of compounds, the other element and increased binding energy hydrogen species are charged such that the other element provides the balancing charge to form a neutral compound. The former group of compounds is characterized by molecular and coordinate bonding; the latter group is characterized by ionic bonding.

Also provided are novel compounds and molecular ions comprising (a) at least one neutral, positive, or negative hydrogen species (hereinafter "increased binding energy hydrogen species") having a total energy
  - (i) greater than the total energy of the corresponding ordinary hydrogen species, or
  - (ii) greater than the total energy of any hydrogen species for which the corresponding ordinary hydrogen species is unstable or is not observed because the ordinary hydrogen species' total energy is less than thermal energies at ambient conditions, or is negative; and (b) at least one other element.

The total energy of the hydrogen species is the sum of the energies to remove all of the electrons from the hydrogen species. The hydrogen species according to the present disclosure has a total energy greater than the total energy of the corresponding ordinary hydrogen species. The hydrogen species having an increased total energy according to the present disclosure is also referred to as an "increased binding energy hydrogen species" even though some embodiments of the hydrogen species having an increased total energy may have a first electron binding energy less that the first electron binding energy of the corresponding ordinary hydrogen species. For example, the hydride ion of Eqs. (39) and (40) for p=24 has a first binding energy that is less than the first binding energy of ordinary hydride ion, while the total energy of the hydride ion of Eqs. (39) and (40) for p=24 is much greater than the total energy of the corresponding ordinary hydride ion.

Also provided herein are novel compounds and molecular ions comprising (a) a plurality of neutral, positive, or negative hydrogen species (hereinafter "increased binding energy hydrogen species") having a binding energy
   (i) greater than the binding energy of the corresponding ordinary hydrogen species, or
   (ii) greater than the binding energy of any hydrogen species for which the corresponding ordinary hydrogen species is unstable or is not observed because the ordinary hydrogen species' binding energy is less than thermal energies at ambient conditions or is negative; and (b) optionally one other element. The compounds of the present disclosure are hereinafter referred to as "increased binding energy hydrogen compounds."

The increased binding energy hydrogen species can be formed by reacting one or more hydrino atoms with one or more of an electron, hydrino atom, a compound containing at least one of said increased binding energy hydrogen species, and at least one other atom, molecule, or ion other than an increased binding energy hydrogen species.

Also provided are novel compounds and molecular ions comprising (a) a plurality of neutral, positive, or negative hydrogen species (hereinafter "increased binding energy hydrogen species") having a total energy
   (i) greater than the total energy of ordinary molecular hydrogen, or
   (ii) greater than the total energy of any hydrogen species for which the corresponding ordinary hydrogen species is unstable or is not observed because the ordinary hydrogen species' total energy is less than thermal energies at ambient conditions or is negative; and (b) optionally one other element. The compounds of the present disclosure are hereinafter referred to as "increased binding energy hydrogen compounds."

In an embodiment, a compound is provided comprising at least one increased binding energy hydrogen species chosen from (a) hydride ion having a binding energy according to Eqs. (39) and (40) that is greater than the binding of ordinary hydride ion (about 0.8 eV) for p=2 up to 23, and less for p=24 ("increased binding energy hydride ion" or "hydrino hydride ion"); (b) hydrogen atom having a binding energy greater than the binding energy of ordinary hydrogen atom (about 13.6 eV) ("increased binding energy hydrogen atom" or "hydrino"); (c) hydrogen molecule having a first binding energy greater than about 15.3 eV ("increased binding energy hydrogen molecule" or "dihydrino"); and (d) molecular hydrogen ion having a binding energy greater than about 16.3 eV ("increased binding energy molecular hydrogen ion" or "dihydrino molecular ion"). In the present disclosure, increased binding energy hydrogen species and compounds is also referred to as lower-energy hydrogen species and compounds. Hydrinos comprise an increased binding energy hydrogen species or equivalently a lower-energy hydrogen species.

IV. Additional MH-Type Catalysts and Reactions

In general, MH type hydrogen catalysts to produce hydrinos provided by the breakage of the M–H bond plus the ionization of t electrons from the atom M each to a continuum energy level such that the sum of the bond energy and ionization energies of the t electrons is approximately m·27.2 eV where m is an integer are given in TABLE 3A. Each MH catalyst is given in the first column and the corresponding M–H bond energy is given in column two. The atom M of the MH species given in the first column is ionized to provide the net enthalpy of reaction of m·27.2 eV with the addition of the bond energy in column two. The enthalpy of the catalyst is given in the eighth column where m is given in the ninth column. The electrons that participate in ionization are given with the ionization potential (also called ionization energy or binding energy). For example, the bond energy of NaH, 1.9245 eV, is given in column two. The ionization potential of the nth electron of the atom or ion is designated by $IP_n$ and is given by the CRC. That is for example, $Na+5.13908\ eV \rightarrow Na^{+}+e^{-}$ and $Na^{+}+47.2864\ eV \rightarrow Na^{2+}+e^{-}$. The first ionization potential, $IP_1$=5.13908 eV, and the second ionization potential, $IP_2$=47.2864 eV, are given in the second and third columns, respectively. The net enthalpy of reaction for the breakage of the NaH bond and the double ionization of Na is 54.35 eV as given in the eighth column, and m=2 in Eq. (35) as given in the ninth column. The bond energy of BaH is 1.98991 eV and $IP_1$, $IP_2$, and $IP_3$ are 5.2117 eV, 10.00390 eV, and 37.3 eV, respectively. The net enthalpy of reaction for the breakage of the BaH bond and the triple ionization of Ba is 54.5 eV as given in the eighth column, and m=2 in Eq. (35) as given in the ninth column. The bond energy of SrH is 1.70 eV and $IP_1$, $IP_2$, $IP_3$, $IP_4$, and $IP_5$ are 5.69484 eV, 11.03013 eV, 42.89 eV, 57 eV, and 71.6 eV, respectively. The net enthalpy of reaction for the breakage of the SrH bond and the ionization of Sr to $Sr^{5+}$ is 190 eV as given in the eighth column, and m=7 in Eq. (35) as given in the ninth column.

TABLE 3A

MH type hydrogen catalysts capable of providing a net enthalpy of reaction of approximately m · 27.2 eV. Energies are in eV.

| Catalyst | M-H Bond Energy | $IP_1$ | $IP_2$ | $IP_3$ | $IP_4$ | $IP_5$ | Enthalpy | m |
|---|---|---|---|---|---|---|---|---|
| AlH | 2.98 | 5.985768 | 18.82855 | | | | 27.79 | 1 |
| AsH | 2.84 | 9.8152 | 18.633 | 28.351 | 50.13 | | 109.77 | 4 |
| BaH | 1.99 | 5.21170 | 10.00390 | 37.3 | | | 54.50 | 2 |
| BiH | 2.936 | 7.2855 | 16.703 | | | | 26.92 | 1 |
| CdH | 0.72 | 8.99367 | 16.90832 | | | | 26.62 | 1 |
| ClH | 4.4703 | 12.96763 | 23.8136 | 39.61 | | | 80.86 | 3 |
| CoH | 2.538 | 7.88101 | 17.084 | | | | 27.50 | 1 |
| GeH | 2.728 | 7.89943 | 15.93461 | | | | 26.56 | 1 |

TABLE 3A-continued

MH type hydrogen catalysts capable of providing a net enthalpy of reaction of approximately m · 27.2 eV. Energies are in eV.

| Catalyst | M-H Bond Energy | $IP_1$ | $IP_2$ | $IP_3$ | $IP_4$ | $IP_5$ | Enthalpy | m |
|---|---|---|---|---|---|---|---|---|
| InH | 2.520 | 5.78636 | 18.8703 | | | | 27.18 | 1 |
| NaH | 1.925 | 5.139076 | 47.2864 | | | | 54.35 | 2 |
| NbH | 2.30 | 6.75885 | 14.32 | 25.04 | 38.3 | 50.55 | 137.26 | 5 |
| OH | 4.4556 | 13.61806 | 35.11730 | | | | 53.3 | 2 |
| OH | 4.4556 | 13.61806 | 35.11730 | 54.9355 | | | 108.1 | 4 |
| OH | 4.4556 | 13.61806 + 13.6 KE | 35.11730 + 13.6 KE | | | | 80.39 | 3 |
| RhH | 2.50 | 7.4589 | 18.08 | | | | 28.0 | 1 |
| RuH | 2.311 | 7.36050 | 16.76 | | | | 26.43 | 1 |
| SH | 3.67 | 10.36001 | 23.3379 | 34.79 | 47.222 | 72.5945 | 191.97 | 7 |
| SbH | 2.484 | 8.60839 | 16.63 | | | | 27.72 | 1 |
| SeH | 3.239 | 9.75239 | 21.19 | 30.8204 | 42.9450 | | 107.95 | 4 |
| SiH | 3.040 | 8.15168 | 16.34584 | | | | 27.54 | 1 |
| SnH | 2.736 | 7.34392 | 14.6322 | 30.50260 | | | 55.21 | 2 |
| SrH | 1.70 | 5.69484 | 11.03013 | 42.89 | 57 | 71.6 | 190 | 7 |
| TlH | 2.02 | 6.10829 | 20.428 | | | | 28.56 | 1 |

In other embodiments, $MH^-$ type hydrogen catalysts to produce hydrinos provided by the transfer of an electron to an acceptor A, the breakage of the M–H bond plus the ionization of t electrons from the atom M each to a continuum energy level such that the sum of the electron transfer energy comprising the difference of electron affinity (EA) of MH and A, M–H bond energy, and ionization energies of the t electrons from M is approximately m·27.2 eV where m is an integer are given in TABLE 3B. Each $MH^-$ catalyst, the acceptor A, the electron affinity of MH, the electron affinity of A, and the M–H bond energy, are is given in the first, second, third and fourth columns, respectively. The electrons of the corresponding atom M of MH that participate in ionization are given with the ionization potential (also called ionization energy or binding energy) in the subsequent columns and the enthalpy of the catalyst and the corresponding integer m are given in the last column. For example, the electron affinities of OH and H are 1.82765 eV and 0.7542 eV, respectively, such that the electron transfer energy is 1.07345 eV as given in the fifth column. The bond energy of OH is 4.4556 eV is given in column six. The ionization potential of the nth electron of the atom or ion is designated by $IP_n$. That is for example, $O+13.61806\ eV \rightarrow O^+ + e^-$ and $O^+ 35.11730\ eV \rightarrow O^{2+} + e$. The first ionization potential, $IP_1=13.61806$ eV, and the second ionization potential, $IP_2=35.11730$ eV, are given in the seventh and eighth columns, respectively. The net enthalpy of the electron transfer reaction, the breakage of the OH bond, and the double ionization of O is 54.27 eV as given in the eleventh column, and m=2 in Eq. (35) as given in the twelfth column. In other embodiments, the catalyst for H to form hydrinos is provided by the ionization of a negative ion such that the sum of its EA plus the ionization energy of one or more electrons is approximately m·27.2 eV where m is an integer. Alternatively, the first electron of the negative ion may be transferred to an acceptor followed by ionization of at least one more electron such that the sum of the electron transfer energy plus the ionization energy of one or more electrons is approximately m·27.2 eV where m is an integer. The electron acceptor may be H.

TABLE 3B $MH^-$ type hydrogen catalysts capable of providing a net enthalpy of reaction of approximately m · 27.2 eV. Energies are in eV.

| Catalyst | Acceptor (A) | EA (MH) | EA (A) | Electron Transfer | M-H Bond Energy | $IP_1$ | $IP_2$ | $IP_3$ | $IP_4$ | Enthalpy | m |
|---|---|---|---|---|---|---|---|---|---|---|---|
| $OH^-$ | H | 1.82765 | 0.7542 | 1.07345 | 4.4556 | 13.61806 | 35.11730 | | | 54.27 | 2 |
| $SiH^-$ | H | 1.277 | 0.7542 | 0.5228 | 3.040 | 8.15168 | 16.34584 | | | 28.06 | 1 |
| $CoH^-$ | H | 0.671 | 0.7542 | −0.0832 | 2.538 | 7.88101 | 17.084 | | | 27.42 | 1 |
| $NiH^-$ | H | 0.481 | 0.7542 | −0.2732 | 2.487 | 7.6398 | 18.16884 | | | 28.02 | 1 |
| $SeH^-$ | H | 2.2125 | 0.7542 | 1.4583 | 3.239 | 9.75239 | 21.19 | 30.8204 | 42.9450 | 109.40 | 4 |

In other embodiments, $MH^+$ type hydrogen catalysts to produce hydrinos are provided by the transfer of an electron from an donor A which may be negatively charged, the breakage of the M–H bond, and the ionization of t electrons from the atom M each to a continuum energy level such that the sum of the electron transfer energy comprising the difference of ionization energies of MH and A, bond M–H energy, and ionization energies of the t electrons from M is approximately m·27.2 eV where m is an integer.

In an embodiment, the catalyst comprises any species such as an atom, positively or negatively charged ion, positively or negatively charged molecular ion, molecule, excimer, compound, or any combination thereof in the ground or excited state that is capable of accepting energy of m·27.2 eV, m=1, 2, 3, 4, . . . (Eq. (5)). It is believed that the rate of catalysis is increased as the net enthalpy of reaction is more closely matched to m·27.2 eV. It has been found that catalysts having a net enthalpy of reaction within ±10%, preferably ±5%, of m·27.2 eV are suitable for most applications. In the case of the catalysis of hydrino atoms to lower energy states, the enthalpy of reaction of m·27.2 eV (Eq. (5)) is relativistically corrected by the same factor as the potential energy of the hydrino atom. In an embodiment, the catalyst resonantly and radiationless accepts energy from atomic hydrogen. In an embodiment, the accepted energy decreases the magnitude of the potential energy of the catalyst by about the amount transferred from atomic hydrogen. Energetic ions or electrons may result due to the conservation of the kinetic energy of the initially bound electrons. At least one atomic H serves as a catalyst for at least one other wherein the 27.2 eV potential energy of the acceptor is cancelled by the transfer or 27.2 eV from the donor H atom being catalyzed. The kinetic energy of the acceptor catalyst H may be conserved as fast protons or electrons. Additionally, the intermediate state (Eq. (7)) formed in the catalyzed H decays with the emission of continuum energy in the form of radiation or induced kinetic energy in a third body. These energy releases may result in current flow in the CIHT cell of the present disclosure.

In an embodiment, at least one of a molecule or positively or negatively charged molecular ion serves as a catalyst that accepts about m27.2 eV from atomic H with a decrease in the magnitude of the potential energy of the molecule or positively or negatively charged molecular ion by about m27.2 eV. For example, the potential energy of $H_2O$ given in Mills GUTCP is $$V_e = \left(\frac{3}{2}\right)\frac{-2e^2}{8\pi\varepsilon_0\sqrt{a^2-b^2}}\ln\frac{a+\sqrt{a^2-b^2}}{a-\sqrt{a^2-b^2}} = -81.8715 \text{ eV} \tag{43}$$

A molecule that accepts m·27.2 eV from atomic H with a decrease in the magnitude of the potential energy of the molecule by the same energy may serve as a catalyst. For example, the catalysis reaction (m=3) regarding the potential energy of $H_2O$ is $$81.6 \text{ eV} + H_2O + H[a_H] \rightarrow 2H^+_{fast} + O^- + e^- + H*\left[\frac{a_H}{4}\right] + 81.6 \text{ eV} \tag{44}$$

$$H*\left[\frac{a_H}{4}\right] \rightarrow H\left[\frac{a_H}{4}\right] + 122.4 \text{ eV} \tag{45}$$

$$2H^+_{fast} + O^- + e^- \rightarrow H_2O + 81.6 \text{ eV} \tag{46}$$

And, the overall reaction is $$H[a_H] \rightarrow H\left[\frac{a_H}{4}\right] + 81.6 \text{ eV} + 122.4 \text{ eV} \tag{47}$$

wherein $$H*\left[\frac{a_H}{4}\right]$$

has the radius of the hydrogen atom and a central field equivalent to 4 times that of a proton and $$H\left[\frac{a_H}{4}\right]$$

is the corresponding stable state with the radius of ¼ that of H. As the electron undergoes radial acceleration from the radius of the hydrogen atom to a radius of ¼ this distance, energy is released as characteristic light emission or as third-body kinetic energy. Based on the 10% energy change in the heat of vaporization in going from ice at 0° C. to water at 100° C., the average number of H bonds per water molecule in boiling water is 3.6. Thus, in an embodiment, $H_2O$ must be formed chemically as isolated molecules with suitable activation energy in order to serve as a catalyst to form hydrinos. In an embodiment, the $H_2O$ catalyst is nascent $H_2O$.

In an embodiment, at least one of nH, O, nO, $O_2$, OH, and $H_2O$ (n=integer) may serve as the catalyst. The product of H and OH as the catalyst may be H(⅕) wherein the catalyst enthalpy is about 108.8 eV. The product of the reaction of H and $H_2O$ as the catalyst may be H(¼). The hydrino product may further react to lower states. The product of H(¼) and H as the catalyst may be H(⅕) wherein the catalyst enthalpy is about 27.2 eV. The product of H(¼) and OH as the catalyst may be H(⅙) wherein the catalyst enthalpy is about 54.4 eV. The product of H(⅕) and H as the catalyst may be H(⅙) wherein the catalyst enthalpy is about 27.2 eV.

Additionally, OH may serve as a catalyst since the potential energy of OH is $$V_e = \left(\frac{3}{2}\right)\frac{-2e^2}{8\pi\varepsilon_0\sqrt{a^2-b^2}}\ln\frac{a+\sqrt{a^2-b^2}}{a-\sqrt{a^2-b^2}} = -40.92709 \text{ eV} \tag{48}$$

The difference in energy between the H states p=1 and p=2 is 40.8 eV. Thus, OH may accept about 40.8 eV from H to serve as a catalyst to form H(½).

Similarly to $H_2O$, the potential energy of the amide functional group $NH_2$ given in Mills GUTCP is −78.77719 eV. From the CRC, ΔH for the reaction of $NH_2$ to form $KNH_2$ calculated from each corresponding $\Delta H_f$ is (−128.9-184.9) kJ/mole=−313.8 kJ/mole (3.25 eV). From the CRC, ΔH for the reaction of $NH_2$ to form $NaNH_2$ calculated from each corresponding $\Delta H_f$ is (−123.8-184.9) kJ/mole=−308.7 kJ/mole (3.20 eV). From the CRC, ΔH for the reaction of $NH_2$ to form $LiNH_2$ calculated from each corresponding $\Delta H_f$ is (−179.5-184.9) kJ/mole=−364.4 kJ/mole (3.78 eV). Thus, the net enthalpy that may be accepted by alkali amides $MNH_2$ (M=K, Na, Li) serving as H catalysts to form hydrinos are about 82.03 eV, 81.98 eV, and 82.56 eV (m=3 in Eq. (5)), respectively, corresponding to the sum of the potential energy of the amide group and the energy to form the amide from the amide group. The hydrino product such as molecular hydrino may cause an upfield matrix shift observed by means such as MAS NMR.

Similarly to $H_2O$, the potential energy of the $H_2S$ functional group given in Mills GUTCP is −72.81 eV. The cancellation of this potential energy also eliminates the energy associated with the hybridization of the 3p shell. This hybridization energy of 7.49 eV is given by the ratio of the hydride orbital radius and the initial atomic orbital radius times the total energy of the shell. Additionally, the energy change of the S3p shell due to forming the two S—H bonds of 1.10 eV is included in the catalyst energy. Thus, the net enthalpy of $H_2S$ catalyst is 81.40 eV (m=3 in Eq. (5)). $H_2S$ catalyst may be formed from MHS (M=alkali) by the reaction $$2MHS \text{ to } M_2S + H_2S \tag{49}$$

This reversible reaction may form $H_2S$ in an active catalytic state in the transition state to product $H_2S$ that may catalyze H to hydrino. The reaction mixture may comprise reactants that form $H_2S$ and a source of atomic H. The hydrino product such as molecular hydrino may cause an upfield matrix shift observed by means such as MAS NMR.

Furthermore, atomic oxygen is a special atom with two unpaired electrons at the same radius equal to the Bohr radius of atomic hydrogen. When atomic H serves as the catalyst, 27.2 eV of energy is accepted such that the kinetic energy of each ionized H serving as a catalyst for another is 13.6 eV. Similarly, each of the two electrons of O can be ionized with 13.6 eV of kinetic energy transferred to the O ion such that the net enthalpy for the breakage of the O—H bond of OH with the subsequent ionization of the two outer unpaired electrons is 80.4 eV as given in TABLE 3. During the ionization of $OH^-$ to OH, the energy match for the further reaction to H(1/4) and $O^{2+}+2e^-$ may occur wherein the 204 eV of energy released contributes to the CIHT cell's electrical power. The reaction is given as follows:

$$80.4\text{ eV}+\text{OH}+\text{H}\left[\frac{a_H}{p}\right]\to \text{O}_{fast}^{2+}+2e^-+\text{H}\left[\frac{a_H}{(p+3)}\right]+[(p+3)^2-p^2]\cdot 13.6\text{ eV} \tag{50}$$

$$\text{O}_{fast}^{2+}+2e^-\to \text{O}+80.4\text{ eV} \tag{51}$$

And, the overall reaction is $$H\left[\frac{a_H}{p}\right]\to H\left[\frac{a_H}{(p+3)}\right]+[(p+3)^2-p^2]\cdot 13.6\text{ eV} \tag{52}$$

where m=3 in Eq. (5). The kinetic energy could also be conserved in hot electrons. The observation of H population inversion in water vapor plasmas is evidence of this mechanism. The hydrino product such as molecular hydrino may cause an upfield matrix shift observed by means such as MAS NMR. Other methods of identifying the molecular hydrino product such as FTIR, Raman, and XPS are given in the present disclosure.

In an embodiment wherein oxygen or a compound comprising oxygen participates in the oxidation or reduction reaction, $O_2$ may serve as a catalyst or a source of a catalyst. The bond energy of the oxygen molecule is 5.165 eV, and the first, second, and third ionization energies of an oxygen atom are 13.61806 eV, 35.11730 eV, and 54.9355 eV, respectively. The reactions $O_2 \rightarrow O+O^{2+}$, $O_2 \rightarrow O+O^{3+}$, and $2O \rightarrow 2O^+$ provide a net enthalpy of about 2, 4, and 1 times $E_h$, respectively, and comprise catalyst reactions to form hydrino by accepting these energies from H to cause the formation of hydrinos.

In an embodiment, the molecular hydrino product is observed as an inverse Raman effect (IRE) peak at about 1950 $cm^{-1}$. The peak is enhanced by using a conductive material comprising roughness features or particle size comparable to that of the Raman laser wavelength that supports a Surface Enhanced Raman Scattering (SERS) to show the IRE peak.

VI. Chemical Reactor

The present disclosure is also directed to other reactors for producing increased binding energy hydrogen species and compounds of the present disclosure, such as dihydrino molecules and hydrino hydride compounds. Further products of the catalysis are power and optionally plasma and light depending on the cell type. Such a reactor is hereinafter referred to as a "hydrogen reactor" or "hydrogen cell." The hydrogen reactor comprises a cell for making hydrinos. The cell for making hydrinos may take the form of a chemical reactor or gas fuel cell such as a gas discharge cell, a plasma torch cell, or microwave power cell, and an electrochemical cell. Exemplary embodiments of the cell for making hydrinos may take the form of a liquid-fuel cell, a solid-fuel cell, a heterogeneous-fuel cell, a CIHT cell, and an SF-CIHT cell. Each of these cells comprises: (i) a source of atomic hydrogen; (ii) at least one catalyst chosen from a solid catalyst, a molten catalyst, a liquid catalyst, a gaseous catalyst, or mixtures thereof for making hydrinos; and (iii) a vessel for reacting hydrogen and the catalyst for making hydrinos. As used herein and as contemplated by the present disclosure, the term "hydrogen," unless specified otherwise, includes not only proteum ($^1H$), but also deuterium ($^2H$) and tritium ($^3H$). Exemplary chemical reaction mixtures and reactors may comprise SF-CIHT, CIHT, or thermal cell embodiments of the present disclosure. Additional exemplary embodiments are given in this Chemical Reactor section. Examples of reaction mixtures having $H_2O$ as catalyst formed during the reaction of the mixture are given in the present disclosure. Other catalysts such as those given in TABLES 1 and 3 may serve to form increased binding energy hydrogen species and compounds. An exemplary M–H type catalyst of TABLE 3A is NaH. The reactions and conditions may be adjusted from these exemplary cases in the parameters such as the reactants, reactant wt %'s, $H_2$ pressure, and reaction temperature. Suitable reactants, conditions, and parameter ranges are those of the present disclosure. Hydrinos and molecular hydrino are shown to be products of the reactors of the present disclosure by predicted continuum radiation bands of an integer times 13.6 eV, otherwise unexplainable extraordinarily high H kinetic energies measured by Doppler line broadening of H lines, inversion of H lines, formation of plasma without a breakdown fields, and anomalously plasma afterglow duration as reported in Mills Prior Publications. The data such as that regarding the CIHT cell and solid fuels has been validated independently, off site by other researchers. The formation of hydrinos by cells of the present disclosure was also confirmed by electrical energies that were continuously output over long-duration, that were multiples of the electrical input that in most cases exceed the input by a factor of greater than 10 with no alternative source. The predicted molecular hydrino $H_2(1/4)$ was identified as a product of CIHT cells and solid fuels by MAS H NMR that showed a predicted upfield shifted matrix peak of about −4.4 ppm, ToF-SIMS and ESI-ToFMS that showed $H_2(1/4)$ complexed to a getter matrix as m/e=M+n2 peaks wherein M is the mass of a parent ion and n is an integer, electron-beam excitation emission spectroscopy and photoluminescence emission spectroscopy that showed the predicted rotational and vibration spectrum of $H_2(1/4)$ having 16 or quantum number p=4 squared times the energies of $H_2$, Raman and FTIR spectroscopy that showed the rotational energy of $H_2(1/4)$ of 1950 $cm^{-1}$, being 16 or quantum number p=4 squared times the rotational energy of $H_2$, XPS that showed the predicted total binding energy of $H_2(1/4)$ of 500 eV, and a ToF-SIMS peak with an arrival time before the m/e=1 peak that corresponded to H with a kinetic energy of about 204 eV that matched the predicted energy release for H to H(1/4) with the energy transferred to a third body H as reported in Mills Prior Publications and in R. Mills X Yu, Y. Lu, G Chu, J. He, J. Lotoski, "Catalyst Induced Hydrino Transition (CIHT) Electrochemical Cell", International Journal of Energy Research, (2013) and R. Mills, J. Lotoski, J. Kong, G Chu, J. He, J. Trevey, "High-Power-Density Catalyst Induced Hydrino Transition (CIHT) Electrochemical Cell" (2014) which are herein incorporated by reference in their entirety.

Using both a water flow calorimeter and a Setaram DSC 131 differential scanning calorimeter (DSC), the formation of hydrinos by cells of the present disclosure such as ones comprising a solid fuel to generate thermal power was confirmed by the observation of thermal energy from hydrino-forming solid fuels that exceed the maximum theoretical energy by a factor of 60 times. The MAS H NMR showed a predicted $H_2(1/4)$ upfield matrix shift of about −4.4 ppm. A Raman peak starting at 1950 $cm^{-1}$ matched the free space rotational energy of $H_2(1/4)$ (0.2414 eV). These results are reported in Mills Prior Publications and in R. Mills, J. Lotoski, W. Good, J. He, "Solid Fuels that Form HOH Catalyst", (2014) which is herein incorporated by reference in its entirety.

In an embodiment, a solid fuel reaction forms $H_2O$ and H as products or intermediate reaction products. The $H_2O$ may serve as a catalyst to form hydrinos. The reactants comprise at least one oxidant and one reductant, and the reaction comprises at least one oxidation-reduction reaction. The reductant may comprise a metal such as an alkali metal. The reaction mixture may further comprise a source of hydrogen, and a source of $H_2O$, and may optionally comprise a support such as carbon, carbide, boride, nitride, carbonitrile such as TiCN, or nitrile. The support may comprise a metal powder. In an embodiment, a hydrogen support comprises Mo or a Mo alloy such as those of the present disclosure such as MoPt, MoNi, MoCu, and MoCo. In an embodiment, oxidation of the support is avoided by methods such as selecting the other components of the reaction mixture that do not oxidize the support, selecting a non-oxidizing reaction temperature and conditions, and maintaining a reducing atmosphere such as a $H_2$ atmosphere as known by one skilled in the art. The source of H may be selected from the group of alkali, alkaline earth, transition, inner transition, rare earth hydrides, and hydrides of the present disclosure. The source of hydrogen may be hydrogen gas that may further comprise a dissociator such as those of the present disclosure such as a noble metal on a support such as carbon or alumina and others of the present disclosure. The source of water may comprise a compound that dehydrates such as a hydroxide or a hydroxide complex such as those of Al, Zn, Sn, Cr, Sb, and Pb. The source of water may comprise a source of hydrogen and a source of oxygen. The oxygen source may comprise a compound comprising oxygen. Exemplary compounds or molecules are $O_2$, alkali or alkali earth oxide, peroxide, or superoxide, $TeO_2$, $SeO_2$, $PO_2$, $P_2O_5$, $SO_2$, $SO_3$, $M_2SO_4$, $MHSO_4$, $CO_2$, $M_2S_2O_8$, $MMnO_4$, $M_2Mn_2O_4$, $M_xH_yPO_4$ (x, y=integer), $POB_2$, $MClO_4$, $MNO_3$, NO, $NO_2$, $NO_2$, $N_2O_3$, $Cl_2O_7$, and $O_2$ (M=alkali; and alkali earth or other cation may substitute for M). Other exemplary reactants comprise reagents selected from the group of Li, LiH, $LiNO_3$, LiNO, $LiNO_2$, $Li_3N$, $Li_2NH$, $LiNH_2$, LiX, $NH_3$, $LiBH_4$, $LiAlH_4$, $Li_3AlH_6$, LiOH, $Li_2S$, LiHS, LiFeSi, $Li_2CO_3$, $LiHCO_3$, $Li_2SO_4$, $LiHSO_4$, $Li_3PO_4$, $Li_2HPO_4$, $LiH_2PO_4$, $Li_2MoO_4$, $LiNbO_3$, $Li_2B_4O_7$ (lithium tetraborate), $LiBO_2$, $Li_2WO_4$, $LiAlCl_4$, $LiGaCl_4$, $Li_2CrO_4$, $Li_2Cr_2O_7$, $Li_2TiO_3$, $LiZrO_3$, $LiAlO_2$, $LiCoO_2$, $LiGaO_2$, $Li_2GeO_3$, $LiMn_2O_4$, $Li_4SiO_4$, $Li_2SiO_3$, $LiTaO_3$, $LiCuCl_4$, $LiPdCl_4$, $LiVO_3$, $LiIO_3$, $LiBrO_3$, $LiXO_3$ (X=F, Br, Cl, I), $LiFeO_2$, $LiIO_4$, $LiBrO_4$, $LiIO_4$, $LiXO_4$ (X=F, Br, Cl, I), $LiScO_n$, $LiTiO_n$, $LiVO_n$, $LiCrO_n$, $LiCr_2O_n$, $LiMn_2O_n$, $LiFeO_n$, $LiCoO_n$, $LiNiO_n$, $LiNi_2O_n$, $LiCuO_n$, and $LiZnO_n$, where n=1, 2, 3, or 4, an oxyanion, an oxyanion of a strong acid, an oxidant, a molecular oxidant such as $V_2O_3$, $I_2O_5$, $MnO_2$, $Re_2O_7$, $CrO_3$, $RuO_2$, AgO, PdO, $PdO_2$, PtO, $PtO_2$, and $NH_4X$ wherein X is a nitrate or other suitable anion given in the CRC, and a reductant. Another alkali metal or other cation may substitute for Li. Additional sources of oxygen may be selected from the group of $MCoO_2$, $MGaO_2$, $M_2GeO_3$, $MMn_2O_4$, $M_4SiO_4$, $M_2SiO_3$, $MTaO_3$, $MVO_3$, $MIO_3$, $MFeO_2$, $MIO_4$, $MClO_4$, $MScO_n$, $MTiO_n$, $MVO_n$, $MCrO_n$, $MCr_2O_n$, $MMn_2O_n$, $MFeO_n$, $MCoO_n$, $MNiO_n$, $MNi_2On$, $MCuO_n$, and $MZnO_n$, where M is alkali and n=1, 2, 3, or 4, an oxyanion, an oxyanion of a strong acid, an oxidant, a molecular oxidant such as $V_2O_3$, $I_2O_5$, $MnO_2$, $Re_2O_7$, $CrO_3$, $RuO_2$, AgO, PdO, $PdO_2$, PtO, $PtO_2$, $I_2O_4$, $I_2O_5$, $I_2O_9$, $SO_2$, $SO_3$, $CO_2$, $N_2O$, NO, $NO_2$, $N_2O_3$, $N_2O_4$, $N_2O_5$, $Cl_2O$, $ClO_2$, $Cl_2O_3$, $Cl_2O_6$, $Cl_2O_7$, $PO_2$, $P_2O_3$, and $P_2O_5$. The reactants may be in any desired ratio that forms hydrinos. An exemplary reaction mixture is 0.33 g of LiH, 1.7 g of $LiNO_3$ and the mixture of 1 g of $MgH_2$ and 4 g of activated C powder. Another exemplary reaction mixture is that of gun powder such as $KNO_3$ (75 wt %), softwood charcoal (that may comprise about the formulation $C_7H_4O$) (15 wt %), and S (10 wt %); $KNO_3$ (70.5 wt %) and softwood charcoal (29.5 wt %) or these ratios within the range of about ±1-30 wt %. The source of hydrogen may be charcoal comprising about the formulation $C_7H_4O$.

In an embodiment, the reaction mixture comprises reactants that form nitrogen, carbon dioxide, and $H_2O$ wherein the latter serves as the hydrino catalyst for H also formed in the reaction. In an embodiment, the reaction mixture comprises a source of hydrogen and a source of $H_2O$ that may comprise a nitrate, sulfate, perchlorate, a peroxide such as hydrogen peroxide, peroxy compound such as triacetone-triperoxide (TATP) or diacteone-diperoxide (DADP) that may also serve as a source of H especially with the addition of $O_2$ or another oxygen source such as a nitro compound such as nitrocellulose (APNC), oxygen or other compound comprising oxygen or oxyanion compound. The reaction mixture may comprise a source of a compound or a compound, or a source of a functional group or a functional group comprising at least two of hydrogen, carbon, hydrocarbon, and oxygen bound to nitrogen. The reactants may comprise a nitrate, nitrite, nitro group, and nitramine. The nitrate may comprise a metal such as alkali nitrate, may comprise ammonium nitrate, or other nitrates known to those skilled in the art such as alkali, alkaline earth, transition, inner transition, or rare earth metal, or Al, Ga, In, Sn, or Pb nitrates. The nitro group may comprise a functional group of an organic compound such as nitromethane, nitroglycerin, trinitrotoluene or a similar compound known to those skilled in the art. An exemplary reaction mixture is $NH_4NO_3$ and a carbon source such as a long chain hydrocarbon ($C_nH_{2n+2}$) such as heating oil, diesel fuel, kerosene that may comprise oxygen such as molasses or sugar or nitro such as nitromethane or a carbon source such as coal dust. The H source may also comprise the $NH_4$, the hydrocarbon such as fuel oil, or the sugar wherein the H bound to carbon provides a controlled release of H. The H release may be by a free radical reaction. The C may react with O to release H and form carbon-oxygen compounds such as CO, $CO_2$, and formate. In an embodiment, a single compound may comprise the functionalities to form nitrogen, carbon dioxide, and $H_2O$. A nitramine that further comprises a hydrocarbon functionality is cyclotrimethylene-trinitramine, commonly referred to as Cyclonite or by the code designation RDX. Other exemplary compounds that may serve as at least one of the source of H and the source of $H_2O$ catalyst such as a source of at least one of a source of O and a source of H are at least one selected from the group of ammonium nitrate (AN), black powder (75% $KNO_3$+15% charcoal+10% S), ammonium nitrate/fuel oil (ANFO) (94.3% AN+5.7% fuel oil), erythritol tetranitrate, trinitrotoluene (TNT), amatol (80% TNT+20% AN), tetrytol (70% tetryl+30% TNT), tetryl (2,4,6-trinitrophenylmethylnitramine ($C_7H_5N_5O_8$)), C-4 (91% RDX), C-3 (RDX based), composition B (63% RDX+36% TNT), nitroglycerin, RDX (cyclotrimethylenetrinitramine), Semtex (94.3% PETN+5.7% RDX), PETN (pentaerythritol tetranitrate), HMX or octogen (octahydro-1,3,5,7-tetranitro-1,3,5,7-tetrazocine), HNIW (CL-20) (2,4,6,8,10,12-hexanitro-2,4,6,8,10,12-hexaazaisowurtzitane), DDF, (4,4'-dinitro-3,3'-diazenofuroxan), heptanitrocubane, octanitrocubane, 2,4,6-tris(trinitromethyl)-1,3,5-triazine, TATNB (1,3,5-trinitrobenzene, 3,5-triazido-2,4,6-trinitrobenzene), trinitroanaline, TNP (2,4,6-trinitrophenol or picric acid), dunnite (ammonium picrate), methyl picrate, ethyl picrate, picrate chloride (2-chloro-1,3,5-trinitrobenzene), trinitocresol, lead styphnate (lead 2,4,6-trinitroresorcinate, $C_6HN_3O_8Pb$), TATB (triaminotrinitrobenzene), methyl nitrate, nitroglycol, mannitol hexanitrate, ethylenedinitramine, nitroguanidine, tetranitroglycoluril, nitrocellulos, urea nitrate, and hexamethylene triperoxide diamine (HMTD). The ratio of hydrogen, carbon, oxygen, and nitrogen may be in any desired ratio. In an embodiment of a reaction mixture of ammonium nitrate (AN) and fuel oil (FO) known as ammonium nitrate/fuel oil (ANFO), a suitable stoichiometry to give about a balanced reaction is about 94.3 wt % AN and 5.7 wt % FO, but the FO may be in excess. An exemplary balanced reaction of AN and nitromethane is $$3NH_4NO_3+2CH_3NO_2 \text{ to } 4N_2+2CO_2+9H_2O \tag{80}$$

wherein some of the H is also converted to lower energy hydrogen species such as $H_2(1/p)$ and $H^-(1/p)$ such as p=4. In an embodiment, the molar ratios of hydrogen, nitrogen, and oxygen are similar such as in RDX having the formula $C_3H_6N_6O_6$.

In an embodiment, the energetics are increased by using an additional source of atomic hydrogen such as $H_2$ gas or a hydride such as alkali, alkaline earth, transition, inner transition, and rare earth metal hydrides and a dissociator such as Ni, Nb, or a noble metal on a support such as carbon, carbide, boride, or nitride or silica or alumina. The reaction mixture may produce a compression or shock wave during reaction to form $H_2O$ catalyst and atomic H to increase the kinetics to form hydrinos. The reaction mixture may comprise at least one reactant to increase the heat during the reaction to form H and $H_2O$ catalyst. The reaction mixture may comprise a source of oxygen such as air that may be dispersed between granules or prills of the solid fuel. For example AN prills may comprise about 20% air. The reaction mixture may further comprise a sensitizer such as air-filled glass beads. In an exemplary embodiment, a powdered metal such as Al is added to increase the heat and kinetics of reaction. For example, Al metal powder may be added to ANFO. Other reaction mixtures comprise pyrotechnic materials that also have a source of H and a source of catalyst such as $H_2O$. In an embodiment, the formation of hydrinos has a high activation energy that can be provided by an energetic reaction such as that of energetic or pyrotechnic materials wherein the formation of hydrinos contributes to the self-heating of the reaction mixture. Alternatively, the activation energy can be provided by an electrochemical reaction such as that of the CIHT cell that has a high equivalent temperature corresponding to 11,600 K/eV.

Another exemplary reaction mixture is $H_2$ gas that may be in the pressure range of about 0.01 atm to 100 atm, a nitrate such as an alkali nitrate such as $KNO_3$, and hydrogen dissociator such as Pt/C, Pd/C, Pt/$Al_2O_3$, or Pd/$Al_2O_3$. The mixture may further comprise carbon such as graphite or Grade GTA Grafoil (Union Carbide). The reaction ratios may be any desired such as about 1 to 10% Pt or Pd on carbon at about 0.1 to 10 wt % of the mixture mixed with the nitrate at about 50 wt %, and the balance carbon; though the ratios could be altered by a factor of about 5 to 10 in exemplary embodiments. In the case that carbon is used as a support, the temperature is maintained below that which results in a C reaction to form a compound such as a carbonate such as an alkali carbonate. In an embodiment, the temperature is maintained in a range such as about 50° C.-300° C. or about 100° C.-250° C. such that $NH_3$ is formed over $N_2$.

The reactants and regeneration reaction and systems may comprise those of the present disclosure or in prior US Patent Applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012 and CIHT Power System, PCT/US13/041938 file May 21, 2013 ("Mills Prior Applications") herein incorporated by reference in their entirety.

In an embodiment, the reaction may comprise a nitrogen oxide such as $N_2O$, $NO_2$, or NO rather than a nitrate. Alternatively the gas is also added to the reaction mixture. NO, $NO_2$, and $N_2O$ and alkali nitrates can be generated by known industrial methods such as by the Haber process followed by the Ostwald process. In one embodiment, the exemplary sequence of steps is:

$$N_2 \xrightarrow[\text{Haber process}]{H_2} NH_3 \xrightarrow[\text{Ostwald process}]{O_2} NO, N_2O, NO_2. \tag{81}$$

Specifically, the Haber process may be used to produce $NH_3$ from $N_2$ and $H_2$ at elevated temperature and pressure using a catalyst such as α-iron containing some oxide. The Ostwald process may be used to oxidize the ammonia to NO, $NO_2$, and $N_2O$ at a catalyst such as a hot platinum or platinum-rhodium catalyst. In an embodiment, the products are at least one of ammonia and an alkali compound. $NO_2$ may be formed from $NH_3$ by oxidation. $NO_2$ may be dissolved in water to form nitric acid that is reacted with the alkali compound such as $M_2O$, MOH, $M_2CO_3$, or $MHCO_3$ to form M nitrate wherein M is alkali.

In an embodiment, at least one reaction of a source of oxygen such as $MNO_3$ (M=alkali) to form $H_2O$ catalyst, (ii) the formation of atomic H from a source such as $H_2$, and (iii) the reaction to form hydrinos occurs by or an on a conventional catalyst such as a noble metal such as Pt that may be heated. The heated catalyst may comprise a hot filament. The filament may comprise a hot Pt filament. The source of oxygen such as $MNO_3$ may be at least partially gaseous. The gaseous state and its vapor pressure may be controlled by heating the $MNO_3$ such as $KNO_3$. The source of oxygen such as $MNO_3$ may be in an open boat that is heated to release gaseous $MNO_3$. The heating may be with a heater such as the hot filament. In an exemplary embodiment, $MNO_3$ is placed in a quartz boat and a Pt filament is wrapped around the boat to serve as the heater. The vapor pressure of the $MNO_3$ may be maintained in the pressure range of about 0.1 Torr to 1000 Torr or about 1 Torr to 100 Torr. The hydrogen source may be gaseous hydrogen that is maintained in the pressure range of about 1 Torr to 100 atm, about 10 Torr to 10 atm, or about 100 Torr to 1 atm. The filament also serves to dissociate hydrogen gas that may be supplied to the cell through a gas line. The cell may also comprise a vacuum line. The cell reactions give rise to $H_2O$ catalyst and atomic H that react to form hydrinos. The reaction may be maintained in a vessel capable of maintaining at least one of a vacuum, ambient pressure, or a pressure greater than atmospheric. The products such as $NH_3$ and MOH may be removed from the cell and regenerated. In an exemplary embodiment, $MNO_3$ reacts with the hydrogen source to form $H_2O$ catalyst and $NH_3$ that is regenerated in a separate reaction vessel or as a separate step by oxidation. In an embodiment, the source of hydrogen such as $H_2$ gas is generated from water by at least one of electrolysis or thermally. Exemplary thermal methods are the iron oxide cycle, cerium(IV) oxide-cerium(III) oxide cycle, zinc zinc-oxide cycle, sulfur-iodine cycle, copper-chlorine cycle and hybrid sulfur cycle and others known to those skilled in the art. Exemplary cell reactions to form $H_2O$ catalyst that reacts further with H to form hydrinos are $$KNO_3 + 9/2H_2 \rightarrow K + NH_3 + 3H_2O. \quad (82)$$

$$KNO_3 + 5H_2 \rightarrow KH + NH_3 + 3H_2O. \quad (83)$$

$$KNO_3 + 4H_2 \rightarrow KOH + NH_3 + 2H_2O. \quad (84)$$

$$KNO_3 + C + 2H_2 \rightarrow KOH + NH_3 + CO_2. \quad (85)$$

$$2KNO_3 + C + 3H_2 \rightarrow K_2CO_3 + 1/2N_2 + 3H_2O. \quad (86)$$

An exemplary regeneration reaction to form nitrogen oxides is given by Eq. (81). Products such a K, KH, KOH, and $K_2CO_3$ may be reacted with nitric acid formed by addition of nitrogen oxide to water to form $KNO_2$ or $KNO_3$. Additional suitable exemplary reactions to form at least one of the reacts $H_2O$ catalyst and $H_2$ are given in TABLES 4, 5, and 6.

TABLE 4

Thermally reversible reaction cycles regarding $H_2O$ catalyst and $H_2$. [L.C. Brown, G.E. Besenbruch, K.R. Schultz, A.C. Marshall, S.K. Showalter, P.S. Pickard and J.F. Funk, Nuclear Production of Hydrogen Using Thermochemical Water-Splitting Cycles, a preprint of a paper to be presented at the International Congress on Advanced Nuclear Power Plants (ICAPP) in Hollywood, Florida, Jun. 19-13, 2002, and published in the *Proceedings*.]

| Cycle | Name | T/E* | T (° C.) | Reaction |
|---|---|---|---|---|
| 1 | Westinghouse | T | 850 | $2H_2SO_4(g) \rightarrow 2SO_2(g) + 2H_2O(g) + O_2(g)$ |
| | | E | 77 | $SO_2(g) + 2H_2O(g) \rightarrow \rightarrow H_2SO_4(a) + H_2(g)$ |
| 2 | Ispra Mark 13 | T | 850 | $2H_2SO_4(g) \rightarrow 2SO_2(g) + 2H_2O(g) + O_2(g)$ |
| | | E | 77 | $2HBr(a) \rightarrow Br_2(a) + H_2(g)$ |
| | | T | 77 | $Br_2(l) + SO_2(g) + 2H_2O(l) \rightarrow 2HBr(g) + H_2SO_4(a)$ |
| 3 | UT-3 Univ. of Tokyo | T | 600 | $2Br_2(g) + 2CaO \rightarrow 2CaBr_2 + O_2(g)$ |
| | | T | 600 | $3FeBr_2 + 4H_2O \rightarrow Fe_3O_4 + 6HBr + H_2(g)$ |
| | | T | 750 | $CaBr_2 + H_2O \rightarrow CaO + 2HBr$ |
| | | T | 300 | $Fe_3O4 + 8HBr \rightarrow Br_2 + 3FeBr_2 + 4H_2O$ |
| 4 | Sulfur-Iodine | T | 850 | $2H_2SO_4(g) \rightarrow 2SO_2(g) + 2H_2O(g) + O_2(g)$ |
| | | T | 450 | $2HI \rightarrow I_2(g) + H_2(g)$ |
| | | T | 120 | $I_2 + SO_2(a) + 2H_2O \rightarrow 2HI(a) + H_2SO_4(a)$ |
| 5 | Julich Center EOS | T | 800 | $2Fe_3O_4 + 6FeSO_4 \rightarrow 6Fe_2O_3 + 6SO_2 + O_2(g)$ |
| | | T | 700 | $3FeO + H_2O \rightarrow Fe_3O_4 + H_2(g)$ |
| | | T | 200 | $Fe_2O_3 + SO_2 \rightarrow FeO + FeSO_4$ |
| 6 | Tokyo Inst. Tech. Ferrite | T | 1000 | $2MnFe_2O_4 + 3Na_2CO_3 + H_2O \rightarrow 2Na_3MnFe_2O_6 + 3CO_2(g) + H_2(g)$ |
| | | T | 600 | $4Na_3MnFe_2O_6 + 6CO_2(g) \rightarrow 4MnFe_2O_4 + 6Na_2CO_3 + O_2(g)$ |
| 7 | Hallett Air Products 1965 | T | 800 | $2Cl_2(g) + 2H_2O(g) \rightarrow 4HCl(g) + O_2(g)$ |
| | | E | 25 | $2HCl \rightarrow Cl_2(g) + H_2(g)$ |
| 8 | Gaz de France | T | 725 | $2K + 2KOH \rightarrow 2K_2O + H_2(g)$ |
| | | T | 825 | $2K_2O \rightarrow 2K + K_2O_2$ |
| | | T | 125 | $2K_2O_2 + 2H_2O \rightarrow 4KOH + O_2(g)$ |
| 9 | Nickel Ferrite | T | 800 | $NiMnFe_4O_6 + 2H_2O \rightarrow NiMnFe_4O_8 + 2H_2(g)$ |
| | | T | 800 | $NiMnFe_4O_8 \rightarrow NiMnFe_4O_6 + O_2(g)$ |
| 10 | Aachen Univ Julich 1972 | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 800 | $2CrCl_3 \rightarrow 2CrCl_2 + Cl_2(g)$ |
| 11 | Ispra Mark 1C | T | 100 | $2CuBr_2 + Ca(OH)_2 \rightarrow 2CuO + 2CaBr_2 + H_2O$ |
| | | T | 900 | $4CuO(s) \rightarrow 2Cu_2O(s) + O_2(g)$ |
| | | T | 730 | $CaBr_2 + 2H_2O \rightarrow Ca(OH)_2 + 2HBr$ |
| | | T | 100 | $Cu_2O + 4HBr \rightarrow 2CuBr_2 + H_2(g) + H_2O$ |
| 12 | LASL-U | T | 25 | $3CO_2 + U_3O_8 + H_2O \rightarrow 3UO_2CO_3 + H_2(g)$ |
| | | T | 250 | $3UO_2CO_3 \rightarrow 3CO_2(g) + 3UO_3$ |
| | | T | 700 | $6UO_3(s) \rightarrow 2U_3O_8(s) + O_2(g)$ |
| 13 | Ispra Mark 8 | T | 700 | $3MnCl_2 + 4H_2O \rightarrow Mn_3O_4 + 6HCl + H_2(g)$ |
| | | T | 900 | $3MnO_2 \rightarrow Mn_3O_4 + O_2(g)$ |
| | | T | 100 | $4HCl + Mn_3O_4 \rightarrow 2MnCl_2(a) + MnO_2 + 2H_2O$ |

TABLE 4-continued

Thermally reversible reaction cycles regarding $H_2O$ catalyst and $H_2$. [L.C. Brown, G.E. Besenbruch, K.R. Schultz, A.C. Marshall, S.K. Showalter, P.S. Pickard and J.F. Funk, Nuclear Production of Hydrogen Using Thermochemical Water-Splitting Cycles, a preprint of a paper to be presented at the International Congress on Advanced Nuclear Power Plants (ICAPP) in Hollywood, Florida, Jun. 19-13, 2002, and published in the *Proceedings*.]

| Cycle | Name | T/E* | T (° C.) | Reaction |
|---|---|---|---|---|
| 14 | Ispra Mark 6 | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 700 | $2CrCl_3 + 2FeCl_2 \rightarrow 2CrCl_2 + 2FeCl_3$ |
| | | T | 420 | $2FeCl_3 \rightarrow Cl_2(g) + 2FeCl_2$ |
| 15 | Ispra Mark 4 | T | 850 | $2Cl_2(g) + 2H_2O(g) \rightarrow 4HCl(g) + O_2(g)$ |
| | | T | 100 | $2FeCl_2 + 2HCl + S \rightarrow 2FeCl_3 + H_2S$ |
| | | T | 420 | $2FeCl_3 \rightarrow Cl_2(g) + 2FeCl_2$ |
| | | T | 800 | $H_2S \rightarrow S + H_2(g)$ |
| 16 | Ispra Mark 3 | T | 850 | $2Cl_2(g) + 2H_2O(g) \rightarrow 4HCl(g) + O_2(g)$ |
| | | T | 170 | $2VOCl_2 + 2HCl \rightarrow 2VOCl_3 + H_2(g)$ |
| | | T | 200 | $2VOCl_3 \rightarrow Cl_2(g) + 2VOCl_2$ |
| 17 | Ispra Mark 2 (1972) | T | 100 | $Na_2O{\bullet}MnO_2 + H_2O \rightarrow 2NaOH(a) + MnO_2$ |
| | | T | 487 | $4MnO_2(s) \rightarrow 2Mn_2O_3(s) + O_2(g)$ |
| | | T | 800 | $Mn_2O_3 + 4NaOH \rightarrow 2Na_2O{\bullet}MnO_2 + H_2(g) + H_2O$ |
| 18 | Ispra CO/Mn304 | T | 977 | $6Mn_2O_3 \rightarrow 4Mn_3O_4 + O_2(g)$ |
| | | T | 700 | $C(s) + H_2O(g) \rightarrow CO(g) + H_2(g)$ |
| | | T | 700 | $CO(g) + 2Mn_3O_4 \rightarrow C + 3Mn_2O_3$ |
| 19 | Ispra Mark 7B | T | 1000 | $2Fe_2O_3 + 6Cl_2(g) \rightarrow 4FeCl_3 + 3O_2(g)$ |
| | | T | 420 | $2FeCl_3 \rightarrow Cl_2(g) + 2FeCl_2$ |
| | | T | 650 | $3FeCl_2 + 4H_2O \rightarrow Fe_3O_4 + 6HCl + H_2(g)$ |
| | | T | 350 | $4Fe_3O_4 + O_2(g) \rightarrow 6Fe_2O_3$ |
| | | T | 400 | $4HCl + O_2(g) \rightarrow 2Cl_2(g) + 2H_2O$ |
| 20 | Vanadium Chloride | T | 850 | $2Cl_2(g) + 2H_2O(g) \rightarrow 4HCl(g) + O_2(g)$ |
| | | T | 25 | $2HCl + 2VCl_2 \rightarrow 2VCl_3 + H_2(g)$ |
| | | T | 700 | $2VCl_3 \rightarrow VCl_4 + VCl_2$ |
| | | T | 25 | $2VCl_4 \rightarrow Cl_2(g) + 2VCl_3$ |
| 21 | Ispra Mark 7A | T | 420 | $2FeCl_3(l) \rightarrow Cl_2(g) + 2FeCl_2$ |
| | | T | 650 | $3FeCl_2 + 4H_2O(g) \rightarrow Fe_3O_4 + 6HCl(g) + H_2(g)$ |
| | | T | 350 | $4Fe_3O_4 + O_2(g) \rightarrow 6Fe_2O_3$ |
| | | T | 1000 | $6Cl_2(g) + 2Fe_2O_3 \rightarrow 4FeCl_3(g) + 3O_2(g)$ |
| | | T | 120 | $Fe_2O_3 + 6HCl(a) \rightarrow 2FeCl_3(a) + 3H_2O(l)$ |
| 22 | GA Cycle 23 | T | 800 | $H_2S(g) \rightarrow S(g) + H_2(g)$ |
| | | T | 850 | $2H_2SO_4(g) \rightarrow 2SO_2(g) + 2H_2O(g) + O_2(g)$ |
| | | T | 700 | $3S + 2H_2O(g) \rightarrow 2H_2S(g) + SO_2(g)$ |
| | | T | 25 | $3SO_2(g) + 2H_2O(1) \rightarrow 2H_2SO_4(a) + S$ |
| | | T | 25 | $S(g) + O_2(g) \rightarrow SO_2(g)$ |
| 23 | US -Chlorine | T | 850 | $2Cl_2(g) + 2H_2O(g) \rightarrow 4HCl(g) + O_2(g)$ |
| | | T | 200 | $2CuCl + 2HCl \rightarrow 2CuCl_2 + H_2(g)$ |
| | | T | 500 | $2CuCl_2 \rightarrow 2CuCl + Cl_2(g)$ |
| 24 | Ispra Mark | T | 420 | $2FeCl_3 \rightarrow Cl_2(g) + 2FeCl_2$ |
| | | T | 150 | $3Cl_2(g) + 2Fe_3O_4 + 12HCl \rightarrow 6FeCl_3 + 6H_2O + O_2(g)$ |
| | | T | 650 | $3FeCl_2 + 4H_2O \rightarrow Fe_3O_4 + 6HC1 + H_2(g)$ |
| 25 | Ispra Mark 6C | T | 850 | $2Cl_2(g) + 2H_2O(g) \rightarrow 4HCl(g) + O_2(g)$ |
| | | T | 170 | $2CrCl_2 + 2HCl \rightarrow 2CrCl_3 + H_2(g)$ |
| | | T | 700 | $2CrCl_3 + 2FeCl_2 \rightarrow 2CrCl_2 + 2FeCl_3$ |
| | | T | 500 | $2CuCl_2 \rightarrow 2CuCl + Cl_2(g)$ |
| | | T | 300 | $CuCl + FeCl_3 \rightarrow CuCl_2 + FeCl_2$ |

*T = thermochemical, E = electrochemical.

TABLE 5

Thermally reversible reaction cycles regarding $H_2O$ catalyst and $H_2$. [C. Perkins and A. W. Weimer, Solar-Thermal Production of Renewable Hydrogen, AIChE Journal, 55 (2), (2009), pp. 286-293.]

| Cycle | Reaction Steps |
|---|---|
| High Temperature Cycles | |
| Zn/ZnO | $ZnO \xrightarrow{1600\text{-}1800^\circ\ C.} Zn + \frac{1}{2}O_2$ <br> $Zn + H_2O \xrightarrow{400^\circ\ C.} ZnO + H_2$ |

TABLE 5-continued

Thermally reversible reaction cycles regarding $H_2O$ catalyst and $H_2$. [C. Perkins and A. W. Weimer, Solar-Thermal Production of Renewable Hydrogen, AIChE Journal, 55 (2), (2009), pp. 286-293.]

| Cycle | Reaction Steps |
|---|---|
| FeO/$Fe_3O_4$ | $Fe_3O_4 \xrightarrow{2000\text{-}2300° C.} 3FeO + \frac{1}{2}O_2$<br>$3FeO + H_2O \xrightarrow{400° C.} Fe_3O_4 + H_2$ |
| Cadmium carbonate | $CdO \xrightarrow{1450\text{-}1500° C.} Cd + \frac{1}{2}O_2$<br>$Cd + H_2O + CO_2 \xrightarrow{350° C.} CdCO_3 + H_2$<br>$CdCO_3 \xrightarrow{500° C.} CO_2 + CdO$ |
| Hybrid cadmium | $CdO \xrightarrow{1450\text{-}1500° C.} Cd + \frac{1}{2}O_2$<br>$Cd + 2H_2O \xrightarrow{25° C., electrochemical} Cd(OH)_2 + H_2$<br>$Cd(OH)_2 \xrightarrow{375° C.} CdO + H_2O$ |
| Sodium manganese | $Mn_2O_3 \xrightarrow{1400\text{-}1600° C.} 2MnO + \frac{1}{2}O_2$<br>$2MnO + 2NaOH \xrightarrow{627° C.} 2NaMnO_2 + H_2$<br>$2NaMnO_2 + H_2O \xrightarrow{25° C.} Mn_2O_3 + 2NaOH$ |
| M-Ferrite (M = Co, Ni, Zn) | $Fe_{3-x}M_xO_4 \xrightarrow{1200\text{-}1400° C.} Fe_{3-x}M_xO_{4-\delta} + \frac{\delta}{2}O_2$<br>$Fe_{3-x}M_xO_{4-\delta} + \delta H_2O \xrightarrow{1000\text{–}1200° C.} Fe_{3-x}M_xO_4 + \delta H_2$ |
| Low Temperature Cycles | |
| Sulfur-Iodine | $H_2SO_4 \xrightarrow{850° C.} SO_2 + H_2O + \frac{1}{2}O_2$<br>$I_2 + SO_4 + 2H_2O \xrightarrow{100° C.} 2HI + H_2SO_4$<br>$2HI \xrightarrow{300° C.} I_2 + H_2$ |
| Hybrid sulfur | $H_2SO_4 \xrightarrow{850° C.} SO_2 + H_2O + \frac{1}{2}O_2$<br>$SO_2 + 2H_2O \xrightarrow{77° C., electrochemical} H_2SO_4 + H_2$ |
| Hybrid copper chloride | $Cu_2OCl_2 \xrightarrow{550° C.} 2CuCl + \frac{1}{2}O_2$<br>$2Cu + 2HCl \xrightarrow{425° C.} H_2 + 2CuCl$<br>$4CuCl \xrightarrow{25° C., electrochemical} 2Cu + 2CuCl_2$<br>$2CuCl_2 + H_2O \xrightarrow{325° C.} Cu_2OCl_2 + 2HCl$ |

TABLE 6

Thermally reversible reaction cycles regarding $H_2O$ catalyst and $H_2$. [S. Abanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.

| No ID | Name of the cycle | List of ele-ments | Number of chemical steps | Maximum temp-erature (° C.) | Reactions | |
|---|---|---|---|---|---|---|
| 6 | ZnO/Zn | Zn | 2 | 2000 | $ZnO \rightarrow Zn + 1/2O_2$<br>$Zn + H_2O \rightarrow ZnO + H_2$ | (2000° C.)<br>(1100° C.) |
| 7 | $Fe_3O_4$/FeO | Fe | 2 | 2200 | $Fe_3O_4 \rightarrow 3FeO + 1/2O_2$<br>$3FeO + H_2O \rightarrow Fe_3O_4 + H_2$ | (2200° C.)<br>(400° C.) |

TABLE 6-continued

Thermally reversible reaction cycles regarding $H_2O$ catalyst and $H_2$. [S. Abanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.

| No ID | Name of the cycle | List of elements | Number of chemical steps | Maximum temperature (° C.) | Reactions | |
|---|---|---|---|---|---|---|
| 194 | $In_2O_3$/ | In | 2 | 2200 | $In_2O_3 \rightarrow In_2O + O_2$ | (2200° C.) |
| | $In_2O$ | | | | $In2O + 2H_2O \rightarrow In_2O_3 + 2H_2$ | (800° C.) |
| 194 | $SnO_2$/Sn | Sn | 2 | 2650 | $SnO_2 \rightarrow Sn + O_2$ | (2650° C.) |
| | | | | | $Sn + 2H_2O \rightarrow SnO_2 + 2H_2$ | (600° C.) |
| 83 | MnO/ | Mn, S | 2 | 1100 | $MnSO_4 \rightarrow MnO + SO_2 + 1/2O_2$ | (1100° C.) |
| | $MnSO_4$ | | | | $MnO + H_2O + SO_2 \rightarrow MnSO_4 + H_2$ | (250° C.) |
| 84 | FeO/ | Fe, S | 2 | 1100 | $FeSO_4 \rightarrow FeO + SO_2 + 1/2O_2$ | (1100° C.) |
| | $FeSO_4$ | | | | $FeO + H_2O + SO_2 \rightarrow FeSO_4 + H_2$ | (250° C.) |
| 86 | CoO/ | Co, S | 2 | 1100 | $CoSO_4 \rightarrow CoO + SO_2 + 1/2O_2$ | (1100° C.) |
| | $CoSO_4$ | | | | $CoO + H_2O + SO_2 \rightarrow CoSO_4 + H_2$ | (200° C.) |
| 200 | $Fe_3O_4$/ | Fe, Cl | 2 | 1500 | $Fe_3O_4 + 6HCl \rightarrow 3FeCl_2 + 3H_2O + 1/2O_2$ | (1500° C.) |
| | $FeCl_2$ | | | | $3FeCl_2 + 4H_2O \rightarrow Fe_3O_4 + 6HCl + H_2$ | (700° C.) |
| 14 | $FeSO_4$ | Fe, S | 3 | 1800 | $3FeO(s) + H_2O \rightarrow Fe_3O_4(s) + H_2$ | (200° C.) |
| | Julich | | | | $Fe_3O_4(s) + FeSO_4 \rightarrow 3Fe_2O_3(s) + 3SO_2(g) + 1/2O_2$ | (800° C.) |
| | | | | | $3Fe_2O_3(s) + 3SO_2 \rightarrow 3FeSO_4 + 3FeO(s)$ | (1800° C.) |
| 85 | $FeSO_4$ | Fe, S | 3 | 2300 | $3FeO(s) + H_2O \rightarrow Fe_3O_4(s) + H_2$ | (200° C.) |
| | | | | | $Fe_3O_4(s) + 3SO_3(g) \rightarrow 3FeSO_4 + 1/2O_2$ | (300° C.) |
| | | | | | $FeSO_4 \rightarrow FeO + SO_3$ | (2300° C.) |
| 109 | C7 IGT | Fe, S | 3 | 1000 | $Fe_2O_3(s) + 2SO_2(g) + H_2O \rightarrow 2FeSO_4(s) + H_2$ | (125° C.) |
| | | | | | $2FeSO_4(s) \rightarrow Fe_2O_3(s) + SO_2(g) + SO_3(g)$ | (700° C.) |
| | | | | | $SO_3(g) \rightarrow SO_2(g) + 1/2O_2(g)$ | (1000° C.) |
| 21 | Shell | Cu, S | 3 | 1750 | $6Cu(s) + 3H_2O \rightarrow 3Cu_2O(s) + 3H_2$ | (500° C.) |
| | Process | | | | $Cu_2O(s) + 2SO_2 + 3/2O_2 \rightarrow 2CuSO_4$ | (300° C.) |
| | | | | | $2Cu_2O(s) + 2CuSO_4 \rightarrow 6Cu + 2SO_2 + 3O_2$ | (1750° C.) |
| 87 | $CuSO_4$ | Cu, S | 3 | 1500 | $Cu_2O(s) + H_2O(g) \rightarrow Cu(s) + Cu(OH)_2$ | (1500° C.) |
| | | | | | $Cu(OH)_2 + SO_2(g) \rightarrow CuSO_4 + H_2$ | (100° C.) |
| | | | | | $CuSO_4 + Cu(s) \rightarrow Cu_2O(s) + SO_2 + 1/2O_2$ | (1500° C.) |
| 110 | LASL | Ba, | 3 | 1300 | $SO_2 + H_2O + BaMoO_4 \rightarrow BaSO_3 + MoO_3 + H_2O$ | (300° C.) |
| | $BaSO_4$ | Mo, S | | | $BaSO_3 + H_2O \rightarrow BaSO_4 + H_2$ | |
| | | | | | $BaSO_4(s) + MoO_3(s) \rightarrow BaMoO_4(s) + SO_2(g) + 1/2O_2$ | (1300° C.) |
| 4 | Mark 9 | Fe, Cl | 3 | 900 | $3FeCl_2 + 4H_2O \rightarrow Fe_3O_4 + 6HCl + H_2$ | (680° C.) |
| | | | | | $Fe_3O_4 + 3/2Cl_2 + 6HCl \rightarrow 3FeCl_3 + 3H_2O + 1/2O_2$ | (900° C.) |
| | | | | | $3FeCl_3 \rightarrow 3FeCl_2 + 3/2Cl_2$ | (420° C.) |
| 16 | Euratom | Fe, Cl | 3 | 1000 | $H_2O + Cl_2 \rightarrow 2HCl + 1/2O_2$ | (1000° C.) |
| | 1972 | | | | $2HCl + 2FeCl_2 \rightarrow 2FeCl_3 + H_2$ | (600° C.) |
| | | | | | $2FeCl_3 \rightarrow 2FeCl_2 + Cl_2$ | (350° C.) |
| 20 | Cr, Cl | Cr, Cl | 3 | 1600 | $2CrCl_2(s, T_f = 815° C.) + 2HCl \rightarrow 2CrCl_3(s) + H_2$ | (200° C.) |
| | Julich | | | | $2CrCl_3$ (s, $T_f$ = 1150° C.) $\rightarrow 2CrCl_2(s) + Cl_2$ | (1600° C.) |
| | | | | | $H_2O + Cl_2 \rightarrow 2HCl + 1/2O_2$ | (1000° C.) |
| 27 | Mark 8 | Mn, Cl | 3 | 1000 | $6MnCl_2(l) + 8H_2O \rightarrow 2Mn_3O_4 + 12HCl + 2H_2$ | (700° C.) |
| | | | | | $3Mn_3O_4(s) + 12HCl \rightarrow 6MnCl_2(s) + 3MnO_2(s) + 6H_2O$ | (100° C.) |
| | | | | | $3MnO_2(s) \rightarrow Mn_3O_4(s) + O_2$ | (1000° C.) |
| 37 | Ta Funk | Ta, Cl | 3 | 2200 | $H_2O + Cl_2 \rightarrow 2HCl + 1/2O_2$ | (1000° C.) |
| | | | | | $2TaCl_2 + 2HCl \rightarrow 2TaCl_3 + H_2$ | (100° C.) |
| | | | | | $2TaCl_3 \rightarrow 2TaCl_2 + Cl_2$ | (2200° C.) |
| 78 | Mark 3 | V, Cl | 3 | 1000 | $Cl_2(g) + H_2O(g) \rightarrow 2HCl(g) + 1/2O_2(g)$ | (1000° C.) |
| | Euratom | | | | $2VOCl_2(s) + 2HCl(g) \rightarrow 2VOCl_3(g) + H_2(g)$ | (170° C.) |
| | JRC Ispra | | | | $2VOCl_3(g) \rightarrow Cl_2(g) + 2VOCl_2(s)$ | (200° C.) |
| | (Italy) | | | | | |
| 144 | Bi, Cl | Bi, Cl | 3 | 1700 | $H_2O + Cl_2 \rightarrow 2HCl + 1/2O_2$ | (1000° C.) |
| | | | | | $2BiCl_2 + 2HCl \rightarrow 2BiCl_3 + H_2$ | (300° C.) |
| | | | | | $2BiCl_3(T_f = 233° C., T_{eb} = 441° C.) \rightarrow 2BiCl_2 + Cl_2$ | (1700° C.) |
| 146 | Fe, Cl | Fe, Cl | 3 | 1800 | $3Fe(s) + 4H_2O \rightarrow Fe_3O_4(s) + 4H_2$ | (700° C.) |
| | Julich | | | | $Fe_3O_4 + 6HCl \rightarrow 3FeCl_2(g) + 3H_2O + 1/2O_2$ | (1800° C.) |
| | | | | | $3FeCl_2 + 3H_2 \rightarrow 3Fe(s) + 6HCl$ | (1300° C.) |
| 147 | Fe, Cl | Fe, Cl | 3 | 1800 | $3/2FeO(s) + 3/2Fe(s) + 2.5H_2O\ Fe_3O_4(s) + 2.5H_2$ | (1000° C.) |
| | Cologne | | | | $Fe_3O_4 + 6HCl \rightarrow 3FeCl_2(g) + 3H_2O + 1/2O_2$ | (1800° C.) |
| | | | | | $3FeCl_2 + H_2O + 3/2H_2 \rightarrow {}_{3/2}FeO(s) + 3/2Fe(s) + 6HCl$ | (700° C.) |
| 25 | Mark 2 | Mn, Na | 3 | 900 | $Mn_2O_3(s) + 4NaOH \rightarrow 2Na_2O \cdot MnO_2 + H_2O + H_2$ | (900° C.) |
| | | | | | $2Na_2O \cdot MnO_2 + 2H_2O \rightarrow 4NaOH + 2MnO_2(s)$ | (100° C.) |
| | | | | | $2MnO_2(s) \rightarrow Mn_2O_3(s) + 1/2O_2$ | (600° C.) |
| 28 | Li, Mn | Mn, Li | 3 | 1000 | $6LiOH + 2Mn_3O_4 \rightarrow 3Li_2O \cdot Mn_2O_3 + 2H_2O + H_2$ | (700° C.) |
| | LASL | | | | $3Li_2O \cdot Mn_2O_3 + 3H_2O \rightarrow 6LiOH + 3Mn_2O_3$ | (80° C.) |
| | | | | | $3Mn_2O_3 \rightarrow 2Mn_3O_4 + 1/2O_2$ | (1000° C.) |
| 199 | Mn PSI | Mn, Na | 3 | 1500 | $2MnO + 2NaOH \rightarrow 2NaMnO_2 + H_2$ | (800° C.) |
| | | | | | $2NaMnO_2 + H_2O \rightarrow Mn_2O_3 + 2NaOH$ | (100° C.) |
| | | | | | $Mn_2O_3(l) \rightarrow 2MnO(s) + 1/2O_2$ | (1500° C.) |

TABLE 6-continued

Thermally reversible reaction cycles regarding $H_2O$ catalyst and $H_2$. [S. Abanades, P. Charvin, G. Flamant, P. Neveu, Screening of Water-Splitting Thermochemical Cycles Potentially Attractive for Hydrogen Production by Concentrated Solar Energy, Energy, 31, (2006), pp. 2805-2822.

| No ID | Name of the cycle | List of elements | Number of chemical steps | Maximum temperature (° C.) | Reactions | |
|---|---|---|---|---|---|---|
| 178 | Fe, M ORNL | Fe, (M = Li, K, Na) | 3 | 1300 | $2Fe_3O_4 + 6MOH \rightarrow 3MFeO_2 + 2H_2O + H_2$ | (500° C.) |
| | | | | | $3MFeO_2 + 3H_2O \rightarrow 6MOH + 3Fe_2O_3$ | (100° C.) |
| | | | | | $3Fe_2O_3(s) \rightarrow 2Fe_3O_4(s) + 1/2O_2$ | (1300° C.) |
| 33 | Sn Souriau | Sn | 3 | 1700 | $Sn(l) + 2H_2O \rightarrow SnO_2 + 2H_2$ | (400° C.) |
| | | | | | $2SnO_2(s) \rightarrow 2SnO + O_2$ | (1700° C.) |
| | | | | | $2SnO(s) \rightarrow SnO_2 + Sn(l)$ | (700° C.) |
| 177 | Co ORNL | Co, Ba | 3 | 1000 | $CoO(s) + xBa(OH)_2(s) \rightarrow Ba_xCoO_y(s) + (y - x - 1)H_2 + (1 + 2x - y) H_2O$ | (850° C.) |
| | | | | | $Ba_xCoO_y(s) + xH_2O \rightarrow xBa(OH)_2(s) + CoO(y - x)(s)$ | (100° C.) |
| | | | | | $CoO(y - x)(s) \rightarrow CoO(s) + (y - x - 1)/2O_2$ | (1000° C.) |
| 183 | Ce, Ti ORNL | Ce, Ti, Na | 3 | 1300 | $2CeO_2(s) + 3TiO_2(s) \rightarrow Ce_2O_3 \cdot 3TiO_2 + 1/2O_2$ | (800-1300° C.) |
| | | | | | $Ce_2O_3 \cdot 3TiO_2 + 6NaOH \rightarrow 2CeO_2 + 3Na_2TiO_3 + 2H_2O + H_2$ | (800° C.) |
| | | | | | $CeO_2 + 3NaTiO_3 + 3H_2O \rightarrow CeO_2(s) + 3TiO_2(s) + 6NaOH$ | (150° C.) |
| 269 | Ce, Cl GA | Ce, Cl | 3 | 1000 | $H_2O + Cl_2 \rightarrow 2HCl + 1/2O_2$ | (1000° C.) |
| | | | | | $2CeO_2 + 8HCl \rightarrow 2CeCl_3 + 4H_2O + Cl_2$ | (250° C.) |
| | | | | | $2CeCl_3 + 4H2O \rightarrow 2CeO_2 + 6HCl + H_2$ | (800° C.) |

Reactants to form $H_2O$ catalyst may comprise a source of O such as an O species and a source of H. The source of the O species may comprise at least one of $O_2$, air, and a compound or admixture of compounds comprising O. The compound comprising oxygen may comprise an oxidant. The compound comprising oxygen may comprise at least one of an oxide, oxyhydroxide, hydroxide, peroxide, and a superoxide. Suitable exemplary metal oxides are alkali oxides such as $Li_2O$, $Na_2O$, and $K_2O$, alkaline earth oxides such as MgO, CaO, SrO, and BaO, transition oxides such as NiO, $Ni_2O_3$, FeO, $Fe_2O_3$, and CoO, and inner transition and rare earth metals oxides, and those of other metals and metalloids such as those of Al, Ga, In, Si, Ge, Sn, Pb, As, Sb, Bi, Se, and Te, and mixtures of these and other elements comprising oxygen. The oxides may comprise a oxide anion such as those of the present disclosure such as a metal oxide anion and a cation such as an alkali, alkaline earth, transition, inner transition and rare earth metal cation, and those of other metals and metalloids such as those of Al, Ga, In, Si, Ge, Sn, Pb, As, Sb, Bi, Se, and Te such as $MM'_{2x}O_{3x+1}$ or $MM'_{2x}O_4$ (M=alkaline earth, M'=transition metal such as Fe or Ni or Mn, x=integer) and $M_2M'_{2x}O_{3x+1}$ or $M_2M'_{2x}O_4$ (M=alkali, M'=transition metal such as Fe or Ni or Mn, x=integer). Suitable exemplary metal oxyhydroxides are AlO(OH), ScO(OH), YO(OH), VO(OH), CrO(OH), MnO (OH) ($\alpha$-MnO(OH) groutite and $\gamma$-MnO(OH) manganite), FeO(OH), CoO(OH), NiO(OH), RhO(OH), GaO(OH), InO (OH), $Ni_{1/2}Co_{1/2}O(OH)$, and $Ni_{1/3}Co_{1/3}Mn_{1/3}O(OH)$. Suitable exemplary hydroxides are those of metals such as alkali, alkaline earth, transition, inner transition, and rare earth metals and those of other metals and metalloids such as such as Al, Ga, In, Si, Ge, Sn, Pb, As, Sb, Bi, Se, and Te, and mixtures. Suitable complex ion hydroxides are $Li_2Zn(OH)_4$, $Na_2Zn(OH)_4$, $Li_2Sn(OH)_4$, $Na_2Sn(OH)_4$, $Li_2Pb(OH)_4$, $Na_2Pb(OH)_4$, $LiSb(OH)_4$, $NaSb(OH)_4$, $LiAl(OH)_4$, $NaAl(OH)_4$, $LiCr(OH)_4$, $NaCr(OH)_4$, $Li_2Sn(OH)_6$, and $Na_2Sn(OH)_6$. Additional exemplary suitable hydroxides are at least one from $Co(OH)_2$, $Zn(OH)_2$, $Ni(OH)_2$, other transition metal hydroxides, $Cd(OH)_2$, $Sn(OH)_2$, and Pb(OH). Suitable exemplary peroxides are $H_2O_2$, those of organic compounds, and those of metals such as $M_2O_2$ where M is an alkali metal such as $Li_2O_2$, $Na_2O_2$, $K_2O_2$, other ionic peroxides such as those of alkaline earth peroxides such as Ca, Sr, or Ba peroxides, those of other electropositive metals such as those of lanthanides, and covalent metal peroxides such as those of Zn, Cd, and Hg. Suitable exemplary superoxides are those of metals $MO_2$ where M is an alkali metal such as $NaO_2$, $KO_2$, $RbO_2$, and $CsO_2$, and alkaline earth metal superoxides. In an embodiment, the solid fuel comprises an alkali peroxide and hydrogen source such as a hydride, hydrocarbon, or hydrogen storage material such as $BH_3NH_3$. The reaction mixture may comprise a hydroxide such as those of alkaline, alkaline earth, transition, inner transition, and rare earth metals, and Al, Ga, In, Sn, Pb, and other elements that form hydroxides and a source of oxygen such as a compound comprising at least one an oxyanion such as a carbonate such as one comprising alkaline, alkaline earth, transition, inner transition, and rare earth metals, and Al, Ga, In, Sn, Pb, and others of the present disclosure. Other suitable compounds comprising oxygen are at least one of oxyanion compound of the group of aluminate, tungstate, zirconate, titanate, sulfate, phosphate, carbonate, nitrate, chromate, dichromate, and manganate, oxide, oxyhydroxide, peroxide, superoxide, silicate, titanate, tungstate, and others of the present disclosure. An exemplary reaction of a hydroxide and a carbonate is given by $$Ca(OH)_2 + Li_2CO_3 \text{ to } CaO + H_2O + Li_2O + CO_2 \quad (87)$$

In other embodiments, the oxygen source is gaseous or readily forms a gas such as $NO_2$, NO, $N_2O$, $CO_2$, $P_2O_3$, $P_2O_5$, and $SO_2$. The reduced oxide product from the formation of $H_2O$ catalyst such as C, N, $NH_3$, P, or S may be converted back to the oxide again by combustion with oxygen or a source thereof as given in Mills Prior Applications. The cell may produce excess heat that may be used for heating applications, or the heat may be converted to electricity by means such as a Rankine or Brayton system. Alternatively, the cell may be used to synthesize lower-energy hydrogen species such as molecular hydrino and hydrino hydride ions and corresponding compounds.

In an embodiment, the reaction mixture to form hydrinos for at least one of production of lower-energy hydrogen species and compounds and production of energy comprises a source of atomic hydrogen and a source of catalyst comprising at least one of H and O such those of the present disclosure such as $H_2O$ catalyst. The reaction mixture may further comprise an acid such as $H_2SO_3$, $H_2SO_4$, $H_2CO_3$, $HNO_2$, $HNO_3$, $HClO_4$, $H_3PO_3$, and $H_3PO_4$ or a source of an acid such as an acid anhydride or anhydrous acid. The latter may comprise at least one of the group of $SO_2$, $SO_3$, $CO_2$, $NO_2$, $N_2O_3$, $N_2O_5$, $Cl_2O_7$, $PO_2$, $P_2O_3$, and $P_2O_5$. The reaction mixture may comprise at least one of a base and a basic anhydride such as $M_2O$ (M=alkali), M'O (M'=alkaline earth), ZnO or other transition metal oxide, CdO, CoO, SnO, AgO, HgO, or $Al_2O_3$. Further exemplary anhydrides comprise metals that are stable to $H_2O$ such as Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. The anhydride may be an alkali metal or alkaline earth metal oxide, and the hydrated compound may comprise a hydroxide. The reaction mixture may comprise an oxyhydroxide such as FeOOH, NiOOH, or CoOOH. The reaction mixture may comprise at least one of a source of $H_2O$ and $H_2O$. The $H_2O$ may be formed reversibly by hydration and dehydration reactions in the presence of atomic hydrogen. Exemplary reactions to form $H_2O$ catalyst are $$Mg(OH)_2 \text{ to } MgO + H_2O \tag{88}$$

$$2Li_2OH \text{ to } Li_2O + H_2O \tag{89}$$

$$H_2CO_3 \text{ to } CO_2 + H_2O \tag{90}$$

$$2FeOOH \text{ to } Fe_2O_3 + H_2O \tag{91}$$

In an embodiment, $H_2O$ catalyst is formed by dehydration of at least one compound comprising phosphate such as salts of phosphate, hydrogen phosphate, and dihydrogen phosphate such as those of cations such as cations comprising metals such as alkali, alkaline earth, transition, inner transition, and rare earth metals, and those of other metals and metalloids such as those of Al, Ga, In, Si, Ge, Sn, Pb, As, Sb, Bi, Se, and Te, and mixtures to form a condensed phosphate such as at least one of polyphosphates such as $[P_nO_{3n+1}]^{(n+2)-}$, long chain metaphosphates such as $[(PO_3)_n]^{n-}$, cyclic metaphosphates such as $[(PO_3)_n]^{n-}$ with n≥3, and ultraphosphates such as $P_4O_{10}$. Exemplary reactions are $$(n-2)NaH_2PO_4 + 2Na_2HPO_4 \xrightarrow{heat} Na_{n+2}P_nO_{3n+1}(\text{polyphosphate}) + (n-1)H_2O \tag{92}$$

$$nNaH_2PO_4 \xrightarrow{heat} (NaPO_3)_n(\text{metaphosphate}) + nH_2O \tag{93}$$

The reactants of the dehydration reaction may comprise R—Ni that may comprise at least one of $Al(OH)_3$, and $Al_2O_3$. The reactants may further comprise a metal M such as those of the present disclosure such as an alkali metal, a metal hydride MH, a metal hydroxide such as those of the present disclosure such as an alkali hydroxide and a source of hydrogen such as $H_2$ as well as intrinsic hydrogen. Exemplary reactions are $$2Al(OH)_3 + \text{to } Al_2O_3 + 3H_2O \tag{94}$$

$$Al_2O_3 + 2NaOH \text{ to } 2NaAlO_2 + H_2O \tag{95}$$

$$3MH + Al(OH)_3 + \text{to } M_3Al + 3H_2O \tag{96}$$

$$MoCu + 2MOH + 4O_2 \text{ to } M_2MoO_4 + CuO + H_2O (M = \text{Li, Na, K, Rb, Cs}) \tag{97}$$

The reaction product may comprise an alloy. The R—Ni may be regenerated by rehydration. The reaction mixture and dehydration reaction to form $H_2O$ catalyst may comprise and involve an oxyhydroxide such as those of the present disclosure as given in the exemplary reaction:

$$3Co(OH)_2 \text{ to } 2CoOOH + Co + 2H_2O \tag{98}$$

The atomic hydrogen may be formed from $H_2$ gas by dissociation. The hydrogen dissociator may be one of those of the present disclosure such as R—Ni or a noble metal or transition metal on a support such as Ni or Pt or Pd on carbon or $Al_2O_3$. Alternatively, the atomic H may be from H permeation through a membrane such as those of the present disclosure. In an embodiment, the cell comprises a membrane such as a ceramic membrane to allow $H_2$ to diffuse through selectively while preventing $H_2O$ diffusion. In an embodiment, at least one of $H_2$ and atomic H are supplied to the cell by electrolysis of an electrolyte comprising a source of hydrogen such as an aqueous or molten electrolyte comprising $H_2O$. In an embodiment, $H_2O$ catalyst is formed reversibly by dehydration of an acid or base to the anhydride form. In an embodiment, the reaction to form the catalyst $H_2O$ and hydrinos is propagated by changing at least one of the cell pH or activity, temperature, and pressure wherein the pressure may be changed by changing the temperature. The activity of a species such as the acid, base, or anhydride may be changed by adding a salt as known by those skilled in the art. In an embodiment, the reaction mixture may comprise a material such as carbon that may absorb or be a source of a gas such as $H_2$ or acid anhydride gas to the reaction to form hydrinos. The reactants may be in any desired concentrations and ratios. The reaction mixture may be molten or comprise an aqueous slurry.

In another embodiment, the source of the $H_2O$ catalyst is the reaction between an acid and a base such as the reaction between at least one of a hydrohalic acid, sulfuric, nitric, and nitrous, and a base. Other suitable acid reactants are aqueous solutions of $H_2SO_4$, HCl, HX (X-halide), $H_3PO_4$, $HClO_4$, $HNO_3$, HNO, $HNO_2$, $H_2S$, $H_2CO_3$, $H_2MoO_4$, $HNbO_3$, $H_2B_4O_7$ (M tetraborate), $HBO_2$, $H_2WO_4$, $H_2CrO_4$, $H_2Cr_2O_7$, $H_2TiO_3$, $HZrO_3$, $MAlO_2$, $HMn_2O_4$, $HIO_3$, $HIO_4$, $HClO_4$, or an organic acidic such as formic or acetic acid. Suitable exemplary bases are a hydroxide, oxyhydroxide, or oxide comprising an alkali, alkaline earth, transition, inner transition, or rare earth metal, or Al, Ga, In, Sn, or Pb.

In an embodiment, the reactants may comprise an acid or base that reacts with base or acid anhydride, respectively, to form $H_2O$ catalyst and the compound of the cation of the base and the anion of the acid anhydride or the cation of the basic anhydride and the anion of the acid, respectively. The exemplary reaction of the acidic anhydride $SiO_2$ with the base NaOH is $$4NaOH + SiO_2 \text{ to } Na_4SiO_4 + 2H_2O \quad (99)$$

wherein the dehydration reaction of the corresponding acid is $$H_4SiO_4 \text{ to } 2H_2O + SiO_2 \quad (100)$$

Other suitable exemplary anhydrides may comprise an element, metal, alloy, or mixture such as one from the group of Mo, Ti, Zr, Si, Al, Ni, Fe, Ta, V, B, Nb, Se, Te, W, Cr, Mn, Hf, Co, and Mg. The corresponding oxide may comprise at least one of $MoO_2$, $TiO_2$, $ZrO_2$, $SiO_2$, $Al_2O_3$, NiO, $Ni_2O_3$, FeO, $Fe_2O_3$, $TaO_2$, $Ta_2O_5$, VO, $VO_2$, $V_2O_3$, $V_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, MnO, $Mn_3O_4$, $Mn_2O_3$, $MnO_2$, $Mn_2O_7$, $HfO_2$, $Co_2O_3$, CoO, $Co_3O_4$, $Co_2O_3$, and MgO. In an exemplary embodiment, the base comprises a hydroxide such as an alkali hydroxide such as MOH (M=alkali) such as LiOH that may form the corresponding basic oxide such as $M_2O$ such as $Li_2O$, and H2O. The basic oxide may react with the anhydride oxide to form a product oxide. In an exemplary reaction of LiOH with the anhydride oxide with the release of $H_2O$, the product oxide compound may comprise $Li_2MoO_3$ or $Li_2MoO_4$, $Li_2TiO_3$, $Li_2ZrO_3$, $Li_2SiO_3$, $LiAlO_2$, $LiNiO_2$, $LiFeO_2$, $LiTaO_3$, $LiVO_3$, $Li_2B_4O_7$, $Li_2NbO_3$, $Li_2SeO_3$, $Li_3PO_4$, $Li_2SeO_4$, $Li_2TeO_3$, $Li_2TeO_4$, $Li_2WO_4$, $Li_2CrO_4$, $Li_2Cr_2O_7$, $Li_2MnO_4$, $Li_2HfO_3$, $LiCoO_2$, and MgO. Other suitable exemplary oxides are at least one of the group of $As_2O_3$, $As_2O_5$, $Sb_2O_3$, $Sb_2O_4$, $Sb_2O_5$, $Bi_2O_3$, $SO_2$, $SO_3$, $CO_2$, $NO_2$, $N_2O_3$, $N_2O_5$, $Cl_2O_7$, $PO_2$, $P_2O_3$, and $P_2O_5$, and other similar oxides known to those skilled in the art. Another example is given by Eq. (91). Suitable reactions of metal oxides are $$2LiOH + NiO \text{ to } Li_2NiO_2 + H_2O \quad (101)$$

$$3LiOH + NiO \text{ to } LiNiO_2 + H_2O + Li_2O + 1/2H_2 \quad (102)$$

$$4LiOH + Ni_2O_3 \text{ to } 2Li_2NiO_2 + 2H_2O + 1/2O_2 \quad (103)$$

$$2LiOH + Ni_2O_3 \text{ to } 2LiNiO_2 + H_2O \quad (104)$$

Other transition metals such as Fe, Cr, and Ti, inner transition, and rare earth metals and other metals or metalloids such as Al, Ga, In, Si, Ge, Sn, Pb, As, Sb, Bi, Se, and Te may substitute for Ni, and other alkali metal such as Li, Na, Rb, and Cs may substitute for K. In an embodiment, the oxide may comprise Mo wherein during the reaction to form $H_2O$, nascent $H_2O$ catalyst and H may form that further react to form hydrinos. Exemplary solid fuel reactions and possible oxidation reduction pathways are $$3MoO_2 + 4LiOH \rightarrow 2Li_2MoO_4 + Mo + 2H_2O \quad (105)$$

$$2MoO_2 + 4LiOH \rightarrow 2Li_2MoO_4 + 2H_2 \quad (106)$$

-continued $$O^{2-} \rightarrow 1/2O_2 + 2e^- \quad (107)$$

$$2H_2O + 2e^- \rightarrow 2OH^- + H_2 \quad (108)$$

$$2H_2O + 2e^- \rightarrow 2OH^- + H + H(1/4) \quad (109)$$

$$Mo^{4+} + 4e^- \rightarrow Mo \quad (110)$$

The reaction may further comprise a source of hydrogen such as hydrogen gas and a dissociator such as $Pd/Al_2O_3$. The hydrogen may be any of proteium, deuterium, or tritium or combinations thereof. The reaction to form $H_2O$ catalyst may comprise the reaction of two hydroxides to form water. The cations of the hydroxides may have different oxidation states such as those of the reaction of an alkali metal hydroxide with a transition metal or alkaline earth hydroxide. The reaction mixture and reaction may further comprise and involve $H_2$ from a source as given in the exemplary reaction:

$$LiOH + 2Co(OH)_2 + 1/2H_2 \text{ to } LiCoO_2 + 3H_2O + Co \quad (111)$$

The reaction mixture and reaction may further comprise and involve a metal M such as an alkali or an alkaline earth metal as given in the exemplary reaction:

$$M + LiOH + Co(OH)_2 \text{ to } LiCoO_2 + H_2O + MH \quad (112)$$

In an embodiment, the reaction mixture comprises a metal oxide and a hydroxide that may serve as a source of H and optionally another source of H wherein the metal such as Fe of the metal oxide can have multiple oxidation states such that it undergoes an oxidation-reduction reaction during the reaction to form $H_2O$ to serve as the catalyst to react with H to form hydrinos. An example is FeO wherein $Fe^{2+}$ can undergo oxidation to $Fe^{3+}$ during the reaction to form the catalyst. An exemplary reaction is $$FeO + 3LiOH \text{ to } H_2O + LiFeO_2 + H(1/p) + Li_2O \quad (113)$$

In an embodiment, at least one reactant such as a metal oxide, hydroxide, or oxyhydroxide serves as an oxidant wherein the metal atom such as Fe, Ni, Mo, or Mn may be in an oxidation state that is higher than another possible oxidation state. The reaction to form the catalyst and hydrinos may cause the atom to undergo a reduction to at least one lower oxidation state. Exemplary reactions of metal oxides, hydroxides, and oxyhydroxides to form $H_2O$ catalyst are $$2KOH + NiO \text{ to } K_2NiO_2 + H_2O \quad (114)$$

$$3KOH + NiO \text{ to } KNiO_2 + H_2O + K_2O + 1/2H_2 \quad (115)$$

$$2KOH + Ni_2O_3 \text{ to } 2KNiO_2 + H_2O \quad (116)$$

$$4KOH + Ni_2O_3 \text{ to } 2K_2NiO_2 + 2H_2O + 1/2O_2 \quad (117)$$

$$2KOH + Ni(OH)_2 \text{ to } K_2NiO_2 + 2H_2O \quad (118)$$

$$2LiOH + MoO_3 \text{ to } Li_2MoO_4 + H_2O \quad (119)$$

-continued $$3KOH+Ni(OH)_2 \text{ to } KNiO_2+2H_2O+K_2O+1/2H_2 \quad (120)$$

$$2KOH+2NiOOH \text{ to } 2K_2NiO_2+2H_2O+NiO+1/2O_2 \quad (121)$$

$$KOH+NiOOH \text{ to } KNiO_2+H_2O \quad (122)$$

$$2NaOH+Fe_2O_3 \text{ to } 2NaFeO_2+H_2O \quad (123)$$

Other transition metals such as Ni, Fe, Cr, and Ti, inner transition, and rare earth metals and other metals or metalloids such as Al, Ga, In, Si, Ge, Sn, Pb, As, Sb, Bi, Se, and Te may substitute for Ni or Fe, and other alkali metals such as Li, Na, K, Rb, and Cs may substitute for K or Na. In an embodiment, the reaction mixture comprises at least one of an oxide and a hydroxide of metals that are stable to $H_2O$ such as Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. Additionally, the reaction mixture comprises a source of hydrogen such as $H_2$ gas and optionally a dissociator such as a noble metal on a support. In an embodiment, the solid fuel or energetic material comprises mixture of at least one of a metal halide such as at least one of a transition metal halide such as a bromide such as $FeBr_2$ and a metal that forms a oxyhydroxide, hydroxide, or oxide and $H_2O$. In an embodiment, the solid fuel or energetic material comprises a mixture of at least one of a metal oxide, hydroxide, and an oxyhydroxide such as at least one of a transition metal oxide such as $Ni_2O_3$ and $H_2O$.

The exemplary reaction of the basic anhydride NiO with acid HCl is $$2HCl+NiO \text{ to } H_2O+NiCl_2 \quad (124)$$

wherein the dehydration reaction of the corresponding base is $$Ni(OH)_2 \text{ to } H_2O+NiO \quad (125)$$

The reactants may comprise at least one of a Lewis acid or base and a Bronsted-Lowry acid or base. The reaction mixture and reaction may further comprise and involve a compound comprising oxygen wherein the acid reacts with the compound comprising oxygen to form water as given in the exemplary reaction:

$$2HX+POX_3 \text{ to } H_2O+PX_5 \quad (126)$$

(X=halide). Similar compounds as $POX_3$ are suitable such as those with P replaced by S. Other suitable exemplary anhydrides may comprise an oxide of an element, metal, alloy, or mixture that is soluble in acid such as an a hydroxide, oxyhydroxide, or oxide comprising an alkali, alkaline earth, transition, inner transition, or rare earth metal, or Al, Ga, In, Sn, or Pb such as one from the group of Mo, Ti, Zr, Si, Al, Ni, Fe, Ta, V, B, Nb, Se, Te, W, Cr, Mn, Hf, Co, and Mg. The corresponding oxide may comprise $MoO_2$, $TiO_2$, $ZrO_2$, $SiO_2$, $Al_2O_3$, NiO, FeO or $Fe_2O_3$, $TaO_2$, $Ta_2O_5$, VO, $VO_2$, $V_2O_3$, $V_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, MnO, $Mn_3O_4$, $Mn_2O_3$, $MnO_2$, $Mn_2O_7$, $HfO_2$, $Co_2O_3$, CoO, $Co_3O_4$, $Co_2O_3$, and MgO. Other suitable exemplary oxides are of those of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In an exemplary embodiment, the acid comprises a hydrohalic acid and the product is $H_2O$ and the metal halide of the oxide. The reaction mixture further comprises a source of hydrogen such as $H_2$ gas and a dissociator such as Pt/C wherein the H and $H_2O$ catalyst react to form hydrinos.

In an embodiment, the solid fuel comprises a $H_2$ source such as a permeation membrane or $H_2$ gas and a dissociator such as Pt/C and a source of $H_2O$ catalyst comprising an oxide or hydroxide that is reduced to $H_2O$. The metal of the oxide or hydroxide may form metal hydride that serves as a source of H. Exemplary reactions of an alkali hydroxide and oxide such as LiOH and $Li_2O$ are $$LiOH+H_2 \text{ to } H_2O+LiH \quad (127)$$

$$Li_2O+H_2 \text{ to } LiOH+LiH \quad (128)$$

The reaction mixture may comprise oxides or hydroxides of metals that undergo hydrogen reduction to $H_2O$ such as those of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In and a source of hydrogen such as $H_2$ gas and a dissociator such as Pt/C.

In another embodiment, the reaction mixture comprises a $H_2$ source such as $H_2$ gas and a dissociator such as Pt/C and a peroxide compound such as $H_2O_2$ that decomposes to $H_2O$ catalyst and other products comprising oxygen such as $O_2$. Some of the $H_2$ and decomposition product such as $O_2$ may react to also form $H_2O$ catalyst.

In an embodiment, the reaction to form $H_2O$ as the catalyst comprises an organic dehydration reaction such as that of an alcohol such as a polyalcohol such as a sugar to an aldehyde and $H_2O$. In an embodiment, the dehydration reaction involves the release of $H_2O$ from a terminal alcohol to form an aldehyde. The terminal alcohol may comprise a sugar or a derivative thereof that releases $H_2O$ that may serve as a catalyst. Suitable exemplary alcohols are meso-erythritol, galactitol or dulcitol, and polyvinyl alcohol (PVA). An exemplary reaction mixture comprises a sugar+hydrogen dissociator such as $Pd/Al_2O_3+H_2$. Alternatively, the reaction comprises a dehydration of a metal salt such as one having at least one water of hydration. In an embodiment, the dehydration comprises the loss of $H_2O$ to serve as the catalyst from hydrates such as aqua ions and salt hydrates such as $BaI_2$ $2H_2O$ and $EuBr_2$ $nH_2O$.

In an embodiment, the reaction to form $H_2O$ catalyst comprises the hydrogen reduction of a compound comprising oxygen such as CO, an oxyanion such as $MNO_3$ (M=alkali), a metal oxide such as NiO, $Ni_2O_3$, $Fe_2O_3$, or SnO, a hydroxide such as $Co(OH)_2$, oxyhydroxides such as FeOOH, CoOOH, and NiOOH, and compounds, oxyanions, oxides, hydroxides, oxyhydroxides, peroxides, superoxides, and other compositions of matter comprising oxygen such as those of the present disclosure that are hydrogen reducible to $H_2O$. Exemplary compounds comprising oxygen or an oxyanion are $SOCl_2$, $Na_2S_2O_3$, $NaMnO_4$, $POBr_3K_2S_2O_8$, CO, $CO_2$, NO, $NO_2$, $P_2O_5$, $N_2O_5$, $N_2O$, $SO_2$, $I_2O_5$, $NaClO_2$, NaClO, $K_2SO_4$, and $KHSO_4$. The source of hydrogen for hydrogen reduction may be at least one of $H_2$ gas and a hydride such as a metal hydride such as those of the present disclosure. The reaction mixture may further comprise a reductant that may form a compound or ion comprising oxygen. The cation of the oxyanion may form a product compound comprising another anion such as a halide, other chalcogenide, phosphide, other oxyanion, nitride, silicide, arsenide, or other anion of the present disclosure. Exemplary reactions are $$4NaNO_3(c)+5MgH_2(c) \text{ to } 5MgO(c)+4NaOH(c)+3H_2O(l)+2N_2(g) \quad (129)$$

$$P_2O_5(c)+6NaH(c) \text{ to } 2Na_3PO_4(c)+3H_2O(g) \quad (130)$$

$$NaClO_4(c)+2MgH_2(c) \text{ to } 2MgO(c)+NaCl(c)+2H_2O(l) \quad (131)$$

$$KHSO_4+4H_2 \text{ to } KHS+4H_2O \quad (132)$$

$$K_2SO_4+4H_2 \text{ to } 2KOH+2H_2O+H_2S \quad (133)$$

$$LiNO_3+4H_2 \text{ to } LiNH_2+3H_2O \quad (134)$$

$$GeO_2+2H_2 \text{ to } Ge+2H_2O \quad (135)$$

$$CO_2+H_2 \text{ to } C+2H_2O \quad (136)$$

$$PbO_2+2H_2 \text{ to } 2H_2O+Pb \quad (137)$$

$$V_2O_5+5H_2 \text{ to } 2V+5H_2O \quad (138)$$

$$Co(OH)_2+H_2 \text{ to } Co+2H_2O \quad (139)$$

$$Fe_2O_3+3H_2 \text{ to } 2Fe+3H_2O \quad (140)$$

$$3Fe_2O_3+H_2 \text{ to } 2Fe_3O_4+H_2O \quad (141)$$

$$Fe_2O_3+H_2 \text{ to } 2FeO+H_2O \quad (142)$$

$$Ni_2O_3+3H_2 \text{ to } 2Ni+3H_2O \quad (143)$$

$$3Ni_2O_3+H_2 \text{ to } 2Ni_3O_4+H_2O \quad (144)$$

$$Ni_2O_3+H_2 \text{ to } 2NiO+H_2O \quad (145)$$

$$3FeOOH+1/2H_2 \text{ to } Fe_3O_4+2H_2O \quad (146)$$

$$3NiOOH+1/2H_2 \text{ to } Ni_3O_4+2H_2O \quad (147)$$

$$3CoOOH+1/2H_2 \text{ to } Co_3O_4+2H_2O \quad (148)$$

$$FeOOH+1/2H_2 \text{ to } FeO+H_2O \quad (149)$$

$$NiOOH+1/2H_2 \text{ to } NiO+H_2O \quad (150)$$

$$CoOOH+1/2H_2 \text{ to } CoO+H_2O \quad (151)$$

$$SnO+H_2 \text{ to } Sn+H_2O \quad (152)$$

The reaction mixture may comprise a source of an anion or an anion and a source of oxygen or oxygen such as a compound comprising oxygen wherein the reaction to form $H_2O$ catalyst comprises an anion-oxygen exchange reaction with optionally $H_2$ from a source reacting with the oxygen to form $H_2O$. Exemplary reactions are $$2NaOH+H_2+S \text{ to } Na_2S+2H_2O \quad (153)$$

$$2NaOH+H_2+Te \text{ to } Na_2Te+2H_2O \quad (154)$$

$$2NaOH+H_2+Se \text{ to } Na_2Se+2H_2O \quad (155)$$

$$LiOH+NH_3 \text{ to } LiNH_2+H_2O \quad (156)$$

In another embodiment, the reaction mixture comprises an exchange reaction between chalcogenides such as one between reactants comprising O and S. An exemplary chalcogenide reactant such as tetrahedral ammonium tetrathiomolybdate contains the ($[MoS_4]^{2-}$) anion. An exemplary reaction to form nascent $H_2O$ catalyst and optionally nascent H comprises the reaction of molybdate $[MoO_4]^{2-}$ with hydrogen sulfide in the presence of ammonia:

$$[NH_4]_2[MoO_4]+4H_2S \text{ to } [NH_4]_2[MoS_4]+4H_2O \quad (157)$$

In an embodiment, the reaction mixture comprises a source of hydrogen, a compound comprising oxygen, and at least one element capable of forming an alloy with at least one other element of the reaction mixture. The reaction to form $H_2O$ catalyst may comprise an exchange reaction of oxygen of the compound comprising oxygen and an element capable of forming an alloy with the cation of the oxygen compound wherein the oxygen reacts with hydrogen from the source to form $H_2O$. Exemplary reactions are $$NaOH+1/2H_2+Pd \text{ to } NaPb+H_2O \quad (158)$$

$$NaOH+1/2H_2+Bi \text{ to } NaBi+H_2O \quad (159)$$

$$NaOH+1/2H_2+2Cd \text{ to } Cd_2Na+H_2O \quad (160)$$

$$NaOH+1/2H_2+4Ga \text{ to } Ga_4Na+H_2O \quad (161)$$

$$NaOH+1/2H_2+Sn \text{ to } NaSn+H_2O \quad (162)$$

$$NaAlH_4+Al(OH)_3+5Ni \text{ to } NaAlO_2+Ni_5Al+H_2O+5/2H_2 \quad (163)$$

In an embodiment, the reaction mixture comprises a compound comprising oxygen such as an oxyhydroxide and a reductant such as a metal that forms an oxide. The reaction to form $H_2O$ catalyst may comprise the reaction of an oxyhydroxide with a metal to from a metal oxide and $H_2O$. Exemplary reactions are $$2MnOOH+Sn \text{ to } 2MnO+SnO+H_2O \quad (164)$$

$$4MnOOH+Sn \text{ to } 4MnO+SnO_2+2H_2O \quad (165)$$

$$2MnOOH+Zn \text{ to } 2MnO+ZnO+H_2O \quad (166)$$

In an embodiment, the reaction mixture comprises a compound comprising oxygen such as a hydroxide, a source of hydrogen, and at least one other compound comprising a different anion such as halide or another element. The reaction to form $H_2O$ catalyst may comprise the reaction of the hydroxide with the other compound or element wherein the anion or element is exchanged with hydroxide to from another compound of the anion or element, and $H_2O$ is formed with the reaction of hydroxide with $H_2$. The anion may comprise halide. Exemplary reactions are $$2NaOH+NiCl_2+H_2 \text{ to } 2NaCl+2H_2O+Ni \quad (167)$$

$$2NaOH+I_2+H_2 \text{ to } 2NaI+2H_2O \quad (168)$$

$$2NaOH+XeF_2+H_2 \text{ to } 2NaF+2H_2O+Xe \quad (169)$$

$$BiX_3\ (X=\text{halide})+4Bi(OH)_3 \text{ to } 3BiOX+Bi_2O_3+6H_2O \quad (170)$$

The hydroxide and halide compounds may be selected such that the reaction to form $H_2O$ and another halide is thermally reversible. In an embodiment, the general exchange reaction is $$NaOH + 1/2H_2 + 1/yM_xCl_y = NaCl + 6H_2O + x/yM \quad (171)$$

wherein exemplary compounds $M_xCl_y$ are $AlCl_3$, $BeCl_2$, $HfCl_4$, $KAgCl_2$, $MnCl_2$, $NaAlCl_4$, $ScCl_3$, $TiCl_2$, $TiCl_3$, $UCl_3$, $UCl_4$, $ZrCl_4$, $EuCl_3$, $GdCl_3$, $MgCl_2$, $NdCl_3$, and $YCl_3$. At an elevated temperature the reaction of Eq. (171) such as in the range of about 100° C. to 2000° C. has at least one of an enthalpy and free energy of about 0 kJ and is reversible. The reversible temperature is calculated from the corresponding thermodynamic parameters of each reaction. Representative are temperature ranges are NaCl—$ScCl_3$ at about 800K-900K, NaCl—$TiCl_2$ at about 300K-400K, NaCl—$UCl_3$ at about 600K-800K, NaCl—$UCl_4$ at about 250K-300K, NaCl—$ZrCl_4$ at about 250K-300K, NaCl—$MgCl_2$ at about 900K-1300K, NaCl—$EuCl_3$ at about 900K-1000K, NaCl—$NdCl_3$ at about >1000K, and NaCl—$YCl_3$ at about >1000K.

In an embodiment, the reaction mixture comprises an oxide such as a metal oxide such a alkali, alkaline earth, transition, inner transition, and rare earth metal oxides and those of other metals and metalloids such as those of Al, Ga, In, Si, Ge, Sn, Pb, As, Sb, Bi, Se, and Te, a peroxide such as $M_2O_2$ where M is an alkali metal such as $Li_2O_2$, $Na_2O_2$, and $K_2O_2$, and a superoxide such as $MO_2$ where M is an alkali metal such as $NaO_2$, $KO_2$, $RbO_2$, and $CsO_2$, and alkaline earth metal superoxides, and a source of hydrogen. The ionic peroxides may further comprise those of Ca, Sr, or Ba. The reaction to form $H_2O$ catalyst may comprise the hydrogen reduction of the oxide, peroxide, or superoxide to form $H_2O$. Exemplary reactions are $$Na_2O + 2H_2 \text{ to } 2NaH + H_2O \quad (172)$$

$$Li_2O_2 + H_2 \text{ to } Li_2O + H_2O \quad (173)$$

$$KO_2 + 3/2H_2 \text{ to } KOH + H_2O \quad (174)$$

In an embodiment, the reaction mixture comprises a source of hydrogen such as at least one of $H_2$, a hydride such as at least one of an alkali, alkaline earth, transition, inner transition, and rare earth metal hydride and those of the present disclosure and a source of hydrogen or other compound comprising combustible hydrogen such as a metal amide, and a source of oxygen such as $O_2$. The reaction to form $H_2O$ catalyst may comprise the oxidation of $H_2$, a hydride, or hydrogen compound such as metal amide to form $H_2O$. Exemplary reactions are $$2NaH + O_2 \text{ to } Na_2O + H_2O \quad (175)$$

$$H_2 + 1/2O_2 \text{ to } H_2O \quad (176)$$

$$LiNH_2 + 2O_2 \text{ to } LiNO_3 + H_2O \quad (177)$$

$$2LiNH_2 + 3/2O_2 \text{ to } 2LiOH + H_2O + N_2 \quad (178)$$

In an embodiment, the reaction mixture comprises a source of hydrogen and a source of oxygen. The reaction to form $H_2O$ catalyst may comprise the decomposition of at least one of source of hydrogen and the source of oxygen to form $H_2O$. Exemplary reactions are $$NH_4NO_3 \text{ to } N_2O + 2H_2O \quad (179)$$

$$NH_4NO_3 \text{ to } N_2 + 1/2O_2 + 2H_2O \quad (180)$$

$$H_2O_2 \text{ to } 1/2O_2 + H_2O \quad (181)$$

$$H_2O_2 + H_2 \text{ to } 2H_2O \quad (182)$$

The reaction mixtures disclosed herein this Chemical Reactor section further comprise a source of hydrogen to form hydrinos. The source may be a source of atomic hydrogen such as a hydrogen dissociator and $H_2$ gas or a metal hydride such as the dissociators and metal hydrides of the present disclosure. The source of hydrogen to provide atomic hydrogen may be a compound comprising hydrogen such as a hydroxide or oxyhydroxide. The H that reacts to form hydrinos may be nascent H formed by reaction of one or more reactants wherein at least one comprises a source of hydrogen such as the reaction of a hydroxide and an oxide. The reaction may also form $H_2O$ catalyst. The oxide and hydroxide may comprise the same compound. For example, an oxyhydroxide such as FeOOH could dehydrate to provide $H_2O$ catalyst and also provide nascent H for a hydrino reaction during dehydration:

$$4FeOOH \text{ to } H_2O + Fe_2O_3 + 2FeO + O_2 + 2H(1/4) \quad (183)$$

wherein nascent H formed during the reaction reacts to hydrino. Other exemplary reactions are those of a hydroxide and an oxyhydroxide or an oxide such as NaOH+FeOOH or $Fe_2O_3$ to form an alkali metal oxide such as $NaFeO_2$+$H_2O$ wherein nascent H formed during the reaction may form hydrino wherein $H_2O$ serves as the catalyst. The oxide and hydroxide may comprise the same compound. For example, an oxyhydroxide such as FeOOH could dehydrate to provide $H_2O$ catalyst and also provide nascent H for a hydrino reaction during dehydration:

$$4FeOOH \text{ to } H_2O + Fe_2O_3 + 2FeO + O_2 + 2H(1/4) \quad (184)$$

wherein nascent H formed during the reaction reacts to hydrino. Other exemplary reactions are those of a hydroxide and an oxyhydroxide or an oxide such as NaOH+FeOOH or $Fe_2O_3$ to form an alkali metal oxide such as $NaFeO_2$+$H_2O$ wherein nascent H formed during the reaction may form hydrino wherein $H_2O$ serves as the catalyst. Hydroxide ion is both reduced and oxidized in forming $H_2O$ and oxide ion. Oxide ion may react with $H_2O$ to form $OH^-$. The same pathway may be obtained with a hydroxide-halide exchange reaction such as the following $$2M(OH)_2 + 2M'X_2 \rightarrow H_2O + 2MX_2 + 2M'O + 1/2O_2 + 2H(1/4) \quad (185)$$

wherein exemplary M and M' metals are alkaline earth and transition metals, respectively, such as $Cu(OH)_2$+$FeBr_2$, $Cu(OH)_2$+$CuBr_2$, or $Co(OH)_2$+$CuBr_2$. In an embodiment, the solid fuel may comprise a metal hydroxide and a metal halide wherein at least one metal is Fe. At least one of $H_2O$ and $H_2$ may be added to regenerate the reactants. In an embodiment, M and M' may be selected from the group of alkali, alkaline earth, transition, inner transition, and rare earth metals, Al, Ga, In, Si, Ge, Sn, Pb, Group 13, 14, 15, and 16 elements, and other cations of hydroxides or halides such as those of the present disclosure. An exemplary reaction to form at least one of HOH catalyst, nascent H, and hydrino is $$4MOH + 4M'X \rightarrow H_2O + 2M'_2O + M_2O + 2MX + X_2 + 2H(1/4) \quad (186)$$

In an embodiment, the reaction mixture comprises at least one of a hydroxide and a halide compound such as those of the present disclosure. In an embodiment, the halide may serve to facilitate at least one of the formation and maintenance of at least one of nascent HOH catalyst and H. In an embodiment, the mixture may serve to lower the melting point of the reaction mixture.

In an embodiment, the solid fuel comprises a mixture of $Mg(OH)_2$+$CuBr_2$. The product CuBr may be sublimed to form a CuBr condensation product that is separated from the nonvolatile MgO. $Br_2$ may be trapped with a cold trap. CuBr may be reacted with $Br_2$ to form $CuBr_2$, and MgO may be reacted with $H_2O$ to form $Mg(OH)_2$. $Mg(OH)_2$ may be combined with $CuBr_2$ to form the regenerated solid fuel.

An acid-base reaction is another approach to $H_2O$ catalyst. Thus, the thermal chemical reaction is similar to the electrochemical reaction to form hydrinos. Exemplary halides and hydroxides mixtures are those of Bi, Cd, Cu, Co, Mo, and Cd and mixtures of hydroxides and halides of metals having low water reactivity of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, and Zn. In an embodiment, the reaction mixture further comprises $H_2O$ that may serves as a source of at least one of H and catalyst such as nascent $H_2O$. The water may be in the form of a hydrate that decomposes or otherwise reacts during the reaction.

In an embodiment, the solid fuel comprises a reaction mixture of $H_2O$ and an inorganic compound that forms nascent H and nascent $H_2O$. The inorganic compound may comprise a halide such as a metal halide that reacts with the $H_2O$. The reaction product may be at least one of a hydroxide, oxyhydroxide, oxide, oxyhalide, hydroxyhalide, and hydrate. Other products may comprise anions comprising oxygen and halogen such as $XO^-$, $XO_2^-$, $XO_3^-$, and $XO_4^-$ (X=halogen). The product may also be at least one of a reduced cation and a halogen gas. The halide may be a metal halide such as one of an alkaline, alkaline earth, transition, inner transition, and rare earth metal, and Al, Ga, In, Sn, Pb, S, Te, Se, N, P, As, Sb, Bi, C, Si, Ge, and B, and other elements that form halides. The metal or element may additionally be one that forms at least one of a hydroxide, oxyhydroxide, oxide, oxyhalide, hydroxyhalide, hydrate, and one that forms a compound having an anion comprising oxygen and halogen such as $XO^-$, $XO_2^-$, $XO_3^-$, and $XO_4^-$ (X=halogen). Suitable exemplary metals and elements are at least one of an alkaline, alkaline earth, transition, inner transition, and rare earth metal, and Al, Ga, In, Sn, Pb, S, Te, Se, N, P, As, Sb, Bi, C, Si, Ge, and B. An exemplary reaction is $$5MX_2 + 7H_2O \text{ to } MXOH + M(OH)_2 + MO + M_2O_3 + 11H(1/4) + 9/2X_2 \quad (187)$$

wherein M is a metal such as a transition metal such as Cu and X is halogen such as Cl.

In an embodiment, $H_2O$ serves as the catalyst that is maintained at low concentration to provide nascent $H_2O$. In an embodiment, the low concentration is achieved by dispersion of the $H_2O$ molecules in another material such as a solid, liquid, or gas. The $H_2O$ molecules may be diluted to the limit of isolated of nascent molecules. The material also comprises a source of H. The material may comprise an ionic compound such as an alkali halide such as a potassium halide such as KCl or a transition metal halide such as $CuBr_2$. The low concentration to form nascent H may also be achieved dynamically wherein $H_2O$ is formed by a reaction. The product $H_2O$ may be removed at a rate relative to the rate of formation that results in a steady state low concentration to provide at least one of nascent H and nascent HOH. The reaction to form $H_2O$ may comprise dehydration, combustion, acid-base reactions and others such as those of the present disclosure. The $H_2O$ may be removed by means such as evaporation and condensation. Exemplary reactants are FeOOH to form iron oxide and $H_2O$ wherein nascent H is also formed with the further reaction to from hydrinos. Other exemplary reaction mixtures are $Fe_2O_3$+ at least one of NaOH and $H_2$, and FeOOH+at least one of NaOH and $H_2$. The reaction mixture may be maintained at an elevated temperature such as in the range of about 100° C. to 600° C. $H_2O$ product may be removed by condensation of steam in a cold spot of the reactor such as a gas line maintained below 100° C. In another embodiment, a material comprising $H_2O$ as an inclusion or part of a mixture or a compound such as $H_2O$ dispersed or absorbed in a lattice such as that of an ionic compound such as an alkali halide such as a potassium halide such as KCl may be incident with the bombardment of energetic particles. The particles may comprise at least one of photons, ions, and electrons. The particles may comprise a beam such as an electron beam. The bombardment may provide at least one of $H_2O$ catalyst, H, and activation of the reaction to form hydrinos. In embodiments of the SF-CIHT cell, the $H_2O$ content may be high. The $H_2O$ may be ignited to form hydrinos at a high rate by a high current.

The reaction mixture may further comprise a support such as an electrically conductive, high surface area support. Suitable exemplary supports are those of the present disclosure such as a metal powder such as Ni or R—Ni, metal screen such as Ni, Ni celmet, Ni mesh, carbon, carbides such as TiC and WC, and borides. The support may comprise a dissociator such as Pd/C or Pd/C. The reactants may be in any desired molar ratio. In an embodiment, the stoichiometry is such to favor reaction completion to form $H_2O$ catalyst and to provide H to form hydrinos. The reaction temperature may be in any desired range such as in the range of about ambient to 1500° C. The pressure range may be any desired such as in the range of about 0.01 Torr to 500 atm. The reactions are at least one of regenerative and reversible by the methods disclosed herein and in Mills Prior Applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, and CIHT Power System, PCT/US13/041938 filed May 21, 2013 herein incorporated by reference in their entirety. Reactions that form $H_2O$ may be reversible by changing the reaction conditions such as temperature and pressure to allow the reverse reaction that consumes $H_2O$ to occur as known by those skilled in the art. For example, the $H_2O$ pressure may be increased in the backward reaction to reform the reactants from the products by rehydration. In other cases, the hydrogen-reduced product may be regenerated by oxidation such as by reaction with at least one of oxygen and $H_2O$. In an embodiment, a reverse reaction product may be removed from the reaction such that the reverse or regeneration reaction proceeds. The reverse reaction may become favorable even in the absence of being favorable based on equilibrium thermodynamics by removing at least one reverse reaction product. In an exemplary embodiment, the regenerated reactant (reverse or regeneration reaction product) comprises a hydroxide such as an alkali hydroxide. The hydroxide may be removed by methods such as solvation or sublimation. In the latter case, alkali hydroxide sublime unchanged at a temperature in the range of about 350° C. to 400° C. The reactions may be maintained in the power plants systems of Mills Prior Applications. Thermal energy from a cell producing power may provide heat to at least one other cell undergoing regeneration as disclosed previously. Alternatively, the equilibrium of the reactions to form $H_2O$ catalyst and the reverse regeneration reaction can be shifted by changing the temperature of the water wall of the system design having a temperature gradient due to coolant at selected region of the cell as previously disclosed.

In an embodiment, the halide and oxide may undergo an exchange reaction. The products of the exchange reaction may be separated from each other. The exchange reaction may be performed by heating the product mixture. The separation may be by sublimation that may be driven by at least one of heating and applying a vacuum. In an exemplary embodiment, $CaBr_2$ and CuO may undergo an exchange reaction due to heating to a high temperature such as in the range of about 700° C. to 900° C. to form $CuBr_2$ and CaO. Any other suitable temperature range may be used such as in the range of about 100° C. to 2000° C. The $CuBr_2$ may be separated and collected by sublimation that may be achieved by applying heat and low pressure. The $CuBr_2$ may form a separate band. The CaO may be reacted with $H_2O$ to form $Ca(OH)_2$.

In an embodiment, the solid fuel or energetic material comprises a source of singlet oxygen. An exemplary reaction to generate singlet oxygen is $$NaOCl + H_2O_2 \text{ to } O_2 + NaCl + H_2O \tag{188}$$

In another embodiment, the solid fuel or energetic material comprises a source of or reagents of the Fenton reaction such as $H_2O_2$.

In an embodiment, lower energy hydrogen species and compounds are synthesized using a catalyst comprising at least one of H and O such as $H_2O$. The reaction mixture to synthesize the exemplary lower energy hydrogen compound MHX wherein M is alkali and may be another metal such as alkaline earth wherein the compound has the corresponding stoichiometry, H is hydrino such as hydrino hydride, and X is an anion such as halide, comprises a source of M and X such as an alkali halide such as KCl, and metal reductant such as an alkali metal, a hydrogen dissociator such as Ni such as Ni screen or R—Ni and optionally a support such as carbon, a source of hydrogen such as at least one of a metal hydride such as MH that may substitute for M and $H_2$ gas, and a source of oxygen such as a metal oxide or a compound comprising oxygen. Suitable exemplary metal oxides are $Fe_2O_3$, $Cr_2O_3$, and NiO. The reaction temperature may be maintained in the range of about 200° C. to 1500° C. or about 400° C. to 800° C. The reactants may be in any desired ratios. The reaction mixture to form KHCl may comprise K, Ni screen, KCl, hydrogen gas, and at least one of $Fe_2O_3$, $Cr_2O_3$, and NiO. Exemplary weights and conditions are 1.6 g K, 20 g KCl, 40 g Ni screen, equal moles of oxygen as K from the metal oxides such as 1.5 g $Fe_2O_3$ and 1.5 g NiO, 1 atm $H_2$, and a reaction temperature of about 550-600° C. The reaction forms $H_2O$ catalyst by reaction of H with O from the metal oxide and H reacts with the catalyst to form hydrinos and hydrino hydride ions that form the product KHCl. The reaction mixture to form KHI may comprise K, R—Ni, KI, hydrogen gas, and at least one of $Fe_2O_3$, $Cr_2O_3$, and NiO. Exemplary weights and conditions are 1 g K, 20 g KI, 15 g R—Ni 2800, equal moles of oxygen as K from the metal oxides such as 1 g $Fe_2O_3$ and 1 g NiO, 1 atm $H_2$, and a reaction temperature of about 450-500° C. The reaction forms $H_2O$ catalyst by reaction of H with O from the metal oxide and H reacts with the catalyst to form hydrinos and hydrino hydride ions that form the product KHI. In an embodiment, the product of at least one of the CIHT cell, SF-CIHT cell, solid fuel, or chemical cell is $H_2(1/4)$ that causes an upfield H NMR matrix shift. In an embodiment, the presence of a hydrino species such as a hydrino atom or molecule in a solid matrix such as a matrix of a hydroxide such as NaOH or KOH causes the matrix protons to shift upfield. The matrix protons such as those of NaOH or KOH may exchange. In an embodiment, the shift may cause the matrix peak to be in the range of about −0.1 to −5 ppm relative to TMS.

In an embodiment, the regeneration reaction of a hydroxide and halide compound mixture such as $Cu(OH)_2+CuBr_2$ may by addition of at least one $H_2$ and $H_2O$. Products such as halides and oxides may be separated by sublimation of the halide. In an embodiment, $H_2O$ may be added to the reaction mixture under heating conditions to cause the hydroxide and halide such as $CuBr_2$ and $Cu(OH)_2$ to form from the reaction products. In an embodiment, the regeneration may be achieved by the step of thermal cycling. In an embodiment, the halide such as $CuBr_2$ is $H_2O$ soluble whereas the hydroxide such as $Cu(OH)_2$ is insoluble. The regenerated compounds may be separated by filtering or precipitation. The chemicals may be dried with wherein the thermal energy may be from the reaction. Heat may be recuperated from the driven off water vapor. The recuperation may be by a heat exchanger or by using the steam directly for heating or to generate electricity using a turbine and generator for example. In an embodiment, the regeneration of $Cu(OH)_2$ from CuO is achieved by using a $H_2O$ splitting catalyst. Suitable catalysts are noble metals on a support such as $Pt/Al_2O_3$, and $CuAlO_2$ formed by sintering CuO and $Al_2O_3$, cobalt-phosphate, cobalt borate, cobalt methyl borate, nickel borate, $RuO_2$, $LaMnO_3$, $SrTiO_3$, $TiO_2$, and $WO_3$. An exemplary method to form an $H_2O$-splitting catalyst is the controlled electrolysis of $Co^{2+}$ and $Ni^{2+}$ solution in about 0.1 M potassium phosphate borate electrolyte, pH 9.2, at a potential of 0.92 and 1.15 V (vs., the normal hydrogen electrode), respectively. Exemplary, thermally reversible solid fuel cycles are $$T\ 100\ 2CuBr_2 + Ca(OH)_2 \rightarrow 2CuO + 2CaBr_2 + H_2O \tag{189}$$

$$T\ 730\ CaBr_2 + 2H_2O \rightarrow Ca(OH)_2 + 2HBr \tag{190}$$

-continued $$T\ 100\ CuO + 2HBr \rightarrow CuBr_2 + H_2O \quad (191)$$

$$T\ 100\ 2CuBr_2 + Cu(OH)_2 \rightarrow 2CuO + 2CaBr_2 + H_2O \quad (192)$$

$$T\ 730\ CuBr_2 + 2H_2O \rightarrow Ca(OH)_2 + 2HBr \quad (193)$$

$$T\ 100\ CuO + 2HBr \rightarrow CuBr_2 + H_2O \quad (194)$$

In an embodiment, the reaction mixture of a solid fuel having at least one of $H_2$ as a reactant and $H_2O$ as a product and one or more of $H_2$ or $H_2O$ as at least one of a reactant and a product is selected such that the maximum theoretical free energy of the any conventional reaction is about zero within the range of −500 to +500 kJ/mole of the limiting reagent or preferably within the range of −100 to +100 kJ/mole of the limiting reagent. A mixture of reactants and products may be maintained at one or more of about the optimum temperature at which the free energy is about zero and about the optimum temperature at which the reaction is reversible to obtain regeneration or steady power for at least a duration longer than reaction time in the absence of maintaining the mixture and temperature. The temperature may be within a range of about +/−500° C. or about +/−100° C. of the optimum. Exemplary mixtures and reaction temperatures are a stoichiometric mixture of Fe, $Fe_2O_3$, $H_2$ and $H_2O$ at 800 K and a stoichiometric Sn, SnO, $H_2$ and $H_2O$ at 800 K.

In an embodiment, wherein at least one of an alkali metal M such as K or Li, and nH (n=integer), OH, O, 2O, $O_2$, and $H_2O$ serve as the catalyst, the source of H is at least one of a metal hydride such as MH and the reaction of at least one of a metal M and a metal hydride MH with a source of H to form H. One product may be an oxidized M such as an oxide or hydroxide. The reaction to create at least one of atomic hydrogen and catalyst may be an electron transfer reaction or an oxidation-reduction reaction. The reaction mixture may further comprise at least one of $H_2$, a $H_2$ dissociator such as those of the present disclosure such as Ni screen or R—Ni and an electrically conductive support such as these dissociators and others as well as supports of the present disclosure such as carbon, and carbide, a boride, and a carbonitride. An exemplary oxidation reaction of M or MH is $$4MH + Fe_2O_3 \text{ to } + H_2O + H(1/p) + M_2O + MOH + 2Fe + M \quad (195)$$

wherein at least one of $H_2O$ and M may serve as the catalyst to form H(1/p). The reaction mixture may further comprise a getter for hydrino such as a compound such as a salt such as a halide salt such as an alkali halide salt such as KCl or KI. The product may be MHX (M=metal such as an alkali; X is counter ion such as halide; H is hydrino species). Other hydrino catalysts may substitute for M such as those of the present disclosure such as those of TABLE 1.

In an embodiment, the source of oxygen is a compound that has a heat of formation that is similar to that of water such that the exchange of oxygen between the reduced product of the oxygen source compound and hydrogen occurs with minimum energy release. Suitable exemplary oxygen source compounds are CdO, CuO, ZnO, $SO_2$, $SeO_2$, and $TeO_2$. Others such as metal oxides may also be anhydrides of acids or bases that may undergo dehydration reactions as the source of $H_2O$ catalyst are $MnO_x$, $AlO_x$, and $SiO_x$. In an embodiment, an oxide layer oxygen source may cover a source of hydrogen such as a metal hydride such as palladium hydride. The reaction to form $H_2O$ catalyst and atomic H that further react to form hydrino may be initiated by heating the oxide coated hydrogen source such as metal oxide coated palladium hydride. The palladium hydride may be coated on the opposite side as that of the oxygen source by a hydrogen impermeable layer such as a layer of gold film to cause the released hydrogen to selectively migrate to the source of oxygen such the oxide layer such as a metal oxide. In an embodiment, the reaction to form the hydrino catalyst and the regeneration reaction comprise an oxygen exchange between the oxygen source compound and hydrogen and between water and the reduced oxygen source compound, respectively. Suitable reduced oxygen sources are Cd, Cu, Zn, S, Se, and Te. In an embodiment, the oxygen exchange reaction may comprise those used to form hydrogen gas thermally. Exemplary thermal methods are the iron oxide cycle, cerium(IV) oxide-cerium(III) oxide cycle, zinc zinc-oxide cycle, sulfur-iodine cycle, copper-chlorine cycle and hybrid sulfur cycle and others known to those skilled in the art. In an embodiment, the reaction to form hydrino catalyst and the regeneration reaction such as an oxygen exchange reaction occurs simultaneously in the same reaction vessel. The conditions such a temperature and pressure may be controlled to achieve the simultaneity of reaction. Alternately, the products may be removed and regenerated in at least one other separate vessel that may occur under conditions different than those of the power forming reaction as given in the present disclosure and Mills Prior Applications.

In an embodiment, the $NH_2$ group of an amide such as $LiNH_2$ serves as the catalyst wherein the potential energy is about 81.6 eV corresponding to m=3 in Eq. (5). Similarly to the reversible $H_2O$ elimination or addition reaction of between acid or base to the anhydride and vice versa, the reversible reaction between the amide and imide or nitride results in the formation of the $NH_2$ catalyst that further reacts with atomic H to form hydrinos. The reversible reaction between amide, and at least one of imide and nitride may also serve as a source of hydrogen such as atomic H.

In an embodiment, a hydrino species such as molecular hydrino or hydrino hydride ion is synthesized by the reaction of H and at least one of OH and $H_2O$ catalyst. The hydrino species may be produced by at least two of the group of a metal such as an alkali, alkaline earth, transition, inner transition, and rare earth metal, Al, Ga, In, Ge, Sn, Pb, As, Sb, and Te, a metal hydride such as $LaNi_5H_6$ and others of the present disclosure, an aqueous hydroxide such as an alkaline hydroxide such as KOH at 0.1 M up to saturated concentration, a support such as carbon, Pt/C, steam carbon, carbon black, a carbide, a boride, or a nitrile, and oxygen. Suitable exemplary reaction mixtures to form hydrino species such as molecular hydrino are (1) Co PtC KOH (sat) with and without $O_2$; (2) Zn or Sn+$LaNi_5H_6$+KOH (sat), (3) Co, Sn, Sb, or Zn+$O_2$+CB+KOH (sat), (4) Al CB KOH (sat), (5) Sn Ni-coated graphite KOH (sat) with and without $O_2$, (6) Sn+SC or CB+KOH (sat)+$O_2$, (7) Zn Pt/C KOH (sat) $O_2$, (8) Zn R—Ni KOH (sat) $O_2$, (9) Sn $LaNi_5H_6$ KOH (sat) $O_2$, (10) Sb $LaNi_5H_6$ KOH (sat) $O_2$, (11) Co, Sn, Zn, Pb, or Sb+KOH (Sat aq)+$K_2CO_3$+CB-SA, and (12) $LiNH_2$ LiBr and LiH or Li and $H_2$ or a source thereof and optionally a hydrogen dissociator such as Ni or R—Ni. Additional reaction mixtures comprise a molten hydroxide, a source of hydrogen, a source of oxygen, and a hydrogen dissociator. Suitable exemplary reaction mixtures to form hydrino species such as molecular hydrino are (1) $Ni(H_2)$ LiOH—LiBr air or $O_2$, (2) $Ni(H_2)$ NaOH—NaBr air or $O_2$, and (3) $Ni(H_2)$ KOH—NaBr air or $O_2$.

In an embodiment, the product of at least one of the chemical, SF-CIHT, and CIHT cell reactions to form hydrinos is a compound comprising hydrino or lower-energy hydrogen species such as $H_2(1/p)$ complexed with an inorganic compound. The compound may comprise an oxyanion compound such as an alkali or alkaline earth carbonate or hydroxide or other such compounds of the present disclosure. In an embodiment, the product comprises at least one of $M_2CO_3 \cdot H_2(1/4)$ and $MOH \cdot H_2(1/4)$ (M=alkali or other cation of the present disclosure) complex. The product may be identified by ToF-SIMS as a series of ions in the positive spectrum comprising $M(M_2CO_3 \cdot H_2(1/4))_n^+)$ and $M(KOH \cdot H_2(1/4))_n^+$, respectively, wherein n is an integer and an integer and integer p>1 may be substituted for 4. In an embodiment, a compound comprising silicon and oxygen such as $SiO_2$ or quartz may serve as a getter for $H_2(1/4)$. The getter for $H_2(1/4)$ may comprise a transition metal, alkali metal, alkaline earth metal, inner transition metal, rare earth metal, combinations of metals, alloys such as a Mo alloy such as MoCu, and hydrogen storage materials such as those of the present disclosure.

The lower-energy hydrogen compounds synthesized by the methods of the present disclosure may have the formula MH, $MH_2$, or $M_2H_2$, wherein M is an alkali cation and H is an increased binding energy hydride ion or an increased binding energy hydrogen atom. The compound may have the formula $MH_n$ wherein n is 1 or 2, M is an alkaline earth cation and H is an increased binding energy hydride ion or an increased binding energy hydrogen atom. The compound may have the formula MHX wherein M is an alkali cation, X is one of a neutral atom such as halogen atom, a molecule, or a singly negatively charged anion such as halogen anion, and H is an increased binding energy hydride ion or an increased binding energy hydrogen atom. The compound may have the formula MHX wherein M is an alkaline earth cation, X is a singly negatively charged anion, and H is an increased binding energy hydride ion or an increased binding energy hydrogen atom. The compound may have the formula MHX wherein M is an alkaline earth cation, X is a double negatively charged anion, and H is an increased binding energy hydrogen atom. The compound may have the formula $M_2HX$ wherein M is an alkali cation, X is a singly negatively charged anion, and H is an increased binding energy hydride ion or an increased binding energy hydrogen atom. The compound may have the formula $MH_n$ wherein n is an integer, M is an alkaline cation and the hydrogen content $H_n$ of the compound comprises at least one increased binding energy hydrogen species. The compound may have the formula $M_2H_n$ wherein n is an integer, M is an alkaline earth cation and the hydrogen content $H_n$ of the compound comprises at least one increased binding energy hydrogen species. The compound may have the formula $M_2XH_n$ wherein n is an integer, M is an alkaline earth cation, X is a singly negatively charged anion, and the hydrogen content $H_n$ of the compound comprises at least one increased binding energy hydrogen species. The compound may have the formula $M_2X_2H_n$ wherein n is 1 or 2, M is an alkaline earth cation, X is a singly negatively charged anion, and the hydrogen content $H_n$ of the compound comprises at least one increased binding energy hydrogen species. The compound may have the formula $M_2X_3H$ wherein M is an alkaline earth cation, X is a singly negatively charged anion, and H is an increased binding energy hydride ion or an increased binding energy hydrogen atom. The compound may have the formula $M_2XH_n$ wherein n is 1 or 2, M is an alkaline earth cation, X is a double negatively charged anion, and the hydrogen content $H_n$ of the compound comprises at least one increased binding energy hydrogen species. The compound may have the formula $M_2XX'H$ wherein M is an alkaline earth cation, X is a singly negatively charged anion, X' is a double negatively charged anion, and H is an increased binding energy hydride ion or an increased binding energy hydrogen atom. The compound may have the formula $MM'H_n$ wherein n is an integer from 1 to 3, M is an alkaline earth cation, M' is an alkali metal cation and the hydrogen content $H_n$ of the compound comprises at least one increased binding energy hydrogen species. The compound may have the formula $MM'XH_n$ wherein n is 1 or 2, M is an alkaline earth cation, M' is an alkali metal cation, X is a singly negatively charged anion and the hydrogen content $H_n$ of the compound comprises at least one increased binding energy hydrogen species. The compound may have the formula MM'XH wherein M is an alkaline earth cation, M' is an alkali metal cation, X is a double negatively charged anion and H is an increased binding energy hydride ion or an increased binding energy hydrogen atom. The compound may have the formula MM'XX'H wherein M is an alkaline earth cation, M' is an alkali metal cation, X and X' are singly negatively charged anion and H is an increased binding energy hydride ion or an increased binding energy hydrogen atom. The compound may have the formula $MXX'H_n$ wherein n is an integer from 1 to 5, M is an alkali or alkaline earth cation, X is a singly or double negatively charged anion, X' is a metal or metalloid, a transition element, an inner transition element, or a rare earth element, and the hydrogen content $H_n$ of the compound comprises at least one increased binding energy hydrogen species. The compound may have the formula $MH_n$ wherein n is an integer, M is a cation such as a transition element, an inner transition element, or a rare earth element, and the hydrogen content $H_n$ of the compound comprises at least one increased binding energy hydrogen species. The compound may have the formula $MXH_n$ wherein n is an integer, M is an cation such as an alkali cation, alkaline earth cation, X is another cation such as a transition element, inner transition element, or a rare earth element cation, and the hydrogen content $H_n$ of the compound comprises at least one increased binding energy hydrogen species. The compound may have the formula $[KH_mKCO_3]_n$ wherein m and n are each an integer and the hydrogen content $H_m$ of the compound comprises at least one increased binding energy hydrogen species. The compound may have the formula $[KH_mKNO_3]_n^+ nX^-$ wherein m and n are each an integer, X is a singly negatively charged anion, and the hydrogen content $H_m$ of the compound comprises at least one increased binding energy hydrogen species. The compound may have the formula $[KHKNO_3]_n$ wherein n is an integer and the hydrogen content H of the compound comprises at least one increased binding energy hydrogen species. The compound may have the formula $[KHKOH]_n$ wherein n is an integer and the hydrogen content H of the compound comprises at least one increased binding energy hydrogen species. The compound including an anion or cation may have the formula $[MH_mM'X]_n$ wherein m and n are each an integer, M and M' are each an alkali or alkaline earth cation, X is a singly or double negatively charged anion, and the hydrogen content $H_m$ of the compound comprises at least one increased binding energy hydrogen species. The compound including an anion or cation may have the formula $[MH_mM'X']_n^+ nX^-$ wherein m and n are each an integer, M and M' are each an alkali or alkaline earth cation, X and X' are a singly or double negatively charged anion, and the hydrogen content $H_m$ of the compound comprises at least one increased binding energy hydrogen species. The anion may comprise one of those of the disclosure. Suitable exemplary singly negatively charged anions are halide ion, hydroxide ion, hydrogen carbonate ion, or nitrate ion. Suitable exemplary double negatively charged anions are carbonate ion, oxide, or sulfate ion.

In an embodiment, the increased binding energy hydrogen compound or mixture comprises at least one lower energy hydrogen species such as a hydrino atom, hydrino hydride ion, and dihydrino molecule embedded in a lattice such as a crystalline lattice such as in a metallic or ionic lattice. In an embodiment, the lattice is non-reactive with the lower energy hydrogen species. The matrix may be aprotic such as in the case of embedded hydrino hydride ions. The compound or mixture may comprise at least one of H(1/p), $H_2(1/p)$, and $H^-(1/p)$ embedded in a salt lattice such as an alkali or alkaline earth salt such as a halide. Exemplary alkali halides are KCl and KI. The salt may be absent any $H_2O$ in the case of embedded $H^-(1/p)$. Other suitable salt lattices comprise those of the present disclosure. The lower energy hydrogen species may be formed by catalysis of hydrogen with an aprotic catalyst such as those of TABLE 1.

The compounds of the present invention are preferably greater than 0.1 atomic percent pure. More preferably, the compounds are greater than 1 atomic percent pure. Even more preferably, the compounds are greater than 10 atomic percent pure. Most preferably, the compounds are greater than 50 atomic percent pure. In another embodiment, the compounds are greater than 90 atomic percent pure. In another embodiment, the compounds are greater than 95 atomic percent pure.

In another embodiment of the chemical reactor to form hydrinos, the cell to form hydrinos and release power such as thermal power comprises the combustion chamber of an internal combustion engine, rocket engine, or gas turbine. The reaction mixture comprises a source of hydrogen and a source of oxygen to generate the catalyst and hydrinos. The source of the catalyst may be at least one of a species comprising hydrogen and one comprising oxygen. The species or a further reaction product may be at least one of species comprising at least one of O and H such as $H_2$, H, $H^+$, $O_2$, $O_3$, $O_3^+$, $O_3^-$, O, $O^+$, $H_2O$, $H_3O^+$, OH, $OH^+$, $OH^-$, HOOH, $OOH^-$, $O^-$, $O^{2-}$, $O_2^-$, and $O_2^{2-}$. The catalyst may comprise an oxygen or hydrogen species such as $H_2O$. In another embodiment, the catalyst comprises at least one of nH, nO (n=integer), $O_2$, OH, and $H_2O$ catalyst. The source of hydrogen such as a source of hydrogen atoms may comprise a hydrogen-containing fuel such as $H_2$ gas or a hydrocarbon. Hydrogen atoms may be produced by pyrolysis of a hydrocarbon during hydrocarbon combustion. The reaction mixture may further comprise a hydrogen dissociator such as those of the present disclosure. H atoms may also be formed by the dissociation of hydrogen. The source of O may further comprise $O_2$ from air. The reactants may further comprise $H_2O$ that may serve as a source of at least one of H and O. In an embodiment, water serves as a further source of at least one of hydrogen and oxygen that may be supplied by pyrolysis of $H_2O$ in the cell. The water can be dissociated into hydrogen atoms thermally or catalytically on a surface, such as the cylinder or piston head. The surface may comprise material for dissociating water to hydrogen and oxygen. The water dissociating material may comprise an element, compound, alloy, or mixture of transition elements or inner transition elements, iron, platinum, palladium, zirconium, vanadium, nickel, titanium, Sc, Cr, Mn, Co, Cu, Zn, Y, Nb, Mo, Tc, Ru, Rh, Ag, Cd, La, Hf, Ta, W, Re, Os, Ir, Au, Hg, Ce, Pr, Nd, Pm, Sm, Eu, Gd, Tb, Dy, Ho, Er, Tm, Vb, Lu, Th, Pa, U, activated charcoal (carbon), or Cs intercalated carbon (graphite). The H and O may react to form the catalyst and H to form hydrinos. The source of hydrogen and oxygen may be drawn in through corresponding ports or intakes such as intake valves or manifolds. The products may be exhausted through exhaust ports or outlets. The flow may be controlled by controlling the inlet and outlet rates through the respective ports.

In an embodiment, hydrinos are formed by heating a source of catalyst and a source of hydrogen such as a solid fuel of the present disclosure. The heating may be at least one of thermal heating and percussion heating. Experimentally, Raman spectroscopy confirms that hydrinos are formed by ball milling a solid fuel such as a mixture of a hydroxide and a halide such as a mixture comprising alkali metals such as Li. For example, an inverse Raman effect peak is observed from ball milled LiOH+LiI and LiOH+LiF at 2308 $cm^{-1}$. Thus, a suitable exemplary mixture is LiOH+LiI or LiF. In an embodiment, at least one of thermal and percussion heating is achieved by a rapid reaction. In this case, an additional energetic reaction is provided by forming hydrinos.

VII. Solid Fuel Catalyst Induced Hydrino Transition (SF-CIHT) Cell and Power Converter In an embodiment, a power system that generates at least one of direct electrical energy and thermal energy comprises at least one vessel, reactants comprising: (a) at least one source of catalyst or a catalyst comprising nascent $H_2O$; (b) at least one source of atomic hydrogen or atomic hydrogen; and (c) at least one of a conductor and a conductive matrix, and at least one set of electrodes to confine the hydrino reactants, a source of electrical power to deliver a short burst of high-current electrical energy, a reloading system, at least one system to regenerate the initial reactants from the reaction products, and at least one direct converter such as at least one of a plasma to electricity converter such as PDC, a photovoltaic converter, and at least one thermal to electric power converter. In a further embodiment, the vessel is capable of a pressure of at least one of atmospheric, above atmospheric, and below atmospheric. In an embodiment, the regeneration system can comprise at least one of a hydration, thermal, chemical, and electrochemical system. In another embodiment, the at least one direct plasma to electricity converter can comprise at least one of the group of plasmadynamic power converter, $\vec{E}\times\vec{B}$ direct converter, magnetohydrodynamic power converter, magnetic mirror magnetohydrodynamic power converter, charge drift converter, Post or Venetian Blind power converter, gyrotron, photon bunching microwave power converter, and photoelectric converter. In a further embodiment, the at least one thermal to electricity converter can comprise at least one of the group of a heat engine, a steam engine, a steam turbine and generator, a gas turbine and generator, a Rankine-cycle engine, a Brayton-cycle engine, a Stirling engine, a thermionic power converter, and a thermoelectric power converter. The converter may be one given in Mills Prior Publications and Mills Prior Applications.

In an embodiment, $H_2O$ is ignited to form hydrinos with a high release of energy in the form of at least one of thermal, plasma, and electromagnetic (light) power. ("Ignition" in the present disclosure denotes a very high reaction rate of H to hydrinos that may be manifest as a burst, pulse or other form of high power release.) $H_2O$ may comprise the fuel that may be ignited with the application a high current such as one in the range of about 2000 A to 100,000 A. This may be achieved by the application of a high voltage such as about 5,000 to 100,000 V to first form highly conducive plasma such as an arc. Alternatively, a high current may be passed through a compound or mixture comprising $H_2O$ wherein the conductivity of the resulting fuel such as a solid fuel is high. (In the present disclosure a solid fuel or energetic material is used to denote a reaction mixture that forms a catalyst such as HOH and H that further reacts to form hydrinos. However, the reaction mixture may comprise other physical states than solid. In embodiments, the reaction mixture may be at least one state of gaseous, liquid, solid, slurry, sol gel, solution, mixture, gaseous suspension, pneumatic flow, and other states known to those skilled in the art.) In an embodiment, the solid fuel having a very low resistance comprises a reaction mixture comprising $H_2O$. The low resistance may be due to a conductor component of the reaction mixture. In embodiments, the resistance of the solid fuel is at least one of in the range of about $10^{-9}$ ohm to 100 ohms, $10^{-8}$ ohm to 10 ohms, $10^{-3}$ ohm to 1 ohm, $10^{-4}$ ohm to $10^{-1}$ ohm, and $10^{-4}$ ohm to $10^{-2}$ ohm. In another embodiment, the fuel having a high resistance comprises $H_2O$ comprising a trace or minor mole percentage of an added compound or material. In the latter case, high current may be flowed through the fuel to achieve ignition by causing breakdown to form a highly conducting state such as an arc or arc plasma.

In an embodiment, the reactants can comprise a source of $H_2O$ and a conductive matrix to form at least one of the source of catalyst, the catalyst, the source of atomic hydrogen, and the atomic hydrogen. In a further embodiment, the reactants comprising a source of $H_2O$ can comprise at least one of bulk $H_2O$, a state other than bulk $H_2O$, a compound or compounds that undergo at least one of react to form $H_2O$ and release bound $H_2O$. Additionally, the bound $H_2O$ can comprise a compound that interacts with $H_2O$ wherein the $H_2O$ is in a state of at least one of absorbed $H_2O$, bound $H_2O$, physisorbed $H_2O$, and waters of hydration. In embodiments, the reactants can comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product. In other embodiments, the at least one of the source of nascent $H_2O$ catalyst and the source of atomic hydrogen can comprise at least one of: (a) at least one source of $H_2O$; (b) at least one source of oxygen, and (c) at least one source of hydrogen.

In additional embodiments, the reactants to form at least one of the source of catalyst, the catalyst, the source of atomic hydrogen, and the atomic hydrogen comprise at least one of $H_2O$ and the source of $H_2O$; $O_2$, $H_2O$, HOOH, $OOH^-$, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen; and a conductive matrix. In certain embodiments, the oxyhydroxide can comprise at least one from the group of TiOOH, GdOOH, CoOOH, InOOH, FeOOH, GaOOH, NiOOH, AlOOH, CrOOH, MoOOH, CuOOH, MnOOH, ZnOOH, and SmOOH; the oxide can comprise at least one from the group of CuO, $Cu_2O$, CoO, $Co_2O_3$, $Co_3O_4$, FeO, $Fe_2O_3$, NiO, and $Ni_2O_3$; the hydroxide can comprise at least one from the group of $Cu(OH)_2$, $Co(OH)_2$, $Co(OH)_3$, $Fe(OH)_2$, $Fe(OH)_3$, and $Ni(OH)_2$; the compound that comprises oxygen can comprise at least one from the group of a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X═F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, CoOOH, InOOH, FeOOH, GaOOH, NiOOH, AlOOH, CrOOH, MoOOH, CuOOH, MnOOH, ZnOOH, and SmOOH, and the conductive matrix can comprise at least one from the group of a metal powder, carbon, carbide, boride, nitride, carbonitrile such as TiCN, or nitrile.

In embodiments, the reactants can comprise a mixture of a metal, its metal oxide, and $H_2O$ wherein the reaction of the metal with $H_2O$ is not thermodynamically favorable. In other embodiments, the reactants can comprise a mixture of a metal, a metal halide, and $H_2O$ wherein the reaction of the metal with $H_2O$ is not thermodynamically favorable. In additional embodiments, reactants can comprise a mixture of a transition metal, an alkaline earth metal halide, and $H_2O$ wherein the reaction of the metal with $H_2O$ is not thermodynamically favorable. And in further embodiments, the reactants can comprise a mixture of a conductor, a hydroscopic material, and $H_2O$. In embodiments, the conductor can comprise a metal powder or carbon powder wherein the reaction of the metal or carbon with $H_2O$ is not thermodynamically favorable. In embodiments, the hydroscopic material can comprise at least one of the group of lithium bromide, calcium chloride, magnesium chloride, zinc chloride, potassium carbonate, potassium phosphate, carnallite such as $KMgCl_3{\cdot}6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt. In certain embodiments, the power system can comprise a mixture of a conductor, hydroscopic materials, and $H_2O$ wherein the ranges of relative molar amounts of (metal/conductor), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). In certain embodiments, the metal having a thermodynamically unfavorable reaction with $H_2O$ can be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In additional embodiments, the reactants can be regenerated by addition of $H_2O$.

In further embodiments, the reactants can comprise a mixture of a metal, its metal oxide, and $H_2O$ wherein the metal oxide is capable of $H_2$ reduction at a temperature less than 1000° C. In other embodiments, the reactants can comprise a mixture of an oxide that is not easily reduced with $H_2$ and mild heat, a metal having an oxide capable of being reduced to the metal with $H_2$ at a temperature less than 1000° C., and $H_2O$. In embodiments, the metal having an oxide capable of being reduced to the metal with $H_2$ at a temperature less than 1000° C. can be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In embodiments, the metal oxide that is not easily reduced with $H_2$, and mild heat comprises at least one of alumina, an alkaline earth oxide, and a rare earth oxide.

In embodiments, the solid fuel can comprise carbon or activated carbon and $H_2O$ wherein the mixture is regenerated by rehydration comprising addition of $H_2O$. In further embodiments, the reactants can comprise at least one of a slurry, solution, emulsion, composite, and a compound. In embodiments, the current of the source of electrical power to deliver a short burst of high-current electrical energy is sufficient enough to cause the hydrino reactants to undergo the reaction to form hydrinos at a very high rate. In embodiments, the source of electrical power to deliver a short burst of high-current electrical energy comprises at least one of the following: a voltage selected to cause a high AC, DC, or an AC-DC mixture of current that is in the range of at least one of 100 A to 1,000,000 A, 1 kA to 100,000 A, 10 kA to 50 kA; a DC or peak AC current density in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$; the voltage is determined by the conductivity of the solid fuel or energetic material wherein the voltage is given by the desired current times the resistance of the solid fuel or energetic material sample; the DC or peak AC voltage may be in at least one range chosen from about 0.1 V to 500 kV, 0.1 V to 100 kV, and 1 V to 50 kV, and the AC frequency may be in the range of about 0.1 Hz to 10 GHz, 1 Hz to 1 MHz, 10 Hz to 100 kHz, and 100 Hz to 10 kHz. In embodiments, the resistance of the solid fuel or energetic material sample is in at least one range chosen from about 0.001 milliohm to 100 Mohm, 0.1 ohm to 1 Mohm, and 10 ohm to 1 kohm, and the conductivity of a suitable load per electrode area active to form hydrinos is in at least one range chosen from about $10^{-10}$ ohm$^{-1}$ cm$^{-2}$ to $10^{6}$ ohm$^{-1}$ cm$^{-2}$, $10^{-5}$ ohm$^{-1}$ cm$^{-2}$ to $10^{6}$ ohm$^{-1}$ cm$^{-2}$, $10^{-4}$ ohm$^{-1}$ cm$^{-2}$ to $10^{5}$ ohm$^{-1}$ cm$^{-2}$, $10^{-3}$ ohm$^{-1}$ cm$^{-2}$ to $10^{4}$ ohm$^{-1}$ cm$^{-2}$, $10^{-2}$ ohm$^{-1}$ cm$^{-2}$ to $10^{3}$ ohm$^{-1}$ cm$^{-2}$, $10^{-1}$ ohm$^{-1}$ cm$^{-2}$ to $10^{2}$ ohm$^{-1}$ cm$^{-2}$ and 1 ohm$^{-1}$ cm$^{-2}$ to 10 ohm$^{-1}$ cm$^{-2}$.

In an embodiment, the solid fuel is conductive. In embodiments, the resistance of a portion, pellet, or aliquot of solid fuel is at least one of in the range of about $10^{-9}$ ohm to 100 ohms, $10^{-8}$ ohm to 10 ohms, $10^{-3}$ ohm to 1 ohm, $10^{-3}$ ohm to $10^{-1}$ ohm, and $10^{-3}$ ohm to $10^{-2}$ ohm. In an embodiment, the hydrino reaction rate is dependent on the application or development of a high current. The hydrino catalysis reaction such as an energetic hydrino catalysis reaction may be initiated by a low-voltage, high-current flow through the conductive fuel. The energy release may be very high, and shock wave may form. In an embodiment, the voltage is selected to cause a high AC, DC, or an AC-DC mixture of current that causes ignition such as a high current in the range of at least one of 100 A to 1,000,000 A, 1 kA to 100,000 A, 10 kA to 50 kA. The current density may be in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$ of fuel that may comprise a pellet such as a pressed pellet. The DC or peak AC voltage may be in at least one range chosen from about 0.1 V to 100 kV V, 0.1 V to 1 k V, 0.1 V to 100 V, and 0.1 V to 15 V. The AC frequency may be in the range of about 0.1 Hz to 10 GHz, 1 Hz to 1 MHz, 10 Hz to 100 kHz, and 100 Hz to 10 kHz. The pulse time may be in at least one range chosen from about $10^{-6}$ s to 10 s, $10^{-5}$ s to 1 s, $10^{-4}$ s to 0.1 s, and $10^{-3}$ s to 0.01 s.

In an embodiment, the solid fuel or energetic material may comprise a source of $H_2O$ or $H_2O$. The $H_2O$ mole % content may be in the range of at least one of about 0.000001% to 100%, 0.00001% to 100%, 0.0001% to 100%, 0.001% to 100%, 0.01% to 100%, 0.1% to 100%, 1% to 100%, 10% to 100%, 0.1% to 50%, 1% to 25%, and 1% to 10%. In an embodiment, the hydrino reaction rate is dependent on the application or development of a high current. In an embodiment, the voltage is selected to cause a high AC, DC, or an AC-DC mixture of current that is in the range of at least one of 100 A to 1,000,000 A, 1 kA to 100,000 A, 10 kA to 50 kA. The DC or peak AC current density may be in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$. In an embodiment, the voltage is determined by the conductivity of the solid fuel or energetic material. The resistance of the solid fuel or energetic material sample is in at least one range chosen from about 0.001 milliohm to 100 Mohm, 0.1 ohm to 1 Mohm, and 10 ohm to 1 kohm. The conductivity of a suitable load per electrode area active to form hydrinos is in at least one range chosen from about $10^{-10}$ ohm$^{-1}$ cm$^{-2}$ to $10^{6}$ ohm$^{-1}$ cm$^{-2}$, $10^{-5}$ ohm$^{-1}$ cm$^{-2}$ to $10^{6}$ ohm$^{-1}$ cm$^{-2}$, $10^{-4}$ ohm$^{-1}$ cm$^{-2}$ to $10^{5}$ ohm$^{-1}$ cm$^{-2}$, $10^{-3}$ ohm$^{-1}$ cm$^{-2}$ to $10^{4}$ ohm$^{-1}$ cm$^{-2}$, $10^{-2}$ ohm$^{-1}$ cm$^{-2}$ to $10^{3}$ ohm$^{-1}$ cm$^{-2}$, $10^{-1}$ ohm$^{-1}$ cm$^{-2}$ to $10^{2}$ ohm$^{-1}$ cm$^{-2}$, and 1 ohm$^{-1}$ cm$^{-2}$ to 10 ohm$^{-1}$ cm$^{-2}$. In an embodiment, the voltage is given by the desired current times the resistance of the solid fuel or energetic material sample. In the exemplary case that the resistance is of the order of 1 mohm, the voltage is low such as <10 V. In an exemplary case of essentially pure $H_2O$ wherein the resistance is essentially infinite, the applied voltage to achieve a high current for ignition is high, such as above the breakdown voltage of the $H_2O$ such as about 5 kV or higher. In embodiments, the DC or peak AC voltage may be in at least one range chosen from about 0.1 V to 500 kV, 0.1 V to 100 kV, and 1 V to 50 kV. The AC frequency may be in the range of about 0.1 Hz to 10 GHz, 1 Hz to 1 MHz, 10 Hz to 100 kHz, and 100 Hz to 10 kHz. In an embodiment, a DC voltage is discharged to create plasma comprising ionized $H_2O$ wherein the current is underdamped and oscillates as it decays.

In an embodiment, the high-current pulse is achieved with the discharge of capacitors such as supercapacitors that may be connected in at least one of series and parallel to achieve the desired voltage and current wherein the current may be DC or conditioned with circuit elements such a transformer such as a low voltage transformer known to those skilled in the art. The capacitor may be charged by an electrical source such as grid power, a generator, a fuel cell, or a battery. In an embodiment, a battery supplies the current. In an embodiment, a suitable frequency, voltage, and current waveform may be achieved by power conditioning the output of the capacitors or battery.

The solid fuel or energetic material may comprise a conductor or conductive matrix or support such as a metal, carbon, or carbide, and $H_2O$ or a source of $H_2O$ such as a compound or compounds that can react to form $H_2O$ or that can release bound $H_2O$ such as those of the present disclosure. The solid fuel may comprise $H_2O$, a compound or material that interacts with the $H_2O$, and a conductor. The $H_2O$ may be present in a state other than bulk $H_2O$ such as absorbed or bound $H_2O$ such as physisorbed $H_2O$ or waters of hydration. Alternatively, the $H_2O$ may be present as bulk $H_2O$ in a mixture that is highly conductive or made highly conductive by the application of a suitable voltage. The solid fuel may comprise $H_2O$ and a material or compound such as a metal powder or carbon that provides high conductivity and a material or compound such as an oxide such as a metal oxide to facilitate forming H and possibility HOH catalyst. A exemplary solid fuel may comprise R—Ni alone and with additives such as those of transition metals and Al wherein R—Ni releases H and HOH by the decomposition of hydrated $Al_2O_3$ and $Al(OH)_3$. A suitable exemplary solid fuel comprises at least one oxyhydroxide such as TiOOH, GdOOH, CoOOH, InOOH, FeOOH, GaOOH, NiOOH, AlOOH, CrOOH, MoOOH, CuOOH, MnOOH, ZnOOH, and SmOOH and a conducive matrix such as at least one of a metal powder and carbon powder, and optionally $H_2O$. The solid fuel may comprise at least one hydroxide such as a transition metal hydroxide such as at least one of $Cu(OH)_2$, $Co(OH)_2$, $Fe(OH)_2$ and $Ni(OH)_2$, an aluminum hydroxide such as $Al(OH)_3$, a conductor such as at least one of carbon powder and a metal powder, and optionally $H_2O$. The solid fuel may comprise at least one oxide such as at least one of a transition metal oxide such as at least one of CuO, $Cu_2O$, NiO, $Ni_2O_3$, FeO and $Fe_2O_3$, a conductor such as at least one of carbon powder and a metal powder, and $H_2O$. The solid fuel may comprise at least one halide such as a metal halide such as an alkaline earth metal halide such as $MgCl_2$, a conductor such as at least one of carbon powder and a metal powder such as Co or Fe, and $H_2O$. The solid fuel may comprise a mixture of solid fuels such as one comprising at least two of a hydroxide, an oxyhydroxide, an oxide, and a halide such as a metal halide, and at least one conductor or conductive matrix, and $H_2O$. The conductor may comprise at least one of a metal screen coated with one or more of the other components of the reaction mixture that comprises the solid fuel, R—Ni, a metal powder such as a transition metal powder, Ni or Co celmet, carbon, or a carbide or other conductor, or conducing support or conducting matrix known to those skilled in the art. In an embodiment, at least one conductor of the $H_2O$-based solid fuel comprises a metal such as a metal power such as at least one of a transition metal such as Cu, Al, and Ag.

In an embodiment, the solid fuel comprises carbon such as activated carbon and $H_2O$. In the case that the ignition to form plasma occurs under vacuum or an inert atmosphere, following plasma-to-electricity generation, the carbon condensed from the plasma may be rehydrated to reform the solid in a regenerative cycle. The solid fuel may comprise at least one of a mixture of acidic, basic, or neutral $H_2O$ and activated carbon, charcoal, soft charcoal, at least one of steam and hydrogen treated carbon, and a metal powder. In an embodiment, the metal of the carbon-metal mixture is at least partially unreactive with $H_2O$. Suitable metals that are at least partially stable toward reaction with $H_2O$ are at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. The mixture may be regenerated by rehydration comprising addition of $H_2O$.

In an embodiment, the basic required reactants are a source of H, a source of O, and a good conductor matrix to allow a high current to permeate the material during ignition. The solid fuel or energetic material may be contained in a sealed vessel such as a sealed metal vessel such as a sealed aluminum vessel. The solid fuel or energetic material may be reacted by a low-voltage, high-current pulse such as one created by a spot welder such as that achieved by confinement between the two copper electrodes of a Taylor-Winfield model ND-24-75 spot welder and subjected to a short burst of low-voltage, high-current electrical energy. The 60 Hz voltage may be about 5 to 20 V RMS and the current may be about 10,000 to 40,000 $A/cm^2$.

Exemplary energetic materials and conditions are at least one of TiOOH, GdOOH, CoOOH, InOOH, FeOOH, GaOOH, NiOOH, AlOOH, CrOOH, MoOOH, CuOOH, MnOOH, ZnOOH, SmOOH, $Ni_2O_3 \cdot H_2O$, $La_2O_3 \cdot H_2O$, and $Na_2SO_4 \cdot H_2O$ coated onto a Ni mesh screen as a slurry and dried and then subjected to an electrical pulse of about 60 Hz, 8 V RMS, and to 40,000 $A/cm^2$.

In an embodiment, the solid fuel or energetic material comprises $H_2O$ and a dispersant and dissociator to form nascent $H_2O$ and H. Suitable exemplary dispersants and dissociators are a halide compound such as a metal halide such as a transition metal halide such as a bromide such as $FeBr_2$, a compound that forms a hydrate such as $CuBr_2$, and compounds such as oxides and halides having a metal capable of multiple oxidation states. Others comprise oxides, oxyhydroxides, or hydroxides such as those of transition elements such as CoO, $Co_2O_3$, $Co_3O_4$, CoOOH, $Co(OH)_2$, $Co(OH)_3$, NiO, $Ni_2O_3$, NiOOH, $Ni(OH)_2$, FeO, $Fe_2O_3$, FeOOH, $Fe(OH)_3$, CuO, $Cu_2O$, CuOOH, and $Cu(OH)_2$. In other embodiments, the transition metal is replaced by another such as alkali, alkaline earth, inner transition, and rare earth metal, and Group 13 and 14 metals. Suitable examples are $La_2O_3$, $CeO_2$, and $LaX_3$ (X=halide). In another embodiment, the solid fuel or energetic material comprises $H_2O$ as a hydrate of an inorganic compound such as an oxide, oxyhydroxides, hydroxide, or halide. Other suitable hydrates are metal compounds of the present disclosure such as at least one of the group of sulfate, phosphate, nitrate, carbonate, hydrogen carbonate, chromate, pyrophosphate, persulfate, hypochlorite, chlorite, chlorate, perchlorate, hypobromite, bromite, bromate, perchlorate, hypoiodite, iodite, iodate, periodate, hydrogen sulfate, hydrogen or dihydrogen phosphate, other metal compounds with an oxyanion, and metal halides. The moles ratios of dispersant and dissociator such as a metal oxide or halide compound is any desired that gives rise to an ignition event. Suitable the moles of at the at least one compound to the moles $H_2O$ are in at least one range of about 0.000001 to 100000, 0.00001 to 10000, 0.0001 to 1000, 0.01 to 100, 0.1 to 10, and 0.5 to 1 wherein the ratio is defined as (moles compound/moles $H_2O$). The solid fuel or energetic material may further comprise a conductor or conducing matrix such as at least one of a metal powder such as a transition metal powder, Ni or Co celmet, carbon powder, or a carbide or other conductor, or conducing support or conducting matrix known to those skilled in the art. Suitable ratios of moles of the hydrated compound comprising at the least one compound and $H_2O$ to the moles of the conductor are in at least one range of about 0.000001 to 100000, 0.00001 to 10000, 0.0001 to 1000, 0.01 to 100, 0.1 to 10, and 0.5 to 1 wherein the ratio is defined as (moles hydrated compound/moles conductor).

In an embodiment, the reactant is regenerated from the product by the addition of $H_2O$. In an embodiment, the solid fuel or energetic material comprises $H_2O$ and a conductive matrix suitable for the low-voltage, high-current of the present disclosure to flow through the hydrated material to result in ignition. The conductive matrix material may be at least one of a metal surface, metal powder, carbon, carbon powder, carbide, boride, nitride, carbonitrile such as TiCN, nitrile, another of the present disclosure, or known to those skilled in the art. The addition of $H_2O$ to form the solid fuel or energetic material or regenerate it from the products may be continuous or intermittent.

The solid fuel or energetic material may comprise a mixture of conductive matrix, an oxide such as a mixture of a metal and the corresponding metal oxide such as a transition metal and at least one of its oxides such as ones selected from Ag, Fe, Cu, Ni, or Co, and $H_2O$. The $H_2O$ may be in the form of hydrated oxide. In other embodiments, the metal/metal oxide reactant comprises a metal that has a low reactivity with $H_2O$ corresponding to the oxide being readily capable of being reduced to the metal, or the metal not oxidizing during the hydrino reaction. A suitable exemplary metal having low $H_2O$ reactivity is one chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr. The metal may be converted to the oxide during the reaction. The oxide product corresponding to the metal reactant may be regenerated to the initial metal by hydrogen reduction by systems and methods known by those skilled in the art. The hydrogen reduction may be at elevated temperature. The hydrogen may be supplied by the electrolysis of $H_2O$. In another embodiment, the metal is regenerated form the oxide by carbo-reduction, reduction with a reductant such as a more oxygen active metal, or by electrolysis such as electrolysis in a molten salt. The formation of the metal from the oxide may be achieved by systems and methods known by those skilled in the art. The molar amount of metal to metal oxide to $H_2O$ are any desirable that results in ignition when subjected to a low-voltage, high current pulse of electricity as given in the present disclosure. Suitable ranges of relative molar amounts of (metal), (metal oxide), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

The solid fuel or energetic material may comprise a mixture of conductive matrix, a halide such as a mixture of a first metal and the corresponding first metal halide or a second metal halide, and $H_2O$. The $H_2O$ may be in the form of hydrated halide. The second metal halide may be more stable than the first metal halide. In an embodiment, the first metal has a low reactivity with $H_2O$ corresponding to the oxide being readily capable of being reduced to the metal, or the metal not oxidizing during the hydrino reaction. A suitable exemplary metal having low $H_2O$ reactivity is one chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr. The molar amount of metal to metal halide to $H_2O$ are any desirable that results in ignition when subjected to a low-voltage, high current pulse of electricity as given in the present disclosure. Suitable ranges of relative molar amounts of (metal), (metal halide), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

In an embodiment, the solid fuel or energetic material may comprise a conductor such as one of the present disclosure such as a metal or carbon, a hydroscopic material, and $H_2O$. Suitable exemplary hydroscopic materials are lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers (such as cotton and paper), sugar, caramel, honey, glycerol, ethanol, methanol, diesel fuel, methamphetamine, many fertilizer chemicals, salts (including table salt) and a wide variety of other substances know to those skilled in the art as well as a desiccant such as silica, activated charcoal, calcium sulfate, calcium chloride, and molecular sieves (typically, zeolites) or a deliquescent material such as zinc chloride, calcium chloride, potassium hydroxide, sodium hydroxide and many different deliquescent salts known to those skilled in the art. Suitable ranges of relative molar amounts of (metal), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1). The solid fuel or energetic material may comprise at least one of a slurry, solution, emulsion, composite, and a compound.

In an exemplary energetic material, 0.05 ml (50 mg) of $H_2O$ was added to 20 mg or either $Co_3O_4$ or CuO that was sealed in an aluminum DSC pan (Aluminum crucible 30 μl, D:6.7×3 (Setaram, S08/HBB37408) and Aluminum cover D: 6,7, stamped, non-tight (Setaram, S08/HBB37409)) and ignited with a current of ranging from about 15,000 to 25,000 A at about 8 V RMS using a Taylor-Winfield model ND-24-75 spot welder. A large energy burst was observed that vaporized the samples, each as an energetic, highly-ionized, expanding plasma. Another exemplary solid fuel ignited in the same manner with a similar result comprises Cu (42.6 mg)+CuO (14.2 mg)+$H_2O$ (16.3 mg) that was sealed in an aluminum DSC pan (71.1 mg) (Aluminum crucible 30 μl, D:6.7×3 (Setaram, S08/HBB37408) and Aluminum cover D: 6,7, stamped, tight (Setaram, S08/HBB37409)).

In an embodiment, the solid fuel or energetic material comprises a source of nascent $H_2O$ catalyst and a source of H. In an embodiment, the solid fuel or energetic material is conductive or comprises a conductive matrix material to cause the mixture of the source of nascent $H_2O$ catalyst and a source of H to be conductive. The source of at least one of a source of nascent $H_2O$ catalyst and a source of H is a compound or mixture of compounds and a material that comprises at least O and H. The compound or material that comprises O may be at least one of an oxide, a hydroxide, and an oxyhydroxide such as alkali, alkaline earth, transition metal, inner transition metal, rare earth metal, and group 13 and 14 metal oxide, hydroxide and oxyhydroxide. The compound or material that comprises O may be a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, rare earth oxide such as $CeO_2$ or $La_2O_3$, an oxyhydroxide such as TiOOH, GdOOH, CoOOH, InOOH, FeOOH, GaOOH, NiOOH, AlOOH, CrOOH, MoOOH, CuOOH, MnOOH, ZnOOH, and SmOOH. Exemplary sources of H are $H_2O$, a compound that has bound or absorbed $H_2O$ such as a hydrate, a hydroxide, oxyhydroxide, or hydrogen sulfate, hydrogen or dihydrogen phosphate, and a hydrocarbon. The conductive matrix material may be at least one of a metal powder, carbon, carbon powder, carbide, boride, nitride, carbonitrile such as TiCN, or nitrile. The conductors of the present disclosure may be in different physical forms in different embodiments, such as bulk, particulate, power, nanopowder, and other forms know to those skilled in the art that cause the solid fuel or energetic material comprising a mixture with the conductor to be conductive.

Exemplary solid fuels or energetic materials comprise at least one of $H_2O$ and a conductive matrix. In an exemplary embodiment, the solid fuel comprises $H_2O$ and a metal conductor such as a transition metal such as Fe in a form such as a Fe metal powder conductor and a Fe compound such as iron hydroxide, iron oxide, iron oxyhydroxide, and iron halide wherein the latter may substitute for $H_2O$ as the hydrate that serves as the source of $H_2O$. Other metals may substitute for Fe in any of their physical forms such as metals and compounds as well as state such as bulk, sheet, screen, mesh, wire, particulate, powder, nanopowder and solid, liquid, and gaseous. The conductor may comprise carbon in one or more physical forms such as at least one of bulk carbon, particulate carbon, carbon powder, carbon aerogel, carbon nanotubes, activated carbon, graphene, KOH activated carbon or nanotubes, carbide derived carbon, carbon fiber cloth, and fullerene. Suitable exemplary solid fuels or energetic materials are $CuBr_2$+$H_2O$+conductive matrix; $Cu(OH)_2$+$FeBr_2$+ conductive matrix material such as carbon or a metal powder; FeOOH+conductive matrix material such as carbon or a metal powder; Cu(OH)Br+ conductive matrix material such as carbon or a metal powder; AlOOH or $Al(OH)_3$+Al powder wherein addition $H_2$ is supplied to the reactions to form hydrinos by reaction of Al with $H_2O$ formed from the decomposition of AlOOH or $Al(OH)_3$; $H_2O$ in conducting nanoparticles such as carbon nanotubes and fullerene that may be steam activated and $H_2O$ in metalized zeolites wherein a dispersant may be used to wet hydrophobic material such as carbon; $NH_4NO_3$+$H_2O$+NiAl alloy powder; $LiNH_2$+$LiNO_3$+Ti powder; $LiNH_2$+$LiNO_3$+Pt/Ti; $LiNH_2$+$NH_4NO_3$+Ti powder; $BH_3NH_3$+$NH_4NO_3$; $BH_3NH_3$+$CO_2$, $SO_2$, $NO_2$, as well as nitrates, carbonates, sulfates; LiH+$NH_4NO_3$+ transition metal, rare earth metal, Al or other oxidizable metal; $NH_4NO_3$+transition metal, rare earth metal, Al or other oxidizable metal; $NH_4NO_3$+R—Ni; $P_2O_5$ with each of a hydroxide of the present disclosure, $LiNO_3$, $LiClO_4$ and $S_2O_8$+conductive matrix; and a source of H such as a hydroxide, oxyhydroxide, hydrogen storage material such as one or more of the present disclosure, diesel fuel and a source of oxygen that may also be an electron acceptor such as $P_2O_5$ and other acid anhydrides such as $CO_2$, $SO_2$, or $NO_2$.

The solid fuel or energetic material to form hydrinos may comprise at least one highly reactive or energetic material, such as $NH_4NO_3$, tritonal, RDX, PETN, and others of the present disclosure. The solid fuel or energetic material may additionally comprise at least one of a conductor, a conducting matrix, or a conducting material such as a metal powder, carbon, carbon powder, carbide, boride, nitride, carbonitrile such as TiCN, or nitrile, a hydrocarbon such as diesel fuel, an oxyhydroxide, a hydroxide, an oxide, and $H_2O$. In an exemplary embodiment, the solid fuel or energetic material comprises a highly reactive or energetic material such as $NH_4NO_3$, tritonal, RDX, and PETN and a conductive matrix such as at least one of a metal powder such as Al or a transition metal powder and carbon powder. The solid fuel or energetic material may be reacted with a high current as given in the present disclosure. In an embodiment, the solid fuel or energetic material further comprises a sensitizer such as glass micro-spheres.

A. Plasmadynamic Converter (PDC)

The mass of a positively charge ion of a plasma is at least 1800 times that of the electron; thus, the cyclotron orbit is 1800 times larger. This result allows electrons to be magnetically trapped on magnetic field lines while ions may drift. Charge separation may occur to provide a voltage to a plasmadynamic converter.

B. Magnetohydrodynamic (MHD) Converter

Charge separation based on the formation of a mass flow of ions in a crossed magnetic field is well known art as magnetohydrodynamic (MHD) power conversion. The positive and negative ions undergo Lorentzian direction in opposite directions and are received at corresponding MHD electrode to affect a voltage between them. The typical MHD method to form a mass flow of ions is to expand a high-pressure gas seeded with ions through a nozzle to create a high speed flow through the crossed magnetic field with a set of MHD electrodes crossed with respect to the deflecting field to receive the deflected ions. In the present disclosure, the pressure is typically greater than atmospheric, but not necessarily so, and the directional mass flow may be achieved by reaction of a solid fuel to form a highly ionize radially expanding plasma.

C. Electromagnetic Direct (Crossed Field or Drift) Converter, $\vec{E}+\vec{B}$ Direct Converter The guiding center drift of charged particles in magnetic and crossed electric fields may be exploited to separate and collect charge at spatially separated $\vec{E}\times\vec{B}$ electrodes. As the device extracts particle energy perpendicular to a guide field, plasma expansion may not be necessary. The performance of an idealized $\vec{E}\times\vec{B}$ converter relies on the inertial difference between ions and electrons that is the source of charge separation and the production of a voltage at opposing $\vec{E}\times\vec{B}$ electrodes relative to the crossed field directions. $\nabla\vec{B}$ drift collection may also be used independently or in combination with $\vec{E}\times\vec{B}$ collection.

D. Charge Drift Converter

The direct power converter described by Timofeev and Glagolev [A. V. Timofeev, "A scheme for direct conversion of plasma thermal energy into electrical energy," Sov. J. Plasma Phys., Vol. 4, No. 4, July-August, (1978), pp. 464-468; V. M. Glagolev, and A. V. Timofeev, "Direct Conversion of thermonuclear into electrical energy a drakon system," Plasma Phys. Rep., Vol. 19, No. 12, December (1993), pp. 745-749] relies on charge injection to drifting separated positive ions in order to extract power from a plasma. This charge drift converter comprises a magnetic field gradient in a direction transverse to the direction of a source of a magnetic flux B and a source of magnetic flux B having a curvature of the field lines. In both cases, drifting negatively and positively charged ions move in opposite directions perpendicular to plane formed by B and the direction of the magnetic field gradient or the plane in which B has curvature. In each case, the separated ions generate a voltage at opposing capacitors that are parallel to the plane with a concomitant decrease of the thermal energy of the ions. The electrons are received at one charge drift converter electrode and the positive ions are received at another. Since the mobility of ions is much less than that of electrons, electron injection may be performed directly or by boiling them off from a heated charge drift converter electrode. The power loss is small without much cost in power balance.

E. Magnetic Confinement

Consider that the blast or ignition event is when the catalysis of H to form hydrinos accelerates to a very high rate. In an embodiment, the plasma produced from the blast or ignition event is expanding plasma. In this case, magnetohydrodynamics (MHD) is a suitable conversion system and method. Alternatively, in an embodiment, the plasma is confined. In this case, the conversion may be achieved with at least one of a plasmadynamic converter, magnetohydrodynamic converter, electromagnetic direct (crossed field or drift) converter, $\vec{E}\times\vec{B}$ direct converter, and charge drift converter. In this case, in addition to a SF-CIHT cell and balance of plant comprising ignition, reloading, regeneration, fuel handling, and plasma to electric power conversion systems, the power generation system further comprises a plasma confinement system. The confinement may be achieved with magnetic fields such as solenoidal fields. The magnets may comprise at least one of permanent magnets and electromagnets such as at least one of uncooled, water cooled, and superconducting magnets with the corresponding cryogenic management system that comprises at least one of a liquid helium dewar, a liquid nitrogen dewar, radiation baffles that may be comprise copper, high vacuum insulation, radiation shields, and a cyropump and compressor that may be powered by the power output of a hydrino-based power generator. The magnets may be open coils such as Helmholtz coils. The plasma may further be confined in a magnetic bottle and by other systems and methods known to those skilled in the art.

Two magnetic mirrors or more may form a magnetic bottle to confine plasma formed by the catalysis of H to form hydrinos. The theory of the confinement is given in prior applications such as Microwave Power Cell, Chemical Reactor, And Power Converter, PCT/US02/06955, filed Mar. 7, 2002 (short version), PCT/US02/06945 filed Mar. 7, 2002 (long version), U.S. Ser. No. 10/469,913 filed Sep. 5, 2003 herein incorporated by reference in their entirety. Ions created in the bottle in the center region will spiral along the axis, but will be reflected by the magnetic mirrors at each end. The more energetic ions with high components of velocity parallel to a desired axis will escape at the ends of the bottle. Thus, in an embodiment, the bottle may produce an essentially linear flow of ions from the ends of the magnetic bottle to a magnetohydrodynamic converter. Since electrons may be preferentially confined due to their lower mass relative to positive ions, and a voltage is developed in a plasmadynamic embodiment of the present disclosure. Power flows between an anode in contact with the confined electrons and a cathode such as the confinement vessel wall which collects the positive ions. The power may be dissipated in an external load.

F. Solid Fuel Catalyst Induced Hydrino Transition (SF-CIHT) Cell

Chemical reactants of the present invention may be referred to as solid fuel or energetic materials or both. A solid fuel may perform as and thereby comprise an energetic material when conditions are created and maintained to cause very high reaction kinetics to form hydrinos. In an embodiment, the hydrino reaction rate is dependent on the application or development of a high current. In an embodiment of an SF-CIHT cell, the reactants to form hydrinos are subject to a low voltage, high current, high power pulse that causes a very rapid reaction rate and energy release. The rate may be sufficient to create a shock wave. In an exemplary embodiment, a 60 Hz voltage is less than 15 V peak, the current ranges from 10,000 A/cm$^2$ and 50,000 A/cm$^2$ peak, and the power ranges from 150,000 W/cm$^2$ and 750,000 W/cm$^2$. Other frequencies, voltages, currents, and powers in ranges of about 1/100 times to 100 times these parameters are suitable. In an embodiment, the hydrino reaction rate is dependent on the application or development of a high current. In an embodiment, the voltage is selected to cause a high AC, DC, or an AC-DC mixture of current that is in the range of at least one of 100 A to 1,000,000 A, 1 kA to 100,000 A, 10 kA to 50 kA. The DC or peak AC current density may be in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$. The DC or peak AC voltage may be in at least one range chosen from about 0.1 V to 1000 V, 0.1 V to 100 V, 0.1 V to 15 V, and 1 V to 15 V. The AC frequency may be in the range of about 0.1 Hz to 10 GHz, 1 Hz to 1 MHz, 10 Hz to 100 kHz, and 100 Hz to 10 kHz. The pulse time may be in at least one range chosen from about $10^{-6}$ s to 10 s, $10^{-5}$ s to 1 s, $10^{-4}$ s to 0.1 s, and $10^{-3}$ s to 0.01 s.

During H catalysis to hydrinos, electrons are ionized from the HOH catalyst by the energy transferred from the H being catalyzed to the HOH. The steps of catalysis are (1) Atomic hydrogen reacts with an energy acceptor called a catalyst wherein energy is transferred from atomic hydrogen to the catalyst that forms positive ions and ionized electrons due to accepting the energy; (2) Then, the negative electron of H drops to a lower shell closer to the positive proton to form a smaller hydrogen atom, hydrino, releasing energy to produce electricity or heat depending on the design of the system; (3) The catalyst positive ions regain their lost electrons to reform the catalyst for another cycle with the release of the initial energy accepted from H (atomic hydrogen). The high current of the SF-CIHT cell counters the limiting effect of the charge accumulation from the catalyst losing its electrons to result in a catastrophically high reaction rate. These electrons (Step 2) may be conducted in the applied high circuit current to prevent the catalysis reaction from being self-limiting by charge buildup. The high current may further give rise to an electron stimulated transitions or electron stimulated cascade wherein one or more current electrons increase the rate that a hydrogen (H) atom electron undergoes a transition to form hydrino. The high current may give rise to catastrophic decay or a catastrophic hydrino reaction rate. Plasma power formed by the hydrino may be directly converted into electricity.

A blast is produced by the fast kinetics that in turn causes massive electron ionization. In embodiments, the plasma power from the ignition of solid fuel in converted to electric power using at least one dedicated plasma to electric converter such as at least one of a MHD, PDC, and $\vec{E}\times\vec{B}$ direct converter. The details of these and other plasma to electric power converters are given in prior publications such as R. M. Mayo, R. L. Mills, M. Nansteel, "Direct Plasmadynamic Conversion of Plasma Thermal Power to Electricity," IEEE Transactions on Plasma Science, October, (2002), Vol. 30, No. 5, pp. 2066-2073; R. M. Mayo, R. L. Mills, M. Nansteel, "On the Potential of Direct and MHD Conversion of Power from a Novel Plasma Source to Electricity for Microdistributed Power Applications," IEEE Transactions on Plasma Science, August, (2002), Vol. 30, No. 4, pp. 1568-1578; R. M. Mayo, R. L. Mills, "Direct Plasmadynamic Conversion of Plasma Thermal Power to Electricity for Microdistributed Power Applications," 40th Annual Power Sources Conference, Cherry Hill, NJ, June 10-13, (2002), pp. 1-4 ("Mills Prior Plasma Power Conversion Publications") which are herein incorporated by reference in their entirety and prior applications such as Microwave Power Cell, Chemical Reactor, And Power Converter, PCT/US02/06955, filed Mar. 7, 2002 (short version), PCT/US02/06945 filed Mar. 7, 2002 (long version), U.S. Ser. No. 10/469,913 filed Sep. 5, 2003; Plasma Reactor And Process For Producing Lower-Energy Hydrogen Species, PCT/US04/010608 filed Apr. 8, 2004, U.S. Ser. No. 10/552,585 filed Oct. 12, 2015; and Hydrogen Power, Plasma, and Reactor for Lasing, and Power Conversion, PCT/US02/35872 filed Nov. 8, 2002, U.S. Ser. No. 10/494,571 filed May 6, 2004 ("Mills Prior Plasma Power Conversion Publications") herein incorporated by reference in their entirety.

The plasma energy converted to electricity is dissipated in an external circuit. As demonstrated by calculations and experimentally in Mills Prior Plasma Power Conversion Publications greater than 50% conversion of plasma energy to electricity can be achieved. Heat as well as plasma is produced by each SF-CIHT cell. The heat may be used directly or converted to mechanical or electrical power using converters known by those skilled in the art such as a heat engine such as a steam engine or steam or gas turbine and generator, a Rankine or Brayton-cycle engine, or a Stirling engine. For power conversion, each SF CIHT cell may be interfaced with any of the converters of thermal energy or plasma to mechanical or electrical power described in Mills Prior Publications as well as converters known to those skilled in the art such as a heat engine, steam or gas turbine system, Stirling engine, or thermionic or thermoelectric converter. Further plasma converters comprise at least one of plasmadynamic power converter, $\vec{E}\times\vec{B}$ direct converter, magnetohydrodynamic power converter, magnetic mirror magnetohydrodynamic power converter, charge drift converter, Post or Venetian Blind power converter, gyrotron, photon bunching microwave power converter, and photoelectric converter disclosed in Mills Prior Publications. In an embodiment, the cell comprises at least one cylinder of an internal combustion engine as given in Mills Prior Thermal Power Conversion Publications, Mills Prior Plasma Power Conversion Publications, and Mills Prior Applications.

A solid fuel catalyst induced hydrino transition (SF-CIHT) cell power generator shown in FIG. 1 comprises at least one SF-CIHT cell 301 having a structural support frame 3011*a*, each having at least two electrodes 302 that confine a sample, pellet, portion, or aliquot of solid fuel 303 and a source of electrical power 304 to deliver a short burst of low-voltage, high-current electrical energy through the fuel 303. The current ignites the fuel to release energy from forming hydrinos. The power is in the form of thermal power and highly ionized plasma of the fuel 303 capable of being converted directly into electricity. (Herein "ignites or forms blast" refers to the establishment of high hydrino reaction kinetics due to a high current applied to the fuel.) The plasma may be seeded to increase the conductivity or duration of the conductivity. In an embodiment, a composition of matter such as an element or compound such as an alkali metal or alkali metal compound such as $K_2CO_3$ may be added to at least one of the solid fuel and the plasma to seed it with charged ions. In an embodiment, the plasma comprises a source of ion seeding such as an alkali metal or alkali metal compound that maintains the conductivity when the plasma cools. Exemplary sources of electrical power to achieve ignition of the solid fuel to form plasma are those of a Taylor-Winfield model ND-24-75 spot welder and an EM Test Model CSS 500N10 CURRENT SURGE GENERATOR, 8/20US UP TO 10 KA. In an embodiment, the source of electrical power 304 is DC, and the plasma to electric power converter is suited for a DC magnetic field. Suitable converters that operate with a DC magnetic field are magnetohydrodynamic, plasmadynamic, and $\vec{E}\times\vec{B}$ power converters.

In an embodiment, an exemplary solid fuel mixture comprises a transition metal powder, its oxide, and $H_2O$. The fine powder may be pneumatically sprayed into the gap formed between the electrodes 302 when they open. In another embodiment, the fuel comprises at least one of a powder and slurry. The fuel may be injected into a desired region to be confined between the electrodes 302 to be ignited by a high current. To better confine the powder, the electrodes 302 may have male-female halves that form a chamber to hold the fuel. In an embodiment, the fuel and the electrodes 302 may be oppositely electrostatically charged such that the fuel flows into the inter-electrode region and electrostatically sticks to a desired region of each electrode 302 where the fuel is ignited.

In an embodiment of the power generator shown in FIG. 1, the electrodes surfaces 302 may be parallel with the gravitational axis, and solid fuel powder 303 may be gravity flowed from an overhead hopper 305 as intermittent stream wherein the timing of the intermittent flow streams matches the dimensions of the electrodes 302 as they open to receive the flowing powdered fuel 303 and close to ignite the fuel stream. In another embodiment, the electrodes 302 further comprise rollers 302*a* on their ends that are separated by a small gap filled with fuel flow. The electrically conductive fuel 303 completes the circuit between the electrodes 302, and the high current flow through the fuel ignites it. The fuel stream 303 may be intermittent to prevent the expanding plasma from disrupting the fuel stream flow.

In another embodiment, the electrodes 302 comprise a set of gears 302*a* supported by structural element 302*b*. The set of gears may be rotated by drive gear 302*c* powered by drive gear motor 302*d*. In another embodiment, the set of rollers may be rotated by drive roller 302*c* powered by drive roller motor 302*d*. In an embodiment, the drive roller may comprise a dressing wheel wherein the applied pressure on the roller electrode may be adjusted. In an embodiment, the bearings of the electrodes comprise plain bearings. The electrode bearing may be lubricated with a conductive lubricant such as $MoS_2$ or graphite lubricant. The drive gear 302*c* may further serve as a heat sink for each gear 302*a* wherein the heat may be removed by an electrode heat exchanger such as 310 that receives heat from the drive gear 302*c*. The gears 302*a* such herringbone gears each comprise an integer n teeth wherein the fuel flows into the $n^{th}$ inter-tooth gap or bottom land as the fuel in the $n-1^{th}$ inter-tooth gap is compressed by tooth n−1 of the mating gear. Other geometries for the gears or the function of the gears are within the scope of the present disclosure such as interdigitated polygonal or triangular-toothed gears, spiral gears, and augers as known to those skilled in the art. In an embodiment, the fuel and a desired region of the gear teeth of the electrodes 302*a* such as the bottom land may be oppositely electrostatically charged such that the fuel flows into and electrostatically sticks to the desired region of one or both electrodes 302*a* where the fuel is ignited when the teeth mesh. In an embodiment, the fuel 303 such as a fine powder is pneumatically sprayed into a desired region of the gears 302*a*. In another embodiment, the fuel 303 is injected into a desired region to be confined between the electrodes 302*a* such as the interdigitation region of the teeth of the gears 302*a* to be ignited by a high current. In an embodiment, the rollers or gears 302*a* maintain tension towards each other by means such as by being spring loaded or by pneumatic or hydraulic actuation. The meshing of teeth and compression causes electrical contact between the mating teeth through the conductive fuel. In an embodiment, the gears are conducting in the interdigitation region that contacts the fuel during meshing and are insulating in other regions such that the current selectively flows through the fuel. In an embodiment, the gears 302*a* comprise ceramic gears that are metal coated to be conductive in the interdigitation region or electrically isolated without a ground path. Also, the drive gear 302*c* may be nonconductive or electrically isolated without a ground path. The electrical contact and supply from the electrodes 302 to the interdigitating sections of the teeth may be provided by brushes. An exemplary brush comprises a carbon bar or rod that is pushed into contact with the gear by a spring, for example. Alternatively, the electrical contact from the bus bar of the electrodes 302 to the electrodes may be by at least one of a bushing, a slip ring, a rotary transformer and synchros. In an embodiment, the electrical contact from the bus bar from the source of electrical power to the electrodes 302 may be by a Hg contact in a sealed reservoir. The connection may comprise a rotatable shaft turning in the Hg reservoir electrified by the bus bar. The rotating shaft may be connected to a roller that makes contact with the roller electrode 302.

In another embodiment, electrical contact and supply from the electrodes 302 to the interdigitating sections of the teeth may be provided directly through a corresponding gear hub and bearings. Electrical contact and supply from the electrodes 302 to the opposing sections of the rollers may be provided directly through a corresponding roller hub and bearings. Structural element 302*b* may comprise the electrodes 302. As shown in FIG. 1, each electrode 302 of the pair of electrodes may be centered on each gear or roller and connected to the center of each gear or roller to serve as both the structural element 302*b* and the electrode 302 wherein the gear or roller bearings connecting each gear or roller 302*a* to its shaft or hub serves as an electrical contact, and the only ground path is between contacting teeth or surfaces of opposing gears or rollers. In an embodiment, the outer part of each gear or roller turns around its central hub to have more electrical contact through the additional bearings at the larger radius. The hub may also serve as a large heat sink. An electrode heat exchanger 310 may also attach to the hub to remove heat from the gears or rollers. The heat exchanger 310 may be electrically isolated from the hub with a thin layer of insulator such as an electrical insulator having high heat conductivity such as diamond or diamond-like carbon film. In an embodiment wherein the electrodes such as gear or roller electrodes are directly driven by at least one motor the heat exchanger hub may have a slip ring with the rotating electrode. The interface of the hub heat exchanger and the rotating roller or gear electrode may have a bearing such as a plain bearing. Coolant may be also flowed through the shaft to the gear or roller electrodes and may further flow through hollow channels in the electrodes such as gears or rollers. The electrification of the gears or rollers can be timed using a computer and switching transistors such as those used in brushless DC electric motors. In an embodiment, the gears or rollers are energized intermittently such that the high current flows through the fuel when the gears are meshed or rollers in contact. The flow of the fuel may be timed to match the delivery of fuel to the gears as they mesh or rollers as they rotate and the current is caused to flow through the fuel. The consequent high current flow causes the fuel to ignite. The fuel may be continuously flowed through the gears or rollers 302*a* that rotate to propel the fuel through the gap. The fuel may be continuously ignited as it is rotated to fill the space between the electrodes 302 comprising meshing regions of a set of gears or opposing sides of a set of rollers. In this case, the output power may be steady. The resulting plasma expands out the sides of the gears and flows to the plasma to electric converter 306, in an embodiment. The plasma expansion flow may be along the axis that is parallel with the shaft of each gear and transverse to the direction of the flow of the fuel stream 303. The axial flow may be to a PDC converter 306 as shown in FIG. 1 or an MHD converter. Further directional flow may be achieved with confining magnets such as those of Helmholtz coils or a magnetic bottle 306*d*.

The electrodes may be at least one of continuously or intermittently regenerated with metal from a component of the solid fuel 303. The solid fuel may comprise metal in a form that is melted during ignition such that some adheres, fuses, weld, or alloys to the surface to replace electrode 302*a* material such as metal that was eroded way or worn away during operation. The SF-CIHT cell power generator may further comprise a means to repair the shape of the electrodes such as the teeth of gears 302*a*. The means may comprise at least one of a cast mold, a grinder, and a milling machine. Gear erosion may be continuously repaired during operation. The gear electrodes of the SF-CIHT cell may be continuous repaired by electrical discharge machining (EDM) or by electroplating by means such as EDM electroplating that may be performed in vacuum. Systems and methods of continuous refurbishing of the gears or rollers during operation in vacuum or in the cell gas such as cold spray, thermal spray, or sputtering are known to those skilled in the art.

In an embodiment, the interdigitating gears are designed to trap excess solid fuel such as a solid fuel powder that is highly conductive. Gear regions such as each tooth and corresponding mating gear bottom-land have at least one of a geometric design and selective electrification such that only a portion of the excess amount fuel detonates. The selected portion may be separated from contact with the gears surfaces by non-selected, un-detonating fuel. The volumetric shape of the fuel in the interdigitation region may be such that a selected smaller volume has sufficiently high current to be permissive of detonation; whereas, the surrounding larger volume through which the current may pass has a current density below that required for detonation. In an embodiment, excess, trapped fuel conducts current that flows through a larger area or volume of fuel and is concentrated into a smaller area or volume wherein the current threshold for detonation is exceeded, and detonation occurs in the selected portion of the fuel having higher current density. In an embodiment, the selective fuel portion has a lower resistance relative to the non-selected portion due to the geometric design and selective electrification that determines the length of the current path through the portions of fuel. In an embodiment, the geometry of the gear causes a selected region to have a higher compression of the fuel than the non-selected area such that the resistance is lower in the selected region. Consequently, the current density is higher in the selected region and is above the detonation threshold. In contrast, the resistance is higher in the non-selected area. Consequently, the current density is lower in the non-selected area and is below the detonation threshold. In an exemplary embodiment, the selected region comprises the pinch of an hour-glass shaped aliquot of fuel.

In an embodiment, the opposed electrodes such as rollers or inter-digitating gears provide an initial compression of the fuel and facilitate current flow into the fuel. Then, the blast and magnetic pinch forces associated with the current flow within the confined fuel act in such a way as to further compress the fuel in order to achieve the critical current and pressure densities needed for further ignition. The latter may occurred within a region of the fuel some distance away from the surface layers. In an embodiment, the selective ignition in a selective region is achieved by selective electrification, selective compression, selective pinch forces of the high current flowed though the fuel, and selective shaping of the blast front and blast forces. At least one of the means to achieve selectivity may be due to selective geometry. The selectivity may be due to achieving the critical values for pressure and current in a region of the confined fuel remote from the surfaces of the gears.

The surrounding excess, non-detonated fuel absorbs at least some of the conditions that would otherwise cause erosion to the gears if they were directly exposed to the conditions being absent the intervening solid fuel that does not detonate. The conditions may comprise bombardment or exposure to at least one of high heat, high pressure such as that due to a shock wave or blast over pressure, projectiles, plasma, electrons, and ions. The un-detonated fuel may be connected by the fuel recovery system and recirculated. Regarding FIGS. 1 and 2A, the fuel recovery and recirculation systems may comprise vapor condensor 315, chute 306*a*, product remover/fuel loader 313, regeneration system 314, and hopper 305.

In another embodiment, the gears are movable by a fastened mechanism such as a reciprocating connecting rod attacked an actuated by a crankshaft similar to system and method of the piston system of an internal combustion engine. As the opposing electrode portions of gears rotate into the opposing mated position, the opposing electrodes are driven together in compression and moves apart following ignition by the fastened mechanism. The opposing electrodes may be any desired shape and may be selectively electrified to cause at least one of the fuel to undergo greater compression in the selected region and the current density to be greater in the selected region. The opposing electrodes may form a semispherical shell that compresses the fuel with the greatest compression in the center. The highest current density may also be at the center to selectively achieve the threshold for denotation in the center region. The expanding plasma may flow out the open portion of the semispherical shell. In another embodiment, the opposing electrodes may form the hour-glass shape wherein the selected region may comprise the waist or neck of the hour-glass.

In an embodiment, the gear can be comprised of at least two materials wherein in at least one material is a conductor. At least one hardened material may serve the purpose of being resistant to corrosion when exposed to the conditions of the blast wherein the blast may occur in contact with or close proximity to the hardened material. The highly conductive material may be separated from the blast by undetonated solid fuel. The arrangement of the at least two types of materials provides for at least one of the selective compression and selective electrification of the selected region over the non-selected region. In an exemplary embodiment, the interdigitation of the gears forms an hour-glass or pinched shape. The neck or waist of the hour-glass may be formed by a highly stable or hardened material that may be an insulator such as a ceramic. The non-waist or bulb portions of the gears may comprise a conductor such as a metal such as at least one of a transition, inner transition, rare earth, Group 13, Group 14, and Group 15 metal or an alloy of at least two such metals or a carbide such as TiC and WC. The waist portion may compress the selected region and the current may pass between the non-waist or bulb regions to be concentrated in the waist region. Thereby, the current density is increased in the selected region comprising the waist such that the detonation threshold is achieved. The waist is protected from damage from the blast by the resistance to erosion of the waist material comprising the hardened material. The non-waist or bulb regions comprised of a conductor are in contact with a non-selected fuel region wherein the fuel intervening between the blast and these corresponding gear surfaces protects these surfaces from erosion by the blast.

The ignition power source 304 that may also serve as a startup power source comprises at least one capacitor such as a bank of low voltage, high capacitance capacitors that supply the low voltage, high current necessary to achieve ignition. The capacitor circuit may be designed to avoid ripple or ringing during discharge to increase the lifetime of the capacitors. The lifetime may be long, such as in the range of about 1 to 20 years. The capacitors may be designed to store at least part of the electric power wave reflected upon detonation. The bus bar to the electrodes may comprise layers or comprise other means to achieve capacitance to offset the inductance of the bus bars and thus attenuate or control the reactive power following detonation. The bus bar may be superconducting to carry large current such as in the range of about 1000 A to 1,000,000 A. The capacitor bank power supply may comprise a circuit that avoids the skin effect during discharge that would prevent the current from penetrating into the bulk of the solid fuel. The power circuit may comprise an LRC circuit for the capacitor discharge to ignite the solid fuel wherein the time constant is long enough to prevent high frequency oscillations or a pulse discharge comprising of high frequency components that prevent the current from flowing through the sample to ignite it.

To dampen any intermittence, some power may be stored in a capacitor and optionally a high-current transformer, battery, or other energy storage device. In another embodiment, the electrical output from one cell can deliver a short burst of low-voltage, high-current electrical energy that ignites the fuel of another cell. The output electrical power can further be conditioned by output power conditioner 307 connected by power connectors 308 and 308*a*. The output power conditioner 307 may comprise elements such as power storage such as a battery or supercapacitor, DC to AC (DC/AC) converter or inverter, and a transformer. DC power may be converted to another form of DC power such as one with a higher voltage; the power may be converted to AC, or mixtures of DC and AC. The output power may be power conditioned to a desired waveform such as 60 Hz AC power and supplied to a load through output terminals 309. In an embodiment, the output power conditioner 307 converts the power from the photovoltaic converter or the thermal to electric converter to a desired frequency and wave form such as an AC frequency other than 60 or 50 HZ that are standard in the United States and Europe, respectively. The different frequency may be applied to matching loads designed for the different frequency such as motors such as those for motive, aviation, marine, appliances, tools, and machinery, electric heating and space conditioning, telecommunications, and electronics applications. A portion of the output power at power output terminals 309 may used to power the source of electrical power 304 such as about 5-10 V, 10,000-40,000 A DC power. PDC power converters may output low-voltage, high current DC power that is well suited for re-powering the electrodes 302 to cause ignition of subsequently supplied fuel. The output of low voltage, high current may be supplied to DC loads. The DC may be conditioned with a DC/DC converter. Exemplary DC loads comprise DC motors such as electrically commutated motors such as those for motive, aviation, marine, appliances, tools, and machinery, DC electric heating and space conditioning, DC telecommunications, and DC electronics applications. In an embodiment of motive applications, a vehicle may be used as a mobile distributed generation asset. A consumer may purchase electrical power through a service such as that provided by Uber Technologies, Inc. for transportation. For example, the customer may solicit power from a pool of providers by a mobile phone, notebook, or computer and the provider may drive to the customer's location and provide power to the consumer wherein the power is generated by the vehicle having a SF-CIHT or SunCell™ of the current disclosure.

The ignition generates an output plasma and thermal power. The plasma power may be directly converted to electricity by photovoltaic power converter 306. The cell may be operated open to atmosphere. In an embodiment, the cell 301 is capable of maintaining a vacuum or a pressure less than atmospheric. The vacuum or a pressure less than atmospheric may be maintained by vacuum pump 313*a* to permit ions for the expanding plasma of the ignition of the solid fuel 303 to be free of collisions with atmospheric gases. In an embodiment, a vacuum or a pressure less than atmospheric is maintained in the system comprising the plasma-generating cell 301 and the connected photovoltaic converter 306. In an embodiment, the cell 301 may be operated under at least one of vacuum and a cover gas. The cover gas may comprise an inert gas such as a noble gas such as argon. The cover gas may comprise nitrogen in the case that the reaction of the nitrogen with the solid fuel to form a product such as a metal nitride is unfavorable. The cover gas may further comprise a portion of hydrogen gas to react with oxygen formed from the reaction of $H_2O$ to hydrino and oxygen. The hydrogen may also react with oxygen from any atmospheric leak to form $H_2O$. In the case that light is converted to electricity, the cover gas is selected such that it does not have any undesirable absorption of the light produced by the hydrino reaction. The cover gas may also be selected as a converter of one spectrum of light to another more desirable spectrum for photovoltaic conversion to electricity.

The thermal power may be extracted by at least one of an electrode heat exchanger 310 with coolant flowing through its electrode coolant inlet line 311 and electrode coolant outlet line 312 and a PDC heat exchanger 318 with coolant flowing through its PDC coolant inlet line 319 and PDC coolant outlet line 320. Other heat exchangers may be used to receive the thermal power from the hydrino reaction such as a water-wall type of design that may further be applied on at least one wall of the vessel 301, at least one other wall of the PDC converter, and the back of the electrodes 317 of the PDC converter. In an embodiment, at least one of the heat exchanger and a component of the heat exchanger may comprise a heat pipe. The heat pipe fluid may comprise a molten salt or metal. Exemplary metals are cesium, NaK, potassium, sodium, lithium, and silver. These and other heat exchanger designs to efficiently and cost effectively remove the heat form the reaction are known to those skilled in the art. The heat may be transferred to a heat load. Thus, the power system may comprise a heater with the heat supplied by the at least one of the coolant outlet lines 312 and 320 going to the thermal load or a heat exchanger that transfers heat to a thermal load. The cooled coolant may return by at least one of the coolant inlet lines 311 and 319. The heat supplied by at least one of the coolant outlet lines 312 and 320 may flow to a heat engine, a steam engine, a steam turbine, a gas turbine, a Rankine-cycle engine, a Brayton-cycle engine, and a Stirling engine to be converted to mechanical power such as that of spinning at least one of a shaft, wheels, a generator, an aviation turbofan or turbopropeller, a marine propeller, an impeller, and rotating shaft machinery. Alternatively, the thermal power may flow from at lest one of the coolant outlet lines 312 and 320 to a thermal to electric power converter such as those of the present disclosure. Suitable exemplary thermal to electricity converters comprise at least one of the group of a heat engine, a steam engine, a steam turbine and generator, a gas turbine and generator, a Rankine-cycle engine, a Brayton-cycle engine, a Stirling engine, a thermionic power converter, and a thermoelectric power converter. The output power from the thermal to electric converter may be used to power a load, and a portion may power components of the SF-CIHT cell power generator such as the source of electrical power 304.

Ignition of the reactants of the fuel 303 yields power and products wherein the power may be in the form of plasma of the products. In an embodiment, the fuel 303 is partially to substantially vaporized to a gaseous physical state such as a plasma during the hydrino reaction blast event. The plasma passes through the plasma to electric power converter 306. Alternatively, the plasma emits light to the photovoltaic converter 306, and the recombined plasma forms gaseous atoms and compounds. These are condensed by a vapor condensor 315 and collected and conveyed to the regeneration system 314 by product remover-fuel loader 313 comprising a conveyor connection to the regeneration system 314 and further comprising a conveyor connection to the hopper 305. The vapor condensor 315 and product remover-fuel loader 313 may comprise systems such as at least one of an electrostatic collection system and at least one auger, conveyor or pneumatic system such as a vacuum or suction system to collect and move material. Solid fuel or product material may be separated from carrier gas such as argon by systems and methods such as filtration, cyclone, electrostatic, centrifugal, and magnetic separation, and gravity separations such as centrifugal jig and dry air shake table separation.

The plasma product and regenerated fuel from regeneration system 314 may be transported on an electrostatically charged or magnetized conveyor belt 313 wherein the fuel and product particles stick and are transported. The regenerated fuel particles may be drawn from the regeneration chamber 314 into a pipe 313 over the regeneration chamber due to the strong electrostatic or magnetic attraction of the particles to the conveyor belt. Suitable systems are known by those skilled in the art. Fuel or product transport may also be achieved using magnetic forces. For example, magnetic or magnetize particles may be transported by magnetic fields of permanent or electromagnets. The latter may be activated in a time sequence to cause the particles to at least one of move along a desired trajectory, be collected, be repelled, and be trapped.

The regeneration system 314 may comprise a closed vessel or chamber capable of a pressure greater than atmospheric and a heat exchanger in the regeneration chamber. The regeneration heat exchange may be in connection with a source of heat such as at least one of the electrode heat exchanger 310 and the PDC heat exchanger 318. In an embodiment, water from tank source 314*a* drips onto the regeneration heat exchanger to form steam that steam treats the plasma product to hydrate it. The steam may be refluxed with a water condensor 322 having a line 321 from the regeneration chamber 314 to the water tank 314*a*. The hydration may be conducted as batch regeneration followed by the steps of cool steam and condense, recirculate $H_2O$ to water tank 314*a*, move regenerated solid fuel to the hopper 305 via product remover/fuel loader 313, and refill regeneration chamber 314 with plasma product via product remover/fuel loader 313 to start another cycle.

In an embodiment, plasma to electric converter 306 such as a plasmadynamic converter or generator system comprising a photovoltaic converter 306 comprises a chute or channel 306*a* for the product to be conveyed into the product remover-fuel loader 313. At least one of the floor of the PDC converter 306, the chute 306*a*, and PDC electrode 317 may be sloped such that the product flow may be at least partially due to gravity flow. At least one floor of the PDC converter 306, the chute 306*a*, and PDC electrode 317 may be mechanically agitated or vibrated to assist the flow. The flow may be assisted by a shock wave formed by the ignition of the solid fuel. In an embodiment, at least one of the floor of the PDC converter 306, the chute 306*a*, and PDC electrode 317 comprises a mechanical scraper or conveyor to move product from the corresponding surface to the product remover-fuel loader 313.

The hopper 305 may be refilled with regenerated fuel from the regeneration system 314 by product remover-fuel loader 313. Any H or $H_2O$ consumed such as in the formation of hydrino may be made up with $H_2O$ from $H_2O$ source 314*a*. Herein, the spent fuel is regenerated into the original reactants or fuel with any H or $H_2O$ consumed such as in the formation of hydrino made up with $H_2O$ from $H_2O$ source 314*a*. The water source may comprise a tank, cell, or vessel 314*a* that may contain at least one of bulk or gaseous $H_2O$, or a material or compound comprising $H_2O$ or one or more reactants that forms $H_2O$ such as $H_2$+$O_2$. Alternatively, the source may comprise atmospheric water vapor, or a means to extract $H_2O$ from the atmosphere such as a hydroscopic material such as lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers (such as cotton and paper), sugar, caramel, honey, glycerol, ethanol, methanol, diesel fuel, methamphetamine, many fertilizer chemicals, salts (including table salt) and a wide variety of other substances know to those skilled in the art as well as a desiccant such as silica, activated charcoal, calcium sulfate, calcium chloride, and molecular sieves (typically, zeolites) or a deliquescent material such as zinc chloride, calcium chloride, potassium hydroxide, sodium hydroxide and many different deliquescent salts known to those skilled in the art.

In an embodiment, the SF-CIHT cell power generator further comprises a vacuum pump 313*a* that may remove any product oxygen and molecular hydrino gas. In an embodiment, at least one of oxygen and molecular hydrino are collected in a tank as a commercial product. The pump may further comprise selective membranes, valves, sieves, cryofilters, or other means known by those skilled in the art for separation of oxygen and hydrino gas and may additionally collect $H_2O$ vapor, and may supply $H_2O$ to the regeneration system 314 to be recycled in the regenerated solid fuel. $H_2$ gas may be added to the vessel chamber in order to suppress any oxidation of the generator components such as the gears or PDC or MHD electrodes. The hydrogen may undergo combustion with any oxygen present. The generator may further comprise a recombiner to catalyze the reaction of $H_2$ and $O_2$ to form water. Alternatively, the plasma may cause the reaction of the $H_2$ and $O_2$ to form $H_2O$. The hydrogen may be supplied by the electrolysis of $H_2O$ wherein the $H_2$ is separated from the $O_2$. The separation may be achieved by a selective gas membrane. The gases may be separated by using a hydrogen permeable cathode that may be in connection with the cell 301.

In an embodiment, the fuel 303 comprises a fine powder that may be formed by ball milling regenerated or reprocessed solid fuel wherein the regeneration system 314 may further comprise a ball mill, grinder, or other means of forming smaller particles from larger particles such as those grinding or milling means known in the art. An exemplary solid fuel mixture comprises a conductor such as conducting metal powder such as a powder of a transition metal, silver, or aluminum, its oxide, and $H_2O$. In another embodiment, the fuel 303 may comprise pellets of the solid fuel that may be pressed in the regeneration system 314. The solid fuel pellet may further comprise a thin foil of the powdered metal or another metal that encapsulates the metal oxide and $H_2O$, and optionally the metal powder. In this case, the regeneration system 314 regenerates the metal foil by means such as at least one of heating in vacuum, heating under a reducing hydrogen atmosphere, and electrolysis from an electrolyte such as a molten salt electrolyte. The regeneration system 314 further comprises metal processing systems such as rolling or milling machinery to form the foil from regenerated foil metal stock. The jacket may be formed by a stamping machine or a press wherein the encapsulated solid fuel may be stamped or pressed inside.

In an exemplary embodiment, the solid fuel is regenerated by means such as given in the present disclosure such as at least one of addition of $H_2$, addition of $H_2O$, thermal regeneration, and electrolytic regeneration. Due to the very large energy gain of the hydrino reaction relative to the input energy to initiate the reaction, such as 100 times in the case of NiOOH (3.22 kJ out compared to 46 J input as given in the Exemplary SF-CIHT Cell Test Results section), the products such as $Ni_2O_3$ and NiO can be converted to the hydroxide and then the oxyhydroxide by electrochemical reactions as well as chemical reactions as given in the present disclosure and also by ones known to those skilled in the art. In other embodiments, other metals such as Ti, Gd, Co, In, Fe, Ga, Al, Cr, Mo, Cu, Mn, Zn, Sn, and Sm, and the corresponding oxides, hydroxides, and oxyhydroxides such as those of the present disclosure may substitute for Ni. In another embodiment, the solid fuel comprises a metal oxide and $H_2O$ and the corresponding metal as a conductive matrix. The product may be metal oxide. The solid fuel may be regenerated by hydrogen reduction of a portion of the metal oxide to the metal that is then mixed with the oxide that has been rehydrated. Suitable metals having oxides that can readily be reduced to the metals with mild heat such as less than 1000° C. and hydrogen are Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In another embodiment, the solid fuel comprises (1) an oxide that is not easily reduced with $H_2$ and mild heat such as at least one of alumina, an alkaline earth oxide, and a rare earth oxide, (2) a metal having an oxide capable of being reduced to the metal with $H_2$ at moderate temperatures such as less than 1000° C., and (3) $H_2O$. An exemplary fuel is MgO+Cu+

$H_2O$. Then, the product mixture of the $H_2$ reducible and nonreducible oxide may be treated with $H_2$ and heated at mild conditions such that only the reducible metal oxide is converted to metal. This mixture may be hydrated to comprise regenerated solid fuel. An exemplary fuel is MgO+Cu+$H_2O$; wherein the product MgO+CuO undergoes $H_2$ reduction treatment to yield MgO+Cu that is hydrated to the solid fuel.

In another embodiment, the oxide product such as CuO or AgO is regenerated by heating under at least one of vacuum and an inert gas stream. The temperature may be in the range of at least one of about 100° C. to 3000° C., 300° C. to 2000° C., 500° C. 10 1200° C., and 500° C. to 1000° C. In an embodiment, the regeneration system 314 may further comprise a mill such as at least one of a ball mill and a shredding/grinding mill to mill at least one of bulk oxide and metal to powders such as fine powders such as one with particle sizes in the range of at least one of about 10 nm to 1 cm, 100 nm to 10 mm, 0.1 μm to 1 mm, and 1 μm to 100 μm (μ=micro).

In another embodiment, the regeneration system may comprises an electrolysis cell such as a molten salt electrolysis cell comprising metal ions wherein the metal of a metal oxide product may be plated onto the electrolysis cell cathode by electrodeposition using systems and methods that are well known in the art. The system may further comprise a mill or grinder to form metal particles of a desired size from the electroplated metal. The metal may be added to the other components of the reaction mixture such as $H_2O$ to form regenerated solid fuel.

In an embodiment the cell 301 of FIG. 1 is capable of maintaining a vacuum or a pressure less than atmospheric. A vacuum or a pressure less than atmospheric is maintained in the cell 301 by pump 313*a* and may also be maintained in the connecting plasma to electric converter 306 that receives the energetic plasma ions from the plasma source, cell 301. In an embodiment, the solid fuel comprises a metal that is substantially thermodynamically stable towards reaction with $H_2O$ to become oxidized metal. In this case, the metal of the solid fuel is not oxidized during the reaction to form products. An exemplary solid fuel comprises a mixture of the metal, the oxidized metal, and $H_2O$. Then, the product such as a mixture of the initial metal and metal oxide may be removed by product remover-fuel loader 313 and regenerated by addition of $H_2O$. Suitable metals having a substantially thermodynamically unfavorable reaction with $H_2O$ may be chosen for the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In other embodiments, the solid fuel comprises the $H_2O$ unreactive metal and at least one of $H_2O$, a metal oxide, hydroxide, and oxyhydroxide that may comprise the same or at least one different metal.

In an embodiment, the methods of $H_2$ reduction, reduction under vacuum, and rehydration are conducted in order to regenerate the solid fuel expeditiously, efficiently, and cost effectively as possible.

In an embodiment, the solid fuel comprises a mixture of hydroscopic material comprising $H_2O$ and a conductor. An exemplary fuel is a hydrated alkaline earth metal halide such as $MgX_2$ (X=F, Cl, Br, I) and a conductor such as a transition metal such as Co, Ni, Fe, or Cu.

The solid fuel may comprise a composition of matter such as an element or compound such as a metal with at least one of a low melting point, a high conductivity, and a low work function wherein the work function may be very low at high temperature, and further comprises at least one of a source of $H_2O$ and $H_2O$. In an embodiment, the solid fuel comprises a conductor such as a metal that melts; the high current from the source of electrical power 4 melts the conductor such as a metal to give rise to thermionic or thermoelectric emission to form low voltage arc plasma, and the arc plasma causes ignition of the $H_2O$. In an embodiment, the solid fuel is a highly conductive and comprises at least one low-melting point metal that has a low work function at high temperature to give rise to a low-voltage arc plasma in the presence of $H_2O$ of the fuel wherein the fuel consequently ignites.

In an embodiment, the solid fuel comprises a source of H such as hydrocarbon that may be a source of mH catalyst according to Eqs. (6-9) to form hydrinos. The solid fuel may comprise a conductor, a material to bind the source of hydrogen such as carbon or other hydrophobic matrix, and a source of hydrogen such as a hydrocarbon. The solid fuel may be denoted by a high current that results in the formation of a high concentration of H that serves and a catalyst and reactant to form hydrinos.

The power generator further comprises means and methods for variable power output. In an embodiment, the power output of the power generator is controlled by controlling the variable or interruptible flow rate of the fuel 303 into the electrodes 302 or rollers or gears 302*a*, and the variable or interruptible fuel ignition rate by the power source 304. The rate of rotation of the rollers or gears may also be controlled to control the fuel ignition rate. In an embodiment, the output power conditioner 307 comprises a power controller 307 to control the output that may be DC. The power controller may control the fuel flow rate, the rotation speed of the gears by controlling the gear drive motor 302*d* that rotates the drive gear 302*c* and turns the gears 302*a*. The response time based on the mechanical or electrical control of at least one of the fuel consumption rate or firing rate may be very fast such as in the range of 10 ms to 1 μs. The power may also be controlled by controlling the connectivity of the converter electrodes of the plasma to electric converter. For example, connecting PDC electrodes in series increases the voltage, and connecting converter electrodes in parallel increases the current. Changing the angle of the PDC electrodes or selectively connecting to sets of PDC electrodes 317 at different angles relative to at least one of the magnetic field direction changes the power collected by changing at least one of the voltage and current.

Figure 2A:
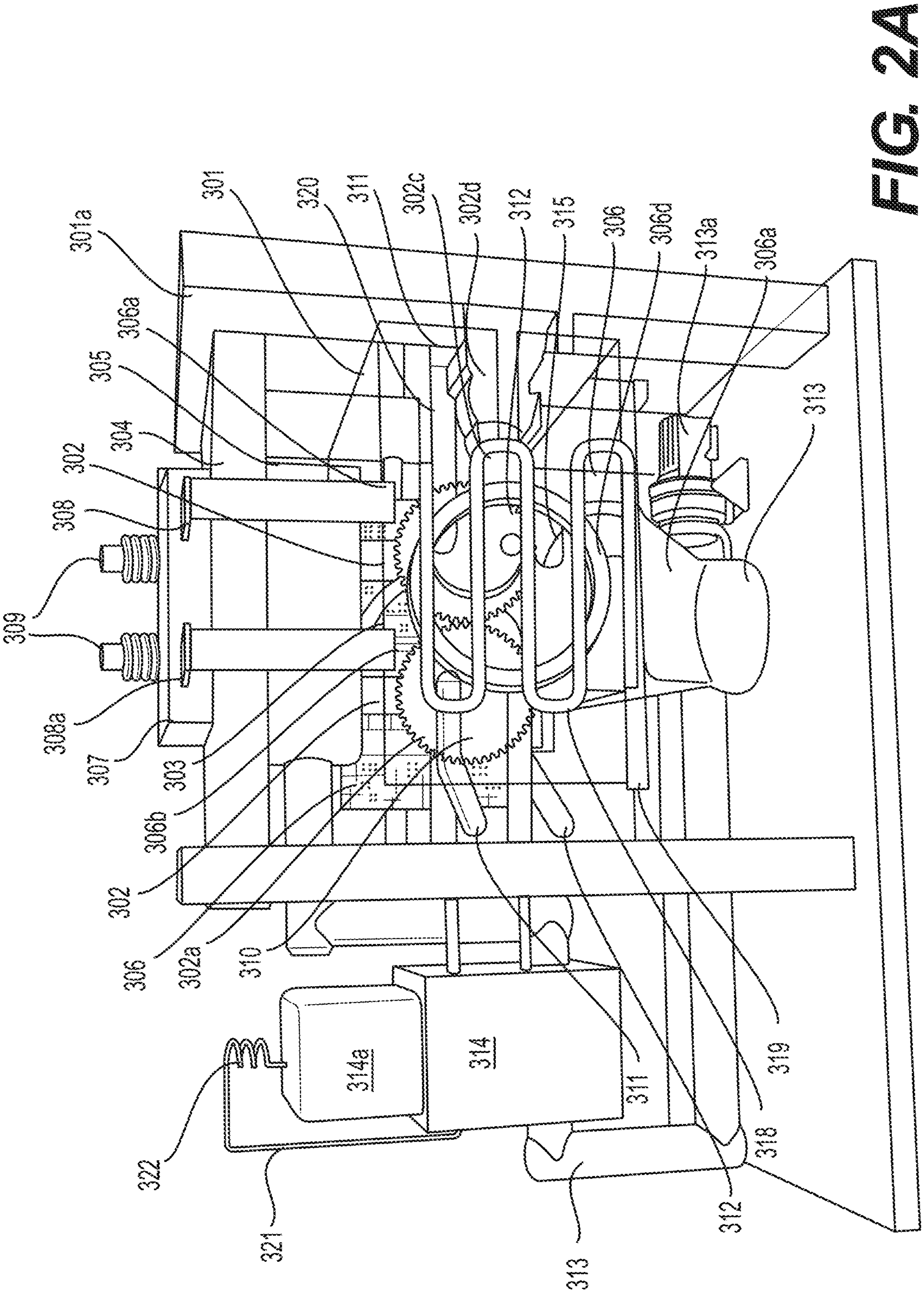
FIG. 2A is a schematic drawing of a SF-CIHT cell power generator showing a photovoltaic converter in accordance with an embodiment of the present disclosure.

In an embodiment shown in FIG. 2A, the power converter 306 comprises a photovoltaic or solar cell system. In an embodiment, the output power controller/conditioner 307 receives power from the photovoltaic power converter 306 and delivers some of the power to the source of electrical power 304 in a form suitable to power the source 304 to cause ignition of the solid fuel 303 at a desired repetition rate. In an embodiment, the ignition is auto-triggered by the presence of fuel that sufficiently reduces the resistance between the electrodes to permit ignition. The fuel may be injected into the electrodes at a rate to achieve a desired rate of ignition. Additional power received and conditioned by output power controller/conditioner 307 may be output to deliver to an electrical load. Suitable integration of the photovoltaic output with power requirement of the fuel ignition electrical system, source of electrical power 304, and that of the load may be achieved with an output power controller/conditioner 307 used in the solar industry known to those skilled in the art. Suitable solar power conditioners output AC power at a range of voltages suitable for the grid such as 120 V and multiples there of In an embodiment, at least a portion of the electrical output of the photovoltaic converter is high voltage to reduce transmission losses in delivering power to internal and external loads. The voltage may be in at least one range of about 10 V to 5000 V, 100 V to 1000 V, 200 to 500V, and 300 to 400 V The power controller 307 further comprises sensors of input and output parameters such as voltages, currents, and powers. The signals from the sensors may be fed into a processor that controls the power generator. At least one of the ramp-up time, ramp-down time, voltage, current, power, waveform, and frequency may be controlled. In an embodiment, the output electricity may be any desired waveform such as DC or AC such as 60 Hz AC or another frequency different from 60 Hz that may comprise a new standard of electrical power. The power generator may comprise a resistor such as a shunt resistor through which power in excess of that required or desired for a power load may be dissipated. The shunt resistor may be connected to output power conditioner or power controller 307. The power generator may comprise an embedded processor and system to provide remote monitoring that may further have the capacity to disable the power generator.

In an embodiment, the SF-CIHT generator comprises a smart mobile device to at least one of monitor and control the generator. The smart mobile device may further comprise a portal. The portal may facilitate wireless communication to and from the SF-CIHT generator. In an embodiment, the portal may serve as a means to at least one of transmit and receive internet-type and telecommunications content. The smart device may comprise at least one of a smart phone and a smart tablet. The internet-like services may be provided via the portal. Exemplary internet-like services comprise GPS, internet connectivity, social media, networking, email, voice or video over IP, search capability, and other uses of the internet known to those skilled in the art. The portal of each SF-CIHT generator may be connected to other such portals to form a network on interconnectivity. The network may serve as an alterative or a parallel internet. Airborne SunCells such as those in aircraft such as planes and drones may serve as receiver-transmission tower replacements. In an embodiment, signals such as internet content from the SF-CIHT cell portal may be transmitted through the building wiring that may be based on DC electricity.

In an embodiment, the SF-CIHT cell that may be portable or mobile such as one mounted in a vehicle may be connected to power conditioning equipment such as an inverter to convert DC to AC power. The power conditioning equipment may be used for any application such as auxiliary power. Exemplary auxiliary power uses are vehicle to stationary power such as vehicle to building or plant, and vehicle to vehicle such as vehicle to truck, vehicle to train, and vehicle to ship wherein the vehicle providing power such as a car may be carried by the vehicle receiving power. Exemplary carrying vehicles are a truck, train, ship, and plane. In an embodiment, the power conditioning equipment may comprise a reverse car charging station such as the reverse of car charging stations known in the art. In an embodiment, DC power supplied by a mobile SF-CIHT cell such as one in a vehicle may be connected to the power conditioning equipment such as one comprising an inverter such as the reverse charging station to supply power to a stationary application such as a building. In an embodiment, the vehicle may comprise a reverse charging station. The vehicle may comprise power conditioning equipment such as an inverter that outputs power suitable for an external load such as a stationary or auxiliary application load. The output from the power conditioner may be connected to the external load by a matching power cord connected to the load. An exemplary cord connection to a load is to the beaker box of a building. In an embodiment, the SunCell such as one mounted in a vehicle may output DC power to the external load such as a building that may require DC power. The connection may be through the cord. The power transfer may comprise inductive charging using a transmitter on the vehicle and a receiver to receive and supply power to the auxiliary load such as a building. The connection between the power conditioning equipment and the SF-CIHT cell may further comprise at least one of a mechanical and an electronic key to control the power flow from the SF-SunCell to the power conditioning equipment. The control may also be provided by the monitoring and control capability of the unit enabled through the portal.

In an embodiment, a portion of the electrical power output at terminals 309 is supplied to at least one of the source of electrical power 304, the gear (roller) drive motor 302*d*, product remover-fuel loader 313, pump 313*a*, and regeneration system 314 to provide electrical power and energy to propagate the chemical reactions to regenerate the original solid fuel from the reaction products. In an embodiment, a portion of the heat from at least one of the electrode heat exchanger 310 and PDC heat exchanger 318 is input to the solid fuel regeneration system by at least one of the coolant outlet lines 312 and 320 with coolant return circulation by at least one of the coolant input lines 311 and 319 to provide thermal power and energy to propagate the chemical reactions to regenerate the original solid fuel from the reaction products. A portion of the output power from the thermal to electric converter 306 may also be used to power the regeneration system as well as other systems of the SF-CIHT cell generator.

G. Plasmadynamic Plasma to Electric Power Converter

The plasma power may be converted to electricity using plasmadynamic power converter 306 (FIG. 1) that is based on magnetic space charge separation. Due to their lower mass relative to positive ions, electrons are preferentially confined to magnetic flux lines of a magnetized PDC electrode such as a cylindrical PDC electrode or a PDC electrode in a magnetic field. Thus, electrons are restricted in mobility; whereas, positive ions are relatively free to be collisional with the intrinsically or extrinsically magnetized PDC electrode. Both electrons and positive ions are fully collisional with an unmagnetized PDC electrode. Plasmadynamic conversion extracts power directly from the thermal and potential energy of the plasma and does not rely on plasma flow. Instead, power extraction by PDC exploits the potential difference between a magnetized and unmagnetized PDC electrode immersed in the plasma to drive current in an external load and, thereby, extract electrical power directly from stored plasma thermal energy. Plasmadynamic conversion (PDC) of thermal plasma energy to electricity is achieved by inserting at least two floating conductors directly into the body of high temperature plasma. One of these conductors is magnetized by an external electromagnetic field or permanent magnet, or it is intrinsically magnetic. The other is unmagnetized. A potential difference arises due to the vast difference in charge mobility of heavy positive ions versus light electrons. This voltage is applied across an electrical load.

In embodiments, the power system shown in FIG. 1 comprises additional internal or external electromagnets or permanent magnets or comprises multiple intrinsically magnetized and unmagnetized PDC electrodes such as cylindrical PDC electrodes such as pin PDC electrodes. The source of uniform magnetic field B parallel to each PDC pin electrode 306*b* may be provided by an electromagnet such as by Helmholtz coils 306*d*. The magnets may be at least one of permanent magnets such as Halbach array magnets, and uncooled, water cooled, and superconducting electromagnets. The exemplary superconducting magnets may comprise NbTi, NbSn, or high temperature superconducting materials. The negative voltage from a plurality of anode pin electrodes 306*b* is collected by anode or negative PDC electrode 317. In an embodiment, at least one magnetized PDC pin electrode 306*b* is parallel to the applied magnetic field B; whereas, the at least one corresponding counter PDC pin electrode 306*c* is perpendicular to magnetic field B such that it is unmagnetized due to its orientation relative to the direction of B. The positive voltage from a plurality of cathode pin electrodes 306*c* is collected by cathode or positive PDC electrode 317*a*. The power can be delivered to the power conditioner/controller through negative electrode power connector 308 and positive electrode power connector 308*a*. In an embodiment, the cell wall may serve as a PDC electrode. In an embodiment, the PDC electrodes comprise a refractory metal that is stable in a high temperature atmospheric environment such high-temperature stainless steels and other materials known to those skilled in the art. In an embodiment, the plasmadynamic converter further comprises a plasma confinement structure such as a magnetic bottle or source of solenoidal field such as Helmholtz coils 306*d* to confine the plasma and extract more of the power of the energetic ions as electricity.

In a further embodiment of the power converter, the flow of ions along the z-axis with $v_{\parallel} >> v_{\perp}$ may then enter a compression section comprising an increasing axial magnetic field gradient wherein the component of electron motion parallel to the direction of the z-axis $v_{\parallel}$ is at least partially converted into to perpendicular motion $v_{\perp}$ due to the adiabatic invariant $$\frac{v_{\perp}^2}{B} = \text{constant}.$$

An azimuthal current due to $v_{\perp}$ is formed around the z-axis. The current is deflected radially in the plane of motion by the axial magnetic field to produce a Hall voltage between an inner ring and an outer ring MHD electrode of a disk generator magnetohydrodynamic power converter. The voltage may drive a current through an electrical load. The plasma power may also be converted to electricity using $\vec{E} \times \vec{B}$ direct converter or other plasma to electricity devices of the present disclosure. In another embodiment, the magnetic field such as that of the Helmholtz coils 306*d* confine the plasma such that it can be converted to electricity by plasma to electric converter 306 which may be a plasmadynamic power converter. In an embodiment the Helmholtz coils comprise a magnetic bottle. The PDC converter 306 may be proximal to the plasma source relative to the Helmholtz coils as shown in FIG. 1. For plasma to electric converter components comprising magnet located outside of the cell vessel, the separating walls may comprise a nonferrous material such as stainless steel. For example, a wall separating the Helmholtz coils 306 from the vessel 301 containing the plasma or the sidewalls of a PDC converter or an MHD converter may comprise a material such as stainless steel that the magnetic flux readily penetrates. In this embodiment, the magnets are positioned externally to provide a magnetic flux that is transverse to magnetize transverse-oriented PDC pin anodes or transverse to the plasma expansion direction of a MHD converter.

Each cell also outputs thermal power that may be extracted from the electrode heat exchanger 310 by inlet and out coolant lines 311 and 312, respectively, and the PDC heat exchanger 318 by inlet and outlet coolant lines 319 and 320, respectively. The thermal power may be used as heat directly or converted to electricity. In embodiments, the power system further comprises a thermal to electric converter. The conversion may be achieved using a conventional Rankine or Brayton power plant such as a steam plant comprising a boiler, steam turbine, and a generator or one comprising a gas turbine such as an externally heated gas turbine and a generator. Suitable reactants, regeneration reaction and systems, and power plants may comprise those of the present disclosure, in prior US Patent Applications such as Hydrogen Catalyst Reactor, PCT/US08/61455, filed PCT Apr. 24, 2008; Heterogeneous Hydrogen Catalyst Reactor, PCT/US09/052072, filed PCT Jul. 29, 2009; Heterogeneous Hydrogen Catalyst Power System, PCT/US10/27828, PCT filed Mar. 18, 2010; Electrochemical Hydrogen Catalyst Power System, PCT/US11/28889, filed PCT Mar. 17, 2011; $H_2O$-Based Electrochemical Hydrogen-Catalyst Power System, PCT/US12/31369 filed Mar. 30, 2012, and CIHT Power System, PCT/US13/041938 filed May 2, 2013 ("Mills Prior Applications") and in prior publications such as R. L. Mills, M. Nansteel, W. Good, G. Zhao, "Design for a BlackLight Power Multi-Cell Thermally Coupled Reactor Based on Hydrogen Catalyst Systems," Int. J. Energy Research, Vol. 36, (2012), 778-788; doi: 10.1002/er.1834; R. L. Mills, G. Zhao, W. Good, "Continuous Thermal Power System," Applied Energy, Vol. 88, (2011) 789-798, doi: 10.1016/j.apenergy.2010.08.024, and R. L. Mills, G. Zhao, K. Akhtar, Z. Chang, J. He, X. Hu, G. Wu, J. Lotoski, G. Chu, "Thermally Reversible Hydrino Catalyst Systems as a New Power Source," Int. J. Green Energy, Vol. 8, (2011), 429-473 ("Mills Prior Thermal Power Conversion Publications") herein incorporated by reference in their entirety. In other embodiments, the power system comprises one of other thermal to electric power converters known to those skilled in the art such as direct power converters such as thermionic and thermoelectric power converters and other heat engines such as Stirling engines.

In an embodiment, a 10 MW power generator undergoes the following steps:

1. Fuel flows from the hopper into a pair of gears and/or support members that confines about 0.5 g aliquots of highly conducting solid fuel in the interdigitating regions wherein a low voltage, high current is flowed through the fuel to cause it to ignite. The ignition releases about 10 kJ of energy per aliquot. The gears comprise 60 teeth and rotate at 1000 RPM such that the firing rate is 1 k Hz corresponding to 10 MW of power. In an embodiment, the gears are designed such that a fuel powder layer in direct contact with the gears does not carry the critical current density for detonation whereas bulk region does such that the gears are protected from erosion by the blast from the ignition of the fuel.
2. An essentially, fully ionized plasma expands out from the gears on the axis perpendicular to the gears and enters the magnetohydrodynamic or plasmadynamic converter wherein the plasma flow is converted to electricity. Alternatively, brilliant light is emitted from the plasma that is converted to electricity using a photovoltaic power converter.
3. A portion of the electricity powers the source of electrical power to the electrodes and the rest can be supplied to an external load following power conditioning by the corresponding unit. Heat that is removed from the gear hub by an electrode heat exchanger flows to a regeneration system heat exchanger, and the rest flows to an external heat load.

4. The plasma gas condenses to product comprising the solid fuel without $H_2O$.
5. An auger such as one used in the pharmaceutical or food industries transports the product powder to a regeneration system wherein it is rehydrated with steam wherein the steam is formed by flowing $H_2O$ from a $H_2O$ reservoir over the hot coils of the regeneration system heat exchanger.
6. The regenerated solid fuel is transported to the hopper by an auger to permit the continuous use of the fuel with $H_2O$ add back only.

Assume 0.5 gram of solid fuel yields 1 kJ of energy. Assuming that the density of the fuel is the density of Cu, 8.96 g/cm$^3$, then the volume of fuel per tooth in the interdigitating area is 0.056 cm$^3$. If the conduction depth is 2 mm to achieve high conductivity through the fuel, then the fuel base defined by the interdigitation gap of the triangular teeth of each gear is 4 mm, and the gear width is 0.11 cm$^3$/(0.2)(0.4)=1.39 cm. In another embodiment, the $H_2O$ consumption of an exemplary 10 MW generators is given as follows:

$H_2O$ to $H_2(1/4)+1/2O_2$ (50 MJ/mole $H_2O$); 10 MJ/s/50 MJ/mole $H_2O$=0.2 moles (3.6 g) $H_2O$/s or 13 kg/h=13 liter/hr. Considering an exemplary case wherein the solid fuel recirculated with ignition and regeneration in 1 minute and 0.5 g produces 10 kJ, the inventory of solid fuel is given as follows: 10 MJ/s×0.5 g/10 kJ=500 g/s (30 kg/minute), and the solid fuel inventory is 30 kg or about 3 liters.

H. Arc and High-DC, AC, and DC-AC Mixture Current Hydrino Plasma Cells Having Photovoltaic Conversion of Optical Power In exemplary embodiments of the present disclosure, the power system having photovoltaic conversion of optical power may include any of the components disclosed herein with respect to the SF-CIHT cells. For example, certain embodiments include one or more of the following: the vessel may be capable of a pressure of at least one of atmospheric, above atmospheric, and below atmospheric; the reactants may comprise a source of $H_2O$ and a conductive matrix to form at least one of the source of catalyst, the catalyst, the source of atomic hydrogen, and the atomic hydrogen; the reactants may comprise a source of $H_2O$ comprising at least one of bulk $H_2O$, a state other than bulk $H_2O$, a compound or compounds that undergo at least one of react to form $H_2O$ and release bound $H_2O$; the bound $H_2O$ may comprise a compound that interacts with $H_2O$ wherein the $H_2O$ is in a state of at least one of absorbed $H_2O$, bound $H_2O$, physisorbed $H_2O$, and waters of hydration; the reactants may comprise a conductor and one or more compounds or materials that undergo at least one of release of bulk $H_2O$, absorbed $H_2O$, bound $H_2O$, physisorbed $H_2O$, and waters of hydration, and have $H_2O$ as a reaction product; at least one of the source of nascent $H_2O$ catalyst and the source of atomic hydrogen may comprise at least one of a) at least one source of $H_2O$, b) at least one source of oxygen, and c) at least one source of hydrogen; the reactants may form at least one of the source of catalyst, the catalyst, the source of atomic hydrogen, and the atomic hydrogen may comprise at least one of a) $H_2O$ and the source of $H_2O$, b) $O_2$, $H_2O$, HOOH, $OOH^-$, peroxide ion, superoxide ion, hydride, $H_2$, a halide, an oxide, an oxyhydroxide, a hydroxide, a compound that comprises oxygen, a hydrated compound, a hydrated compound selected from the group of at least one of a halide, an oxide, an oxyhydroxide, a hydroxide, a compound that comprises oxygen, and c) a conductive matrix; the oxyhydroxide may comprise at least one from the group of TiOOH, GdOOH, CoOOH, InOOH, FeOOH, GaOOH, NiOOH, AlOOH, CrOOH, MoOOH, CuOOH, MnOOH, ZnOOH, and SmOOH, the oxide may comprise at least one from the group of CuO, $Cu_2O$, CoO, $Co_2O_3$, $Co_3O_4$, FeO, $Fe_2O_3$, NiO, and $Ni_2O_3$, the hydroxide may comprise at least one from the group of $Cu(OH)_2$, $Co(OH)_2$, $Co(OH)_3$, $Fe(OH)_2$, $Fe(OH)_3$, and $Ni(OH)_2$, the compound that comprises oxygen comprises at least one from the group of a sulfate, phosphate, nitrate, carbonate, hydrogen carbonate, chromate, pyrophosphate, persulfate, perchlorate, perbromate, and periodate, $MXO_3$, $MXO_4$ (M=metal such as alkali metal such as Li, Na, K, Rb, Cs; X=F, Br, Cl, I), cobalt magnesium oxide, nickel magnesium oxide, copper magnesium oxide, $Li_2O$, alkali metal oxide, alkaline earth metal oxide, CuO, $CrO_4$, ZnO, MgO, CaO, $MoO_2$, $TiO_2$, $ZrO_2$, $SiO_2$, $Al_2O_3$, NiO, FeO, $Fe_2O_3$, $TaO_2$, $Ta_2O_5$, VO, $VO_2$, $V_2O_3$, $V_2O_5$, $P_2O_3$, $P_2O_5$, $B_2O_3$, NbO, $NbO_2$, $Nb_2O_5$, $SeO_2$, $SeO_3$, $TeO_2$, $TeO_3$, $WO_2$, $WO_3$, $Cr_3O_4$, $Cr_2O_3$, $CrO_2$, $CrO_3$, CoO, $Co_2O_3$, $Co_3O_4$, FeO, $Fe_2O_3$, NiO, $Ni_2O_3$, rare earth oxide, $CeO_2$, $La_2O_3$, an oxyhydroxide, TiOOH, GdOOH, CoOOH, InOOH, FeOOH, GaOOH, NiOOH, AlOOH, CrOOH, MoOOH, CuOOH, MnOOH, ZnOOH, and SmOOH, and the conductive matrix may comprise at least one from the group of a metal powder, carbon, carbide, boride, nitride, carbonitrile such as TiCN, or nitrile.

In still further embodiments of the present disclosure, the power system may include one or more of the following: the reactants may comprise a mixture of a metal, its metal oxide, and $H_2O$ wherein the reaction of the metal with $H_2O$ is not thermodynamically favorable; the reactants may comprise a mixture of a transition metal, an alkaline earth metal halide, and $H_2O$ wherein the reaction of the metal with $H_2O$ is not thermodynamically favorable; the reactants may comprise a mixture of a conductor, a hydroscopic material, and $H_2O$; the conductor may comprise a metal powder or carbon powder wherein the reaction of the metal or carbon with $H_2O$ is not thermodynamically favorable; the hydroscopic material may comprise at least one of the group of lithium bromide, calcium chloride, magnesium chloride, zinc chloride, potassium carbonate, potassium phosphate, carnallite such as $KMgCl_3 \cdot 6(H_2O)$, ferric ammonium citrate, potassium hydroxide and sodium hydroxide and concentrated sulfuric and phosphoric acids, cellulose fibers, sugar, caramel, honey, glycerol, ethanol, methanol, diesel fuel, methamphetamine, a fertilizer chemical, a salt, a desiccant, silica, activated charcoal, calcium sulfate, calcium chloride, a molecular sieves, a zeolite, a deliquescent material, zinc chloride, calcium chloride, potassium hydroxide, sodium hydroxide and a deliquescent salt; the power system may include a mixture of a conductor, hydroscopic materials, and $H_2O$ wherein the ranges of relative molar amounts of (metal), (hydroscopic material), ($H_2O$) are at least one of about (0.000001 to 100000), (0.000001 to 100000), (0.000001 to 100000); (0.00001 to 10000), (0.00001 to 10000), (0.00001 to 10000); (0.0001 to 1000), (0.0001 to 1000), (0.0001 to 1000); (0.001 to 100), (0.001 to 100), (0.001 to 100); (0.01 to 100), (0.01 to 100), (0.01 to 100); (0.1 to 10), (0.1 to 10), (0.1 to 10); and (0.5 to 1), (0.5 to 1), (0.5 to 1); the metal having a thermodynamically unfavorable reaction with $H_2O$ may be at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In; the reactants may be regenerated by addition of $H_2O$; the reactants may comprise a mixture of a metal, its metal oxide, and $H_2O$ wherein the metal oxide is capable of $H_2$ reduction at a temperature less than 1000° C.; the reactants may comprise a mixture of an oxide that is not easily reduced with $H_2$ and mild heat, a metal having an oxide capable of being reduced to the metal with $H_2$ at a temperature less than 1000° C., and $H_2O$; the metal may have an oxide capable of being reduced to the metal with $H_2$ at a temperature less than 1000° C. is at least one of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In; the metal oxide that may not easily be reduced with $H_2$, and mild heat comprises at least one of alumina, an alkaline earth oxide, and a rare earth oxide; the solid fuel may comprise carbon or activated carbon and $H_2O$ wherein the mixture is regenerated by rehydration comprising addition of $H_2O$; and the reactants may comprise at least one of a slurry, solution, emulsion, composite, and a compound; the $H_2O$ mole % content may be in the range of at least one of about 0.000001% to 100%, 0.00001% to 100%, 0.0001% to 100%, 0.001% to 100%, 0.01% to 100%, 0.1% to 100%, 1% to 100%, 10% to 100%, 0.1% to 50%, 1% to 25%, and 1% to 10%; the current of the source of electrical power may deliver a short burst of high-current electrical energy is sufficient enough to cause the hydrino reactants to undergo the reaction to form hydrinos at a very high rate. In some embodiments of the present disclosure, the power system may include one or more of the following: the source of electrical power may deliver a short burst of high-current electrical energy comprises at least one of a voltage selected to cause a high AC, DC, or an AC-DC mixture of current that is in the range of at least one of 100 A to 1,000,000 A, 1 kA to 100,000 A, 10 kA to 50 kA, a DC or peak AC current density in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$, the voltage is determined by the conductivity of the solid fuel or energetic material wherein the voltage is given by the desired current times the resistance of the solid fuel or energetic material sample, the DC or peak AC voltage may be in at least one range chosen from about 0.1 V to 500 kV, 0.1 V to 100 kV, and 1 V to 50 kV, and the AC frequency may be in the range of about 0.1 Hz to 10 GHz, 1 Hz to 1 MHz, 10 Hz to 100 kHz, and 100 Hz to 10 kHz; the resistance of the solid fuel or energetic material sample may be in at least one range chosen from about 0.001 milliohm to 100 Mohm, 0.1 ohm to 1 Mohm, and 10 ohm to 1 kohm, and the conductivity of a suitable load per electrode area active to form hydrinos may be in at least one range chosen from about $10^{-10}$ ohm$^{-1}$ cm$^{-2}$ to $10^6$ ohm$^{-1}$ cm$^{-2}$, $10^{-5}$ ohm$^{-1}$ cm$^{-2}$ to $10^6$ ohm$^{-1}$ cm$^{-2}$, $10^{-4}$ ohm$^{-1}$ cm$^{-2}$ to $10^5$ ohm$^{-1}$ cm$^{-2}$, $10^{-3}$ ohm$^{-1}$ cm$^{-2}$ to $10^4$ ohm$^{-1}$ cm$^{-2}$, $10^{-2}$ ohm$^{-1}$ cm$^{-2}$ to $10^3$ ohm$^{-1}$ cm$^{-2}$, $10^{-1}$ ohm$^{-1}$ cm$^{-2}$ to $10^2$ ohm$^{-1}$ cm$^{-2}$, and 1 ohm$^{-1}$ cm$^{-2}$ to 10 ohm$^{-1}$ cm$^{-2}$; the regeneration system may comprise at least one of a hydration, thermal, chemical, and electrochemical system; the photovoltaic power converter may include a photon-to-electric power converter; the power system may include a light distribution system or a concentrated photovoltaic device; the photovoltaic power converter may include a photon-to-thermal power converter; the power system may include a thermal-to-electric power converter, a concentrated solar power device, a tracker, or an energy storage device; the power system may be operably connected to a power grid; the power system may be a stand-alone system; the photovoltaic power converter may include a plurality of multi junction photovoltaic cells; the multi junction photovoltaic cells may be triple-junction photovoltaic cells; he photovoltaic power converter may be located within a vacuum cell; the photovoltaic power converter may include at least one of an antireflection coating, an optical impedance matching coating, or a protective coating; the photovoltaic power converter may be operably coupled to a cleaning system configured to clean at least a portion of the photovoltaic power converter; the power system may include an optical filter; the photovoltaic power converter may comprise at least one of a monocrystalline cell, a polycrystalline cell, an amorphous cell, a string/ribbon silicon cell, a multi junction cell, a homojunction cell, a heterojunction cell, a p-i-n device, a thin-film cell, a dye-sensitized cell, and an organic photovoltaic cell; the photovoltaic power converter may comprise at multi junction cell, wherein the multi junction cell comprises at least one of an inverted cell, an upright cell, a lattice-mismatched cell, a lattice-matched cell, and a cell comprising Group III-V semiconductor materials; the power system may include an output power conditioner operably coupled to the photovoltaic power converter and an output power terminal operably coupled to the output power conditioner; the power system may include an inverter or an energy storage device; a portion of power output from the output power terminal may be directed to the energy storage device or to a component of the power generation system or to the plurality of electrodes or to an external load or to a power grid.

In an embodiment, the CIHT cell comprises a hydrino-forming plasma cell called a hydrino plasma cell wherein at least a portion of the optic power is converted to electricity by a photovoltaic converter. The high current may be DC, AC, or combinations thereof. The plasma gas may comprise at least one of a source of H and a source of HOH catalyst such as $H_2O$. Additional suitable plasma gases are a mixture of at least one of $H_2O$, a source of H, $H_2$, a source of oxygen, $O_2$, and an inert gas such as a noble gas. The gas pressure may be in the range of at least one of about 0.001 Torr to 100 atm, 1 Torr to 50 atm, and 100 Torr to 10 atm. The voltage may be high such as in the range of at least one of about 50 V to 100 kV, 1 kV to 50 kV, and 1 kV to 30 kV. The current may be in the range of at least one of about 0.1 mA to 100 A, 1 mA to 50 A, and 1 mA to 10A. The plasma may comprise arcs that have much higher current such as ones in the range of at least one of about 1 A to 100 kA, 100 A to 50 kA, and 1 kA to 20 kA. In an embodiment, the high current accelerates the hydrino reaction rate. In an embodiment, the voltage and current are AC. The driving frequency may be an audio frequency such as in the range of 3 kHz to 15 kHz. In an embodiment, the frequency is in the range of at least one of about 0.1 Hz to 100 GHz, 100 Hz to 10 GHz, 1 kHz to 10 GHz, 1 MHz to 1 GHz, and 10 MHz to 1 GHz. The conductor of at least one electrode exposed to the plasma gas may provide electron thermionic and field emission to support the arc plasma.

In an embodiment, the cell comprises a high voltage power source that is applied to achieve a breakdown in a plasma gas comprising a source of H and a source of HOH catalyst. The plasma gas may comprise at least one of water vapor, hydrogen, a source of oxygen, and an inert gas such as a noble as such as argon. The high voltage power may comprise direct current (DC), alternating current (AC), and mixtures thereof. The breakdown in the plasma gas causes the conductivity to significantly increase. The power source is capable of high current. A high current at a lower voltage than the breakdown voltage is applied to cause the catalysis of H to hydrino by HOH catalyst to occur at a high rate. The high current may comprise direct current (DC), alternating current (AC), and mixtures thereof.

An embodiment, of a high current plasma cell comprises a plasma gas capable of forming HOH catalyst and H. The plasma gas comprises a source of HOH and a source of H such as $H_2O$ and $H_2$ gases. The plasma gas may further comprise additional gases that permit, enhance, or maintain the HOH catalyst and H. Other suitable gases are noble gases. The cell comprises at least one of, at least one set of electrodes, at least one antennae, at least one RF coil, and at least one microwave cavity that may comprise an antenna and further comprising at least one breakdown power source such as one capable of producing a voltage or electron or ion energy sufficient to cause electrical breakdown of the plasma gas. The voltage maybe in the range of at least one of about 10 V to 100 kV, 100 V to 50 kV, and 1 kV to 20 kV. The plasma gas may initially be in a liquid state as well as be in a gaseous state. The plasma may be formed in a medium that is liquid $H_2O$ or comprises liquid $H_2O$. The gas pressure may be in the range of at least one of about 0.001 Torr to 100 atm, 0.01 Torr to 760 Torr, and 0.1 Torr to 100 Torr. The cell may comprise at least one secondary source of power that provides high current once breakdown is achieved. The high current may also be provided by the breakdown power source. Each of the power sources may be DC or AC. The frequency range of either may be in the range of at least one of about 0.1 Hz to 100 GHz, 100 Hz to 10 GHz, 1 kHz to 10 GHz, 1 MHz to 1 GHz, and 10 MHz to 1 GHz. The high current may be in the range of at least one of about 1 A to 100 kA, 10 A to 100 kA, 1000 A to 100 kA, 10 kA to 50 kA. The high discharge current density may be in the range of at least one of 0.1 $A/cm^2$ to 1,000,000 $A/cm^2$, 1 $A/cm^2$ to 1,000,000 $A/cm^2$, 10 $A/cm^2$ to 1,000,000 $A/cm^2$, 100 $A/cm^2$ to 1,000,000 $A/cm^2$, and 1 $kA/cm^2$ to 1,000,000 $A/cm^2$. In an embodiment, at least one of the breakdown and secondary high current power sources may be applied intermittently. The intermittent frequency may be in the range of at least one of about 0.001 Hz to 1 GHz, 0.01 Hz to 100 MHz, 0.1 Hz to 10 MHz, 1 Hz to 1 MHz, and 10 Hz to 100 kHz. The duty cycle may be in the range of at least one of about 0.001% to 99.9%, 1% to 99%, and 10% to 90%. In an embodiment, comprising an AC such as RF power source and a DC power source, the DC power source is isolated from the AC power source by at least one capacitor. In an embodiment, the source of H to form hydrinos such as at least one of $H_2$ and $H_2O$ is supplied to the cell at a rate that maintains a hydrino component to the output power that is gives a desired cell gain such as one wherein the hydrino power component exceeds the input electrical power.

In an embodiment, the plasma gas is replaced by liquid $H_2O$ that may be pure or comprise an aqueous salt solution such as brine. The solution may be incident with AC excitation such high frequency radiation such as RF or microwave excitation. The excited medium comprising $H_2O$ such as brine may be placed between a RF transmitter and receiver. The RF transmitter or antenna receives RF power from a RF generator capable of generating a RF signal of frequency and power capable of being absorbed by the medium comprising $H_2O$. The cell and excitation parameters may be one of those of the disclosure. In an embodiment, the RF frequency may be in the range of about 1 MHz to 20 MHz. The RF excitation source may further comprise a tuning circuit or matching network to match the impedance of the load to the transmitter. Metal particles may be suspended in the $H_2O$ or salt solution. The incident power may be high such as in the range of at least one of about 0.1 $W/cm^2$ to 100 $kW/cm^2$, 0.5 $W/cm^2$ to 10 $kW/cm^2$, and 0.5 $W/cm^2$ to 1 $kW/cm^2$ to cause arcs in the plasma due to interaction of the incident radiation with the metal particles. The size of the metal particles may be adjusted to optimize the arc formation. Suitable particle sizes are in the range of about 0.1 μm to 10 mm. The arcs carry high current that causes the hydrino reaction to occur with high kinetics. In another embodiment, the plasma gas comprises $H_2O$ such as $H_2O$ vapor, and the cell comprises metal objects that are also incident with high frequency radiation such as RF or microwave. The field concentration on sharp points on the metal objects causes arcs in the plasma gas comprising $H_2O$ with a great enhancement of the hydrino reaction rate.

In an embodiment, the high-current plasma comprises an arc. The arc plasma may have a distinguishing characteristic over glow discharge plasma. In the former case, the electron and ion temperatures may be similar, and in the latter case, the electron thermal energy may be much greater than the ion thermal energy. In an embodiment, the arc plasma cell comprises a pinch plasma. The plasma gas such as one comprising $H_2O$ is maintained at a pressure sufficient to form arc plasma. The pressure may be high such as in the range of about 100 Torr to 100 atm. In an embodiment, the breakdown and high current power supplies may be the same. The arc may be formed in high pressure $H_2O$ including liquid $H_2O$ by a power supply comprising a plurality of capacitors comprising a bank of capacitors capable of supplying high voltage such as a voltage in the range of about 1 kV to 50 kV and a high current such as one that may increase as the resistance and voltage decreases with arc formation and maintenance wherein the current may be in the range of about 0.1 mA to 100,000 A. The voltage may be increased by connecting the capacitors in series, and the capacitance may be increased by connecting the capacitors in parallel to achieve the desired high voltage and current. The capacitance may be sufficient to maintain the plasma for a long duration such as 0.1 s to greater than 24 hours. The power circuit may have additional elements to maintain the arc once formed such as a secondary high current power source. In an embodiment, the power supply comprises a plurality of banks of capacitors that may sequentially supply power to the arc wherein each discharged bank of capacitors may be recharged by a charging power source as a given charged bank of capacitors is discharged. The plurality of banks may be sufficient to maintain steady state arc plasma. In another embodiment, the power supply to provide at least one of plasma breakdown and high current to the arc plasma comprises at least one transformer. In an embodiment, the arc is established at a high DC repetition rate such as in the range of about 0.01 Hz to 1 MHz. In an embodiment, the role of the cathode and anode may reverse cyclically. The rate of the reversal may be low to maintain arc plasma. The cycle rate of the alternating current may be at least one of about 0 Hz to 1000 Hz, 0 Hz to 500 Hz, and 0 Hz to 100 Hz. The power supply may have a maximum current limit that maintains the hydrino reaction rate at a desired rate. In an embodiment, the high current is variable to control the hydrino-produced power to provide variable power output. The high current limit controlled by the power supply may be in the range of at least one of about 1 kA to 100 kA, 2 kA to 50 kA, and 10 kA to 30 kA. The arc plasma may have a negative resistance comprising a decreasing voltage behavior with increasing current. The plasma arc cell power circuit may comprise a form of positive impedance such as an electrical ballast to establish a stable current at a desired level. The electrodes may be in a desired geometry to provide and electric field between the two. Suitable geometries are at least one of a center cylindrical electrode and an outer concentric electrode, parallel-plate electrodes, and opposing pins or cylinders. The electrodes may provide at least one of electron thermionic and field emission at the cathode to support the arc plasma. High current densities such as ones as high as about $10^6$ A/cm$^2$ may be formed. The electrode may be comprised of at least one of a material that has a high melting point such as one from the group of a refractory metal such as W or Mo and carbon and a material that has a low reactivity with water such as one from the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In. In an embodiment, the electrodes may be movable. The electrodes may be placed in close or direct contact with each other and then mechanically separated to initiate and maintain the arc plasma. In this case, the breakdown voltage may be much less than the case wherein the electrodes are permanently separated with a fixed gap. The voltage applied to form the arc with movable or gap adjustable electrodes may be in the range of at least one of about 0.1 V to 20 kV, 1 V to 10 kV, and 10 V to 1 kV. The electrode separation may be adjusted to maintain a steady arc at a desire current or current density.

Figure 2B:
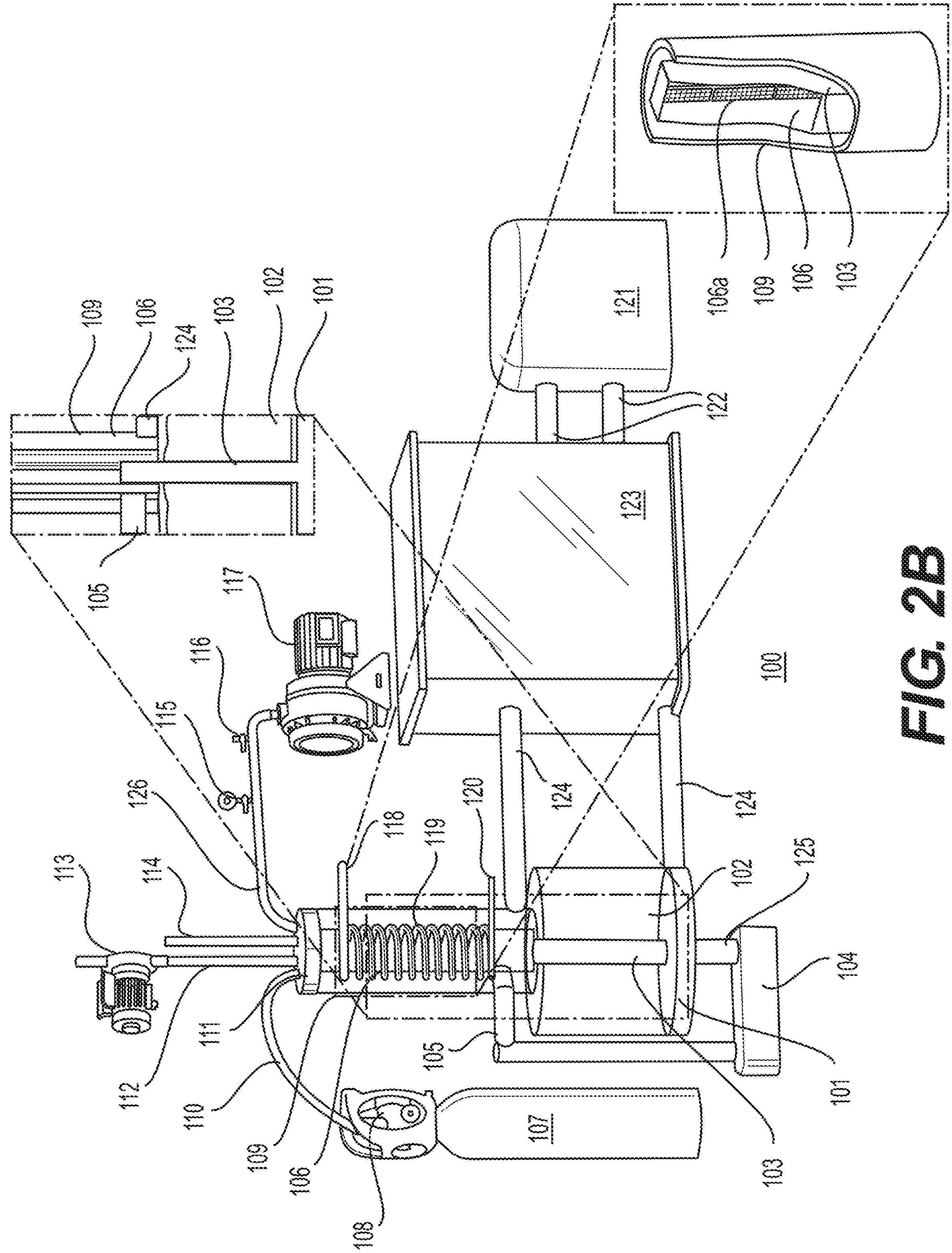
FIG. 2B is a schematic drawing of an arc $H_2O$ plasma cell power generator showing a photovoltaic converter in accordance with an embodiment of the present disclosure.

In an embodiment, the catalyst comprising at least one of OH, HOH, $O_2$, nO, and nH (n is an integer) is generated in a water-arc plasma. A schematic drawing of a $H_2O$ arc plasma cell power generator 100 is shown in FIG. 2B. The arc plasma cell 109 comprises two electrodes such as an outer cylindrical electrode 106 and a center axial electrode 103 such as a center rod that with a cell cap 111 and an insulator base 102 that can define an arc plasma chamber of cell 109 capable of at least one of a vacuum, atmospheric pressure, and a pressure greater than atmospheric. The cell 109 is supplied with an arc plasma gas or liquid such as $H_2O$. Alternatively, the electrodes 103 and 106 are immersed in the arc plasma gas or liquid such as $H_2O$ contained in a vessel 109. The $H_2O$ may be made more conductive to achieve arc breakdown at a lower voltage by the addition of a source of ions such as an ionic compound that may dissolve such as a salt. The salt may comprise a hydroxide or halide such as an alkali hydroxide or halide or others of the disclosure. The supply may be from a source such as a tank 107 having a valve 108 and a line 110 through which the gas or liquid flows into the cell 109, and exhaust gases flow out of the cell through outlet line 126 having at least one pressure gauge 115 and valve 116 where in a pump 117 removes gases from the cell 109 to maintain at least one of a desired flow and pressure. In an embodiment, the plasma gas is maintained at a high flow condition such as supersonic flow at high pressure such as atmospheric pressure and higher to provide adequate mass flow of the reactants to the hydrino reaction to produce hydrino-based power a desired level. A suitable exemplary flow rate achieves a hydrino-based power that exceeds the input power. Alternatively, liquid water may be in the cell 109 such as in the reservoir having the electrodes as the boundaries. The electrodes 103 and 106 are connected to a high voltage-high current power supply 123 through cell power connectors 124. The connection to the center electrode 103 may be through a base plate 101. In an embodiment, the power supply 123 may be supplied by another power supply such as a charging power supply 121 through connectors 122. The high voltage-high current power supply 123 may comprise a bank of capacitors that may be in series to provide high voltage and parallel to provide high capacitance and a high current, and the power supply 123 may comprise a plurality of such capacitor banks wherein each may be temporally discharged and charged to provide a power output that may approach a continuous output. The capacitor bank or banks may be charged by the charging power supply 121.

In an embodiment, an electrode such as 103 may be powered by an AC power source 123 that may be high frequency and may be high power such as that provided by an RF generator such as a Tesla coil. In another embodiment, the electrodes 103 comprises an antennae of a microwave plasma torch. The power and frequency may be one of the disclosure such as in the range of about 100 kHz to 100 MHz or 100 MHz to 10 GHz and 100 W to 500 kW per liter, respectively. In an embodiment, the cylindrical electrode may comprise only the cell wall and may be comprised of an insulator such as quartz, ceramic, or alumina. The cell cap 111 may further comprise an electrode such as a grounded or ungrounded electrode. The cell may be operated to form plasma arcs or streamers of the $H_2O$ that at least partially covers the electrode 103 inside of the arc plasma cell 109. The arcs or steamers greatly enhance the hydrino reaction rate.

In an embodiment, the arc plasma cell 109 is closed to confine the thermal energy release. The water inside of the then sealed cell is in the standard conditions of a liquid and gaseous mixture according to the $H_2O$ phase diagram for the desired operating temperature and pressure as known by those skilled in the art. The operating temperature may be in the range of about 25° C. to 1000° C. The operating pressure may be in the range of at least one of about 0.001 atm to 200 atm, 0.01 atm to 200 atm, and 0.1 atm to 100 atm. The cell 109 may comprise a boiler wherein at least one phase comprising heated water, super heated water, steam, and super heated steam flow out steam outlet 114 and supply a thermal or mechanical load such as a steam turbine to generate electricity. At least one the processes of cooling of the outlet flow and condensation of steam occurs with thermal power transfer to the load, and the cooled steam or water is returned to the cell through a return 112. Alternatively, makeup steam or water is returned. The system make be closed and may further comprise a pump 113 such as a $H_2O$ recirculation or return pump to circulate the $H_2O$ in its physical phase that serves as a coolant. The cell may further comprise a heat exchanger 119 that may be internal or on the external cell wall to remove the thermal energy into a coolant that enters cold at coolant inlet 118 and exists hot at coolant outlet 120. Thereafter, the hot coolant flows to a thermal load such as a pure thermal load or a thermal to mechanical power converter or a thermal to electrical power converter such as a steam or gas turbine or a heat engine such as a steam engine and optionally a generator. Further exemplary converters from thermal to mechanical or electrical power are Rankine or Brayton-cycle engines, Stirling engines, thermionic and thermoelectric converters and other systems known in the art. System and methods of thermal to at least one of mechanical and electrical conversion are also disclosed in Mills Prior Applications that are herein incorporated by reference in their entirety.

In an embodiment, the electrodes 103 and 106 such as carbon or metal electrodes such as tungsten or copper electrodes may be fed into the cell 109 as they erode due to the plasma. The electrodes may be replaced when sufficiently eroded or replaced continuously. The corrosion product may be collected from the cell in a form such as sediment and recycled into new electrodes. Thus, the arc plasma cell power generator further comprises an electrode corrosion product recovery system 105, an electrode regeneration system 104, and a regenerated electrode continuous feed 125. In an embodiment, at least one electrode prone to the majority of the corrosion such as the cathode such as the center electrode 103 may be regenerated by the systems and methods of the disclosure. For example, an electrode may comprise one metal chosen from Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, and In having a corresponding oxide that may be reduced by at least one of $H_2$ treatment, heating, and heating under vacuum. The regeneration system 104 may comprise a furnace to melt at least one of the oxide and metal and cast or extrude the electrode from the regenerated metal. The systems and methods for metal smelting and shaping or milling are well known to those skilled in the art. In another embodiment, the regeneration system 104 may comprise an electrolysis cell such as a molten salt electrolysis cell comprising metal ions wherein the electrode metal may be plated onto the electrode by electrodeposition using systems and methods that are well known in the art.

In an embodiment of the plasma cell such as the arc plasma cell 109 shown in FIG. 2B, the $H_2O$ arc plasma cell outputs high optical power, and the light is converted into electricity by a photovoltaic power converter. In an embodiment, the cell cap 111 comprises a photovoltaic power converter to receive the high optical power and convert it to electricity. In another embodiment, at least one of the electrodes 103 and 106 comprises a grid electrode that is at least partially transparent to light. The transparency may be due to gaps between conduction sections of the electrode. A photovoltaic converter is positioned behind the grid electrode to convert the optical power to electricity. In another embodiment, the electrodes 103 and 106 comprise parallel plates. The parallel plate electrodes may be confined in the cell 109 that may be sealed. The high optical power may be received by a photovoltaic converter **106*a*** that is transverse to the planes formed by the electrodes. The photovoltaic converter may comprise photovoltaic cells and may further comprise a window transparent to the optical power to protect the cells from damage from the pressure wave of the arc plasma. Other embodiments of electrodes and electrode configurations and designs that support at least one of a plasma and arc plasma such as a plasma comprising $H_2O$ and comprise at least one region for light penetration to a photovoltaic converter such as those known by one skilled in the art are within the scope of the present disclosure.

In an embodiment, the hydrino cell comprises a pinched plasma source to form hydrino continuum emission. The cell comprises and cathode, an anode, a power supply, and at least one of a source of hydrogen and a source of HOH catalyst to form a pinched plasma. The plasma system may comprise a dense plasma focus source such as those known in the art. The plasma current may be very high such as greater than 1 kA. The plasma may be arc plasma. The distinguishing features are that the plasma gas comprises at least one of H and HOH or H catalyst and the plasma conditions may be optimized to give hydrogen continuum emission. In an embodiment, the optical power is converted to electricity with photovoltaic converter **106*a* or 111**.

I. Photovoltaic Optical to Electric Power Converter

In an alternative plasma power converter 306 of the SF-CIHT cell power generator shown in FIG. 2A, the plasma produced by the ignition of the solid fuel 303 is highly ionized. The hydrino catalysis reaction such as that given by Eqs. (6-9) and (44-47) as well as the energy released in forming hydrinos results in the ionization of the fuel. The ions recombine with free electrons to emit light. Additional light is emitted by decaying excited-state atoms, ions, molecules, compounds, and materials. In an embodiment, the hydrino reaction releases soft X-ray continuum radiation that is converted to blackbody visible emission in an optically thick medium. The light is incident on the photovoltaic converter 306. The photovoltaic power converter 306 comprises a cathode **306*c* and an anode 306*b* that are each connected to the output power controller/conditioner 307 by cathode and anode output power connector 308*a* and 308, respectively. The light may be received by a photon-to-electric converter 306 such as photovoltaic tiling of the inside of the vacuum vessel 301. The photovoltaic power converter may be cooled by at least one heat exchanger 318 that receives cool coolant through the photovoltaic coolant inlet line 319 and reject hot coolant through photovoltaic coolant outlet line 320**. The disclosure regarding photovoltaic conversion of the optical power of the SF-CIHT cell to electricity given herein also applies to the arc and high-DC, AC, and DC-AC mixture current hydrino plasma cells having photovoltaic conversion of the optical power.

a. Solid Fuel Injection System

In an embodiment shown in FIG. 2A, the solid fuel is fed into the SF-CIHT generator by gravity. The fuel flow system may comprise a gravity flow system. The gravity flow may comprise a feeder mechanism such as at least one of an auger, rotating gear that may receive fuel into its teeth from the bottom of a chute at the bottom of the hopper 305, and a pair or gears or rollers **302*a* that may receive fuel into its teeth from the bottom of a chute at the bottom of the hopper 305. The solid fuel may be dispensed from a rolling drum reservoir that contains an Archimedes screw as commonly known in the art of cement mixers. In an alternative embodiment, the fuel 303 is injected into the electrodes 302 that cause the fuel to be ignited. The electrodes 302 may comprise at least one of rollers, gears, moveable elements such as pistons and other embodiments described in PCT Application No. PCT/US14/32584 entitled "PHOTOVOLATIC POWER GENERATION SYSTEMS AND METHODS REGARDING SAME" filed Apr. 1, 2014 herein incorporated by reference in its entirety. The roller 302*a* may have a length or width to radius ratio in at least one range of about 0.0001 to 100,0000, 0.001 to 10,000, and 0.01 to 1000. The length to radius ratio of the roller may be selected such that at least one of the light is not blocked from the photovoltaic converter, the plasma is permitted to expand such that light is emitted to the photovoltaic converter, the blast pressure is allowed to be dissipated by less resistance and confinement to expansion of the pressurized gas, density of fuel is below that which causes damage to the roller surface, the heat transfer is sufficient to prevent thermal damage, and the electrical conductivity is sufficient to avoid at least one of an unsatisfactory power loss and heating of the roller. The light collection system such as the mirrors and lenses of the optical distribution system of the disclosure may be matched to the electrode geometry and dimensions. The mirror may be parabolic for receiving light from a focal-like light source such as one comprising roller electrodes having a length or width to radius ratio of less than one. The mirror may be more paraboloidal or cylindrical for receiving light from a more extended light source such as one comprising roller electrodes having a length or width to radius ratio of greater than one. In an embodiment, the plasma may expand at the rate of at least one of greater than, less than, and equal to sound speed. In an embodiment, the injection system comprises a means to electrically charge the fuel and a means to electrically accelerate the fuel towards the electrodes 302. The means to charge the fuel may comprise a source of electrons such as a filament, coronal discharge, electron gun or other means known by those skilled in the art. The fuel may be charged at an injector hopper 305 or an injector at the based of the hopper 305. The electrodes 302 such as gears 302***a* or rollers may be oppositely charged such that the charged fuel is accelerated to the electrodes. The velocity of the fuel may be controlled by controlling at least one of the voltage differential between the charge of the fuel at the source such as hopper 305 or injector and the electrodes 302, the particle size of the fuel, the time the voltage differential is applied in the case that an intermittent voltage is applied, the pressure of the gas through which the fuel travels, and the size of the fuel particles. The velocity of the fuel may be controlled such that it overcomes any pressure from the detonation of a prior sample of fuel. In an embodiment, the energy and power of the ignited fuel is primarily radiation (optical power) and not pressure volume. In an embodiment, the over pressure due to the pressure wave from the fuel detonation is at least one of less than 100 PSIg, less than 50 PSIg, less than 10 PSIg, less than 5 PSIg, less than 2 PSIg, and less than 1 PSIg. In an embodiment, the ejector may utilize similar systems and methods as those used in electrostatic spray painting, particle delivery in photocopying, air pollutant removal in electrostatic precipitators and other such electrostatic technologies known to those skilled in the art.

In another embodiment, the fuel injection and fuel injector comprise a pneumatic injection. The fuel 303 may be injected by a carrier gas such as an inert gas such a noble gas such as argon. The fuel 303 may comprise a powder that is unloaded from the hopper 305 by a mechanical feeder such as a gear or auger. In exemplary embodiment, the hopper 305 has a tapered chute that has a rotating gear at the end of the chute wherein the gear meters out a controlled flow of fuel based on the size of the cavity formed by the teeth and bottom land and the rotation rate of the gear. The gas pressure may be controlled such that it overcomes any pressure from the detonation of a prior sample of fuel. The pressure may be greater than of any pressure from the detonation of a prior sample of fuel. In an exemplary embodiment, since blast pressure is less than about 3 PSIg, the solid fuel is injected with an argon jet stream at higher pressure. In an embodiment, the fuel 303 may be injected into the electrodes 302 by a combination of pneumatic and electrostatic injection by a corresponding system. The fuel 303 may be at least one of transported and directed to electrodes 302 by a carrier gas such as a noble gas such as argon of a pneumatic injection system and by an electric field of an electrostatic injection system. In another embodiment, the fuel 303 or product may be at least one of be transported and accelerated by a magnetic field by a magnetic field system. At least one of the fuel 303 or the product is magnetic or can be magnetized. In an embodiment, the carrier gas and particles such as those of the product may be separated by a magnetic field that deflects the particles and not the gas. In an embodiment, the fuel is injected by at least one of mechanical, pneumatic, electrostatic, and magnetic systems and methods. The injection system may comprise a feeder mechanism such as an auger or rotating gear that may receive fuel into its teeth from the bottom of a chute at the bottom of the hopper 305. The fed fuel may be injected by at least one of mechanical, pneumatic, electrostatic, and magnetic systems and methods.

The solid fuel may be injected to form a coating on the electrodes. The injection coating may be achieved by at least one of mechanical, pneumatic, and electrostatic systems and methods. The solid fuel may be in bulk such as a pile of ignition product that is rehydrated and is picked up by the at least one electrode and transported to a position to undergo ignition. The rehydrated fuel may be picked up as a coating that forms due to at least one of absorption, physisorption or physical adsorption, chemisorption, adhesion, suction, compression, thermal bonding, shrink bonding, electrostatic bonding wherein at least one of the fuel and at least one electrode may be electrostatically charged, and magnetically bonded wherein at least one of the fuel and at least one electrode may be at least one of magnetic and magnetized.

Figure 2D:
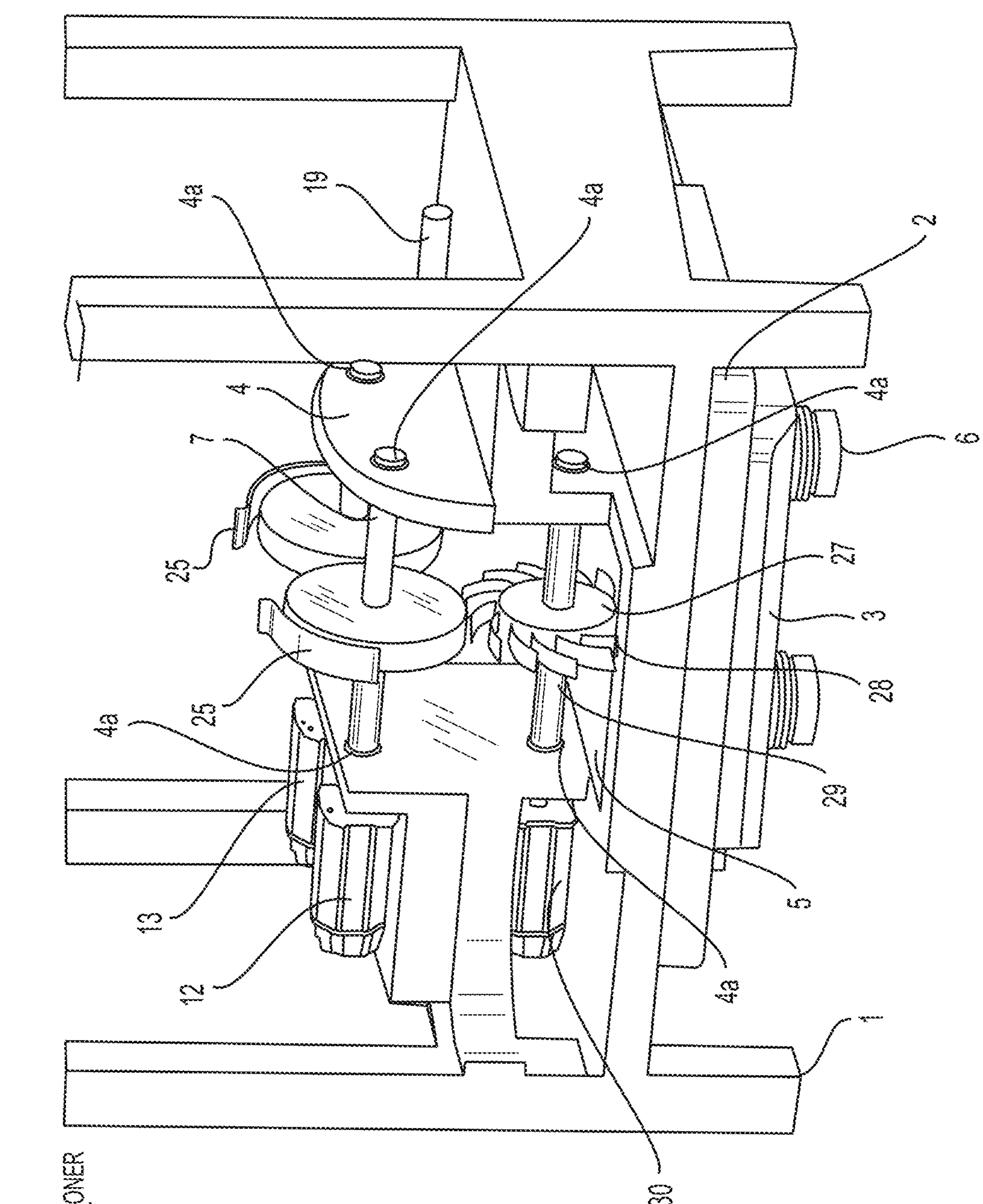
FIG. 2D is a schematic drawing of a SF-CIHT cell power generator showing the ignition system with an applicator wheel in accordance with an embodiment of the present disclosure.
Figure 2E:
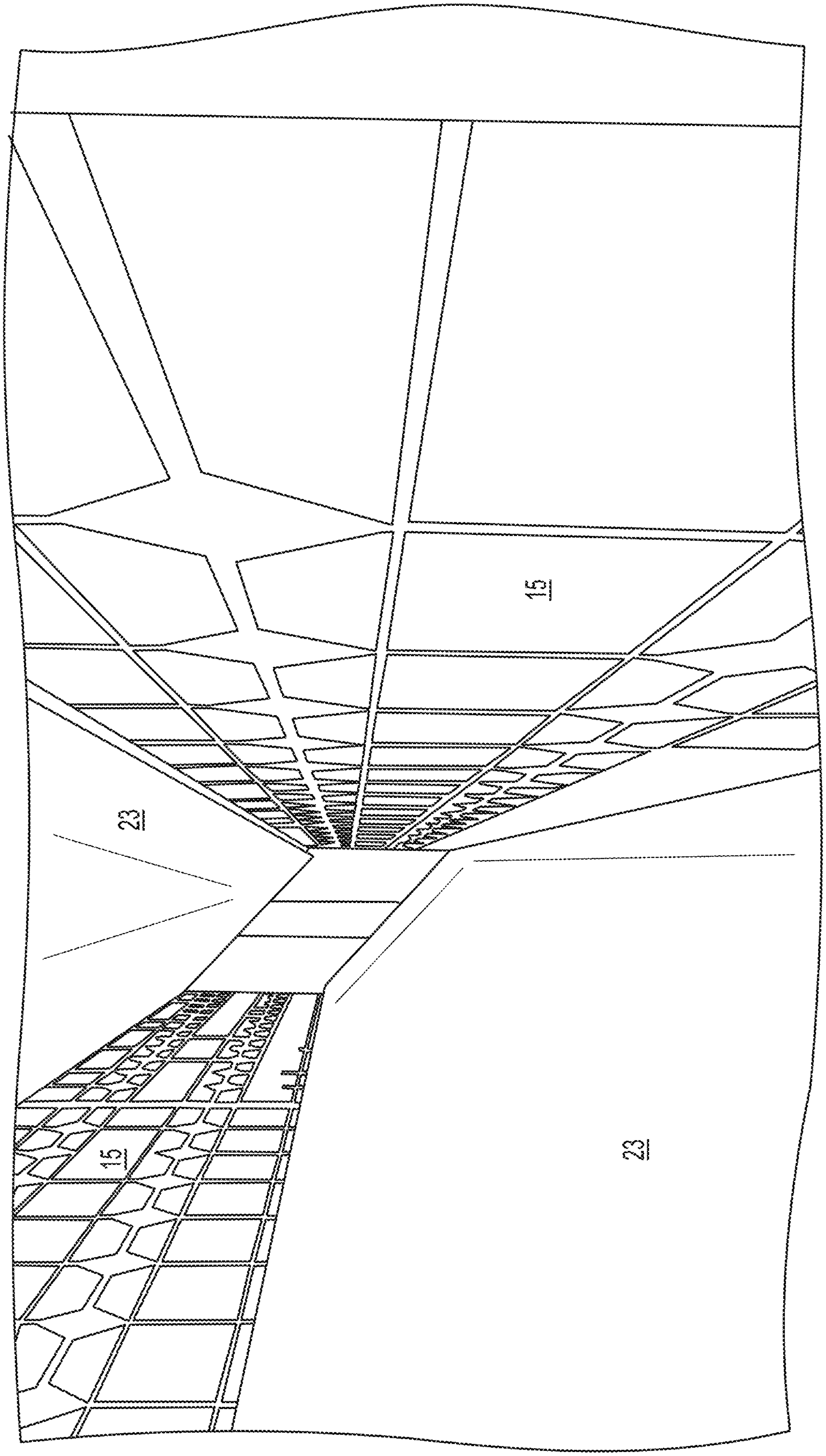
FIG. 2E is a schematic drawing of a SF-CIHT cell power generator showing a perspective inside of the optical distribution and photovoltaic converter system comprising semitransparent mirrors and photovoltaic cells in accordance with an embodiment of the present disclosure.
Figure 2F:
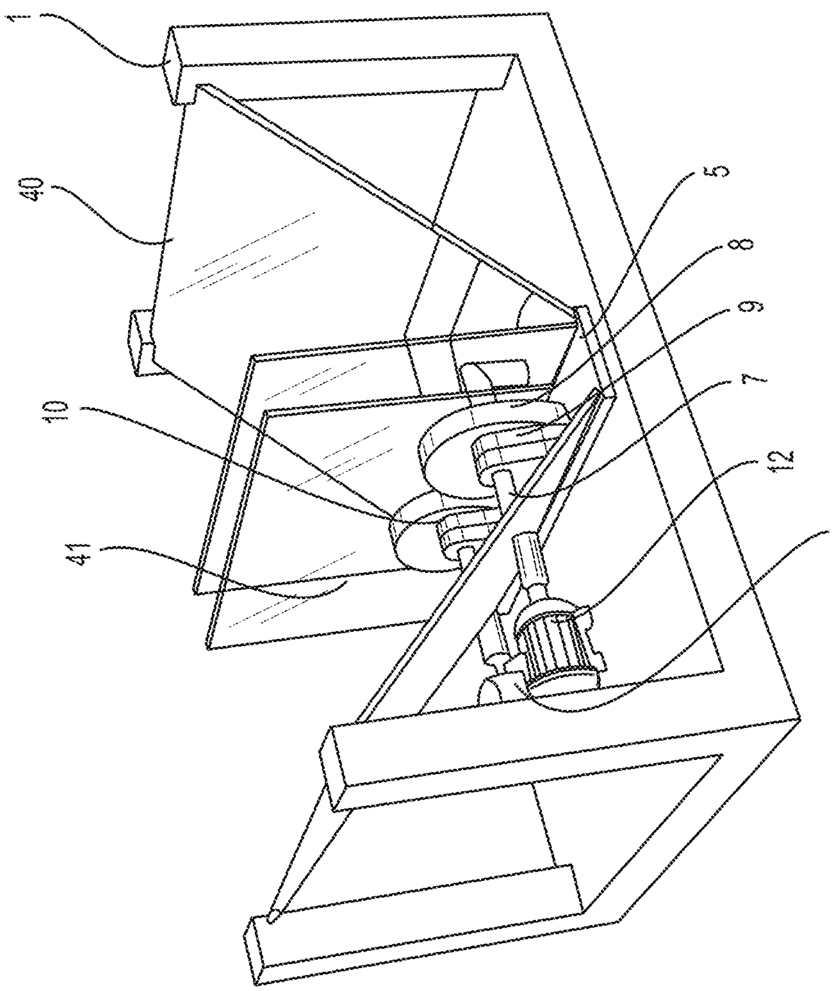
FIG. 2F is a schematic drawing of a SF-CIHT cell power generator showing the ignition system with mirrors in accordance with an embodiment of the present disclosure.

A schematic drawing of a SF-CIHT cell power generator comprising a solid fuel slurry trough 5 source of the solid fuel, an optical distribution and photovoltaic converter system 26*a* is shown in FIGS. 2C and 2C1, the ignition system further comprising an applicator wheel 27 is shown in FIG. 2D, and the inside of the optical distribution and photovoltaic converter system comprising semitransparent mirrors 23 and photovoltaic cells 15 are shown in FIG. 2E. The components of FIGS. 2C, 2C1, 2C2, and 2D may be equivalent to those of first embodiments shown in FIGS. 1 and 2A and may be organized into a different architecture. The system may further comprise new components that replace components that are absent in the first embodiments. Incorporating structure and function of like components of the first embodiments shown in FIG. 2A, the generator shown in FIGS. 2C, 2C1, 2C2, 2D, and 2E comprises the cell 26 supported by structural supports 1, the electrodes such as a pair of roller electrodes 8 mounted on shafts 7 that rotate on bearings 4*a* supported by bearing supports 4 and powered by motors 12 and 13, and electrical connections to each electrode such as the bus bars 9 and 10 that transmit power from the source of electrical power 2 that may receive power from the output power controller/conditioner 3. The solid fuel is lifted from the trough 5 and transported to the electrode 8 contact region where the high current causes it to ignite. The light is directed upward due to the trajectory of the fuel and the lower expansion resistance. Downward directed light is reflected upward by parabolic mirror 14. The optical power produced by the ignition of the solid passes through the window 20 and is incident on the optical distribution and PV conversion system 26*a* that comprises semitransparent mirrors 23 connected to supports by fasteners 22 wherein the mirrors 23 amongst each stack of mirrors in each column split the incident high intensity and direct the light to the corresponding PV panel 15 of the column to be converted to electricity that is carried on bus bars 26*b* to the output power controller/conditioner 3 and output power terminals 6. The ignition product is cleaned from the window 20 by a stream such as a gas stream from a rinsing line with water jets 21 supplied by a window wash line 16 having pressurized water flow due to ejection water pump 17 with water add back to that consumed in forming hydrinos supplied by water reservoir 11. The ignition product is rinsed to the collection area 24 that is shaped for the collection and also to scrap solid fuel from the rotating roller electrodes 8 as fuel is injected to the ignition. The collected fuel rinse is pumped through chute 25 by the rotating action of the rollers 8 and collected in the trough 5. The excess water is removed with water sucking pump 18 through water sucking line 19 wherein the trough 5 may be at least one of vibrated and agitated to facilitate the excess water recovery. The sucking pump 18 may comprise a hydrocyclone separator. The water is then pumped to the ejection water pump 17. The slurry consistency is adjusted to a desired viscosity. In an embodiment, the collected fuel rinse may be flowed down a chute comprising a screen such as a metal screen that has a pressure gradient across it. The higher pressure on the upper side of the slurry causes some of the water to separate from the slurry. The water may flow through the screen and be collected by a pump such as the sucking pump 18. The pressure gradient across the screen may be maintained by a gas pump. The gas pump may circulate the pumped gas through the gas jets that recover and facilitate recirculation of the ignition product. The slurry application to the roller electrodes 8 may be assisted with an applicator such as the applicator wheel 27 comprising applicator flaps 28 driven by applicator wheel motor 30 through applicator shaft 29. The roller electrodes may be groves in at least one of the transverse and longitudinal directions in order to better retain solid fuel on their surfaces.

In an embodiment, the injection is achieved by coating at least one electrode with solid fuel. The coating may be at least one of assisted and achieved by electrostatically charging the electrodes. The source of the fuel for coating may be a bulk collection or pile of fuel with which at least one electrode is in contact. In an embodiment, the electrodes comprise rollers that are in contact with bulk fuel such as at least one of a bulk reservoir, slurry bath, and paste bath. The rollers may be coated by turning through at least one of a fuel source such as the bulk reservoir, slurry bath, and paste bath. The fuel may adhere to at least one roller due to an electrostatic charge applied to at least one of the fuel and the rollers. The fuel may absorb onto the roller. The fuel may absorb $H_2O$ to form an absorbable state such as a paste or slurry that adheres to at least one roller. The thickness of the slurry or paste may be controlled using a blade that trowels the fuel layer onto the roller at a desired thickness. Referring to FIG. 2D, the paste may be applied to the electrode such as a roller electrode 8 by an applicator wheel 27 having flexible appendages such as circumferentially attached blades or paddles 28 attached at angle greater than 90° from the x-axis defined by the axis tangent to the wheel with the positive axis in the direction of rotation of the wheel. The blades or paddles may pick up fuel paste from a reservoir 5, come into contact with the roller electrode 8 by rotation, apply pressure as they each bend of deform, and perform a troweling action with further rotation. In an embodiment, the solid fuel is applied and set to a coating of a desired thickness using a doctor blade. The solid fuel may flow from a reservoir to be applied by the doctor blade. Alternatively, the fuel may be applied with a pump or auger from a reservoir wherein a doctor blade may assist or facilitate the application of a layer of a desired thickness. The coating may be applied using methods and systems of tape casting electrodes. In an embodiment, the electrode is coated with the solid fuel paste by a wire brush as the fuel applicator. The wire material, thickness of the wires, density of the wires, and springiness of the wires of the wire brush may be selected to achieve the desired pickup of the paste and application to the wheel electrode. In an embodiment, the coating may be applied using methods and systems of a paddle wheel or gear pump that injects fuel such as paste or slurry from a reservoir into the region of electrical contact of the pair of electrodes. The injection may be by centrifugal force of a rotating pump element. In an embodiment, solid fuel paste is applied to at least one roller electrode using another applicator wheel wherein the applicator wheel may be driven by the roller electrode by contract of the cylindrical surfaces. The electrodes may be coated with fuel paste by troweling it on or doctor blading it on from a reservoir.

In an embodiment a means to coat fuel onto a roller electrode comprises a continuous traveling slab fuel source that transported into contact with the roller electrode. The motion of the fuel slab may be achieved using an auger, a vibratory table, and a conveyor belt that may have spines to facilities application of the fuel onto the roller electrode. In an embodiment, the conveyor receives solid fuel from a reservoir. The conveyor may comprise at least a portion of the floor of the reservoir. The sides of the reservoir may be sloped to serve as chutes to the conveyor surface. The reservoir may have an adjustable height slot at the exit to control the depth of the solid fuel transported by the conveyor. The reservoir may be on adjustable legs with the conveyor at the bottom to receive fuel of a depth determined by the height of the legs. In an embodiment, the conveyor to serve as the solid fuel applicator may comprise a belt such as a drive belt or timing belt with mechanicals. The fuel may be applied by at least one of contact and pressing of the slab onto the roller surface. The tangential velocity of the slab may be made to be a close match to that of the roller electrode onto which fuel is applied. The relative speed may be adjusted to apply the fuel onto the moving electrode such as the rotating roller or gear electrode. The continuous traveling slab fuel source may be at least one of a tape cast from a fuel reservoir such as trough, or mechanically picked up from a reservoir by means such as at least one of the conveyor and auger. The thickness of the slab may be set by a depth blade such as a doctor blade at the exit of the fuel reservoir. In an embodiment, the conveyor to serve as the solid fuel applicator may comprise a belt such as a drive belt or timing belt with mechanicals. In an embodiment, the auger to transport the fuel such as a slurry comprises a progressive cavity pump, a type of positive displacement pump also known as a progressing cavity pump, eccentric screw pump or cavity pump.

In an embodiment, excess water is separated from the rehydrated solid fuel by the application of pressure on the excess-water-containing slurry (pre-slurry). The pressure may be applied by at least one of mechanically and pneumatically. The mechanical pressure may be applied by a piston pushing on the pre-slurry and by a vibrator such as at least one of a vibrating table, vessel, and transporter. The pneumatic pressure may be applied by pressurized gas in a sealed container containing the pre-slurry. In an embodiment, the cell may be operated under sufficient pressure such that the excess water separates from the pre-slurry to form the slurry. In an embodiment, the pre-slurry is transported to at least one cell that may be sealable, and the cell is pressurized with gas such as argon. The pressure of the gas may be controlled to achieve the desired water separation. In an embodiment, the temperature of at least one of the pre-slurry and the slurry may be controlled to control the solubility of a component of the solid fuel that is water soluble such as the water binding compound such as the alkaline earth or transition metal halide compound that forms a hydrate. At least one of the metal and the halide may be selected to achieve the desired solubility. In an exemplary embodiment of $MgCl_2$, fluoride may be selected for $MgX_2$ (X=halide) to decrease the solubility of the water-binding compound wherein the solubility of $MgX_2$ (X═F, Cl, Br) in moles/100 g $H_2O$ at 25° C. is 0.0002, 0.58, and 0.55, respectively. The excess water may be removed by pumping with a pump such as the sucking pump 18. The excess water separation may be achieved in a plurality of vessels that may be sealed. The separation may be in a batch process. The separation may be sequentially and in different phases of the separation process such that a continuous or periodic flow of slurry output is achieved. In another embodiment, the gas pressure is applied as the pre-slurry is transported or flowed such that a more continuous flow of slurry is produced. The slurry may be transported to the slurry trough 5. The transport may be achieved using at least one of chute under gravity or pneumatic flow, an auger, a conveyor, and a pump such as a progressing cavity pump.

In an embodiment, fuel may be coated on the electrodes such as at least one gear or roller. The fuel may be coated on at least one electrode by a fuel applicator. In another embodiment, the fuel may comprise slurry that can be mechanically pumped. The fuel may be pumped to coat the at least electrode such as at least one gear or roller electrode. Alternatively, the fuel may be pumped to inject the fuel into the electrodes just proximal to the point at which the fuel ignition occurs. The fuel may be transported by pumping it from a position where it is at least one of being collected and rehydrated such as at a first position at −90° to a second position such as at −180° wherein ignition occurs. In another embodiment, the fuel may be fed centrally to the electrode and extruded, flowed, pumped, or otherwise transported to the surface that makes electrical contact with the opposing electrode of a pair. The electrode may comprise a roller or gear, and the transport may be radial from a central input region. The flow may be by centrifugal force wherein the electrode such as a roller or gear may rotate.

In an embodiment shown in FIGS. 2C, 2C1, 2C2, 2D, and 2E, the ignition is auto-triggered by the presence of fuel that sufficiently reduces the resistance between the electrodes 8 to permit ignition. The fuel may be injected into the electrodes at a rate to achieve a desired rate of ignition. The photovoltaic converter 26*a* may serve as a source of low-voltage, high current DC power that is well suited for re-powering the electrodes 8 to cause ignition of subsequently supplied fuel. The power from the source of electrical power 2 supplying the electrodes 8 may be reflected back to the source of electrical power 2 when the fuel ignites to create a high relative resistance such as that of an open circuit. Referring to FIG. 2C1, the source of electrical power 2 may comprise a storage element such as a capacitor or battery 27 to receive and store the reflected power to be used for another ignition. The ignition system may further comprise a DC power supply with a DC regenerator 33.

The generator may be started by a start-up battery 27 of FIG. 2C1 and a starter circuit 28. As an alternative to a battery, the initial startup energy may be supplied by a capacitor such as one of output power controller/conditioner 3. The capacitor may comprise a supercapacitor and may have a frequency response compatible with the desired ignition frequency. The ignition frequency may be in the range of at least one of 1 Hz to 10 MHz, 10 Hz to 1 MHz, 100 Hz to 100 kHz, and 1 kHz to 10 kHz. The internal loads such a motors and pumps may be powered by the startup power source initially. Following startup, the ignition and internal power loads may be powered by the photovoltaic converter 26*a*. The voltage output by the photovoltaic converter 26*a* to at least one internal and external loads may be high to reduce resistive losses. The DC power may be fed into at least one variable frequency drive 36 to provide the proper input power to an internal load such as at least one motor or pump. The PV output may be directed to at least one servo drive to power at least one servo motor such as the roller motors 11 and 12 and the piezoelectric actuator of the disclosure to control the ignition. The DC PV output may be conditioned with at least one of a DC/DC, AC/DC, and DC/AC converter. The output power to internal and external loads may be AC converted from the DC output of the PV converter 26*a* by a DC/AC power inverter 35. The DC power to be converted may be stored in DC power storage 34.

The start-up battery or capacitor (e.g. 27 or part of 3) and the source of electrical power 2 may be recharged by the photovoltaic converter 26*a* or may comprise the photovoltaic converter 26*a*. The range of the peak power of at least one of the start-up battery or capacitor and the source of electrical power 2 may be in the range given by product of the voltage and current ranges. The voltage may be in the range of about 4 V to 20 V, and the current may be in the range of about 5000 A to 30,000 A. The peak power may be in the range of about 20 kW to 600 kW. The time average power may be given by the energy required to ignite the fuel times the ignition frequency. The average energy to ignite the fuel may be in the range of about 1 J to 500 J, and the ignition frequency may be in the range of about 1 Hz to 100 kHz. The time average power may be in the range of about 1 W to 50 MW. The duty cycle may be given by the ratio of the time average power to the peak power. The duration of the ignition input power flow may be given by the energy to achieve ignition divided by the peak power. Some operating parameters are given in TABLE 7.

TABLE 7

| Operating Specifications. | |
|---|---|
| Fuel Composition | Ti, Cu, Ni, Co, Ag or Ag-Cu alloy + $ZnCl_2$ hydrate, $BaI_2$ $2H_2O$, $MgCl_2$ $6H_2O$ powder |
| Load applied to the fuel | 180-200 lb total pressure per 7 mm diameter, adjustable +/− 30% |
| Cycle frequency | 2000 Hz adjustable to control power output |
| Mass Flow | Aliquot mass × ignition frequency = 200 mg × 2000 Hz = 400 g/s |
| Optical Power | Energy/aliquot × ignition frequency = 1000 J × 2000 Hz = 2 MW optical |
| Spectrum | 3500 to 5500K blackbody depending on fuel composition and ignition parameters |
| Ignition current | 10,000 A to 30,000 A |
| Ignition voltage | 4.5 V-15 V |
| System Peak Input Power | 45 kW to 450 kW |
| System Time Average | Power Ignition input energy × ignition frequency = 5 J × 2000 Hz = 10 kW |
| System output power | 0.25 to 10 MW |
| Power Source Duty Cycle | System time average power/system peak input power = 10 kW/180 kW = 5.6% |
| Pulse Time | Ignition energy/system peak input power = 5 J/180,000 = 28 μs |
| Fuel mass | (Match with power requirements) 200 mg per 1000 J multiply each by frequency such as 2000 Hz to get power and mass flow rate |

TABLE 7-continued

| Operating Specifications. | |
| --- | --- |
| Reaction product analysis | Perform online analysis/monitoring such as IR for fuel water content |
| Operating temperature | <600° C. at electrodes<br><100° C. at electrodes with slurry |
| Operating pressure | Expected range <2 PSIg |
| Radiation | Emission from plasma blackbody at 3500 to 5500K depending on the fuel |

The switching may be performed electronically by means such as at least one of an insulated gate bipolar transistor (IGBT), a silicon controlled rectifier (SCR), and at least one metal oxide semiconductor field effect transistor (MOSFET). Alternatively, ignition may be switched mechanically. The fuel may trigger the switching wherein the conductivity between the electrodes falls as the fuel accumulates such that the high current flows to cause ignition. The switching may be controlled with a microcontroller. The microcontroller may control the frequency, duty cycle, voltage, current, power, pulse peak power, pulse duration, as well as the fuel injection/delivery, fuel recovery, fuel regeneration, power conditioning, power output, cooling, and performance of the plasma to electric converter.

In an embodiment, the fuel may comprise a powder. The fuel may comprise a highly electrically conductive matrix such as a metal powder and $H_2O$. The fuel may further comprise a material that binds $H_2O$ such as a hydroscopic compound. Exemplary hydroscopic compounds are oxides such as a transition metal oxide and a halide such as an alkaline earth halide such as $MgCl_2$. The solid fuel may comprise combinations with low melting point metals such as Zn, Sn, and In and Ti and Ti alloys such as TiAl, TiFe, TiV, TiMo, TiC, molybdenum-titanium-zirconium (TZM) alloy, and TiN and $H_2O$ and a source of $H_2O$. In an embodiment, Ag, Cu, and noble metals as the conductor of the solid fuel have a low enough resistance despite air exposure of the metal to support a low voltage such as in the range 4 to 15 V, and high current such as in the range of about 5,000 A to 35,000 A to cause ignition.

In an embodiment, the $H_2O$-base solid fuel comprises a component that changes the surface tension of the mixture. The component may comprise a water-binding compound such as a metal halide or oxide such as an alkaline earth halide or oxide such as $MgX_2$ (X=F, Cl, Br, I). The change in surface tension may facilitate better adhesion of the mixture to the rollers of the ignition system.

Suitable exemplary $H_2O$-based solid fuels are those from the group of Ti+$H_2O$ in a metal encasement such as a pan such as an aluminum DSC pan such (75 mg) (aluminum crucible 30 μl, D: 6.7 mm×3 mm (Setaram, S08/HBB37408) and aluminum cover D: 6.7 mm, stamped, tight (Setaram, S08/HBB37409)), Cu+$H_2O$ in the DSC pan, Cu+CuO+$H_2O$ in the DSC pan, Ag+$MgCl_2$.6H2O in the DSC pan, Ag+$NH_4NO_3$+$H_2O$, $NH_4NO_3$+$H_2O$+Al in the DSC pan, $NH_4NO_3$ in the DSC pan, $NH_4NO_3$+ fuel oil, $NH_4NO_3$+fuel oil+Al, and Ti+Al+$ZnCl_2$+$H_2O$. The reaction mixture may further comprise at least one of an oxide such as a metal oxide, a hydroxide such as a metal hydroxide, and a compound such as an ionic compound comprising an oxyanion such as borate, metaborate, molybdate, tungstate, stanate, phosphate, and sulfate. The at least one of an oxide, hydroxide, and compound comprising oxygen may comprise a hydrate or comprise waters of hydration. The fuel may comprise M+M'$X_2$+$H_2O$ content+/−hydrocarbon (M=transition metal, Ag; M'=alkaline earth metal, Zn; X=halogen). The metal may be non-reactive or have a positive to slightly negative free energy for the oxidation reaction with $H_2O$. Exemplary metals are Ni, Cu, Ag, Mo, Co, and Sn. The metal may comprise at least one alloy such as one of at least two metals from the group of Ni, Cu, Ag, Mo, Co, Sn, and noble metals. An exemplary alloy is AgCu. The fuel may comprise a powder. Suitable exemplary hydrocarbon-based solid fuels are those from the group of paraffin wax in the DSC pan and synthetic oil 10W40 in the DSC pan. The reaction mixture may be operated under vacuum, ambient pressure, or a pressure greater than atmospheric. In an embodiment, the electrodes may be coated with a layer of a metal that protects them from melting and denotation damage. The coating may comprise a metal of the solid fuel such as Ti. The metal may be protective since it has at least one of a higher melting point and is harder. The coating may be thin such that the electrical resistance is low. The metal may be the same as that of the electrodes such a Cu metal and Cu electrodes.

In an embodiment a material such as a compound is added to the solid fuel to facilitate at least one of the directional electrostatic injection of the solid fuel into the electrodes, the repelling of the blast products from the optical distribution system, and at least one of the collection of the blast products and the transport of the blast products to the regeneration system.

In an embodiment, $H_2O$ is injected into at least one of the plasma-forming region and onto the electrodes. The electrodes may comprise a roughened surface such as one having adhered metal power. The roughened electrodes may cause the injected water to adhere to facilitate the $H_2O$ to be transported into the ignition region, and to ignite. The roughed surface may be formed by coating the wheel with metal powder and allowing the heat of the ignition to fuse or bond the metal to the electrode such as a wheel electrode. The water may be injected using the water recirculator system of the current disclosure. An exemplary $H_2O$ recirculatory system shown in FIG. 2C comprises trough 5, water sucking line 19, water sucking pump 18, ejection pump 17, jet water line 16, rinsing line with jets 21, scraper and collection area 24, and chute 25.

Suitable exemplary $H_2O$-based solid fuels comprise a highly conductive matrix such as a metal such as a metal powder and at least one of $H_2O$, a compound that binds $H_2O$, an oxide, a hydroxide, a halide, and a hydrate such as a metal hydrate. The metal power may comprise at least one of a transition metal, inner transition metal, Ag, Al, and other metals of the disclosure. The metal may be applied as part of a solid fuel of the disclosure. The metal may comprise an encasement of a solid fuel pellet. The metal may comprise a hydrogen dissociator such as Ni, Ti, and a noble metal. The fuel may comprise M+M'$X_2$+$H_2O$ content+/−hydrocarbon (M=transition metal, Sn, Ag; M'=alkaline earth metal, transition metal, Ni, Zn; X=halogen). Exemplary solid fuels are Ti, Ag, Ni, or Sn+at least one of $MgCl_2$ and $ZnCl_2$+$H_2O$, $MgCl_2$ $6H_2O$, $ZnCl_2$ $6H_2O$ and Ni+$NiCl_2$ $6H_2O$. In an embodiment, the $H_2O$ of the fuel may be added by steam treatment of the solid fuel. In an embodiment, the solid fuel comprises a hydroxide having a reversible oxide to hydroxide reaction with addition of $H_2O$. Suitable oxides are $Al_2O_3$, an alkaline earth oxide such as MgO and a transition metal oxide such as NiO. In an embodiment, the solid fuel comprising a hydroxide further comprises a halide such as an alkaline earth halide such as $MgCl_2$ or a transition metal halide such as $NiCl_2$ or $ZnCl_2$ to allow for halide-hydroxide exchange such as that given by Eqs. (185-186) to form H and then hydrinos.

In an embodiment, the solid fuel comprises a conductive matrix and at least one of $H_2O$ and a $H_2O$ binding compound such as those of the disclosure and $H_2O$. In an embodiment, the conductive matrix comprises at least one of graphene and a superconductor.

In an embodiment, the $H_2O$-based solid fuel may comprise a metal that may react with $H_2O$ to form an oxide and $H_2$. At least one of the metal oxide may be prevented from forming and the metal oxide that forms may be reduced to metal and $H_2O$ by application of hydrogen. The ignition may be run under a hydrogen atmosphere. The plasma formed by the ignition may form atomic hydrogen. The atomic hydrogen may be much more reactive than $H_2$ for at least one of suppressing formation of metal oxide and reducing any formed metal oxide. The cell atmosphere may comprise hydrogen and an inert gas such as a noble gas such as argon. The cell atmosphere may be any desired pressure such as in at least one range of about 0.1 Torr to 100 atm, 10 Torr to 50 atm, and 1 atm to 10 atm. The $H_2$ may be in any desired mole ratio such as in at least one range of about 0.1% to 99%, 1% to 75%, and 10% to 50%. In an exemplary embodiment, the $H_2O$-based solid fuel may comprise Ti+$MgCl_2$+$H_2O$ run under a cell atmosphere of $H_2$ and argon. The ignition plasma may form H atoms that prevent formation of titanium oxide and react with titanium oxide to form Ti and $H_2O$. In an embodiment, the high current of the disclosure such as in the range of about 100 A to 1 MA maintains the plasma that maintains the reducing atomic hydrogen. In an embodiment, the oxidation of titanium is limited to the $2^+$ state such as in the case of TiO by the atomic hydrogen that may be maintained by the plasma. Additional examples of fuels run under $H_2$ and optionally a noble gas such as krypton to prevent metal oxidation are Al+$MgCl_2$+$H_2O$, Al+Ti+$MgCl_2$+$H_2O$, at least one of a transition metal such as Fe or Ti and Al+a hydroscopic compound such as one of the disclosure such as a alkaline earth halides such as $MgX_2$ or $CaX_2$ (X=F, Cl, Br, I).

In an embodiment, the generator may further comprise a separate plasma chamber to reduce metal oxide to metal such as a hydrogen gas reduction chamber and a hydrogen plasma chamber wherein the metal oxide is formed by oxidation of the $H_2O$-based solid fuel.

In another embodiment, the formation of a metal oxide of at least one metal of the $H_2O$-based solid fuel is suppressed and the metal oxide is reduced to the metal by reaction with carbon. Metal oxide formation may be prevented and reversed by carbo-reduction. The carbon may comprise graphitic or activated carbon. In an exemplary embodiment, the $H_2O$-based solid fuel may comprise Ti+$MgCl_2$+$H_2O$ wherein any titanium oxide formation is suppressed and any titanium oxide formation is reduced to Ti by reaction with carbon. In an embodiment, the stabilization of at least one metal of the $H_2O$-based solid fuel may be protected or stabilized against oxidation by at least one of H reduction and carbo-reduction. The at least one of protection and stabilization may be achieved by addition of a hydrocarbon such as gasoline, diesel fuel, wax, kerosene, and oil. The hydrocarbon may serve as a source of carbon for carbo-reduction and the hydrocarbon may serve as a source of hydrogen for H reduction. In an embodiment, TiO is a conductive and is formed from at least one of the H and carbo-reduction of a higher oxide of Ti. The TiO may comprise a protective layer against further oxidation. In an embodiment, the solid fuel may further comprise a conductive oxide such as TiO, ZnO, SnO, cobalt oxide, and $LiCoO_2$. In another embodiment, the $H_2O$-based solid fuel comprises a metal such as Ti or Al that is coated with a conductive coating such as at least one of titanium oxide (TiO), titanium nitride (TiN), titanium carbon nitride (TiCN), titanium carbide (TiC), titanium aluminum nitride (TiAlN), and titanium aluminum carbon nitride. In an embodiment, the coating protects the conductive matrix material from oxidizing by reacting with at least one of oxygen and water. In other embodiment, the conductive matrix of the $H_2O$-based solid fuel comprises a conductive compound such as at least one of titanium oxide (TiO), titanium nitride (TiN), titanium carbon nitride (TiCN), titanium carbide (TiC), titanium aluminum nitride (TiAlN), and titanium aluminum carbon nitride. In an embodiment, the compound is at least one of resistive and unreactive towards being oxidized by reacting with at least one of oxygen and water. Additional such coatings or compounds comprises indium tin oxide such as a mixture of $In_2O_3$ and $SnO_2$ or aluminum, gallium, or indium-doped zinc oxide.

In an embodiment, the metal of the $H_2O$-based solid fuel is an alloy. The oxide of the alloy may be easier to undergo reduction such as H reduction or carbo-reduction than that of a single metal of the alloy. The alloy may comprise Ti such as at least one of Pt-noble metal, Ti—Pt, Ti-other transition metal, TiCu, and Ti—Ni. The alloy may comprise at least two elements capable of a $H_2O$-metal reaction to assist in the production of H hydrino reactant such as TiAl alloy and molybdenum-titanium-zirconium (TZM) alloy. Both Ti and Al may be protected from oxidation by the presence of hydrogen in the ignition plasma as given in the disclosure.

The carbo-reduction product may comprise CO and $CO_2$. The carbon consumed to form product may be replaced in the cell such as in the $H_2O$-based solid fuel. The product may be trapped and removed from the cell. CO and $CO_2$ may be removed with a scavenger, scrubber, or getter. CO and $CO_2$ may be removed with a reversible chemical reaction. In an embodiment, the cell comprises a carbon dioxide scrubber, a device that absorbs carbon dioxide ($CO_2$), to remove the $CO_2$ formed during carbo-reduction. The scrubber may comprise systems and methods known to those skilled in the art such as at least one of amine scrubbing, minerals and zeolites such as sodium hydroxide or lithium hydroxide, a regenerative carbon dioxide removal system, and activated carbon. The scrubber reaction may be reversible such as at high temperature. The thermally reversible scrubber reaction may comprise an amine such as monoethanol amine that reversibly binds $CO_2$, an oxide regarding a carbonate looping, or a hydroxide regarding causticization. An alternative to a thermo-chemical process is an electrical one in which a nominal voltage is applied across the carbonate solution to release the $CO_2$.

In an embodiment, the applied voltage of the high current exceeds the corresponding threshold energy for breaking the O—H bond of $H_2O$. The bond breakage may provide a source of H atoms to form hydrinos. The energy may be in at least one range of about 2 V to 10 V, 3 V to 8 V, 4 V to 6 V, and 4 V to 5 V. The high current may be in the range of about 5,000 A to 35,000 A. In another embodiment, the $H_2O$ may react with a metal such as Mg, Al, and Ti to form the corresponding oxide and hydrogen. In an embodiment, an additional source of power is applied to the ignition plasma to form atomic hydrogen from a source such as $H_2O$. The additional power may be at least one of microwave, RF, glow discharge and other sources of plasma power of the disclosure. The additional power may further comprise a laser such as one selective to excitation of the H—O bond of $H_2O$ to cause it to break to from H atoms. The laser wavelength may be infrared such as in the range of about 1 μm to 10 μm. In an exemplary embodiment, the wavelength is about 2.9 μm. Exemplary lasers are gas lasers such as CO, $CO_2$, HCN, and $C_2H_2$ gas lasers, solid state lasers such as a rare earth doped chalcogenide glass fiber laser, and diode lasers such as a GaAs or a group III-antimonide laser. The laser may be high-power, continuous wave or pulsed.

In an embodiment, a coating of metal powder is adhered or permitted to adhere to the electrodes such as roller or gears to protect them from damage from the detonation. In an embodiment, at least one metal of the solid fuel may adhere to the electrodes to protect the electrodes from damage from the detonation. Exemplary, metals are transition metals such as Cu and Ti. The layer may be thin such that the resistance is maintained low. The metal may continuously build up during operation. The electrodes may be adjustable such as to be self-adjusting to accommodate size changes in the electrode such as an increase in the radius with time. The electrodes may have a means to maintain a constant size such as a means of at least one of intermittently or continuously grinding or machining the electrode surface. One means is a grinder or lathe that may be controlled by a controller such as a computerized controller to maintain the electrodes within certain desired size tolerances. At least one electrode may be conditioned with a dressing wheel. Each electrode may have a dressing wheel to condition the surface. Each dressing wheel may be driven by a drive train such as at least one gear wherein the drive system may be driven by at least one electric motor that may be controlled by a system such as a microprocessor. Alternatively, at least one dressing wheel may be driven directly by an electric motor that may be microprocessor controlled or controlled by another control means. The dressing wheel may imprint a pattern on the electrode surface. The pattern may assist in the adhesion of the solid fuel to the surface. In an embodiment, the dressing wheels are driven by separate motors that may rotate the dressing wheel in an opposite direction to that of the roller that is being dressed. In another embodiment, the counter rotation is achieved with counter gearing from a gearbox driven off of the electrode drive motor that may also provide variable speed gearing that may step up or down the rotational speed relative to the roller speed. In an alternative embodiment such as that shown in FIGS. 2C and 2D, the one roller electrode 8 driven by its motor 12 or 13 serves as the dressing wheel for the other. In an embodiment, each roller 8 is driven by its independent speed-controlled motor 12 or 13. An exemplary computer controlled DC motor is ClearPath by Teknic. In this case the rotational velocity of one roller may be controlled to be faster or slower relative to the other. The faster rotating roller may dress the other or vice versa. A sensor of each roller surface condition and rotational speed may be controlled by at least one sensor and a controller such as a microprocessor to maintain the desired fuel flow and ignition rate while also performing the dressing operation. The spacing between the rollers may be also be controlled by a controller such as a microprocessor. The spacing may be set to permit faster rotation of one member of the pair of rollers relative to the other and to maintain a desired mechanical pressure to control the machining or milling rate. In another embodiment, the motor may comprise at least one of a pneumatic, hydraulic, internal combustion, and electric motor and an electric motor with a speed reducer-torque amplifier. In an embodiment, the exhaust from the pneumatic motor may be used to flow gas in the solid fuel recovery and regeneration system such as through the ducts 53 and perforated window 20*c* (FIGS. 2G1, 2G1*a*, 2G1*b*, and 2G1*c*).

In an embodiment, the electrode may be protected by un-detonated powder. The geometry, fuel compression strength, fuel quantity, fuel composition, ignition frequency, and electrification may be varied to achieve a desired power output while protecting the electrodes such as at least one of gear and roller electrodes. In an embodiment, the electrodes at least partially comprise a readily oxidizable metal such as at least one of Al, Zr, Mo, W, a transition metal, and Ti. In an embodiment of an electrode having an oxidized coating and having a low applied voltage such as in the range of 4 V to 15V, the current is very low compared to the current such as in the range of 5,000 to 40,000 A in the absence of the oxide coating. Regions of the electrode may be selectively oxidized to cause the oxidized region to be resistive to high current such that selective high current flow and selective detonation of the fuel may be achieved in the non-oxidized region. In an embodiment, the electrode geometry to cause at least one of selective compression and electrification of the fuel such as a powder fuel gives rise to an un-detonated powder layer that is protective of the electrodes. In an embodiment, the electrodes are comprised of a material that is resistant to damage by the detonation. The electrodes may be comprised of a cold-formed alloy of copper dispersion strengthened with aluminium oxide such as Luvata's Nitrode, copper chrome, copper chrome zirconium, copper-molybdenum, copper-tungsten, and copper with tungsten or molybdenum facing.

In an embodiment, a coolant such as water is flowed through internal channels in the gear to cool them. The coolant and the channels may be electrically isolated. At least one section of the coolant channels, coolant inlet, and coolant outlet may be non-electrically conductive to achieve the electrical isolation. In an embodiment, a heat pipe is used to remove thermal energy from at least one component of the generator such as at least one of the electrodes and photovoltaic converter.

The solid fuel of the present disclosure may comprise at least one of rehydrated or regenerated solid fuel formed by processing the solid fuel ignition products wherein at least $H_2O$ is added to the products to reform the fuel.

b. Solid Fuel Regeneration System

Referring to FIG. 2A, the ignition products may be moved to the regeneration system 314. The product may be rehydrated and reused as fuel. The fuel can be monitored on line or in batch for $H_2O$ content by means such as at least one of infrared and Raman spectroscopy. The fuel or product may be transported by at least one of mechanical, pneumatic, and electrostatic systems and methods. The transporter may comprise a mechanical product remover/fuel loader such as at least one of an auger and conveyor belt. The pneumatic product remover/fuel loader 313 may comprise a source of gas pressure above or below an average of ambient pressure to cause the particles of the fuel to be transported. The system may move particles by blowing or by suction. The particles may be separated from the gas by at least one of a cyclone separator, a filter, and a precipitator. The electrostatic product remover/fuel loader 313 may comprise a means to charge the fuel and a means to move the fuel by creating an electric field that accelerates the fuel particles. The means to establish the accelerating electric field may comprise a series of electrodes such as grid electrodes such as wire grid electrodes that can be charged and are porous to the powder. The charging may be controlled to cause a static or partially static electric field. In an embodiment, the electrodes may be charged sequentially to move the powder sequentially along a path determined by the timing and position of the electrification of the electrodes. In an embodiment, the timing of the electric field positioning is used to move charged powder between electrodes. The product remover/fuel loader 313 may comprise a combination of mechanical, pneumatic, and electrostatic systems and methods. For example, the system may comprise an electrostatic chargeable mechanical transporter such as a conveyor belt or auger that may be charged to cause adherence of charge product or fuel particles that are then transported mechanically. The particles may be released by discharging or by applying the opposite charge.

In an embodiment shown in FIG. 2A, the product of the solid fuel ignition is at least one of actively and passively transported along the chute 306*a* to the product remover/fuel loader 313. The floor of chute 306*a* may be sloped such that the product flow may be at least partially due to gravity flow. The chute 306*a* may comprise systems and methods of the current disclosure to transport the product such as at least one of mechanical, pneumatic, and electrostatic systems and methods. In an exemplary embodiment, the floor of the chute 306*a* may be at least one of mechanically agitated, shaken, and vibrated to assist the flow. The floor of the chute 306*a* may comprise at least one of mechanical and pneumatic systems for transporting the product such as at least one of a blower, a source of suction, an auger, a scraper, a shaker, and a conveyor to move product from region where it is collected to the product remover-fuel loader 313. The fuel may rehydrate as it is transported to and stored in the product remover/fuel loader 313. The cell 301 may comprise a suitable partial pressure of $H_2O$ vapor to achieve the desired extent of rehydration. In an embodiment, the electrodes such as gears or rollers 302*a* extend at least partially into the product remover/fuel loader 313 such that the electrodes come into contact with at least some rehydrated product that comprises regenerated fuel. The fuel may in the form of a slurry or paste such that it adheres to the gear or roller electrodes 302*a*. The product remover/fuel loader 313 may further comprise a system of the present invention such as at least one of a doctor blade, trowel, a tape casting system, an injector, and an electrostatic electrode charger to apply a coating to the gear or roller electrodes 302*a*. In an embodiment, the product remover/fuel loader 313 further comprises a system to apply or trowel solid fuel onto the electrode 302 such as roller or gear electrodes 302*a*. In an embodiment, the product remover/fuel loader 313 serves as the regeneration system 314 and hopper 305. The inlet and outlet components of the product remover/fuel loader 313 may not be necessary in this embodiment.

In an embodiment, the product remover/fuel loader 313 and regeneration system 314 of FIG. 2A are replaced by a water rinsing and recirculation system such as trough 5, water sucking line 19, water sucking pump 18, ejection pump 17, jet water line 16, rinsing line with jets 21, scraper and collection area 24, and chute 25 shown in FIGS. 2C and 2D wherein the fuel application to the roller electrodes may be assisted with an applicator wheel 27.

In an embodiment, the cell 301 (FIG. 2A) and cell 26 (FIG. 2C) may have an atmosphere that may comprise water vapor. The water vapor may rehydrate the solid fuel. The atmosphere of the cell may comprise a controlled quantity of water vapor to rehydrate the fuel. The $H_2O$ content of the solid fuel such as at least one that is injected, one that comprises a coating such as a paste coating, one that comprises bulk material, one that comprises a bath such as a slurry bath, and one that comprises a suspension may be adjusted to a desired level by controlling at least one of the extent of rehydration and the extent of dehydration or drying. In any case, the extent of the rehydration may be controlled by at least one of controlling the $H_2O$ vapor pressure, the temperature of the reaction mixture comprising ignition products and water vapor, and the time that the products are exposed to the water vapor. In an embodiment comprising a solid fuel compound that forms a hydrate and is hydroscopic such as at least one of an alkaline earth halide such as $MgCl_2$ and $ZnCl_2$, the water vapor pressure is maintained at the value that allows the hydrate to form while preventing bulk $H_2O$ absorption to any significant extent. In another embodiment, the $H_2O$ vapor pressure is maintained at a value that causes the hydrate and deliquescent water to be absorbed. In an exemplary embodiment of a solid fuel comprising $MgCl_2$, the $H_2O$ vapor pressure is maintained at or below 30 Torr to selectively permit the formation of the hydrate, and above 30 Torr to form physisorbed $H_2O$ as well as chemically bound waters of hydration. In an embodiment, the temperature of the electrodes may be controlled such that excess $H_2O$ absorbed by the fuel is driven off prior to ignition. Using a sensor for $H_2O$ such as at least one of infrared spectroscopy, Raman spectroscopy, and conductivity, the $H_2O$ content can be monitored to achieve control in a feedback control loop. In an embodiment, at least one of the $H_2O$ vapor and another gas such as ammonia may be added and controlled as a cell gas to increase the power yield by involving the cell gas in the reaction to form hydrinos. The another gas may at least provide hydrogen and enhance the catalytic rate to form hydrinos.

At least one of a wet fuel coating and immersion of at least one electrode of a pair in wet fuel such as hydrated bulk fuel or a slurry may serve as a heat sink to cool the at least one electrode. In an embodiment, the temperature of the electrodes may be controlled in a range such as at least one of about 25° C. to 2000° C., 100° C. to 1500° C., 200° C. to 1000° C., and 300° C. to 600° C. such that excess $H_2O$ absorbed by the fuel is driven off prior to ignition. The $H_2O$ content may be optimized to give the maximum power and energy while maintaining sufficient conductivity such that ignition may be achieved.

In an embodiment shown in FIG. 2A, the regeneration system 314 may comprise a fluidized bed. The fluid may comprise a gas suspension of the regenerating fuel. The gas may comprise a controlled quantity of water vapor to rehydrate the fuel. In an embodiment, the regeneration system 314 may comprise a moving bed reactor that may further comprise a fluidized-reactor section wherein the reactants are continuously supplied and side products are removed and regenerated and returned to the reactor. The system may further comprise a separator to separate components of a product mixture. The separator may, for example, comprise sieves for mechanically separating by differences in physical properties such as size. The separator may also be a separator that exploits differences in density of the component of the mixture, such as a cyclone separator. For example, inorganic products can be separated based on the differences in density in a suitable medium such as forced inert gas and also by centrifugal forces. The separation of solid and gases components such as the carrier gas such as argon may also be achieved. The separation of components may also be based on the differential of the dielectric constant and chargeability. For example, metal oxide may be separated from metal based on the application of an electrostatic charge to the former with removal from the mixture by an electric field. In the case that one or more components of a mixture are magnetic, the separation may be achieved using magnets. The mixture may be agitated over a series of strong magnets alone or in combination with one or more sieves to cause the separation based on at least one of the stronger adherence or attraction of the magnetic particles to the magnet and a size difference of the two classes of particles. In an embodiment of the use of sieves and an applied magnetic field, the latter adds an additional force to that of gravity to draw the smaller magnetic particles through the sieve while the other particles of the mixture are retained on the sieve due to their larger size.

The reactor may further comprise a separator to separate one or more components based on a differential phase change or reaction. In an embodiment, the phase change comprises melting using a heater, and the liquid is separated from the solid by methods known in the art such as gravity filtration, filtration using a pressurized gas assist, centrifugation, and by applying vacuum. The reaction may comprise decomposition such as hydride decomposition or reaction to from a hydride, and the separations may be achieved by melting the corresponding metal followed by its separation and by mechanically separating the hydride powder, respectively. The latter may be achieved by sieving.

Other methods known by those skilled in the art that can be applied to the separations of the present disclosure by application of routine experimentation. In general, mechanical separations can be divided into four groups: sedimentation, centrifugal separation, filtration, and sieving. In one embodiment, the separation of the particles is achieved by at least one of sieving and use of classifiers. The size and shape of the particle may be chosen in the starting materials to achieve the desired separation of the products.

c. Combined Slurry Ignition and Regeneration System

Referring to FIGS. 2C, 2C1, 2C2, 2D, and 2E, the generator may comprise a combined ignition and regeneration system. In an embodiment, the electrodes 8 such as roller or gear electrodes are least partially submerged in solid fuel slurry such that the slurry is rotary pumped into the electrode contact region, and the fuel subsequently ignites. The solid fuel slurry may be contained in a reservoir such as a trough 5 that may receive fuel flow from the collection area 24. The flow may be achieved using a water or gas stream. At least one of the water and gas stream may be provided by a line 16 from a reservoir 5 and 11. The stream may be pressurized by a pump 17. The line may run to at least one nozzle 21 that may have a pressure gauge as input to a pressure and flow controller. The stream may be recovered by a collection system 24 and 25 and a sucking line 19 and pump 18 that may also pump the stream. Alternatively, a second pump 17 may pump the stream through the lines and the nozzles 16 and 21. In another embodiment, excess $H_2O$ may be drained from the trough 5 by a drain hole or channel. Excess water may be pumped off using a sump pump 18. The pumping may be through a filter such as a filter in the bottom of a collection reservoir that may comprise the trough 5. The trough 5 may have a vibrator system such a vibratory table to agitate the slurry to at least one of separate excess water from the solid fuel and maintain a desired viscosity and mixing of the solid fuel components such as the metal powder, hydroscopic compound, and $H_2O$. In an embodiment, rotary pumping of solid fuel is achieved by the rotation of the electrodes such as roller or gear electrodes 8. The solid fuel may at least temporarily adhere or coat at least one electrode 8 as it rotates to at least one of transport and throw the solid fuel into the contact region. The rotation is maintained at a sufficient speed to transport the solid fuel slurry. In an exemplary embodiment with 3 inch diameter copper roller electrodes, running the rollers at high rotational speed of greater than 1000 RMP transports Ti (50 mole %)+$H_2O$ (50 mole %) slurry solid fuel to the ignition region at a sustained rate to maintain about 1 MW of optical power. Another exemplary fuel is (Ti+$MgCl_2$) (50 mole %)+$H_2O$ (50 mole %). The ignition system may comprise electrode scrappers 24 to clean the side faces of adhered solid fuel slurry and may further comprise baffles and a chute 25 to provide a pressure gradient of the solid fuel against the rotating electrode to at least one of better coat it or cause better adhesion of fuel. The ignition system may comprise an agitator such as a mechanical vibrator to facilitate the application of fuel onto the electrode 8 to be transported into the contact region by means such as by rotation of the electrodes. The agitator may comprise the paddle wheel of the disclosure. The slurry agitator may comprise a propeller or stirrer blade driven by an electric motor. The flow rate of fuel may be controlled by adjusting the fuel thickness by adjusting the gap between the electrodes and the pressure applied to the electrodes. The inter-electrode pressure may also be adjusted to at least one of compress the fuel to the point that $H_2O$ is rejected and the resistance is sufficiently lowered such that ignition occurs. In an embodiment, at least one of the electrodes such as a roller or gear electrode 8 is movable. The compression of the fuel may be provided by an adjustable tension such as one achieved by an adjustable spring, pneumatic, or hydraulic actuator. The electrical connection to the movable electrode may be flexible. The flexible connection may be provided by a wire cable connection. In an embodiment, the mechanical system to separate the electrodes 8 may comprise at least one of a rotating mechanism and a linear mechanism. The rotating mechanism may comprise a cam that rocks the roller electrodes back and forth to achieve the change in separation. The cam may be driven by a servomotor. The mechanical separation of the electrodes may be achieved with actuators such as those of the disclosure such as solenoidal, piezoelectric, pneumatic, servomotor-driven, cam driven with a rotation drive connection, and screw-motor-driven actuators. The separation may be in at least one range of about 0.0001 cm to 3 cm, 0.01 cm to 1 cm, and 0.05 cm to 0.5 cm. The flow of fuel may also be controlled by controlling the depth of the electrodes such as rollers or gears in the slurry and the rotation rate. The surface roughening may be controlled to change the fuel pick up rate to control the fuel flow rate.

The system may further comprise a bubbler such as at least one of a mechanical agitator, and a pneumatic bubbler such as a percolator that lifts solid fuel such as slurry of solid fuel into the electrode contact region. The solid fuel may be supplied as a fuel column. The bubbler may comprise a gas pressure gauge as input to a pressure and flow controller and a gas nozzle. The gas may be supplied from the gas jet system used to clean the optical elements and facilitate recovery of the ignition product for regeneration. The electrodes such as roller electrodes 8 may be at least partially submerged. A rotation action of the electrodes such as roller or gear electrodes 8 may transport the fuel into the contract region wherein ignition occurs. The bubbler may fill the space between the electrodes in at least one portion such as the lower portion. The solid fuel may be compressed such that current preferentially flows in the compression region between the electrodes such that ignition occurs at this selected region. The expanding plasma formed by the ignition may expand away from the region that has the solid fuel supplied by a means such as a bubbler. The fuel that is lifted up by the bubbler may provide a pressure barrier such that the plasma expands away from the supplied fuel. The light may be received by the optical distribution and photovoltaic conversion system 26*a* of the disclosure. The optical power may be controlled by controlling the fuel flow rate that may in turn be controlled by the electrode rotation rate and the thickness of the fuel layer on the electrodes such as roller electrodes at the point of least electrode separation wherein ignition occurs.

In an embodiment, the kinetic energy of the rotating or projected aliquot of fuel is sufficient to overcome the force of the blast pressure wave of the ignition of a preceding fuel aliquot. In an embodiment, wherein the fuel is coated onto the electrode such as a rotating electrode such as a roller or gear, at least one of the adhesive forces of the fuel with the electrode and the atmospheric pressure holding the fuel to the wheel surface are greater than the centrifugal force on the aliquot of fuel adhered to the electrode surface. Using a corresponding system, the injection may be achieved by imparting kinetic energy to the fuel to cause projectile injection of an aliquot of the fuel. The projectile action may be achieved by an electrical or magnetic force device as well as by a mechanical device. Exemplary embodiments of the former-type devices known in the art are electrostatic engines and rail guns.

Consider an $H_2O$-based solid fuel aliquot of dimensions D: 6.7 mm×3 mm, the velocity v of a fuel aliquot is the width of the aliquot divided by the duration of the light pulse:

$$v=(6.7\text{ mm})\left(\frac{1\text{ m}}{1000\text{ mm}}\right)\left(\frac{1}{0.5\times10^{-3}\text{ s}}\right)=13.4\text{ m/s} \tag{196}$$

The rotational frequency is the velocity of the aliquot divided by the circumference of the roller. An exemplary case, a roller having a 6.5 cm radius and a circumference of 41 cm has a rotational frequency f of $$f=\frac{13.4\text{ m/s}}{0.41\text{ m}}=32.7\ rev/\text{s}=1961\ RPM \tag{177}$$

The kinetic energy K of the aliquot of 530 mg is given by $$K=\frac{mv^2}{2}=\frac{(5.3\times10^{-4}\text{ kg})(13.4\text{ m/s})^2}{2}=4.76\times10^{-2}\text{ J} \tag{198}$$

The centrifugal force $F_C$ of the aliquot of 530 mg is given by $$F_C=\frac{mv^2}{r}=\frac{(5.3\times10^{-4}\text{ kg})(13.4\text{ m/s})^2}{6.5\times10^{-2}\text{ m}}=1.46\text{ N} \tag{199}$$

In an exemplary embodiment, the pressure of the blast wave from the ignition is 2 PSIg or $1.37\times10^4$ N/m$^2$. An estimate of blast force $F_B$ on the cross section of the fuel aliquot is $$F_B=(6.7\text{ mm})(3\text{ mm})\left(10^{-6}\text{ m}^2/\text{mm}^2\right)\left(1.37\times10^4\text{ N/m}^2\right)=0.275\text{ N} \tag{200}$$

An estimate of the force $F_K$ corresponding to the kinetic energy is $$F_K=\frac{4.76\times10^{-2}\text{ J}}{6.7\times10^{-3}\text{ m}}=7.1\text{ N} \tag{201}$$

The kinetic force is greater than the blast force so the aliquot is not repelled by a preceding blast. An estimate of atmospheric pressure force $F_A$ on the aliquot is $$F_A=PA=\left(1.01\times10^5\text{ N/m}^2\right)\left(\pi\left(\frac{6.7\text{ mm}/2}{1000\text{ mm/m}}\right)^2\right)=3.56\text{ N} \tag{201}$$

The atmospheric pressure force is greater than the centrifugal force. If the force binding the aliquot to the wheel is about the atmospheric force, then aliquot will be transported to the ignition region and become detonated without being expelled by the centrifugal force.

In an embodiment, the rotational frequency may be in at least one range of about 1 RPM to 100,000 RPM, 10 RPM to 10,000 RPM, and 100 RPM to 2000 RPM. The rotating electrodes such as the roller or gear electrodes may each have a radius in at least one range of about 0.1 cm to 1 m, 1 cm to 100 cm, and 1 cm to 25 cm. The ignition frequency may be in at least one range of about 1 Hz to 100,000 Hz, 10 Hz to 10,000 Hz, and 500 Hz to 3000 Hz. The circumferential speed of the rotating electrodes such as roller or gear electrodes may be in at least one range of about 0.01 m/s to 200 m/s, 0.1 m/s to 100 m/s, 1 m/s to 50 m/s, and 1 m/s to 25 m/s. The width of the rotating electrode may be in at least one range of about 0.01 cm to 10 m, 0.1 cm to 1 m, 1 cm to 100 cm, and 1 cm to 10 cm. In an embodiment, an increase in the roller width causes an increase in the flow of fuel at a given rotational velocity. The ignition current may be increased to maintain about constant ignition current density through the fuel. In another embodiment, the increased fuel flow may increase the plasma intensity and the corresponding intrinsically formed current such that the ignition current through the electrodes may be decreased. The generator may be started with a pulse of higher current than that required to maintain the plasma and light power once the fuel supplied by the wider roller electrodes ignited wherein the plasma makes a contribution to the current. The pulsed current may be provided by exemplary elements such as at least one of capacitors and batteries as disclosed in the disclosure. The start may be achieved with the rollers at a low to no rotational velocity so that accumulated energy is deposited to facilitate the ignition. The rotational speed may be increased following ignition. The hydrino power contribution to the plasma may facilitate the reduction of the input power required to maintain the ignition of solid fuel. The ignition may be facilitated to occur by the sequential localization of the current at a higher than average density over a plurality of locations along a cross section of the electrode as it rotates to provide sequential cross sections. In an exemplary embodiment, the ignition current to maintain the plasma remained at 4000 A with an increase in the roller width from 1.3 cm to 2.6 cm. In an embodiment, the ignition current may be scaled as a function of the electrode surface area wherein ignition is achieved with a sufficient current density in at least one range of about 10 A/cm$^2$ to 1 MA/cm$^2$, 100 A/cm$^2$ to 500 kA/cm$^2$, 1 kA/cm$^2$ to 100 kA/cm$^2$, and 5 kA/cm$^2$ to 50 kA/cm$^2$. In an exemplary embodiment, the ignition current is scaled from the range of about 30,000 to 40,000 A to about 3000 to 4000 A but replacing ⅝ inch diameter cylindrical electrodes with 1 to 2.5 cm wide by 4 cm radius roller electrodes. The thickness of the solid fuel layer may be in at least one range of about 0.001 cm to 10 cm, 0.01 cm to 1 cm, and 0.1 cm to 1 cm. The water composition of the solid fuel that is applied may be at least one range of about 0.01 mole % to 99.9 mole %, 0.1 mole % to 80 mole %, and 1 mole % to 50 mole %.

In an embodiment, wherein the fuel comprises a conductive matrix and a compound to bind $H_2O$, the current density is increased by the skin effect with transients of the current. The fast transients may be achieved by pulsing at least one of direct current, alternating current, and combinations thereof. The source of electric power to cause ignition may comprise a pulsed source of current wherein the higher the frequency the swallower the skin depth of the current in the conductive matrix of the solid fuel such that the current density is increased in a portion of the fuel. The maximum current and pulsing frequency are controlled to achieve the desired current density such as one that causes ignition of at least a portion of the solid fuel. The current density may be controlled to optimize the energy gain of the generator comprising the ratio of the output energy and the input energy. The fast pulsing may be achieved by at least one of electronically and mechanically as disclosed in the disclosure. The current density may further be increased by decreasing the contact area or electrical cross section for current flow of at least one of the fuel and the electrodes. The contact area of the roller electrodes may be decreased by decreasing at least one of the roller diameter and the roller width. In an embodiment, the roller electrodes may comprise different radii. The electrodes may be modified as well. For example, the roller surface of at least one roller of a pair may have at least one of lobes and elevations such as protrusions that at least one of mechanically vibrate the rollers relative to each other while rotating to cause current disruptions and make electrical contact at regions of diminished surface area to cause the current to concentrate in that area. In an embodiment, the at least one electrode of a pair may comprise a circular surface with alternating regions of conductive material such as metal such as copper and non-conductive or insulating material such as ceramic, oxidized metal, or anodized metal. The non-conducting material may comprise a layer on the surface of the roller or may comprise roller segments of surface and body. In the case that both electrodes have intervening non-conductor surfaces, contact of like regions of the electrode pairs may be synchronized. The conductivity and the corresponding current are pulsed due to the alternating conductivity due to the geometrical or material alterations of the roller. The pulsing may increase the effectiveness of the maximum current at causing ignition by current concentration through the skin effect.

In an embodiment, the high current from the skin effect may cause magnetic pinch plasma of the plasma formed by ignition of the fuel. The pinch may cause plasma confinement that may increase one of the plasma density and confinement time to increase at least one of the hydrino reaction rate and yield.

FIG. 2A provides an exemplary orientation of the electrodes. The at least one coated electrode may transport the fuel to a point at which the high current is passed between the electrodes through the fuel to achieve ignition. The transport may be achieved by rotation of the electrode 302 such as rotation of the gear or roller electrode 302*a* that is coated with fuel at a position different from the point of ignition. Consider the spherical Cartesian coordinate system with respect to the generator system as shown in FIG. 2A with the z-axis oriented vertically and the +x-axis oriented horizontally to the right hand side of the figure and the angle $\theta=0°,\phi=0°$ is along the z-axis. The fuel may be transported from a first position on the roller on the right hand side such as at $\theta=180°$, $\phi=0°$ where it is coated to a second position such as at $\theta=90°,\phi=180°$ where ignition occurs wherein the left roller rotates counter clockwise and right roller rotates clockwise. In another embodiment, the fuel may be transported from a first position on the roller on the right hand side such as at $\theta=180°,\phi=0°$ where it is coated to a second position such as at $\theta=90°,\phi=180°$ where ignition occurs wherein the left roller rotates clockwise and right roller rotates counter clockwise. In another embodiment, both electrodes are coated and transport the fuel by rotation to the point of ignition. In an embodiment, the pair of electrodes 302 such as rollers or gears 302*a* may be aligned along the z-axis. In an exemplary embodiment, the bottom electrode may be coated at a first position such as one at $\theta=180°,\phi=0°$ and rotate clockwise to transport the fuel coating to a second position such as one at $\theta=90°,\phi=180°$ where ignition occurs; alternatively, the bottom electrode may be coated and rotate counter clockwise to transport the fuel coating from a first position such as one at $\theta=180°,\phi=0°$ to a second position such as one at $\theta=90°,\phi=180°$ where ignition occurs. In an embodiment, solid fuel that centrifugally flies off of one rotating electrode is at least partially caught by the counter-rotating electrode to be transported into the ignition area.

Referring to FIG. 2C, in an embodiment, the ignition product may be recovered from the surfaces on which it collects such as the window 20 to the optical distribution and photovoltaic conversion system 26*a* by at least one of a liquid steam such as $H_2O$ and a gaseous stream such as argon. In an embodiment, the window 20 may be at least one of electrostatically charged and maintained with a thin film of liquid such a $H_2O$ to prevent the ignition products from adhering to the window. In an embodiment, the window and optionally any cell reflective surfaces are coated with an anti-adhering or anti-sticking layer such that the adhesion of the ignition product is impeded. The coating may comprise a nanotechnology coating known in the art. The coating may comprise a superhydrophobic coating. The coating may comprise an anti-soiling coating such as the reported by Jones: http://phys.org/news/2014-01-self-cleaning-solar-panel-coating-optimizes.html which is herein incorporated by reference in its entirety. The coating may be transparent over the wavelengths useful for photovoltaic conversion to electricity. Any surface material on the window may be rinsed with the gaseous and $H_2O$ stream. The application of the stream may be as a raster such as by using a controlled sequence of activations of jets 21. The raster motion may be controlled by a microprocessor controller. The removal may be a pixel or a limited number of pixels at a time such that at least one of the light blockage is limited and the stream is concentrated. The rinse may be to a collection area 24 (or product remover/fuel loader 313 of FIG. 2A). In an embodiment, at least the top window 20 comprises an arch. At least one of the gas and $H_2O$ streams may be applied at least partially tangentially to at least one base of the arch such that the pressure of the stream causes the gas or $H_2O$ (or other suitable liquid capable of at least one of cleaning an cooling) to travel along the arch, pick up product material from the surface and flow to a collection area such as 24. In an embodiment, the ignition products such as the conducting matrix material such as metal or carbon power and powder of any water absorbing material that are suspended in the cell gas may be removed to clear the light path of these potential absorbers. The clearing may be achieved by at least on of a gas stream and a $H_2O$ stream. The stream may be transverse to the propagation of the light to remove it from the light path. The cleared material may be collected on at least one cell region such as the window 20, the walls of the cell 26, and the collection region 24 and may be returned to the solid fuel reservoir such as the slurry trough 5 as regenerated solid fuel.

In an embodiment, the parabolic mirror 14 of the disclosure that surrounds the electrodes, such as one having the electrodes about at the focus that directs the light towards an optical window such as a top window 20, may be at least one of rinsed and cooled by at least one of gas and $H_2O$ streams from a source such as rinsing line with jets 21. The mirror may be connected directly to side member structural elements such as the walls of cell 26 that may be reflective and may comprise mirrors. In an embodiment, a $H_2O$ stream may remove product from at least one of the window 20, the side members of 26, and the parabolic mirror 14. The water may flow to a collection area 24, then through passages in the parabolic mirror 14. The passages may direct the water stream to the face of each electrode opposite the face upon which ignition occurs, then along a chute 25 and into a fuel reservoir such as the trough 5. The roller electrodes 8 may be rotating in the direction of the flow of the $H_2O$ stream into the trough 5. The rotation of the rollers may assist in pumping the $H_2O$ stream. In an embodiment, the electrodes such as roller or gears 8 are rotating in a direction that rotary pumps the solid fuel upwards into the contract region where ignition occurs and pumps the water stream downward into the chute 25 and fuel reservoir such as the trough 5. In an alternative embodiment, the parabolic mirror is free standing, not connected to the side member elements. The gas and $H_2O$ streams may be separately applied to the parabolic mirror 14 and the side members of cell 26. The separate flows may be combined or remain independent and flowed to a collection area 24 that directs the water stream to the faces of each electrode such as a roller electrode 8 that is rotating in the direction of the flow of the $H_2O$ stream through any passage to the trough 5.

The product may be rehydrated by the $H_2O$ stream. The stream such as the $H_2O$ stream may be flowed to a collection area such as 24 (or the product remover/fuel loader 313 of FIG. 2A). Excess liquid such as $H_2O$ or gas such as argon may be removed by at least one of a strainer, pump, a filter, a cyclone separator, and a centrifugal separator and other separation systems and methods of the disclosure and those known in the art. The gas such as argon and liquid such as $H_2O$ may be recirculated by means such as a pump. In an embodiment, the generator comprises recirculation system comprising a pipe to a $H_2O$ reservoir having a suction pump at the inlet and a $H_2O$ injection pump at the outlet. Alternatively, the recirculation system comprises a pipe 19 to a $H_2O$ suction pump 18 that removes excess $H_2O$ from the trough 5 and pumps it to an election pump 17 that recirculates the water for cleaning cell components through water line 16 and rinse line with jets 21. The ejection pump 17 may draw additional water from $H_2O$ reservoir 11 to make up for that consumed by means such as by the formation of hydrinos. The $H_2O$ may be ejected to at least one of the window 20, the parabolic mirror 14, and the collection area 24. The $H_2O$ may at least one of cause the transport of the ignition products from the window 20 to the collection area 24 and cause the transport of the ignition products from the collection area 24 to the product trough 5. Alternatively or in addition to $H_2O$ stream transport, the ignition products may be transported from the window 20 and parabolic mirror 14 to at least one of the collection area 24 and the trough 5 by a gaseous stream. In an embodiment, the water sucking pump 18 comprises a hydrocyclone separator wherein the excess water is removed and the de-watered slurry is returned to the trough 5 by an transporter such as at least one of a conveyor, an auger, and a pump such as a progressive cavity pump, a type of positive displacement pump also known as a progressing cavity pump, eccentric screw pump or cavity pump.

In an embodiment, water is used to collect and recover the ignition products from the cell and form slurry that is applied to the electrodes 8 from the slurry trough 5. The excess water beyond that amount that at least one of rehydrates the $H_2O$-based solid fuel and forms as desired slurry is removed. The desired slurry may have $H_2O$ content in at least one wt % range of about 0.000001% to 100%, 0.00001% to 99%, 0.0001% to 90%, 0.001% to 80%, 0.01% to 75%, 0.1% to 70%, 1% to 65%, 10% to 60%, 0.1% to 50%, 1% to 25%, and 1% to 10%. Alternatively, the water composition of the slurry solid fuel that is applied to the electrodes 8 may be at least one range of about 0.01 mole % to 99.9 mole %, 0.1 mole % to 80 mole %, and 1 mole % to 50 mole %. The excess water may be removed with a water jet. The water jet may be directed at an angle to the vertical of a reservoir that contains the excessively wet slurry such that a tangential component of the gas flow is created at the slurry surface. In an embodiment, the tangential gas flow causes $H_2O$ flow that separates the excess water from the remaining desired slurry. The reservoir such as the trough 5 may be partially filled such that the excess water is pushed vertically up at least one wall of the reservoir by the tangential flow. The excess water may be selectively removed over the solid fuel due to at least one of its lower mass, lower viscosity, and greater fluidity. The gas jet may comprise at least one of pulsed pressure or continuous pressure to selectively remove the excess $H_2O$. In an embodiment, the forced flow may be over a washboard or sluice to increase the separation wherein either may be at least one of partially horizontal and partially vertical. The water flow may selectively adhere to a separator structure such as a vertically oriented curve over which the water is blown. The water may curve around or flow along the surface of the structure due to the Coanda effect. This effect may be exploited to achieve better separation. In an embodiment, the excess water may be secretively removed to a greater extent by a counter current flow of water and slurry. In an embodiment, the removed water may contain a higher mole percentage of water than the slurry. This water may be recirculated to collect and recover the ignition products from the cell and form slurry. The water may be pumped with a pump such as water sucking pump 18 and water ejection pump 17. The pumps may comprise peristaltic pumps or progressing cavity pumps.

In an embodiment, excess $H_2O$ may be removed by evaporation. The water may be at least one of that removed with a gas jet and that obtained directly from the rinse that collected and recovered the ignition products. The evaporated water may be condensed in a condenser that may comprise at least one of a heat exchanger, heat rejection system, and a chiller system that may remove excess heat from the cell or generator systems. The condensed water may be recirculated for the collection and recovery of the ignition products. In an exemplary embodiment, the heat released from the water condensation may be dissipated in the heat exchanger, and the excess heat may be removed from the system. Exemplary sources of heat to achieve the evaporation are any heat exchanger on the electrodes 8 and the photovoltaic cells of the optical distribution and photovoltaic converter 26*a*.

In an embodiment, the slurry cools the electrodes such as rollers 8. Moreover, the fuel coating such as slurry coating may protect the electrodes such as rollers 8 from blast damage. In an embodiment, at least one of the slurry, slurry trough 5, and reservoirs for the streams such as at least one of the gas stream and water stream is cooled with at least one of a corresponding heat exchanger, chiller, radiator, and cooling system (31 of FIG. 2C1). In an embodiment, the roller electrodes may be spoked to prevent heat from being transferred to the central bearing.

In an embodiment, light from the ignition of the solid fuel may be incident a light absorbing material that creates steam. The light absorbing material may comprise a plurality of layers such as carbon in two forms such as graphite flakes and porous carbon. The light absorbing material may be floated on bulk water and may draw water into the structure using capillary action to form steam. The a top layer may be selective to absorb the light and get hot, and at least one other layer may serve as insulation and a water conduit to the first layer where steam is formed from the water being heated by the absorbed light. The steam may be used in a steam load such as a heating load or a turbine to generate electricity.

d. Light Distribution System

In an embodiment, the system is operated to maximize the optical power such as blackbody radiation. The optical power may be increased over other power inventories such as thermal and pressure volume power by means such as maintaining the expanding plasma as optically thin. This may be achieved by allowing the plasma to expand at a higher rate while retarding the expansion of absorbing species. The absorbing species may be blown or rinsed from the optical path by means of the disclosure. The system gas pressure may be adjusted to achieve the differential expansion velocity. The roller diameter may be changed to lower the pressure volume work by means such as by reducing confinement. At least one of the cell gas, the fuel composition, and an additive to the fuel composition may be selected to reduce the pressure volume work such that the energy from the formation of hydrinos is substantially in the form of light. For example, the mass of the cell gas may be changed to reduce the pressure volume work. Alternative, any of these compositions may give rise to photons over translational energy of the compositions or ignition products. The roller width may be adjusted. The ignition power waveform may be adjusted. The current density may be adjusted. The water component and other absorbing gases may be lowered in the cell. The water content and other components of the fuel may be adjusted. The injection velocity and the corresponding product velocity may be adjusted. An additive such as a noble gas such a Kr or Xe may be added to the cell atmosphere. An additive may be added to the fuel to release more of the power as light or shift the emission such as blackbody emission to a more desirable spectral range such as shorter wavelengths. In an embodiment, the cell gas may comprise some oxygen to at least one of shift the spectrum to a desired spectral range and increase the optical power. The fuel may comprise oxygen stable components such as Ag and $ZnCl_2$ hydrate.

Referring to FIGS. 2C, 2C1, 2C2, 2D, and 2E, the photovoltaic power converter 26*a* of the SF-CIHT power generator may further comprise a light distribution system 26*a* to provide optical power of the SF-CIHT cell at a plurality of photovoltaic cells 15 that may be arranged in a compact design. At least one cell wall such as the top of the cell 26 may comprise a window 20 that transmits the cell light and directs it to the photovoltaic converter 26*a*. The window 20 may be in the form of a plane, an arch, a dome, a polygon, a geodesic dome, a lens such as at least one Fresnel lens, and another suitable architectural form known to those skilled in the art. The window material is transparent to at least one of the wavelength bands of the emitted light such as EUV, UV, visible, infrared, and near infrared light. Exemplary materials are glass, quartz, and plastics such as polycarbonate, Lexan, and acrylic.

In an embodiment of the photovoltaic converter, the light output (optical power) is directed to a plurality of photovoltaic converters. The light output can be distributed by optical distribution and photovoltaic conversion system such one comprising at least one of mirrors, lenses, fiber optic cables, and optical waveguides. In an embodiment such as an SF-CIHT generator comprising roller or gear electrodes, the generator comprises a mirror that at least partially surrounds the light-emitting region to reflect the light to at least one of the photovoltaic converter and the optical distribution system that transports and directs the light to the photovoltaic cells. In an embodiment of an optical distribution system and photovoltaic converter (26*a* of FIG. 2C), the light is distributed to a plurality of PV cells or panels 15 by a series of semitransparent mirrors 23.

In one embodiment, light is formed into a beam with a lens at the focal point of a parabolic mirror, and is directed to a lens at the focal point of another parabolic mirror that outputs parallel rays of light that are made incident on a photovoltaic cell. The system comprises a plurality of such parabolic mirrors, lenses, and photovoltaic cells and may further comprise optical waveguides. The light may also be directed and distributed using beam splitters, prisms, gratings, diffusers and other optical elements known to those skilled in the art. In an embodiment, the window, such as 20 of FIG. 2G1*e*3, comprises diffuser or homogenizer to more evenly distribute the light to the photovoltaic converter. Elements such as a prism, polychromat layer, monochromator, filter, and a grating may separate a plurality of wavelength ranges or bands of the light output such that the separated light can be directed to photovoltaic cells that have a maximum efficiency of optical to electrical conversion within the wavelength range of each band.

In another embodiment, the optical power is collected in a bundle of fiber optic cables. The collection may be achieved with at least one or more lenses and one or more optical impedance matching plates such as a quarter wave plate. The light distribution system may further comprise at least one mirror to at least one of direct light to the lenses and fiber optic cables and reflect any light reflected from the fiber optic cable back to at least one of the cable inlet, the light collection system, and the impedance matching plate to the cable. The mirror may be at about the center of the ignition wherein the light acts as a point source from the center of the mirror. The mirror may be at the plane of the gear electrodes of FIG. 2A. The mirror may comprise a pair of mirrors that reflect light in opposite directions to opposing matched photovoltaic converters as shown in FIG. 2A. The opposed mirrors may reflect light back into the light distribution systems such as ones comprising fiber optic cables. The mirror may have the shape that optimizes the reflection of the back-reflected light to the light distribution systems. The mirrors may be parabolic. Fiber optic cable elements of the fiber optic cable may be selective for a band of wavelengths that may selectively conduct light to a matched photovoltaic cell of a plurality that has a maximum efficiency of optical to electrical conversion within the wavelength range of the band. In another embodiment, the light distribution system and photovoltaic power converter comprises a plurality of transparent or semitransparent photovoltaic cells arranged in a stack such that the optical power from the ignition is converted to electricity at members of the stack as the light penetrates into the stack. In an embodiment, the surface of the photovoltaic cell may be coated with a polychromat that separates the incident light into wavelengths bands and directs each band to a portion of the photovoltaic cell that is responsive to the wavelength band. In an embodiment, the light from the ignition is collected before the blackbody radiation cools by a mechanism such as expansion. The plasma may be maintained in a magnetic bottle such as that produced by Helmholtz coils 306*d* of FIG. 2A to prevent expansion or collisional losses such that the maximum power may be extracted by radiation.

In an embodiment, the solid fuel may comprise an additive to shift the plasma spectrum to a desired wavelength band to match that of the photovoltaic cell response. In an embodiment, the spectrum is shifted to shorter wavelengths. The additive may comprise an oxide such as at least one of a metal oxide such as an alkaline, alkaline earth, transition, inner transition, rare earth, Group 13, and Group 14 oxide. The oxide may comprise a metalloid compound. The oxide may comprise a Group 13, 14, 15, or 16 element. Exemplary metal oxides and oxides to shift the spectrum are at least one of the group of MgO, CuO, FeO, CaO, TiO, AlO, $Al_2O_3$, and $SiO_2$. In an embodiment, an additive may at least one of enhance the hydrino reaction rate and yield. The additive such as MgO or $MgBr_2$ may increase the blackbody temperature to cause a shift in the spectrum to shorter wavelengths. In an embodiment, a gas may be added to at least one of shift the spectrum to a desired wavelength region, increase the emission intensity, increase the concentration of at least one of the atomic H and catalyst, increase at least one of the rate and yield of the hydrino reaction, assist in preventing oxidation of the metal of the solid fuel, and serve to transport the ignition product during regeneration. The gas may comprise a noble gas such as He, Ne, Ar, Kr, and Xe. Hydrogen may be added to the gas to at least one of prevent oxidation the metal of the solid fuel and provide addition atomic H as a reactant of the hydrino reaction. An exemplary cell gas is a mixture of Kr and hydrogen in any desired ratio and total pressure.

The photovoltaic converter may be modular and scalable. The photovoltaic converter may comprise photovoltaic cells such as concentrator cells. In an embodiment, each of the photovoltaic cells comprise at least one of an extreme ultraviolet, an ultraviolet, a visible, and an infrared photovoltaic cell. The cells may be organized as stackable modules that can be located about the perimeter of the source of optical power. The light distribution system may be scaleable based on the desired output power wherein the optical power is controlled to produce the desired level to achieve the desired electrical output. The optical power may be controlled by controlling the ignition frequency, the amount of fuel ignited in intermittent ignitions, the composition of the fuel, and the parameters of the igniting waveform.

In an embodiment, the light distribution system comprises a light collector that may also serve as a light concentrator. The collector may have a directional reflection. The light collector may comprise a parabolic mirror. The directional reflection may be onto a light distribution system that may comprise one or more lenses, mirrors, optical waveguides, and fiber optic cables. In an embodiment, the directed light may be incident on the entrances of fiber optic cables. The light may be focused onto the entrances by at least one lens. A series of lenses such as a series arranged in a plane may focus the light onto a plurality of fiber optic cables that may comprise a fiber optic bundle. The area of a fiber optic cable bundle that a lens illuminates is variable. The variable illuminated area may be adjusted by changing the focus of the lenses. The focus of each or the plurality of lenses may be changed by changing the separation distance between any given lens and a corresponding fiber optic cable that receives light from the lens. The lens system may comprise one similar to the one described in U.S. Pat. No. 6,730,840 that is herein incorporated by reference. Each fiber optical cable may be incident on at least one photovoltaic (PV) cell such as a triple junction concentrator photovoltaic cell. Alternatively, each lens may focus the light onto a system of mirrors or optical waveguides that transport the light to one or more corresponding photovoltaic cells. The distance between the output of the light distribution component such as a fiber optic cable and the PV cell that it illuminates may be adjustable. The photovoltaic cells may comprise concentrator photovoltaic cells. The photovoltaic cells may be stacked to form a modular scalable design. The PV cell stack may comprise one similar to that described in U.S. Pat. No. 5,575,860 that is herein incorporated by reference. The electrical power output by the generator may be scaled up by the steps of at least one of (i) increasing the optical power by controlling the power from the ignition of fuel, (ii) defocusing the lens system to distribute the incident light over a proportionally increased area of the fiber optic cables, mirror system, or optical waveguide system that is incident on the PV cells, (iii) proportionally increasing the PV cell area corresponding to an increase of the number of PV cells in the stack of PV cells, and (iv) increasing the path length between the exit of at least one optical fiber and its illuminated PV cell such that a larger area is illuminated at the plane of the PV cells wherein the PV cell area is enlarged to match the extent of the incident light.

The photovoltaic converter may comprise a coating for at least one of antireflection layer or coating such as silicon monoxide, optical impedance matching, and protection from plasma or kinetic material erosion or damage. The film may comprise a window. The window may further comprise a system for cleaning detonation products that cover the window and at least partially block the transmission of light to the photovoltaic converter. In an embodiment, the optical window is cleaned. The cleaning may comprise at least one system and method of chemical cleaning or etching and plasma cleaning or etching. The window may comprise multiple windows that are each removable such that one replaces another and serves to transmit light to the converter while the at least one other is cleaned of detonation products. In an embodiment, the optical window is cleaned. The cleaning may comprise at least one system and method of chemical cleaning or etching and plasma cleaning or etching. In an embodiment, a stream of gas such as an inert gas is flowed in the direction opposite to the expanding ignited plasma in order to prevent products from coating at least one of the protective window, the light collections system such as at least one of mirrors, lenses, fiber optic cables, optical waveguides, and the photovoltaic converter. In an embodiment, a gas stream such as an inert gas stream such as an argon gas stream may be directed transversely to the expansion direction of the plasma to cause the ignition products to flow out of the optical path between the plasma and the optics and photovoltaic converter. The gas stream may force the product to a collection area. A gas jet to provide a gas stream may comprise a gas pressure gauge as input to a pressure and flow controller and a gas nozzle. In an embodiment, a thin layer of the stream material such as the gas or $H_2O$ stream material is maintained to protect the window from damage from the plasma.

In an embodiment, at least one of a gas and liquid stream that may be at an elevated pressure and velocity such as a high-pressure jet performs at least one function of preventing the blasted out powder from accumulating on the surface of the optical distribution system components and cleans the components of ignition products wherein exemplary optical distribution system components comprise as at least one of mirrors, lenses, fiber optic cables, and optical waveguides. The velocity and pressure may be sufficient to remove any accumulated ignition products. The optical distribution system component such as a mirror could comprise an electrostatic system to charge the component such as a mirror with the same polarity as particles that are desired to be repelled. The mirror may be positively charged to repel positively changed product particles in the expanding plasma. Alternatively, a negatively charged collector such as charged electrode, such as a grid electrode may collect the charged particles. Referring to FIG. 2A, the collected particles may be transported to the regeneration system 314 such that the fuel is regenerated.

In an embodiment, the expanding plasma is comprised of positively charged particles and electrons. In an embodiment, the electrons have a higher mobility than the positive ions. A space charge effect may develop. In an embodiment, the space charge effect is used to at least one of collect the product ions and repel the product ions. In an embodiment, the electrons are electrically grounded on a surface on which it is not desirable to have the particles accumulate. The surface may be further positively charged to repel the positively charged particles. The surface may comprise at least one element of the optical distribution system such as the optical waveguide, mirror, lens, and a fiber optic cable component such as the entrance. In an embodiment, the SF-CIHT cell generator comprises at least one of an electrostatic particle repelling system and a pneumatic particle repelling system. The repelling system may prevent the product such as fuel ignition product from accumulating on at least one of the optical distribution system and the photovoltaic converter. The light distribution system may comprise lenses, mirrors, light waveguides, and fiber optic cables. In an embodiment, the plasma particles may be charged by application of electrons, and the particles may be stopped by applying a repelling electric field. The application of the electrons may be means such as a coronal discharge. In an embodiment, a transparent membrane or window such as a glass plate capable of stopping the pressure wave from the ignition of the fuel and transmit light comprises a means such as a conductive wire grid to electrostatically charge the surface to repel product particles. In an embodiment, the transparent membrane is charged such that the product is prevented from adhering. In another embodiment, magnetic forces are used to at least one of repel the particles and prevent them from adhering.

In an embodiment, the voltage of the repelling electric field is sufficient to stop the particles of kinetic energy $K=\frac{1}{2}mv^2$ wherein m is the particle mass and v is the particle velocity. The corresponding voltage over the stopping distance may be given by $eV>K$ wherein e is the fundamental charge of the particle and V is the applied voltage. The voltage may be in at least one range of about 1 V to 1 MV, 10 V to 1 MV, 100 V to 100 kV, and 1000 V to 50 kV. The electric field may be in at least one range of about 1 V/m to $10^8$ V/m, 10 V/m to $10^7$ V/m, 100 V/m to $10^6$ V/m, and 1000 V/m to $10^5$ V/m.

In an embodiment, the generator comprises parabolic mirrors with the ignition region located at a region such that the ignition-generated light is reflected to at least one of the windows, the lenses, and optical waveguides of the optical distribution system. The location of the fuel ignition point relative to the parabolic mirror may be at the focus or near the focus of the parabolic mirror. The lenses may comprise at least half-cylinder lenses with at least one of the fiber optic cables and optical waveguides aligned along an axis of each cylinder to receive focused light into at least on of the fiber optic cables and waveguides. The waveguides may comprise PV cells on the surfaces. The lenses may be embedded into the window to eliminate an optical interface. At least one of the windows, lenses, fiber optical cables, optical waveguides, and photovoltaic cells may be coated with a quarter wave plate or other optical coating to better impedance match incident light to the optical element such that the light is transmitted into or through the element. Components that do not serve as a window to the optical system, such as nontransparent walls of the cell, the electrodes, the fuel applicator, and other components upon which cell light is incident, may have reflective surfaces to cause the light to be reflected and ultimately transmitted to the optical distribution and photovoltaic conversion system. In an embodiment, at least one of the windows, and any optical elements such as mirrors, lenses, fiber optical cables, waveguides, and PV cell exposed to ignition products may be cleaned intermittently or continuously with a combination of gas and $H_2O$ while minimizing optical opacity wherein $H_2O$ has strong absorption bands for visible light. The rinsed products may be carried by a stream such as at least one of a gas and $H_2O$ stream to a collection area.

Consider the spherical Cartesian coordinate system with respect to the generator system as shown in FIG. 2A with the z-axis oriented vertically and the +x-axis oriented horizontally to the right hand side of the figure and the angle $\theta=0°,\phi=0°$ is along the z-axis. In an embodiment such as one shown in FIG. 2F, the light is incident on at least one mirror 40 tilted relative to the sides of the cell defined by structural support 1 such as one oriented about $\theta=45°,\phi=0°$ and one at about $\theta=45°,\phi=180°$ such that the light is reflected vertically to optical elements such as the lenses or waveguides of the optical distribution system. The light may be directed to the tilted mirrors by mirrors that surround the electrodes such as center plane mirrors 41 or parabolic mirrors. In an embodiment, the light is direct to a plurality of lenses that focus the light into optical waveguides that may have PV cells on at least on side or front surface. The angle of the mirrors may be any desired that achieves the desired reflection to the optical elements of the optical distribution system. The tiled mirror may be mounted outside of a system of widows that enclose the plasma wherein the light is transmitted through the windows, is incident on the mirrors, and is reflected to the optical elements. The light may be reflected vertically to a plurality of optical elements such as lenses or waveguides (slabs such as rectangular glass or quartz blocks). A mirror or system of mirrors such as a parabolic mirror or system may surround the electrodes to direct the light vertically. The light may further be directed vertically by performing at least one of confining the plasma such that it expands vertically and by causing the fuel to have kinetic energy in the vertical direction. The solid fuel may be accelerated vertically by injection. The injection may be achieved by pumping with a pump such as a rotary pump such as one comprising the rotating roller electrodes as well as by pneumatic, electrostatic, magnetic, and mechanical means of the disclosure. The top wall of the cell may comprise a window that transmits the light to an optical distribution system such as at least one of the system comprised of lenses, fiber optic cables, waveguides, and PV cells; the system comprising waveguides and PV cells, and the system comprised of beam splitters such as semitransparent mirrors and PV cells.

Figure 2G:
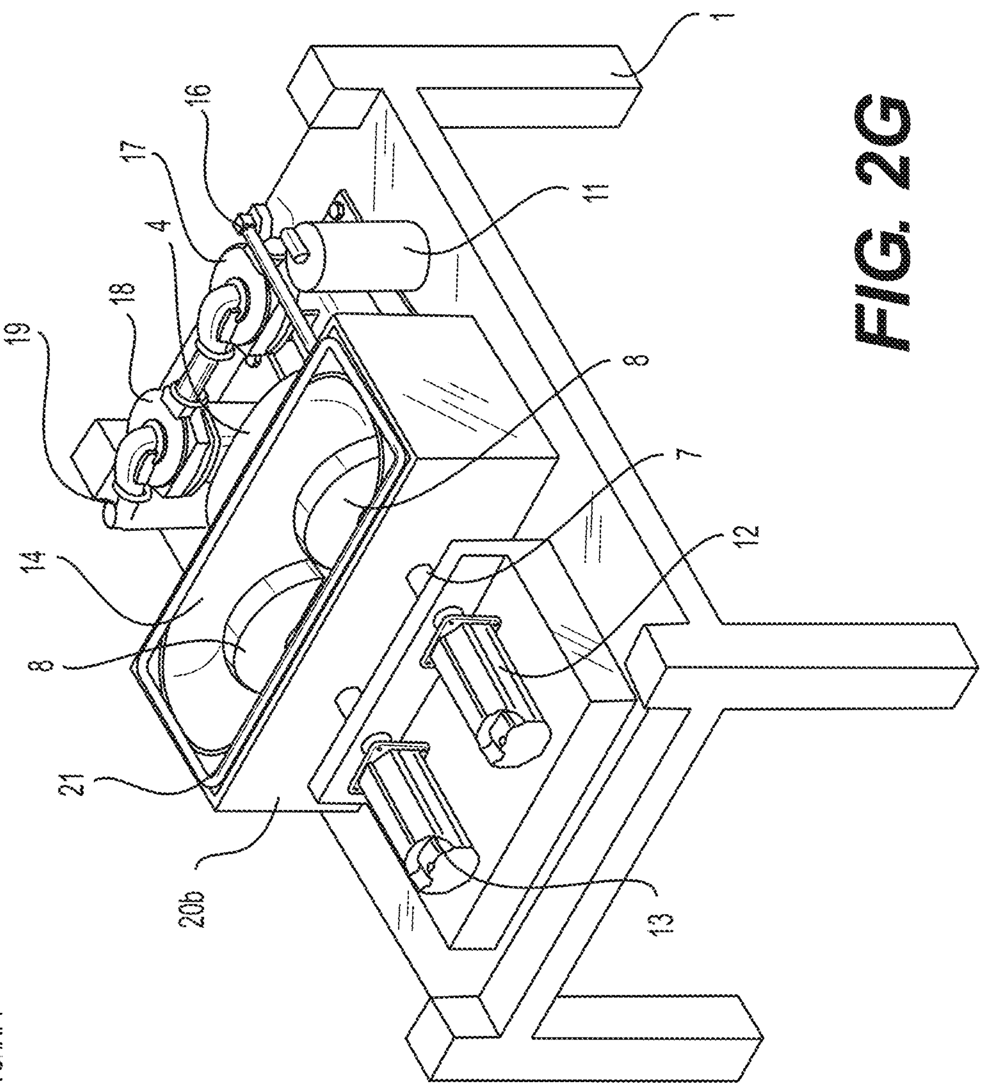
FIG. 2G is a schematic drawing of a SF-CIHT cell power generator showing the placement of motors, pumps, and other components outside of the region housing the roller electrodes in accordance with an embodiment of the present disclosure.
Figure 2J:
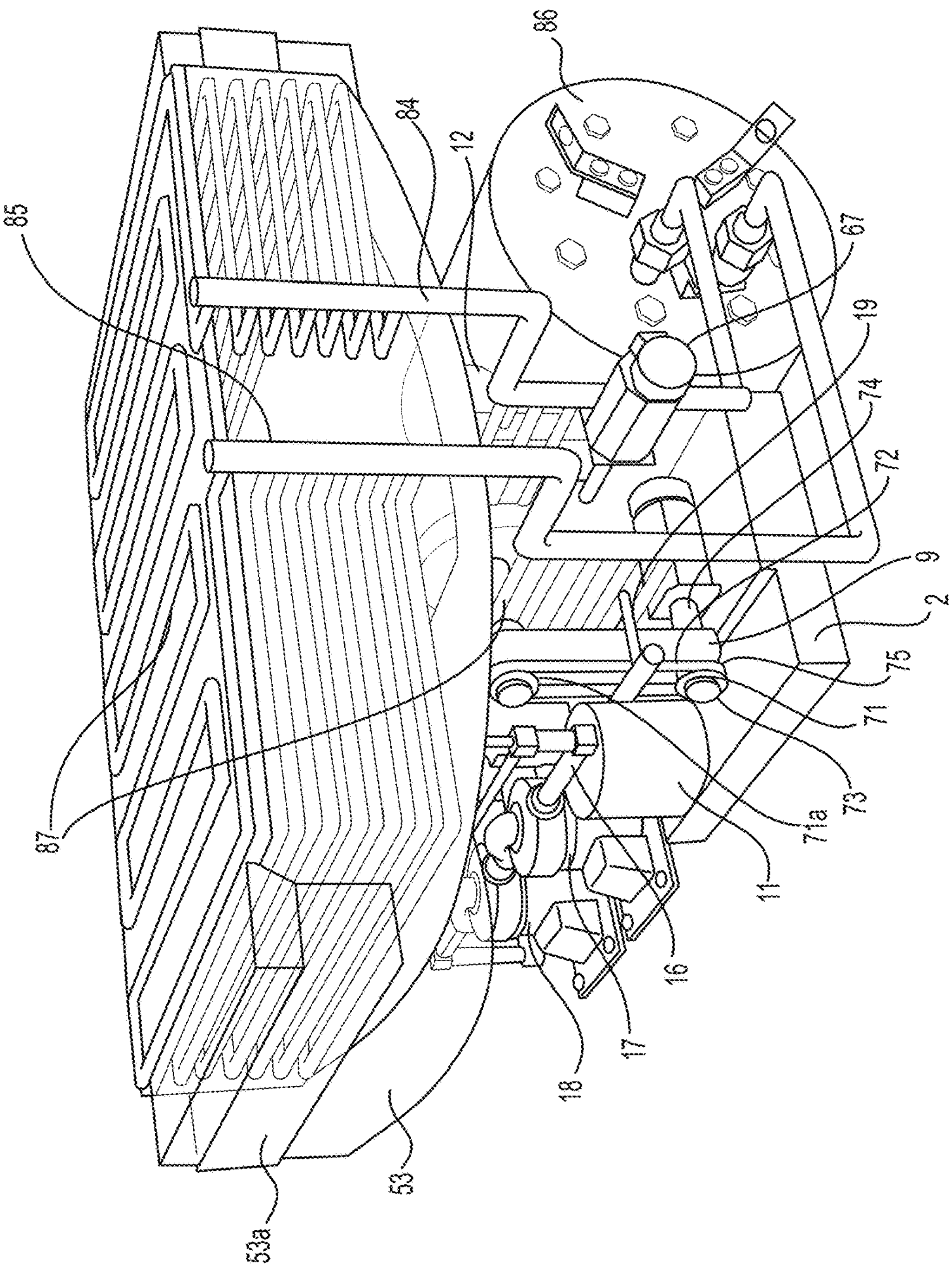
FIG. 2J is a schematic of a thermal power system in accordance with an embodiment of the present disclosure.

In an embodiment, at least one of the motors and pumps are outside of a sealed chamber to contain the plasma that has at least one window to transmit the light to the optical distribution system and PV converter. The light may be directed upwards to the optical distribution system and PV converter by means such as the parabolic mirror 14 that may sit such that the ignition occurs at about the center of the mirror. A schematic drawing of a SF-CIHT cell power generator showing the placement of motors, pumps, and other components outside of the region housing the roller electrodes is shown in FIG. 2G. Shafts that may be set on bearings may run to the rotating electrodes. The cell penetrations may be sealed. In an embodiment, the generator comprises independent motors to run each of the components such as the movable electrodes such as rotating roller or gear electrodes, electrode resurfacing systems such a dressing wheels, pumps such as sump pumps, sucking pumps, $H_2O$ ejection pumps, and gas ejection pumps. In another embodiment at least on of a plurality of motors may be replaced by a gearbox that runs off another motor. The gearbox may comprise an adjustable gearing to control the speed of actuation such as rotation. The control may be achieved using a computer or microprocessor.

The waveguides may have photovoltaic cells on at least one surface or side of the waveguide to receive the light trapped in the waveguide and transmitted through the surfaces. The entrances of a plurality of waveguides and be closely packed such that the maximum amount of incident light may be transmitted into the waveguides. The expanding plasma comprises a dynamic light source wherein the light enters the waveguides at different angles over time and thus may exist at direct side positions over time. In an embodiment, the change in waveguide light exit position to the PV cells scans the intense light over the PV cell surface over time to distribute the light intensity over time. The time distribution of the light may better match the maximum capacity of the PV cell. The waveguides may be arranged as a fan with the entrances in close contract and the waveguides spreading out more distally such that PV cells may be fastened onto the surfaces. Any surface not having a PV cell to receive the light may be mirrored. In another embodiment, the light is incident on a plurality of lenses that focus the light into the optical waveguides. The ensemble of waveguides and PV cells may be cooled. The cooling may be achieved by a circulating water flow about the waveguides and PV cells.

In an embodiment, the PV cells are concentrator cells that can accept high intensity light, greater than that of sunlight such as in the intensity range of at least one of about 1.5 suns to 75,000 suns, 10 suns to 10,000 suns, and 100 suns to 2000 suns. The concentrator PV cells may comprise c-Si that may be operated in the range of about 1 to 1000 Suns. The PV cells may comprise a plurality of junctions such as triple junctions. The concentrator PV cells may comprise a plurality of layers such as those of group III/V semiconductors such as at least one of the group of InGaP/InGaAs/Ge; InAlGaP/AlGaAs/GaInNAsSb/Ge; GaInP/GaAsP/SiGe; GaInP/GaAsP/Si; GaInP/GaAsP/Ge; GaInP/GaAsP/Si/SiGe; GaInP/GaAs/InGaAs; GaInP/GaAs/GaInNAs; GaInP/GaAs/InGaAs/InGaAs; GaInP/Ga(In)As/InGaAs; GaInP—GaAs-wafer-InGaAs; GaInP—Ga(In)As—Ge; and GaInP—GaInAs—Ge. The plurality of junctions such as triple or double junctions may be connected in series. In another embodiment, the junctions may be connected in parallel. The junctions may be mechanically stacked. The junctions may be wafer bonded. In an embodiment, tunnel diodes between junctions may be replaced by wafer bonds. The wafer bond may be electrically isolating and transparent for the wavelength region that is converted by subsequent or deeper junctions. Each junction may be connected to an independent electrical connection or bus bar. The independent bus bars may be connected in series or parallel. The electrical contact for each electrically independent junction may comprise grid wires. The wire shadow area may be minimized due to the distribution of current over multiple parallel circuits or interconnects for the independent junctions or groups of junctions. The current may be removed laterally. The wafer bond layer may comprise a transparent conductive layer. An exemplary transparent conductor is a transparent conductive oxide (TCO) such as indium tin oxide (ITO), fluorine doped tin oxide (FTO), and doped zinc oxide and conductive polymers, graphene, and carbon nanotubes and others known to those skilled in the art. Benzocyclobutene (BCB) may comprise an intermediate bonding layer. The bonding may be between a transparent material such a glass such as borosilicate glass and a PV semiconductor material. An exemplary two-junction cell is one comprising a top layer of GaInP wafer bonded to a bottom layer of GaAs (GaInP//GaAs). An exemplary four-junction cell comprises GaInP/GaAs/GaInAsP/GaInAs on InP substrate wherein each junction may be individually separated by a tunnel diode (/) or an isolating transparent wafer bond layer (//) such as a cell given by GaInP//GaAs//GaInAsP//GaInAs on InP. All combinations of diode and wafer bonds are within the scope of the disclosure. An exemplary four-junction cell having 44.7% conversion efficacy at 297-times concentration of the AM1.5d spectrum is made by SOITEC, France. The PV cell may comprise a single junction. An exemplary single junction PV cell may comprise a monocrystalline silicon cell such as one of those given in Sater et al. (B. L. Sater, N. D. Sater, "High voltage silicon VMJ solar cells for up to 1000 suns intensities", Photovoltaic Specialists Conference, 2002. Conference Record of the Twenty-Ninth IEEE, 19-24 May 2002, pp. 1019-1022.) which is herein incorporated by reference in its entirety. Alternatively, the single junction cell may comprise GaAs or GaAs doped with other elements such as those from Groups III and V. In an exemplary embodiment, the PV cells comprise triple junction concentrator PV cells or GaAs PV cells operated at about 1000 suns. In another exemplary embodiment, the PV cells comprise c-Si operated at 250 suns. In an exemplary embodiment, the PV may comprise GaAs that may be selectively responsive for wavelengths less than 900 nm and InGaAs on at least one of InP, GaAs, and Ge that may be selectively responsive to wavelengths in the region between 900 nm and 1800 nm. The two types of PV cells comprising GaAs and InGaAs on InP may be used in combination to increase the efficiency. Two such single junction types cells may be used to have the effect of a double junction cell. The combination may implemented by using at least one of dichroic mirrors, dichroic filters, and an architecture of the cells alone or in combination with mirrors to achieve multiple bounces or reflections of the light as given in the disclosure. In an embodiment, each PV cell comprises a polychromat layer that separates and sorts incoming light, redirecting it to strike particular layers in a multi junction cell. In an exemplary embodiment, the cell comprises an indium gallium phosphide layer for visible light and gallium arsenide layer for infrared light where the corresponding light is directed.

In an embodiment having irradiance ($W/m^2$) greater than that of the maximum illumination capacity of photovoltaic cells, the irradiance is reduced by an optical distribution system by at least one method of constantly distributing the light over a larger area of photovoltaic cells and by distribution of the light over a larger area in time. In the former case, the optical distribution system may comprise the system of lenses, fiber optical cables, exist slits, optical waveguides and photovoltaic cells of the disclosure wherein the entrance focus may be adjusted to cover an adjustable number of fiber optic cables and the fiber exit focus on the cells may be adjusted to control the photovoltaic active area illuminated by each fiber. Alternatively, the light may be split with at least one beam splitter such as a semitransparent mirror wherein the incident light is partially reflected to a PV cell or panel, and the transmitted light is ultimately directed to be incident on at least one other PV cell, PV panel, or another portion of the PV panel.

In the time distribution method, the optical distribution system may comprise a plurality of movable optical elements that may receive light from the ignition of solid fuel and raster or scan the light across a plurality of receiving optical elements such as lenses, mirrors, fiber optic cables, and optical waveguides that receive the light and transport it to photovoltaic cells. Alternatively, the light is rastered or scanned across a plurality of photovoltaic cells. The movable elements may comprise at least one of active mirrors and active lenses. The movable optical elements may raster or scan in time at a frequency that divides the light amongst the receiving optical elements and delivers it to the photovoltaic cells such that the utilization of the photovoltaic cell capacity is maximized. In an embodiment the frequency of the raster or scanning of the light across the receiving elements is at a frequency greater that the response time of the photovoltaic cells such that the irradiation is effectively constant. This rate comprises the time fusing rate. In embodiments, the rater or scanning rate may be faster or slower as desired with in the range of about 1% to 10,000% of the time fusing rate. In an embodiment, the movable optical elements such as active mirrors or lenses comprise piezoelectric, pneumatic, and mechanical actuators. Exemplary components of the scanning mirror system such as dynamic mirrors such as piezoelectric tip/tilt mirrors, and steering mirrors, and auxiliary system components such as motorized micro-positioning stages and actuators, motor controllers, and position sensors are given at http://www.physikinstrumente.com/en/products/prdetail.php?sortnr=300710.

In an embodiment, the movable optical elements comprise a segmented mirror. In an embodiment, the segmented mirrors are driven by at least one of piezoelectric, pneumatic, and mechanical actuators. In an embodiment, the movable optical elements comprise rotating mirrors such as rotating polygonal mirrors that raster or scan the light across the receiving optical elements. The raster or scanning modulates the light into the receiving optical elements such that the modulated light has a time-averaged lower intensity than the light incident upon the movable optical elements. The receiving optical elements may comprise at least one of optical waveguides and PV cells. The waveguides may have PV cells mounted on at least one surface to receive the light and convert it into electricity. The entrance to the optical waveguides may be close packed and the distal parts may spread into intervening spaces between the plurality of waveguides to provide space to mount the PV cell on the surfaces comprising at least one of edges and faces. The receiving elements may comprise lenses that focus the light onto other optical elements such as at least one of waveguides, fiber optic cables, mirrors, and PV cells. In an embodiment, the modulation of the light by the movable optical elements may be controlled using the PV output power as a function of time that changes in responds to the light alignment into the receiving optical elements and the scan or raster rate giving rise to optical power input to the PV cells and corresponding electrical power output.

In an embodiment, the optical distribution system comprises a window such as the one at the top of the cell and a lens system comprising at least one lens to defocus the incident light. The lens system may comprise a plurality of lenses. The lenses may be attached to the window to decrease the number of optical interfaces. The defocused light may be incident on the PV converter that comprises at least one PV cell. The defocused light may be incident on at least one optical element such as at least one mirror, lens, fiber optic cable, and waveguide that directs the light to the PV converter. Another, means to spatially decease the light intensity to be compatible with the capability of PV cells is to place the cell at a greater distance from the light source covering a larger area. The light of reciprocal distance squared intensity decrease may be directly incident or secondarily incident from at least one optical element such as at least one mirror, beam splitter, lens, fiber optic cable, and waveguide.

Referring to FIGS. 2C, 2C1, 2C2, 2D, and 2E, in an embodiment, the light is transmitted through a window 20 such as one at the top of the cell 26 and is incident on an optical distribution and photovoltaic conversion system **26*a* comprising a plurality of semitransparent mirrors 23 such as at least one spatially repeating stack of a series of semitransparent mirrors. The mirrors are mounted to a support structure. Each mirror such as a rectangular mirror pane or panel may be mounted with fasteners such as end brackets 22 to a support structure to avoid any light blockage by the mirror fasteners or supports. In an embodiment, the semitransparent mirror 23 comprises an optical element known in the art as a beam splitter with the exception that the cell light comprises a wavelength band and is not monochromatic, not coherent, and may comprise divergent rays. Each mirror 23 reflects a portion of the incident light to at least one corresponding photovoltaic cell or panel 15 and transmits the remainder of the light to the next mirror in the series. In aggregate, the stack of mirrors serves as an optical distribution system to reduce the intensity of the light from the cell and makes it incident on photovoltaic cells or panels 15 at an intensity for which the photovoltaic cells 15 are capable of converting the light to electricity. The mirror stack architecture may resemble that of Venetian blinds or louvers each comprised of louver slats. The vertical separation of each (n+1)th mirror from the nth is such that the transmitted light is incident on the surface of the (n+1)th mirror and the light reflected from its surface is not blocked by the nth mirror. The angle of each mirror relative the inter-mirror axis called the z-axis may be the same or different. The angle may be such that the reflected light from the (n+1)th mirror is not blocked by the backside of the nth mirror. The mirror angle may be such that the light is reflected to a location other than back into the cell. The light may be reflected to at least one of another optical element and a PV cell. The angle of the mirror relative to the inter-mirror axis called the z-axis may be in at least one range of θ=1° to 89°, θ=10° to 75°, and θ=30° to 50°. The vertical separation of each (n+1)th mirror from each nth may be at least the width of each mirror times the cosine of the angle with the z-axis. In an embodiment the mirrors are at an angle of about θ=45° to the z-axis, and the separation distance is at least about 0.71 times the width of the mirror. The length of each mirror may be such to receive all or essentially all of the light emitted from the cell. In an embodiment, the vertical separation of each (n+1)th mirror from each nth may be less than the width of each mirror times the cosine of the angle with the z-axis wherein each mirror is semitransparent (some reflectivity) for light traveling with the incident direction on the front of the mirror facing towards the cell and is transparent (essentially lacks reflectivity) for light traveling with the incident direction on the back of the mirror facing away from the cell. A PV cell may be positioned in the xy-plane transverse to the light propagation direction to cap the louver stack of mirrors by receiving the remaining light that is not reflected by the mirrors of the louver stack of mirrors. A schematic drawing of a SF-CIHT cell power generator showing a perspective inside of the optical distribution and photovoltaic conversion system 26***a* comprising semitransparent mirrors 23 and photovoltaic cells 15 is shown in FIG. 2E.

In an embodiment, the light is made incident to a light trapping cavity such as the one shown in FIG. 2E having semitransparent mirrors that reflects the light onto at least one of a plurality of photovoltaic cell types. The photovoltaic cells may comprise light incident surfaces in the cavity. The PV cell types may be selective for different wavelength regions such as visible versus near infrared. The reflection may be such that light is optimally trapped in the cavity wherein it can undergo multiple reflections until it is absorbed by a photovoltaic cell wherein photons of a wavelength band are selectively absorbed by the photovoltaic cell type that is selective for the same optical band. In an embodiment, light incident on a photovoltaic cell that is not selective for the corresponding wavelength to create electrons and holes is reflected to the cell that is selective. The reflectivity may be achieved by a reflective backing on each photovoltaic cell such as a conductive metal backing. In an embodiment, a dichroic filter may be on the face of the photovoltaic cells. The dichroic filters may select the light appropriate to match the selectivity of the photovoltaic cell. The non-selected light may be reflected to another photovoltaic cell that is selective to the reflected light. The light may undergo multiple reflections and even undergo a trajectory having a plurality of incidences on a given photovoltaic cell until selective absorption occurs. In this case of multiple bounces and incidences of the light, the efficiency may be increased. The splitting of the light by the dichroic filters may also improve the efficiency of light to electricity conversion. In an embodiment, the light passes through a light valve and is trapped in the light cavity wherein the light is incident upon at least one PV cell and may undergo at least one bounce to be incident on the PV cell or others of a plurality of PV cells. The trapped light is least partially converted into electricity. In an embodiment, at least one first photovoltaic cell of a given wavelength region sensitivity may serve as a dichroic filter for at least another photovoltaic cell of a different wavelength region sensitivity. The first photovoltaic cell may absorbed the light for which it is selective and reflect the non-selected light onto at least one of the another photovoltaic cells having a different wavelength region sensitivity. The first and at least another photovoltaic cell may have orientations such that the first cell receives light from the ignition of fuel and reflects light onto at least one another photovoltaic cell. The non-selected light may be reflected from the first to the another photovoltaic cell that is selective to the reflected light. The light may undergo multiple reflections and even undergo a trajectory having a plurality of incidences on a given photovoltaic cell or at least one another photovoltaic cell until selective light absorption and light to electricity conversion occurs.

In an embodiment, the material of the mirror causes the partial light transmissivity and reflectivity. In another embodiment, the mirror medium such as a gas, liquid, or solid that surrounds the mirrors has a permittivity that causes the selective transmission and reflectance due to the appropriate change in permittivity at the medium-mirror interface. In an embodiment, the mirrors may have a shape other than flat such as hemispherical, curved, polygonal, and wavy such as sinusoidal. In an embodiment, the back of each PV cell or panel may be mirrored such that light in the columns between PV panels is ultimately reflected or directed to the PV cells or panel faces. In another embodiment, PV material may be on both sides of the vertical cells or panels 15 as shown in FIG. 2E such that PV material receives reflected light from the semitransparent mirrors, and at least one of randomly reflected, scattered, and propagating light within the columns may be received by the opposing PV wall of the column to convert that light to electricity. The PV material may sandwich a shared heat sink such as a water-cooled heat exchanger.

Alternatively or in addition to the vertical orientation, the optical distribution and photovoltaic conversion system 26*a* may be oriented with a horizontal axis of photon propagation, and the light of the cell maybe be at least partially directed along this horizontal axis by at least one of cell emission in the horizontal direction and by light refraction, reflection, or secondary emission in the horizontal direction by at least one optical element such as a mirror, lens, and waveguide.

In an embodiment, the optical distribution and photovoltaic conversion system 26*a* comprises a plurality of mirror stacks 23 each with a contiguous corresponding PV cell panel 15 wherein each stack of mirrors 23 directs its reflected light to a corresponding PV panel 15. The PV panels 15 may be made as thin as possible to avoid shadowing the mirror stacks. The base of each PV panel 15 may comprise at least one optical element to reflect or otherwise direct the light incident each PV panel base to the stack of mirrors. For example, angled mirrors covering the footprint of the base of each PV panel may redirect light incident on each base so that it is ultimately directed to a mirror stack and its corresponding PV panel. Alternative, the base may be covered with at least one lens such as a cylindrical lens to direct the light incident on the base to at least one of a photovoltaic cell and a mirror. The light may also be directed back into the cell and further reflected to the PV converter. The system of mirror stacks and PV panels oriented along the z-axis may comprise a PV converter tower for receiving light from the cell 26 through window 20 and converting it to electricity. The angle of each mirror may be adjustable and dynamically changed in response to the incident light to make a desired distribution of light on the corresponding photovoltaic cell or panel.

The reflectivity of the mirror may be variable along the axis of the transmitted light. The variability may be such to optimize the light distribution to the cells to achieve the highest capacity and efficiency without damaging the cells with excessive incident power. In an embodiment, the light intensity decreases as a function of vertical position in the stack away from the light source. Thus, in an embodiment, the reflectivity of the mirrors may correspondingly increase as a function of vertical position such that the amount of light reflected onto each area of the corresponding photovoltaic cell or panel may be about constant. The last mirror of the vertical stack may be about 100% reflective such that no light is lost from the stack. The light from the cell is about 100% directed by the mirror stack to be incident on photovoltaic cells or panels. In an embodiment, the reflectivity (R) and transmissivity (T) may be in at least one range of about R=0.0001% to 100% and T=0% to 99.999%, R=0.01% to 95% and T=0.01% to 95%, and wherein the reflectivity may increase and the transmissivity may decrease as a function of the vertical position along the stack, and the reflectivity and transmissivity may be within at least one of the ranges.

In an embodiment, the reflectivity may be controlled dynamically. A suitable active element having a variable reflectivity is an electro-optical device such as an electrochromic mirror. The dynamic reflectivity may be controlled by a controller such as a microprocessor. The reflectivity may be controlled in response to the power output of the PV cell that receives light from its corresponding mirror. The control may achieve optimal irradiation of the PV cell to achieve at least one of peak efficiency and peak power output without damaging the cell. The mirror material may comprise a material having low losses for visible wavelengths such as a fiber optical material. In an embodiment, each mirror angle and the reflectivity and transmissivity of each mirror are adjustable. The former may be changed with a servomotor or other actuator such as those of the disclosure, and the latter may be adjusted by changing the applied voltage on a mirror that changes the opacity of an electrochromic mirror coating.

In an embodiment, a part of the light spectrum is selectively reflected and transmitted at a given mirror. Then, in an embodiment, the corresponding photovoltaic cell has a selective response to the selectively reflected wavelengths. At least one other mirror in the stack above the nth mirror may be selective to reflect at least a portion to the selectively reflected light and direct the light to the corresponding photovoltaic cell or panel that has a selective response to the selectively reflected wavelengths. The wavelength selective reflectance of the mirrors and response matched corresponding PV cells or panels may repeat as a function of position along the stack to optimize the wavelength dispersion along the stack of mirrors to achieve at least one of higher power and efficiency than in the absence of the selectivity.

In an embodiment, longer wavelengths are increased from the bottom towards the top of the stack due to the selectivity of the reflectivity. In an embodiment, the corresponding PV cells on the bottom are selective for shorter wavelengths, and the PV cells on the top are selective for longer wavelengths. In an exemplary embodiment, the mirrors on the bottom layers are selective to reflect visible and transmit infrared, and the corresponding PV cells have high efficiency for visible light. The mirrors on the top layers are selective to reflect infrared and the corresponding PV cells have high efficiency for infrared light. Suitable visible PV cells are monocrystalline silicon or GaAs and suitable infrared cells are germanium or silicon germanium. Suitable exemplary materials for the wavelength selectivity are dichroic mirrors, dichroic reflectors, and dichroic filters. In an embodiment, the PV cells 15 may be at least one of actively and passively cooled. The cooling system may comprise heat sinks such as fins. The heat sinks may be comprise of a highly thermally conductive material such as aluminum or copper. The heat sink may be cooled by at least one of gaseous or liquid medium such as air and water, respectively. In an embodiment, the PV cells 15 may be cooled with at least one of air cooling such as by air jets directed at the PV cells and by water cooling such as water flow over the back surface of the PV cells or PV panels to a heat exchanger such as a radiator or chiller to reject the heat. The radiator, may be at least one of convection, conduction, and forced convection cooled. Another gas such as helium may be substituted for air as the gas coolant. In an embodiment, each PV cell is cooled with a microchannel cooler such as one on the back of the cell wherein the coolant such as at least one of $H_2O$ and ethylene glycol is circulated through a heat rejection system such as at least one of a heat exchanger and a chiller. In an embodiment, the mirrors of the optical distribution system **26*a*** may be cooled by at least one of conduction, convection, forced air cooling, and water cooling. The water-cooling system may comprise microchannel along the mirrors that minimize the light blockage. The light may be reflected or refracted at the position of the microchannels by the corresponding optical element.

Referring to FIG. 2C1, the window 20 and the mirror 14 exposed to ignition products may be cleaned intermittently or continuously with a combination of gas and $H_2O$ while minimizing optical opacity wherein $H_2O$ has strong absorption bands for visible light. In an embodiment, a thin layer of the stream material such as the gas or $H_2O$ stream material is maintained to protect the window 20 from damage from the plasma. The ignition product may be rinsed from a collection area such as 24 and ultimately flowed into the trough 5 with a water stream. The excess water may be removed. The trough 5 may be at the bottom of the cell 26. The rotating electrode such as roller or gear electrodes 8 may be immersed in solid fuel slurry in the trough 5. The movable electrodes such as the rollers may transport the fuel slurry to the contact region between the pair of roller electrodes 8 to cause ignition.

In an embodiment, the infrared wavelengths are separated from the shorter wavelengths and transmitted from the cell in a region where the water attenuation is minimized by limiting the $H_2O$ transmission path. The separation may be achieved inside of the cell. The separation may be by means such as a dichroic mirror. The infrared light may be at least one of transmitted, reflected, and focused optionally to the optical distribution system and to the photovoltaic converter using systems and methods of the disclosure. Gas may be used to retrieve and recirculate the fuel in the region in proximity to the window 20 to avoid light attenuation by water. Gas may be used to push downward any upward traveling ignition products to maintain the transparency to light.

In an embodiment, the solid fuel is recirculated by transporting the ignition product to mirror 14 (FIG. 2C) by at least one of gas and $H_2O$ streams. In an embodiment shown in FIG. 2C1, the generator comprises a gas supply such as an argon gas supply 29 and gas jets such as argon jets of an argon distribution system 30 to suppress the ignition product downward and to clean the window 20. The argon jet may comprise an argon knife at the window 20 to clean it. FIG.

2C2 shows another angle of the gas recirculation system. The gas jet fuel retrieval and recirculation system may comprise at least one of a gas pump inlet 37*a*, a gas pump 37 and a gas blower, and a gas pump return line 38 in addition to the gas distribution line and jets 30. The gas jets and pump and blower may be positioned to achieve the retrieval and recirculation. In an embodiment, the gas flow pattern is down the center of the cell against the ejecting plasma with return flow from the perimeter at the top of the cell. The ignition products may be forced onto the parabolic mirror 14 and rinsed into the slurry trough 5 through the back side of the rotating roller electrodes 8 with $H_2O$ jets 21 trained onto the parabolic mirror 14. The water jets may be positioned to form water flow patterns to achieve $H_2O$ recirculation. An exemplary pattern on the parabolic mirror is down the center along the back of the roller electrodes on each side with return flow from the perimeter of the parabolic mirror. The water reflections may randomize the light distribution across the optical distribution and photovoltaic conversion system.

In an embodiment, a gas flow in the opposite direction of the ignition plasma expansion direction is provided by a gas flow system. Regarding FIGS. 2C1 and 2C3, in an embodiment, the direction of forced gas flow may be in the negative z-direction wherein the average direction of the expanding ignition plasma is in the positive z-direction. The gas flow system may comprise a fan that may comprise a plurality of fan blades. The fan may be transparent to at least a portion of the spectrum of the light emitted by the plasma such as the visible and near infrared spectrum. The fan may comprise a plurality of movable window slats (louver slats) 39. In an embodiment, the window 20 may be flat. The fan may comprise a louver fan 20*a*. The louver fan may comprise a plane window, parallel to window 20 when the slats 39 are in the closed position. In an embodiment, the slats may be at least one of cupped or curved and staggered in angular orientation relative to each other to better move gas. In an embodiment, the slats are angularly oriented relative to each other such that the ensemble of slat edges sweeps out a traveling wave as the slates rotate. In another embodiment, the slats are paired, and contiguous slats rotate in opposite directions. In an embodiment, the slats are mounted offset from the center longitudinal axis to better move gas. In an embodiment, the slats are mounted to rotate about one longitudinal edge. Each slat 39 may be joined to a bracket 40 at the both ends of each slat. The each bracket 40 may be attached to a bracket holder 41 by a pivot or bearing 42 such that each slat can freely rotate around the longitudinal slat axis. The slat brackets 40 may be at the ends of each slat 39 to prevent light blockage through the louver fan 20*a*. The slats may be comprised of quartz or glass such as fiber optics glass or PV cover glass that has a minimum attenuation of the visible and near infrared light from the plasma. The edges of the slats 39 may be mirrored to reflect edge-on light. The slat rotation may time-average the reflections and reflections of the incident light to form a uniform distribution across the optical distribution and photovoltaic conversion system 26*a*. The louver fan may comprise a light distribution system for the optical distribution system. The slats may be driven by at least one electric motor 43. The rotation of the plurality of slats may be in tandem or synchronized. The coordinated rotation may be achieved by synchronized motors or a single motor having a plurality of drive connections. In an embodiment, each slat may comprise a dual pulley 44, one driven and one a driver of the contiguous slat. Each dual slat pulley 44 may be driven by a drive belt 45, and the pulley 44 may drive the contiguous slat with a slat belt 46. Each large pulley may have an idler to prevent belt slippage. Alternatively, the belt 45 and 46 may comprise a notched timing belt or a chain. Alternatively, other connections known in the art such as gears or chains may drive the slat rotations. The rotation of the slats may be driven to cause the negative z-axis directed gas flow. During a rotational cycle, the downward rotation of the leading slat edge pushes the gas down directly and the corresponding upward rotation of the slat trailing edge pushes gas upwards against the window 20 that redirects the gas downward. Thus, clockwise or courter clockwise rotation results is a downward directed gas steam (along the negative z-axis).

The roller electrodes may serve as an upward rotary pump for solid fuel and a downward rotary pump for at least one of gas and $H_2O$. In an embodiment, roller gasket 47 prevents slurry from being hurdled onto the optic elements such as louver fan 20*a* and window 20. In the event that at least one of some slurry is inadvertently hurdled to the optics by an event such as a failure of roller gaskets such as 47 or an ignition misfire, and ignition powder accumulates on the optics, then the slurry can be cleaned with at least one of a gas jet, gas knife, water jet, and water knife. In addition to forcing the ignition products downward onto the parabolic mirror 14, the slat rotation may mechanically remove any adhering ignition products not stopped by the downward directed gas. The gas turbulence produced at the slats and at the top window 20 further serves to maintain these surfaces free of adhering ignition products. This louver fan comprising a rotating slat or vane recirculation system may further comprise a sensor for product adherence on the slats or vanes and a slat or vane cleaner such as at least one gas knife and at least one $H_2O$ jet that may comprise a steam jet. The gas flow of the louver fan may further serve to cool at least one of the window 20, the louver fan 20*a*, and the louver fan components such as the slats 39.

As shown in FIGS. 2G1 and 2G1*a* the louver fan blows the gas in direction from the window at the top of the cell to the parabolic mirror 14, and the return gas flow may be through ducts 53 with gas collection inlets 64 at the lower edge of the cell such as at the edges of the parabolic mirror 14. The return gas may be channeled to the region between the window 20 and the louver fan 20*a*.

In another embodiment shown in FIG. 2G1*b*, the louver fan shown in FIG. 2G1 may be replaced by a perforated transparent window 20*c*. The top window 20 and the lower perforated window 20*c* may form a cavity. The windows may be parallel. The windows may be parallel plane windows. The cavity may receive pressurized gas from the gas distribution ducts 53. As shown in FIG. 2G1*c* the pressure and flow of gas into the cavity may be maintained by the duct blowers 53*a*. The pressurized gas may flow through the perforations to be distributed downwards to suppress the upward flow of ignition products as in the case of the louver fan embodiment. The downward transported ignition products may be rehydrated to form solid fuel that is recirculated as described in the disclosure.

Regarding FIGS. 2G1, 2G1*a*, 2G1*b*, and 2G1*c*, at least one of a duct pump and a duct blower 53*a* may be in-line of the ducts 53 to increase at least one of the return gas flow rate, volume, and pressure in the ducts 53 and well as at least one of the downward gas flow rate, volume, and pressure from the top of the cell by the louver fan 20*a* and perforated window 20*c*. The at least one of a pump and a blower 53*a* may further provide suction of the gas at the level of the parabolic mirror 14. The gas may be sucked from the region of the parabolic mirror 14 through duct inlet 64*c*, plenum 65, and duct 53 into the blower inlet 64*a* by the blower 53*a* that exhausts the gas through the blower outlet 64*b*. The gas may flow through the duct 53 and another plenum 65 into the region between the window 20 and the louver fan 20*a* or the perforated window 20*c*. The gas in the ducts may be cooled with a heat exchanger and a chiller. In other embodiments, the parabolic mirror 14 may be replaced by other structural elements and reflectors such those that serve as a means to collect ignition products and direct them to the slurry trough and those that may also serve as a reflector to direct the light power of the cell toward the photovoltaic converter. An exemplary alternative to the parabolic mirror is a chute having reflective walls.

In an embodiment, the blower means comprises a circumferential fan such as a cyclonic fan such as one commercially manufactured by Dyson.

Regarding FIGS. 2G1, 2G1*b*, 2G1*c*, and 2G1*d*, in alternative embodiments, the duct blower 53*a* provides gas suction in the electrode housing 20*b* through at least one of ducts in at least one sidewall and through a frit 49 under the slurry and into the underlying duct connected to the return ducts 53. In an embodiment, the gas collected from the frit 49 is sucked into the duct 65 by pump 18 through line 19, transferred to injection pump 17, and ejected at jets 21 supplied by line 16. In other embodiments, water replaces gas as the recirculation medium. At least the elements 16, 17, 18, 19, 21, 49, and 65 are capable of recirculating a liquid medium such as water as given in the disclosure.

In an embodiment, the generator comprises a powder only ignition product recovery and recirculation system wherein the ignition product dust is blown downward with a blower means such as the louver fan 20*a* and perforated window 20*c*. The gas is flowed through channels 52 (FIGS. 2G1 and 2G1*b*) in the downward rotating portion of the rollers. The channels 52 connect to conduits, and the gas flows through the conduits and is bubbled under the slurry 48 surface to mix the ignition product dust with the wet slurry. The gas may be recovered through at least one screen at the side or bottom 49 of the slurry trough 5 that may comprise the electrode housing 20*b*. In an embodiment, the side gas return ducts are under the parabolic mirror 14 and above the slurry trough 5 and slurry 48 that sits under the parabolic mirror. The gas may be flowed into ducts 53 to return at the top of the cell such as the region between the window 20 and the louver fan 20*a* or perforated window 20*c*. In an alternative embodiment, the gas may flow through the peripheral side of each roller electrode 8, through channels 52 and is drawn into ducts 53 that extend to connect with the electrode housing 20*b*. The suction may be provided by the gas duct blower 53*a*. The blower may force the gas to be ejected at the top of the cell through ducts 53. In another embodiment, the gas duct may be the sidewall of the electrode housing 20*b* of FIG. 2G1. In this embodiment, the ducts for the gas lines may be under the parabolic mirror 14 and above the slurry that sits under the parabolic mirror.

In an embodiment shown in FIGS. 2G1 and 2G1*b*, gas is moved in the opposite direction as the plasma expansion direction such as in the downward or negative z-axis direction. The gas may be flowed downward by the louver fan 20*a* or perforated window 20*c*. The gas may be channeled along the surface of the parabolic mirror 14 and flowed into channels on the outer portion of the rotating rollers 8 where they are rotating in the downward direction. The rotating roller may serve as a rotary pump to move the gas into the electrode housing 20*b* under the parabolic mirror 14 wherein the ignition products that are flowed along by the gas may come into contract with the slurry in the trough 5 that may comprise the electrode housing 20*b*. The channel outlet for the gas may be over or under the slurry surface such that the gas and the transported ignition products powder come into contact with the slurry, and the powder becomes part of the slurry. Gaskets 47 along the side surfaces of the roller electrodes 8 may contain the slurry in the electrode housing 20*b* area except for that rotary pumped to the roller contact area and ignited. In another embodiment, the powder circulates with the gas in the electrode housing 20*b* wherein the gas flows through the slurry 48 and out a selective gas permeable membrane 49 to ducts that serve as conduits for the gas to return to the top of the cell. In an embodiment, the gas must at least one of contact the surface of the slurry and flow through the slurry in order to flow out the selectively permeable membrane such as a fine screen such as a fine stainless steel mesh screen or a frit 49 to enter the ducts. An exemplary screen comprises a stainless steel mesh in the range of about 5 to 50 microns. Alternative embodiments of the screen 49 are shown in FIGS. 2G1, 2G1*b*, and 2G1*d*.

In another combined gas and $H_2O$ recirculation system embodiment shown in FIGS. 2G1, 2G1*a*, 2G1*b*, 2G1*c*, and 2G1*d*, the louver fan 20*a* or perforated window 20*c* pushes the ignition products downward, and the gas is returned to the region between the window 20 and the louver fan 20*a* or perforated window 20*c* through gas collection ducts 64 along the periphery of the parabolic mirror and gas distribution ducts 53. The gas flow may be accentuated by duct blower 53*a*. The ignition products that are forced onto the parabolic mirror 14 by the downward gas flow may be washed into the slurry trough by $H_2O$ jets 21 that may comprise at least one steam jet. In an embodiment, the mirror 14 comprises a surface such as quartz, glass, or Pyrex onto which $H_2O$ adheres by surface tension. The water may flow into the slurry trough through channels 52 of FIGS. 2G1 and 2G1*b*, and excess water may be removed by suction such as by suction by water sucking pump 18 through a water permeable membrane, barrier, or filter 49 in contact with the slurry 48 such as at the sides or bottom of the slurry trough 5. The membrane may be selective for water such that the solid reactants of the solid fuel remain in the slurry trough. The membrane, barrier, or filter 49 may comprise a mesh such as a stainless steel mesh or a frit such as a porous ceramic frit or a metal frit such as a 25 micron stainless steel screen. At least one of the rate and extent that water is pumped from the slurry containing excess water may be controlled by controlling at least one of the area of the membrane, barrier, or filter and the differential pressure across the barrier. In an embodiment, the rate of $H_2O$ flow through the screen 49 may be increased with agitation such as that provided by a stirrer or vibrator. In an embodiment, at least one of the rate and extent that water is pumped from the slurry containing excess water is controlled by controlling at least one of an increased pressure on the surface of the slurry in the trough 5 and a vacuum on the slurry in contact with the membrane, barrier, or filter. The pressure gradient may be measured with a sensor. In an embodiment, water can be pumped backward to unclog the membrane, barrier, or filter in the event that it becomes clogged. The unclogging may be controlled by a controller in response to a flow sensor. The differential pressure may be achieved and maintained by the water sucking pump 18. The water may be sucked into water suction inlet 65 and water sucking line 19. The water may be recirculated by water ejection pump 17 through line 21 supplied by line 16. The trough 5 that may comprise the electrode housing 20*b* may further comprise a $H_2O$ sensor 50, and the hydration at the slurry may be maintained in a desired range such as one of the disclosure by addition of water from the water reservoir 11 in response to the hydration reading. The reading and control of the hydration level may be achieved by a controller such as one comprising a computer. Exemplary slurry hydration sensors comprise at least one of a sound propagation velocity, thermal conductivity, and electrical conductivity sensor. The generator may further comprise at least one slurry agitator 66 driven by slurry agitator motor 67 to at least one of mix the water and fuel to form and maintain the slurry, facilitate the removal of excess $H_2O$ from the slurry by means such as suction across membrane 49, and push slurry into the region where the rotating electrodes 8 can draw it into the ignition process. In another embodiment, the water is removed by centrifugation. The water may flow through a frit and be removed by the pumps.

Each agitator may comprise an auger. Each agitator may comprise a plurality of mixer blades such as a pair of mixer blade per agitator. The blades may rotate in opposite directions such as in the case of a commercial dual blade mixer. In another embodiment, the auger may be driven by one motor that turns a single shaft wherein the pitch of the augers on opposite halves have opposite handedness. The generator may further comprise a source of hydrogen such as at least one of a hydrogen tank 68 and a $H_2O$ electrolysis system having a means to supply hydrogen alone such as a selective membrane or other systems know by those skilled in the art. The hydrogen may be supplied to the cell through hydrogen feed line 70. The generator may further comprise a hydrogen sensor 69 and a means to control the hydrogen partial pressure such as a controller than may comprise a computer. The generator may comprise an external hydrogen sensor and an alarm to warm of an external hydrogen leak. The controller may disable the generator and stop the hydrogen flow from the source in the event of an external hydrogen leak.

In an embodiment shown in FIG. 2G1*d*, the slurry trough 5 comprises sides the may be sloped. The slope may connect a larger surface area top perimeter section to a smaller surface area bottom section. The bottom may be in the shape of a channel such as a U shape. The channel may house the agitators 66. At least one slurry trough side wall such as the two opposing long walls of a rectangular topped slurry trough may be V-shaped and may taper to connect the rectangular top to the U-shaped base. The V-shaped walls may comprise the water permeable membrane 49. The trough comprising V-shaped walls may further comprise external housing walls 20*d* that form a vacuum tight water chamber 20*e* to receive water sucked through the water permeable membrane 49. The suction may be provided by water sucking pump 18 that draws the water out of the chamber 20*e* through the water sucking line 19. The water may be ejected through jets 21 by the pressure from the water ejection pump 17 supplied by line 16 (FIGS. 2G1 and 2G1*b*). The ejected water may rinse the ignition powder into the slurry trough 5. In an embodiment shown in FIG. 2G1*d*, the slurry agitators such as augers 66 are under the rollers 8 such that they feeds slurry from both sides into the middle wherein it wells up to be sucked into the rollers for ignition. The rinse from the parabolic mirror 14 may be at the ends away from the center wherein the slurry may sink to the underlying auger 66 to be mixed and be forced up with the welling action. The slurry flow may comprise a mixing circulation in the slurry trough 5. In another embodiment, chamber 20*e* contains gas and water, and the generator system further comprises a vacuum pump that maintains suction across the water permeable membrane/frit 49. The pump inlet may be above the water level in chamber 20*e* and penetrate the electrode housing 20*b*. A pump inlet line may receive gas from the chamber 20*e*, and a pump output line may exhaust the gas to another region of the cell outside of at least one of the slurry trough 5 and electrode housing 20*b*. In an embodiment, the gas may be exhausted to the duct 53. In an embodiment, the gas pump pressure and water pump pressure are controlled such that the desired water suction through the water permeable membrane/frit 49, the water suction through the water pumps 18 and 17, and the gas pumping by the gas pump are achieved. In an embodiment, the relative pump pressures are controlled to avoid water being pumped into the gas pump.

The power and energy lost to non-light components of the energy inventory such as pressure-volume work, heating the $H_2O$-based solid fuel reactants and products such as the metal powder matrix, and heating and vaporizing the water can be reduced by at least one of changing the radius of curvature of the roller electrodes, changing the kinetic energy of the fuel by means such a changing the rotational speed of the rollers, lowering the density of the blast products, and changing the $H_2O$ content by means such as suction through the semipermeable membrane and application of pressure to the fuel by the rollers.

In an embodiment, the generator components such as the mirror 14 and at least one attached component such as the entrances to the ducts 53 and water jets 21 are fabricated by at least one method known in the art such as 3-D printing, casting, and milling.

In an alternative embodiment, the powder ignition products such as a powder of dehydrated solid fuel may be removed by gas flow such as suction. The powder may be collected on a filter. The collected material may be removed and rehydrated and recirculated as $H_2O$-based solid fuel. The removal may be by $H_2O$ rinsing. The removal may be pneumatically wherein the powder may be controllably hydrated in the slurry trough 5. The rinse or powder may be transported to the slurry trough by means of the disclosure. Excess water may be removed by means of the disclosure before or after the slurry rinse is transported to the slurry trough. In an exemplary embodiment, the ignition product powder is collected with a vacuum cleaner, the vacuum cleaner filter is rinsed periodically or continuously with $H_2O$, the resulting slurry is flowed into an $H_2O$ separation reservoir such as the trough 5, and the excess water is removed by means such as at least one gas jet that blows the extra $H_2O$ away and suction through a selective $H_2O$ permeable membrane. Alternatively, the vacuumed or sucked ignition product powder may be delivered directly to the slurry trough or first to a hydration reservoir as powder. The powder may be rehydrated in the slurry trough 5 or in the reservoir and delivered to the slurry trough 5. The system may be substantially sealed so that it is not appreciably influenced by gravitational or centrifugal forces in an application such as a transportation application such as aviation. The powder or slurry may be transported to the trough by means of the disclosure such as pneumatic or mechanical means. Alternatively, the gas containing ignition powder may flow into a closed reservoir that collects the powder and optionally rehydrates it and transports the powder or slurry to the slurry trough 5 by means of the disclosure.

In an embodiment, the rotating electrodes 8 are operated at sufficient rotational velocity to transport the solid fuel from a reservoir such as a slurry trough 5 to the contact region of the pair of electrodes such as rollers to cause ignition. In an exemplary embodiment with 3 inch diameter copper roller electrodes, running the rollers at high rotational speed greater than 1000 RMP with the lower portion submerged in a Ti (50 mole %)+$H_2O$ (50 mole %) or Ti+$MgCl_2$ (50 mole %)+$H_2O$ (50 mole %) slurry transports the fuel from the θ=180°,ϕ=0° position to the θ=90°,ϕ=180° position, and the compression at the roller contact region results in ignition. The light goes principally vertically (direction of the z-axis). This may be expected since the plasma may not be capable of expanding downward due to the pressure of the slurry, and the vertically-directed kinetic energy of the fuel imparted by the rollers causes a vertical plasma expansion. In an embodiment, a mirror system 14 surrounds the electrodes such as the roller electrodes 8 and directs the light vertically. The mirror system may comprise a parabolic mirror 14. The electrodes 8 may be at a position such as at or near the focus so that the light is optimally directed upward to the top of the cell. The top wall of the cell may comprise a window 20 that transmits the light to the optical distribution and photovoltaic converter system 26*a* such as one comprising a stacked series of semitransparent mirrors 23 and photovoltaic panels 15 (FIGS. 2C and 2C1).

High-speed video recording of the ignition of $H_2O$-based fuel comprising Ti+$MgCl_2$+$H_2O$ was performed with an Edgertronics camera. Some observed phenomena due to the hydrino reaction were: (i) the $H_2O$-based fuel demonstrated fractal-type microbursts following primary ignitions, i.e. a cascade of subsequent ignitions was observed; (ii) fractal-type microbursts superimpose upon rapid fuel injections and ignitions to produce non-linear, multiplicative power output; (iii) micro-aerosolization of the $H_2O$-based solid fuel as it ignites creates plasma flare-type phenomena, and (iv) fuel pellets such as Ti+$H_2O$ in an Al DSC pan that undergo ignition demonstrate shockwave reverberations. In an embodiment, the cascade of microburst is enhanced in at least one of rate and extent by the application of at least one of an external electric field, a current, and an external magnetic field. The external electric field and a current may be provided by electrodes in contact with the ignition output such as plasma formed by the ignition of the $H_2O$-based solid fuel and an external power source that may be powdered by the generator. The electric field and current may be within the ranges of the disclosure such as 0.01 V/m to 100 kV/m and 1 A to 100 kA, respectively. The frequency of the applied electric field and current may be within the ranges of plasma excitation of the disclosure such as in the range of 0 Hz to 100 GHz. In exemplary embodiments, the AC, RF, and microwave excitations may be provided by the generators of the disclosure. The magnetic field may be provided by at least one of electromagnets and permanent magnets such as those of the disclosure. The electromagnets may comprise Helmholtz coils. The magnetic field may in the range of 0.001 T to 10 T. The magnetic field may be constant or alternating in time. The frequency of the applied alternating magnetic field may be in at least one range of about 0.001 Hz to 10 GHz, 0.1 Hz to 100 MHz, 1 Hz to 1 MHz, 1 Hz to 100 kHz, and 1 Hz to 1 kHz. In an embodiment, the alternating magnetic field may be achieved by rotating a permanent magnet or an electromagnet. The rotation may be achieved using a motor that mechanically rotates the magnet. In another embodiment, the magnetic field is rotated electronically. The electronic rotation may be achieved by controlling an alteration of current in space and time as known by those skilled in the art. In an embodiment, the magnetic field confines the plasma to increase the concentration of hydrino reactants and thereby increase the rate of the hydrino reaction.

In an embodiment, the light may be output through at least one optical element that decreases the light intensity by means such as defocusing or diffusing the light. The light of decreased intensity may be incident onto the optical distribution and photovoltaic converter system 26*a* that may have a larger footprint or cover a larger cross sectional area than the window 20. In an exemplary embodiment, the window 20 comprises a lens that defocuses the light that is incident on the optical distribution and photovoltaic converter system 26*a* that has a larger cross sectional area. Window 20 may comprise a concave lens. The lens may comprise a Fresnel lens. The optical distribution and photovoltaic converter system 26*a* may comprise additional entrance optical elements such as at least one mirror, lens, fiber optic cable, and optical waveguide to directed the lowered intensity light such as diffused or defocused light into the columns of the optical distribution and photovoltaic converter system 26*a*. In another embodiment, the light may be output through at least one optical element that increases the light intensity by means such as focusing or concentrating the light. The light of increased intensity may be incident onto the optical distribution and photovoltaic converter system 26*a* that may have a smaller footprint or cover a smaller cross sectional area than the window 20. In an exemplary embodiment, the window 20 comprises a lens that focuses the light that is incident on the optical distribution and photovoltaic converter system 26*a* that has a smaller cross sectional area. Window 20 may comprise a convex lens. The lens may comprise a Fresnel lens. The optical distribution and photovoltaic converter system 26*a* may comprise additional entrance optical elements such as at least one mirror, lens, fiber optic cable, and optical waveguide to directed the increased intensity light such as concentrated or focused light into the columns of the optical distribution and photovoltaic converter system 26*a*. In this case, a standard size cell 26 comprising the ignition and regeneration system that serves as the source of light may be a module that can output a range of optical powers such as in the range of 10 kW to 50 MW and the optical distribution and photovoltaic converter system 26*a* may be sized to convert the optical power into electrical power wherein the cross sections of the window 20 and optical distribution and photovoltaic converter system 26*a* may be different. Some exemplary operating parameters for 10 MW electrical power are given in TABLE 8. Some of the independent parameters are given with no protocol for calculation. Methods to calculate other dependent parameters are given in TABLE 8. The parameters are exemplary ones for 10 MW of electrical power. The parameters may be scaled proportionally for other powers.

TABLE 8

Operating Specifications of a 10 MW Electric SF-CIHT Generator with a Rotary Ignition-Regeneration and an Optical Distribution and Photovoltaic Converter System.

| | |
|---|---|
| Optical/Electrical Power | 25 MW optical 10 MW electrical |
| Fuel Composition | Ti, Cu, Ni, Co, Ag or Ag-Cu alloy + $ZnCl_2$ hydrate, $BaI_2$ $2H_2O$, $MgCl_2$ $6H_2O$ powder |

TABLE 8-continued

Operating Specifications of a 10 MW Electric SF-CIHT Generator with a Rotary Ignition-Regeneration and an Optical Distribution and Photovoltaic Converter System.

| Optical/Electrical Power | 25 MW optical 10 MW electrical |
|---|---|
| Load applied to the fuel | 180-200 lb total pressure per 1 $cm^2$, adjustable +/− 30% |
| Energy per Mass | 5 MJ/kg |
| Fuel Mass Flow | optical power/energy per mass = 25 MW/5 MJ/kg = 5 kg/s |
| Fuel Volume Flow | Fuel mass flow/fuel density = 5 kg/s/0.005 kg/$cm^3$ = 1000 $cm^3$/s |
| $H_2O$ Fuel Consumption (Volume Flow) | 25 MW/50 MJ/mole ($H_2O$ to $H_2(1/4)$)/55 moles $H_2O$/liter = 9 ml/s (33 1/h) |
| Cycle frequency (based on pulse duration of 0.5 ms) | 2000 Hz |
| Roller Diameter | 10 cm |
| Roller Rotational Speed | 10 cm diameter roller × 2000 RPM = 1050 cm/s |
| Fuel dimensions | H: 0.3 cm<br>L: roller rotation speed/cycle frequency = 1050 cm/s/2000 Hz = 0.525 cm<br>W: Fuel volume flow/cycle frequency/H/L = 1000 $cm^3$/s/2000 Hz/0.3 cm/0.525 cm = 3.17 cm (Roller electrode width) |
| Ignition current | 20,000 A to 30,000A |
| Ignition voltage | 4.5 V-8 V |
| System Peak Input Power | 90 kW to 240 kW |
| System Time Average Power | Ignition input energy × ignition frequency = 5 J × 2000 Hz = 10 kW |
| Power Source Duty Cycle | System time average power/system peak input power = 10 kW/165 kW = 6% |
| Pulse Time | Ignition energy/system peak input power = 5 J/165,000 = 30 μs<br>Pulse duration × duty cycle = 0.5 ms × 6% = 30 μs |
| Reaction product analysis | Perform online analysis/monitoring such as IR for fuel water content |
| Operating temperature | <100° C. at electrodes with slurry |
| Operating pressure | Expected range <2 PSIg |
| Spectrum | Emission from plasma blackbody at 3500 to 5500K blackbody depending on fuel composition and ignition parameters |
| Area of Concentrator PV (1000 suns Illumination, 40% efficiency) | Optical power/illumination/efficiency = 10 MW/1 MW/$m^2$/40% = 25 $m^2$ |
| Width of Optical Distribution and Photovoltaic Conversion System | 0.5 m |
| Length of Optical Distribution and Photovoltaic Conversion System | 1 m |
| Spacing of Centers of PV Panels | 2.08 cm |
| Number of PV | Panels Width of system/spacing of PV panels + 1 = 50 cm/2.08 cm + 1 = 25 panels |
| Height of Optical Distribution and Photovoltaic Conversion System | Area of Concentrator PV/ Number of PV Panels/Width of PD & PVC system = 25 $m^2$/25 panels/1 m = 1 m |

The mirror may be moved dynamically. The active mirrors may raster or scan in time at a frequency that divides the light amongst the receiving photovoltaic cells such that the utilization of the photovoltaic cell capacity is maximized. The light division may also be achieved by the semitransparent nature of the mirrors of a stack of mirrors. In an embodiment, the frequency of the raster or scanning of the light across the receiving elements is at a frequency greater that the response time of the photovoltaic cells such that the irradiation is effectively constant. This rate comprises the time fusing rate. In embodiments, the rater or scanning rate may be faster or slower as desired with in the range of about 1% to 10,000% of the time fusing rate. In an embodiment, the movable or active mirrors comprise piezoelectric, pneumatic, and mechanical actuators. Exemplary components of the scanning mirror system such as dynamic mirrors such as piezoelectric tip/tilt mirrors, and steering mirrors, and auxiliary system components such as motorized micro-positioning stages and actuators, motor controllers, and position sensors are given at http://www.physikinstrumente.com/en/products/prdetail.php?sortnr=300710. In an embodiment, each mirror comprises a segmented mirror. In an embodiment, the segmented mirrors are driven by at least one of piezoelectric, pneumatic, and mechanical actuators. In an embodiment, the movable mirrors comprise rotating mirrors such as rotating polygonal mirrors that raster or scan the light across the receiving PV cells. In an embodiment, the modulation of the light by the movable mirrors may be controlled using the PV output power as a function of time that changes in responds to the light raster rate and alignment into the receiving PV cell.

The power from the PV converter may be delivered to a battery system such as a lithium ion battery system (27 or 34 of FIG. 2C1). The PV converted electricity may charge the batteries. The battery may power the ignition system and may be further conditioned by the output power controller/conditioner. The batteries and output power controller/conditioner may comprise a system similar to one used in solar farm power conditioning known to those skilled in the art.

In an embodiment, the ignition system comprises a conditioner of power from the PV converter. The conditioned power may at least partially power the ignition system. The conditioned PV power may comprise AC, DC, and variants thereof. The PV power may charge a storage element such as at least one of a capacitor and battery such as 27 of FIG. 2C1. The storage element may be connected to a circuit element of the ignition system such as the source of electrical power, the bus bar, and the electrodes. The circuit element may self-trigger. The trigger may be achieved when the storage element charges to a threshold level. Alternatively, the storage element may be triggered with a switch such as at least one or a plurality of one or more members of the group of a silicon controlled rectifier (SCR), an insulated gate bipolar transistor (IGBT), a metal-oxide-semiconductor field-effect transistor (MOSFET), and a gas tube. In an embodiment, the source of high-current such as direct current comprises a homopolar generator. In an embodiment, the ignition power is applied continuously. The current to achieve ignition may be significantly higher at initiation versus steady operation. In an embodiment, the high initiation or startup up current may be provided by a startup circuit that may comprise at least one of a power storage element such as one comprising at least one capacitor and battery, and a power source. In an embodiment, the startup may be achieved with a standard steady state operating current wherein the plasma builds with time to a steady state level at the applied current. Suitable currents for continuous operation that are less than currents for intermittent ignition such as those applied using a switch such as a mechanical or electronic switch of the disclosure may be in at least one range of 0.1% to 90%, 1% to 80%, 5% to 75%, and 10% to 50% that of the ignition current that is applied intermittently. Exemplary continuously applied ignition currents are in at least one range of about 100 A to 10,000 A, 500 A and 7,500 A, 1000 A and 5,000 A, 1500 A and 2000 A. A match of the ignition power to fuel transport rate may be achieved with a controller to optimize the power gain at a given desired output power. The controller may match the ignition energy to light energy from the corresponding ignited fuel to achieve the optimal power gain due to forming hydrinos. The controller may control at least one of the fuel flow rate, the ignition current, and the ignition voltage. The fuel flow rate may be controlled by controlling the roller rotational speed and the thickness of the fuel applied to the roller or other-type movable electrodes. The controller may receive input from a sensor that can determine the presence or absence of fuel in between the electrodes. The sensor may be optical. The sensor may sense at least one of refection, scattering, and absorption of the fuel versus the electrode. The sensor may comprise an imaging device such as a high-speed camera.

In an embodiment, the ignition system comprises a switch to at least one of initiate the current and interrupt the current once ignition is achieved. The flow of current may be initiated by a pellet that completes the gap between the electrodes. The switch to initiate the current may be at least one of mechanical and electronic. The electronic switch may comprise at least one of an IGBT, SCR, and a MOSFET switch. The current may be interrupted following ignition in order to optimize the output hydrino generated energy relative to the input ignition energy. The ignition system may comprise a switch to allow controllable amounts of energy to flow into the fuel to cause detonation and turn off the power during the phase wherein plasma is generated called the plasma phase of ignition. In an embodiment, the current is terminated by depletion of at least one of available power, energy, current, or charge that powers the ignition such as the charge on a capacitor, capacitor bank, or battery, or the current in a transformer. In an embodiment, the termination or interruption of the current to the plasma is achieved by mechanically removing the conductive fuel from between the roller electrodes. The transport rate of the conductive fuel through the inter-electrode contact region may be controlled to control the electrical contact time duration. The timing of the removal of the conductive fuel may be achieved by controlling the rotational speed of the electrodes. The wheel speed may be increased to lose contact faster to cause a shorter duration to current termination or interruption during the plasma phase following ignition. The termination of the current following ignition may optimize the input energy. The termination of the current flow during the plasma phase of the ignition may be controlled by a sensor such as at least one of a current, voltage, conductivity, power, light, and pressure sensor and a controller such as computer.

In another embodiment, the switch may comprise a mechanical one. The contact between the electrodes may be periodically interrupted by physically separating them at sufficient distance such that the low-voltage cannot maintain an electrical contact between them. In an embodiment having current flow with the electrodes separated, the separation is sufficient that the current does not comprise a significant parasitic drain from the charging system such as the conditioned power or direct power from the PV converter. In an embodiment, the mechanical system to separate the electrodes intermittently and optionally periodically may comprise at least one of a rotating mechanism and a linear mechanism. The rotating mechanism may comprise a cam that rocks the roller electrodes back and forth to achieve the change in separation over time. The cam may be driven by a servomotor. The mechanical separation of the electrodes may be achieved with actuators such as those of the disclosure such as solenoidal, piezoelectric, pneumatic, servomotor-driven, cam driven with a rotation drive connection, and screw-motor-driven actuators. In an embodiment, the intermittent separation may be achieved by the pressure from the ignition event that pushes the electrodes apart wherein contact is restored by a restoring mechanism such as a spring. The separation may be in at least one range of about 0.001 cm to 3 cm, 0.01 cm to 1 cm, and 0.05 cm to 0.5 cm. The ignition may self trigger with at least one mechanism of the voltage is charged to a sufficiently high level and the separation gap is sufficiently small due to moving the electrodes closer together. In an embodiment, the electrodes are separated by a gap that is at least a minimum to prevent ignition in the absence of fuel. The transport of the highly conductive fuel into the inter-gap region causes sufficient electrical contact between the electrodes to allow a large current to flow to cause ignition. In an embodiment, wherein the fuel in the inter-gap region is ignited and lost due to ignition, the current substantially stops since the gap is present without the fuel electrical connection.

In an embodiment, a mechanical tension and positioning system maintains the tension and position of the pair of electrodes relative to each other such that the current can be maintain at about constant current or optimally maintained as constant. In another embodiment, the mechanical tension and positioning system maintains the tension and position of the pair of electrodes relative to each other such that the current is pulsatile. The mechanical system may comprise at least one of a screw, pneumatic, hydraulic, piezoelectric, and other mechanical system known in the art that is capable of actuations such as linear actuation of the at least one electrode relative to the other to cause a change in at least one of the separation and the tension between the electrodes. The positioning and tension may be controlled by a controller such as one with a sensor and a computer. The sensor may detect a signal corresponding to a change in the optimal condition of current. The signal may be reactive or reflected current from the ignition current being at least partially disrupted, a change the torque of the motors such as servomotors due to a change in tension, and a change in light emission. The positioning may be dynamic, responding on the time scale of light emission duration following ignition. Alternatively, the positioning may be essentially rigid, occurring on longer times scales. The system may have more or less flex to give the desired current in response to the dynamic pressure created by detonation of the fuel. The set position may be periodically adjusted. The adjustment may be made by the mechanical tension and positioning system. An exemplary mechanical system is a threaded rod that is connected to a movable table having one roller and drive motor mounted. The threaded rod may have a nut that is tightened or loosened such that the table moves towards or away for the opposing electrode that may be fixed in position. In an alternative exemplary embodiment, the electrode, such as one mounted with its drive motor on a movable table, is moved by a piezoelectric actuator. The actuator may be driven by a power supply. The power supply may be controlled by the controller. In the case that the electrodes are held in a relative fixed position except for adjustments based on optimizing the operating conditions, the electrodes are maintained by milling. The milling may be achieved with a fixed abrasive blade that mills the surface as the roller electrode rotates. The height of the blade may be adjustable.

In an embodiment, the roller electrode may rotate about a bearing such as a plain bearing. The diameter and corresponding circumference of the plain bearing may be sufficient to prevent over heating and seizing. The surfaces may be electroplated or coated with a conductor such as Ag, Cu, Ti, TiO, or Cr that improves the durability. The bearing faces may comprise different materials to improve durability such as Cu on one and silver plated copper on the other. In an embodiment, the plain bearing is spring-loaded. An expandable inner electrode ring may be pressed against an outer electrode ring by spring to make electrical contact wherein the one ring rotates relative to the other. The plain bearing may be cooled. The bearing may be water-cooled. The plain bearing may comprise a slip ring. The rotating shaft connected and electrified by the plain bearing may be supported by a bearing other than a plain bearing such as a roller bearing. Alternative bearings known by those skilled in the art such as ball bearings and bearings having elements that increase the current contact over the balls of ball bearings such as ones having cylindrical elements are also within the scope of the invention. In an embodiment, the bus bar such as 9 shown in FIG. 2C1, may pivot at a frame mount at the end opposite to the roller 8 connection. A movable or flexible connector to the bus bar may supply the low voltage high current of the ignition power from the source of electrical power. The bus bar may be electrically isolated except for the connector to the source of electrical power. An exemplary connector is a braided wire. Consider each member of the pair of roller electrodes. The roller may be driven by a motor that may be mounted to the frame or mounted such that it pivots with the pivot of the bus bar 9 or 10. The roller may be driven by a drive connector such as a belt, chain, or gearing. Alternatively, the roller may be driven by a second roller in contact with the roller electrode wherein the second roller is driven by a motor such as an electric motor. In another embodiment, the roller may be driven by a magnetic drive. The magnetic drive may comprise at least one of a permanent or electromagnet mounted on the roller (roller magnets) with an independent opposing permanent or electromagnet mounted on a drive mechanism (drive magnets) with a gap in between the roller magnets and the drive magnets. The drive magnets may be rotated by a motor such as an electric motor. The rotating drive magnets may mechanically couple with the roller magnets to turn them and concomitantly turn the roller electrode. The roller and drive magnets may comprise an electric motor with one set of magnets performing as a rotor and the other as a stator. The motor may comprise brushes or may be brushless such as an electronically commutating motor. In another embodiment, the motor may be mounted to the frame and the motor may directly drive the roller 8 through the shaft 7 via a mechanical coupler that may at least one of have an electrical isolator and a flexure or be capable of flexing to accommodate movement of the roller. The flexure may accommodate a maximum range of displacement of the roller from the point of contact of about 1 mm to 1 cm. In other embodiments, the shaft 7, roller 8 and bus bar 9 or 10 may be mounted on a movable table on guides to permit the reciprocating motion of the electrodes in contact and displacement. In an embodiment, the bus bar is superconducting. The superconducting bus bar may be more compact that a normal conducting bus bar.

In an embodiment shown in FIG. **2G1*d*1, the at least one bus bar 9 that pivots at an electrically isolated pivot connection such as a bearing or flexure at the cell-mounted end is outside of the electrode housing 20*b*. The bar may be electrically connected to the source of electrical power 2 by a connected flexible conductor such as a wire 75. The roller 8 may be rigidly connected to a shaft 7 that penetrates the external walls 20*d* of the electrode housing 20*b*. A slot that allows rocking motion of the shaft 7 through the walls 20*d* is sealed with drive shaft gasket 59. The shaft 7 connects to a bearing such as a plain bearing 73*a* and others of the disclosure mounted on the end of the pivoting bus bar 9 opposite the pivot-mounted end. The shaft 7 may further comprise the indirect drive mechanism on a mounting protrusion on a portion of the shaft 7 that penetrates the bearing. The indirect drive mechanism may comprise a pulley 71 turned by a shaft 74 and motor 12 or 13 separately mounted to the frame. A roller drive pulley 71*a* connected to a drive shaft 74 that held by drive bearing 73 may be driven by shaft drive belt 72 driven by drive pulley 71. An alternative drive mechanism comprises the rotor-stator mechanism wherein the roller magnets may be fastened to a circularly symmetrical mounting structure at the end of the shaft 7 such as a mounting disc. The bus bar 9 may be spring-loaded with a spring 57 connected to a mount 57*a* that applies pressure to the bus bar to apply tension on the roller electrodes 8. The external housing wall 20*d* of the electrode housing 20*b* may comprise mu metal to shield the rotor-stator drive from magnetic fields produced by the ignition current. An advantage of the pivoting cam bus bar embodiment is that it is permissive of locating the bus bar electrical isolation at the bottom pivot point away from the hotter region closer to the roller electrodes 8**.

The bus bar capable of being pivoted permits the tension and gap between the roller electrodes to be variable as given in the disclosure. The restoring mechanism for the separation force following a solid fuel ignition may be one of the disclosure. Exemplary restoring mechanisms are spring, pneumatic, hydraulic, and piezoelectric actuation. The embodiment comprising the roller pivoting on a bus bar with a separately mounted motor and restored by a restoring mechanism may have a faster restoration response time compared to the embodiment wherein the roller drive motor and the roller are mounted on a movable table. The response may be faster due to the reduced mass. The response time may also be decreased by using a restoring mechanism with a higher effective spring constant. The response time may be adjusted to one that is desirable. The adjustment may be to produce at least one of a desired power and energy gain. The adjustment may be performed by a controller such as one comprising at least one sensor such as at least one of a tension, position, and tension senor and a computer.

In another embodiment, the periodic contact may be achieved by a non-uniform surface on at least one of the rotating electrodes such as one comprising lobes or facets comprising raised and depressed or scalloped regions. Contact may be achieved when raised regions on opposing electrodes come into proximity with rotation and contact is lost when depressed regions are juxtaposed. Alternatively, contact may be achieved when raised regions of the lobed electrode come into contact with the circular-surface counter roller electrode with rotation and vice versa. The alternating electrical contact results in current pulsing. Suitable electrode designs having non-uniformity of the surface perimeter to provide intermittent contact are given in previous PCT Application No. PCT/US14/32584 entitled "Photovoltaic Power Conversion Systems and Methods Regarding Same" filed Apr. 1, 2014, 040114 and PCT No. PCT/IB2014/058177 entitled, "Power generation systems and methods regarding same", filed on Jan. 10, 2014 which are herein incorporated by reference in their entirety. Alternatively, the roller electrode perimeter of at least one roller may be uniform level with intervening relatively non-conducting or insulating sections, regions, or segments. The insulating roller sections may comprise the surface and may optionally comprise the underlying body sections, regions, or segments. The roller sections of conductive material may comprise metal such as copper, and the roller sections of non-conductive or insulating material may comprise a ceramic, oxidized metal, or anodized metal. The alternating non-conducting material may comprise a layer on the surface of the roller or may comprise a section of the roller surface and body. In the case that the surfaces of both rollers have a mixture of non-conductive and conductive sections, contact of like regions of the electrode pairs may be synchronized such that the conductivity and the corresponding current are pulsed. Alternatively, contact is made when conductive sections contact the constantly conductive roller. The alternating conductivity results in pulsing in the current.

In an embodiment, the rotating electrodes having periodic contact achieved by juxtaposition of those areas of the rotating electrodes of each pair that cause contact comprise a plurality of pairs of such electrodes. The non-uniform surface elevation along the perimeter of at least one member of each pair of the rotating electrodes comprises lobes or facets comprising raised areas with depressed or scalloped regions in between the lobes. Each pair may comprise an independent source of electricity to cause ignition. Each source of electricity may receive power and energy from the PV converter. The plurality of electrode pairs such as roller electrodes pairs may be timed to undergo ignition in a phased manner of a cycle to achieve about constant ignition and light duration or other parameters that are desired. With n pairs with at least one member having m % lobe area relative to non-lobed area arranged geometrically according to a relative phase in a cycle, a desired firing rate such as a continuous firing may be achieved with a desired duty cycle such as 10%. Here, the duty cycle may be fixed, but can be changed by changing the number of roller lobes on the roller having lobes. The firing timing may also be changed or may further be changed electronically by controlling the ignition circuit. The rotational speed of each member electrode of a plurality of n electrodes pairs need rotate at a speed of only 1/n that of the rotational speed of a pair having uniform surfaces. For example, ten pairs need to rotate at only 200 RPMs to achieve the same duty cycle and ignition rate as a single pair of uniform electrodes having a 2000 RPM rotational speed. The heat per surface area is equivalent between the two cases as well. In an embodiment having the plurality of periodically conductive roller electrode pairs, the number of pairs is about 1/duty cycle that of a single pair wherein each roller is continuously conductive along the perimeter and operated at the same RPM. In an embodiment of the periodically conductive roller pairs having 1/duty cycle number of roller pairs, the number of ignition circuits is about 1/duty cycle and each may have a capacitor that is about 1/duty cycle as fast to charge as that of the ignition circuit of the single pair wherein each roller is continuously conductive along the perimeter and operated at the same RPM.

The ignition system may further comprise a means to direct the light from the plurality of electrode pairs evenly across the optical distribution and photovoltaic conversion system. The directing system may comprise optical elements of the disclosure such as active optical elements such as active mirrors or lenses. The directing system may further comprise a mechanical system such as a means to move the ignition system to achieve about cell centering of the ignition from each pair of electrodes of the plurality.

In an embodiment of the plurality of electrode pairs, the electrical connection is supplied to each pair in isolation wherein the drive for each roller is provided by at least one of a independent drive motor, a shaft having a plurality of rollers rigidly attached and driven by at least one common motor, and a drive connection such as a gear, belt, or chain driven by a motor wherein the drive connection may drive at least one roller. In an embodiment, a drive connection that is part of a mechanism to drive a plurality of rollers comprises electrical isolation between rollers. The electrical isolation may be provided by electrically non-conductive elements of the drive mechanism. The plurality of n roller electrode pairs may comprise n electrode-ignition systems such as the one pair shown in FIG. 2C1. In an embodiment, one member of a roller pair is connected to one shaft and the other is attached to another shaft for a plurality of pairs such as n pairs. Each shaft may be driven by an electric motor. Non-conductive sections in each shaft between electrodes may electrically isolate the rollers from each other. The electrodes may be independently electrified. Each may have an independent connection that may comprise a slip ring or electrically conducting bearing such as a plain bearing to permit the shaft and attached rollers to rotate while providing current. In an embodiment, the electrical connection may comprise a bus bar such as 9 or 10 of FIG. 2C1 that may comprise a slip ring or a conducting bearing such as a plain bearing.

The ignition system may be controlled by at least one of applying a force on at least one electrode such as a rotating electrode such as a roller electrode and changing the separation between the electrodes. The at least one of pressure application and separation change may be achieved by at least one of mechanical, pneumatic, hydraulic, piezoelectric actuation. The separation distance between the electrodes may be in at least one range of about 0 to 50 mm, 0 to 10 mm, 0 to 2 mm, and 0 to 1 mm. The pressure of one electrode against the other of the pair may be in at least one range of about 0.1 N to 100,000 N, 1 N to 10,000 N, 10 N to 1000 N, and 20 N 200 N. A piezoelectric actuator that expands and contracts in response to an applied voltage may achieve the at least one of separation gap and pressure. In an embodiment, the piezoelectric actuator may apply pressure to the bus bar to which the electrode is fastened to cause it to reversibly flex to thereby apply the pressure. Alternatively, the electrode may have another restoring mechanism such as a spring forcing the at least one roller electrode apart from the other member of the pair for the phase of the ignition cycle wherein the pressure is relieved. In an embodiment, the piezoelectric actuator may at least one of apply pressure and close the separation between the electrodes to cause a high electrical current to flow to cause ignition wherein at least one other piezoelectric actuator undergoes the reciprocal action of contracting in the to the bus bar to which the electrode is fastened to cause it to reversibly flex to thereby apply the pressure. In an embodiment, the piezoelectric actuator may move a table onto which at least of one electrode and the corresponding electrode drive motor are mounted. The piezoelectric actuator may be mounted at a specific position such as one on the generator frame to establish at least one of an initial gap and an initial pressure. The position may be adjusted by a position adjustor such as one of a mechanical, pneumatic, solenoidal, and hydraulic position adjustor. A suitable mechanical position adjustor comprises a micrometer. The piezoelectric actuator may comprise a plurality of units that may function in at least one of series and parallel. In an embodiment, the piezoelectric actuators may be arranged in at least one of series and parallel. A parallel arrangement may be used to achieve stronger force. A series arrangement may be used to achieve greater displacement. The piezoelectric actuator may comprise a mechanical system such as a lever arm to increase its range of motion. The lever arm may be attached to the portion of the electrode system that is desired to be moved or pressurized.

At least one piezoelectric actuator moves at least one roller electrode back and forth to open and close a corresponding gap between the pair of roller electrodes to open and close the ignition circuit. The roller electrode may be mounted on a table on bearings connected to slide guides. The roller electrode may be direct driven by an electric motor that may also be mounted on the sliding table.

In an embodiment, the piezoelectric actuator ignition system comprises at least two piezoelectric actuators that are arranged to cause a reciprocating action to at least one of apply and release pressure and close and open the separation between the electrodes to cause or terminate a high electrical current flow that causes ignition. In an embodiment, one piezoelectric actuator undergoes the reciprocating action of expanding and contracting while the other does the opposite reciprocating action of contracting and expanding. The at least two actuators operating in opposite motion to cause the intermittent ignition at the electrodes by at least one of applying and releasing pressure and closing and opening the separation gap. Thus, the opposing piezoelectric actuator may provide the restoring action. The frequency, force, displacement and duty cycle may those of the disclosure wherein the opposing actuators undergo motion that is 180° phase shifted. In an exemplary embodiment, the gap may be about 50 μm, the frequency may be 1000 to 2000 Hz, the one actuator may expand to cause the application of pressure and closure to the electrode pair for about 50 μs to 100 μs while the other contracts to remove the restoring force for 50 μs to 100 μs. Then, the one contracts while the other expands to relieve the pressure and open the gap for about 500 μs to 1000 μs. The action of the piezoelectric actuator may be controlled with a programmable controller that controls a power supply wherein the force and travel distance of the piezoelectric actuator may be controlled by the strength of the applied voltage. The frequency and duty cycle may be controlled by the controller by controlling the voltage waveforms applied to the piezoelectric actuators. In an embodiment, the functions of applying a pressure force and providing a restoring force are provided by the same piezoelectric actuator in expanding and contracting modes during a cycle of ignition and non-ignition. The ignition may be achieved by at least one of applying the mechanical action to at least one electrode directly or indirectly and by applying mechanical action directly or indirectly to a table having at least one mounted electrode. In an embodiment, exemplary piezoelectrics comprise at least one of quartz, barium titanate, and lead zirconate titanate. In an embodiment, a high response rate and fast distortion of the piezoelectric crystals allows the steps to be made at very high frequencies such as upwards of 5 MHz. This gives an exemplary maximum linear speed of approximately 800 mm per second, or nearly 2.9 km/h; however, other desirable speeds may be higher or lower such as in at least one range of about 10 mm/s to 10,000 mm/s and 100 mm/s to 1000 mm/s. In an embodiment, the piezoelectric actuator is activated with a voltage to achieve the contact between the electrodes that is sufficient to cause ignition. The ignition or activation time comprising the time that high current is flowed through the fuel may be different from the corresponding non-ignition or deactivation time. The duty cycle comprising the ratio of the ignition to non-ignition times may be in at least one range of about 0.01% to 99%, 0.1% to 50%, and 1% to 20%. The piezoelectric actuator may be activated during the ignition phase to apply at least one of the pressure or the reduced electrode separation. The activation may be achieved by applying a voltage. The voltage may be applied by a function generator, power supply, and a controller such as a computer. For example, a square wave activating voltage may be applied for 50 μs and no voltage or a square wave of opposite polarity voltage may be applied for 500 μs. The at least one of the activation frequency and deactivation frequency may be in the at least one range of about 1 Hz to 1 MHz, 10 Hz to 100 kHz, and 100 Hz to 10 kHz. At least one of the activation duration time and deactivation duration time may be in at least one range of about 1 μs to 100 s, 10 μs to 10 s, and 25 μs to 1 s.

A schematic of a piezoelectric actuator system is shown in FIG. 2G1*e*. In an embodiment, the piezoelectric system to at least one of switch on and off the ignition and control the separation and tension between the electrodes comprises opposing piezoelectric actuators 54 and 55 to move the electrodes relative to each other. The piezoelectric actuator may be mounted on piezoelectric actuator mount 56. The motors 12 and 13 and electrodes 8 supported on roller shafts 7 and bearing supports for roller shafts 4 may be individually mounted on movable tables 62 that are moved relative to each other by the piezoelectric actuators 54 and 55. A restoring force may be provided by tension swings 57 supported by tension spring mounts 57*a*. The movement of the tables 62 may be guided by slide tracks 60 in a base support 61. The motors may be mounted on the tables 62 by motor mounts 63. The movement of the electrode roller shafts 7 may be accommodated by the flexible gaskets 59 in the walls of the electrode housing 20*b* that contain the slurry trough 5. The electrode housing may be mounted to the base support 61 by the electrode housing bracket 58.

The ignition of the solid fuel may be achieved by flowing a high current. The ignition may be initiated and terminated intermittently. The time of current flow between the rollers may be different from the time that no current flows. The duty cycle for the application of current may be in at least one range of about 0.01% to 99%, 0.1% to 50%, and 1% to 20%. The interruption may be achieved by at least one of decreasing the pressure that the electrodes apply to the fuel and opening a gap between the electrodes. In an embodiment, at least one electrode such as a roller or gear electrode is rotated with an indirect drive from an electric motor such as at least one of a belt and pulley, cog and chain, and gear drive. The roller electrode may be mounted on a lever that may comprise a pivot in between the end having the roller fastened through a bearing and the other end. The other end may be driven. The motion may be periodic to at least one of open and close the gap between the electrodes and to apply pressure to the fuel. The driving motion of the other end may be caused by at least one of mechanical, pneumatic, and piezoelectric actuation. Reciprocal mechanical motion of the driven end may be achieved by a connecting rod connected to a cam or crankshaft. The cam may be shaped to achieve the desired duty cycle. The cam may be multi-lobed. The reciprocal motion may also be achieved by a solenoid system such as one having the design of a speaker. The solenoidal coil and the magnet of the speaker-type actuator may be protected from the high field of the high ignition current by means such as orientation and magnetic shielding. The servo-motor may also be magnetically shielded. The shielding may be achieved with mu-metal. A piezoelectric motor or actuator that expands and contracts in response to an applied voltage may achieve the motion that controls the intermittent ignition. The applied voltage from a function generator and a power supply may be controlled to achieve the desired duty cycle.

In an embodiment, the electrodes are constantly engaged in the conductive position. The electrodes such as roller electrodes may be loaded with springs or other means to apply pressure between them to maintain electrical contact. In an embodiment, the roller electrodes 8 (FIGS. 2C, 2G1, and 2G1*b*) are driven by a single motor. A motor driven roller may drive the other roller of the pair of roller electrodes when they make contact. Tension of one roller on the other may be provided by at least one spring that pushes the rollers together to make contact. Each roller may be dressed by at least one scrapper such as a stationary scrapper applied to the roller surface that removes extraneous material as the roller turns. The motor mounts and bus bar connections may be rigid or near rigid. The ignition current may be maintained constantly by the source of electricity that may obtain the power from the PV converter. Alternatively, the ignition current may be applied intermittently at a duty cycle less than 100%. The switch of the current to cause ignition may comprise a mechanical switch. In an embodiment, a mechanical switch is part of the bus bar wherein a bus bar circuit contact is moved to open and close the circuit rather than comprising a switching element that makes contact by moving the electrodes and optionally the drive motor and mounting table. In this case, the mass, travel distance, and applied force can be greatly reduced such that a programmable switching and a duty cycle of about 2000 Hz and 10%, respectively, can be achieve.

The mechanical switch may comprise a movement that engages and disengages contact of a section of the bus bar circuit. The section may comprise wire such as braided wire with end connectors that may be made to contact by an actuator. In an embodiment, a small section of a conductor is moved by an actuator such as the piezoelectric actuator to open and close the ignition electrical circuit. The contact area between sections of the bus bar circuit could be made very large and very flat such that the separation can be very small to break contact such as in at least one separation range of about 10 nm to 200 μm, 100 nm to 100 μm, and 1 μm to 50 μm. The contact could be between two large flat plates. The bus bar sections connected to opposite sides of the switch may be attached to a guide. The guide may comprise at least one of a flexure, a spring, and a sliding collar with bearings. At least one of the guide and the switch itself may have a bracket or attachment for an actuator that moves at least one switch part and guide to close the switch.

The switch may comprise at least one of a highly conductive material such as copper, silver, and a light-weight, highly conductive metal such as aluminum. In an embodiment, the voltage is too low to cause arching; so, the surface remains flat. In an embodiment, the switch may be maintained in an inert atmosphere such as a noble gas atmosphere such as a helium atmosphere that prevents oxidation and may also prevent arcing due to the high ionization energy of He. Alternatively, the switch may be maintained under vacuum to prevent at least one of arcing and oxidation. The contacting surfaces of the switch such as large flat plates may be coated with an inert material such as Au or Ag to prevent oxidation. The switch surfaces may be coated with a metal with a high work function such as tungsten to prevent arcing. In an embodiment, a lever arm or other mechanical system is used to increase the range of motion of the actuator to open and close the circuit. In another embodiment, the mechanical switch actuator comprises at least one of a hydraulic, pneumatic, solenoidal, cam-driven, crankshaft-driven, and servomotor-driven actuator of the disclosure. The cam may have multiple lobes. The lobe area that causes electrical contact may comprise duty cycle percentage such as 10% for a 10% duty cycle. Alternatively, the cam may open the switch and the lobes may comprise 100% minus duty cycle percentage of the area. In either case, the restoring mechanism may comprise a spring, pneumatic, hydraulic and a mechanical restorer such as an opposing cam.

The at least one of pressure application and electrode separation may be achieved with at least one of rotating camshaft and crankshaft mechanics and possibly a reciprocating actuator such as a solenoid with a connecting rod to the electrode component that is desired to be a least one of pressurized and moved. In another embodiment, an electric servo-motor repetitively rotates clockwise and counterclockwise over an arc of less than 180° to move a cam forward and back. The cam may have a shaft connection to a roller electrode to move it back and forth relative to the second roller electrode of a pair, to open and close the ignition circuit. The roller may be mounted on a table on bearings connected to slide guides wherein the roller may directly driven by an electric motor that may also be mounted on the table.

In an embodiment, the ignition is a hybrid of a mechanical and electronic system. In an embodiment, the ignition system comprises a distributor having an electrified lead that moves to at least one contact electrically connected to at least one member of a pair of electrodes. The motion of the lead to the contact permits current to flow from the electrified lead to the electrode such as the roller electrode. The complete circuit may comprise the source of electrical power, a terminal of the source of electrical power connected to the electrified distributor lead, the distributor contact, the pair of electrodes, the contact connected to one member of the pair of electrodes, the electrodes in contact, the other member of the pair of electrodes connected to the other terminal of the source of electrical power. The flow of current results in the ignition of the fuel between the roller electrodes. The contact may be made intermittently such as periodically wherein the duty cycle is controlled to allow the source of electrical power adequate time to store enough energy to cause the ignition when the circuit is closed. The electrified lead of the distributor may comprise a central hub connected to one terminal of the source of electrical power. A member of the pair of electrodes may be electrically connected to the at least one contact. The opposing roller electrode may be electrically connected to the other terminal of the source of electrical power. The at least one contact may be positioned circumferentially such that contact with it is made by rotation of the distributor lead.

In an embodiment, at least one of the current and voltage are pulsed to increase at least one of the hydrino reaction rate and the power gain of output over input power. The pulsing may be achieved by at least one of electronically and mechanically. The electronically pulsed system may comprise the electronic switches of the disclosure such as those comprising silicon-controlled rectifiers, insulated gate bipolar transistors and MOSFETs. At least one of the voltage and current may be pulsed. At least one of the peak current, peak voltage, offset current or minimum current, offset voltage or minimum voltage, waveform shape or form, pulse duration, pulse frequency, and duty cycle may be controlled to achieve the desired ignition power pulsing. The control may be achieved by a controller such as one comprising at least one voltage and current sensor and a computer. The pulsing may further comprise a controlled waveform envelope such as at least one of a current and voltage ramp that may comprise a saw tooth waveform, sinusoidal and other waveform envelopes known by those skilled in the art. The peak current may be in the range of about 10 A to 1 MA. The offset or minimum current may be in the range of 0 to 10 kA. The peak voltage may be in the range of about 0.1 V to 1000 V. The offset voltage may be greater than about 0 V to 100 V. The pulse duration may be in the range of about 100 ns to 1 s. The pulse frequency may be in the range of about 10 Hz to 1 MHz. The duty cycle may be in the range of about 1% to 99%.

The mechanical pulsing may be achieved actively or passively. Active mechanical systems to achieve the pulsing comprise mechanical switches of the disclosure such as cam switches and piezoelectric switches. Passive mechanical systems to achieve the pulsing may comprise mechanical switches and switch components such as the pivoting bus bar (FIG. 2G1*d*1) and mechanical restoration such as the restoring spring. The mechanical frequency may be adjusted by changing the spring constant and the mass of moveable portion of the ignition system. In an exemplary embodiment, the mass is reduced by using an indirect-driven roller mounted on a light-weight bus bar such as the pivoting bus bar that is not directly loaded with the drive motor. In an embodiment, the mechanical pulsing may be achieved with at least one roller of the disclosure having a non-uniform circumference such as the lobed roller electrode or electrodes of the disclosure. In an embodiment, the mechanical pulsing is achieved by controlling the rotational speed of the roller electrodes. The dynamics of the blast pressure of the ignited fuel and the mechanical response may be tuned to cause the pulsing. Such a means comprises controlling the rate the fuel is supplied to the ignition by means such as the rotational speed. Other means comprise controlling the fuel thickness and energy yield per fuel. The thickness may be controlled using the fuel applicator means of the disclosure. The energy yield per fuel may be controlled by controlling the fuel composition such as the $H_2O$ content and other components of the mixture such as the conductive matrix and the water-binding compound as given in the disclosure.

In an embodiment, the ignition system is a hybrid of a mechanical and electronic system wherein the mechanical and electronic states are monitored to achieve at least one of the desired rate and timing of ignition. The ignition may primarily be pulsed electronically or mechanically wherein an electronically triggered pulse may be advanced or delayed to accommodate a mechanically produced pulse or vice versa. In the latter case, the mechanical ignition system may be control driven. An exemplary controlled mechanical ignition system comprises at least one of a piezoelectric, cam, and electromagnetic driven system of the disclosure. The ignition system may comprise a controller such as a computer and sensors to follow the mechanical motion, position, and electrical conductivity and timing in the desired ignition cycle to trigger at least one of an electronic and mechanical triggered ignition. In the case that the fuel comprises a discrete pellet of the disclosure, the sensor may further sense the position, conductivity, and pressure of the pellet during its trajectory into and through its ignition. The sensor may be at least one of optical, electrical such as a conductivity sensor, and mechanical such as a pressure sensor.

In an embodiment, the fuel may comprise a powder in addition to comprising slurry. The fuel may be ignited under an inert atmosphere such as one comprising an inert gas such as a noble gas such as argon or krypton and water vapor. The solid fuel such as a solid fuel powder may comprise a metal that is substantially stable to reaction with $H_2O$ such as at least one of the group of Ag, Cu, Ni, Co, Te, Sn, Sb, Mo, Cd, Pb, and Bi and one of the group of Ag, Cu, Ni, Co, Fe, As, Tc, Ru, Rh, Pd, Cd, Sb, Te, Re, Os, Ir, Pt, Au, Hg, Ti, Pd, and Bi, and may further comprise a source of $H_2O$ such as at least one of absorbed water and a water binding compound such as at least one of halide, hydroxide, and oxide and a plurality of halides, hydroxides, and oxides and mixtures thereof. The $H_2O$ binding compound may comprise one or more from the group of alkaline earth and transition metal halides such as $MgBr_2$ and $ZnCl_2$ that are hydrated and alkali, inner transition, and rare earth metal halides that are hydrated and metalloid halides that are hydrated, and alkali, alkaline earth, transition, inner transition, and rare earth metal and metalloid oxides or hydroxides that are hydrated. The reaction mixture may further comprise at least one of an oxide such as a metal oxide, a hydroxide such as a metal hydroxide such as an alkali, alkaline earth, transition, inner transition, rare earth, or Group 13, 14, or 15 metal or metalloid oxide or hydroxide and a compound such as an ionic compound comprising an oxyanion such as borate, metaborate, molybdate, tungstate, stanate, phosphate, and sulfate. The at least one of an oxide, hydroxide, and compound comprising oxygen may comprise a hydrate or comprise waters of hydration. In an embodiment, the solid fuel comprises a hydroxide having a reversible oxide to hydroxide reaction with addition of $H_2O$. Exemplary oxides are $Al_2O_3$, an alkaline earth oxide such as MgO and a transition metal oxide such as NiO. For example, aluminum hydroxide, $Al(OH)_3$, archaically called hydrate of alumina or alumina trihydrate ($Al_2O_3{\cdot}3H_2O$) can reversibly undergo hydration and dehydration:

$$Al_2O_3\cdot 3\ H_2O \leftrightarrow Al_2O_3 + 3\ H_2O \quad (202)$$

$$Al_2O_3\cdot 3\ H_2O \leftrightarrow Al_2O_3 + 3\ H_2O \quad (203)$$

Solid alkaline earth hydroxides undergo reversible hydration and dehydration reactions. For example, magnesium hydroxide undergoes an endothermic decomposition at 332° C., and conversely MgO reacts with water to form magnesium hydroxide:

$$Mg(OH)_2(s) \leftrightarrow MgO(s) + H_2O(g) \quad (204)$$

Similarly, rare earth hydroxides undergo reversibly hydration and dehydration reactions.

$$2Ln(OH)_3 \leftrightarrow Ln_2O_3 + 3H_2O \quad (205)$$

Transition metal oxides form hydrates that may comprise hydroxides. The inter-conversion is reversible through loss or gain of $H_2O$. For example, $Fe_2O_3 \cdot H_2O$ (also written as 2Fe(O)OH) dehydrates around 200° C.:

$$2FeO(OH) \leftrightarrow Fe_2O_3 + H_2O \quad (206)$$

Similarly, the thermal decomposition of iron(III) hydroxide under temperature above 200° C. is given by $$2Fe(OH)_3 \leftrightarrow Fe_2O_3 + 3H_2O \quad (207)$$

Alkali metal hydroxides such as LiOH also undergo reversible hydration and dehydration reactions:

$$2LiOH \leftrightarrow Li_2O + H_2O \quad (208)$$

In an embodiment, $H_2O$ is released from the solid fuel by reaction with a compound comprising oxygen such as an oxide or hydroxide. An exemplary $H_2O$ releasing reaction involving $H_2$ reduction of an oxygen containing compound comprising the partial reduction of $Fe_2O_3$ with hydrogen at about 400° C. gives magnetite that contains both Fe(III) and Fe(II):

$$2Fe_2O_3 + H_2 \leftrightarrow 2Fe_3O_4 + H_2O \quad (209)$$

The conductive matrix such as a metal powder may be stable to reaction with the hydrated $H_2O$ binding compound. The solid fuel may comprise at least one of Cu and Ag with rare earth halides such as chlorides such as those of La, Ce, Pr, Ho, Dy, Er, Lu, Nd that are hydrated. The solid fuel may comprise a mixture of metals such as a plurality selected from the group of Ag, Cu, Ni, Co, Te, Sn, Sb, Mo, Cd, Pb, and Bi in different ratios as a more optimal fuel. Materials having high electrical resistance may be mixed with those having low resistance. An exemplary conductive matrix comprises a mixture of highly conductive Ag and less conductive Ni in different ratios. The fuel mixture with optimized ratios of components may be obtained by routine experimentation and may be selected for desired properties such as power or energy yield, spectral profile and irradiance, stability of the fuel to unwanted reactions, stability of a desired particle size distribution, stability of the hydrate such as $MgBr_2$ $6H_2O$ or $BaI_2$ $2H_2O$ that are relatively thermally stable and may form or be stable at elevated temperatures present while the fuel is being formed or maintained, kinetics and the extent of rehydration, rate and extent of release of the $H_2O$ under detonation conditions wherein hydrates with lower decomposition temperatures such as $ZnCl_2$ $4H_2O$ may be more favorable, limiting the extent of electrode material in the fuel, electrode erosion prevention, and the ability to facilitate resurfacing of the electrode involving fuel material. The cell material may be selected to avoid reactivity with the fuel or products. In an embodiment, the cell may be comprised of at least one of stainless steel, a molybdenum alloy, TZM, and Monel metal. In the case that halogen gas is formed, the cell and generator components exposed to the gas may comprise a halogen corrosion resistant metal such as at least one of stainless steel and Monel metal.

In an embodiment, the fuel or a component of the fuel such as the conductive metal matrix such as silver powder may be doped with trace impurities of other elements in known quantities such as weight percentages to trace any theft of the material.

In an embodiment, solid fuel is injected into the rollers vertically from the fuel reservoir 5 as shown in FIG. **2G1*e*1. The injection may be by the means and methods of the disclosure. In an embodiment, the fuel is recirculated using pneumatic and mechanical injection of powder fuel into the rollers and a pneumatic ignition product removal/collection system such as one comprising ducts, fans, and cyclone separators to return the fuel to the trough to be re-injected. In an embodiment, the ignition products are blown or suctioned out of the cell and injected into the rollers. The cell gas may serve as a carrier gas of the ignition products. The injection may be pneumatically. The powder may pneumatically flow through a cyclone separator with a portion of the gas flow used to pneumatically inject the fuel. The cyclone separator may separate the carrier gas and the ignition products. Some of the gas flow from the cyclone separator may be used to inject the fuel powder. A portion of the gas flow may be used to cause the powder to flow into rollers to be ignited. The fuel may flow from the cyclone separator to the trough 5 wherein it is injected into the roller by means such as pneumatically. The cyclone separator may be connected to a least one of the ducts 53 and trough 5 (FIG. 2G1*b*). The designations of inlets and outlets may be interchangeable with a reversal of the direction of gas flow in the ducts and cell. The cell gas may flow trough a passage such as one at the window 20*c*** at the top of the cell. Alternatively, the gas may pass through at least one window in the cell sides. The opening to the cell may comprise a plurality of perforated reflectors to selectively allow the passage of gas while reflecting photons out of the duct.

In an embodiment shown in FIG. **2G1*e*1, the slurry 48 is replaced by a powder solid fuel such as one comprising a conductive matrix such as a metal powder and a water binding compound such as a hydrate. Exemplary powder solid fuels are Ag+$MX_2$ (M=Mg, Ca, Sr, Ba; X=F, Cl, Br, I) and Cu+$MX_2$ (M=Mg, Ca, Sr, Ba; X=F, Cl, Br, I). In an embodiment, the powder fuel is fed into the rotating roller electrodes 8 that may serve as a rotary pump. The powder may be agitated by the powder agitator 66 driven by agitator motor 67. The agitator 66 may comprise an auger with one motor 67 and two opposite pitch screws on the same shaft. The fuel may also be agitated with a vibrator. The powder may be further agitated pneumatically. In an embodiment, the agitator blower or pump 18 injects gas such as cell gas such as a noble gas such as argon or krypton through gas injection line 19 into chamber 20*e*. The gas may flow though a gas permeable membrane 49 to be blown into the powder fuel 48 to cause it to be agitated. In another embodiment, the powder may be pneumatically agitated by a gas jet that may be supplied by gas injection line 19. The powder may be partially suspended by at least one of the mechanical and pneumatic agitation to cause the fuel to be transported to the electrodes 8 wherein the rotary pumping action of rotating roller electrodes 8 may further assist with the injection of the fuel. In an embodiment, the ignition may be pulsed in current such as the parameters given in the disclosure such as about 1 kHz, 50% duty cycle, 1 kA maximum current. The roller may be essentially fixed in place with some flexure in the bus bars for give such that the ignition dynamics are substantially driven by the pulse source of electricity. The bearing such as at least one plain bearing may be located away from the rollers to avoid being over heated. In an exemplary embodiment the plain bearing may be located outside of the electrode housing 20***b*. The roller 8 may be fixed to the shaft 7 that is electrified by bus bar 9 (FIG. 2G1*d*1) having the plain bearing 73*a*.

In an embodiment, the fuel performance of Ag+alkaline earth halide hydrates seems to depend on the temperature stability of the hydrate. The higher stability of the hydrate is permissive of operating the roller electrodes at higher temperature. Exemplary thermally stable fuels are at least one of Ag and Cu power and at least one of $BaI_2$ $2H_2O$, $MgBr_2$ $6H_2O$, and $CaCl_2$ $6H_2O$. The roller electrode may be cooled by flowing a coolant such as water through the roller shaft 7. Each roller electrode may also comprise coolant channels that may be milled out and covered with a sealed plate such as a welded-in plate. Alternatively, the channels may be cast. The coolant may be chilled by a chiller that may comprise at least one heat exchanger and fans. In an embodiment, the fuel comprising Ag metal powder is safe from combustion of the metal powder and does not require explosion proof motors and other components.

In an embodiment, the powder is recovered and recirculated pneumatically. Cell gas may be pumped out of the electrode housing 20*b* by a recirculation blower or pump 17 through gas suction line 17*a*. Recirculation blower 17 may supply gas to agitator blower 18 and may further supply gas ejected through jet gas line 16 to the gas jets 21 of FIG. 2G1*b*. The return gas may flow through the channels 52 to the electrode housing 20*b* to carry the ignition products to the fuel trough 5. In an embodiment, the cell walls such as the mirror 14 may comprise smooth steep cell walls to serve as a chute to the return channels 52 and fuel trough 5 so that the powder fuel flows readily. The walls may be mechanically agitated with an agitator such as a vibrator to increase the flow of the ignition product.

The powder may be recovered for pneumatic recirculation in the upper portion of the cell as well as in the lower portion comprising the electrode housing 20*b*. In an embodiment shown in FIGS. 2G1*b* and 2G1*c*, cell gas enters the gas collection duct 64 through the duct inlet 64 and plenum 65, flows along duct 53 into the duct blower 53*a* through blower inlet 64*a*, and is blown out the blower outlet 64*b* by the duct blower 53*a* to plenum 65 and out duct outlet 64*d*. The gas may flow between window 20 and perforated window 20*c* to be blown down onto the cell floor mirror 14 and through channels 52. The downward flow may carry the ignition products and transport them downward to cause transport to the trough 5. During the flow or transport of the fuel to the trough 5, the fuel may become rehydrated. The powder may be rehydrated by absorption of $H_2O$ from the cell gas. The $H_2O$ partial pressure of cell gas may be maintained a level that achieves the desired extent of hydration or water content of the solid fuel such as a hydrate such as a hexahydrate. In another embodiment, the direction of the cell gas recirculation may be reversed.

In an embodiment, the fuel injection or fuel supply system comprises a fluidized bed. In an embodiment, the fuel comprises a hydrated powder such as $Ag+BaI_2$ $2H_2O$, $Ag+MgBr_2$ $6H_2O$, or $Cu+ZnCl_2$ hydrate such as $ZnCl_2$ $4H_2O$ that is recirculated pneumatically. The electrodes may comprise a surface coating of the metal of the solid fuel. A SF-CIHT cell power generator showing details of fuel powder injection and ignition system with a blower and cyclone separator fuel recirculation-regeneration system is shown in FIG. 2G1*e*2. The ignited powder product may be drawn by suction into the inlet duct 76 of blower 77. The product entrained on the gas flow may be blown out the outlet 78 of blower 77 and flow into the cyclone separator inlet 79 of a cyclone separator 80. In an embodiment, antistatic tubing or metal tubing is used to avoid electrostatic adhesion of ignition product particles to the wall of the recirculation system. The solid particles may fall out into the cyclone separator 80, and the gas may exist the gas return duct 81 at the top of the cyclone separator 80. The pressurized gas may return to the cell to the top of the cell just below window 20 through return duct 81. The powder collected in the cyclone separator 80 may be pressurized by the blower 77 gas flow. Additional blowers may be added along the ducts and components of the fuel recirculation system as need to achieve improved motion of the powder and the desired flow. The powder may flow into the trough 5 to be injected into the rollers. The cyclone separator may comprise an outlet chute 82 that may feed into the auger 66. Alternatively, the auger 66 or auger and trough 5 may extend sufficiently to allow the chute 82 to supply fuel at an angle which permits the fuel to flow freely such as in the case that there is pressure applied to the top of the fuel in the cyclone separator 80. The pressure may be applied by gas from the blower 77. In other embodiments, the auger that serves as the means to transport the fuel powder to the region beneath the rollers 8 may be replaced by another transporter such as a conveyor belt and other transporters of the disclosure.

The powder fuel injection from the trough may be facilitated by pressurized gas flow. As shown in FIG. 2G1*e*1 higher-pressure gas output from the blower 77 may enter chamber 20*e* through gas injection line 19 and flow through a jet or gas permeable membrane 49 to suspend the powder 48 in trough 5 to be drawn into the rollers 8 to be ignited. The fuel in the trough 5 may be at least one of agitated and pushed to the center of the trough 5 to be available to be transported into the rollers 8 by agitator 66 such as an auger driven by agitator motor 67.

In another embodiment shown in FIGS. 2G1*e*2 and 2G1*e*3, the fuel is at least one of fluidized and aerosolized by at least one or more of a gas jet and a gas knife 83. The gas stream may be directed to the surface of the fuel powder at an angle such that the flow direction has a projection along the negative z-axis, the opposite direction as that of the direction from the trough 5 to the roller electrodes. For example, high velocity gas may be directed along the negative z-axis such that the fuel is suspended in the turbulent flow created by the impact with at least one of the fuel powder and the floor and walls of the trough 5. The suspended powder may flow into the inter-electrode region to become ignited. The floor and walls of the trough 5 may be shaped to cause the turbulence to agitate and suspend the fuel powder to cause its injection into the rollers for ignition. In an embodiment, the ignition system comprises a jet 83 on each side of the trough to inject high velocity gas downward into the powder that is forced upward by the back pressure from gas flow off the walls of the trough. The ignition system may comprise gaskets 47 (FIG. 2G1*b*) along the sides of the roller electrodes to confine the aerosolized power in the trough 5 above the powder and below the parabolic mirror 14. The high-velocity gas may be supplied by a line from the high-pressure side of the blower 77. Alternatively, the generator may further comprise a gas pump or compressor that supplies the high velocity gas that may also be at a high pressure. The velocity and pressure may be any desired to achieve the fuel agitation and suspension such as in the range of about 1 m/s to 1000 m/s and about 1 PSIG to 1500 PSIG, respectively. The gas jet or knife 83 may be moved to cover a desired area. The movement may be in the transverse plane. The movement may comprise a repetitive pattern of displacement. The jet or knife 83 may be rastered over a given region to better agitate and suspend the fuel powder. The movement may be achieved with an actuator such as an electromagnetic mechanical device. An exemplary actuator may work on the principles of an electric bell or a speaker as is well known in the art. In an exemplary embodiment, the fuel powder was formed into a fluidized cloud by ⅛ inch diameter, 35 PSIG gas jets on opposing sides of the trough at the middle where the auger piled the powder, and the fuel cloud flowed through the rollers to be ignited.

In an embodiment, the roller electrodes comprise a mechanical mechanism to transport the fuel powder from the trough into the ignition zone at the contact region of the roller electrodes. The mechanism may comprise gears, blades, scoops, paddles or other protrusions or appendages attached or contiguous to the rollers that rotate and transport the fuel upward. In an embodiment, the roller electrodes are covered with shields to return fuel that is not ignited. The parabolic dish 14 may have channels 52 on the back side of the roller to return non-ignited fuel to the trough.

The fuel may be rehydrated by absorption of humidity of the cell gas that may be controlled to achieve the desired hydration. The rehydration may occur during transit between successive ignition events. In an embodiment, the gas stream to cause the fuel to be fluidized and aerosolized to cause fuel injection may carry at least one of suspended water and water vapor to cause the rehydration of the fuel. The water may be entrained in the gas by bubbling through a water column. The $H_2O$ vapor pressure of the cell may be controlled by maintaining a coldest spot at the temperature to achieve the desired pressure at steady state of the liquid and gaseous phases wherein the balance of the cell is maintained at a higher temperature than the coldest spot. In an embodiment, the temperature of the cell gas may be elevated such as in the temperature range of about 26° C. to 2000° C. such that the equilibrium partial pressure of $H_2O$ is not limited by the temperature of the water source that is colder. In an embodiment, at least one of liquid $H_2O$ and a gas stream comprising $H_2O$ vapor may be directed onto the powder fuel in selected rehydration region such as in the trough 5 that may be agitated with the auger 66. The directed water may be provided by a misting means or a sprayer such as one that is ultrasonic or pneumatic. The pneumatic system may be operated off of the gas pressure from the blower. In an embodiment, the hydrate forms by application of at least one of liquid water and water vapor and is stable to the elevated temperature of the cell and cell gas. Any excess water such as deliquescent water may be evaporated to yield the compound with bound waters of hydration. The evaporated water may be condensed to maintain a lower vapor pressure to prevent attenuation of light. In an exemplary embodiment, the collected ignition products may be humidified with $H_2O$ in excess of the waters of hydration in a region such as at least one of the cyclone separator and the trough. The hydrate is stable to the elevated temperature of the rollers, and the water content beyond the waters of hydration evaporate when in contact with the rollers. The evaporated water may be condensed with a colder condenser or dehumidifier to prevent steam condensation on the window 20 to avoid attenuation of light such as visible and near infrared light from propagating out of the cell to the power converter such as the photovoltaic power converter. The condenser or dehumidifier may be in a desired region such as at the intake of the blower that removes $H_2O$ water from the cell cavity through which the light propagates. In an embodiment, the steam may be recirculated to be available for rehydrating the ignition products. The blower may suck the steam from the cell and blow it onto the fuel in a desired region such as in the cyclone separator or auger. The evaporation of excess water over rehydrating the fuel may serve to remove heat from the rollers. In an embodiment, the cooling load due to the rollers heating is reduced by the heat removed by the steam. The steam may be condensed in a condenser and removed from the system by at least one of a heat exchanger and a chiller.

In an embodiment, the rollers comprise blower blades such as those of a turbo pump to cause at least one of suction and blowing relative to the solid fuel such as powder fuel in the trough. The blowing may agitate the powder to suspend it such that some flows into the contact region of the rollers and ignites. In another embodiment wherein the blades create suction, the fuel is sucked into the roller contact region and undergoes ignition. In an embodiment, the rotating blades fixed to the roller electrodes comprise a blower that may replace the blower 77. In another embodiment, the rotating blades are independently driven by means such as an electric motor or a gearbox that may be variable, selectable driven from another motor of the system. Fuel may be sucked into the electrode contact region and ignited. The ignition products may be blown into at least one return duct and returned to the trough 5 with the cell gas as carrier. Alternatively, the ignition products may be blown into a cyclone separator 80. The ignition product particles may be rehydrated during recirculation. The particles may settle out of the cell gas carrier and flow out the cyclone separator chute 82 into the trough 5 and be transported by means such as the auger 66 to the region under the rollers 8 to be re-injected. The cell gas from the chute outlet 82 of the cyclone separator 80 may flow back to the trough 5 by way of a return duct. The gas may be diffused at the trough by a gas diffuser. The flow of gas over the rollers 8 created by the rotating blades may cool the rollers. The heat may be removed with a heat exchanger such as one in the ducts such as one in a duct that returns the flowing gas to the trough.

In an embodiment, at least one roller electrode and its supporting shaft and bearings may be mounted on a movable platform such as a table on sliding bearings and guides such as shown in FIG. **2G1*e***. The sliding bearings may slide on rods that guide the motion such as linear motion. The shaft bearings may be electrically isolated from the movable platform with a high-temperature insulator such as a ceramic. The roller shaft penetrations of the electrode housing have room for the shaft to undergo small translations due to the inter-electrode separation changing. The movable shaft may have an elongated gap in the electrode housing penetration comprising a slot to permit roller shaft travel as the electrode separation changes during operation. These penetrations may be sealed with a flexible seal. The seal may comprise a bellows with a metal to ceramic or glass union. Alternatively, the penetrations may not be sealed. Rather the seal may be open, and a gas tight housing may contain surround other components of the ignition system such as the bus bars to housing penetrations and drive systems such as pulleys and drive belts to the roller motor mounts. The housing may further encase the moveable platform. The ignition system may comprise a bus bar flexure inside of the housing chamber attached to the movable electrode on the moveable platform wherein the bus bars may be rigidly sealed at their housing penetrations with an insulator sealant such as silicon caulking. A housing chamber formed by the housing may be in communication with the cell gas comprising an inert gas such as argon or krypton and some water vapor. Each open seal where a shaft penetrates the electrode housing may comprise an electrically insulating bushing such as a ceramic bushing around the roller shaft with a gap between the circumferential bushing and the shaft and may further comprise gas jets to blow back the powder fuel at the gap, in the embodiment comprising a powder fuel. The bearings at the penetrations of the fixed roller shaft of the stationary or fixed counter roller electrode may be sealed.

In an embodiment, the ignition power source or power supply comprises a power divider of a suitable portion of photovoltaic converter DC output that is input to an inverter to output AC power. An exemplary input voltage to the inverter is 400 V DC, and a suitable output voltage of the inverter is 480 V AC. The AC voltage may be stepped down with a transformer to less than 20 V, and the current increased to at least 1000 A. In an embodiment, the frequency of transformer may be increased to decrease its size. The AC voltage may be rectified to apply low voltage, high direct current (DC) to the electrodes to ignite the solid fuel. An exemplary, drop across the roller electrodes is 1 V and 10,000 A DC. Exemplary AC rectifiers comprise diode bridge circuits such as the C&H Technologies, CHA1BU2450F2FRCMVF single phase diode bridge, air cooled and the Powerex single phase bridge. The DC power may be applied to the electrodes as essentially constant current wherein the current density is sufficient to cause the fuel to ignite. Otherwise, the current may be pulsed to cause a concentration of the current through the skin effect wherein the increase in the current density is sufficient to cause fuel ignition. In these and other embodiments, fast-response super-capacitors may be used for power leveling.

The power supply may comprise the photovoltaic cell (PV) cells that supply power to a large bus bar. In an embodiment, the high DC current is provided by the photovoltaic converter directly or with DC to DC power conditioning to achieve the desired voltage and current. The output terminals of the PV cells may be connected to a large bus bar that supplies the low voltage, high current to the roller electrodes. Alternatively, the power may be conditioned from this large bus bar. In another embodiment, individual PV cells or a plurality of subsets of PV cells of the PV converter may be individually controlled to contribute their corresponding power output to a large bus bar that supplies at least one of power conditioning equipment, the roller electrodes, the power storage, and the output power terminals. The flow of power from each PV or from each subset of the PV cells of the PV converter may be controlled by a switch that combines the components of power in series and parallel to output the desired voltage and current to the large bus bar such as low voltage such as less than 10 V and high current such as greater than 1000 A. In an embodiment, the current may be adjusted to efficiently ignite the as a function of the fuel flow rate. The current may be adjusted to provide enough power to heat the fuel up to detonate it while dwelling in the ignition zone.

In an embodiment comprising a DC power source from the PV converter, the PV cells may be connected in series and parallel to deliver at least one desired voltage and current. The PV power supply may comprise a plurality or voltage and current outputs by the appropriate parallel and series connections of PV cells. The PV power source may comprise a low and higher voltage DC outputs for example. The PV power supply may output a low voltage such as 1 to 10 V for the ignition source of electrical power and a higher voltage such as 10 V to 400 V for the servomotors for example. The internal loads of the electrical generator may be selected to be a match with the available DC outputs from the PV converter. For example, the internal load of the servomotors may comprise low voltage, high current operation.

In an embodiment, the current carrying elements such as the bus bars 9 and 10 are cooled to reduce the resistance and power drop on these elements. The cooling may be achieved with coolant in contact with the element wherein the coolant is cooled with a chiller such as one comprising a heat exchanger and fans. In an embodiment, the current carrying elements such as the bus bars 9 and 10 may comprise superconductors. The voltage drop along the current carrying element may be reduced by cooling or by using superconductors. Liquid nitrogen superconductors may be used since the purpose is not for generating magnetic fields. The components with superconducting materials may comprise a cryogenic management system. The cryogenic management system may comprise at least one of a liquid helium dewar, a liquid nitrogen dewar, radiation baffles that may be comprise copper, high vacuum insulation, radiation shields, and a cryogenic recovery system such as one comprising a cyropump and compressor that may be powered by the power output of a hydrino-based power generator.

In an embodiment, the powder fuel is compressed by the roller electrodes 8 to sufficient extent to cause the fuel to detonate with optimal conversion of the hydrogen content of the fuel into hydrinos. In an embodiment, the pressure is in the range of 0.1 bar to 500 bar. The roller motors 12 and 13 are sized for torque and power to provide the pressure volume work corresponding to compressing the fuel.

In an embodiment, the solid fuel comprises small particles such as powder or slurry particles. The current from the source of electrical power may be pulsed. The particle size may be selected to enhance the efficiency of the skin effect to ignite the fuel. In an embodiment, the source of electrical power may have a lower maximum current yet ignite the fuel particles due to high frequency pulsing of the current that dramatically increases the current density by way of the skin effect. The pulsing may be DC, AC, and combinations thereof. At least one of the current parameters such as pulsing frequency, waveform, peak current, peak voltage, offset current, offset voltage, and duty cycle and particle size may be selected to achieve the optimal amount of fuel ignited per input energy (i.e. highest ignition efficiency). The fuel particle size may be selected by selecting the particle size of at least one of the components of the fuel such as the conductive matrix such as a metal powder such as Ag or Cu metal powder and a $H_2O$ binding compound such as $MgBr_2$ $6H_2O$ or $ZnCl_2$ $4H_2O$. The component particle size may be in the range of about 0.01 um to 1 mm. The fuel particle size may be in the range of about 0.01 um to 1 mm. The flow rate of the fuel may be controlled to achieve optimally efficient energy input to achieve ignition. The roller may comprise a pattern to hold fuel in aggregates that can be detonated by the skin effect concentration of current. The pattern may be maintained with operation by machining in during operation or during intermittent maintenance. In an embodiment, the fuel may be formed into fuel aggregates that can be flowed into the electrodes and ignited. The ignition may be facilitated by current concentration on the surface of the fuel aggregates by the skin effect. The fuel aggregates may be formed by at least one of addition of water and drying. In an embodiment, the ignition product such as powder may be at least one of humidified and wetted and dried. The at least one of humidifying and wetting and drying may be performed in a cell region such as at least one of the cyclone separator and trough. The fuel aggregates may be processed to a smaller more desirable sized fuel aggregates. The processing may be performed mechanically. The auger may serve to process the fuel aggregates. The processing may occur while the particles are being injected into the rollers for ignition. The particle size of the fuel aggregates may be selected by the injection system such as by the gas jets that selectively suspend fuel aggregates of a desired size. The size may be selected by controlling the pressure and flow rate to the carrier gas applied by the gas jets, for example.

In an embodiment, the fuel comprises electrically non-conducting particles to periodically interrupt the circuit. The circuit interruption may cause pulsing of the current. The pulsing or rapidly changing current may concentrate the current by the skin effect to cause the fuel to ignite. The particles may comprise at least one of irregular shapes, beads, and spheres. The particles may comprise alumina, a transition metal oxide such as CuO, an alkaline earth metal oxide such as MgO, CaO, $SiO_2$, a rare metal oxide such as $La_2O_3$, glass, quartz, or oxidized aluminum such as anodized aluminum metal spheres. The beads may have a size sufficient to cause interruption of the ignition current to give rise to a desired concentration of the resulting pulsed current due to the skin effect. The bead size may be the range of about 10 um to 5 mm in diameter. The pulse frequency may be controlled by means such as adding and removing particles and by controlling the size of the particles as well as by controlling the fuel injection parameters such as the roller rotational speed. The non-conductive particles may be selectively removed in the cyclone separator due to their higher mass than the metal and water binding compound particles of the solid fuel. In an embodiment to mill the rollers, an abrasive is run in the trough 5. The abrasive may be in at least partial replacement of the solid fuel. In an embodiment, the abrasive comprises the electrically non-conducting particles.

In an embodiment, the fuel injection system comprises a means to cause a flow of fuel into the inter-electrode contact region and a means to cause the flow to be intermittent. The intermittent flow may cause the current to pulse as the presence of the conductive fuel completes the electrical circuit between the electrodes, and the absence of conductive fuel results in essentially an open circuit. The intermittent flow of fuel may be achieved by an injector that intermittently causes the fuel to flow. The injector may be one of the disclosure. The injector may comprise a pneumatic one such as the gas jets and the rollers acting as a rotary pump. The injector may further comprise a mechanical one and an electrical one. The mechanical injector may comprise a rotating set of paddles or buckets that fold back at about the top dead center position to allow the fuel samples transported in each paddle or bucket fly into the region of contact of the electrodes. The paddles or buckets may be mounted on a belt or chain that undergoes a rotary motion. Alternatively, they may be mounted on a rotating wheel or similar structure known to those skilled in the art. The fuel may be picked up from a reservoir such as that maintained in the trough 5. In an embodiment, the fuel flow is made intermittent with a chopper. The chopper intermittently blocks the flow of fuel. In an embodiment, the chopper comprises a rotating disc transverse to the direction of fuel flow with a fuel passage in a portion of the area of the disc. The passage intermittently aligns with the fuel flow path. The fuel flows through the passage until it rotates out of alignment with the fuel flow path and the non-passage portion rotates into this position. Thus, the rotating disc serves as a mechanical chopper of the fuel flow. The intermittent flow and current pulse rate may be controlled by controlling the rate of rotation of the disc. In another embodiment, the chopper comprises a shutter. The chopper may also comprise a rotating shaft.

In an embodiment, pulsed ignition current is supplied by intermittently supplying electrically conductive fuel pellets. In an embodiment, the powder fuel is formed into pellets that are transported into the region between the electrodes such as roller electrodes wherein the electrical circuit is completed over the non-conductive inter-electrode gap by the conductive pellet. The system shown in FIGS. **2G1*e*2 and 2G1*e*3 may comprise a means such as a mechanical, hydraulic, or piezoelectric actuator and locking mechanism to fix the movable table 62 at a fixed position to fix the inter-electrode gap between the electrodes such as rollers 8. The gap may comprise substantially and open circuit that is closed by the pellet. The pressure applied to the solid fuel to form an exemplary 1 mm to 10 mm diameter pellet may correspond to a force in the range of 0.01 tons to 10 tons. The pressure on the electrodes may be adjustable and correspond to a force on the 1 mm to 10 mm diameter pellet in the range of about 1 lb. to 1000 lbs. The gap may be set to apply the desired pressure onto the pellet when it enters into the inter-electrode region. The gap may be smaller than the pellet such that the pressure is applied to the pellet. The mechanical system may comprise some flexure to accommodate the pellet while applying pressure and while maintaining an essentially fix table 62** position. The exemplary gap may be in the range of about 0.001 mm to 10 mm.

The pellet may have any desired shape such as cylindrical or spherical. The desired shape such as spherical may be selected to enhance the current density at one or more positions to cause ignition at a lower current than in the absence of the geometrical enhancement. The current density may be further enhanced and optionally amplified by the skin effect caused by a rapid change in the current. The rapid change may be achieved by pulsing the current by means such as by mechanical, electronic, or physical switching. The physical switching may be achieved by intermittently supplying conductive fuel between the electrodes such as in the form of pellets. Alternatively, the physical switching may be achieved by interrupting the current by supplying electrically non-conductive material such as non-conducive particles within a conductive fuel stream flowing into the contact region of the electrodes.

In an embodiment wherein there is a preferred condition such as pellet orientation, position, velocity, and pressure in the electrodes such as the roller electrodes 8, the electronically pulsed ignition system of the disclosure comprises a sensor such as an optical or conductivity sensor for the detection of the condition such as position and further comprises a trigger of the pulse of ignition current at the optimal condition such as position. At least one of control of the timing of the ignition and the ignition trigger may comprise a computer control and electronics. In an embodiment wherein there is a mismatch between the timing of the triggering and arrival of the current, the ignition circuit comprises power conditioning systems such as ones that provides a delay of the current such as a delay line or advance of the current such as an advanced trigger.

The injection may be at least one of electrostatic, pneumatic, and mechanical injection. In an embodiment, the ignition system comprises a pelletizer to form compressed samples of the fuel that are fed into the contact region of the electrodes to detonate. The pellets may be fed by at least one of the turbo fan, gas jets, and roller rotary pump. Alternatively, the pellet injection may be achieved by a pellet injector. In an embodiment, a reservoir of pellets such as one in the trough 5 supply pellets that are transported pneumatically into the contact region of the electrodes 8. Referring to FIGS. **2G1*e*2 and 2G1*e*3, the transport may be achieved pneumatically by at least one of suction by the rotary pump comprising the roller electrodes 8, the gas jet 83, and the pressure gradient maintained by blower 77. The pellets may be at least one of sucked and blown into the electrode contact region. The pellets may be fed into the rollers by a vibrator such as a vibratory shaft, platform, or table. The shaft may have a shape to push into the pellet pile in the trough 5 and trough at least one upward. The vibrator may comprise a piezoelectric. The bottom may be tapered and the top flat or cupped for example. Alternatively, the pellets may be partially suspended to cause the pellets to be fed into the rollers by one or more of a gas table and at least one underneath gas jet. The pellets may also be thrown to the rollers by downward projecting jets 83 that act to cause agitation by the gas reflecting off of the trough 5. The injector such as the rotary pump, gas jets, vibrator, and gas table may be supplied by the auger 66**. The pellets may flow singly and sequentially since the over pressure created from the blast of pellet n may push away pellet n+1 (n is an integer) for a period of time such as about 0.1 to 100 ms over which the pressure dissipates to permit the n+1th particle to flow into the contact region to undergo detonation. The firing interval may be controlled by changing the roller geometry such as at least one of width and diameter to control the time that the blast overpressure dissipates. The ignition system may comprise a plurality of roller electrode pairs that sequentially ignite fuel pellets. The ignition system may be electrically connected in parallel such that one pellet may detonated one at a time as the current flows through the detonating pellet. Alternatively, the generator system may comprise a plurality of ignition power supplies that has the capacity to detonate a plurality of pellets simultaneously. The ignition products may be collected by the cyclone separator, the fuel rehydrated as disclosed in the disclosure, and the regenerated fuel may flow from the cyclone separator to the pelletizer.

The pelletizer may comprise a stamper of the powered fuel or a machine such as a tablet maker known to those skilled in the art. The pelletizer may comprise an extruder-knife type or meshed-gear type. The pelletizer may comprise a pill maker. The pelletizer may comprise a hopper that intermittently is filled in between spreading strokes. The stroke may spread the fuel and then fly-back to receive and inflow of another fill of fuel to be pelletized. The pellet may be formed by interdigitating gears that compress fuel fed into the contacting regions into pellets. In an embodiment, the pelletizing is by a mechanism such as interdigitating gears that separates the pellet formation from the ignition process. At least a portion of one member of a pair of gears to form pellets comprises a non-metal such as a plastic such as Nylon, Teflon, or polycarbonate. In an embodiment, the gear comprises non-metal teeth surfaces that resist the adhesion of the pellets formed between the interdigitating teeth. The teeth may be held in place, prevented from splaying, by adjacent teeth until the pellet is released. The pellet may be released from the member of the gear pair by a splaying gear that partially and reversibly spreads the malleable teeth apart.

In an embodiment, a 40 mg sample of a solid fuel mixture comprising Ag+$MgBr_2$ $6H_2O$ at the ratio of 200 mg: 60 mg (30 wt % $MgBr_2$ $6H_2O$) gave 357 J of excess energy in a water bath calorimeter describe in the Data I section. The fuel was in the form of a right cylindrical pellet 3 mm OD×1 mm H=$7.1\times10^{-3}$ $cm^3$ formed with 0.1 to 0.75 tons in a press and held at 90 to 175 pounds of force between the sample fastening bolts of the water bath bomb calorimeter. The pellet density was given by the ratio of the pellet mass and volume: $40\times10^{-3}$ g/$7.1\times10^{-3}$ $cm^3$=5.65 g/$cm^3$. The moles of water in the sample was given by the sample weight, times the wt % hydrate, divided by the molecular weight of the hydrate $MgBr_2$ $6H_2O$, times the moles $H_2O$ per mole hydrate: (40 mg×0.30)/292.2×6=$2.46\times10^{-4}$ moles $H_2O$. The energy yield per mole of $H_2O$ of the fuel is given by the ratio of the energy per pellet and the moles $H_2O$ per pellet: 357 J/$2.46\times10^{-4}$ moles $H_2O$=1.44 MJ/mole $H_2O$. The theoretical energy for $H_2O$ to $H_2(1/4)+1/2O_2$ is 50 MJ/mole. The yield of hydrino follows from the ratio of the energy yield per mole of $H_2O$ of the fuel and the corresponding theoretical energy: 1.44 MJ/50 MJ=2.88%. The gain given by the excess energy divided by the ignition energy is 357 J/40 J=8.9 times. In an embodiment, the conditions to ignite the calorimetry pellet are sufficiently reproduced in the continuous electrical generator such as ones shown in the FIGURES such as FIG. **2G1*e*2** to achieve the same energy yield per mass of fuel in both embodiments. Then, the engineering principles may be determined for the case of repetitive successive ignitions at high rate from the pellet data. The fuel may comprise various forms such as fuel powder, powder compressed by the roller electrodes, and fuel pellets that may be formed in the rollers or preformed in a pelletizer. Consider fuel sample of 40 mg yielding 357 J ignited at an exemplary frequency of 1000 Hz (one ignition per millisecond). Then, the total continuous excess power is 357 J×1000 Hz=357,000 W. The fuel mass flow rate is given by the product of the fuel sample mass and the ignition rate: 40 mg×1000 Hz=40 g/s. The fuel flow volume is given by the ratio of the mass flow and fuel density: 40 g/s/(5.65 g/$cm^3$)=7.1 $cm^3$/s. The input Coulombs for a single ignition is given by the RMS current divided by the peak frequency: $20{,}000/\sqrt{2}$ A×1/120 Hz=118 C per ignition. The sample ignition energy is given by the RMS product of the sample voltage drop and current: 1/2×0.5 V×20,000 A×1/120 Hz=42 J. The corresponding continuous current is given by the product of the Coulombs per sample times the ignition rate: 118 C×1000 Hz=118,000 A or 11,800 A with 10× skin effect due to pulsing as given in the disclosure. The continuous power is given by the product of the energy per sample times the ignition rate: 42 J×1000 Hz=42 kW or 4.2 kW with 10× skin effect due to pulsing as given in the disclosure. The power and current may be reduced with the condition of steady high power plasma versus those of the cold ignition of the pellet. Moreover, the power gain curve is expected to be positive nonlinear. The fuel thickness for the parameters of 1800 RPM of 10 cm diameter, 1 cm wide roller electrodes is given by the volumetric fuel flow rate divided by the rotational velocity and the surface area of the roller: 7.1 $cm^3$/s×60 s/minute/1800 RPM×1/(π×10 cm×1 cm)=0.0075 cm. Using the same analysis on a 40 mg sample of a solid fuel mixture comprising Ag (4-7 um)+$BaI_2$ $2H_2O$ at the ratio of 200 mg:30 mg (15 wt % $BaI_2$ $2H_2O$) that gave 380 J of excess energy in a water bath calorimeter describe in the Data I section, 27% of the $H_2O$ hydrogen goes to hydrino $H_2(1/4)$, the energy gain was 9.5 times, and the corresponding total continuous excess power is 380,000 W.

In an exemplary embodiment, the pellet comprises a 40 mg pellet of $Cu+MgBr_2$ $6H_2O$ (13 wt %), a 40 mg pellet of $Ag+MgBr_2$ $6H_2O$ (23 wt %), or a 40 mg pellet of 40 mg $Ag+BaI_2$ $2H_2O$ (15 wt %). In an embodiment, in the absence of a pellet, the electrodes such a rollers may have an electrical gap between them such as a gap of about 0.1 to 10 mm to prevent substantial current flow such as that which causes ignition, and the presence of the pellet completes the circuit to permit sufficient current flow to cause ignition. The intermittently presence of a pellet may cause intermittent current pulsing which may concentrate the current by the skin effect to lower the maximum current necessary to achieve ignition. Pellets may be formed with a pressure applied to the fuel of about 0.1 tons to 1 ton. The pressure applied to the pellet by the electrodes may about 10 lbs. to 500 lbs. In an exemplary embodiment, a pellet of 40 mg $Ag+BaI_2$ $2H_2O$ (15 wt %) with a 2 mm diameter was ignited with about 0.2 V to 0.5 V drop across the electrodes and about 10 kA maximum current. The ignition occurred in an argon, krypton, or xenon atmosphere in about 1 ms and emitted intense white light for about 1 ms. In another embodiment, the pellet comprised a 40 mg 10% Ag on $Cu+BaI_2$ $2H_2O$ (13 wt %) sphere formed by TIG welder heating of the powder in an inert-atmosphere glove box on a graphite or ceramic plate and ignited in a krypton atmosphere. In an embodiment, the pellets are formed on a conductive surface such as a graphite or copper surface.

In an embodiment, the generator comprises a steam generator to rehydrate the fuel. Fast rehydration kinetics may be achieved with the application of steam to the ignition products. The steam generator may receive as least some heat from the heat generated by the cell such as that released at the rollers during the ignition of solid fuel due to at least one of resistive heating and the formation of hydrinos. The heat may be transferred to the steam generator by a heat exchanger. The heat may be transferred to the steam generator by a heat pipe. The ignition products may be rehydrated by means such as exposure to water vapor such as in the range of 0.1 Torr to the pressure of super saturated steam such as greater than one atm. Alternatively, the fuel may be rehydrated by water such as by using water spray or water mist exposure. Excess water beyond the desired amount such as that which optimizes the energy yield such as that of the hydrate and additional water such as in the range of about 0 to 100 wt % may be removed by the application of pressure such as during compression to form a fuel pellet. Alternatively, the fuel may be rehydrated by adding the ignition products to a saturated solution of the water-binding compound such as an alkaline earth halide such as $BaI_2$ and collecting the precipitated metal powder and hydrated water binding compound such as an alkaline earth halide such as $BaI_2$ $_2H_2O$ crystals. Optionally, the fuel may be centrifuged to remove excess water. The fuel may be dried. The drying heat may be supplied by waste heat. The fuel may be formed into pellets by methods of the disclosure.

In an embodiment, pellets are formed by a physical or chemical process such as by forming a solid that is milled into pellets such as spherically shaped pellets. Alternatively, an exemplary process is to form spheres based on surface tension. The spheres may form by surface tension when molten material is placed on a non-adhering surface such as a ceramic surface or suspended in a liquid medium for example. Other such processes are known to those skilled in the art. In an embodiment, a solid fuel mixture such as at least one of $Ag+BaI_2$, $Cu+BaI_2$, and $Ag+Cu+BaI_2$ is melted and the molten mixture is cooled into pellets such as spherical or cylindrically shaped pellets. The conducting mixture may be a mixture of metals such as a eutectic mixture with a significantly lower melting point than the highest melting point of an individual member of the mixture such as Ag—Cu (28.1 wt %) alloy (m.p.=779° C.), Ag—Sb (44 wt %) alloy (m.p.=485° C.) wherein in lesser amounts of Sb such as 25 wt % (m.p.=562° C.) may be used to maintain high conductivity, Cu—Sb (19 wt %) alloy (m.p.=645° C.), and Cu—Sb (63 wt %) alloy (m.p.=525° C.). Alternatively, exemplary alloys comprise 90/10 at % Ag—Ti alloy (m.p.=1150° C.) and 95/5 at % Ag—Ti alloy (m.p.=961° C.). The solid fuel may comprise mixtures of at least three of different conductive matrices such as mixtures of metals and alloys and different water-binding compounds. The combinations may be selected from metals that are substantially stable to reaction with $H_2O$ such as at least one of the group of Ag, Cu, Ni, Co, Te, Sn, Sb, Mo, Cd, Pb, and Bi and may further comprise a source of $H_2O$ such as at least one of absorbed water and a water binding compound such as at least one of halide, hydroxide, and oxide and a plurality of halides, hydroxides, and oxides and mixtures thereof. The solid fuel may be sintered to form a pellet. A desired shape may be achieved by sintering the solid fuel powder in a mold. The pellet may be hydrated by application of at least one of water vapor and water such as misted or sprayed water. The solidified molten pellet and the sintered pellet may be rehydrated during or after it is formed. Alternatively, the water-binding compound such as a halide such as an alkaline earth halide such as $BaI_2$ or $LaBr_3$ $xH_2O$ such as $LaBr_3$ $6H_2O$, or an oxide such as $La_2O_3$ may be rehydrated before at least one of the fuel mixture is melted, the metal is melted, and the fuel is sintered in the process to form the pellet. In the case that only the metal melts, the water binding compound such as the metal halide or hydroxide (hydrated oxide) such as $Mg(OH)_2$, $Al(OH)_3$, $La(OH)_3$, borax, hydrated $B_2O_3$, and borinic acid may be trapped in the metal that solidifies with pellet formation. The hydrate may be highly stable, and the decomposition temperature may not be exceeded during processing. For example, in an embodiment, the solid fuel mixture comprising the $BaI_2$ $2H_2O$ is not heated above its decomposition temperature of 740° C. wherein the conductive matric such as an alloy such as an alloy of Ag or Cu and Sb melts below the $BaI_2$ $2H_2O$ decomposition temperature. Other exemplary fuels comprise an alloy of at least one of Ag and Cu and another low-melting point metal that may be stable to reaction with $H_2O$ such as at least one of Pb, Bi, Sb, and Te such as 10 to 50 wt % and a hydrate such as $BaI_2$ $2H_2O$. An exemplary ternary alloy is Ag (5 at %), Cu (0.5 at %) Bi (94.5 at %) with a melting point of 258° C. In an embodiment, the $H_2O$ vapor pressure is maintained above that which prevents the decomposition of the hydrate at the melting point of the fuel. In another embodiment wherein the fuel melting point is above the hydrate decomposition temperature and the kinetics of the dehydration reaction is slow, the fuel is maintained in a molten state to form the pellets for less time than the decomposition time. The ignition product may be recovered and rehydrated as given in the disclosure and then melted to form the fuel pellet. In other embodiments, the solid fuel such as the ones that may comprise mixtures of at least three of different conductive matrices such as mixtures of metals and alloys and different water-binding compounds is selected such that the powder readily ignites to for a high hydrino yield with the application of a sustainable pressure and current from the electrodes such as roller electrodes. Suitable currents are in at least one range of about 1000 A to 1 MA and 1000 A to 30,000 A. Suitable pressures are in the range of about 1 atm to 10,000 atm. Suitable forces on the rollers are in the range of about 10 lbs to 4000 lbs.

In another embodiment, powder fuel may flow towards the ignition system and be converted to pellets before entering the ignition process. The pellets can be formed in situ pre-detonation. The in situ pelletizer system may comprise a means to flow powder to the ignition system such as the roller electrodes, a source of plasma generated by a low-current, high voltage pulse applied to the flowing powder to cause pellets to be formed, a means to cause the pellets to flow to the ignition system such as a pneumatic system such as gas jets or a mechanical system such as a piezoelectric driven injector and the ignition system such as the low voltage, high-current ignition system capable of delivering pulsed power with circuit closure by the pellet. The ignition system may comprise the electrodes such as roller electrodes and the source of electric power to the ignition system such as one comprising the PV converter and optionally capacitors.

In an embodiment shown in FIGS. **2G1*e*2 and 2G1*e*3, the ignition product is recovered with the cyclone separator system. The ignition products may flow from the cyclone separator to the pelletizer. The ignited powder product may be drawn by suction into the inlet duct 76 of blower 77. The product entrained on the gas flow may be blown out the outlet 78 of blower 77 and flow into the cyclone separator inlet 79 of a cyclone separator 80. The solid particles may fall out into the cyclone separator 80, and the gas may exist the gas return duct 81 at the top of the cyclone separator 80. In the case that the hydrate of the water binding compound is stable to at least one of melting, sintering, and mechanically pelletizing the corresponding solid fuel, the ignition product may be rehydrated by exposing the ignition product to at least one of water vapor and water such as mist or spray while in transit or residence to the cyclone separator system comprising the blower 77, cyclone separator 80, inlets and outlets such as 76 and 78, outlet chute 82, and optimally the transport system such as the auger 66 and trough 5. The pressurized gas may return to the cell to the top of the cell just below window 20 through return duct 81. The powder collected in the cyclone separator 80 may be pressurized by the blower 77 gas flow. The cyclone separator may comprise an outlet chute 82 that may feed into the auger 66. Alternatively, the chute 82 may feed into the pelletizer, and the pellets may be transported or flow from the pelletizer to the electrodes 8. The auger 66 may transport the pellets. In other embodiments, the auger that serves as the means to transport the pellets to the region beneath the rollers 8** may be replaced by another transporter such as a conveyor belt and other transporters of the disclosure. In an embodiment, the injector comprises a shifter to separate shot or pellets having a size outside of a desired range. The injector may further comprise a transporter to return the shot or pellets of inappropriate size to the pelletizer. Alternatively, different sized shot or pellets may be sorted into a plurality of lots of like size range such as shot or pellets having a diameter of about 1 mm±50%, 2 mm±50%, and 3 mm±50%. Shot or pellets of each lot may be ignited at a set of corresponding ignition parameters such as electrode separation adjusted to optimize the power and energy release.

In embodiment, the recirculation system for collecting the ignition product and supplying it to at least one of the pelletizer and the injector comprises at least one or more features from system of the group of: (i) a perforated window **20*c* and optionally a window 20 at the top of the cell with gas flowing downward to the back of the parabolic mirror 14 on the outside of the roller electrodes 8 through the blower 77 and into the cyclone separator 80; (ii) multiple duct outlets 64*d* at the sides on the upper portion of the cell to create a cyclonic flow about the cell with the gas inlet 64*a* at the bottom of the cell preferably in the region on the outside of the roller electrodes 8 through the blower 77 and into the cyclone separator 80; (iii) a ductless design comprising at least one suction inlet 52 or 64*a* at the region of the electrodes such as on the outside of the roller electrodes 8 through the blower 77 and into the cyclone separator 80 wherein the inlet to the cyclone separator 79 is on its side to create a cyclonic gas flow. In an embodiment, the suction inlets are at about above and transverse to the roller electrodes at about the positions of the Helmholtz coils as well as under the rollers as shown in FIG. 2H$_1$. The top of the cyclone separator 80 may be open to the cell to minimize gas flow back-pressure. The recirculation system may comprise an open cell design such as a box-in-box wherein the cell walls are shaped to reflect the light upward to the PV converter. The top of the cell may be open, and at least one of the walls, the open-top cyclone separator, and the PV converter may be housed in a sealed housing than may be maintained under an inert atmosphere of controlled pressure. The PV cells or panels may comprise a protective window 20 that may further comprise the perforated window 20*c* that is maintained under gas flow conditions. The window such as 20 may have an open gap between at least one wall and the window to allow return gas flow along the wall into the suction inlets 52**. The size of the gap may be variable to change the gas flow rate and pattern. The cell floor may comprise a hopper with an optional means of assisting in moving ignition product not entrained by suction at the suction inlet to at least one of the cyclone separator and the pelletizer. Exemplary means of transport are pneumatic such as suction and blowing and mechanical such as vibration.

In an embodiment of an ignition system having low resistance, the bus bars 9 and 10 each comprise an extruded bus bar such as the Woehner extruded bus bar such as type TCC having a large cross section such as 1600 mm$^2$. The source of electrical power of the ignition may comprise the photovoltaic converter. Dampening capacitors may be located very close to the rollers for fast response of input and reactive power. In another embodiment, the reactive power may be dissipated with a shunt diode that may be connected in parallel with the bus bar. An exemplary diode for transient suppression is a transient voltage suppression diode (TVS) wherein a well-characterized avalanche breakdown takes place above a certain threshold voltage. The diode acting as a resistor with insignificant leakage becomes a shunt capable of current of the order of the ignition current such as multi-kilo amp as well as possessing some dissipative capability following breakdown. In another embodiment, the reactive voltage and current transient is suppressed with at least one varistor. Some reactance such as inductance or capacitance can be designed into the circuit in the event that a delay from the time of first circuit closure by a fuel pellet is desired. The capacitors can be charged with DC current to lower the resistance of the bus bar for current carried from the PV converter to the capacitors. In an embodiment, the reactive energy from the reactive power is low such that it can be dissipated in a corresponding circuit element. By dissipation of the reactive component, power consuming rectification and PV protection may be eliminated. In another embodiment, a designed reactance may counter that of the ignition circuit.

In an embodiment, the ignition power supply comprises at least one capacitor such as a bank of capacitors that may be connected in at least one of series and parallel, a photovoltaic power converter to receive light from the SF-CIHT cell and convert it to electricity such as low voltage, high current DC electricity to charge the capacitors such as a capacitor bank, and bus bars to connect the PV converter to the capacitor bank and the capacitor bank to the roller electrodes. The connections may be in series or parallel. In an embodiment, the PV converter is parallel connected to the capacitors and the electrodes. The bus bar from the PV converter may comprise an inductor to suppress the reflected or reverse, reactive power from the electrodes following an ignition event. The reactive power may be deflected or shunted away from the PV converter to the capacitor bank that may recover at least some of the energy of the reactive power. The inductor may selectively provide impedance for the reflected power and not the forward DC charging power. The power shunting may protect the PV converter from damage by the reactive power. In an embodiment, a diode such as a shunt diode may shunt and dissipate at least some of the reactive power to protect the PV converter.

In an embodiment, the pelletizer may comprise at least one form or mold to contain at least one sample of fuel that may be hydrated or not that may depend on the thermal stability of the hydrate. Each sample may be heated to at least one of sinter to a pellet or melt to from a pellet wherein the cooling melt may at least partially form a sphere. The pellet may be hydrated if it does not comprise $H_2O$. The sintering or melting may be achieved by at least one of directly or indirectly heating each fuel sample. The form or mold may be heated in an oven such as a resistive oven or an arc furnace. In an embodiment, heat for the ignition reaction is transported to the fuel sintering or melting zone by a heat pipe such as one known in the art. In another embodiment, each sample may be heated directly by a direct heater such as an electrical arc or discharge or plasma torch. The arc or discharge heater may comprise an electrode for each fuel sample wherein the fuel sample and form or mold comprises the counter electrode. The form or mold may comprise a plurality of fuel sample containers such as holes such as cylindrical holes or depressions such as semispherical depressions in a plate. At least one of the fuel, sintering fuel, melting fuel, and pellet may resist to adhering to the plate. The samples may be dispersed as aliquots by a sample dispenser. Alternatively, fuel may be applied over the surface of the plate and excess not in the holes or depressions may be removed. The removal may be by means such as pneumatically with a gas stream or mechanically by a scraper or vibration, for examples. Other excess fuel removal means are known to those skilled in the art. With heating the melt may form sintered pellets such as cylindrical ones and spherical solidified pellets from the melt, respectively.

The pelletizer may comprise a plurality of such plates comprising a plurality of such forms or molds. The plates may be mounted on a traveling belt or chain comprising a conveyor mold. The samples may be applied to a plate of the conveyor mold, and the conveyor mold may transport the fuel-loaded plate into the heater. The heater may indirectly or directly heat the samples to form the pellets. The arc or discharge heater for the plate may comprise an array of electrodes with each fuel sample having an electrode with each corresponding fuel sample serving as the counter electrode. Alternatively, the direct heater may comprise at least one of a plurality of plasma torches, at least one rastering plasma torch, and at least one rastering arc or discharge electrode that combined with the counter electrode comprising the sample forms an arc or discharge. Alternatively, a beam such as an electron beam may be used to heat the fuel to make pellets. Steering electrodes or magnets may be used to steer the beam to make pellets in a raster over a plurality of fuel samples that may be moved on a conveyor mold. The electron beam heater may comprise an electron beam welder. The welder may comprise a power supply and control and monitoring electronics, an electron gun, a beam steering mechanism, and a vacuum chamber. In an embodiment, a laser such as a diode laser or gas laser such as a $CO_2$ laser may be used to heat the fuel to make pellets. In an embodiment, the light output from the SF-CIHT cell may be used to heat the fuel sample to form the pellet. In an embodiment, a lamp such as at least one of an incandescent, fluorescent, arc, and halogen lamp and a light emitting diode, laser pump source, flash bulb, or other source of light known in the art may be used to heat the fuel sample to form the pellet. The light may be directed to the fuel sample by a mirror such as a parabolic mirror. The light may be focused by an optical element such as at least one or more of a lens and a mirror. The light may be delivered by at least one optical element of the disclosure such as one or more of a lens, mirror, and fiber optic cable. The fuel sample heated by photons may be on a thermally insulating support to prevent excess loss of energy delivered to heat the fuel sample. Steering optics may be used to steer the laser beam, light beam, or light from the cell to make pellets in a raster over a plurality of fuel samples that may be moved on a conveyor mold. An area of samples can be heated with the combined motion of rastering of the at least one direct heater and transport of the samples by the conveyor mold. The sample area of a plate of samples is heated by at least one method of the group of (i) at least one direct heater is rastered over the area, (ii) at least one direct heater is rastered along a line and the conveyor mold advances the linear raster from the nth line (n is an integer) to an n+1th line by transport, (iii) at least one line of direct heaters heat a line of samples and the conveyor mold advances the linear heaters from the nth line (n is an integer) to an n+1th line by transport, and (iv) and two dimensional array of heaters heats the area of samples of a portion of plate or all of the samples of the plate, and the conveyor mold advances the array of heaters from the nth area to the n+1th area. In an exemplary embodiment, a row of 10, 5 mm-spaced electrodes directly heat 10, 5 mm-spaced samples by high-voltage, low current discharge. The voltages and current may be those of the disclosure. The samples such as 30 to 40 mg $Ag+BaI_2$ $2H_2O$ are in depressions in a plate or plates of non-adhering material such as ceramic or graphite. In an embodiment, the pellets are formed on a conductive surface such as a graphite or copper surface. The plates are mounted on a conveyor and comprise a conveyor mold that is moving at about 1 m/s on average. About 10 J/sample of energy is delivered by a pulse discharge having duration of about a millisecond. The row of 10, 5 mm-spaced electrodes is moved from the nth to the n+1th row by transport by the conveyor of 10 mm. Over one second the number of rows covered is 100 such that 1000 spherical pellets are formed in a second.

Once the pellets are formed they may be removed from the plate and transported to the ignition electrodes. The pellets may be dumped into the auger 66 and trough 5 to be transported to the roller electrodes. Alternatively, the pellets may be removed from the plate of the conveyor mold by means such as pneumatically with a gas stream or mechanically by a scraper or vibration, for examples. Other pellet removal means are known to those skilled in the art. The pellet-forming process may occur continuously as the plurality of plates of the conveyor mold facilitates a repetitive cycle of the steps of forming and releasing pellets. In other embodiments, the conveyor mold is replaced with another type of pelletizer such as a gear or extruder type known to those skilled in the art. The fuel may flow from the cyclone separator 80 into the pelletizer such as one known in the art, and the pellets may exit the pelletizer to be transported to the electrodes 8. The pellets may be transported by the auger 66 in the trough 5 to be delivered to the roller electrodes 8.

In an embodiment, the pelletizer may comprise a shot maker. In an embodiment, the pelletizer comprises a heated hopper wherein the solid fuel is melted and is flowed through nozzles or drippers into a reservoir of water. The water may be saturated with a water binding compound such as $BaI_2$ to suppress the dissolving of the compound such as $BaI_2$ of the fuel wherein the hydration to $BaI_2$ $2H_2O$ may occur in the water reservoir. The heater may comprise one of the disclosure. In an embodiment, the melt may be stirred or agitated to maintain the uniform mixture of the metal and the water binding compound such as $BaI_2$ and $BaI_2$ $2H_2O$. The agitation may be achieved by injecting water or steam that may also at least one of hydrate and maintain the hydrate of the water-binding compound. The heater may be a resistive heater or an arc heater. The nozzles may form drops of molten fuel that rapidly cool and form essentially spherical pellets in the water bath. The pellets may also form and cool in a gas or vacuum drop or on a cool support. The pellets may be removed from the water reservoir and flow into the auger 66 to be transported to the electrodes 8. The removal may be mechanically. In an embodiment, the pellets are strained from the bath. Alternatively, the water is pumped off such as to another reservoir. The pellets may be transported on a conveyor belt, and the pellets may be dumped out such as into the auger 66. The water reservoir may further serve as a heat sink to cool the system where necessary. For example, the electrodes and the plain bearings may be cooled.

In an embodiment, the fuel comprises a pellet of (i) a conductive material such as a metal or alloy such as one comprising a water-nonreactive component such as at least one or more of Ag, Pb, Bi, Sb, and Te and (ii) a hydrated water binding material such as at least one of the conductive material and a material that forms a hydrate such as a compound such as a metal halide, hydrated oxide, and a hydroxide such as those of the disclosure. Exemplary metal halide hydrates, hydrated oxides, and hydroxides are alkali, alkaline earth, and transition metal halide hydrates such as $BaI_2$ $2H_2O$, $MgBr_2$ $6H_2O$, and $ZnCl_2$ hydrate, and alkali, alkaline earth, transition, inner transition, Group 13, 14, 15 and 16, and rare earth metal hydrated oxides and hydroxides such as NaOH, $Mg(OH)_2$, $Fe(OH)_3$, $Al(OH)_3$, borax, hydrated $B_2O_3$ or other boron oxide, borinic acid, and $La(OH)_3$. In an embodiment, the solid fuel comprises an oxide that reacts with hydrogen such as CuO, and the cell gas comprises hydrogen such that the catalyst HOH is formed by reaction of the oxide with the cell gas hydrogen. The ignition product may be formed into a pellet by the steps of melting and rehydration. The steps may in any order or simultaneously. The pellets may be formed by the metal-shot method wherein the ignition product is melted and dripped through nozzles or poured into an aqueous cooling reservoir to form pellets. The water binding material may be hydrated prior to dripping or pouring into the water reservoir. Alternatively, the water binding material may be hydrated while immersed in the water reservoir. In an embodiment, the conductive material such as a metal or metal alloy comprises the ignition product that is melted and dripped or poured into the water reservoir. Some water may turn into steam while cooling the pellet, and the steam may form cavities and become trapped in the forming fuel pellet. Bulk water may also be trapped in the resulting fuel pellet.

The heater to form the melt may comprise one of the disclosure such as a resistive, arc, or inductively coupled heater. The light output from the SF-CIHT cell may be used to heat the fuel sample to form the pellet. The light may be directed to the fuel sample by a mirror such as a parabolic mirror. The light may be focused by an optical element such as at least one or more of a lens and a mirror. The light may be delivered by at least one optical element of the disclosure such as one or more of a lens, mirror, and fiber optic cable.

In an exemplary embodiment, fuel pellets are formed by melting silver and dripping about 40 mg samples into water preferably under an inert atmosphere. The steam may form cavities, and $H_2O$ may be trapped in the pellet. The sliver melt may also be dripped into a brine of an inorganic compound that forms a hydrate such as a $BaI_2$ $2H_2O$ brine wherein the hydrate may be incorporated into the pellet as the hydrate. An exemplary energy release is 10 kJ/g. Given that the energy release from $H_2O$ to $H_2(1/4)+1/2O_2$ is 50 MJ/mole, 10 kJ would require 2E-4 moles (3.6 mg) of $H_2O$. Thus, the silver pellet would have to contain at least 0.36 wt % $H_2O$. In another embodiment, the pellets comprise a metal such as Ag or an Ag alloy such as Ag (72 wt %)-Cu (28 wt %) and at least one of $H_2$ and $H_2O$ that may be incorporated into the metal during pellet formation by means such as bubbling into the melt before dripping into the reservoir and incorporation of $H_2O$ from the reservoir.

The fuel may comprise a hydrated porous material such as a hydrated metal or metal alloy material such as metal or metal alloy foam, sponge, mesh, cavitated metal or alloy, or mat. The hydrated porous material may be formed by at least one of steam and water treating of the molten metal or metal alloy wherein $H_2O$ may be trapped in the material. The metal or metal alloy may be at least one of Ag, Cu, Pb, Bi, Sb, and Te. The porous material may be form in larger units than the fuel samples or pellets, and the fuel samples such as pellets may be formed by machining such as by stamping or punching out pellets from the larger units of material. The material may be hydrated before or after the machining to the desired size pellets. In an embodiment, metal foam is made by adding a salt to metal, heating to a temperature in between the melting point of the metal and the salt, forcing the molten metal into the salt with pressure exerted by an inert gas, and cooling the mixture to a solid. The salt may be removed by placing the material in water and by dissolving the salt. The material may be formed into a slab, and the foam may be machined into pieces and hydrated with water. In another embodiment, the metal-salt mixture may be cut into pellets and hydrated to form the fuel pellets. Alternatively, the salt of the metal-salt mixture may comprise a hydrate, and the mixture may be cut or punched into pellets to form the fuel pellets. In an embodiment, the porous metal or metal alloy or metal-salt mixture may be cast as cylinders or another elongated shape and cut into pellets by a machine such as a pelletizer of wire feed. In an embodiment, the salt may comprise flux. The metal may comprise silver, and the flux may comprise at least one of borax, borinic acid, and alkali carbonate such as sodium carbonate. In the case that the salt is dehydrated, the salt is rehydrated to form the fuel.

In an embodiment, the fuel may comprise a conductive matrix such as a metal or metal alloy such as Ag—Cu (50-99 wt %/1 to 50 wt %) having incorporated at least one of a source of hydrogen, hydrogen, a source of $H_2O$, and $H_2O$ and may optionally comprise a water binding compound that may comprise a hydrate. The fuel may comprise at least one of a shot and a pellet. In an embodiment, the solubility of at least one of hydrogen, a source of hydrogen, and $H_2O$ is increased in the molten form of the conductive matrix material of the solid fuel such as metal or alloy. The molten matrix material such as a molten metal or alloy may be exposed to at least one of hydrogen, a source of hydrogen, and $H_2O$. The pressure of the at least one of hydrogen, a source of hydrogen, and $H_2O$ may be any desired such a less than, equal to, or greater than atmospheric pressure. The pressure may be in the range of about 1 m Torr to 100 atm. The temperature may be increased to increase the hydrogen absorption. In an embodiment, at least one of the metal and the composition of an alloy are selected to increase the incorporation of at least one of hydrogen, a source of hydrogen, and $H_2O$. In an embodiment, the composition of Ag and Cu of an alloy comprising Ag and Cu is selected to optimize the incorporation of at least one of hydrogen, a source of hydrogen, and $H_2O$. Additives such as at least one of oxides and hydroxides may be added to the molten alloy to increase the content of at least one of hydrogen and oxygen that may serve as at least one of the source of H and HOH catalyst. The molten matrix material that has absorbed at least one of a source of hydrogen, hydrogen, a source of $H_2O$, and $H_2O$ may be solidified initially on the outer surface to trap the at least one a source of hydrogen, hydrogen, a source of $H_2O$, and $H_2O$. At least one of $H_2$ and $H_2O$ may be much less soluble in the solid than in the molten metal or alloy. Cavities or pockets of gas comprising at least one of $H_2$ and $H_2O$ may form in the solidified metal or alloy. In an embodiment, hydrogen is incorporated in the solidified melt by techniques that cause embrittlement such as those known in the art. The shot or pellets formed from the melt having at least one of dissolved source of hydrogen, hydrogen, source of $H_2O$, and $H_2O$ may be porous or comprise metal foam or sponge with at least one of incorporated source of H, source of catalyst, source of $H_2O$, $H_2$, and $H_2O$. The molten matrix material that has absorbed at least one of a source of hydrogen, hydrogen, a source of $H_2O$, and $H_2O$ may be solidified to form pellets such as shot by cooling in a liquid or gaseous coolant such as water or an inert gas. Alternatively, the melt may be solidified as a solid that may be in any desired form such as a wire or slab. The pellets may be formed mechanically from the solid. The pellets may be formed by shearing a wire or by punching a slab. In another embodiment, the pellets may be formed from the molten conductive matrix material that further contains a water-binding material such as those of the disclosure such as metal halide or oxide that forms a hydrate such as $ZnCl_2$ hydrate, $BaI_2$ $2H_2O$, or $MgCl_2$ $6H_2O$.

In an embodiment, a gas may be blown into the melt to form shot. The gas blown into the melt may form porous metal or metal foam into which water is collected when the melt is dripped into water. The gas may blow the molten metal out a nozzle. A mechanical dispenser such as a spinning wheel may be used to catch the drips and throw them to the water bath for cooling. The pelletizer may comprise a centrifugal atomizer or pelletizer. Molten pellet material may be dripped into a cup or onto a rotating cone or disc that are rotated at speed sufficient to produce a substantial centrifugal force that forms a pellet. In a rotating electrode process embodiment, a bar of the solid fuel or at least one component is rotated as the bar is melted at the end by a heater to form pellets. The heater may comprise an arc such as one from a tungsten electrode. A water spray may be applied to at least partially cool the falling pellets. The pellets may drop into a coolant other than water such as a less dense coolant such as oil.

In other embodiments, pellets may be formed by at least one of using a working fluid or coolant other than water and using a method other than dripping into bulk water. Suitable methods know by those skilled in the art are fluid or gas atomization such as water atomization that involves the dispersion of thin stream of molten pellet material by an impinging high energy jet of fluid such as a liquid such as water or a gas such as an inert gas. In the atomization process, the particle shape produced depends on the time available for surface tension to form a minimum surface to volume ratio as the molten droplet cools to a solid. A low heat capacity gas favors a spherical shape, by extending the cooling time. The dripper or nozzle can allow for more or less free fall of the particle wherein the former case called close coupled or confined atomization comprises a design of the nozzle and a head that provides the atomizing gas to be adjustable so that the impingement of the gas jets and the molten stream occurs just below the nozzle.

In an embodiment, as it streams out the dripper to make pores in the pellets, an un-melted component of the fuel such as powder ignition product may be added to the melt such ignition product such as a one comprising a molten alloy such as Ag—Cu alloy such as Ag (72 wt %)-Cu (28 wt %) or Ag (50 wt %)+Cu, Pb, Bi, Sb, or Te. The pressure on at least a portion of the pellet surface may change during the phase change between water and steam that may create pores. The pellets may be dripped into water of different temperatures to make pores by the bubbling or steam action on the forming pellet. The pellets may be dripped into water having a dissolved gas such as argon or $CO_2$ to form porous pellets. Porous pellets may also be formed by bubbling a gas such as argon into the melt. In an embodiment, ultrasound is applied to the cooling pellets in the bath to form pores. The ultrasound may be sufficiently intense to cause cavitation. The pellets may concentrate the ultrasonic power to increase the efficiency of forming porous pellets. Porous pellets may be formed by adding salt that may be dissolved in the water bath. The pellets may be hydrated by trapping $H_2O$ in the pores. In an embodiment, the pellets may comprise a zeolite structure. Pellets of a desired size or size range may be made by controlling the viscosity of the melt by means such as by controlling the temperature and by controlling the size of the orifices of the drippers or nozzles. The desired size may be in at least one range of about 10 um to 2 cm, 100 um to 10 mm, and 1 mm to 5 mm. A steam generator may be used to contribute to the hydration of the pellets. Exemplary fuels are $TiO+H_2O$ 3 mm pellet, Cu pan$+H_2O$, $Ag+ZnCl_2$ $4H_2O$, $Ag+CaCl_2$ $6H_2O$, $Ag+MgBr_2$ $6H_2O$, $Ag+MgCl_2$ $6H_2O$, $Ag+CeBr_3$ $7H_2O$, $Ti+ZnCl_2+H_2O$ (185:30:30) 100 mg loaded in Cu cap, Ag+hydrated borax, $Ag+CeCl_3$ $7H_2O$, $Ag+SrCl_2$ $6H_2O$, $Ag+SrI_2$ $6H_2O$, $Ag+BaCl_2$ $2H_2O$, $Ag+BaI_2$ $6H_2O$, Cu+hydrated borax, $Cu+ZnCl_2$ $4H_2O$, $Cu+CeBr_3$ $7H_2O$, $Cu+CeCl_3$ $7H_2O$, $Cu+MgCl_2$ $6H_2O$, $Cu+MgBr_2$ $6H_2O$, $Cu+CaCl_2$ $6H_2O$, $Cu+SrCl_2$ $6H_2O$, $Cu+SrI_2$ $6H_2O$, $Cu+BaCl_2$ $2H_2O$, and $Cu+BaI_2$ $6H_2O$.

In an embodiment, powder from the ignition of solid fuel is collected by the cyclone separator and formed into molds such as linear or slab molds. The powder may be dispersed by means of the disclosure such as mechanically and pneumatically. The powder may be heated to a melt in a furnace that is well insulated to conserve energy. The melt is cooled in a cooler section that may have some heat provided by a heat exchanger from a hot portion of the cell. The solidified material such as a metal-salt mixture such as a mixture of $Ag+ZnCl_2$ or $Ag+MgBr_2$ is hydrated. The hydration may be achieved by applying bulk water, water mist, or steam. In the latter case, the steam may be recycled to conserve energy. The fuel slabs of strips may be machined into pellets by means such as at least one of punching, stamping, and cutting. The pellets may be transported to the rollers by means such as a conveyor or an auger such as auger 66. The pellets may be injected into the rollers to be ignited by an injector such as one of the disclosure.

In an embodiment, at least one nozzle or dripper is spatially rastered over a line or area as it discharges the molten fuel onto a non-adhering surface such as that of a conveyor belt wherein the non-adhering surface beads up the drips into pellet spheres or semi-spheres. The raster may be over a line wherein the conveyor belt may be moved while the dripping occurs to achieve a dispensing over an area. Alternatively, the raster may be over a plane during the dispensing over an area that is independent of the conveyor translation. In other embodiments, a line of nozzles or drippers dispense simultaneously along a line and may dispense over an area by rastering in the transverse direction or by dispensing alone a line at different transverse-axis positions with the motion of the conveyor. In an embodiment wherein the drippers discharge the molten fuel onto a conveyor belt of non-adhering surface that beads up the drips into pellet spheres or semi-spheres, the fuel may comprise an additive such as Sb that serves to lower the melting point below the hydrate decomposition temperature such as 740° C. in the case of $BaI_2$ $2H_2O$.

The pelletizer may comprise first and second vessels that may comprise heaters or furnaces to serve as melters of the ignition product that may comprise a metal such as a pure metal or alloy such as Ag, Cu, or Ag—Cu alloy. The heater to form the melt may comprise one of the disclosure such as a resistive, arc, or inductively coupled heater. The light output from the SF-CIHT cell may be used to heat the fuel sample to form the pellet. Heat from a heat exchanger may deliver heat to the melt from another component of the SF-CIHT cell. The heater may comprise a resistive heater with heating elements capable of high temperature such as ones comprising Nichrome, tungsten, molybdenum, SiC, or $MoSi_2$. The elements may be hermetically sealed. The heater may comprise a non-filament type such as an electric arc heater. In an embodiment, the ignition product is collected by a means such as a cyclone separator. The collected product may be flowed into the first vessel, crucible, or hopper that further comprises a heater. The product may be melted by the heater, and the melt may flow into the second vessel through a connecting passage. The passage outlet into the second vessel may be submerged below the surface of the melt such as the molten ignition product in the second vessel. The first vessel may discharge the melt under the surface of the second. The melt level in either vessel may be sensed by electrical resistance probes such as a refractor wire such as a W or Mo wire that is electrically isolated from the vessel wall to sense an open circuit in the absence of contact with the melt and a low resistance when in contact with the melt. The flow from the first to the second may be controlled by the pressure differential between the first and second based on the level of melt in the first and second vessel and any gas pressures in the first and second vessels. The melt levels may be changed to control the flow between the vessels. In an embodiment, the column height of molten ignition product in at least one of the passage and the first vessel is such that the corresponding pressure given by the product of the melt density, gravitational acceleration, and the column height plus the gas pressure in the first vessel is greater than or equal to the pressure in the second vessel.

The gas pressure in the first vessel may comprise that of the SF-CIHT cell. In an embodiment, the pressure in at least one of the first and second vessel is controlled with at least one pressure sensor, at least one valve, at least on gas pressure controller, at least one pump, and a computer. The flow through the passage may also or further be controlled by a valve, petcock, or sluice valve.

The second vessel or crucible further comprises at least one nozzle or dipper to form shot. The melt may flow out an orifice or nozzle of the second vessel to a water reservoir to form shot, and the resulting level and pressure change may cause melt to flow from the first vessel to the second. In an embodiment, the orifice or nozzle opening size may be controlled to control at least one of the shot size and metal flow rate. Exemplary orifices of adjustable size may comprise a solenoid valve, a shutter valve, or a sluice valve. The opening size may be controlled with a solenoid or other mechanical, electronic, or electromechanical actuator. In another embodiment, the office may have a fixed size such as 1 mm diameter for an alloy such as Ag—Cu (72%/28%). The orifice may have a diameter in the range of about 0.01 mm to 10 mm. The size of the shot may be controlled by controllably adjusting at least one of the orifice size, the fuel melt temperature, the diameter of the connecting passage between vessels, the pressure in the first vessel, the pressure in the second vessel, the pressure difference between the first and second vessel, the fuel composition such as the composition of at least one of the conductive matrix such as the weight percentages of pure metal components of a metal alloy such as a Ag—Cu alloy, and at least one of the percentage composition of a water binding compound, the water content, and the hydrogen content.

In an embodiment, the ignition product is melted in a first region or vessel having intense heating such as that provided by an electrical arc such as at least one of an arc having the ignition product directly carrying at least some of the arc current and an arc on in proximity to the first vessel such as a refractory metal tube through which the ignition product powder flows. The melt may flow into another region or vessel having a temperature above the ignition product melting point that may be maintained by a second vessel heater such as a resistive heater such as one comprising at least one of Nichrome, SiC, and MoSi. In an embodiment to avoid degradation of the arc plasma electrodes while melting the ignition product powder, the first vessel heater comprises an inductive heating element such as an electromagnetic heater such as an alternating frequency (AC) inductively coupled heater. The second vessel heater may comprise and inductively coupled heater. The frequency may be in at least one range of about 1 Hz to 10 GHz, 10 Hz to 100 MHz, 10 Hz to 20 MHz, 100 Hz to 20 MHz, 100 kHz to 1 MHz, 500 Hz to 500 kHz, 1 kHz to 500 kHz, and 1 kHz to 400 kHz. The vessel may comprise a heat resistant AC-transparent material such as a ceramic such as silicon nitride such as $Si_3N_4$, $Al_2O_3$, alumina, or Zirconia, zirconium oxide. The heater may comprise high insulation between the vessel and the inductively coupled coil that may be cooled by means such as water-cooling. In another embodiment, the second vessel may be at least one of partially and solely heated by the melt that is formed and elevated in temperature in the first vessel. The first vessel heater such as an inductively coupled heater may heat the melt to a higher temperature than that desired in the second vessel to provide heat to the second vessel. The temperature and flow rate of the metal flowing from the first vessel to the second vessel may be controlled to achieve the desired temperature in the second vessel. In an embodiment, the heater of at least one of the first and second vessels comprises at least one of an inductively coupled heater, a heat exchanger to transfer thermal power sourced from the reaction of the reactants, and at least one optical element to transfer optical power sourced from the reaction of the reactants. The pelletizer may also comprise one or more electromagnetic pumps to control the flow of at least one of the powder and melt through the pelletizer. In an embodiment, the pelletizer further comprises a heat recuperator to recovery or reclaim at least some heat from the cooling shot and transfer it to incoming ignition product to preheat it as it enters the smelter or first vessel comprising a heater. The melt may drip from the dripper into the water reservoir and form hot shot that is recovered while hot. The heat from the cooling shot may be at least partially recovered or reclaimed by the recuperator. The recovered or reclaimed heat may be used to at least one of preheat the recovered ignition product powder, melt the powder, heat the melt, and maintain the temperature of at least a portion of the pelletizer. The pelletizer may further comprise a heat pump to increase the temperature of the recovered heat.

The second vessel may be capable of maintaining a gas at a pressure less than, equal to, or greater than atmospheric. The second vessel may be sealed. The second vessel may be capable of maintaining a desired controlled atmosphere under gas flow conditions. A gas such as at least one of a source of H, $H_2$, a source of catalyst, a source of $H_2O$, and $H_2O$ may be supplied to the second vessel under static or flow conditions. In an embodiment, the gas such as hydrogen and water vapor and mixtures may be recirculated. The recirculation system may comprise one or more of the group of at least one valve, one pump, one flow and pressure regulator, and one gas line. In an embodiment, a plurality of gases such as $H_2$ and $H_2O$ may be at least one of flowed into or out of the vessel using a common line or separate lines. To permit the gases to bubble through the melt, inlet gas ports may be submerged in the melt, and the gas outlet may be above the melt. Both $H_2$ and $H_2O$ may be supplied by flowing a gas mixture such as one comprising cell gas such as a noble gas with added gas such as $Ar/H_2$ (5%) or one comprising at least one of $H_2$, $H_2O$, and a mixture of $H_2$ and $H_2O$. The gas may flow through a $H_2O$ bubbler to entrain $H_2O$ in a gas stream such as a $H_2$ gas stream, and then mixture may flow into the melt. The gas-treated melt may be dripped into $H_2O$ to form the shot with incorporation of the gases such as at least one of $H_2O$ and $H_2$. The added or flowing gas may comprise $H_2$ alone and $H_2O$ alone. The melt may comprise an oxide to further increase the shot content of at least one of a source of H, a source of catalyst, $H_2$, and $H_2O$. The oxide may be formed by the addition of a source of 02 or 02 gas that may be flowed into the melt. The oxide may comprise those of the disclosure such as a transition metal oxide. The oxide such as CuO may be reducible with $H_2$ ($CuO+H_2$ to $Cu+H_2O$), or it may comprise an oxide that is resistant to $H_2$ reduction such as an alkaline, alkaline earth, or rare earth oxide. The oxide may be capable of being reversibly hydrated. The hydration/dehydration may be achieved by $H_2O$ addition and heating or ignition, respectively. In an embodiment, a fluxing agent such as borax may be added to the melt to enhance the incorporation of at least one of $H_2$ and $H_2O$ into the shot.

In an embodiment, the shot fuel may comprise at least one of a source of H, $H_2$, a source of catalyst, a source of $H_2O$, and $H_2O$. At least one of a source of H, $H_2$, a source of catalyst, a source of $H_2O$, and $H_2O$ may be supplied to the to the plasma formed from the ignition of the fuel such as shot or pellet fuel. Hydrogen may be supplied to the cell wherein the plasma is formed. The hydrogen may be supplied as a gas. In an embodiment, water is supplied to the plasma in the cell where the plasma is formed. The water may be supplied as a gas such as steam from a heated reservoir of water. Alternatively, the water may be injected into the plasma. The directed water may be provided by a misting means or an injector or sprayer such as one that is ultrasonic or pneumatic. The water sprayer or injector may comprise a sprayer such as Fog Buster Model #10110, U.S. Pat. No. 5,390,854. The water spray may further serve as a coolant such as a coolant of the roller electrodes. Excess steam may be condensed by a condenser. The supplied hydrogen may serve as at least one of the primary or secondary or supplementary source of at least one of H, source of catalyst, catalyst, source of water, and source of HOH. The supplied water may serve as at least one of the primary or secondary or supplementary source of at least one of H and HOH catalyst.

In an embodiment, at least one of the fuel composition such as at least one of a source of H, a source of catalyst, $H_2$, a source of $H_2O$, and $H_2O$ and an additive such as a phosphor, and the cell gas such as a noble gas and the cell gas pressure may be dynamically controlled to control the spectrum of the light produced to match that of the PV converter sensitivity. The match may be monitored with at least one of a spectrometer and the electrical output of the PV converter. At least one of the pressure, flow, and exposure time of at least one of a source of H, $H_2$, a source of catalyst, a source of $H_2O$, and $H_2O$ may be controlled in the second vessel to control the fuel composition. The light spectrum may further be controlled by controlling the ignition rate, the roller speed, the shot injection rate, the shot size, the ignition current, the ignition current duration, and the ignition voltage.

In an embodiment, the reaction of the $H_2O$ of the fuel is $H_2O$ to $H_2(1/p)+1/2O_2$ such as p=4. The oxygen may be removed from the cell. Alternatively, hydrogen may be added to the cell to replace that which formed hydrino $H_2(1/p)$. The oxygen may react with the oxygen product to form $H_2O$. The combustion may be facilitated by the cell plasma. The hydrogen may be supplied by permeation through the cathode during the external electrolysis of $H_2O$. In another embodiment, the oxygen may be scavenged in the cell. The oxygen may be scavenged by an oxygen getter such as a material such as a metal that may be finely divided. The getter may selectively react with oxygen over other gases in the cell such as $H_2O$. Exemplary metals are those that are resistant to reaction with water of the disclosure. Exemplary metals having low water reactivity comprise those of the group of Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, and Zn. The getter or oxygen scrubber may be removed from the SF-CIHT cell and regenerated. The removal may be periodic or intermittent. The regeneration may be by hydrogen reduction. The regeneration may occur insitu. The insitu regeneration may be intermittent or continuous. Other oxygen getters and their regeneration such as zeolites and compounds that form reversible ligand bonds comprising oxygen such as salts of such as nitrate salts of the 2-aminoterephthalato-linked deoxy system, $[\{(bpbp)Co_2^{II}(NO_3)\}_2(NH_2bdc)](NO_3)_2.2H_2O$ ($bpbp^-$=2,6-bis(N,N-bis(2-pyridylmethyl)aminomethyl)-4-tert-butylphenolato, $NH_2bdc^{2-}$=2-amino-1,4-benzenedicarboxylato) are known to those skilled in the art. The timing of the oxygen scrubber regeneration may be determined when the oxygen level increases as sensed by an oxygen sensor of the cell oxygen content.

In an embodiment, the pellets are transported from the pelletizer to the pellet injector. In an embodiment wherein pellets are formed in a water reservoir, the pellets may be removed from the water bath by a conveyor that may be porous to water. The water may also be removed in the trough 5 that is porous to water. The pellets may be transported to the region under the roller electrodes by the auger 66. The pellets may be injected into the roller by the gas jets 83. The gas jet may be directed towards the bottom of the trough 5 wherein the downward pointing air jets 83 lift the pellets to achieve pellet injection via the reflected air and turbulent flow. At least one of one or more collimators and baffles under the rollers through which the pellets pass may cause near single-file pellet flow that may further serve to produce a Venturi effect to suck the pellets into the rollers.

The trough 5 may comprise a housing to contain pressurized gas. The trough and housing may comprise a cylindrical tube with the auger 66 inside. The auger 66 may substantially close up the tube to gas flow. The pellets may be transported to a hopper at the center of the auger 66. The hopper may comprise air jets such as those of 83 that may be pointed in a desired direction such as upward to fluidize a pile of pellets. The gas jets may form a fluidized bed of the fuel pellets that may flow through at least one collimator or baffle to flow into the inter-electrode region of the roller electrodes 8 to be ignited.

In an embodiment, the pellet injector comprises a piezoelectric actuator such as one of the disclosure wherein the axis of travel is axial, towards the inter-electrode region. The injector may be fed with pellets from the auger 66. The piezoelectric actuator may comprise an extension shaft such that there is a thin shaft running through the pellet pile to the top where the shaft end pushes pellets from the top of the pile towards the electrodes. The injection of pellets may be at least partially assisted with suction from above the rollers. The suction may be provided by the fuel recirculation system comprising at least one or more fans, blowers, or pumps such as blower 77. In other embodiment, the injector may comprise at least one of assistant wheels or gears or a selenoidal actuator such as an acoustic speaker to hurl pellets into the inter-electrode gap region. In addition to at least one collimator or baffle, the width of the roller electrodes may be adjusted to better facilitate firing of pellets sequentially at a rate of about 1 per millisecond.

In an embodiment, the injector comprises a pneumatic injector comprising a source of pellets such as a hopper, and a valve to regulate the flow of pellets into the pneumatic injector that may comprise a tube containing pressurized flowing gas to carry the pellets to a tube opening through which the pellets pass on a trajectory to the inter-electrode region. The valve may comprise a rotary airlock valve to a pellet transport line. The gas in the tube may be supplied by a separate line into which the pellets flow from the pellet transport line. The tube downstream from the union of the two lines comprises the injection tube that transports the pellets to the opening pointed towards the electrodes. The flow of the gas in the injection tube may be increased by the Venturi effect. The pneumatic injection system may comprise at least one channel for flowing gas that creates a Venturi effect. The flowing gas may be pressurized by at least one fan, blower, or pump. The pneumatic pellet hopper and injector are an alternative to the railgun embodiments shown in FIGS. 2H3 and 2H4.

The pellets injection may be at least one of facilitated and controlled by at least one of electric and magnetic fields. The pellets may be charged and directed by electrodes such as grid electrodes into the ignition area between the roller electrodes 8. The pellets may be charged or have an applied voltage and guided to the ignition area of the roller electrodes 8 that have the opposite charge or polarity of applied voltage. The pellets may comprise magnetizable material such as ferromagnetic nanoparticles and may be magnetized. The ferromagnetic material may be resistant to oxidation. The particles may have an oxidation resistant coating such as a oxide coating. The particle may be incorporated into the pellet during pelletization such as during shot formation. The pellets may be magnetized by at least one of electromagnets and permanent magnets. The magnetized pellets may be directed into the ignition area by magnetic fields. The magnetic fields may be provided and controlled by at least one of electromagnets and permanent magnets. The roller electrodes 8 may be oppositely magnetized to guide the pellets into the ignition area.

In an embodiment, fuel pellets are transported into a drum comprising pellet selectors such as perforations and indentations each suitable for holding a pellet. The pellet may be held in the selectors by a gas pressure gradient. The drum may be pressurized, and the pressurized gas may leak through the perforations. The gas flow may be attenuated by the presence of a pellet that at least partially blocks the perforation wherein the partially blocked flow causes a pressure gradient such that the pellet is held in place. The pressurization may be achieved with a fan or blower. The drum may rotate to move pellets that are selected in selectors such as ones comprising the perforations and indentations to a position wherein the perforations are covered by a means such as an external set of rollers under which the drum rotates. The presence of each roller blocking each perforation removes the gas pressure gradient to cause the corresponding pellet to be released. Each pellet may drop into a corresponding manifold connected to a gas line. The pellet may be transported in the gas line by the flow of gas from the pressurized drum to a position under the roller electrodes. The gas pressure gradient from the manifold to the electrodes may propel the pellet into the region between the roller electrodes where it is ignited. In another embodiment, the pellets formed on the conveyor mold may drop directly into the manifolds and connected gas lines wherein the pressure gradient from the region of the conveyor manifold to the roller electrodes transports the pellets to the roller electrodes with kinetic energy to cause them to be injected to the ignition process.

The pellet may be accelerated by the rollers to match the roller speed. The roller speed may be such that the travel distance of the pellet over the duration of the ignition may be similar to the pellet diameter, and the ignition power may be matched to supply the ignition energy during the corresponding pellet ignition dwell time, the ignition duration. For example, the pellet may have a diameter of 2 mm and the ignition duration may be 1 ms. So, with a 2 m/s roller perimeter velocity, the pellet travel distance is 2 mm over the ignition duration. With an input power of 5 kW, the input energy to match the ignition energy is 5 J.

In an embodiment, the light may be emitted in any direction from the position of the ignition of the fuel. The light may at least one of propagate to a window in any desired direction to be further incident on the photovoltaic converter directly or indirectly using optical elements such as those of the disclosure. In another embodiment, the light may directed in a preferred direction such as upward by at least one optical element such as at least one mirror such as parabolic mirror 14 shown in FIG. 2G. The fuel to be injected may comprise a mixture of pellets and powder that are regenerated following ignition. The mixture of powder and pellets may seal the bottom portion of the electrodes to force the plasma expansion upward towards the window 20 to confine the light emission to the cell rather than the trough region 5 In an embodiment, the fuel such as the pellets may be launched is a desired direction to cause a preferential trajectory and corresponding light emission is a desired region of the cell. In an exemplary embodiment, at least one of the injection system such as at least one of the pneumatic injector, the gas jets, the pressure gradient caused by the blower 77 (FIGS. **2G1*e*2 and 2G1*e*3), and the rotary pump comprising the rotating roller electrode 8 launch the pellet upward from the trough 5 to cause the ignition and emission of light to occur in the cell space above the parabolic mirror 14**.

In an embodiment comprising fuel such as at least one of slurry, powder, and pelletized fuel such as one comprising a mixture of fuel pellets and powder, some fuel such as powder flows between the rollers, is heated, and some metal adheres to the rollers to mend blast damage. The ignition system may further comprise a mill to remove excess material from the rollers to maintain them. In an exemplary case that the electrodes are held in a relative fixed position except for adjustments based on optimizing the operating conditions, the electrodes are maintained by milling. The milling may be achieved with a fixed abrasive blade that mills the surface as the roller electrode rotates. The height of the blade may be adjustable. In an embodiment, the outer layer of the roller may comprise a hardened layer such as a rim of 18200 grade 3 copper that may be compression fitted on a central roller section that may have higher conductivity. In an embodiment, metal such as metal powder may be sintered onto the electrodes to protect them from the blast. The sintering may occur during operation and may occur at least in at least one of the ignition zone with at least partial heating by the blast and another position on the roller. In the latter case, metal powder may be flowed onto the roller and heated by at least one of the roller and a heater such as an arc or resistive heater to cause the metal to adhere to the roller by mean such as sintering. Roller erosion may be continuously or intermittently repaired during operation. Using a deposition system, the roller electrodes may be refurbished and repaired during operation or intermittently maintained with a temporary shut down. An embodiment of a deposition system comprises an electrical discharge machining (EDM) system or an electroplating system such as EDM electroplating system that may be operated in vacuum. Systems and methods of that may provide continuous refurbishing of the gears or rollers during operation in vacuum or in an inert atmosphere such as one comprising a noble gas such as argon, krypton, or xenon comprise alternative embodiments of deposition systems. Exemplary deposition systems that are known to those skilled in the art comprise laser welding or sintering with a diode laser for example, cold spray which is well suited for copper deposition, thermal spray such as spraying using a plasma arc, electric arc, flame spray such as high-velocity, oxy-fuel, (HVOF), and sputtering. In an exemplary embodiment, silver and copper spray are applied at about 200° C. and 400° C., respectively, the spray pressure is in the range of 250 to 500 PSI, the gas velocity is about Mach 2.2, the powder chamber pressure is about 25 PSI, the gas flow is at about 50 SCFM, and the carrier gas is a noble gas such as He, Ne, or Ar. The heating to maintain the spray temperature may be at least partially provided by the thermal power of the SF-CIHT cell. Other ranges are possible such a these values plus or minus 75%. In an embodiment, the outer portion of the electrodes such a roller electrodes that is worn during operation comprises a similar or the same metal alloy as the fuel so that they may be intermixed and interchanged during operation including repair and refurbishment. The rollers may be smoothed and formed to a desired radius by at least one of milling, grinding, lapping, super finishing and heat-treating. In another embodiment, the electrode mending or repair system comprises a sensor such as an optical sensor such as a laser to detect roller damage. A controller may control the deposition to repair blast damage. The cell or other cell components may be coated with corrosion resistant coatings such as yttria partially stabilized zirconia (YSZ) by a coating method of the disclosure such as plasma spray. The milled material and excess cold-sprayed material may be returned to at least one of the cyclone separator and pelletizer by transporters of the disclosure such as pneumatic or mechanical ones.

In an embodiment, the electrodes such as roller electrodes or a surface layer thereof may comprise the metal of the fuel. In an embodiment, some of the fuel shot or pellet metal fuses or welds to the electrode surface. In an embodiment such as one with a high rate of shot or pellet injection, the deposition may exceed the rate that material is deformed or avulsed from the electrode by the ignition events such that net metal build up occurs on the surface. The deposition of shot or pellet material such as metal on the rollers may be controlled by controlling at least one of the shot or pellet size, the ignition current, the ignition voltage, the ignition power, the triggering of the ignition current relative to the position of the shot or pellet in the inter-electrode region, the roller speed, the roller spacing, and the roller temperature. The excess metal over that which comprises the original electrode dimensions may be removed by means such as machining. In an embodiment, at least one of powered ignition product and powdered fuel is injected into the inter-electrode region where the plasma is generated during ignition of co-injected fuel. The ignition product and powder fuel may comprise a metal power such as Ag or Ag alloy such as Ag—Cu powder. The metal powder may at least one of bond to the surface of the roller electrodes, weld or fuse to the roller electrode surface, coat the roller electrodes, and powder coat the roller electrodes. The powder such as ignition product such as metal powder such a silver metal powder may be injected pneumatically. The injection may be with fuel or in synchrony with fuel whose ignition creates plasma. The metal powder may be injected with fuel pellets or shot such as silver shot of about 1 mm to 5 mm diameter that may contain at least one of hydrogen and water. The ignition product may be diverted from the fuel recirculation system. For example, powder may be taken from the cyclone separator or may bypass the cyclone separator and may be injected with the fuel such as silver shot. In an embodiment, small particles such as those less then 10 um diameter may be made to bypass the cyclone separator and be directly injected into the rollers to bond to the surface. In this case, an electrostatic precipitator may not be needed to remove particles that the cyclone separator has difficulty removing. Powder that doesn't bond to the roller electrodes may be recirculated with ignition product formed directly in the ignition. In an exemplary embodiment, Ag powder is co-injected with Ag shots into the rolling electrodes to bond the Ag powder to the surface during ignition to in situ repair the rollers, i.e. repair the rollers while in operation. In an embodiment, pressure may be applied by one roller on the other. The pressure may be applied while the powder deposition occurs. The pressure may be applied by closing any gap between the rollers. The current may be applied continuously while the rollers are in contact and powder is injected to bond to the rollers. The bonding may be facilitated by at least one of the high current applied between the roller such as an arc current and plasma caused by the ignition of fuel such as at least one of pellets and powder fuel. The powder injection may be achieved by pneumatic injection with the pellets or shot and other methods of the disclosure such as by injection of gas into a trough by gas jets to cause a powder stream to flow into the inter-electrode region as disclosed. Excess material such as Ag metal can be machined away with a surface-finishing tool such as a precision grinder or lathe that may operate intermittently while the rollers are stopped or continuously while the roller are turning. Machined removed material may be recirculated. The material may be recirculated by transport to the cyclone separator. In another embodiment, a material such as a material with a low work function such as a metal such as silver powder may be injected into the inter-electrode region during ignition to become ionized to support the plasma. The material may have a low work function to better ionize to support the plasma. An exemplary gaseous material to ionize is a noble gas such as argon. The enhancement of the plasma may increase the hydrino reaction rate and power.

In an embodiment, the hydrino reaction initiated at the ignition event releases high energy light such as extreme ultraviolet and ultraviolet. The resulting plasma may become fully ionized and optically thick by maintaining an appropriate cover gas at an appropriate pressure. The pressure may be maintained at below atmospheric, atmospheric, or above atmospheric. The cover gas may comprise a noble gas such as argon, krypton, or xenon or a $H_2O$ or a source of $H_2O$ such as water vapor or hydrated fuel wherein the water may be chemically bound or physi-absorbed. Other elements or compounds may be added to the reaction mixture to cause the plasma to be optically thick such as $ZnCl_2$ or $ZnCl_2$ hydrate. The additive may have low ionization energy to form more ions and electrons. The optically thick plasma may emit blackbody radiation. The blackbody radiation may be desirable for photovoltaic conversion. At least one of the cell gas, the additives, the fuel, the ignition conditions, and the pressure may be selected to achieve a desired spectrum of blackbody radiation that is optimized for efficient photovoltaic conversion of light into electricity. The photovoltaic converter may comprise PV cells that convert ultraviolet light into electricity. Exemplary ultraviolet PV cells comprise at least one of p-type semiconducting polymer PEDOT-PSS: poly(3,4-ethylenedioxythiophene) doped by poly(4-styrenesulfonate) film deposited on a Nb-doped titanium oxide (SrTiO3:Nb) (PEDOT-PSS/SrTiO3: Nb heterostructure), GaN, GaN doped with a transition metal such as manganese, SiC, diamond, Si, and $TiO_2$.

In an embodiment, the ignition of the fuel causes a high rate of the hydrino reaction that creates plasma. The plasma may comprise fully ionized plasma that may be optically thick and may emit its characteristic blackbody radiation. In an embodiment, essentially all of the energy may be emitted as photons except heating and pressure volume energy that may be minimized by means of the disclosure to be small components.

In an embodiment, the solid fuel is allowed to expand following the blast, such that a gaseous density of the catalyst such as nascent HOH and H is formed to optimally to propagate the hydrino reaction. The ignition under unconfined conditions may increase at least one of the power, light, and hydrino products by the hydrino reaction. For an exemplary solid fuel pellet of about 50 to 100 mg comprising $Ag+ZnCl_2+H_2O$ (74:13:13 wt %) or 40 mg sample of a solid fuel mixture comprising Ag (4-7 um)+$BaI_2$ $2H_2O$ at the ratio of 200 mg:30 mg (15 wt % $BaI_2$ $2H_2O$), high speed (18,000 frames per second) video recorded with an Edgertronic camera shows that the plasma sphere has a radius of about 10 cm that may be relatively static for a substantial duration of the plasma emission event. The plasma achieves this radius within about 100 us and the plasma sphere persists even after the electrical current is zero. Typical times are 1 ms for the current to decay and 10 ms for persistent plasma. The plasma cools uniformly at the same maintained volume of about 4.2 liters. Only a continuous expansion of the weak plasma is observed with arc plasma formation of a control material such as Sn wire with a kink. This indicates that in an embodiment, the hydrino reaction requires a fixed volume with a corresponding plasma density to maintain the catalyst nascent HOH and H. The visible an infrared spectra of unconfined detonations of fuels such as $Ag+ZnCl_2+H_2O$ (74:13:13 wt %) and $Ag+MgCl_2$ $6H_2O$ (83:17 wt %) are continuum blackbody emission with an integrated intensity of at least 5 to 10 times that of control arc plasmas of silver or aluminum alone. In an embodiment, chemically assisted such as $Ti+ZnCl_2$ $4H_2O$, $Ti+MgCl_2$ $6H_2O$, and $Ti+H_2O$ in an Al DSC pan that may have a mechanism similar to that of the thermal solid fuel such as $Cu(OH)_2+FeBr_2$ may compensate for being detonated in a confined volume. In an embodiment, the electrodes may be narrowed or beveled to reduce the confinement of the blast. Exemplary solid fuels to be detonated in an unconfined manner are at least one of $Ag+MgCl_2$ $6H_2O$, $Ag+ZnCl_2$ $4H_2O$, $Ag+CeBr_3$ $7H_2O$, $Ag+BaI_2$ $6H_2O$, Ag powder+DIW, $Ag+CaCl_2$ $6H_2O$, $Ag+MgBr_2$ $6H_2O$, Ag+hydrated borax, $Ag+CeCl_3$ $7H_2O$, $Ag+SrCl_2$ $6H_2O$, $Ag+SrI_2$ $6H_2O$, $Ag+BaCl_2$ $2H_2O$, Ag+hydrated alkali halides such as LiCl $H_2O$, Ag+hydrated borax, $Ag+KMgCl_3\cdot 6(H_2O)$, Ag+hydrated alkali halides such as LiCl $H_2O$; $Cu+MgCl_2$ $6H_2O$, $Cu+ZnCl_2$ $4H_2O$, $Cu+CeBr_3$ $7H_2O$, $Cu+BaI_2$ $6H_2O$, Cu powder+DIW, $Cu+CaCl_2$ $6H_2O$, $Cu+MgBr_2$ $6H_2O$, Cu+hydrated borax, $Cu+CeCl_3$ $7H_2O$, $Cu+SrCl_2$ $6H_2O$, $Cu+SrI_2$ $6H_2O$, $Cu+BaCl_2$ $2H_2O$, Cu+hydrated alkali halides such as LiCl $H_2O$, Cu+hydrated borax, $Cu+KMgCl_3\cdot 6(H_2O)$, Cu+hydrated alkali halides such as LiCl $H_2O$, $NH_4NO_3$ in DSC pan. In an embodiment, a source of at least one of the catalysts such as HOH and H are maintained in the cell. For example, at least one of hydrogen and water vapor may be added or flowed through the cell. $H_2O$ may be added by bubbling in flowing inert cover gas such as argon.

Continuum EUV with a short wavelength cutoff at 10.1 nm is observed with expansion of the solid-fuel ignition plasma into vacuum wherein the expansion results in optically thin plasma as well as lower density plasma that may support the hydrino reaction. In an embodiment of the $H_2O$ arc plasma, the limitation of excessive pressure is eliminated. In an embodiment, arc plasma is created and maintained in gaseous $H_2O$ such as steam with a pressure that may be above atmospheric. The cell may comprise two electrodes in a vessel capable of maintaining a desired atmosphere of plasma gas at a desired pressure such as a pressure range of about 1 Torr to 100 atm. The $H_2O$ gas may be ignited with a high-voltage arc that transitions to high current, low voltage plasma. The $H_2O$ pressure may be adjusted to achieve the plasma density-temperature condition that propagates the hydrino reaction at a high rate. The cell may be maintained above the temperature at which steam at the desired pressure condenses. The steam may be formed from a given charge of water in a sealed cell. Alternatively, steam may be flowed into the cell from a steam generator. The arc plasma discharge may be formed and maintained between a cathode and anode that may be connected to a switch and a high voltage power supply such as one comprising a bank of capacitors as described in the disclosure and in Mills Prior Publications. The voltage may be in the range of about 0.1 to 100 kV, and the current may be in the range of about 1 mA to 100 kA.

In an embodiment run at vacuum pressure, intense soft X-ray radiation is observed consistent with the hydrino emission being continuum soft X-ray with a short wavelength cutoff of 10.1 nm (122.4 eV). In an embodiment operated at atmospheric pressure, predominantly UV, weak visible, and intermediate levels of near infrared are observed. The hydrino soft X-ray radiation ionizes the medium that subsequently manifests as ultraviolet (UV) and longer wavelengths. The heated fuel may emit in the near infrared depending on the temperature. Since the emission is from plasma, essentially all should the energy be emitted as photons. In an embodiment, systems and methods are applied to achieve high energy light for efficient photovoltaic conversion to electricity. In an embodiment, the window 20 is transparent to high-energy light such as UV light. The corresponding photovoltaic converter may convert UV light into electricity.

The plasma mixture may comprise a means such as an additive can convert EUV or UV emitting plasma to one that emits longer wavelengths for which PV converters are readily available. For example, high-energy light may be down converted in energy to the visible and near infrared wavelengths by making the optically thick. The optically thick plasma may comprise high-pressure, fully ionized plasma at a desired blackbody temperature. The powder density and ionization may be controlled by controlling the composition and quantity of fuel, cell gas and additive compositions, and ignition parameters such a pressure and current. In an embodiment comprising Ag+$ZnCl_2$ hydrate, near the infrared emission (NIR) intensity is stronger than that of the visible emission. The hydroscopic $ZnCl_2$ may down convert the light energy relative to $BaI_2$ $2H_2O$ of Ag+$BaI_2$ $2H_2O$ fuel, for example. At least one of $H_2O$ and $ZnCl_2$ may be used to down convert UV to longer wavelengths that match commercial PV cells such as concentrator cells. $H_2O$ is optically thick at long wavelengths such as NIR; so, the $H_2O$ vapor pressure in the path length to the PV may be controlled to maintain transparency to the NIR light. $ZnCl_2$ is another candidate.

Short wavelength light may be down-converted to longer wavelength light by a gas maintained in the cell. The gas may absorb short wavelength light such as UV and re-emit the light as longer, desirable wavelength light. The re-emitted light may be capable of PV conversion into electricity such as visible light. Exemplary gases that absorb short wavelength light such as UV and re-emit at longer wavelengths are noble gases such as xenon and molecular gases such as $H_2O$ and $N_2$. The gas pressure may be adjusted to optimize the conversion from short-wavelength to the desired wavelengths. Phosphors such as those used in fluorescent lights that convert the UV from Hg vapor discharges into visible light may be used to convert UV to visible light in the SF-CIHT. The phosphor may comprise a crystal phosphor, such as a mixture of $MgWO_4$ and $(ZnBe)_2SiO_4$·Mn, or a single-component phosphor, such as calcium halophosphate activated by antimony and manganese. The phosphor may be incorporated into the fuel or may be coated on an optical component such as at least one window such as 20 or 20 c. Exemplary phosphors known to those skilled in the art are transition metal and rare earth metal compounds. Further exemplary phosphors are given at the link http://en.wikipedia.org/wiki/Phosphor which is incorporated by reference in its entirety. The phosphor may be selected to minimize the energy loss by photon down conversion. In an exemplary embodiment, the phosphor may comprise a blacklight phosphor such as europium-doped strontium fluoroborate ($SrB_4O_7F:Eu^{2+}$), europium-doped strontium borate ($SrBr_4O_7F:Eu^{2+}$), lead-doped barium silicate ($BaSi_2O_5:Pb^+$), lead-activated calcium metasilicate, europium-activated strontium pyroborate, $SrP_2O_7$, Eu, $SrB_4O_7$, Eu, $BaSi_2O_5$, Pb, $SrAl_{11}O_{18}$, Ce, or $MgSrAl_{10}O_{17}$, Ce.

In an embodiment, the energy released by the hydrino reaction in the form of at least one of light, heat, and plasma heats an emitter such as a high-temperature-capable emitter such as carbon or a refractory metal such as molybdenum, tungsten, a metal or alloy such as superalloys used in gas turbines or jet engines such as alloy 718, Hastelloy, Inconel, Waspaloy, Rene alloys, MP98T, TMS alloys, CMSX single crystal alloys, titanium aluminide, ceramic, and ceramic coated metal or alloy. The high temperature may be in the range of about 1000 K to 4000 K. In an embodiment, the light penetrates a window such as a quartz or sapphire window and heats the emitter. The heated emitter emits blackbody radiation that may be converted to electricity using photovoltaic cells such as such as NIR cells such as InGaAs or Ge cells or by using thermo-photovoltaic cells. In an embodiment, the emitter may comprise a partial enclosure or an enclosure about the electrodes in the cell that may emit light through the window 20.

In an embodiment, a sample of solid fuel such as a fuel pellet is ignited while being submerged under water. The ignition may be achieved with high current. The voltage may be low. Exemplary high ignition currents may be in the range of about 100 to 100,000 A, and exemplary low voltages may be in the range of about 1 V to 100 V. The energy released may heat the water. The water may be converted to steam. At least one of heated water and steam may be used directly. Alternatively, the steam may be converted to electricity using a steam turbine and a generator.

In an embodiment, the solid fuel comprises a source of hydrogen and a source of catalyst that does not oxidize the conductive matrix such as a metal powder matrix. The non-oxidizing fuel may comprise hydrogen. The non-oxidizing fuel may comprise a hydrocarbon. The hydrogen of the hydrocarbons may serve as the H and H catalyst reactants to form hydrinos. The hydrocarbon may be injected into the inter-electrode region. The hydrocarbon may be injected into the contact region of the roller electrodes that are rotated. The rotation may transport the fuel into the contact region to be ignited. The conductive matrix such as metal powder may be injected into the inter-electrode region. The hydrino reaction mixture comprising a conductive matrix such as a metal powder and the hydrocarbon may be injected simultaneously or individually from the same or different injectors, respectively, to constitute the fuel. The fuel may be transported by means such as by the rotation of the roller electrodes to undergo ignition.

The ignition product may be collected by pneumatic means of the disclosure such as by suction. The powder ignition product such as that comprising the conductive matrix such as metal powder may be collected by suction onto a filter. Hydrocarbon that is not ignited may be collected and recycled as well. The products may be transported and used to reconstitute the fuel. The fuel may be reconstituted by addition of the hydrocarbon to the conductive matrix. The hydrocarbon may be added directly to form the fuel that may be injected. Alternatively, the recovered conductive matrix and hydrocarbon may be injected separately wherein they form the fuel with the simultaneous injection into the ignition system.

In an embodiment wherein projectile particles may be hurdled up towards the window 20 by at least one of the ignition blast and the rotating rollers 8, the particle are suppressed or blocked from impacting with the window 20 at the top of the cell. The suppression and blockage may be achieved by the flow of the gas from the recirculation system such as from the gas return duct 18 of the cyclone separator 80. In an embodiment, the particles may be charged, and the suppression and blockage may be achieved by a magnetic field such as that of a magnetic circuit. At least one of the magnetic field and magnetic circuit flux may have a contribution from the current of the ignition system. The magnetic circuit may comprise a ferromagnetic material. The magnetic field may comprise at least one of an electromagnet such a resistive or superconducting magnet and a permanent magnet.

In another embodiment, the suppression and blockage may be achieved by an applied electric field. The electric field may repel ions. The electric field may be applied by at least one pair of electrodes through which the particles flow. The electrodes may produce a coronal discharge, cause the particles to be charged, and draw the particles to the counter electrode to be collected. The particle removal may be achieved by the flow of current though the particle-cell gas mixture. The particle suppression and blockage system may comprise one substantially like that of an electrostatic precipitator known to those skilled in the art. In an embodiment, the pressure is increased to decrease the speed of the ignition products following detonation of the fuel. The electrostatic precipitator may comprise at least one central wire charged negatively and at least one positively charged powder collection plate. The plate may be circumferential about the wire. The electrostatic precipitator may comprise a plurality of central wires and collection plated that may be circumferential such as tubes. In an embodiment, the electrostatic precipitator plates are positioned to be at least partially out of line of sight of the light from the cell. In an embodiment, the electrostatic precipitator electrodes or plates are positioned in a region of the cell wherein there is no plasma from the ignition process to electrically short the plates. An exemplary location is one above the baffle of the disclosure. In an embodiment, the electrostatic precipitator may be an element of the recirculation system where the plasma does not exist such as in the cyclone separator. The small particles may be charged by a central electrode such as a wire electrode, and the particles may be collected by a circumferential electrode such as one comprising or near the walls of the cyclone separator. The electrostatic precipitator may remove small particles such as in the size range such as about less than 10 um diameter that are difficult for the cyclone separator to remove. The cyclone separator may have a modification in the structure such as a widen portion such as a bulb to slow or stall the gas velocity to permit the particles to be adhere to the plates of the electrostatic precipitator electrodes and fall into a desired system such as the pelletizer. The collection electrodes or plates may drop the material into the bottom of the cyclone separator. The cyclonic gas flow may also dislodge the collected particles and transport them to the bottom of the cyclone separator. The dislodging may be achieved by mechanical means such as a vibration means and other mechanical dislodgers of the disclosure. The plates may be product-non-adhering plates such as those of the disclosure. The diameter of a tube collection plate may be sufficiently large such that the ray paths of the light from the ignition process do not substantially intercept the plate. In the limit of an effective infinite radius, no ray path would intercept the positively charged plate. The collected ignition product may be removed continuously or intermittently by a cleaning means of the disclosure such as gas jets, gas knives, gas forced through perforations in the electrode plates as in the case of gas flow through perforated cell walls of the disclosure, and mechanical cleaning such as ultrasound application or by a mechanical scraper. The electrode may be replaced on an intermittent or continuous basis wherein the cleaning may be performed remotely from the incident light regions. In an exemplary embodiment, the electrostatic precipitator electrode may be moving such as on a belt, or it may comprise a belt that moves. The ignition system may further comprise a parabolic mirror. The mirror may be cleaned. For example, the mirror may be constantly cleaned with an air jet. The tube wall may be of sufficient radius to avoid substantially intercepting any ray path directly or from the parabolic mirror. At higher pressure, the tube may be able to be made larger due to the increase breakdown voltage of the cell gas such as argon.

Figure 3:
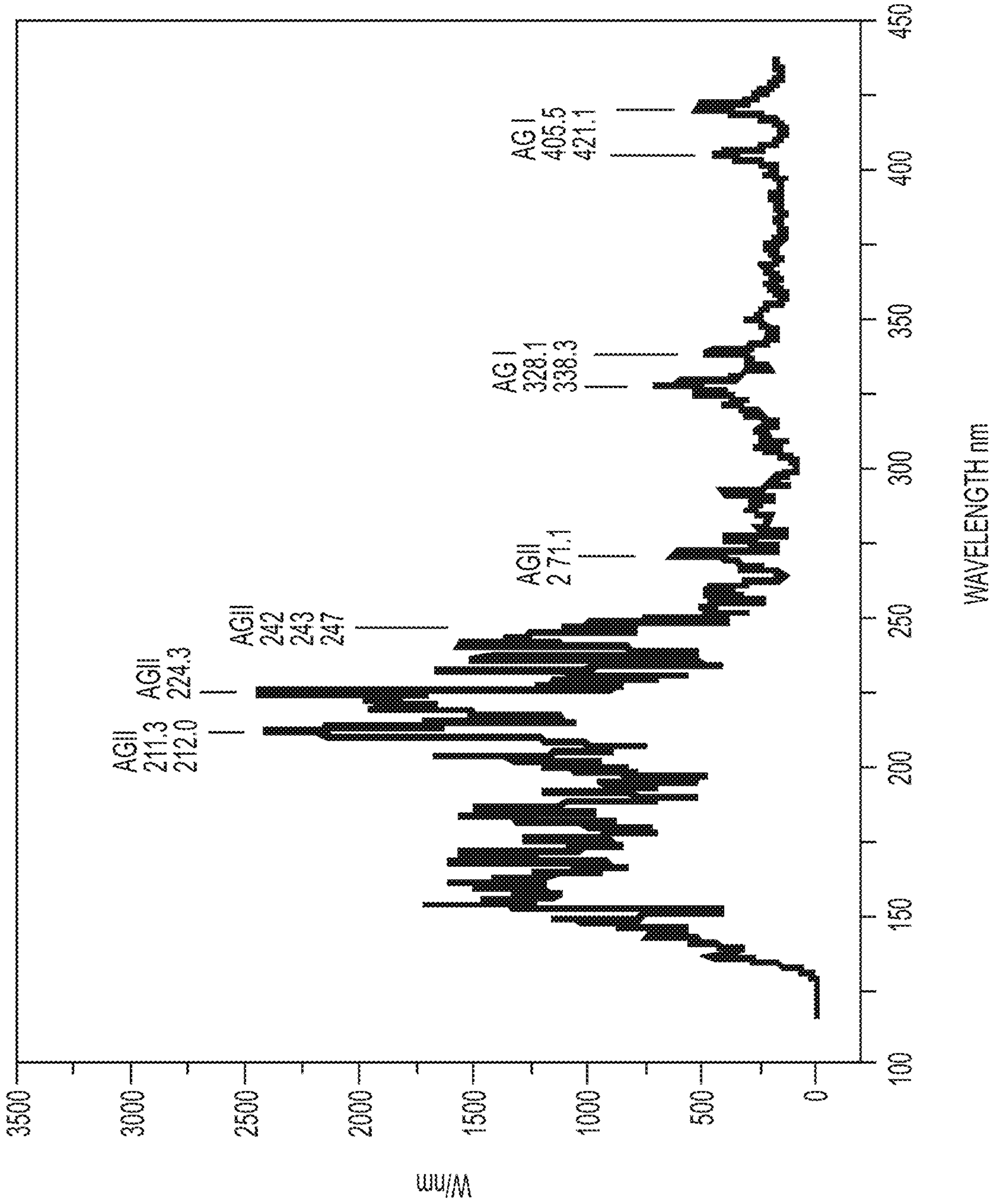

In another embodiment, the particle suppression and blockage system may comprise pressurized gas jets. Alternatively, pressurized gas may flow through the perforations of the perforated window 20*c*. The gas may flow from the top of the cyclone separator 80 through gas return duct 81 (FIG. 2G1*e*3). In an embodiment, the gas flow from the gas jets may comprise the fuel recirculation system wherein pressurized gas may further be applied to recirculate the ignition products.

In an embodiment, the ignition product is at least one of blocked and suppressed from at least one of contacting and adhering to the reflective and transparent surfaces of the SF-CIHT cell such as the cell walls, any mirrors such as the parabolic mirror, and any windows such as the window to the PV converter. The reflective and transparent surfaces may comprise polished, smooth surfaces such as polished metal in the case of reflective surfaces, and clean of any ignition-product-adhesive contaminants such as grease. The surfaces may be heated to an elevated temperature by at least one of the ignition process and at least one heater wherein the high temperature decreases the adhesion of the ignition product. The cell wall may comprise a material that is at least one of capable of high temperature operation, highly reflective, resistant to ignition product adhesion. The cell walls may comprise a material or plating that does not form an oxide coat such as Ag, Au, Pt, Pd, or other noble metal. The cell walls may comprise a material or plating that does form an oxide such as Al, Ni, or Cu. Mechanical agitation such as vibration or ultrasound may be applied such that the ignition product powder will be less capable of adhering. In an embodiment, the SF-CIHT cell surfaces such as cell walls may comprise acoustic speakers that vibrate at a frequency and amplitude to prevent the ignition product powder from adhering such that the cell walls remain reflective of the incident light from the ignition of the solid fuel. The ignition product may further be prevented from adhering to the surfaces by at least one of the use of gas walls and electrostatic repulsion or by the use of electrostatic precipitators to remove the ignition product.

In an embodiment, the cell walls may be reflective with perforations or gas jets. The pressurized gas to the perforations or jets may flow between two parallel plates that comprise walls of a gas supply duct. One plate having the gas perforations or jets may face the cell and another mirrored wall of the duct may be positioned to reflect light back into the cell that penetrates the gas perforations or jets. The back of the perforated wall may be mirrored as well so that multiple bounces between the walls may occur to permit the return of the light to the cell. In another embodiment, the perforations or jets may be oriented at an angle relative to the surface. The perforations may have a geometry such as conical to achieve gas dispersion. The wall comprising jets or gas perforations may comprise a screen or mesh such as 1 to 50 um mesh screen. The screen may comprise stainless steel or other corrosion resistant metal or alloy. The perforations or jets may perform to ideally create a uniform gas pressure barrier at the walls that would impede powder ignition product from at least one of contacting and adhering to the cell wall. Electrostatic charging of at least one of the ignition products and the walls to cause the former to be repelled from the latter may be applied as well to prevent the powder from adhering to the walls. Gas flow through the cell may transport the ignition product powder to recirculate the fuel.

In an embodiment, the upward propagating ignition products are incident upon a barrier or baffle such as a barrier transparent for light such as a window such as the window and perforated window combination 20 and 20*c*. The barrier retards the upward particle trajectory. The velocity-retarded particles are then removed. The removal may be by means of the disclosure such as pneumatically such as by suction or blowing. In an embodiment, the velocity-retarded particles are removed by suction. The suction may be to a cyclone separator that may be substantially open. The corresponding recirculation system may comprise the ductless design or box in a box design. The barrier or baffle may slow the velocity of the particles from the ignition to be permissive of the removal of the particles by the electrostatic precipitator of the disclosure. The baffle may comprise a transparent heat and adhesion resistant material such as at least one of sapphire, fused quartz, fusid silica, quartz, and sapphire on a transparent substrate such as quartz. The baffle may be transparent to ultraviolet light. A suitable baffle comprises at least one of sapphire, LiF, $MgF_2$, and $CaF_2$. The baffle may comprise a lens that may perform at least one of focus and diffuse the light from the ignition of fuel to form an even distribution across the aperture to the light to electricity converter such as at least one of the photovoltaic converter, the photoelectric converter, and the thermionic converter. The baffle lens may be shaped to receive the incident ignition light and focus it on the light to electricity converter such as at least one of the photovoltaic converter, the photoelectric converter, and the thermionic converter. The lens may be at least partially concave to spread the light out. In another embodiment, diffuse light may be more focused and concentrated with a lens that may be at least partially convex. In an embodiment, electrostatic charging of at least one of the ignition products and the baffle, walls, and windows to cause the former to be repelled from the latter may be applied as well to prevent the powder from adhering to the walls. Gas flow through the cell may transport the ignition product powder to recirculate the fuel. The charging may be by electrodes such as those of an electrostatic precipitator of the disclosure. In the case of transparent components such as the baffle and windows, the electrodes may comprise thin grid wires or a transparent conductor such as a transparent conductive oxide (TCO) such as indium tin oxide (ITO) fluorine doped tin oxide (FTO), and doped zinc oxide and others known to those skilled in the art.

The SF-CIHT generator may comprise sapphire elements such as plates, tiles, or panes for at least one of the transparent or reflective cell components such as the baffle, window, and cell walls. Each transparent sapphire element may have a backing mirror. The mirror may be separated with a vacuum gap to reduce heat transfer. The component may further comprise additional radiation shields, insulation, and cooling systems circumferentially from at least one of the sapphire element and mirror. The sapphire may be operated at a sufficiently elevated temperature to prevent adhesion of the ignition product. The sapphire may be operated at a temperature at which the ignition product vaporizes off. $H_2O$ may be added by means such as a spray to at least one of cool the baffle and wet the ignition product to enhance the ease of its recirculation. The wetted ignition product may bead off of components such as the walls and optical components such as the window and baffle due to steam formation upon contact. The water spray may also cool at least one cell component such as at least one of the baffle, wall, and window. Other materials may be used as the elements such as LiF, an alkaline earth halide such as fluorides such as $MgF_2$, $CaF_2$, and $BaF_2$, and $CdF_2$, quartz, fused quartz, UV glass, borosilicate, and Infrasil (ThorLabs). The element may be operated at a temperature that minimizes the adhesion wherein the adhesion energy may be minimized at the elevated temperature. The element material may have a low energy of surface absorption of the ignition products and have a high transmittance for the optical power over the wavelengths that are favorable for PV conversion. In an embodiment, the ignition product comprises at least one component such as the conductive matrix that is substantially non-adherent to the cell walls and windows. In an embodiment, the non-adherent matrix comprises silver. The walls may comprise a material that resists adhesion of the ignition products such as a metal such as silver or hermetically sealed silver such as silver with a mirror sealant such as sapphire or silicon dioxide. In an exemplary embodiment, the film is about 100 nm thick. The film may be less than about 40 um thick. In another embodiment, the high reflectivity of Ag may be extended below 400 nm such as to 200 nm by applying a thin coat of Ag on Al wherein the shorter wavelengths in the UV region are transmitted through Ag and are reflected by the underlying Al. In an embodiment, the walls comprise a material capable of high reflectivity at UV wavelengths such as $MgF_2$-coated Al. The wall may comprise thin fluoride films such as $MgF_2$ or LiF films or SiC films on aluminum. The walls may be operated below a temperature at which the ignition product such as Ag or Ag—Cu alloy may adhere such as below 200° C. The walls may be cooled by allowing water to undergo a phase change from liquid to steam while maintaining the steam below the desired maximum temperature such as 200° C. In other embodiments, the walls may be run at higher temperature wherein gas jets, vibration, or other methods of the disclosure for removing adhering ignition product may be applied. Other exemplary suitable reflective coatings with high reflectivity may be used such as at least one of the group of noble metals, platinum, ruthenium, palladium, iridium, rhodium, and gold, and silver.

In an embodiment, adhering ignition product may be removed by at least one of gas jets or knives, by vibration, by heating, and by bombardment or etching. The bombardment or etching may be with ions. The ions may comprise noble gas ions such as those formed from the cell gas. The ions may be formed by a discharge such as a coronal discharge. The ions may be accelerated by an applied electric field. The ion energy may be controlled to remove the adhering ignition product while avoiding significantly etching the cell component such as the cell wall or optical element such as a window such as windows 20 and 20*c*.

In an embodiment, the ignition products may be removed by rinsing with a liquid such as water. The liquid may be applied by liquid jets. The rinse may be collected in a trough. The excess liquid such as water may be removed by at least one of a wet scrubber such as those known in the art such as those configured vertically (countercurrent) or horizontally (cross flow), and a screen or membrane with suction such as those of the disclosure. The wet scrubber may comprise at least one of a spray tower, a Venturi scrubber, a condensation scrubber, and a mist eliminator such as a cyclonic separator. The wet scrubber may comprise at least one of a saturator, a Venturi scrubber, an entrainment separator, a recirculation pump, a recirculated liquid such as water, and fans and ductwork.

The optical distribution system and photovoltaic converter 26*a* (FIG. 2C) may be modular and scalable. The optical power may be increased by increasing the ignition frequency of intermittent ignitions, optimizing the parameters of the igniting waveform, selecting the composition of the fuel that gives more power, increasing the fuel flow rate, increasing the rotation rate and radius of the rotating electrodes such as roller or gear electrodes 8, increasing the amount of fuel coated on the rotating electrodes, and increasing the width of the rotating electrodes such as roller or gear electrodes 8. The photovoltaic converter may comprise concentrator cells such as triple junction cells, c-Si cells, and GaAs cells. In an embodiment, each of the photovoltaic cells comprises at least one of an extreme ultraviolet, an ultraviolet, a visible, a near infrared, and an infrared photovoltaic cell. The optical distribution system and photovoltaic converter may be scaleable based on the desired output power wherein the optical power is controlled to produce the desired level to achieve the desired electrical output. The scale may be increased by increasing the light output area of cell 26 and window 20, the size of the optical distribution system and photovoltaic converter 26*a*, the number of PV cells or panels 15, the efficiency of the PV cells 15, the intensity capacity of the PV cells 15, the number and width of the semitransparent mirrors 23, and the height of the columns of mirrors and PV panels 26*a*. The components may be modular. For example, additional electrode sections may be added to increase the electrode width, and the number and height of the columns of the optical distribution and PV converter system may be increased using corresponding add-on modules to increase the power capacity.

In an embodiment, the generator may comprise a safety system such as an interlock switch to prevent the application of electrical power to the roller electrodes until the rollers are rotating at a speed to impart sufficient velocity to the igniting fuel to prevent the pressure and plasma from the ignition from causing substantial damage to the rollers.

In an embodiment, the rotating electrodes comprising a rotary pump maintain the slurry in the trough 5. In an embodiment, the pressure differential between the top of the parabolic mirror 14 and the slurry maintained by at least one of the louver fan 20*a* of FIG. 2G1 and the duct blower of FIGS. 2G1, 2G1*a*, 2G1*b*, and 2G1*c* is such that the cell can be operated at any orientation relative to gravity with the slurry maintained in the trough 5 while there is a flow of solid fuel into the ignition region and a return flow to the trough. For example, a pressure gradient of one atmosphere can compensate for a fuel weight per unit area equivalent to $10^5$ N/m$^2$.

The generator may be under positive pressure such that the streams to re-circulate the fuel flow are under positive pressure relative to the trough 5 wherein a pressure drop occurs by removal of the fuel as it is transported to the ignition region. In another embodiment, the generator may be attached to a rotatable support that is attached to a structure such as an aircraft or satellite, the rotate-able support having a plurality of degrees of freedom for rotation such that the generator may be turned relative to rotation of the structure to maintain an upright orientation of the generator relative to Earth's gravity. An exemplary rotate-able support fasten to a structure is that of a gyroscope.

In an embodiment, the SF-CIHT generator may comprise a vacuum chamber arranged circumferential to the SF-CIHT cell 1 for noise reduction. In an alternative embodiment, the cell comprises active noise suppression such as a noise cancellation system such as those known by one skilled in the art. In an embodiment, at least one of the SF-CIHT generator and any time varying electronic components such as the source of electrical power to ignite the fuel may comprise a coated conductive chamber such as a nickel coated chamber arranged circumferential for electromagnetic interference reduction.

In another embodiment, the plasma is confined by at least one of magnetic or electric field confinement to minimize the contact of the plasma with the photon-to-electric converter. The magnetic confinement may comprise a magnetic bottle. The magnetic confinement may be provided by Helmholtz coils 6*d*. In a further embodiment, the converter converts kinetic energy from charged or neutral species in the plasma such as energetic electrons, ions, and hydrogen atoms into electricity. This converter may be in contact with the plasma to receive the energetic species.

In an embodiment, the SF-CIHT generator comprises a hydrogen catalysis cell that produces atoms having binding energies given by Eq. (1) and at least one of a high population of electronically excited state atoms and ions such as those of the materials of the fuel. The power is emitted as photons with spontaneous emission or stimulated emission. The light is converted to electricity using a photon-to-electric converter of the present disclosure such as a photoelectric or photovoltaic cell. In an embodiment, the power cell further comprises a hydrogen laser of the present disclosure.

In an embodiment, the photons perform at least one action of propagating to and becoming incident on the photovoltaic cell and exiting a semitransparent mirror of a laser cavity and irradiating the photovoltaic cell. The incoherent power and laser power may be converted to electricity using photovoltaic cells as described in the following references of photovoltaic cells to convert laser power to electric power which are incorporated by reference in their entirety: L. C. Olsen, D. A. Huber, G. Dunham, F. W. Addis, "High efficiency monochromatic GaAs solar cells", in *Conf. Rec. 22nd IEEE Photovoltaic Specialists Conf.*, Las Vegas, NV, Vol. I, October (1991), pp. 419-424; R. A. Lowe, G. A. Landis, P. Jenkins, "Response of photovoltaic cells to pulsed laser illumination", IEEE Transactions on Electron Devices, Vol. 42, No. 4, (1995), pp. 744-751; R. K. Jain, G. A. Landis, "Transient response of gallium arsenide and silicon solar cells under laser pulse", Solid-State Electronics, Vol. 4, No. 11, (1998), pp. 1981-1983; P. A. Iles, "Non-solar photovoltaic cells", in *Conf. Rec. 21st IEEE Photovoltaic Specialists Conf.*, Kissimmee, FL, Vol. I, May, (1990), pp. 420-423.

In an embodiment of the at least one of optical and laser power converter, using beam forming optics, the at least one of a light beam and laser beam is reduced and spread over a larger area as described in L. C. Olsen, D. A. Huber, G. Dunham, F. W. Addis, "High efficiency monochromatic GaAs solar cells", in *Conf. Rec. 22nd IEEE Photovoltaic*

*Specialists Conf.*, Las Vegas, NV, Vol. I, October (1991), pp. 419-424 which is herein incorporated by reference in its entirety. The beam forming optics may be a lens or a diffuser. The cell 1 may further comprise mirrors or lenses to direct the light onto the photovoltaic. Mirrors may also be present at the cell wall to increase the path length of light such as hydrogen Lyman series emission to maintain excited states that may be further excited by collisions or photons.

In another embodiment, the spontaneous or stimulated emission from the water-based fuel plasma is converted to electrical power using a photovoltaic. Conversion of at least one of spontaneous and stimulated emission to electricity may be achieved at significant power densities and efficiencies using existing photovoltaic (PV) cells with a band gap that is matched to the wavelengths. Photocells of the power converter of the present disclosure that respond to ultraviolet and extreme ultraviolet light comprise radiation hardened conventional cells. Due to the higher energy of the photons potentially higher efficiency is achievable compared to those that convert lower energy photons. The hardening may be achieved by a protective coating such as an atomic layer of platinum or other noble metal. In an embodiment, the photovoltaic has a high band-gap such as a photovoltaic comprised of gallium nitride.

In an embodiment that uses a photovoltaic for power conversion, high-energy light may be converted to lower-energy light by a phosphor. In an embodiment, the phosphor is a gas that efficiently converts short wavelength light of the cell to long wavelength light to which the photovoltaic is more responsive. Percentage phosphor gas may be in any desired range such as in at least one range of about 0.1% to 99.9%, 0.1 to 50%, 1% to 25%, and 1% to 5%. The phosphor gas may be an inert gas such as a noble gas or a gas of an element or compound that is made gaseous by the detonation such as a metal such as an alkali, alkaline earth, or transition metal. In an embodiment, argon comprises an argon candle as used in explosives to emit bright light in the visible range suitable for photovoltaic conversion to electricity. In an embodiment, the phosphor is coated on transparent walls of the cell 1 so that the photons emitted by the excited phosphor more closely match the peak wavelength efficiency of the photovoltaic that may surround the phosphor-coated walls. In an embodiment, species that form excimers are added to the plasma to absorb the power from the formation of hydrinos and contribute to the formation of least one of a large population of excited states and an inverted population. In an embodiment, the solid fuel or an added gas may comprise a halogen. At least one noble gas such as helium, neon, and argon may be added such that excimers form. The power may be extracted by the excimer spontaneous or laser emission. The optical power is incident the photovoltaic converter 6 and is converted to electricity.

In an embodiment, the plasma emits a significant portion of the optical power and energy as EUV and UV light. The pressure may be reduced by maintaining a vacuum in the reaction chamber, cell 1, to maintain the plasma at condition of being less optically thick to decease at least one of the rate of down conversion of high energy photons to longer wavelength photons and the extent of conversion of the EUV and UV light to lower energy, longer wavelength photons. The power spectrum wavelength range may also be changed by adding other cover gases such as a noble gas such as argon and additives to the solid fuel such as at least one of a metal such as a transition metal and at least one inorganic compound such as a metal compound such as at least one of an alkali, alkaline earth, and a transition metal halide, oxide, and hydroxide.

In this exemplary embodiment, the SF-CIHT cell power generation system includes a photovoltaic power converter configured to capture plasma photons generated by the fuel ignition reaction and convert them into useable energy. In some embodiments, high conversion efficiency may be desired. The reactor may expel plasma in multiple directions, e.g., at least two directions, and the radius of the reaction may be on the scale of approximately several millimeter to several meters, for example, from about 1 mm to about 25 cm in radius. Additionally, the spectrum of plasma generated by the ignition of fuel may resemble the spectrum of plasma generated by the sun and/or may include additional short wavelength radiation. FIG. 3 shows an exemplary the absolute spectrum in the 120 nm to 450 nm region of the ignition of a 80 mg shot of silver comprising absorbed $H_2$ and $H_2O$ from gas treatment of silver melt before dripping into a water reservoir showing an average optical power of 172 kW, essentially all in the ultraviolet spectral region. The ignition was achieved with a low voltage, high current using a Taylor-Winfield model ND-24-75 spot welder. The voltage drop across the shot was less than 1 V and the current was about 25 kA. The high intensity UV emission had a duration of about 1 ms. The control spectrum was flat in the UV region. In an embodiment, the plasma is essentially 100% ionized that may be confirmed by measuring the Stark broadening of the H Balmer $\alpha$ line. The radiation of the solid fuel such as at least one of line and blackbody emission may have an intensity in at least one range of about 2 to 200,000 Suns, 10 to 100,000 Suns, 100 to 75,000 Suns.

From Wien's displacement law [A. Beiser, *Concepts of Modern Physics*, Fourth Edition, McGraw-Hill Book Company, New York, (1978), pp. 329-340], the wavelength $\lambda_{max}$ having the greatest energy density of a blackbody at T=6000K is $$\lambda_{max} = \frac{hc}{4.965kT} = 483 \text{ nm} \tag{210}$$

The Stefan-Boltzmann law [A. Beiser, *Concepts of Modern Physics*, Fourth Edition, McGraw-Hill Book Company, New York, (1978), pp. 329-340] equates the power radiated by an object per unit area, R, to the emissivity, e, times the Stefan-Boltzmann constant, $\sigma$, times the fourth power of the temperature, $T^4$.

$$R = e\sigma T^4 \tag{211}$$

The emissivity e=1 for an optically thick plasma comprising a blackbody, $\sigma=5.67\times10^{-8}$ $Wm^{-2}K^{-4}$, and measured blackbody temperature is 6000K. Thus, the power radiated per unit area by the ignited solid fuel is $$R = (1)(\sigma = 5.67\times10^{-8}\ Wm^{-2}K^{-4})(6000\text{ K})^4 = 7.34\times10^7\ Wm^{-2} \tag{212}$$

In the case that the plasma is steady state, the radius $r_{ps}$ of the plasma sphere of 6000K can be calculated from R and the typical power of the blast $P_{blast}$ given by the quotient of the energy $E_{blast}$ of the blast of 1000 J and the time of the blast $\tau$ of $20\times10^{-6}$ s $$r_{ps} = \sqrt{\frac{P_{blast}}{R4\pi}} = \sqrt{\frac{\frac{1000\ \text{J}}{20\times10^{-6}\ \text{s}}}{(7.34\times10^{7}\ Wm^{-2})4\pi}} = 0.23\ \text{m} = 23\ \text{cm} \tag{213}$$

In the case of the expanding plasma, the average radius is given by ½ times the expansion velocity such as sound speed, 343 m/s times the duration of the blast such as 25 μs to 5 ms.

An exemplary average radius of the expanding plasma sphere is 23 cm at an average blackbody temperature of 6000K. From Beiser [A. Beiser, *Concepts of Modern Physics*, Fourth Edition, McGraw-Hill Book Company, New York, (1978), pp. 329-340], the total number of photons N in the volume with a radius of 23 cm is $$N = 8\pi\left(\frac{4}{3}\pi r_{ps}^{3}\right)\left(\frac{kT}{hc}\right)^{3}(2.405) = 2.23\times10^{17}\ \text{photons} \tag{214}$$

From Beiser [1], the average energy of the photons $\bar{\varepsilon}$ is $$\bar{\varepsilon} = \frac{\frac{4\sigma T^{4}}{cN}}{\frac{4}{3}\pi r_{ps}^{3}} = \frac{\sigma c^{2}h^{3}T}{2.405(2\pi k^{3})} = 2.24\times10^{-19}\ \text{J} = 1.40\ \text{eV} \tag{215}$$

Additional plasma temperatures, plasma emissivity, power radiated per unit area, plasma radii, total number of photons, and average energy of the photons are within the scope of the present disclosure. In an embodiment, the plasma temperature is in at least one range of about 500 K to 100,000K, 1000 K to 10,000 K, and 5000 K to 10,000 K. In an embodiment, the plasma emissivity is in at least one range of about 0.01 to 1, 0.1 to 1, and 0.5 to 1. In an embodiment, the power radiated per unit area according to Eq. (212) is in at least one range of about $10^3$ $Wm^{-2}$ to $10^{10}$ $Wm^{-2}$, $10^4$ $Wm^{-2}$ to $10^9$ $Wm^{-2}$, and $10^5$ $Wm^{-2}$ to $10^8$ $Wm^{-2}$. In an embodiment, the radius and total number of photons are given by Eqs. (213) and (214), respectively, according to the power radiated per unit area R and the power of the blast $P_{blast}$ given by the quotient of the energy $E_{blast}$ of the blast and the time of the blast τ. In an embodiment, the energy is in at least one range of about 10 J to 1 GJ, 100 J to 100 MJ, 200 J to 10 MJ, 300 J to 1 MJ, 400 J to 100 kJ, 500 J to 10 kJ, and 1 kJ to 5 kJ. In an embodiment, the time is in at least one range of about 100 ns to 100 s, 1 μs to 10 s, 10 μs to 1 s, 100 μs to 100 ms, 100 μs to 10 ms, and 100 μs to 1 ms. In an embodiment, the power is in at least one range of about 100 W to 100 GW, 1 kW to 10 GW, 10 kW to 1 GW, 10 kW to 100 MW, and 100 kW to 100 MW. In an embodiment, the radius is in at least one range of about 100 nm to 10 m, 1 mm to 1 m, 10 mm to 100 cm, and 10 cm to 50 cm. In an embodiment, the total number of photons according to Eq. (214) is in at least one range of about $10^7$ to $10^{25}$, $10^{10}$ to $10^{22}$, $10^{13}$ to $10^{21}$, and $10^{14}$ to $10^{18}$. In an embodiment, the average energy of the photons according to Eq. (215) is in at least one range of about 0.1 eV to 100 eV, 0.5 eV to 10 eV, and 0.5 eV and 3 eV.

e. UV Photovoltaic Light to Electricity Converter System, Photoelectron Light to Electricity Converter System, Railgun Injector, and Gravity and Plasma Railgun Recovery System The output power of the SF-CIHT cell may comprise thermal and photovoltaic-convertible light power. In an embodiment, the light to electricity converter may comprise one that exploits at least one of the photovoltaic effect, the thermionic effect, and the photoelectron effect. The power converter may be a direct power converter that converts the kinetic energy of energetic electrons into electricity. In an embodiment, the power of the SF-CIHT cell may be at least partially in the form of thermal energy or may be at least partially converted into thermal energy. The electricity power converter may comprise a thermionic power converter. An exemplary thermionic cathode may comprise scandium-doped tungsten. The cell may exploit the photon-enhanced thermionic emission (PETE) wherein the photo-effect enhances electron emission by lifting the electron energy in a semiconductor emitter across the bandgap into the conduction band from which the electrons are thermally emitted. In an embodiment, the SF-CIHT cell may comprise an absorber of light such as at least one of extreme ultraviolet (EUV), ultraviolet (UV), visible, and near infrared light. The absorber may be outside if the cell. For example, it may be outside of the window 20. The absorber may become elevated in temperature as a result of the absorption. The absorber temperature may be in the range of about 500° C. to 4000° C. The heat may be input to a thermo-photovoltaic or thermionic cell. Thermoelectric and heat engines such as Stirling, Rankine, Brayton, and other heat engines known in the art are within the scope of the disclosure.

At least one first light to electricity converter such as one that exploits at least one of the photovoltaic effect, the thermionic effect, and the photoelectron effect of a plurality of converters may be selective for a first portion of the electromagnetic spectrum and transparent to at least a second portion of the electromagnetic spectrum. The first portion may be converted to electricity in the corresponding first converter, and the second portion for which the first converter is non-selective may propagate to another, second converter that is selective for at least a portion of the propagated second portion of electromagnetic spectrum.

In an embodiment, the plasma emits a significant portion of the optical power and energy as EUV and UV light. The pressure may be reduced by maintaining a vacuum in the reaction chamber, cell 1, to maintain the plasma at condition of being less optically thick to decease the attenuation of the short wavelength light. In an embodiment, the light to electricity converter comprises the photovoltaic converter of the disclosure comprising photovoltaic (PV) cells that are responsive to a substantial wavelength region of the light emitted from the cell such as that corresponding to at least 10% of the optical power output. In an embodiment, the fuel may comprise silver shot having at least one of trapped hydrogen and trapped $H_2O$. The light emission may comprise predominantly ultraviolet light such as light in the wavelength region of about 120 nm to 300 nm. The PV cell may be response to at least a portion of the wavelength region of about 120 nm to 300 nm. The PV cell may comprise a group III nitride such as at least one of InGaN, GaN, and AlGaN. In an embodiment, the PV cell may comprise a plurality of junctions. The junctions may be layered in series. In another embodiment, the junctions are independent or electrically parallel. The independent junctions may be mechanically stacked or wafer bonded. An exemplary multi junction PV cell comprises at least two junctions comprising n-p doped semiconductor such as a plurality from the group of InGaN, GaN, and AlGaN. The n dopant of GaN may comprise oxygen, and the p dopant may comprise Mg. An exemplary triple junction cell may comprise InGaN//GaN//AlGaN wherein // may refer to an isolating transparent wafer bond layer or mechanical stacking. The PV may be run at high light intensity equivalent to that of concentrator photovoltaic (CPV). The substrate may be at least one of sapphire, Si, SiC, and GaN wherein the latter two provide the beast lattice matching for CPV applications. Layers may be deposited using metalorganic vapor phase epitaxy (MOVPE) methods known in the art. The cells may be cooled by cold plates such as those used in CPV or diode lasers such as commercial GaN diode lasers. The grid contact may be mounted on the front and back surfaces of the cell as in the case of CPV cells. In an embodiment, the PV converter may have a protective window that is substantially transparent to the light to which it is responsive. The window may be at least 10% transparent to the responsive light. The window may be transparent to UV light. The window may comprise a coating such as a UV transparent coating on the PV cells. The coating may comprise may comprise the material of UV windows of the disclosure such as a sapphire or $MgF_2$ window. Other suitable windows comprise LiF and $CaF_2$. The coating may be applied by deposition such as vapor deposition.

The SF-CIHT cell power converter may comprise a photoelectron (PE) converter. The photoelectron effect comprises the absorption of a photon by a material such as a metal having a work function Φ with the ejection of an electron when the photon energy given by Planck's equation exceeds the work function. For a photon of energy hv, the total energy of the excited electron is hv, with the excess over the work function Φ required to escape from the metal appearing as kinetic energy $$\frac{1}{2}m_e v^2$$

wherein h is Planck's constant, v is the photon frequency, $m_e$ is the electron mass, and v is the electron velocity. Conservation of energy requires that the kinetic energy is the difference between the energy of the absorbed photon and the work function of the metal, which is the binding energy. The relationship is $$\frac{1}{2}m_e v^2 = hv - \Phi \tag{216}$$

The current due to the emitted electrons is proportional to the intensity of the radiation. A light to electricity converter of the present disclosure such as an ultraviolet light to electricity converter exploits the photoelectron effect to convert the photon energy into electrical energy. Heat may also assist in the ejection of electrons that may contribute to the current of the device. The light to electricity converter may comprise a photoelectric power converter comprising at least one cell shown in FIG. **2G1*e*4, each capable of receiving incident light such as ultraviolet light 205 comprising a transparent casing 201, a photocathode or electron emitter 204, an anode or electron collector 202, a separating space such as an evacuated inter-electrode space 203, and external electrical connections 207 between the cathode and anode through a load 206. When exposed to at least one of light and heat, the cathode 204 emits electrons that are collected by the anode 202 that is separated from the cathode by a gap or space 203. In an embodiment, the photocathode 204 has a higher work function than the anode 202 wherein the former serves and an electron emitter and the latter serves as an electron collector when the cell is exposed to light such as ultraviolet light. The difference in work functions between the different materials of the two electrodes serves to accelerate electrons from the higher work function photocathode to the lower work function anode to provide a voltage to perform useful work in an external circuit. The work function of the anode may be low to enhance the cell power output to the load. The photoelectron cell further comprises an electrical connection 207 for conducting electrons to the photocathode and an electrical connection for removing electrons from the anode. The electrical connections may comprise a circuit by attaching across a load 206 through which the current flows. The cell may be sealed. The gap 203** may be under vacuum.

Figure 4:
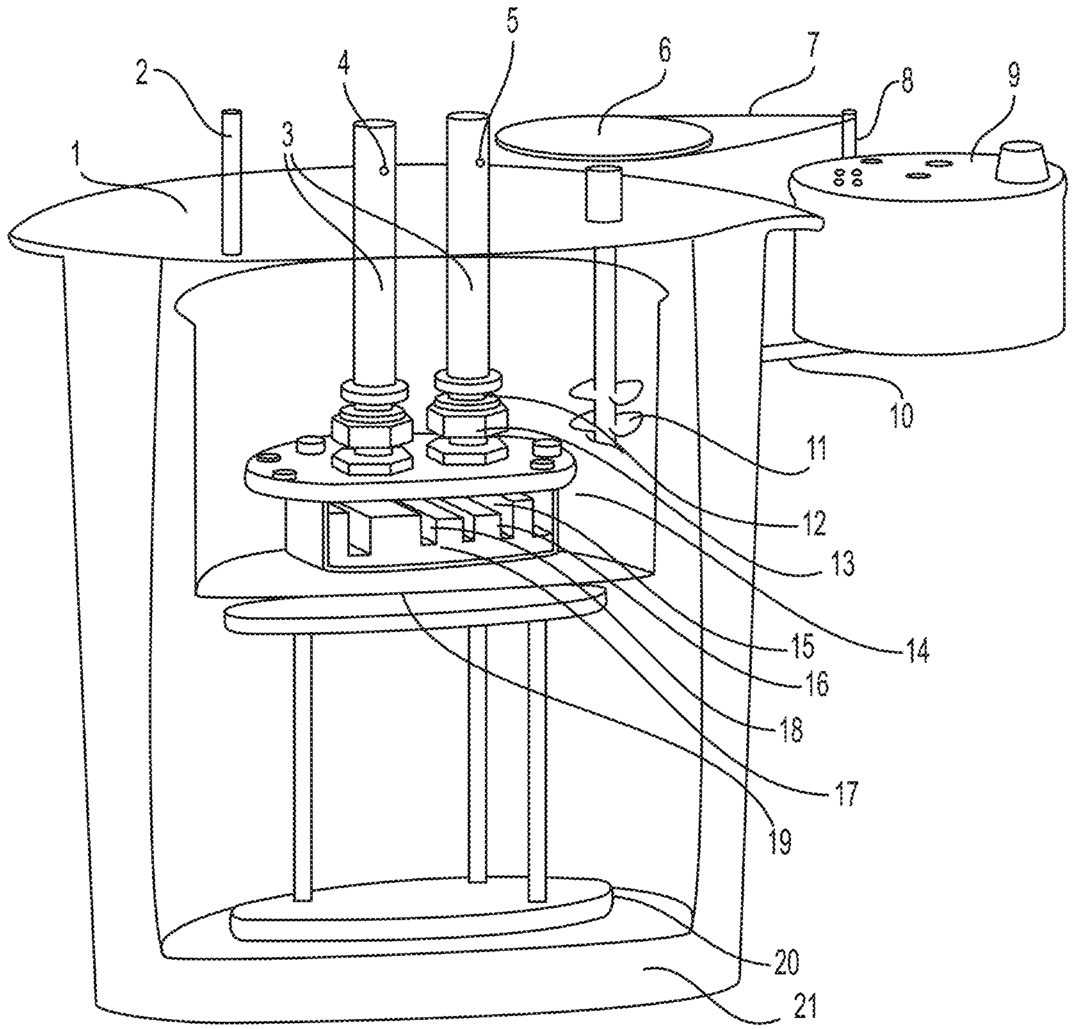

In embodiments, photocathodes can be divided into two groups transmission or semitransparent shown in FIG. **2G1*e*4, and reflective or opaque shown in FIGS. 2G1*e*5 and 2G1*e*6. Referring to FIG. 2G1*e*4, a semitransparent photoelectronic cell embodiment typically comprises a coating upon a transparent window 201 such as sapphire, LiF, $MgF_2$, and $CaF_2$, other alkaline earth halides such as fluorides such as $BaF_2$, $CdF_2$, quartz, fused quartz, UV glass, borosilicate, and Infrasil (ThorLabs) where the light strikes one surface of the photocathode 204 and electrons exit from the opposite surface of 204. In a "semitransparent" mode embodiment, the cell comprises a photocathode 204, an anode 202, and a separating gap between the electrodes 203, and radiation 205 enters the cell through a window 201 onto which the photocathode 204 is deposited on the interior of the cell. Electrons are emitted from the inner face of the photocathode 204 such as the gap or vacuum interface 203**.

Figure 5:
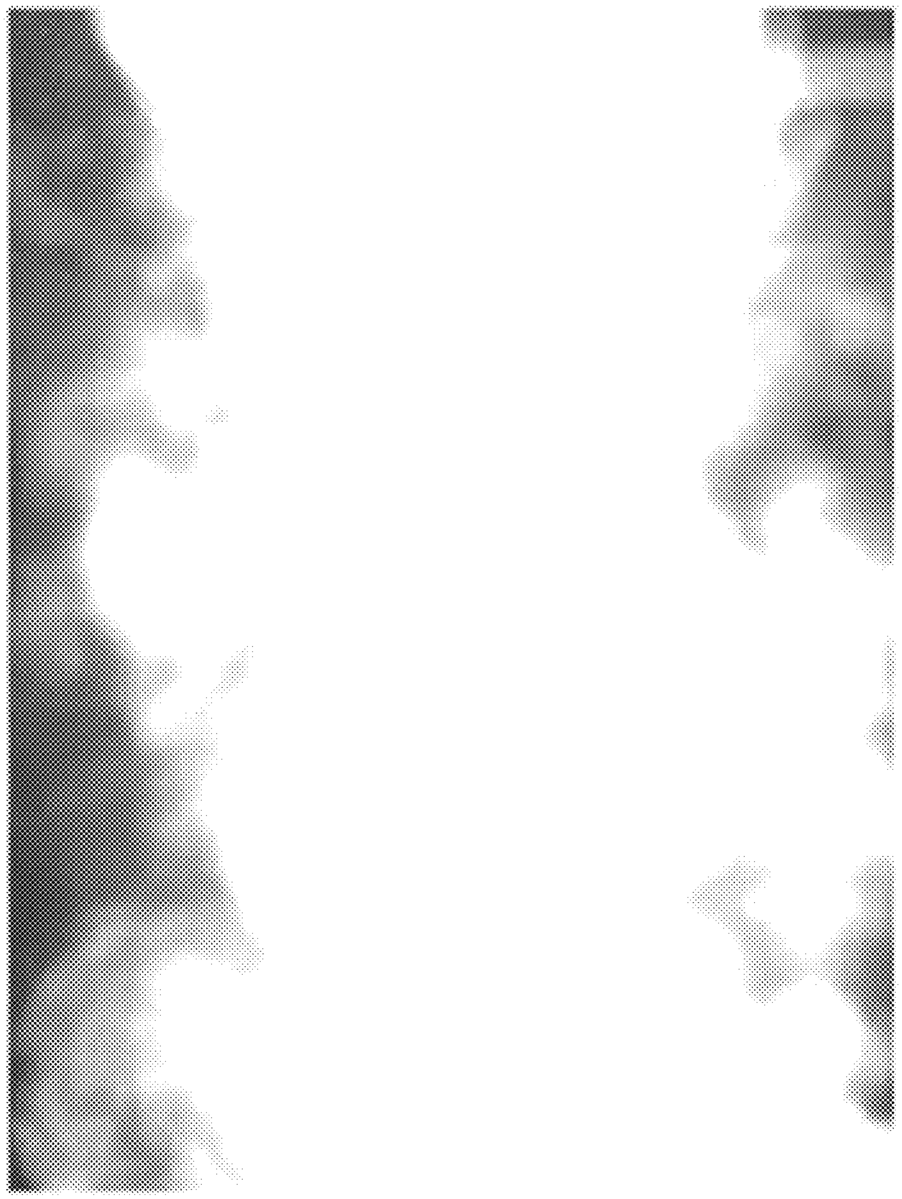
Figure 6:
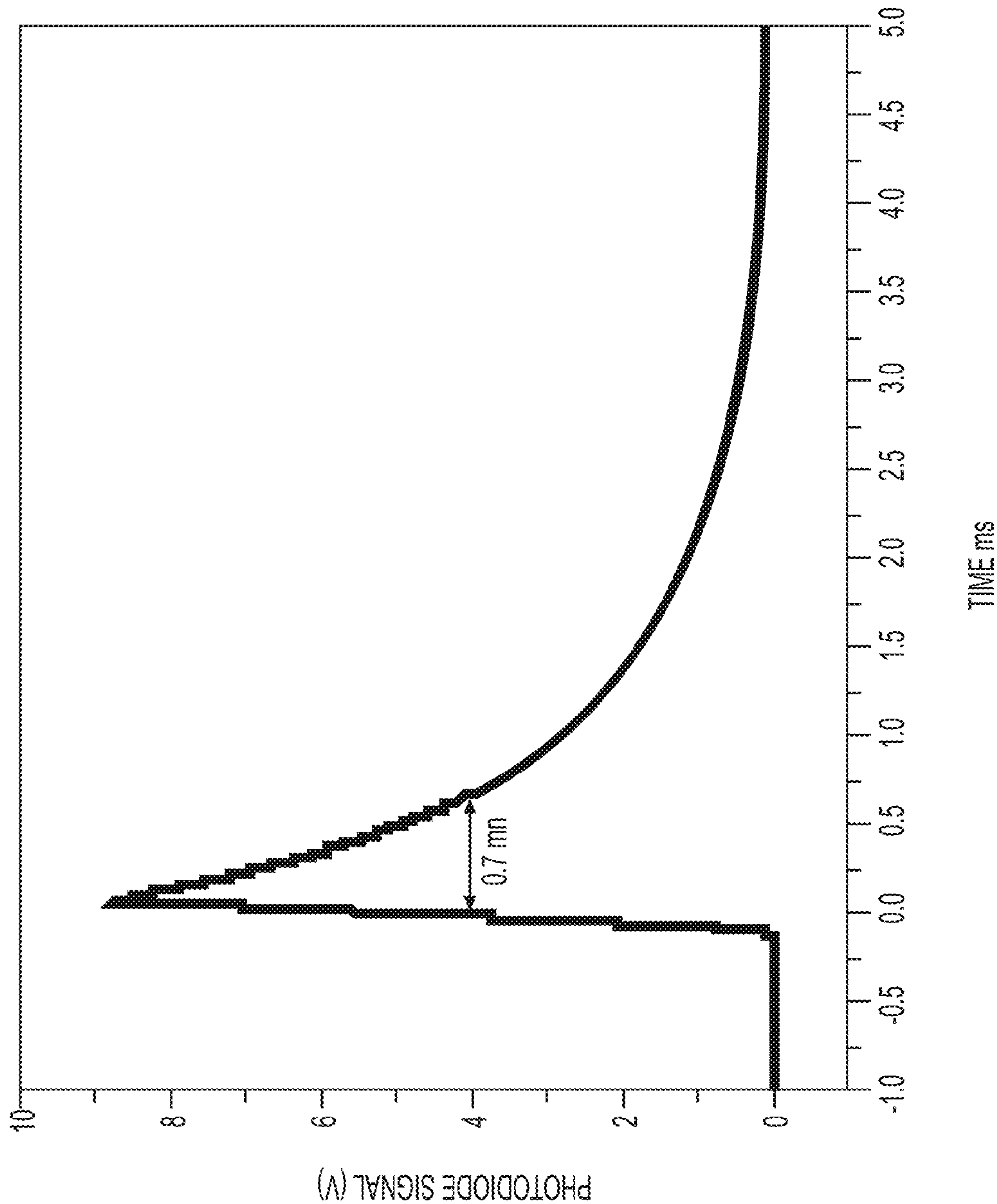

An opaque or reflective photoelectronic cell embodiment shown in FIGS. **2G1*e*5 and 2G1*e*6 typically comprises a photocathode material formed on an opaque metal electrode base, where the light enters and the electrons exit from the same side. A variation is the double reflection type, where the metal base is mirror-like, causing light that passed through the photocathode without causing emission to be bounced back for a second pass at absorption and photoemission. In an "opaque" mode embodiment, the cell shown in FIG. 2G1*e*5 comprises a transparent casing 201, a photocathode 204, a transparent anode 208, a separating space such as an evacuated inter-electrode space 203, and external electrical connections 207 between the cathode and anode through a load 206 wherein radiation such as UV radiation 205 enters the cell and is directly incident on the photocathode 204. Radiation enters the cathode 204 at the gap 203 such as vacuum gap interface, and electrons are emitted from the same interface. Referring to FIG. 2G1*e*6, the light 205 may enter the cell through a transparent window 201 having the anode such as a grid anode 209 on the interior side of the window 201. The opaque mode may be considered to comprise a directly illuminated cathode wherein the incident radiation first traverses the window 201, anode 208 or 209, and gap 203**.

In an embodiment, the cell of the SF-CIHT generator may be maintained under vacuum. The photoelectric (PE) converter may comprise a photocathode, a grid anode, and a vacuum space between the electrodes wherein the vacuum is in continuity with the vacuum of the cell. The PE converter may be absent a window in an embodiment.

The electrical connection grid of an electrode may comprise that of a photovoltaic cell such as a grid of fine wires wherein light may pass between the grid wires. Such grids are known to those skilled in the art. A plurality of photoelectron effect cells may be connected in at least one of series and parallel to achieve a desired voltage and current. The collections may achieve at least one of higher current and higher voltage. For example, the cells may be connected in series to increase the voltage, and the cells may be connected in parallel to increase the cell current. The grid and interconnections may be connected to at least one bus bar 26*b* to carry the higher power to a load such as to the power conditioning equipment 3 and parasitic loads and power output 6 of the SF-CIHT cell (FIG. 2*c*1).

The emission of current as a free electron flow from the photocathode to the anode gives rise to space charge in the gap. The opposing negative voltage $V_{SC}$ due to space charge is given by the Child Langmuir equation:

$$V_{SC} = -\left(\frac{81J^2 m_e}{32\varepsilon_0^2 e}\right)^{1/3} d^{4/3} \tag{217}$$

where J is the current density, $m_e$ is the mass of the electron, $\varepsilon_o$ is the permittivity, e is the electron charge, and d is the electrode separation distance corresponding to the gap between the electrodes. In an embodiment, the voltage of the photoelectric cell $V_{PE}$ is given by the difference in the work functions of the photocathode $\Phi_C$ and anode $\Phi_A$, corrected by the opposing negative space charge voltage $V_{SC}$ $$V_{PE} = \Phi_C - \Phi_A + V_{SC} \tag{218}$$

The photoelectron cell power density $P_{PE}$ may be given by the product of the photoelectric cell voltage $V_{PE}$ and the current density J:

$$P_{PE} = V_{PE} J \tag{219}$$

Using Eqs. (217-219) with selected values of the current density J and the electrode separation d, the opposing space charge voltage $V_{SC}$, the photoelectric cell voltage $V_{PE}$, and the power density $P_{PE}$ are given in TABLE 9.

TABLE 9

Parameters of the photoelectric cell with photocathode and anode work functions of the of $\Phi_C$ = 5 V and $\Phi_A$ = 0.75 V, respectively.

| Current Density J (kA/m$^2$) | Electrode Separation d (um) | Space Charge Voltage $V_{SC}$ (−V) | Photoelectric Cell Voltage $V_{PE}$ (V) | Power Density $P_{PE}$ (kW/m$^2$) |
|---|---|---|---|---|
| 10 | 3 | 0.114 | 4.14 | 41.4 |
| 50 | 3 | 0.334 | 3.92 | 196 |
| 100 | 3 | 0.530 | 3.72 | 372 |
| 150 | 3 | 0.694 | 3.56 | 533 |
| 200 | 3 | 0.841 | 3.41 | 682 |
| 250 | 3 | 0.976 | 3.27 | 819 |
| 10 | 5 | 0.226 | 4.02 | 40.2 |
| 50 | 5 | 0.659 | 3.59 | 180 |
| 100 | 5 | 1.047 | 3.20 | 320 |
| 150 | 5 | 1.372 | 2.88 | 432 |

TABLE 9-continued

Parameters of the photoelectric cell with photocathode and anode work functions of the of $\Phi_C$ = 5 V and $\Phi_A$ = 0.75 V, respectively.

| Current Density J (kA/m$^2$) | Electrode Separation d (um) | Space Charge Voltage $V_{SC}$ (−V) | Photoelectric Cell Voltage $V_{PE}$ (V) | Power Density $P_{PE}$ (kW/m$^2$) |
|---|---|---|---|---|
| 200 | 5 | 1.662 | 2.59 | 518 |
| 250 | 5 | 1.93 | 2.32 | 580 |
| 10 | 7 | 0.353 | 3.90 | 39 |
| 50 | 7 | 1.033 | 3.22 | 161 |
| 100 | 7 | 1.64 | 2.61 | 261 |
| 150 | 7 | 2.148 | 2.10 | 315 |

In an embodiment, the gap or electrode separation d is in at least one range of about 0.1 um to 1000 um, 1 um to 100 um, about 1 um to 10 um, and about 1 to 5 um. The gap spacing may be achieved with insulating spacers such as alumina or beryllium oxide. In an embodiment, a photoelectron effect cell further comprises a voltage source to apply an electron collection voltage to ameliorate the space charge and its voltage at given current and power densities. Exemplary applied voltages are the opposite of those given by Eq. (217) within about ±50%. The temperature may be maintained low such as less than 500° C. to avoid thermal distortion effects that may result in shorting across the gap. In an embodiment operated at an elevated temperature, the gap may be greater than 3 to 5 um to avoid near infrared losses. Thermionic as well as photoelectron emission may be exploited at elevated temperature such as in the range of 500° C. to 3500° C.

In an embodiment, individual photoelectronic cells each comprising the two electrodes separated by a gap may be individually sealed. The gap may be maintained at a pressure of less than atmospheric, atmospheric, or above atmospheric. The gap may be maintained under vacuum. In embodiments, the gap pressure may be maintained in at least one range of about 0 Torr to 10,000 Torr, $10^{-9}$ Torr to 760 Torr, $10^{-6}$ Torr to 10 Torr, and $10^{-3}$ Torr to 1 Torr. In an embodiment, individual photoelectronic cells each comprising the two electrodes separated by a gap may be individually unsealed and contained in a vessel capable of maintaining the pressure of the sealed cells. The vessel may be a vessel containing just the photoelectronic cells. In another embodiment, the vessel may comprise the SF-CIHT cell. In an embodiment, the gap may contain a material to reduce the space charge from the electrons emitted from the cathode. Exemplary materials are alkali metals such as cesium vapor. In an embodiment, the space charge may be reduced with an alkali metal vapor such as cesium vapor and oxygen. The material may produce plasma in an ignited mode and not produce plasma in an un-ignited mode. With a small gap such as 1 to 10 um, the cesium may ionize at the cathode other than being ionized by plasma. The ionization may be by at least one of thermal and electrical energy from the cathode.

In an embodiment to eliminate space charge, the cell may comprise a gate electrode in the gap and a longitudinal magnetic field to cause the electrons to avoid being collected at the gate electrode. The gate electrode may be perforated to allow the electrons trapped on the magnetic field lines to pass through it without being collected.

In an ignited mode, the density of cesium atoms may be about $10^{16}$/cm$^3$ (1 Torr), and the plasma density may be about $10^{13}$/cm$^3$ to $10^{14}$/cm$^3$ in the inter-electrode space. The material may be present in a larger enclosure beyond the inter-electrode space and may receive at least one of electrical and thermal energy to form plasma from at least one of the electrodes and contact surfaces other than the electrodes. In an embodiment, an arc drop of less than about 0.5 eV is required to maintain the plasma. In another embodiment, the arc voltage drop is in the range of about 0.01 V to 5 V. Ions may be formed by emission from the cathode surface that may be hot especially in the case of low material pressure and close inter-electrode spacing that minimize electron scattering. The ionization may be due to at least one of thermal and electrical energy from the cathode. In an embodiment known as Knudsen discharge, the pressure between the electrodes is maintained low enough so that the electron mean free path is greater than the inter-electrode gap such that electron transport occurs essentially without scattering. In the limit, no voltage drop due to space charge occurs. In an embodiment, the material such as a gaseous material such as a vaporized alkali metal is selected and maintained to provide a reduced work function for removal of electrons from the cathode (emitter) and a reduced work function for their collection at the anode (collector). In another embodiment, the photocathode may have a surface that is angled relative to the direction of incidence of light such that the radiation pressure may reduce the space charge.

The photocathode comprises a photoelectron effect active material. The photocathode may comprise a material with a work function that matches that of the ionization spectrum of the incident radiation. The photocathode work function may be greater than that of the anode. The magnitude of the photocathode work function may be greater than the sum of the magnitudes of the opposing voltage energy of the space charge and the work function of the collector or anode. Representative energy magnitudes are 0.8 eV and 1 eV, respectively. In an embodiment, the radiation from the SF-CIHT cell comprises short wavelength radiation such as extreme ultraviolet (EUV) and ultraviolet (UV). The cell gas such as helium or the operating pressure such as about vacuum may favor the emission of short wavelength light. In an embodiment, the photocathode is responsive to ultraviolet radiation from the SF-CIHT cell. Since radiation of higher energy than the work function may be lost to kinetic energy and potentially heat, the work function of the photocathode may be matched to be close to the energy of the light such as ultraviolet radiation. For example, the photocathode work function may be greater than 1.8 eV for radiation of shorter wavelength than 690 nm, and the photocathode work function may be greater than 3.5 eV for radiation of shorter wavelength than 350 nm. The photocathode work function may be within at least one range of about 0.1 V to 100 V, 0.5 V to 10 V, 1 V to 6 V, and 1.85 eV to 6 V. The photocathode may be at least one of GaN having a bandgap of about 3.5 eV that is responsive to light in the wavelength region 150-400 nm and its alloys such as $Al_xGa_{1-x}N$, $In_xGa_{1-x}N$, alkali halide such as KI, KBr, and CsI having a bandgap of about 5.4 eV that is responsive to light in the wavelength region less than 200 nm, multi-alkali such as S20 Hamamatsu comprising Na—K—Sb—Cs that is responsive to light in the wavelength region greater than 150 nm, GaAs that is responsive to light in the wavelength region greater than 300 nm, CsTe that is responsive to light in the wavelength region 150-300 nm, diamond having a bandgap of about 5.47 eV that is responsive to light in the wavelength region less than 200 nm, Sb—Cs that is responsive to light in the wavelength region greater than 150 nm, Au that is responsive to light with a peak wavelength 185 nm, Ag—O—Cs that is responsive to light in the wavelength region 300-1200 nm, bi-alkali such as Sb—Rb—Cs, Sb—K—Cs, or Na—K—Sb, and InGaAs. An exemplary opaque photocathode may comprise at least one of GaN, CsI, and SbCs. An exemplary semitransparent photocathode may comprise CsTe. Type III-V material UV photocathodes have suitable large bandgaps such as 3.5 eV for GaN and 6.2 eV for AlN. The energy or wavelength responsive region may be fine tuned by means such as by changing the material composition of the photocathode such as by changing the ratio of GaN to AlN in $Al_xGa_{1-x}N$. Thin films of p-doped material can be activated into negative electron affinity by proper surface treatments with cesium or Mg and oxygen, for example. Additional exemplary photocathodes comprise MgO thin-film on Ag, $MgF_2$, MgO, and $CuI_2$. Exemplary metal photocathodes comprise Cu, Mg, Pb, Y, and Nb. Exemplary coated metal photocathodes comprise Cu—CsBr, Cu—$MgF_2$, Cu—Cs, and Cu—CsI. Exemplary metal alloy photocathodes comprise CsAu and alloys of pure metals such as Al, Mg, and Cu, with small amounts of Li, Ba, and BaO, respectively. Exemplary semiconductor photocathodes comprise CsTe, RbTe, alkali antimonides, $Cs_3Sb$, $K_2CsSb$, $Na_2KSb$, $NaK_2Sb$, $CsK_2Sb$, $Cs_2Te$, superalkalies, positive election affinity (PEA) type; Cs:GaAs, Cs:GaN, Cs:InGaN, Cs:GaAsP, graded doping, tertiary structures, negative electron affinity (NEA) type. Semiconductor photocathodes may be maintained in high vacuum such as less than about $10^{-7}$ Pa. The size of the PE cell may that desired and capable of being fabricated. For example, PE cells of sub-millimeter dimensions to a as large as 20 cm by 20 cm have been fabricated that are hermetically sealed comprising a photocathode, an anode, and a window as a component of the sealing structure.

In an embodiment, the effectiveness of a photocathode is expressed as quantum efficiency defined as the ratio of the emitted electrons and the impinging photons or quanta of light. In an embodiment, the quantum efficiency is optimized by at least one of providing a strong electric field and optimizing the geometry, temperature, and material composition by means such as adding additives such as alkali metals. In an embodiment, the photocathode is selected to optimize the photon absorption parameters, electron transport properties, and surface energy states to achieve maximum photoelectron efficiency. In the latter case, the surface may be treated or activated to negative electron affinity such that conduction electrons reaching the surface have a higher energy than vacuum electrons and consequently optimally form photoelectrons. The surface of diamond, for example, can be treated or activated to negative electron affinity by cesiation, hydrogenation, coating with monolayers of LiF and RbF, and phosphorous doping using $PH_3$ chemical vapor deposition. The surface of GaN photocathodes may be activated with Cs and oxygen. In a semitransparent mode embodiment, the film thickness on the back on the window is selected to optimize the quantum efficiency wherein a wavelength dependent manner, the absorption of incident photons increases with film thickness while the probability of electron transport to the surface deceases. In an exemplary semitransparent embodiment, the photocathode film thickness may be in at least one range of about 0.1 nm to 100 um, 1 nm to 10 um, 10 nm to 5 um, and 100 nm to 1 um. In general, the electrode, cathode or anode, thickness such as the electrode film thickness may be in at least one range of about 0.1 nm to 100 um, 1 nm to 10 um, 10 nm to 5 um, and 100 nm to 1 um.

In an embodiment, the photocathode comprises multiple layers to convert a wider range of photon wavelengths. The multi-layer photocathode may comprise thin layers that are transparent for photons for successive layers along the propagation path. In an exemplary embodiment, the top layer may be selective to the least penetrating light, and the successive layers are arranged to be selective based on the rate of attenuation or the penetration depth in the layered structure. In an exemplary three layer photocathode, the top layer may be selective for the least penetrating wavelengths and have the corresponding highest work function, the middle layer may be selective for the intermediate penetrating wavelengths and have the corresponding intermediate work function, and the bottom or farthest layer along the light propagation path may be selective for the most penetrating wavelengths and have the corresponding lowest work function. Other combinations of penetration depth, relative layer position, and work function are within the scope of the disclosure.

The anode comprises a material capable of collecting electrons. The anode work function may be as low as possible to increase the cell voltage according to Eq. (218). The anode work function may be lower than at least one of about 2 V, 1.5 V, 1 V, 0.9 V, 0.8 V, 0.7 V, 0.6 V, 0.5 V, 0.4 V, and 0.3 V. The anode may comprise at least one of an alkali metal such as cesium, calcium aluminate electride (C12A7:e) having a work function of about 0.76 eV, phosphorus doped diamond nanofilm having a work function of about 0.9 eV, and scandium-doped tungsten.

At least one electrode of the cathode and anode may have at least a portion of its surface structured or non-planar such that a portion of the incident light may reflect to at least one of another photocathode, a portion of the photocathode, and an optical element such as a mirror that is reflective of the light and reflects it onto another portion of the photocathode or at least one other photocathode. In this manner, the photocathodes received multiple bounces (reflections) of the incident light to increase the absorption cross section of the photocathode for producing photoelectrons. In an embodiment, the photocathode comprises a structured substrate to increase the efficiency wherein the photon absorption path in the photocathode is increased while the electron escape path remains the same or less than as for a planar substrate. An exemplary structured surface has zigzags with alternate interior angles of 45°. In another embodiment, the zigzag angles can alternate between 45° and 90°. Other angles are within the scope of the disclosure.

In an embodiment, increased photon absorption within the material while decreasing the distance the photoelectrons have to travel to the surface can be achieved by at least one of changing the angle of incoming radiation and using multiple total internal reflections within the photocathode. Using the latter method, regarding reflection of photoelectrons from the back surface of the photocathode, facilitates the attainment of greater than 50% conversion efficiency for some materials when each photon produces at most a single photoelectron. For example, some GaN photocathodes are grown on a thin buffer layer of AlN, which has large bandgap energy and serves as a reflection layer. The efficiency of the photo-conversion as a function of incoming radiation angle increases with angle relative to normal incidence until reaching the point of total reflection. Moreover, if the photocathode that is operated in a semitransparent mode can be grown on a transparent substrate such that it has a zigzag photo-active layer, the conduction electrons are produced closer to the escape surface than in the case of a flat substrate, and therefore should have higher probability to escape into vacuum. Alternatively, the photocathode is grown on a planar surface to avoid substantial degradation from lattice mismatch. For example, GaN is typically grown on a matching crystal lattice of sapphire or silicon carbide substrates with C-plane at the surface. In another embodiment, similar reflective systems and methods may be applied to the anode. In a semitransparent mode cell, the anode may comprise a double reflection type where the metal base is mirror-like, causing light that passed through the photocathode without causing emission to be bounced back to the photocathode for a second illumination.

The window for the passage of light into the cell may be transparent to the light such as short wavelength light such as ultraviolet light. Exemplary ultraviolet light has energy greater than about 1.8 eV corresponding to a wavelength of about less than 690 nm. The window may comprise at least one of sapphire, LiF, $MgF_2$, and $CaF_2$, other alkaline earth halides such as fluorides such as $BaF_2$, $CdF_2$, quartz, fused quartz, UV glass, borosilicate, and Infrasil (ThorLabs).

In an embodiment, the photoelectric (PE) converter may be mounted behind the baffle of the recirculation system of the disclosure. In an embodiment, the baffle is replaced by the PE converter. The windows of the PE converter may serve the functions of the baffle as a means to impede the upward trajectory of the ignition product flow and provide transparency for the light into the light to electricity converter, the PE converter in this embodiment.

In an embodiment, the expanding plasma is comprised of positively charged particles and electrons. In an embodiment, the electrons have a higher mobility than the positive ions. A space charge effect may develop. In an embodiment, the space charge is eliminated by grounding at least one conductive component of the cell such as the cell wall. In another embodiment, both electrodes are electrically connected to the cell wherein essentially all of the current from the source of electrical power 2 (FIG. 2C1) to the roller electrodes flows through the fuel to cause ignition due to the much lower electrical resistance of the fuel such as that of a fuel shot or pellet. The elimination of the space charge and it corresponding voltage may increase the hydrino reaction rate. In an embodiment, the cell is run under vacuum. The vacuum condition may facilitate the elimination of at least one of space charge and confinement that may decrease the hydrino reaction rate. The vacuum condition may also prevent the attenuation of UV light that may be desired for PE conversion to electricity.

In the case that the cell is operated under evacuated conditions such as vacuum, SF-CIHT cell generator may comprise a vacuum pump to maintain the evacuation at a desired pressure controlled by a pressure gauge and controller. The product gases such as oxygen may be removed by at least one of pumping and a getter such as an oxygen getter that may be at least one of continuously and periodically regenerated. The latter may be achieved by removing the getter and regenerating it by applying hydrogen to reduce the getter to form a product such as water.

The cell may be operated under evacuated conditions. The cell may comprise a vacuum chamber such as a cylindrical chamber or conical cylindrical chamber that may have domed end caps. In an embodiment, the recovery of the upward expanding ignition plasma is achieved by gravity which works against the upward velocity to slow, stop, and then accelerate the ignition product downwards to be collected ultimately in the pelletizer to be reformed into fuel. The collection may be by means of the disclosure. The height of the cell can be calculated by equating the initial kinetic energy to the gravitation potential energy:

$$1/2mv^2 = mgh \tag{220}$$

where m is the particle mass, v is the initial particle velocity, g is the gravitational acceleration (9.8 $m/s^2$), and h is the maximum particle trajectory height due to gravitational deceleration. For a particle initially traveling at 5 m/s, the maximum height is 1.2 m such that the cell may be higher than 1.2 m. In an embodiment, the upward speed may be slowed by the baffle of the disclosure to reduce the cell height requirement.

In another embodiment, the fuel recirculation is achieved by using the Lorentz force, exploiting the principles of the railgun such as a plasma armature type that may further comprise an augmented railgun type. The Lorentz force causes the ignition plasma to be directed and flow into a collection region such as a plate or a collection bin that may feed the product material into the pelletizer. The current and the magnetic field may be in the horizontal or xy-plane such that the Lorentz force according to Eq. (221) is directed downward along the negative z-axis to the collection system components such as a plate or bin. In another embodiment, the current may be in the xy-plane and the B-field directed along the z-axis such that the Lorentz force according to Eq. (221) is directed transversely in the xy-plane to the collection system components. The ignition plasma may carry current from the source of electrical power 2 (FIG. 2C1) to the roller electrodes or from an external power source to serve as the current in Eq. (221). Using at least a portion of the ignition current, at least one of the electrodes and bus bar and the corresponding circuits may be designed to provide at least one of the plasma current and magnetic field during ignition to produce the desired Lorentz force to move the plasma in a desired manner such as out of the zone wherein the plasma is formed during ignition. The ignition current that powers at least one of plasma current and magnetic flux to provide the Lorentz force may be delayed by a delay circuit element such as a delay line to provide the current and magnetic flux at a later time than the ignition event. The delay may permit the plasma to emit light before it is removed by the Lorentz force. The delay may be controlled by circuit or control means known in the art. The current such as high DC current may also be applied by a power source in a desired direction by parallel plate electrodes with the current direction along the inter-plate axis. The current source power may be derived from the power converter such as the PE or PV converter wherein power may be stored in a capacitor bank. The magnetic field of Eq. (221) may be provided by at least one of the current flowing through the rollers during ignition and augmented magnetic fields (augmented railgun design referred to herein as an augmented plasma railgun recovery system). The sources of the augmented magnetic fields may comprise at least one of electromagnets and permanent magnets. The magnetic field of the augmented plasma railgun may be applied by Helmholtz coils such as a pair of separated, axial-aligned coils with the field in the desired direction along the inter-coil axis. The strength of the magnetic field may be controlled by a current controller to control the strength of the Lorentz force and consequently, the rate of recovery of the ignition products. A plurality of electromagnets may have different controlled magnetic fields to direct the plasma and the ignition products to a desired location for collection. In an embodiment, at least one of the augmented electric and magnetic field may be produced inductively by at least one induction coil and an alternating voltage or current driver. In another embodiment, the magnetic field may be provided by a pair of separated, axial-aligned permanent magnets with the field in the desired direction along the inter-pole-face axis. The permanent magnets may comprise AlNiCo, rare earths, or other high field magnet known in the art. The magnetic flux may be any desired such as in at least one range of about 0.001 T to 10 T, 0.01 T to 1 T and 0.1 T to 0.5 T. The electromagnets may be powered by a power supply wherein the electromagnetic power may be derived from the power converter such the PE or PV converter wherein power may be stored in a capacitor bank. The magnetic field from at least one of the source of electrical power 2 (FIG. 2C1) to the roller electrodes and the sources of the augmented magnetic fields is configured to cause the desired flow of the ignition product plasma into the collection system according to the Lorentz force. The collection system may comprise that of the disclosure such as at least one of a collection plate and a bin that may feed into the pelletizer. The bin may be the first vessel of the pelletizer. In another embodiment, the augmented plasma railgun (electromagnetic pump) may be used to at least one of focus the plasma and to pump the plasma to a desired location in the cell to cause the plasma emitted light to be directed to the photovoltaic converter. The augmented plasma railgun (electromagnetic pump) may achieve the effect of focusing or collimating the plasma light onto the power converter by at least one of spatially and temporally directing the plasma.

In the case that the pressure of the cell is low such as vacuum, the recirculation of the ignition product may be achieved using other means of the disclosure such as electrostatic precipitation (ESP). The ESP collection electrodes may be out of sight of the ray paths of the light created by the hydrino reaction. The ESP may be operated in the ignition plasma region. The plasma operation may be supported by the low cell gas pressure such as vacuum. The ESP may operate with the ignition plasma in a region that does not substantially contact at least one type of the ESP electrodes such as the collection electrodes, being the cathode or anode. The ESP collection electrodes may be circumferential to the ignition plasma with at least one of a vacuum and a low-pressure region having a high resistance in the electrical path from the counter to the collection electrodes. At least one of the ESP electrodes of a pair may comprise a barrier electrode. The barrier electrode may limit the current and maintain a high field to collect the ignition product electrostatically. One electrode type may be covered with a highly resistive layer to be permissive of DC operation called resistive barrier discharge. The electrode barrier may comprise a semiconductor such as a layer of gallium arsenide to replace a dielectric barrier layer to enable the use of high voltage DC. The voltage may be in the range of 580 V to 740 V, for example. The high voltage may be pulsed. The ignition product may be transported from the collection electrodes to the pelletizer. The transport may be at least one of gravity-assisted transport and achieved by other methods of the disclosure such as pneumatic methods.

The cell may be operated under evacuated conditions. The cell may comprise a vacuum chamber such as a cylindrical chamber or conical cylindrical chamber that may have domed end caps. The conical cylindrical chamber may be beneficial for optimizing the propagation of the light from the cone emitted from the electrodes at a minimum cell volume. In another embodiment, the cell has sufficient diameter such that the ignition plasma light does not contact the walls substantially before exiting to at least one of a window 20 of the PV or PE converter and being directly incident on the PV or PE converter. The ignition product may collect on the cell walls and be dislodged mechanically such as by vibration. The ignition product may be collected in a vessel such as the first chamber of the pelletizer by gravity or by other means of the disclosure such as pneumatic means. The cell may be operated at a low pressure such as vacuum.

In an embodiment, the ignition product may be removed by at least one of (i) gravity wherein the cell may be operated under reduced pressure such as a vacuum in the range of 0 to 100 Torr, (ii) an augmented railgun with the ignition plasma as the armature referred to herein as an augmented plasma railgun recovery system, and (iii) an electrostatic precipitator. In an embodiment, the larger particles may be charged by a means such as corona discharge and repelled from the light to electricity converter by an electric field such as an electrostatic field that may be applied to a repelling grid by a power supply. In an embodiment, the augmented plasma railgun recovery system removes or recovers essentially all of the fine particles such that the cell is transparent to the light produced by the ignition. Gravity may remove or recover the remainder. In an embodiment, the cell height is sufficient such that particles not removed or recovered by the augmented plasma railgun recovery system or stopped in an upward trajectory by gravity are cooled to a temperature that causes the particles to be non-adherent to either of the window of the converter or the converter such as the PV or PE converter. The SF-CIHT generator may comprise a means to remove ignition product from the surface of the window or the converter such as an ion-sputtering beam that may be swept or rastered over the surface. Alternatively, the cleaning means to remove ignition product from the surface of the window or the converter may comprise a mechanical scraper such as a knife such as a razor blade that is periodically moved across the surface. The motion may be a sweep for a blade of the width of the window or a raster motion in the case of a smaller blade. The baffle of the disclosure may further comprise the mechanical scraper such as a knife or the ion beam cleaner to remove ignition product from the baffle in the same manner.

In an embodiment, the injector is at least one of electrostatic, electric, electrodynamic, magnetic, magnetodynamic, and electromagnetic. The trajectory of the path is in the inter-electrode region such as in the center point of closest contact of the opposed roller electrodes. The aimed transport may comprise an injection of the fuel shot or pellet. The injection may result in the completion of the electrical contact between the rollers that may result in high current flow to cause the shot or pellet to be ignited. In an embodiment, the injector comprises and electrostatic injector such as one of the disclosure. The shot or pellet may be electrostatically charged, the roller electrodes may be oppositely charged, and the shot or pellet may be propelled by the electric field to be injected into the inter-electrode region to be ignited. In an embodiment, the high conductivity of the fuel shot or pellet is permissive of the induction of a surface current due to a time dependent application of at least one of a magnetic field and an electric field wherein the induced current gives rise to a magnetic field produced by the shot or pellet. The correspondingly magnetized shot or pellet may be accelerated along a path such as that provided by guiding magnetic fields such as those provided by current carrying rails. A gradient of magnetic field may be caused over time to accelerate the shot or pellet along the path.

In another embodiment, the shot or pellet injector comprises a railgun. In an embodiment, the railgun comprises a high current source, at least one pair of rails comprising a high conductor, and an armature that comprises the shot or pellet that also serves as the projectile. The railgun injector may comprise a sabot that may be reusable. Alternatively, the railgun may use a plasma armature that may comprise metal that may be at least one of ignition product and fuel that vaporizes and becomes plasma behind the shot or pellet as it carries the high current and causes the shot or pellet to be accelerated along the rails of the railgun injector. The source of current may provide a pulse of current in at least one range of about 1 A to 100 MA, 10 A to 10 MA, 100 A to 1 MA, 1000 A to 100 KA, and 1 kA to 10 kA. The source of current may comprise the source of electrical power 2 (FIG. 2C1) to the roller electrodes that causes ignition such as one comprising a bank of capacitors charged by the light to electricity converter such as the PV or PE converter. The rails may comprise a positive rail and a negative rail comprising a high conductor such as at least one of copper and silver. The railgun injector may be activated at a desired frequency such as 1000 Hz to provide sufficient fuel to maintain the desired fuel ignition rate wherein the conductive arriving shot or pellet may complete the electrical circuit between the roller electrodes to cause the shot or pellet ignition. In an embodiment, the injection activation frequency may be controlled to be within at least one range of about 0.01 Hz to 1 MHz, 1 Hz to 10 kHz, and 10 Hz to 1 kHz. The injection activation frequency may be controlled to control the power output of the SF-CIHT cell. The injection activation control may comprise a switch. The switch may comprise one of the switches of the disclosure for the source of electrical power 2 (FIG. 2C1) to the roller electrodes such as mechanical or electronic switch such as one comprising at least of a IGBT, SCR, and a MOSFET transistor. In another embodiment, the rails are continuously energized as an open circuit that is closed to allow high current to flow with the completion of the circuit by a fuel shot or pellet. In an embodiment, each time that a shot or pellet contacts the rails to complete the circuit, it is accelerated and injected into the electrodes to be ignited. The power source may be capable of maintaining the desired current to each shot or pellet of a plurality of shots or pellets accelerated along the rails at any given time. The current may be controlled by at least one of circuit elements and a controller. In another embodiment, the railgun current is divided amongst an integer n number of shots or pellets that are accelerating on the rails at a given instance such that the decrease in speed of injection of a single shot or pellets according to Eq. (221) is compensated by the simultaneous acceleration and sequential injection of the n shots or pellets. This compensation mechanism may maintain about a constant injection rate dependent on the railgun current. In another embodiment, the voltage across the rails is maintained about constant independent of the number of shots or pellets such that the current per shot or pellet is about the same due to the similar resistances of the shots or pellets. The about constant voltage may be supplied by a power source comprising a large capacitance such as one comprising a bank of capacitors. In an embodiment, the rails may provide a continuous guide path, but comprise segmented sections for electrical current such that the current may be variable and controlled as the shot propagates along the different sections. The current in each section may be controlled by a computer, sensors, and a plurality of current sources to control the speed and energy of the shot in any given section to control the timing of injection or injections wherein multiple shots may be on the rails comprising the variable current sections.

The constant voltage may be kept below a voltage that causes arcing and consequent shot-to-rail welding or rail arc damage. In an embodiment, the voltage may be at least one of less than about 100 V, less than about 50 V, less than about 20 V, less than about 10 V, less than about 5 V, less than about 1 V, less than about 0.5 V, and less than about 0.25 V. In an embodiment, the rails may be heat sunk to avoid shot-to-rail welding. The heat sink may be electrically isolated from the circuit comprising the rails and shot. An electrical insulator that may also be a good heat conductor may provide the electrical isolation. An exemplary heat sink comprises a high mass of a high heat conductive material such as a block of Al, Cu, or Ag that may be electrically insulated with a top layer of diamond film that is also a good thermal conductor as well being an electrical insulator. In another embodiment, the rails may comprise a conductor such as graphite that is resistant to welding. In another embodiment, the rails may comprise a refractory metal conductor such as tungsten or molybdenum that is resistant to welding. The rails may be cooled by means such as air or water cooling to prevent welding. In an embodiment, the rails are at least partially submerged in water that cools the rails and shot and prevents welding. The water may also prevent electrical arcing between the shot and rails. The current may be less than that which causes shot-to-rail welding. In an embodiment, the rails may be long cylinders that are rotated about their longitudinal axes (z-axis in cylindrical coordinates) to make better contact with the shot. The relative rail rotation may be counter-rotating towards the center of the pair to push the shot tighter against the rails. The tighter connection may abate welding of the shot to the rails.

The Lorentz force may be high with a low magnetic field contribution from the rail current by augmenting the magnetic field with an applied magnetic field by a magnet such as an electromagnet or a permanent magnet. In an exemplary augmented railgun embodiment, the applied magnetic field may be provided by a pair of Helmholtz coils with one above and one below the plane of the rails (xy-plane); each parallel to the xy-plane to provide a magnetic field perpendicular to the xy-plane. A similar z-axis oriented magnetic field may be generated by two permanent magnet such as discs replacing the Helmholtz coils in the xy-plane. In another embodiment, the permanent magnets may comprise rectangular bars that run above and below and parallel to the rails having the field oriented along the z-axis. The permanent magnets may comprise AlNiCo, rare earths, or other high field magnet known in the art. The magnetic flux may be any desired such as in at least one range of about 0.001 T to 10 T, 0.01 T to 1 T and 0.1 T to 0.5 T. In an embodiment, multiple shots may be present on the rails to divide the applied power to prevent arcing and corresponding welding of the shot to the rails or arc damage to the rails. A current surge that causes welding or rail damage may be ameliorated by a damping circuit element such as at least one of a shunt diode, a delay line, and circuit inductor. The railgun injectors may have redundancy such that if one fails another may serve in its place until the failed railgun is repaired. In the case the failure is due to a pellet welding on the rails, it may be removed mechanically by grinding or lathing for example or electrically such as by vaporization at high current.

The railgun injector may comprise a low-friction, low-pressure spring-loaded top guide to facilitate the electrical contact between the shot and rails. In an embodiment, the shot-to-rail electrical contact is assisted by vibration applied to the injector. Vibration may be applied to cause a low-resistance electrical contact between the rails and the shot. The contact may also be facilitated by an agitator such as the mechanical and water jet agitators shown in FIGS. 2I4 and 2I5. In an embodiment, the applied magnetic field of the augmented railgun injector may comprise a component parallel to the direction of pellet motion and transverse to the current through the shot such that the shot is forced down on the rails according to the Lorentz force given by Eq. (221) to make and maintain good electrical contact between the shot and the rails. The motion-parallel magnetic field may be provided by at least one of permanent magnets and electromagnets. In the latter case, the magnetic field may be varied to control the downward force on the shot to optimize the contact while avoiding excess friction. The control of the magnetic field may be provided by a computer, sensors, and a variable current power supply. In an embodiment, the rails may comprise an oxidation resistant material such as silver rails to limit rail oxidation and corresponding resistance increase.

The railgun injector may comprise a plurality of railgun injectors that may have synchronous injection activation that may be controlled with a controller such as a microprocessor or computer. The plurality of injectors may increase the injection rate. The plurality of railgun injectors may comprise an array of injectors to increase the injection rate. The rails of the railgun may be straight or curved to achieve a desired injection path from the shot or pellet supply to the inter-electrode region where ignition occurs. The rotational velocity of the roller electrodes may be increased to accommodate more fuel and increase the power output of the SF-CIHT cell. The roller diameter may be scaled to achieve the increased rotational speed. The maximum rotational speed for steel for example is approximately 1100 m/s [J. W. Beams, "Ultrahigh-Speed Rotation", pp. 135-147]. Considering the exemplary case wherein the diameter of a shot or pellet plus the separating space of a series of shots or pellets is 3 mm, then the maximum fuel flow rate supplied by the railgun or plurality of railguns is 367,000 per second. With exemplary energy of 500 J per shot or pellet, the corresponding total power to be converted into electricity may be 180 MW. Additional power can be achieved by adding a plurality of roller electrode pairs with injectors wherein the electrodes may be on the same or different shafts.

In another embodiment, the injector comprises a Gauss gun or coilgun wherein the pellet or shot comprises the projectile. The pellet or shot may comprise a ferromagnetic material such as at least one of Ni, Co, or Fe. An exemplary shot comprises Ag with trapped $H_2$ and $H_2O$ and a ferromagnetic material. The coilgun may comprise at least one current coil along a barrel comprising a guide for the pellet or shot, a power supply to provide a high current and a magnetic field in the at least one coil, and a switch to cause the current to flow to pull the shot or pellet towards the center of the coil wherein the current is switched off before the shot or pellet experiences a reverse force by passing the coil center. The switch may be one of the disclosure such as one comprising an IGBT. The power supply may comprise at least one capacitor. In an embodiment, current is flowed through the shot or pellet to create a shot or pellet magnetic field by the application of external power or by an external time dependent field such as a time dependent magnetic field. The shot or pellet current flow may be achieved by magnetic induction. The magnetic induction may be caused by the time-varying magnetic field of the current coils. In an embodiment, the temporal current flow to the at least one current coil is controlled to propel the shot or pellet along the barrel.

To convert the high intensity light into electricity, the generator may comprise an optical distribution system **26*a* such as that shown in FIG. 2C. The light to electricity panels 15 may comprise at least one of PE, PV, and thermionic cells. The mirror 20 may be transparent to the light such as short wavelength light. The window may comprise at least one of sapphire, LiF, $MgF_2$, and $CaF_2$, other alkaline earth halides such as fluorides such as $BaF_2$, $CdF_2$, quartz, fused quartz, UV glass, borosilicate, and Infrasil (ThorLabs). The semitransparent mirror 23 may be transparent to short wavelength light. The material may be the same as that of window 20 with a partial coverage of reflective material such as mirror such as UV mirror. The semitransparent mirror 23** may comprise a checkered pattern of reflective material such as UV mirror such as at least one of $MgF_2$-coated Al and thin fluoride films such as $MgF_2$ or LiF films or SiC films on aluminum.

In an embodiment, the speed and location of the delivery of a shot or pellet on the roller electrode surface can be controlled to controllably repair any ignition damage to the surface. The control can be achieved by controlling the timing of the shot or pellet accelerating current pulse, as well as the current, position, and steering capability of the railgun injector, for example. The controlled-position delivery with the control of the roller speed and ignition current can facilitate the bonding of the shot or pellet to the electrode. The bonding may be by at least one of sintering, fusing, and welding of the shot or pellet to the electrode surface at the desired position. In an embodiment, a specific percentage of shot or pellets may be made to have less to none of the hydrino reactants such as at least one of hydrogen and HOH. In an embodiment, this can be achieved by forming the shot without the addition of at least one of steam and $H_2$ in the pelletizer. The reduction or elimination of $H_2O$ and $H_2$ may be achieved by eliminating the supply or reducing the solubility in the melt by lowering the melt temperature during shot formation. Alternatively, pellets may be made absent or with diminished amounts of at least one of $H_2$ and $H_2O$. The corresponding "dud" shots or pellets may be applied separately or mixed with ordinary ones at a desired percentage. In an example, one shot or pellet out of integer n is a dud that becomes bonded to the electrodes when injected. The integer n can be controlled to be larger or smaller depending on the amount of damage there is to be repaired. In an embodiment, ignition powder is recovered, forgoes the shot forming process, and is injected into the electrodes by a plasma railgun injector or augmented plasma railgun wherein some of the powder supports the plasma to cause it to be propelled. At least one of the ignition current and ignition plasma supported by ignition of other shots may cause the powder to bond to the electrodes. Excess material may be machined off by means such as by use of a precision grinder or lathe. Alternatively, the excess material may be removed by electrical discharge machining (EDM) wherein the EDM system may comprise the electrodes and power supply.

In an embodiment of the railgun injector, the electric current runs from the positive terminal of the power supply, up the positive rail, across the armature comprising the fuel shot or pellet, and down the negative rail back to the power supply. The current flowing in the rails creates an azimuthal or circular magnetic field about each rail axis. The magnetic field lines run in a counterclockwise circle around the positive rail and in a clockwise circle around the negative rail with the net magnetic field between the rails directed vertically. In other embodiments such as an augmented railgun, current is channeled through additional pairs of parallel conductors, arranged to increase the magnetic field applied to the shot or pellet. Additionally, external magnetic fields may be applied that act on the shot or pellet when current is flowed through it. The shot or pellet projectile experiences a Lorentz force directed perpendicularly to the magnetic field and to the direction of the current flowing across the armature comprising the shot or pellet. The Lorentz force F that is parallel to the rails is given by $$F = Li \times B \tag{221}$$

where is the current, L is the path length of the current through the shot or pellet between the rails, and B is the magnetic flux. The force may be boosted by increasing either the diameter of the fuel shot or pellet or the amount of current. The kinetic energy of the shot or pellet may be increased by increasing the length of the rails. The projectile, under the influence of the Lorentz force, accelerates to the end of the rails and exits to fly to the inter-electrode region. The exit may be through an aperture. With the exit, the circuit is broken, which ends the flow of current. For an exemplary current of 1 kA, shot diameter of 3 mm, and B flux of 0.01 T, the force is 0.03 N. The corresponding kinetic energy for 5 cm length rails is 0.0015 J. From the kinetic energy, the final velocity of an 80 mg shot is 6 m/s.

The shots or pellets may be fed into the injector. The feed may be from a hopper. The feeder may comprise one of the disclosure such as a mechanical feeder. The feeder may comprise a vibrator. The feeder may comprise at least one of a piezoelectric vibrator and an actuator. The feeder may comprise at least one of an auger and a trough. The latter may have a slot along the bottom to feed along the railgun. The shot or pellets may be fed from a plurality of positions along the railgun injector. The feeding may be achieved by at least one method of mechanically and pneumatically.

In an embodiment, the shots recovered from the quenching water bath are dried in a dryer such as an oven such as a vacuum oven before entering the evacuated region of the injector system such as the feed to the injector such as a railgun injector. In an embodiment, at least one of the pelletizer, the water reservoir or bath for cooling and forming of the shots, and the transporter to remove the shots from the water reservoir are connected to the cell under vacuum conditions. The transporter may drain excess water from the shot. An exemplary transporter comprises a conveyor that is permeable to water. The shot may be removed when sufficiently hot that surface absorbed water is evaporated. The water evaporated from at least one of the shot and the water reservoir may be removed from the cell atmosphere to maintain a desired low pressure by a pump such as a vacuum pump or a cyropump. The cyropump may comprise a water condenser. A condenser may be used in lieu of a vacuum pump to at least one of partially evacuate the cell and maintain the cell under reduced pressure. A water condenser may decrease the pressure due to the water vapor by condensing the water. The water may be recycled to the reservoir or bath. The water from the condenser may be recirculated to the reservoir or bath by a return water line such as a return water drip line. The water condenser may be chilled with chiller such as at least one of an air-cooled radiator, refrigerator chiller, and Peltier chiller. Other chillers known in the art may be used to chill the condenser to a desired temperature. In an embodiment, the water vapor pressure in the cell is determined by the temperature of the condenser that may be in the range of about 0° C. to 100° C. In an exemplary embodiment, a typical industrial water chiller operates at about 17° C. corresponding to a water vapor pressure of about 13 Torr. In another embodiment, the chiller may directly chill the reservoir or bath so that the water vapor is condensed directly into the reservoir or bath and the water return line is eliminated. The dry shot may be transported to the injector by a second transporter such as an auger to the shot injector. The shot injector may comprise a railgun injection system wherein the highly conductive shot may serve as the armature and its contact with the electrified rails may trigger the current across the rails to cause the Lorentz force propulsion of the shot into the electrodes such as the roller electrodes.

Exemplary shot comprises silver spheres having entrapped gases such as at least one of $H_2$ and $H_2O$. The shot may be formed by dripping and quenching the corresponding melted material in a bath or reservoir such as a water bath or reservoir. In an embodiment, the shot transporter auger and shot injector feed auger are replaced. In an embodiment, water jets make a water fluidized bed feed to the railgun injector wherein the inlet to the railgun is in the water bath and travels outside of bath to the injection site. The fluidized water bath may serve a purpose of preventing adhesion of hot/cooling shots and serve the same purpose as the gas/shot fluidized bed of the pneumatic injector of the disclosure. In an embodiment, the water bath or reservoir to cool the melt and form shot further comprises an agitator to stir the shot. The agitator may comprise water jets that may be driven by at least one water pump. The action of the water jets may form a fluidized bed. The agitator may further comprise a mechanical agitator such as an auger, a stirrer, or a vibrator such as an electromagnetic or piezoelectric vibrator and other agitators known in the art. In an embodiment, the bath comprises a railgun in a position to receive shot and propel it into the electrodes for ignition. A shot input section of the railgun may be positioned in the bottom of the bath and may comprise a trough or hopper to receive shot agitated in the water bath by the agitator. The railgun injector may penetrate the wall of the bath to be directed at the ignition region of the electrodes. The railgun may have a guide path shape the transports the shot form the bottom of the bath to the ignition region of the electrodes such as roller electrodes. The railgun may comprise a means to drain any water moved with the shot back into the bath as the shot travels with at least some vertical travel above the water level of the bath. Water that does not flow back into the bath such as water that is ejected with the shot may fall to a receiving hopper at the bottom of the cell and be pumped back into the bath with a drainage water pump. Water that is vaporized by the hot shot may be condensed into the bath by the bath chiller. The shot may be hot to provide drying. The elevated temperature of the shot may be from the residual heat from the melted state that has not fully cooled and from the resistive heating in the railgun from the current flow through the shot to cause the Lorentz force. In an embodiment, the cell, the pelletizer such as the one comprising to chambers, the water bath, and the injection railgun may be maintained in continuity regarding the gas pressure and evacuated cell atmosphere.

In an embodiment, the SF-CIHT cell may operate according to at least one of independent of its orientation relative to Earth and independent of gravity. The shot water bath may be sealed, expandable, and capable of maintaining a pressure in the range of about 0.001 Torr to 100 atm. The pressure P may about match or exceed that of the water pressure column of the bath of height h given by Eq. (222) wherein the density p is the density of water and g is the gravitational acceleration (9.8 $m/s^2$).

$$P=\rho gh \tag{222}$$

The shot dripper may be very highly thermally insulated to prevent excessive cooling of the melt in the dripper by contact with the bath water. The systems that transport fuel and the ignition product may operate using the Lorentz force applied by intrinsic or augmented magnetic fields and currents. The shot injection system may comprise an augmented railgun of the disclosure. The ignition product recovery system may comprise an augment plasma railgun of the disclosure. The pelletizer may transport at least one of the powder ignition product and the melt using an augmented railgun comprising applied magnetic fields and applied current flowed through at least one of the powder and melt. In an embodiment, the current and magnetic field are transverse to the desired direction of flow and are mutually perpendicular according to Eq. (221). The system may comprise the appropriate current electrodes and magnets to achieve the transport. The railgun transporters may have sensors and controllers to monitor the Lorentz forces, the flow rates, and apply current to achieve the desired forces and flow rates. The means to transport at least one of the powder and melt through the pelletizer may comprise a pump such as an electromagnetic pump such as those known in the literature. The agitator such as water jets may agitate shot in the bath to be input to the railgun. A mechanical agitator may also feed shot into the augmented railgun injector. In an embodiment, the mechanical agitator may be large relative to the water bath such that the agitator may function irrespective of the cell's orientation relative to gravity. In an exemplary embodiment, a large diameter auger with an equal gap with the top and bottom of the water reservoir may push shot to the railgun independent of the cell's orientation. The water pump may return any water lost from the shot water bath through the railgun injector by pumping it at a rate that matches any loss.

The system may comprise (i) a cell such as a vacuum cell, (ii) an ignition system comprising the roller electrodes and bus bars, (iii) an injector such as a railgun injector, (iv) a ignition product recovery system that may comprise at least one of an augmented plasma railgun recovery system and gravity flow into (v) a hopper connected to the bottom of the cell, (vi) a pelletizer comprising a first vessel to receive ignition product from the hopper, a heater to melt the ignition product, and a second vessel to apply at least one of hydrogen and steam to the melt, (vii) a bath such as an $H_2O$ bath to receive dripping melt from a dripper of the second vessel to form shot, (viii) a shot conveyor, (ix) a drier such as a vacuum oven to receive the shot, (x) a means to transport the shot to the injector such as a chute with controllable vacuum lock passage, (xi) a conveyor such as an auger to transport the shot to the injector such as the railgun injector, and (xii) a vacuum pump to evacuate the cell.

An embodiment of a SF-CIHT cell power generator showing a cell capable of maintaining a vacuum, an ignition system having a railgun shot injection system fed by two transporters, augmented plasma railgun and gravity recovery systems, a pelletizer, and a photovoltaic converter system is shown in FIG. 2H1. As shown in FIG. 2H1 the SF-CIHT cell power generator may comprise i.) a cell 26 such as a vacuum cell that may comprise a conical cylinder having a vacuum pump 13*a*; ii.) an ignition system 8*a* with a power supply 2; iii) a photovoltaic converter system 26*a* comprising photovoltaic cells or panels 15 to receive the light from the ignited fuel and convert it into electricity, the converter having a heat exchanger 87 for cooling wherein the hot coolant flows into the photovoltaic converter cooling system 31 through inlet 31*b* and chilled coolant exits through outlet 31*c*; and iv)

a fuel formation and delivery system 8*b* having a water reservoir for quenching dripped melt to form shot, the reservoir having a cooling system 31*a* wherein the hot coolant flows into the water reservoir cooling system 31*a* through inlet 31*d* and chilled coolant exits through outlet 31*e*. Details of the ignition system 8*a* and its power supply 2 are shown in FIG. 2H2. In an embodiment, the ignition system 8*a* comprises a source of electrical power 2 to flow a high current through bus bars 9 and 10, slip rings 73*a*, shafts 7, and the roller electrodes 8 that are mounted on the shafts 7 suspended by bearings 4*a* attached to structural support 4 being mounted on base support 61. The shafts and attached electrodes 8 are turned by roller drive pulleys 71*a* that are driven by belts 72 each having a belt tensioner 72*a*, motor shafts and pulleys 71 suspended on bearings 73, and motors 12 and 13. Details of the ignition system 8*a* and the photovoltaic converter system 26*a* are shown in FIG. 2H3. In an embodiment, the fuel may be injected by augmented railgun injector 8*f*. The power supply 2 may receive power from the photovoltaic converter 26*a* and supply a high current to roller electrodes 8 to cause ignition of fuel to form plasma in ignition location 8*e*. The upward trajectory of the ignition products may be interrupted by the light transparent baffle 8*d* that may be concave. The ignition products may be recovered by at least one of gravity in the evacuated cell 26 and by the augmented plasma railgun recovery system comprising Helmholtz coil magnets 8*c* and the current flowing between electrodes 8 through the plasma. Details of the ignition 8*a* and the fuel formation and delivery system 8*b* comprising the ignition product recovery system 8*c*, and the pelletizer to form shot fuel 5*a*, and the injection system 8*f* are shown in FIG. 2H4. In an embodiment, shot fuel may be injected into the roller electrodes 8 by the augmented railgun injector 8*f* that is fed pellets from water reservoir 11 of pelletizer 5*a*, conveyed by shot transport auger 66*a* into injector auger hopper 66*b* and then injection auger 66 driven by injector auger motor and drive shaft 67. The roller electrodes 8 may receive high current from power supply 2 that flows through each sequentially injected shot to cause ignition of the fuel to form a brilliant light emitting plasma that is converted into electricity by photovoltaic converter 26*a* (FIGS. 2H1 and 2H3). The upward trajectory of the ignition products may be interrupted by the light transparent baffle 8*d*, and the ignition products may be recovered by at least one of gravity in the evacuated cell 26 and by the augmented plasma railgun recovery system comprising Helmholtz coil magnets 8*c* and the current flowing between electrodes 8 through the plasma. The ignition products may flow into a first vessel 5*b* of the pelletizer 5*a* that may comprise a crucible 5*d* that may be insulated with insulation 5*e*. The products may heated by inductively coupled heater 5*f* to a melt. Shot that does not ignite may flow to the first vessel 5*b* of the pelletizer 5*a* along with the recovered ignition products. The melt may flow into the second vessel 5*c* of the pelletizer 5*a* wherein the melt may be exposed to at least one of steam and hydrogen gas supplied by inlet lines 5*g* and 5*h*. The gases may be recirculated to incorporate the gases into the melt that drips out the shot dripper 5*i* and quenched in the water reservoir 11 to form shot. The hydrogen may be supplied from a tank refilled by the electrolysis of water, and the water may be supplied for a water tank wherein the water in both cases is periodically refilled as water is consumed. The reservoir may have a cooling system 31*a* wherein the hot coolant flows into the water reservoir cooling system 31*a* through inlet 31*d*, and chilled coolant exits through outlet 31*e*. The temperature of the bath in connection with the evacuated cell 26 may be controlled to control the vapor pressure of water vapor in the cell. The cell pressure may also be controlled using vacuum pump 13*a* shown in FIG. 2H1.

An embodiment of a SF-CIHT cell power generator showing a cell capable of maintaining a vacuum, an ignition system having a railgun shot injection system fed directly from a pelletizer, augmented plasma railgun and gravity recovery systems, the pelletizer, and a photovoltaic converter system is shown from two perspectives in FIG. 2I1. As shown from one of the perspectives in FIG. 2I2, the SF-CIHT cell power generator may comprise i.) a cell 26 such as a vacuum cell that may comprise a conical cylinder having a vacuum pump 13*a*; ii.) an ignition system 8*a* with a power supply 2; iii) a photovoltaic converter system 26*a* comprising photovoltaic cells or panels 15 to receive the light from the ignited fuel and convert it into electricity, the converter having a heat exchanger 87 for cooling wherein the hot coolant flows into the photovoltaic converter cooling system 31 through inlet 31*b* and chilled coolant exits through outlet 31*c*; and iv) a fuel formation and delivery system 8*b* having a water reservoir for quenching dripped melt to form shot, the reservoir having a cooling system 31*a* wherein the hot coolant flows into the water reservoir cooling system 31*a* through inlet 31*d* and chilled coolant exits through outlet 31*e*. Details of the ignition system 8*a* and its power supply 2 are shown in FIG. 2H2. Details of the ignition system 8*a* and the photovoltaic converter system 26*a* are shown in FIG. 2I3. In an embodiment, the fuel may be injected by augmented railgun injector 8*f*. The power supply 2 may receive power from the photovoltaic converter 26*a* and supply a high current to roller electrodes 8 to cause ignition of fuel to form plasma in ignition location 8*e*. The upward trajectory of the ignition products may be interrupted by the light transparent baffle 8*d* that may be concave. The ignition products may be recovered by at least one of gravity in the evacuated cell 26 and by the augmented plasma railgun recovery system comprising Helmholtz coil magnets 8*c* and the current flowing between electrodes 8 through the plasma. Details of the ignition 8*a* and the fuel formation and delivery system 8*b* comprising the ignition product recovery system 8*c*, and the pelletizer to form shot fuel 5*a*, and the injection system 8*f* are shown in FIG. 2H4. In an embodiment, shot fuel may be injected into the roller electrodes 8 by the augmented railgun injector 8*f* that is fed pellets from water reservoir 11 of pelletizer 5*a*, conveyed by auger agitator 16*a* or a water jet agitator fed by agitator water jet line 15 (FIG. 2I5). The roller electrodes 8 may receive high current from power supply 2 that flows through each sequentially injected shot to cause ignition of the fuel to form a brilliant light emitting plasma that is converted into electricity by photovoltaic converter 26*a* (FIGS. 2I1, 2I2, and 2I3). The upward trajectory of the ignition products may be interrupted by the light transparent baffle 8*d*, and the ignition products may be recovered by at least one of gravity in the evacuated cell 26 and by the augmented plasma railgun recovery system comprising Helmholtz coil magnets 8*c* and the current flowing between electrodes 8 through the plasma. The ignition products may flow into a first vessel 5*b* of the pelletizer 5*a* that may comprise a crucible 5*d* that may be insulated with insulation 5*e*. The products may be heated by inductively coupled heater 5*f* to a melt. Shot that does not ignite may flow to the first vessel 5*b* of the pelletizer 5*a* along with the recovered ignition products. The melt may flow into the second vessel 5*c* of the pelletizer 5*a* wherein the melt may be exposed to at least one of steam and hydrogen gas supplied by inlet lines 5*g* and 5*h*. The gases may be recirculated to incorporate the gases into the melt that drips out the shot dripper 5*i* and quenched in the water reservoir 11 to form shot. The reservoir may have a cooling system 31*a* wherein the hot coolant flows into the water reservoir cooling system 31*a* through inlet 31*d*, and chilled coolant exits through outlet 31*e*. The temperature of the bath in connection with the evacuated cell 26 may be controlled to control the vapor pressure of water vapor in the cell. The cell pressure may also be controlled using vacuum pump 13*a* shown in FIGS. 2I1, 2I2, and 2I3.

Other embodiments are anticipated by the disclosure by mixing and matching aspects of the present embodiments of the disclosure. For example, the hopper 305 of FIG. 2A may contain shot wherein the regeneration system 314 comprises the pelletizer of the disclosure. The product remover 313 may comprise at an augmented plasma railgun recovery system or a pneumatic recovery system of the disclosure. The PV panels may be oriented to maximize the capture of the light wherein other positions than that shown for the photovoltaic converter 306 of FIG. 2A are anticipated and can be determined by one skilled in the art with routine knowledge. The same applies to the relative orientation of other systems and combinations of systems of the disclosure.

In an embodiment, the light to electricity converter comprises the photovoltaic converter of the disclosure comprising photovoltaic (PV) cells that are responsive to a substantial wavelength region of the light emitted from the cell such as that corresponding to at least 10% of the optical power output. In an embodiment, the fuel may comprise silver shot having at least one of trapped hydrogen and trapped $H_2O$. The light emission may comprise predominantly ultraviolet light such as light in the wavelength region of about 120 nm to 300 nm. The PV cell may be response to at least a portion of the wavelength region of about 120 nm to 300 nm. The PV cells may comprise concentrator UV cells. The incident light intensity may be in at least one range of about 2 to 100,000 Suns and 10 to 10,000 Suns. The PV cell may comprise a group III nitride such as at least one of InGaN, GaN, and AlGaN. In an embodiment, the PV cell may comprise a plurality of junctions. The junctions may be layered in series. In another embodiment, the junctions are independent or electrically parallel. The independent junctions may be mechanically stacked or wafer bonded. An exemplary multi junction PV cell comprises at least two junctions comprising n-p doped semiconductor such as a plurality from the group of InGaN, GaN, and AlGaN. The n dopant of GaN may comprise oxygen, and the p dopant may comprise Mg. An exemplary triple junction cell may comprise InGaN//GaN//AlGaN wherein // may refer to an isolating transparent wafer bond layer or mechanical stacking. The PV may be run at high light intensity equivalent to that of concentrator photovoltaic (CPV). The substrate may be at least one of sapphire, Si, SiC, and GaN wherein the latter two provide the best lattice matching for CPV applications. Layers may be deposited using metalorganic vapor phase epitaxy (MOVPE) methods known in the art. The cells may be cooled by cold plates such as those used in CPV or diode lasers such as commercial GaN diode lasers. The grid contacts may be mounted on the front and back surfaces of the cells as in the case of CPV cells. In an embodiment, the PV converter may have a protective window that is substantially transparent to the light to which it is responsive. The window may be at least 10% transparent to the responsive light. The window may be transparent to UV light. The window may comprise a coating such as a UV transparent coating on the PV cells. The coating may comprise may comprise the material of UV windows of the disclosure such as a sapphire or $MgF_2$ window. Other suitable windows comprise LiF and $CaF_2$. The coating may be applied by deposition such as vapor deposition. The SF-CIHT generator may comprise a means to remove ignition product from the surface such as a mechanical scraper or an ion-sputtering beam.

f. Other Applications

In an embodiment shown in FIGS. 2G1*d*1 and 2J, the generator comprises a thermal power converter comprising a heat exchanger 87 in the walls of the cell, at least one coolant inlet line 84, at least one coolant outlet line 85, optionally a second heat exchanger, a boiler, a turbine such as a steam turbine, and a generator 86. In an embodiment, the thermal power converter comprises a coolant other than water that is known to those skilled in the art. In another embodiment, the walls of the cell comprise the heat exchanger that heats the coolant. The coolant such as water may boil in response to receiving heat from the cell. The gas formed by boiling may be flowed into a heat engine such as a turbine such as a steam turbine in the case that the gas is steam. In an embodiment, the cell may comprise the boiler. At least one of steam and hot water may serve to recover the ignition products and rinse them into the slurry trough so that the fuel may be recirculated. The system may further comprise at least another heat exchanger, as well as heaters, preheaters, boilers, condensers and other components of a thermal power converter such as those known by one skilled in the art.

In another embodiment, at least a portion of the cell wall comprises a heat exchanger that is in contact with a heat engine such as a Stirling engine. The wall and the heat engine may be connected by a thermal conduit such as a heat pipe that transfers heat from at least one of the cell and the cell wall to the heat engine.

In an embodiment, the power is radiated from the cell and is collected in a photon collector. In an embodiment, the cell walls are highly reflective and are maintained as highly reflective during operation to reflect photons out of the cell to the photon collector. In an embodiment, the optical distribution and photovoltaic converter is replaced with a photon collector. The photons may be within a wavelength region such as ultraviolet, visible, near infrared, and infrared. In an embodiment, the photon collector traps the photons and converts the photons to heat. The heat may be used directly or converted into electricity. In an embodiment, the photon collector comprises a solar collector. The photon collector may comprise a plurality of surfaces with high emissivity that may further have a high heat conductivity such as blacken metal such as blacked aluminum. The photon collector may comprise multiple surfaces or elements comprising surfaces that are incident to the photons emitted form the cell directly or indirectly wherein refection may occur from one surface to another of the collector with energy absorption occurring during the plurality of reflections. The multiple surfaces may be angle to support the multiple reflections to increase the absorption of the photon power incident upon the photon collector. The surface may be corrugated or ribbed. The collector may comprise a plurality of louver pairs wherein light reflects from a slat of one to a slat of another. The slats may be oriented to maximize the absorption by the multiple reflections between reflecting surfaces or elements such as slats. The photon collector may be operated at a much higher temperature than the cell.

In an embodiment, the photovoltaic converter may comprise a thermophotovoltaic converter. Referring to FIG. 2I2, the cell 26 may comprise at least one wall or blackbody cavity (absorber/emitter) that absorbs light and heat from the ignition of the fuel. The absorber/emitter may comprise a refractory material such as at least one of carbon and a refractory metal such as W and Mo. The absorber/emitter may be thermally isolated to reduce conductive heat loss by being mounted on a thin pedestal or posts that may comprise a material of low heat conductivity such as ceramic such as silicon nitride, alumina, or zirconia. The absorber/emitter may be heated to a blackbody temperature such as a blackbody temperature in at least one range of about 500° C. to 6000° C., 1000° C. to 4000° C., and 1000° C. to 3000° C. In an embodiment, the heated absorber/emitter emits light to a photovoltaic converter 26*a*. The photovoltaic converter 26*a* may be outside of the cell 26 that may be sealed. The PV cells 15 may comprise a PV material responsive to the emission of the absorber/emitter. The PV material may comprise at least one of GaAs, Si, InGaAs, and Ge. The PV cells may comprise multi-junction cells such as Si or GaAs/InGaAs or Ge wherein/designates a layer. The heat exchangers such as the photovoltaic heat exchanger 87 have a coolant capable of high thermal power transfer. The coolant may comprise water or other liquid such as solvent or liquid metals or salts known to those skilled in the art. In an embodiment, at least one of the heat exchanger and a component of the heat exchanger may comprise a heat pipe. The heat pipe fluid may comprise a molten salt or metal. Exemplary metals are cesium, NaK, potassium, sodium, lithium, and silver.

In an embodiment, the light emission from the SF-CIHT cell is modulated. The modulation may be achieved by at least one of controlling the ignition process and blocking or deflecting the light. The modulation may be at AC frequencies to create AC electricity in the PV converter. The AC voltage may be stepped up using at least one transformer or other voltage step-up power conditioning equipment known in the art. The higher voltage may lower the current on at least one of the PV circuitry and the bus bars to at least one of decrease resistive loses and heat generation. In addition to electrically, power may be transferred magnetically, and by beaming such as microwave beaming and laser beaming.

The heat may be transferred by at least one heat exchanger to a power conversion system such as one comprising at least one the group of a Sterling engine that may comprise an input heat pipe, a boiler, a steam generator, a turbine, and an electrical generator. The Sterling engine system may comprise a blackbody heat collector, a heat pipe to transfer heat to a Sterling engine, and Sterling engine, and an electrical generator or other mechanical load connected to the Sterling engine. Such systems are known in the art such as those having concentrated solar thermal energy as the source of power input. In another embodiment the working medium of the heat engine such as a turbine may comprise one other than water such as an organic liquid or a condensable gas such as carbon dioxide as known to those skilled in the art. In another embodiment, the heat may be transferred to a heat engine such as a Stirling engine. The heat may be transferred by at least one of a heat exchanger and a heat pipe. In an embodiment, the photon collector is operated at high temperature such as in the range of about 800° C. to 3500° C. The blackbody radiation may be incident on a thermo-photovoltaic converter to produce electricity.

Another application of the current disclosure is a light source. The optical power is from the ignition of the solid fuel of the disclosure. In an embodiment, the SF-CIHT generator comprises a metal halide lamp that may be at least partially powered by the hydrino reaction. The metal and metal halide may be those of conventional metal halide lamps and may further comprise at least one solid fuel. The active metal halide lamp materials may comprise a solid fuel comprising a metal such as at least one of Ag or Cu and hydrate such as at least one an alkaline earth halide hydrate such as at least one of $BaI_2$ $2H_2O$ and $MgBr_2$ $6H_2O$, and a transition metal halide hydrate such as $ZnCl_2$ hydrate, and a hydrated oxide such as $Mg(OH)_2$, $Al(OH)_3$, $La(OH)_3$, borax, hydrated $B_2O_3$ or other boron oxide, and borinic acid. The light source comprises at least one transparent or semitransparent wall of the cell 1 shown in FIG. 2I2. The transparent or semitransparent wall may be coated with a phosphor to convert the energy including light to a desired wavelength band. The ignition may occur at sufficient frequency such that the light appears as constant. In an embodiment, the plasma formed from the ignition of solid fuel produces a high output at short wavelengths. Significant optical power may be in the EUV and soft X-ray region. The short wavelength light source such as a UV light source may be used for chemical reaction propagation, material processing, and other uses known in the art for a powerful UV light source such as one having up to hundreds of kilowatts to megawatts of mostly UV light. The UV light may exit the cell using a UV window such as one of those of the disclosure such as a $MgF_2$ window. The short wavelength light source such as the EUV light source may be used for photolithography. The EUV light may exit the cell using a windowless exit channel. In an embodiment, the ignition plasma from a solid fuel is expanded into vacuum such that it becomes optically thin for short wavelength light such as in the EUV region. At least one of the solid fuel and the plasma may be seeded with at least one of another material, compound, and element that becomes at least one of excited in the plasma and excited by the short wavelength light to emit light in a desired wavelength range. In an embodiment, an exemplary another material, compound, and element comprises one that emits in the wavelength region of 13.5 nm within 20 nm such as Sn or Xe.

A wavelength region of this radiation may be selected by using a filter or a monochrometer. The power is very high. In an exemplary embodiment, more that 100 J is emitted in 0.5 ms corresponding to more than 200,000 W from a fuel volume of less than 10 ul. He selected radiation may be used for medical treatment such as cutaneous treatment for disorders such as skin cancer and other dermatological disorders.

In another application, short wavelength light output by the SF-CIHT cell may be used to destroy the DNA of pathogens such as that of bacteria and viruses. The wavelength of the light may be selected to at least one of destroy DNA of pathogens and be germicidal. An exemplary wavelength band is UV-C. The wavelength region may be in the range of about 100 nm to 280 nm. The power may be high such as in the range of about 10 W to 10 MW. The desired wavelength region may be selective by at least one of using a $H_2O$-based solid fuel that outputs radiation in the desired region and by adding fuel additives that shift the spectrum to the desired region. In another embodiment, the atmosphere of the cell may be changed to achieve the desired wavelength output. In an exemplary embodiment, the cell gas comprises at least one of hydrogen and a noble gas such as Xe that outputs the desired wavelength emission to be germicidal. In another embodiment, the wavelength may be selected with at least one optical filter.

J. $H_2O$-Based Solid Fuel Power Source Based on the Catalysis of H by HOH Catalyst a. Catalyst Reactions of the Embodiment Classical physical laws predict that atomic hydrogen may undergo a catalytic reaction with certain species, including itself, that can accept energy in integer multiples of the potential energy of atomic hydrogen, m·27.2 eV, wherein m is an integer. The predicted reaction involves a resonant, nonradiative energy transfer from otherwise stable atomic hydrogen to the catalyst capable of accepting the energy. The product is H(1/p), fractional Rydberg states of atomic hydrogen called "hydrino atoms," wherein n=½, ⅓, ¼, . . . , 1/p (p≤137 is an integer) replaces the well-known parameter n=integer in the Rydberg equation for hydrogen excited states. Each hydrino state also comprises an electron, a proton, and a photon, but the field contribution from the photon increases the binding energy rather than decreasing it corresponding to energy desorption rather than absorption. Since the potential energy of atomic hydrogen is 27.2 eV, m H atoms serve as a catalyst of m·27.2 eV for another (m+1)th H atom. For example, a H atom can act as a catalyst for another H by accepting 27.2 eV from it via through-space energy transfer such as by magnetic or induced electric dipole-dipole coupling to form an intermediate that decays with the emission of continuum bands with short wavelength cutoffs and energies of $$m^2 \cdot 13.6 \text{ eV} \left(\frac{91.2}{m^2} \text{ nm}\right).$$

In the H-atom catalyst reaction involving a transition to the $$H\left[\frac{a_H}{p = m+1}\right]$$

state, m H atoms serve as a catalyst of m·27.2 eV for another (m+1)th H atom. Then, the reaction between m+1 hydrogen atoms whereby m atoms resonantly and nonradiatively accept m·27.2 eV from the (m+1)th hydrogen atom such that mH serves as the catalyst is given by $$m \cdot 27.2 \text{ eV} + mH + H \to mH^+_{fast} + me^- + H*\left[\frac{a_H}{m+1}\right] + m \cdot 272 \text{ eV} \quad (223)$$

$$H*\left[\frac{a_H}{m+1}\right] \to H\left[\frac{a_H}{m+1}\right] + [(m+1)^2 - 1^2] \cdot 13.6 \text{ eV} - m \cdot 27.2 \text{ eV} \quad (224)$$

$$mH^+_{fast} + me^- \to mH + m \cdot 27.2 \text{ eV} \quad (225)$$

And, the overall reaction is $$H \to H\left[\frac{a_H}{p = m+1}\right] + [(m+1)^2 - 1^2] \cdot 13.6 \text{ eV} \quad (226)$$

In addition to atomic H, a molecule that accepts m·27.2 eV from atomic H with a decrease in the magnitude of the potential energy of the molecule by the same energy may also serve as a catalyst. The potential energy of $H_2O$ is 81.6 eV; so, the nascent $H_2O$ molecule (not hydrogen bonded in solid, liquid, or gaseous state) may serve as a catalyst. Based on the 10% energy change in the heat of vaporization in going from ice at 0° C. to water at 100° C., the average number of H bonds per water molecule in boiling water is 3.6; thus, $H_2O$ must be formed chemically as isolated molecules with suitable activation energy in order to serve as a catalyst to form hydrinos. The catalysis reaction (m=3) regarding the potential energy of nascent $H_2O$ is $$81.6 \text{ eV} + H_2O + H[a_H] \to 2H^+_{fast} + O^- + e^- + H*\left[\frac{a_H}{4}\right] + 81.6 \text{ eV} \quad (227)$$

$$H*\left[\frac{a_H}{4}\right] \to H\left[\frac{a_H}{4}\right] + 122.4 \text{ eV} \quad (228)$$

$$2H^+_{fast} + O^- + e^- \to H_2O + 81.6 \text{ eV} \quad (229)$$

And, the overall reaction is $$H[a_H] \to H\left[\frac{a_H}{4}\right] + 81.6 \text{ eV} + 122.4 \text{ eV} \quad (230)$$

An electrochemical CIHT (Catalyst Induced Hydrino Transition) cell generates electricity from $H_2O$ vapor that may be extracted from air using a charge and discharge cycle to convert the $H_2O$ into hydrinos, oxygen, and excess electricity. During a charging phase, hydrogen and oxygen are generated by electrolysis of $H_2O$ at the anode and cathode, respectively. Then, the cell is discharged and electrolytic $OH^-$ is oxidized at the anode, $OH^-$ reacts with H to form HOH, and hydrinos are formed from the catalysis of H by HOH catalyst. The electrochemical cell reactions consume initially the hydrogen and then $H_2O$ fed to the cell to produce a large gain in electrical output. The CIHT electrical energies were continuously output over long-duration, measured on different systems, configurations, and modes of operation and were typically multiples of the electrical input that in recent higher-power-density cases exceed the input by a factor of about 2 at about 10 $mW/cm^2$ anode area. The power density was further increased by a factor of over 10 while maintaining gain by running a corresponding high current.

Thermal energy may also be produced from the catalysis of H to H(¼) wherein nascent $H_2O$ serves as the catalyst, and a chemical reaction is the source of atomic hydrogen and catalyst. Solid fuels that form HOH catalyst and H also showed multiple times the maximum theoretical energy. Excess heats from solid fuels reactions were measured using water-flow calorimetry and these results have been independently confirmed by differential scanning calorimetry (DSC) runs at testing laboratories. The predicted molecular hydrino $H_2$(¼) was identified as a product of power producing cells, CIHT cells and thermal cells, by techniques such as MAS $^1H$ NMR, ToF-SIMS, ESI-ToFMS, electron-beam excitation emission spectroscopy, Raman spectroscopy, Raman spectroscopy with surface enhanced Raman scattering (SERS), time-of-flight secondary ion mass spectroscopy (ToF-SIMS), electrospray ionization time-of-flight mass spectroscopy (ESI-ToFMS), Fourier transform infrared (FTIR) spectroscopy, X-ray photoelectron XPS spectroscopy, and photoluminescence emission spectroscopy. Moreover, m H catalyst was identified to be active in astronomical sources such as the Sun, stars, and interstellar medium wherein the characteristics of hydrino products match those of the dark matter of the universe.

Greater than 50 eV Balmer α line broadening that reveals a population of extraordinarily high-kinetic-energy hydrogen atoms in certain mixed hydrogen plasmas such as water vapor and continuum-emitting hydrogen pinch plasmas is a well-established phenomenon; however, the mechanism has been controversial in that the conventional view that it is due to field acceleration is not supported by the data and critical tests. Rather it is shown that the cause is due to the energy released in the formation of hydrinos. EUV radiation in the 10-30 nm region observed only arising from very low energy pulsed pinch gas discharges comprising some hydrogen first at BlackLight Power, Inc. (BLP) and reproduced at the Harvard Center for Astrophysics (CfA) was determined to be due to the transition of H to the lower-energy hydrogen or hydrino state H(¼) whose emission matches that observed wherein alternative sources were eliminated. HOH was identified as the most likely cause for the transition. The high multiple kilo-amp current of the pinch plasma was a unique feature of this bright source of hydrino transition radiation.

Based on the catalyst mechanism, the high current facilitates a rapid transition rate (higher kinetics) by providing a sink for the inhibiting space charge build up from the ionization of the HOH catalyst. A Solid Fuel-Catalyst-Induced-Hydrino-Transition (SF-CIHT) cell produces extraordinary power by using a solid fuel comprising a conductive matrix that has bound water. By confining the fuel between opposing electrodes of the cell, and applying a current of about 12,000 A through the fuel, water ignites into an extraordinary brilliant flash of optical power released by the transition of hydrogen of $H_2O$ into hydrinos. Specifically, it was observed that the kinetics of catalysis of H to H(¼) by HOH catalyst can be explosive when a high current such as 10,000-20,000 A is flowed through the solid fuel comprising $M+H_2O$ (M=Ti, Cu, Al) that is a source of HOH catalysts and H. The resulting power density is about $1\times10^{10}$ times greater than observed for the forerunner CIHT cell or thermal solid fuels. The energy was attributed to the reaction of $H_2O$ to $H_2$(¼) and $\frac{1}{2}O_2$. The transition of H to H(¼) was confirmed by extreme ultraviolet (EUV) spectroscopy. The HOH catalyst was shown to give EUV radiation in the region of less than 15 to 30 nm by igniting a solid fuel source comprising a source of H and HOH catalyst by passing a low-voltage, high current through the fuel to produce explosive plasma. No chemical reaction can release such high-energy light, and the field corresponded to a voltage that was less than 15 V for the initially super-atmospheric collisional plasma. No high field existed to form highly ionized ions that could give radiation in this region. This plasma source serves as strong evidence for the existence of the transition of H to hydrino H(¼) by HOH as the catalyst.

Solid fuels of the SF-CIHT cell comprising bound $H_2O$ for production of explosive power and excess energy were tested. Specifically, the $H_2O$-based solid fuel such as one comprising $Ti+H_2O$ was caused to explode by flowing a high current. The brilliant light-emitting plasma and its temporal evolution were characterized by high speed (6500 frames/s video) and a fast photodiode, respectively. The energy balance and time of the event were separately determined by bomb calorimetry and by the mechanical disruption time of the voltage and current waveform by the blast event and supporting the fast-response photodiode results, respectively. From these parameters and the fuel volume, the power and power density were determined. The predicted hydrino product $H_2$(¼) was identified by Raman spectroscopy, photoluminescence emission spectroscopy, and X-ray photoelectron spectroscopy (XPS).

b. Calorimetry of Solid Fuel of the SF-CIHT Cell

The energy balances were measured on the $H_2O$-based solid fuels shown in Table 10 comprising $M+H_2O$ or $M+MO+H_2O$ (M=Ti, Cu, Al), $Ag+MgCl_2.6H_2O$, $Ti+MgCl_2.6H_2O$, $Ti+ZnCl_2+H_2O$, $Ag+NH_4NO_3+H_2O$, $NH_4NO_3+H_2O+Al$, and $NH_4NO_3$. Hydrocarbon-based solid fuels comprised paraffin wax, Nujol oil, and synthetic oil 0W40. Metal foils heated in an argon-atmosphere glove box to dehydrate the hydrated surface oxide coat served as the calibration controls to determine the calorimeter heat capacity. An exemplary fuel comprised Cu (45 mg, Alfa Aesar stock #41205, copper powder, 625 mesh, APS 0.50-1.5 micron, 99% (metals basis))+CuO (45 mg, Alfa Aesar stock #33307)+$H_2O$ (30 mg) that was sealed in an aluminum DSC pan (75 mg) (aluminum crucible 30 μl, D: 6.7 mm×3 mm (Setaram, S08/HBB37408) and aluminum cover D: 6.7 mm, stamped, tight (Setaram, S08/HBB37409)). Samples also comprised metal powder mixtures not contained in a DSC pan. The setup of the Parr 1341 calorimeter used for the energy balance determination (FIG. 4) comprised an unmodified calorimeter jacket (21) and calorimeter cover (1) (combined Parr part number A1100DD). A thermistor with a temperature resolution of ±0.0001° C. (2) (Parr part number 1168E2) passed through the calorimeter cover and was secured such that it read the water temperature in line with the bomb assembly at a distance of 2.54 cm from the bottom of the water bucket (19). The custom made, 0.051 cm thick stainless steel oval bucket weighed 417.8 g and had a small diameter of 12.7 cm inches, a large diameter of 18.4 cm, and a height of 10.2 cm. The water bucket held 1225±0.01 g of deionized water along with the custom calorimeter bomb assembly. A stirring assembly (6) comprised a stirrer pulley (Parr part number 37C2), a stirrer bearing assembly (Parr part number A27A), and stirrer shaft with impeller (11) (Parr part number A30A3). It was mounted on the calorimeter cover and was connected to the motor assembly (Parr part number A50MEB) by a motor pulley (8) (Parr part number 36M4) by a stirrer drive belt (7) (Parr part number 37M2) driven by the motor (9). The motor assembly was attached to the calorimeter externally by an L-bracket motor connector (10) to prevent the heat output of the motor from affecting the calorimetric measurements. Two 1.6 cm OD solid copper electrodes (3) passed through customized holes in the calorimeter cover and further passed through a Teflon position stabilizing block and then connected to the main conductors of an ACME 75 kVA resistance welder. The 0.32 cm thick stainless steel custom cylindrical bomb cell (14) had a 7.62 cm diameter and 2.54 cm height with a 12.4 cm flange that was 0.64 cm thick. The electrodes penetrated the flange lid through electrode feed-throughs (13) with Teflon insulating ferrule seals (15) that provided electrical isolation and a hermetic seal. Power was transmitted to the solid fuel (18) through the 1.3 cm diameter 0.48 cm thick copper fastener swivel (17) by the 3.0 cm long, 0.95 cm diameter copper sample-fastening bolts (16) which were threaded through the base of the electrodes. The solid fuel was contained between the fastener swivels by tightening the sample fastening bolts to a torque of approximately 1.81 Nm as measured by a high accuracy flat beam torque wrench resulting in approximately 1112 N force to the sample as measured by a piezoresistive force sensor (Measurement Specialties, FC2311-0000-0250-L). Efficient heat transfer was enabled by heat fins (12) installed on the electrodes immediately above the electrode feed-throughs that ensured minimal heat loss through the electrodes and out of the closed system. The bucket stand (20) elevated the bomb cell to the top of the calorimeter to minimize the dimensions and quantities of materials necessary to operate the Parr 1341 calorimeter and improve the accuracy of the measurements.

Each sample was ignited under argon with an applied peak 60 Hz voltage of less than 10 V and a peak current of about 20,000 A. The input power was recorded through a custom interface receiving input from the positive probe connector (4) and negative probe connector (5). The input energy of the calibration and ignition of the solid fuel was given as the product of the voltage and current integrated over the time of the input. The voltage was measured by a data acquisition system (DAS) comprising a PC with a National Instruments USB-6210 data acquisition module and Labview VI. The current was also measured by the same DAS using a Rogowski coil (Model CWT600LF with a 700 mm cable) that was accurate to 0.3% as the signal source. V and I input data were obtained at 83 KS/s and a voltage attenuator was used to bring analog input voltage to within the +/−10V range of the USB-6210.

The input power data was processed to calculate the input energy during the rapid power decay following ignition to an open circuit. Taking the product of the measured voltage waveform obtained from the voltage taps immediately above the water level on the ⅝" OD Cu rods and the measured current waveform given by the Rogowski coil yielded the power waveform. The time integrated power waveform yielded the cumulative energy provided to the system to the time point that the ignition or detonation event occurred. The secondary circuit of the spot welder transformer was temporarily broken as the electrode tips were pushed apart by the force of the blast. On a time scale of about 10 μs, the circuit quickly transitioned to high resistance, effectively becoming an open circuit with the development of a reactive voltage transient as a result of the fast collapsing magnetic flux in the transformer. The current fell to zero as the voltage transient produced a corresponding reflected wave reactive power component in the power waveform that typically rapidly decayed on the order of about 500 μs to 1 ms. To eliminate this reactive power component over the time of the current decay, the power waveform was smoothed over the immediate post-blast period until current reached zero by fitting the voltage and current components during this time to their typical amplitudes and phases during pre-blast conditions. The accuracy of this method was confirmed by the achievement of energy balance with control samples.

c. Ignition of $H_2O$-Based Solid Fuels with a Low Voltage, High Current and Plasma Duration Determination Test samples comprising: (i) $H_2O$-based solid fuels 100 mg Cu[1]+30 mg $H_2O$ sealed in the DSC pan, and 100 mg Ti (Alfa Aesar stock #10386, titanium powder, 325 mesh, 99% (metals basis) (<44 micron))+30 mg $H_2O$ sealed in the DSC pan, (ii) hydrocarbon-based solid fuel such as oil or paraffin wax sealed in the DSC pan, (iii) control $H_2O$-based reaction mixtures 185 mg In+30 mg $CaCl_2$+15 mg $H_2O$, 185 mg In+30 mg $ZnCl_2$+15 mg $H_2O$, 185 mg Bi+30 mg $ZnCl_2$+5 mg $H_2O$, and 185 mg Sn+30 mg $ZnCl_2$+5 mg $H_2O$, that were not catalytic to form hydrinos, and (iv) control conductive materials not comprising $H_2O$ such as a 0.0254 cm diameter gold wire loop and a 2.38 mm diameter InSn wire loop, each oriented for axial current flow and preheated in vacuum/pre-dehydrated metal foils were loaded into the electrodes of the Acme 75 KVA welder that was activated to apply high current through each sample. The AC current was typically in the range of 10,000-30,000 A, and the peak voltage was typically less than 6 V with the exception of the wire samples having much lower current due to the low voltage and relatively high resistance. The expanding plasmas formed from solid fuel ignitions were recorded with a Phantom v7.3 high-speed video camera at 6500 frames per second.

[1]All metal samples comprised powder. $H_2O$ was deionzed.

The temporal evolution of the solid fuel Cu+$H_2O$ sealed in the DSC pan was measured with a photodiode (Thorlabs, model SM05PD1A) having a spectral range of 350-1100 nm, a peak sensitive wavelength of 980 nm, an active area of 13 $mm^2$, a rise/fall time of 10 ns, and a junction capacitance of 24 pF at 20 V. The signal was processed using an amplifier (Opto Diode model PA 100) with no gain and a 10 V bias and recorded with a 60 MHz scope (Pico Technology, Picoscope 5442B) at a scan interval of 25 ns. The measuring distance was 25 cm. The temporal resolution of the photodiode was confirmed to be within specification by recording the response to a light-emitting diode powered by pulses of 1 μs, 10 μs, and 1 ms that were generated by a function generator (Agilent 33220A 20 MHz Arbitrary Waveform Generator). In each case, a square wave of the width of the temporal width of the pulse was observed.

d. Analytical Samples for the Spectroscopic Identification of Molecular Hydrino

The solid fuels that were used for calorimetric determination of the energy balance also served as sources of the theoretically predicted molecular hydrino product $H_2(1/4)$. The molecular hydrino samples comprised an indium witness plate or a KOH—KCl mixture placed in a sealed container under argon wherein hydrinos generated with ignition were trapped in the matrix of the indium or KOH—KCl mixture that thereby served as a molecular hydrino getter. Raman spectroscopy, photoluminescence emission spectroscopy, and X-ray photoelectron spectroscopy (XPS) were performed on reaction products. Starting materials not exposed to a hydrino source served as controls.

Quantitative X-Ray Diffraction (XRD).

XRD was performed on the starting materials and the reaction products using a Panalytical X'Pert MPD diffractometer using Cu radiation at 45KV/40 mA over the range 10°-80° with a step size of 0.0131° and a counting time of 250 seconds per step. Once the patterns had been obtained, the phases were identified with the aid of the ICDD database and quantified by a Rietveld refinement.

Raman Spectroscopy.

Raman spectroscopy was performed on indium metal foil witness plates and on solid 1 g KCl+1 g KOH samples wherein each was held in a 1.45 cm OD×2.5 cm height, open top $Al_2O_3$ crucible. The indium foil was exposed for one minute to the product gas following each ignition of a series of solid fuel pellet ignitions. Fifty solid fuel pellets were ignited sequentially in an argon atmosphere each comprising 100 mg Cu+30 mg $H_2O$ sealed in the DSC pan. Each ignition of the solid fuel pellet was performed using an Acme model 3-42-75 AR spot welder that supplied a short burst of electrical energy in the form of a 60 Hz low-voltage of about 8 V RMS and high-current of about 15,000 to 25,000 A. Spectra were obtained using a Thermo Scientific DXR SmartRaman spectrometer having a 780 nm diode laser. The resolution, depending on the instrument focal length, wavelength range, and grating, was typically 1-5 $cm^{-1}$. The Raman spectrum was also recorded on the In metal foil exposed to the product gas from the argon-atmosphere ignition of 50 mg of $NH_4NO_3$ sealed in the DSC pan.

The hydrino getter 1 g KCl+1 g KOH was heated at 250° C. for 15 minutes and cooled (control), then placed in the crucible and exposed to 50 sequential ignitions of solid fuel pellets in an argon atmosphere at room temperature. Each pellet comprised 100 mg Cu+30 mg $H_2O$ sealed in the DSC pan. Additional solid fuels 80 mg Ti+30 mg $H_2O$ and 100 mg Ti+50 mg Al+30 mg $ZnCl_2$+15 mg $H_2O$ were tested as powders with three ignition exposures each exposed to the hydrino getter KOH:KCl (1:1 wt %) that was not heated and was held in a stainless steel mesh pouch (32×32 per $cm^2$, 0.014 cm diameter wire). Each ignition of the solid fuel pellet was performed using a Acme model 3-42-75 AR spot welder that supplied a short burst of electrical energy in the form of a 60 Hz low-voltage of about 8 V RMS and high-current of about 15,000 to 25,000 A. The Raman spectra were recorded on the getter using the Horiba Jobin Yvon LabRAM Aramis Raman spectrometer with a HeCd 325 nm laser in microscope mode with a magnification of 40×.

XPS Spectra.

A series of XPS analyses were made on indium foil witness plates and solid KOH—KCl samples using a Scienta 300 XPS Spectrometer or a Kratos Analytical Axis Ultra. The fixed analyzer transmission mode and the sweep acquisition mode were used. The step energy in the survey scan was 0.5 eV, and the step energy in the high-resolution scan was 0.15 eV. In the survey scan, the time per step was 0.4 seconds, and the number of sweeps was 4. C 1 s at 284.5 eV was used as the internal standard.

Using a Scienta 300 XPS spectrometer, XPS was performed at Lehigh University on the indium metal foil witness plate that was initially analyzed by Raman spectroscopy and showed a strong 1982 $cm^{-1}$ IRE peak (Sec. e.3). The sample described supra comprised the In foil exposed to the gases from the ignition of the solid fuel comprising 100 mg Cu+30 mg deionized water sealed in the aluminum DSC pan.

Additionally, XPS was performed on a KOH:KCl (1:1 wt %) getter placed in a stainless steel tray that was exposed to product gases from three ignitions of the solid fuel 70 mg Ti+30 mg $H_2O$ sealed in the aluminum DSC pan. For each sequential exposure, the solid fuel maintained under argon was ignited in a sealed primary chamber, and ten seconds after the ignition, the product gas was allowed to flow into a secondary initially sealed chamber containing the KOH: KCl (1:1 wt %) getter that was also under argon.

The ignition product of the solid fuel comprising an explosive was investigated for the presence of hydrino as a product. XPS spectra were also recorded on internal KOH—KCl (1:1 wt %) getter exposed to gases from argon-atmospheric ignition of the solid fuel 50 mg $NH_4NO_3$+KOH+KCl (2:1:1 wt.)+15 mg $H_2O$ sealed in the aluminum DSC pan.

e. Results and Discussion

1. Ignition of $H_2O$-Based Solid Fuels with a Low Voltage, High Current and Plasma Duration Determination The control metal foil samples shown in Table 10 as well as a 0.010" diameter gold wire loop were loaded into the electrodes of the Acme 75 KVA welder that was activated to apply high current through each sample. Only resistive heating was observed for the metal foil and wire controls. Additional $H_2O$-based reaction mixtures that were not catalytic to form hydrinos and served as controls such as 185 mg In+30 mg $CaCl_2$+15 mg $H_2O$, 185 mg In+30 mg $ZnCl_2$+15 mg $H_2O$, 185 mg Bi+30 mg $ZnCl_2$+5 mg $H_2O$, and 185 mg Sn+30 mg $ZnCl_2$+5 mg $H_2O$ showed just resistive heating behavior as well. In contrast, all of the $H_2O$-based solid fuels underwent a detonation event with a loud blast, brilliant white light emission, and a pressure shock wave. The white light was characteristic of the blackbody emission temperature of about 5000 K confirmed spectroscopically. The sample appeared to have been completely vaporized and atomized to form an ionized, expanding plasma as evidenced by high-speed video using a Phantom v7.3 camera at 6500 frames per second (FIG. 5). The plasma was confirmed to be essentially 100% ionized by measuring the Stark broadening of the H Balmer α line. The photodiode-measured temporal duration of the blast event of exemplary solid fuel 100 mg Cu+30 mg $H_2O$ sealed in the DSC pan was 0.7 ms (FIG. 6).

In addition to HOH, m H atom catalyst was found to be effective by demonstrating a brilliant light-emitting plasma and blast during the ignition of hydrocarbon-based solid fuel paraffin wax in the DSC pan. As in the case of the $H_2O$-based solid fuels, blackbody radiation with a temperature of about 5000 K was observed also matching the solar spectrum. Using the fast photodiode, the ignition event was determined to be comprised of two distinct light-emissions-the first had duration of about 500 μs, and the duration of the second was about 750 μs.

2. calorimetry of Solid Fuel of the SF-CIHT Cell

Using the metal foils in Table 10, the heat capacity of the calorimeter and electrode apparatus used to measure the energy balance of solid fuel samples was determined to be 8017 J/° C. The calorimetry method used to determine the thermal output from the temperature versus time response following equilibration and ignition was the analytical method described in the operating manual of the Parr 1341 bomb calorimeter. The net energy is the difference between the thermal output and energy input. The gain is the ratio of the thermal energy and the energy input.

TABLE 10

Determination of the energy balance of solid fuels by bomb calorimetry.

| Sample Description[a] | Energy Input (J) | Thermal Output (J) | Net Energy (J) | Gain (X) |
|---|---|---|---|---|
| 44 mg Ag + 6 mg BaI2•2H2O, 3 mm pellet | 190.9 | 571.0 | 380.1 | 3.0 |
| 44 mg Ag + 6 mg BaI2•2H2O, 3 mm pellet | 143.5 | 451.8 | 308.4 | 3.1 |
| 44 mg Ag + 6 mg ZnCl2 hydrate, 3 mm pellet | 162.4 | 519.8 | 357.3 | 3.2 |
| 44 mg Ag + 6 mg ZnCl2 hydrate, 3 mm pellet | 309.5 | 618.3 | 308.7 | 2.0 |
| 39 mg Ag + 11 mg MgBr2•6H2O, 3 mm pellet | 289.5 | 535.9 | 246.4 | 1.9 |
| 44 mg Ag + 6 mg MgBr2•6H2O, 3 mm pellet | 193.7 | 427.0 | 233.3 | 2.2 |
| 39 mg Cu + 11 mg ZnCl2 hydrate, 3 mm pellet | 200.3 | 467.4 | 267.2 | 2.3 |
| 39 mg Cu + 11 mg ZnCl2 hydrate, 3 mm pellet | 232.3 | 522.6 | 290.3 | 2.2 |
| 44 mg Cu + 6 mg MgBr2•6H2O, 3 mm pellet | 154.1 | 264.6 | 110.5 | 1.7 |
| 44 mg Cu + 6 mg MgBr2•6H2O, 3 mm pellet | 220.3 | 340.8 | 120.5 | 1.5 |

TABLE 10-continued

Determination of the energy balance of solid fuels by bomb calorimetry.

| Sample Description[a] | Energy Input (J) | Thermal Output (J) | Net Energy (J) | Gain (X) |
|---|---|---|---|---|
| 148 mg Ag + 52 mg MgCl2•6H2O, 6 mm pellet | 237.9 | 505.6 | 267.6 | 2.1 |
| 148 mg Ag + 52 mg MgCl2•6H2O, 13 mm pellet | 191.8 | 501.8 | 310.0 | 2.6 |
| 80 mg Ti + 30 mg H2O | 244.9 | 1110.8 | 866.0 | 4.5 |
| 80 mg Ti + 30 mg H2O | 126.7 | 887.4 | 760.7 | 7.0 |
| 100 mg Cu + 30 mg H2O | 204.9 | 720.4 | 515.5 | 3.5 |
| 100 mg Cu + 30 mg H2O | 104.4 | 503.1 | 398.6 | 4.8 |
| 30 mg H2O | 293.4 | 771.8 | 478.3 | 2.6 |
| 45 mg Cu + 45 mg CuO + 30 mg H2O | 196.0 | 434.0 | 238.0 | 2.2 |
| 45 mg Cu + 45 mg CuO + 30 mg H2O | 203.4 | 454.1 | 250.7 | 2.2 |
| 370 mg Ti + 57 mg MgCl2•6H2O, 13 mm pellet | 427.7 | 802.6 | 374.9 | 1.9 |
| 75 mg Ti + 12 mg ZnCl2 + 12 mg H2O, powder in cap | 259.9 | 787.0 | 527.1 | 3.0 |
| 30 mg Paraffin Wax | 179.6 | 453.6 | 274.0 | 2.5 |
| 30 mg Paraffin Wax | 194.7 | 324.8 | 130.1 | 1.7 |
| 13 mg Nujol Oil | 266.8 | 534.4 | 267.6 | 2.0 |
| 30 mg Synthetic Oil 10W40 | 191.3 | 312.8 | 121.5 | 1.6 |
| 159 mg Ag + 34 mg NH4NO3 + 7 mg H2O, 6 mm pellet | 239.3 | 609.6 | 370.3 | 2.5 |
| 5 mg NH4NO3 + 1 mg H2O + 10 mg Al | 279.8 | 722.5 | 442.7 | 2.6 |
| 5 mg NH4NO3 | 238.7 | 425.8 | 187.1 | 1.8 |
| Setaram Aluminum Pan Control | 255.5 | 262.2 | 6.8 | 1.03 |
| 0.040" Tungsten Foil Resistive Control | 366.6 | 332.5 | −34.1 | 0.91 |
| 0.040" Tungsten Foil Resistive Control | 373.9 | 398.9 | 25.0 | 1.07 |
| 0.040" Tungsten Foil Resistive Control | 1055.0 | 1069.6 | 14.6 | 1.01 |
| 0.040" Tungsten Foil Resistive Control | 1086.0 | 1079.9 | −6.1 | 0.99 |

[a]Samples were sealed in the DSC pan except for pellet and foil samples.

As shown in Table 10, zero net energy balance was consistently measured on the control metal foils as well as the Al DSC pan. In contrast, very significant energy gains as high as 7× were observed for the $H_2O$-based solid fuel wherein HOH served as catalyst according to Eqs. (227-230). These values are very conservative in that the majority of the input energy was dissipated in the six joints of the calorimeter fuel ignition circuit with only about 20% of the input energy actually delivered to the fuel sample to cause it to ignite. The hierarchy of power production was $Ti+H_2O$ (DSC pan)>$Ti+ZnCl_2+H_2O$ (Cu cap)>$Cu+H_2O$ (DSC pan)> $H_2O$ (DSC pan)>$NH_4NO_3+H_2O+Al$>$Ti+MgCl_2.6H_2O$>$Ag+MgCl_2+H_2O$>$Cu+CuO+H_2O$ (DSC pan)>$NH_4NO_3$. Additionally, H-based solid fuels comprising oil or wax made some excess energy wherein nH served as the catalyst according to Eqs. (223-226). The H-based fuels have no theoretical energy since the reactions were run under an argon atmosphere.

The possibility that $H_2O$ may react exothermically with the Al of the DSC pan must be considered in cases where it was used to seal the solid fuel mixture. Consider the solid fuel $Cu+H_2O$ (DSC pan). As shown in Table 11, the reaction of Cu with water is highly endothermic. Specifically, the reaction $Cu+H_2O$ to $CuO+H_2$ has a positive enthalpy of +130 kJ/mole. Then, the only theoretical energy for conventional chemistry is the reaction of Al with water to form $Al_2O_3$. This reaction is known to have very slow kinetics. Production of $H_2$ gas from the Al-water reaction is difficult kinetically; consequently, other approaches such as $H_2O$ plasma are utilized to increase the rate. Even during the detonation of an explosive containing Al, the $H_2O$ oxidation of Al is a slow reaction. Since the ignition of the $H_2O$-based solid fuel has a duration of less than 1 ms for an inherently slow rate, very little $Al_2O_3$ would be expected to be formed. This is confirmed by XRD. The compositional analysis results of the XRD of the solid fuel product of a sample of 100 mg Cu mixed with 30 mg of deionized water sealed in a 75 mg Al DSC pan tested in an Ar atmosphere is shown in Table 12. No aluminum oxidation products were observed, thereby demonstrating that none of the output energy recorded by calorimetry is due to Al oxidation. Similarly, XRD on the product of solid fuel $Ti+H_2O$ showed no oxidation of Ti. Thus, the energy released for Cu and Ti, $H_2O$-based solid fuels was assigned to forming hydrinos. The identification of the hydrino product by multiple methods is given in Sec. e.3.

TABLE 11

Thermodynamic parameters of the reaction of Cu metal with $H_2O$ at 298K.

| | Cu + H2O(l) to CuO + H2 | T(K) = 298 | | | |
|---|---|---|---|---|---|
| | Cu | O2 | CuO | H2O | H2 |
| Stoichiometry | 1 | 0 | 1 | 1 | 1 |
| HoF @ 298K (kJ/mol) | 0.000 | 0.000 | −156.059 | −285.829 | 0.000 |
| ΔS @ 298K (J/molK) | 33.162 | 205.146 | 42.589 | 69.948 | 130.679 |
| ΔH | 0.000 | 0.000 | −156.059 | −285.829 | 0.000 |

TABLE 11-continued

Thermodynamic parameters of the reaction of Cu metal with $H_2O$ at 298K.

| Cu + H2O(l) to CuO + H2 | | T(K) = 298 | | | |
|---|---|---|---|---|---|
| | Cu | O2 | CuO | H2O | H2 |
| ΔG | −9.882 | 0.000 | −168.751 | −306.674 | −38.942 |
| ΔHrxn (kJ/mol) | 129.770 | | | | |
| ΔGrxn (kJ/mol) | 108.863 | | | | |
| n | 2 | | | | |
| E° (K) =~ | −0.564 | Volts | | | |

TABLE 12

Results of the XRD of the product of the ignition of the solid fuel 100 mg Cu + 30 mg of deionized water. The ignition was performed in an Ar atmosphere at copper electrodes. No $Al_2O_3$ was detected; thus, Al oxidation does not contribute to the energy balance.

| | |
|---|---|
| Cu | 20.4 ± 0.2 (>1,000 Å) |
| $CuAl_2$ | 24.6 ± 0.4 (958 Å) |
| $Cu_{31.3}Al_{18.20}$ | 15.1 ± 0.3 (578 Å) |
| $Cu_4Al$ | 2.1 ± 0.2 (>1,000 Å) |
| CuAl | 0.7 ± 0.1 (613 Å) |
| $Cu_{0.84}Al_{0.16}$ | 6.7 ± 0.3 (355 Å) |

TABLE 12-continued

Results of the XRD of the product of the ignition of the solid fuel 100 mg Cu + 30 mg of deionized water. The ignition was performed in an Ar atmosphere at copper electrodes. No $Al_2O_3$ was detected; thus, Al oxidation does not contribute to the energy balance.

| | |
|---|---|
| $CU_{5.75}Al_{4.5}$ | 4.5 ± 0.2 (>1,000 Å) |
| Al | 23.6 ± 0.4 (>1,000 Å) |
| $Cu_2O$ | 2.3 ± 0.2 (605 Å) |

A major portion of the input energy to ignite the solid fuels in Table 10 was attributed to the melting on the Al DSC pan that is not necessary. For example, a 1 $cm^2$ nickel screen conductor coated with a thin (<1 mm thick) tape cast coating of NiOOH, 11 wt % carbon, and 27 wt % Ni powder was detonated with a 5 J input energy. This solid fuel produced an extraordinary amount of EUV continuum energy yield as measured by EUV spectroscopy. Yet, NiOOH solid fuel is more difficult to regenerate in a continuous power cycle compared to M+$H_2O$ (M=Ti, Cu, Al) that only require adding back the $H_2O$. Rather than use an Al pan, simple pressed metal powders such as Ag+$MgCl_2$.6$H_2O$ that are regenerated by rehydration were tested. These too produced significant excess energy as shown in Table 10. Moreover, there is no theoretical energy from conventional chemistry, the reaction of Ag metal with $MgCl_2$.6$H_2O$, as shown in Table 13. The results of the XRD of the initial solid fuel and the product following the ignition are shown in Tables 14 and 15, respectively. No net positive energy contribution from conventional chemistry can be attributed to the reaction products. A similar analysis for the reactants Ti+$ZnCl_2$+$H_2O$ shows negligible energy from conventional chemistry.

TABLE 13

Thermodynamic parameters of the reaction of Ag metal with $MgCl_2 \cdot 6H_2O$ at 298 K.

| | 2Ag + $MgCl_2$ · 6H2O >> 2AgCl + MgO + H2 + 5H2O | | | T(K) = 298 | | |
|---|---|---|---|---|---|---|
| | Ag | MgCl2 · 6H2O | H2O | AgCl | MgO | H2 |
| Stoichiometry | 2 | 1 | 5 | 2 | 1 | 1 |
| HoF @ 298 K (kJ/mol) | 0 | −2499.01952 | −285.829 | −127.068 | −601.701 | 0 |
| ΔS @ 298 K (J/molK) | 42.677 | 366.1 | 69.948 | 96.232 | 26.941 | 130.679 |
| ΔH | 0 | −2499.01952 | −1429.15 | −254.136 | −601.701 | 0 |
| ΔG | −25.4355 | −2608.11732 | −1533.37 | −311.49 | −609.729 | −38.9423 |
| ΔHrxn (kJ/mol) | 214.0375 | | | | | |
| ΔGrxn (kJ/mol) | 140.0233 | | | | | |
| n | 2 | | | | | |
| E ° (K) = ~ | −0.7256 | Volts | | | | |

TABLE 14

Results of the XRD of the initial solid fuel powder pellet 150 mg Ag + 50 mg $MgCl_2$•6$H_2O$.

| | |
|---|---|
| $MgCl_2(H_2O)_6$ | 67.5% (>1,000 Å) |
| Ag | 31.4% (322 Å) |
| $MgCl_2$ | 1.1% (>1,000 Å) |

TABLE 15

The XRD results of the solid fuel ignition product of a sample of 150 mg Ag + 50 mg $MgCl_2$•6$H_2O$ tested in an Ar atmosphere showing expected conventional chemistry products that do not contribute positively to the net energy balance.

| | |
|---|---|
| $MgCl_2(H_2O)_6$ | 50.9% (>1,000 Å) |
| Ag | 37.2% (336 Å) |

TABLE 15-continued

| The XRD results of the solid fuel ignition product of a sample of 150 mg Ag + 50 mg $MgCl_2$•$6H_2O$ tested in an Ar atmosphere showing expected conventional chemistry products that do not contribute positively to the net energy balance. | |
|---|---|
| Cu | 11.4% (>1,000 Å) |
| AgCl | 0.5% (>1,000 Å) |

The solid fuel $NH_4NO_3$ is a well-known energetic material that does release energy upon thermal decomposition. The decomposition reaction of $NH_4NO_3$ to $N_2O$ and $H_2O$ calculated from the heats of formation is exothermic by ΔH=−124.4 kJ/mole $NH_4NO_3$:

$$NH_4NO_3 \rightarrow N_2O + 2H_2O \tag{231}$$

At elevated temperature, further decomposition occurs. The decomposition reaction energy of $NH_4NO_3$ to $N_2$, $O_2$, and $H_2O$ calculated from the heats of formation is exothermic by ΔH=−206 kJ/mole $NH_4NO_3$:

$$NH_4NO_3 \rightarrow N_2 + 1/2O_2 + 2H_2O \tag{232}$$

For 5 mg $NH_4NO_3$, the theoretical energy release is 12.8 J (Eq. (232)). Assuming slow kinetics for the oxidation of the Al metal pan, the experimental energy balance given in Table 10 is 442.7 J, 34.6 times the most exothermic conventional chemistry reaction given by Eq. (232). The additional energy is attributed to the formation of hydrinos. The high excessive energy balance was confirmed by replacing the conductive Al matrix with non-reactive Ag. The solid fuel 159 mg Ag+34 mg $NH_4NO_3$+7 mg $H_2O$, 6 mm pellet produced 370.3 J of net energy, 4.2 times the 88 J (Eq. (232)) maximum theoretical energy by conventional chemistry. The product $H_2(1/4)$ was observed spectroscopically as given in Sec. e.3. The extraordinary energy and hydrino product identification is very strong evidence that the mechanism of shock wave production in high explosives comprising a source of H and HOH such as those having the elemental composition CHNO is based on the extraordinary energy released by the formation of $H_2(1/4)$. This result has ramifications for an approach to exploiting the hydrino mechanism of the shock wave of energetic materials to enhance this property as discussed in Sec. e.3. As given in Sec. e.1, all of the $H_2O$-based solid fuels ignited and produced a shock wave behaving as energetic materials with the exception that essentially all the power was in the form of visible radiation rather than pressure-volume. The powers and power densities were extraordinary.

The power and power density of the solid fuels can be determined from the energy released by the reaction given in Table 10, the duration of the release, and the volume of the fuel. Consider the 866.0 J from 80 mg Ti+30 mg $H_2O$ with a typical duration 0.7 ms as shown in FIG. 6. Then, the power is 1.24 MW. Given the fuel volume of 30 μl, the corresponding power density is 41 GW/l. It was observed that the length of the duration of the power generation based on the half-width of the light emission peak could be varied in the range of 2 ms to 100 μs by adjusting the pressure applied to the solid fuel sample by the confining electrodes, the nature of the solid fuel composition, and the waveform of the high current flow through the solid fuel. Thus, the power and power density may be controlled in the range of 0.433 MW to 8.66 MW and 14.4 GW/l to 289 GW/l, respectively.

In addition to HOH, m H atom catalyst was tested as evidenced by the observation of thermal energy from a solid fuel comprising a highly conductive material and a source of hydrogen such as a hydrocarbon as shown in Table 10. Since calorimetry was run under an argon atmosphere, no conventional exothermic chemistry was possible. The energy release of over 100 J was significant and confirmatory of m H serving as a catalyst to form hydrinos. Moreover, ignition of a hydrocarbon-based solid fuel may produce some matching conditions as those that exist on the surface of the Sun and stars such as white dwarf stars, essentially liquid density of H atoms of a blackbody radiator at 5500-6000 K. So, the kinetics of hydrino formation should be appreciable with the high densities of H formed in the ignition plasma with the presence of the arc current condition. The effectiveness of the m H atom catalyst to form hydrinos under the solid fuel ignition plasma conditions was confirmed by the observation of EUV radiation and 5500-6000K blackbody radiation from the ignition of hydrocarbon-based solid fuels.

3. Spectroscopic Identification of Molecular Hydrino

Figure 7:
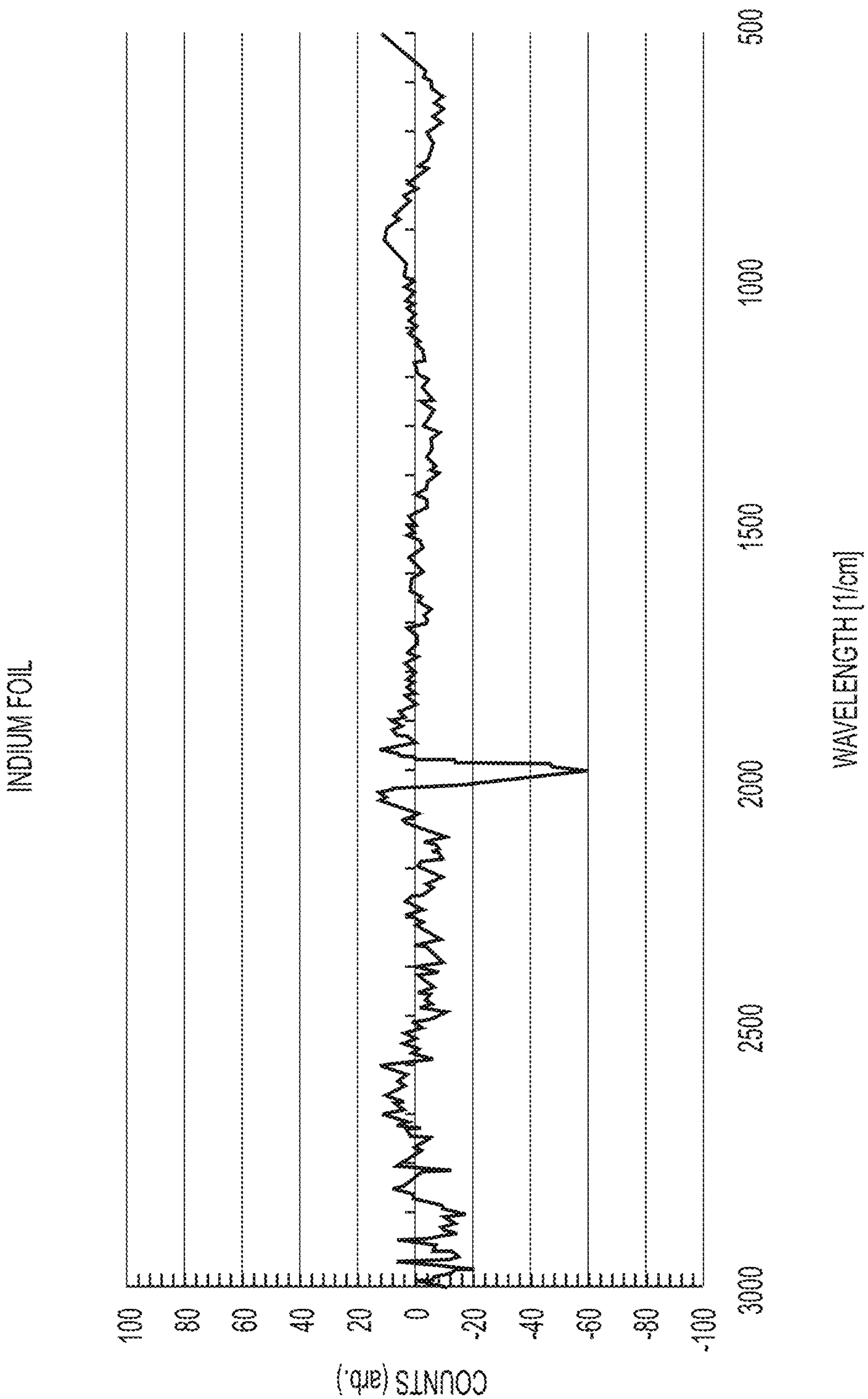
FIG. 7 shows the Raman spectrum obtained on a In metal foil exposed to the product gas from a series of solid fuel ignitions under argon, each comprising 100 mg of Cu mixed with 30 mg of deionized water. Using the Thermo Scientific DXR SmartRaman spectrometer and the 780 nm laser, the spectrum showed an inverse Raman effect peak at 1982 $cm^{-1}$ that matches the free rotor energy of $H_2(1/4)$ (0.2414 eV) to four significant figures.

The predicted hydrino product $H_2(1/4)$ was identified by Raman spectroscopy and XPS. Using a Thermo Scientific DXR SmartRaman with a 780 nm diode laser, an absorption peak at 1982 $cm^{-1}$ having a width of 40 $cm^{-1}$ was observed (FIG. 7) on the indium metal foil that was exposed to the product gas following the ignition of a series of 50 ignitions of solid fuel pellets. Each pellet comprised 100 mg Cu+30 mg deionized water sealed in the DSC pan. The only possible elements to consider as the source were In and O. Permutations of controls did not reproduce the peak, only samples exposed to the gas showed the absorption peak. Since no other element or compound is known that can absorb a single 40 $cm^{-1}$ (0.005 eV) near infrared line at 1.33 eV (the energy of the 780 nm laser minus 2000 $cm^{-1}$) $H_2(1/4)$ was considered. The absorption peak starting at 1950 $cm^2$ matched the free space rotational energy of $H_2(1/4)$ (0.2414 eV) to four significant figures, and the width of 40 $cm^2$ matches the orbital-nuclear coupling energy splitting. The absorption was assigned to an inverse Raman effect (IRE) peak for the $H_2(1/4)$ rotational energy for the J'=1 to J"=0 transition.

Figure 8:
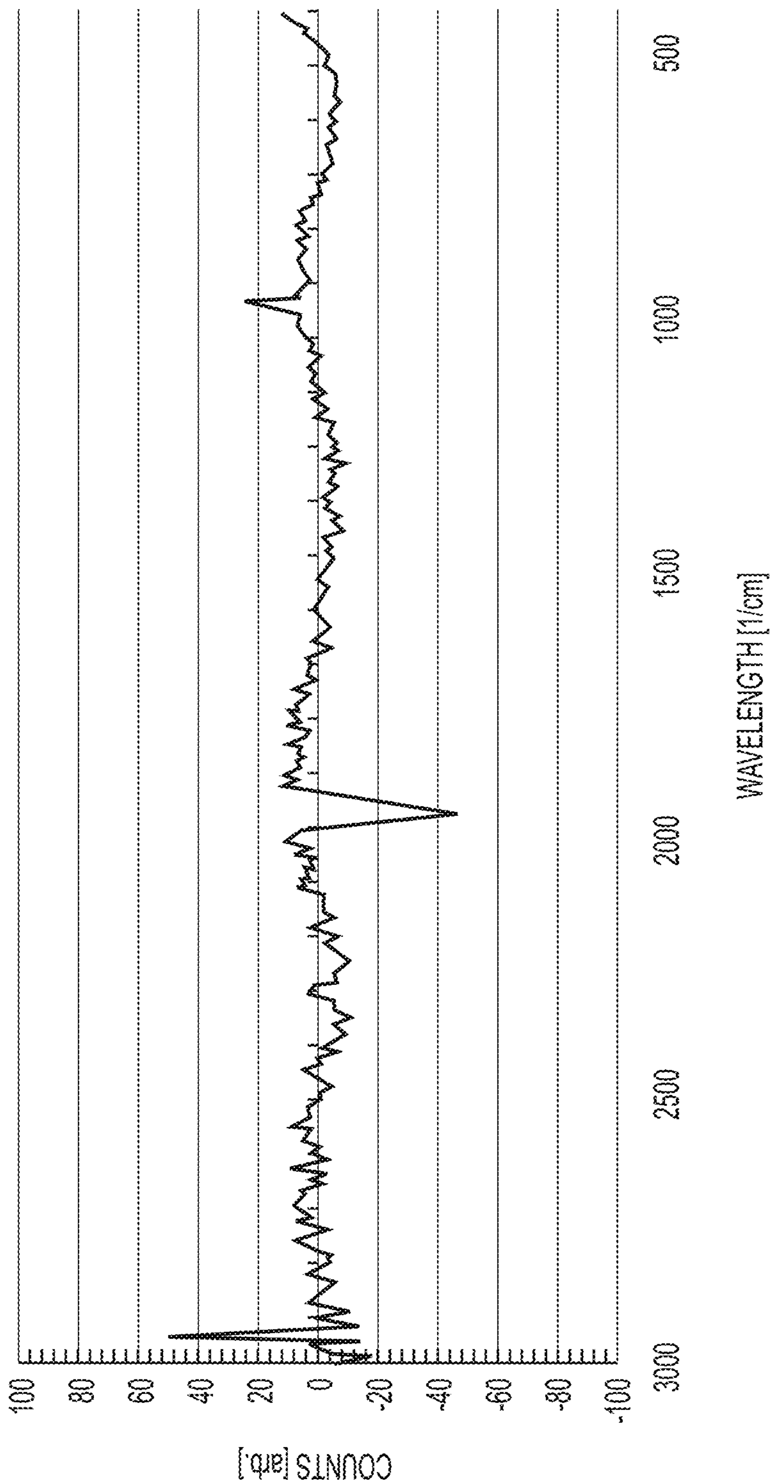
FIG. 8 shows the Raman spectrum recorded on the In metal foil exposed to the product gas from the argon-atmosphere ignition of 50 mg of $NH_4NO_3$ sealed in the DSC pan. Using the Thermo Scientific DXR SmartRaman spectrometer and the 780 nm laser the spectrum showed the $H_2(1/4)$ inverse Raman effect peak at 1988 $cm^{-1}$.

The ro-vibrational emission (so called 260 nm band) of $H_2(1/4)$ trapped in the crystalline lattice of KCl getters was excited by an incident 6 keV electron beam, and the excitation emission spectrum was recorded by windowless UV spectroscopy on the KCl getter from a sealed reactor of the gun powder reaction, $KNO_3$ with softwood charcoal having the formulation $C_7H_4O$. The UV spectrum showed the 260 nm band comprising the peaks Q(0), R(0), R(1), R(2), P(1), P(2), P(3), and P(4) of $H_2(1/4)$ at an integer spacing of $p^2$ that of $H_2$, ($p^2$ 0.01509 eV=0.249 eV with p=4). The hydrino reaction produces 200 times the energy of the conventional chemistry of high explosives that have CHNO structures favorable for forming HOH and H (Eqs. (227-230)), and the production of hydrino $H_2(1/4)$ by the energetic material gun powder was observed. Therefore, it is reasonable to investigate whether the hydrino reaction is the mechanism for the unique formation of a shock wave by energetic materials. Certain characteristic and identifying signatures would be expected. An extraordinary power and energy balance is predicted by applying a high current to an energetic material since this mechanism increased the kinetics of the hydrino reaction of solid fuels. As shown in Table 10, $NH_4NO_3$ produced multiples of the possible thermal energy under high-current ignition; wherein ignition uncharacteristically occurred with minute quantities (5 mg) and without a detonator. Hydrino products of this energetic material where sought. The Raman spectra obtained on the In metal foil exposed to the argon-atmosphere ignition of 50 mg of $NH_4NO_3$ sealed in the DSC pan was recorded using the Thermo Scientific DXR SmartRaman spectrometer and the 780 nm laser. An inverse Raman effect absorption peak was observed at 1988 $cm^{-1}$ (FIG. 8) that matches the free rotor energy of $H_2(1/4)$ (0.2414 eV) to four significant figures. Overwhelming evidence is the observation of soft X-ray emission from the $NH_4NO_3$ ignition. Indeed, 125 J of soft X-ray energy was emitted from 5 mg of $NH_4NO_3$ ignited in a vacuum chamber and allowed to expand such that the resulting plasma was optically thin for such emission. This energy component exceeds the maximum theoretical from the direct conventional $NH_4NO_3$ reaction of 12.8 J (Eq. (232)) by a factor of 10. Thus, the dominant source of energy release from this energetic material under these conditions is the formation of $H_2(1/4)$. The implications are that the distinguishing aspect of high explosives that gives rise to a shock wave is not extraordinary conventional chemistry kinetics; rather it is the 200 times higher energy release in the formation of hydrinos. Since H has less than 10 times the mass of CHNO compositions, 2000 times more energy per mass with more effective shock wave yield is feasible with optimization of the hydrino mechanism.

Molecular hydrino $H_2(1/p)$ such as $H_2(1/4)$ may be at least one of absorbed and trapped in a matrix such as a composite of inorganic compounds such as one comprising halide and one comprising oxygen. The cations of the plurality of compounds may be one of alkali, alkaline earth, transition, inner transition, and rare earth metals and metalloids. The oxygen species may comprise an oxy-anion such as hydroxide, carbonate, hydrogen carbonate, phosphate, hydrogen phosphate, dihydrogen phosphate, sulfate, hydrogen sulfate, borate, metaborate, silicate, arsenate, and other oxyanions of the disclosure. The composite may be formed by at least one of mechanical processing and heating. The mechanical processing may comprise ball milling. The composite may comprise lattice defects such as inclusions, vacancies, and lattices mismatches that permit the molecular hydrino to be at least one of absorbed and trapped in the matrix. Suitable exemplary composites formed by at least one of ball milling and heating are KCl—KOH and KCl—$K_3PO_4$. The ratios may be any desired such as about one to one weight percent or about one to one mole percent.

Figure 9:
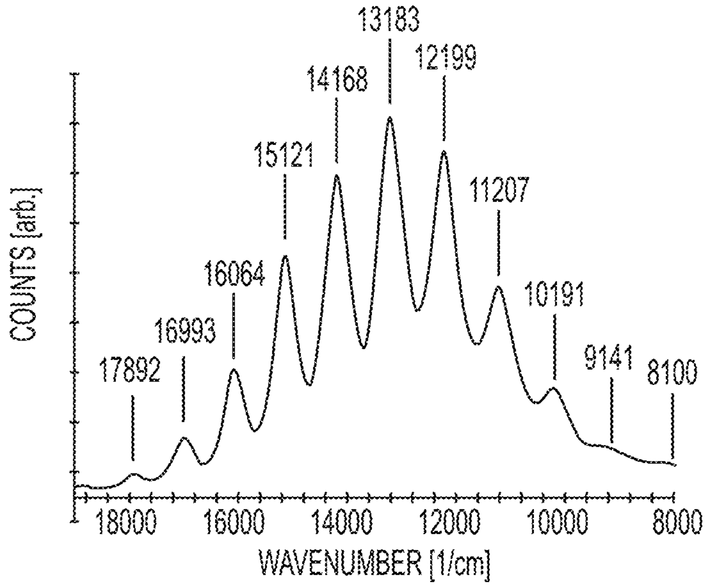
FIG. 9 shows the Raman-mode second-order photoluminescence spectrum of the KOH—KCl (1:1 wt %) getter exposed to the product gases of the ignition of solid fuel samples of 100 mg Cu with 30 mg deionized water sealed in the DSC pan using a Horiba Jobin Yvon LabRam ARAMIS 325 nm laser with a 1200 grating over a range of 8000-19,000 $cm^{-1}$ Raman shift.
Figure 10:
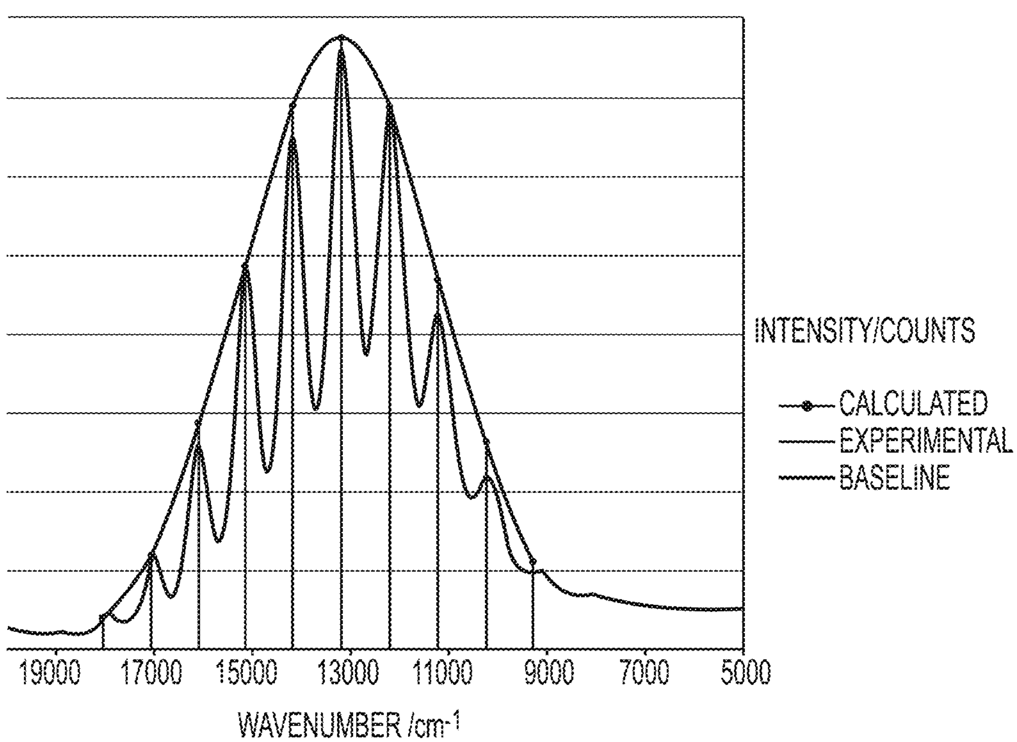
FIG. 10 shows a plot comparison between the theoretical energies and assignments given in Table 16 with the observed Raman spectrum.

Another successful cross-confirmatory technique in the search for hydrino spectra involved the use of the Raman spectrometer to record the ro-vibration of $H_2(1/4)$ as second order fluorescence matching the observed first order spectrum in the ultraviolet, the 260 nm e-beam band. The Raman spectrum of the KOH:KCl (1:1 wt %) getter of the product gas from 50 sequential argon-atmosphere ignitions of solid fuel pellets, each comprising 100 mg Cu+30 mg deionized water sealed the DSC pan, was recorded using the Horiba Jobin Yvon LabRAM Aramis Raman spectrometer with a HeCd 325 nm laser in microscope mode with a magnification of 40×. No features were observed in the starting material getter. Heating the getter which comprised a hydroxide-halide solid fuel resulted in a low intensity series of 1000 $cm^{-1}$ (0.1234 eV) equal-energy spaced Raman peaks observed in the 8000 $cm^{-1}$ to 18,000 $cm^{-1}$ region. An intense, over an order of magnitude, increase in the series of peaks was observed upon exposure to the ignition product gas. The conversion of the Raman spectrum into the fluorescence or photoluminescence spectrum revealed a match as the second order ro-vibrational spectrum of $H_2(1/4)$ corresponding to the 260 nm band first observed by e-beam excitation. Assigning Q(0) to the most intense peak, the peak assignments given in Table 16 to the Q, R, and P branches for the spectra shown in FIG. 9 are Q(0), R(0), R(1), R(2), R(3), R(4), P(1), P(2), P(3), P(4), and P(5) observed at 13,183, 12,199, 11,207, 10,191, 9141, 8100, 14,168, 15,121, 16,064, 16,993, and 17,892 $cm^{-1}$, respectively. The theoretical transition energies with peak assignments compared with the observed Raman spectrum are shown in Table 16 and FIG. 10. Additional solid fuels 80 mg Ti+30 mg $H_2O$ and 100 mg Ti+50 mg Al+30 mg $ZnCl_2$+15 mg $H_2O$ were tested as powders with hydrino getter KOH:KCl (1:1 wt %) that was not heated. The unheated KOH:KCl (1:1 wt %) control did not show the $H_2(1/4)$ ro-vibrational series of peaks, but the solid fuels Ti+$H_2O$ and Ti+Al+$ZnCl_2$+$H_2O$ showed the same spectral feature as shown in FIGS. 9 and 10 with the intensity greater for the latter fuel powder.

TABLE 16

Comparison of the theoretical transition energies and transition assignments with the observed Raman peaks.

| Assignment | Calculated ($cm^{-1}$) | Experimental ($cm^{-1}$) | Difference (%) |
|---|---|---|---|
| P(5) | 18,055 | 17,892 | 0.91 |
| P(4) | 17,081 | 16,993 | 0.52 |
| P(3) | 16,107 | 16,064 | 0.27 |
| P(2) | 15,134 | 15,121 | 0.08 |
| P(1) | 14,160 | 14,168 | −0.06 |
| Q(0) | 13,186 | 13,183 | 0.02 |
| R(0) | 12,212 | 12,199 | 0.11 |
| R(1) | 11,239 | 11,207 | 0.28 |
| R(2) | 10,265 | 10,191 | 0.73 |
| R(3) | 9,291 | 9,141 | 1.65 |
| R(4) | 8,318 | 8,100 | 2.69 |

The excitation was deemed to be by the high-energy UV and EUV He and Cd emission of the laser wherein the laser optics are transparent to at least 170 nm and the grating (Labram Aramis 2400 g/mm 460 mm focal length system with 1024×26 $\mu m^2$ pixels CCD) is dispersive and has its maximum efficiency at the shorter wavelength side of the spectral range, the same range as the 260 nm band. For example, cadmium has a very intense line at 214.4 nm (5.8 eV) that matches the ro-vibrational excitation energy of $H_2(1/4)$ in KCl matrix based on the e-beam excitation data. The CCD is also most responsive at 500 nm, the region of the second order of the 260 nm band centered at 520 nm.

Overall, the Raman results such as the observation of the 0.241 eV (1940 $cm^{-1}$) Raman inverse Raman effect peak and the 0.2414 eV-spaced Raman photoluminescence band that matched the 260 nm e-beam spectrum is strong confirmation of molecular hydrino having an internuclear distance that is ¼ that of $H_2$. The evidence in the latter case is further substantiated by being in a region having no known first order peaks or possible assignment of matrix peaks at four significant figure agreement with theoretical predictions. Similar results were obtained with KCl—$K_3PO_4$ (1:1 wt %) getter. These characteristic ro-vibration signatures of $H_2(1/4)$ match those observed on thermal and electrochemical cells.

Figure 11A:
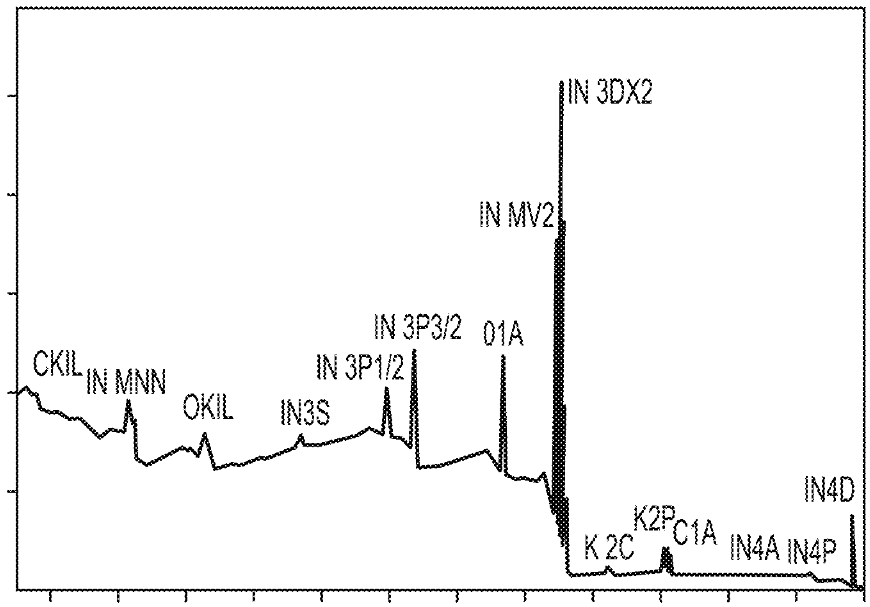
FIGS. 11A-B show the XPS spectra recorded on the indium metal foil exposed to gases from sequential argon-atmosphere ignitions of the solid fuel 100 mg Cu+30 mg deionized water sealed in the DSC pan. (A) A survey spectrum showing only the elements In, C, O, and trace K peaks were present. (B) High-resolution spectrum showing a peak at 498.5 eV assigned to $H_2(1/4)$ wherein other possibilities were eliminated based on the absence of any other corresponding primary element peaks.
Figure 11B:
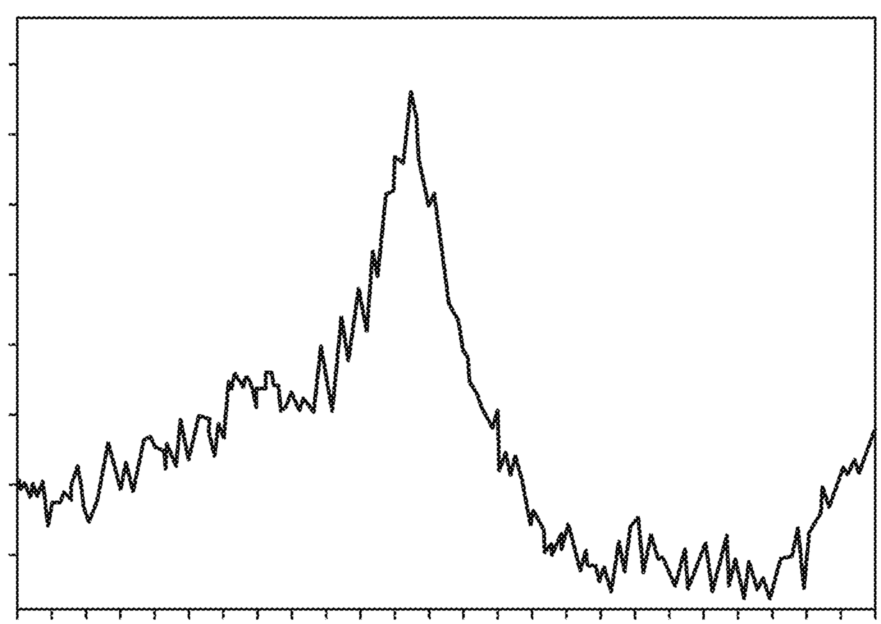

Using a Scienta 300 XPS spectrometer, XPS was performed at Lehigh University on the indium metal foil that showed a strong 1982 $cm^{-1}$ IRE peak following exposure to the gases from the series ignition of the solid fuel pellets, each comprising 100 mg Cu+30 mg deionized water sealed in the DSC pan. A strong peak was observed at 498.5 eV (FIG. 11) that could not be assigned to any known elements. Na, Sn, and Zn being the only possibilities were easy to eliminate based on the absence of any other corresponding peaks of these elements since only In, C, O, and trace K peaks were observed. The peak matched the energy of the theoretically allowed double ionization of molecular hydrino $H_2(1/4)$. This result confirms the molecular hydrino assignment by Raman spectroscopy, the inverse Raman effect absorption peak centered at 1982 $cm^{-1}$.

Figure 12A:
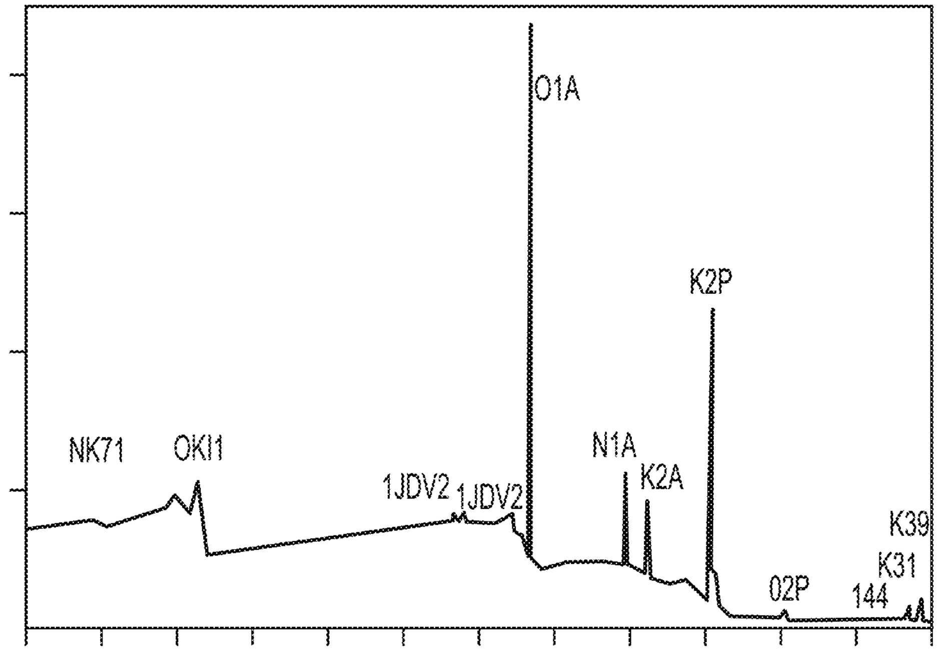
FIGS. 12A-B show XPS spectra recorded on KOH—KCl (1:1 wt %) getter exposed to gases from sequential argon-atmosphere ignitions of the solid fuel 85 mg of Ti mixed with 30 mg of deionized water sealed in the DSC pan. (A) A survey spectrum showing only the elements K, C, O, N, and trace I peaks were present. (B) High-resolution spectrum showing a peak at 496 eV assigned to $H_2(1/4)$ wherein other possibilities were eliminated based on the absence of any other corresponding primary element peaks.
Figure 12B:
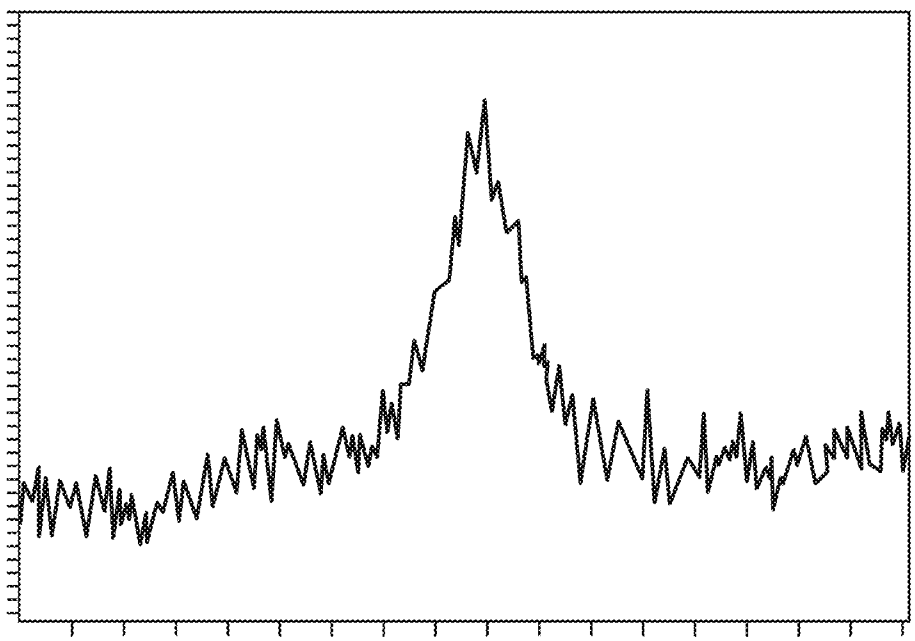

Using the Lehigh University Scienta 300 XPS spectrometer, XPS spectra were also recorded on the KOH—KCl (1:1 wt %) getter sequentially exposed to gases from three ignitions of the solid fuel 70 mg Ti+30 mg $H_2O$ sealed in the aluminum DSC pan. A strong peak was observed at 496 eV (FIG. 12) that was assigned to $H_2(1/4)$ since only K, C, O, N, and trace I peaks were observed. None of these elements have a peak in the region of interest and elements that have a peak in the region of 496 eV were not present based on the absence of any other corresponding primary element peaks.

Figure 13A:
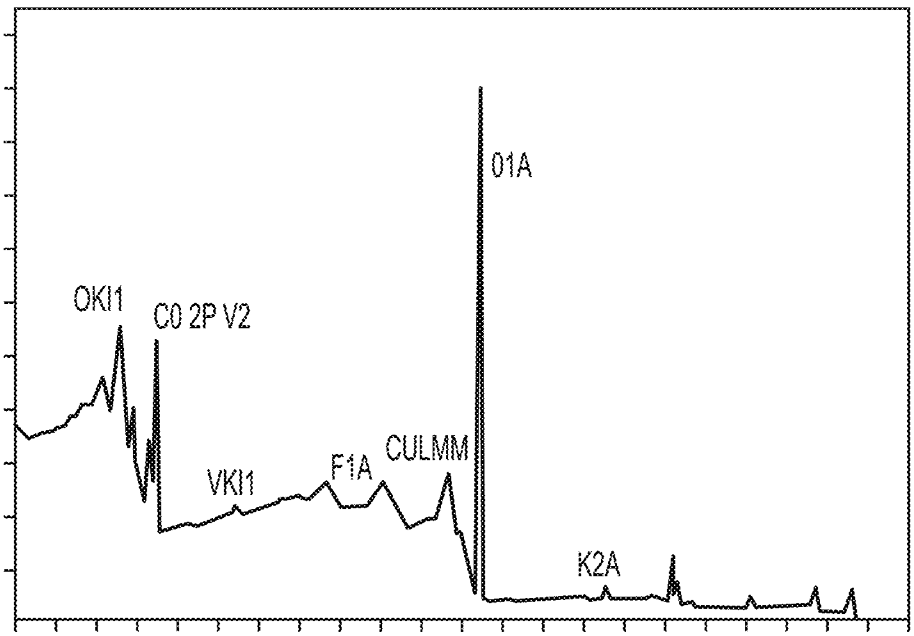
FIGS. 13A-B show XPS spectra recorded on internal KOH—KCl (1:1 wt %) getter exposed to gases argon-atmospheric ignition of the solid fuel 50 mg $NH_4NO_3$+KOH+KCl (2:1:1 wt.)+15 mg $H_2O$ sealed in the aluminum DSC pan. (A) A survey spectrum showing only the elements K, Cu, Cl, Si, Al, C, O, and trace F peaks were present. (B) High-resolution spectrum showing a peak at 496 eV assigned to $H_2(1/4)$ wherein other possibilities were eliminated based on the absence of any other corresponding primary element peaks.
Figure 13B:
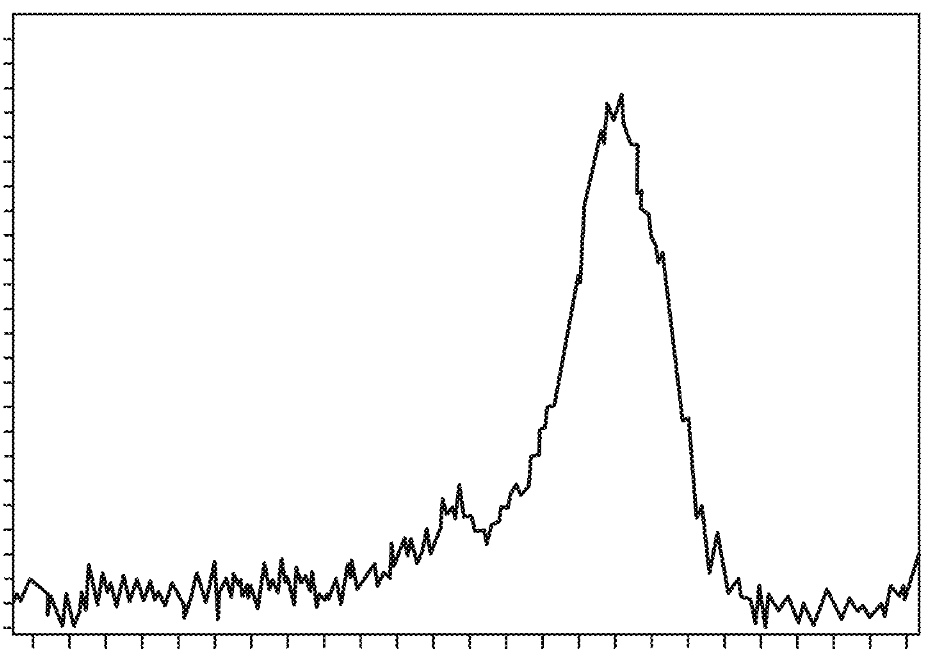

Using the Lehigh University Scienta 300 XPS spectrometer, XPS spectra were also recorded on internal KOH—KCl (1:1 wt %) getter exposed to gases from argon-atmospheric ignition of the solid fuel 50 mg $NH_4NO_3$+KOH+KCl (2:1:1 wt.)+15 mg $H_2O$ sealed in the aluminum DSC pan. A strong peak was observed at 496 eV (FIG. 13) that was assigned to $H_2(1/4)$ since only K, Cu, Cl, Si, Al, C, O, and trace F peaks were observed. None of these elements have a peak in the region of interest and elements that have a peak in the region of 496 eV were not present based on the absence of any other corresponding primary element peaks.

K. Mechanism of Soft X-Ray Continuum Radiation from Low-Energy Pinch Discharges of Hydrogen and Ultra-Low Field Ignition of Solid Fuels a. Catalyst Reactions of the Embodiment to Emit Continuum EUV Radiation Atomic hydrogen is predicted to form fractional Rydberg energy states H (1/p) called "hydrino atoms" wherein $$n = \frac{1}{2}, \frac{1}{3}, \frac{1}{4}, \ldots, \frac{1}{p}$$

(p≤137 is an integer) replaces the well-known parameter n=integer in the Rydberg equation for hydrogen excited states. The transition of H to a stable hydrino state $$H\left[\frac{a_H}{p = m+1}\right]$$

having a binding energy of $p^2 \cdot 13.6$ eV occurs by a nonradiative resonance energy transfer of m·27.2 eV (m is an integer) to a matched energy acceptor. By the same mechanism, the nascent $H_2O$ molecule (not hydrogen bonded in solid, liquid, or gaseous state) may serve as a catalyst by accepting 81.6 eV (m=3) to form an intermediate that decays with the emission of a continuum band with a short wavelength cutoff of 10.1 nm and energy of 122.4 eV. The continuum radiation band at 10.1 nm and going to longer wavelengths for theoretically predicted transitions of H to lower-energy, so called "hydrino" state H(¼), was observed only arising from pulsed pinch gas discharges comprising some hydrogen first at BlackLight Power, Inc. (BLP) and reproduced at the Harvard Center for Astrophysics (CfA) by P. Cheimets and P. Daigneau.

Under a study contracted by GEN3 Partners, spectra of high current pinch discharges in pure hydrogen and helium were recorded in the EUV region at the Harvard Smithsonian Center for Astrophysics (CfA) in an attempt to reproduce experimental results published by BlackLight Power, Inc. (BLP) showing predicted continuum radiation due to hydrogen in the 10-30 nm region. Alternative explanations were considered to the claimed interpretation of the continuum radiation as being that emitted during transitions of H to lower-energy states (hydrinos). Continuum radiation was observed at CfA in the 10-30 nm region that matched BLP's results. Considering the low energy of 5.2 J per pulse, the observed radiation in the energy range of about 120 eV to 40 eV, reference experiments and analysis of plasma gases, cryofiltration to remove contaminants, and spectra of the electrode metal, no conventional explanation was found to be plausible including contaminants, thermal electrode metal emission regarding electron temperature, and Bremsstrahlung, ion recombination, molecular or molecular ion band radiation, and instrument artifacts involving radicals and energetic ions reacting at the CCD and $H_2$ re-radiation at the detector chamber. Moreover, predicted selective extraordinarily high-kinetic energy H was observed by the corresponding Doppler broadening of the Balmer α line.

After the energy transfer to the catalyst (Eqs. (223) and (227)), an intermediate $$H*\left[\frac{a_H}{m+1}\right]$$

is formed having the radius of the H atom and a central field of m+1 times the central field of a proton. The radius is predicted to decrease as the electron undergoes radial acceleration to a stable state having a radius of 1/(m+1) the radius of the uncatalyzed hydrogen atom, with the release of $m^2 \cdot 13.6$ eV of energy. The extreme-ultraviolet continuum radiation band due to the $$H*\left[\frac{a_H}{m+1}\right]$$

intermediate (e.g. Eq. (224) and Eq. (228)) is predicted to have a short wavelength cutoff and energy $$E_{\left(H \to H\left[\frac{a_H}{p=m+1}\right]\right)}$$

given by $$E_{\left(H \to H\left[\frac{a_H}{p=m+1}\right]\right)} = m^2 \cdot 13.6 \text{ eV}; \tag{233}$$

$$\lambda_{\left(H \to H\left[\frac{a_H}{p=m+1}\right]\right)} = \frac{91.2}{m^2} \text{ nm}$$

and extending to longer wavelengths than the corresponding cutoff. Here the extreme-ultraviolet continuum radiation band due to the decay of the $H^*[a_H/4]$ intermediate is predicted to have a short wavelength cutoff at $E=m^2 \cdot 13.6=9 \cdot 13.6=122.4$ eV (10.1 nm) [where p=m+1=4 and m=3 in Eq. (5)] and extending to longer wavelengths. The continuum radiation band at 10.1 nm and going to longer wavelengths for the theoretically predicted transition of H to lower-energy, so called "hydrino" state H(¼), was observed only arising from pulsed pinch gas discharges comprising some hydrogen. Another observation predicted by Eqs. (223) and (227) is the formation of fast, excited state H atoms from recombination of fast $H^+$. The fast atoms give rise to broadened Balmer α emission. Greater than 50 eV Balmer α line broadening that reveals a population of extraordinarily high-kinetic-energy hydrogen atoms in certain mixed hydrogen plasmas is a well-established phenomenon; however, the mechanism has been controversial in that the conventional view that it is due to field acceleration is not supported by the data and critical tests. Rather it is shown that the cause is due to the energy released in the formation of hydrinos. Fast H was observed in continuum-emitting hydrogen pinch plasmas.

Two possible catalysts, m H and HOH, could be the source of the band observed in the 10 to 30 nm region. Both species were present. Hydrogen as an added plasma gas was confirmed by the Balmer visible spectral lines, and oxygen from the electrodes was identifiable by characteristic oxygen ion lines wherein the oxygen reacted with H to form HOH at the electrode surface. To test whether HOH is the dominant catalyst, the spectra were recorded of pulsed pinch hydrogen discharges maintained with metal electrodes that each formed an oxide coat that is thermodynamically unreactive to H reduction. These results were compared with the prior results of the observation of the continuum band only arising from pulsed pinch hydrogen-containing discharges with electrodes each having a metal oxide coat that is thermodynamically favorable to undergo H reduction to form HOH catalyst.

Continuum radiation in the 10 to 30 nm region that matched predicted transitions of H to hydrino state H(¼), was observed only arising from pulsed pinch hydrogen-containing discharges with metal oxides that are thermodynamically favorable to undergo H reduction to form HOH catalyst; whereas, those that are unfavorable did not show any continuum even though the low-melting point metals tested are very favorable to forming metal ion plasmas with strong short-wavelength continua in more powerful plasma sources. Of the two possible catalysts, m H and HOH, the latter is more likely based on the behavior with oxide-coated electrodes and the expectation that the intensities of the transitions of H to H(1/(m+1)) show a profile of H(½) with $\lambda \geq 91.2$ nm>H to H(⅓) with $\lambda \geq 22.8$ nm>H to H(¼) with $\lambda \geq 10.1$ nm due to the lower cross section for n-body collisions with n being 2, 3, and 4, respectively. The HOH catalyst was further shown to give EUV radiation of the same nature by igniting a solid fuel source of H and HOH catalyst by passing a low voltage, high current through the fuel to produce explosive plasma.

The kinetics of catalysis of H to H(¼) by HOH catalyst was observed to be explosive when a high current such as 10,000-25,000 A was flowed through a solid fuel comprising a source of H and HOH embedded in a highly conductive matrix. The resulting brilliant light-emitting expanding plasma was predicted to emit EUV continuum radiation according to Eq. (233) when it was expanded into a vacuum chamber such that its atmospheric pressure was dissipated sufficiently to overcome the optical thickness. Such a light source at once overcame any alternative mechanism of the EUV continuum emission such as being due to a high electric field creating highly-charged ions since the voltage of the ignition current source had an AC peak voltage of under 15 V. Moreover, chemical reactions are not capable of a more than a few eVs; whereas, the continuum radiation was over 70 eV (estimated over 100 eV with shorter wavelengths cutoff by an Al filter). Due to the optical thickness of elements in the plasma, ion emission lines were observed as expected on a continuum radiation background due to continuum absorption and reemission as spectral lines. The same mechanism applies to H pinch plasma emission. In addition to HOH, as predicted, m H atoms acting as a catalyst was evidenced by the observation of EUV radiation from a solid fuel comprising a highly conductive material and a source of hydrogen such as a hydrocarbon through which a low voltage, high current was flowed.

Moreover, m H catalyst having the most probable transition of H to H(½) was shown active in astrophysical sources. Specifically, multi-body collision reactions of H with another serve as a catalyst to form H(1/p) in stars, the Sun, and interstellar medium, all having large amounts of atomic H. Favorable conditions for H—H collisions are a very dense population of atomic H such as in the Sun and stars. The discovery of high-energy continuum radiation from hydrogen as it forms a more stable form has astrophysical implications such as hydrino being a candidate for the identity of dark matter and the corresponding emission being the source of high-energy celestial and stellar continuum radiation. For example, white-dwarf EUV continuum spectra match the profile of the hydrogen pinch plasma.

b. Experimental Method

1. EUV Pinch Plasma Spectra

Figure 14:
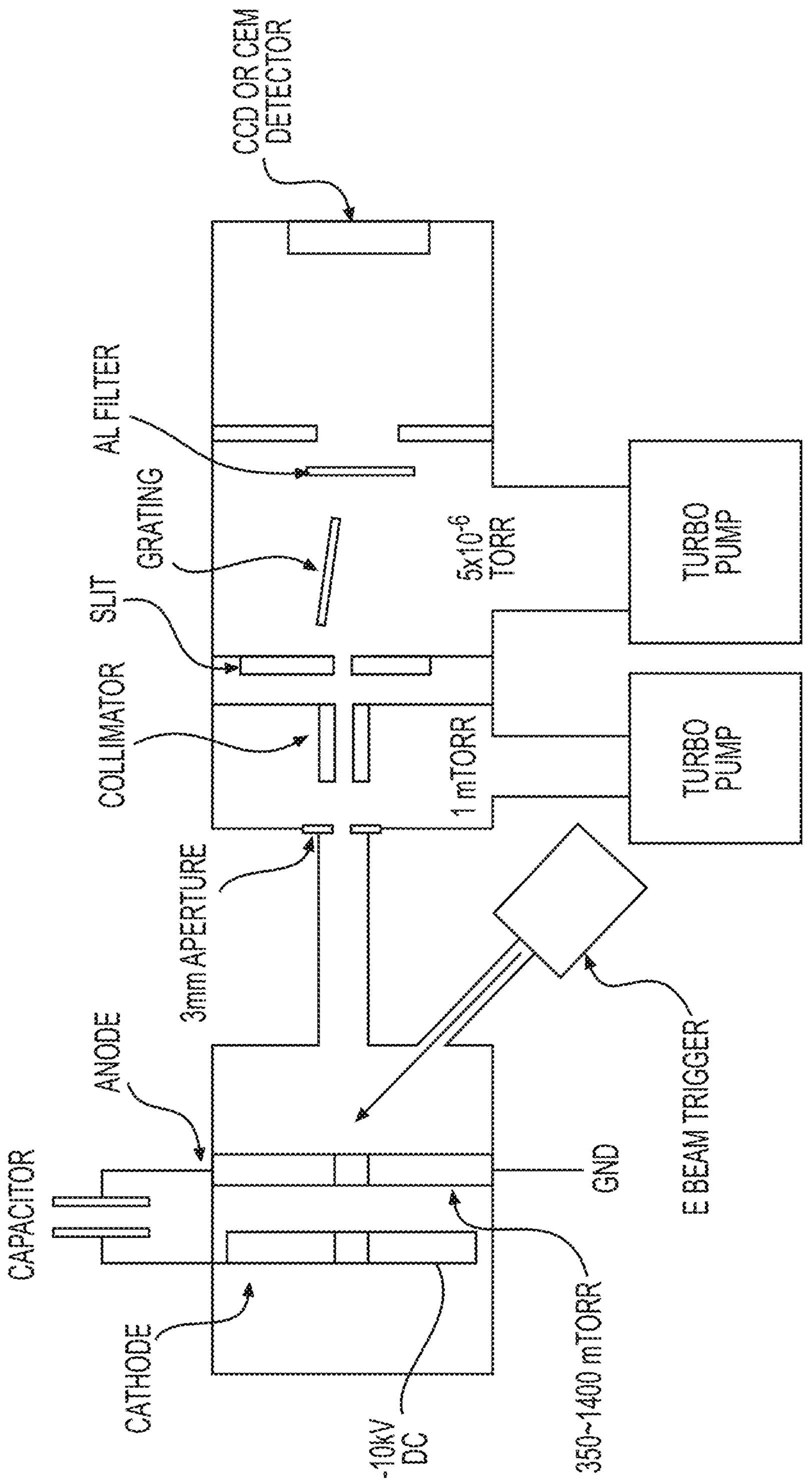
FIG. 14 is the experimental setup for the high voltage pulsed discharge cell. The source emits its light spectra through an entrance aperture passing through a slit, with the spectra dispersed off a grazing-incidence grating onto a CCD detection system.
Figure 15:
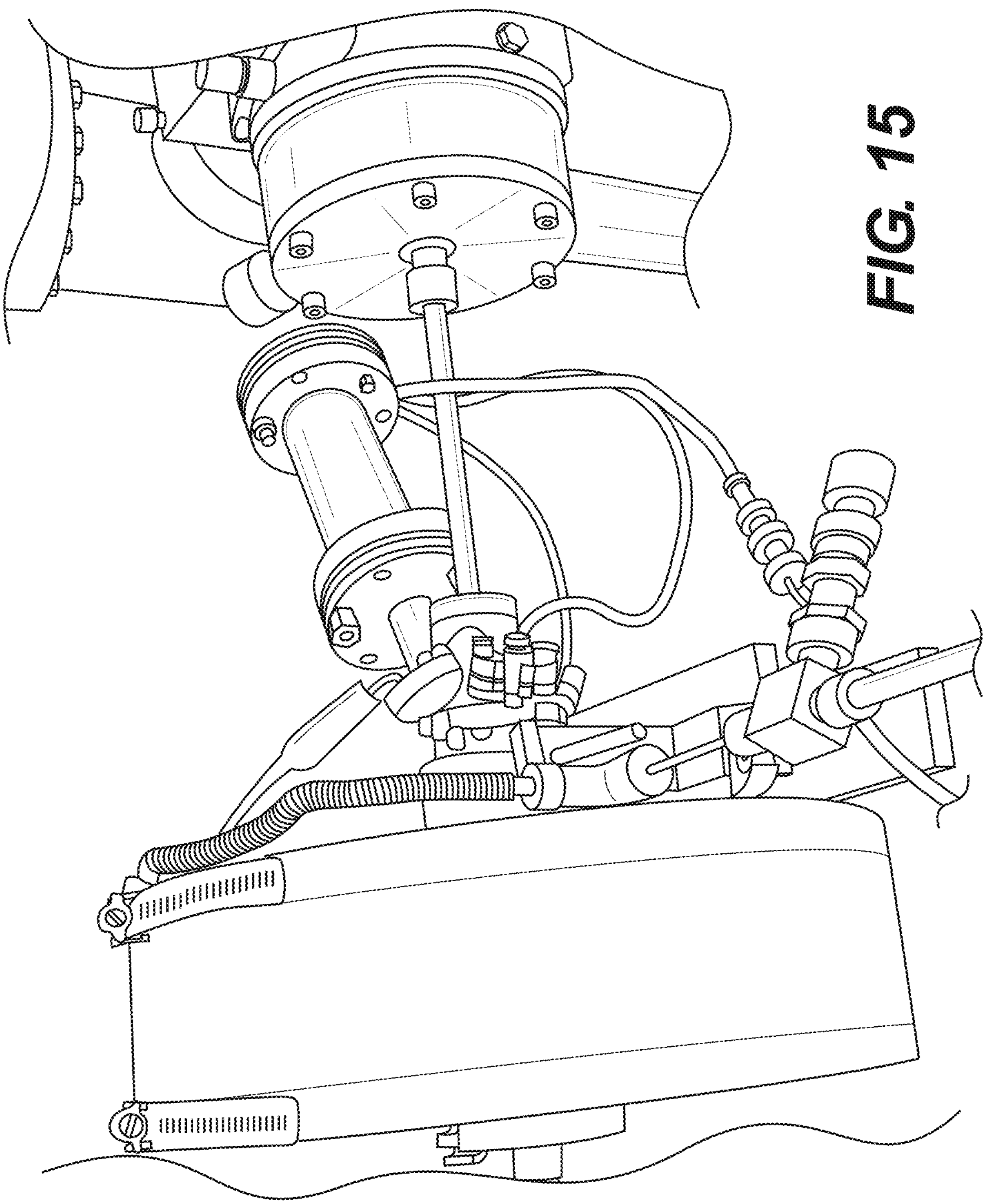
FIG. 15 is the photograph of the high voltage pulsed discharge light source.

The light source and the experimental set up for recording the EUV spectra of pulsed plasmas using molybdenum (Mo), tantalum (Ta), tungsten (W), aluminum (Al), and magnesium (Mg) electrodes are shown in FIGS. 14 and 15. The spectra were recorded using a McPherson grazing incidence EUV spectrometer (Model 248/310G) equipped with a platinum-coated 600 g/mm or a platinum-coated 1200 g/mm grating. The angle of incidence was 87°. The wavelength resolution was about 0.05 nm with an entrance slit width of <1 μm. The EUV light was detected by a CCD detector (Andor iDus) cooled to −60° C. In addition, CfA provided a McPherson 248/310G spectrometer with a platinum-coated 1200 g/mm grating. Both spectrometers and CfA and BLP gratings were used as part of the measurement program.

The discharge cell comprised a hollow anode (3 mm bore) and a hollow cathode (3 mm bore) with electrodes made of Mo, Ta, W, Al, or Mg (see FIG. 14). The electrodes were separated by a 3 mm gap. A high voltage DC power supply was used to charge a bank of twenty 5200 pF capacitors connected in parallel to the electrodes. The cathode was maintained at a voltage of −10 kV before the triggering, while the anode was grounded. In some experiments, the voltage was increased up to −15 kV and decreased to −7 kV to determine the influence of this parameter on the observed spectra. An electron gun (Clinton Displays, Part #2-001), driven by a high voltage pulse generator (DEI, PVX 4140), provided a pulsed electron beam with electron energy of 1-3 keV and pulse duration of 0.5 ms. The electron-beam triggered a high voltage pulsed discharge at a repetition rate of 5 Hz. The discharge was also self-triggered to determine the influence of the electron-beam on the spectral emission, and the electron-beam triggered repetition rate was varied in a range from 1 and 5 Hz to determine if the electrode metal was the source of the continuum by varying the electrode temperature and vaporization rate.

The discharge cell was aligned with the spectrometer using a laser. The CCD detector was gated synchronously with the e-beam trigger. It had an exposure time of 100 ms for each discharge pulse having a breakdown time of about 300 ns. Each recorded spectrum accumulated radiation from 500 or 1000 discharges and in one case 5000 discharges. The CCD dark count was subtracted from the accumulated spectrum. The wavelength calibration was confirmed by OV and OVI lines from the oxygen present on the electrodes in the form of metal oxides. Radiation was measured through an aperture that limited the gas flow from the discharge chamber into the detector chamber. Two-stage differential pumping resulted in low gas pressure in the detector chamber (in the range of $1\times10^{-6}$ Torr) while the gas pressure in the discharge chamber was maintained in the range from 0.1 to 1.3 Torr. Typical flow rates of ultrahigh purity helium, hydrogen, and mixtures ranged from 1 to 10 sccm, and the pressure in the discharge chamber was controlled by a mass flow controller (MKS). Both on-line mass spectroscopy and visible spectroscopy were used for monitoring contaminants in the plasma forming gases.

The pure hydrogen EUV spectra were recorded using an Aluminum (Al) (150 nm thickness, Luxel Corporation) filter to demonstrate that the soft X-rays are emitted from the plasma. The CCD detector position in the beam dispersed by the grating was changed from being centered at 20 nm to 10 nm to determine the short-wavelength cutoff of the hydrogen continuum radiation at about 10 nm using the 600 g/mm grating and Ta electrodes.

Figure 16:
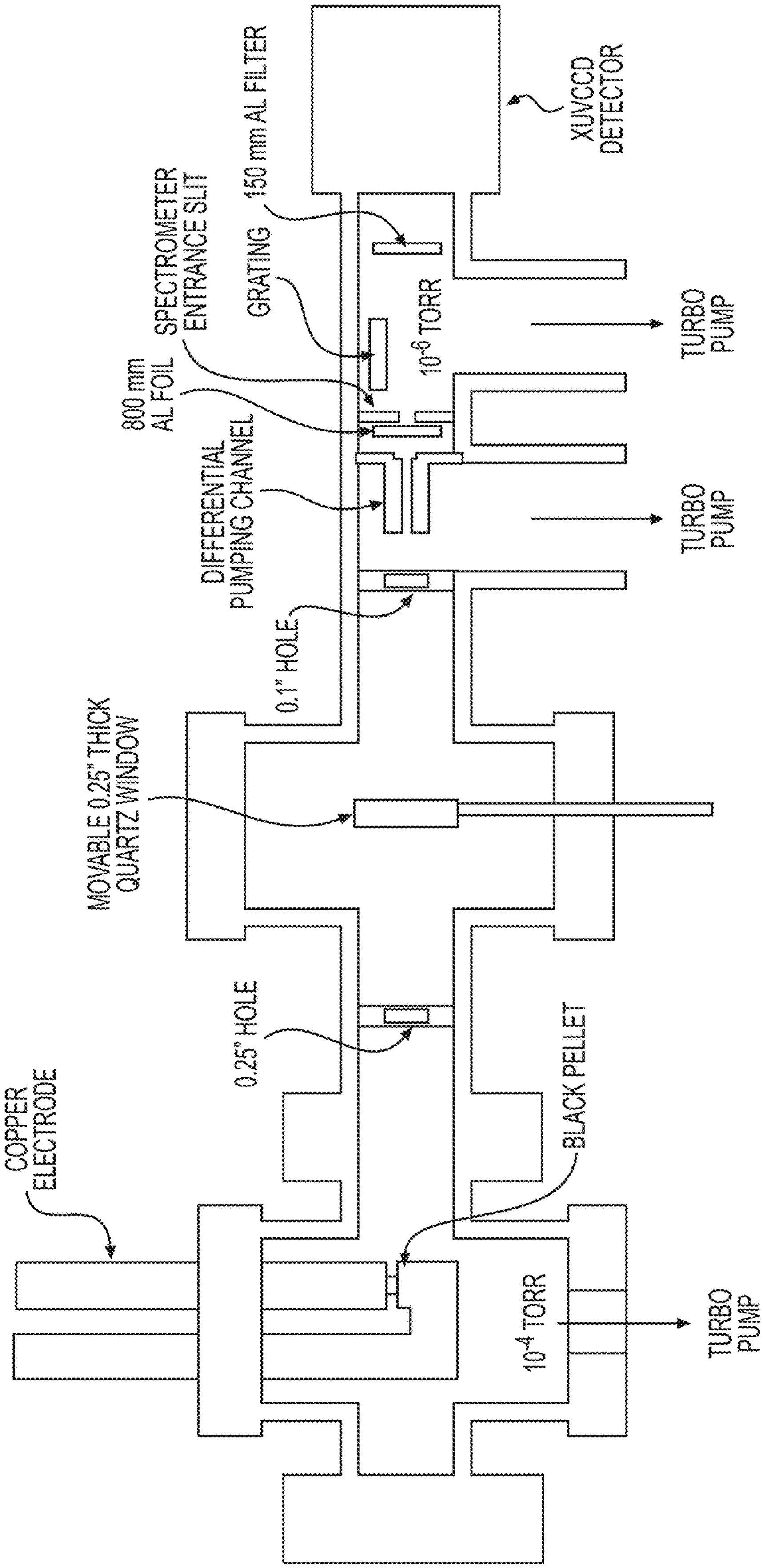
FIG. 16 is the experimental setup for the ignition of conductive solid fuel samples and the recording of the intense plasma emission. The plasma expands into a vacuum chamber such that it becomes optically thin. The source emits its light spectrum through an entrance aperture passing through a slit, with the spectrum dispersed off a grazing-incidence grating onto a CCD detection system.
Figure 17A:
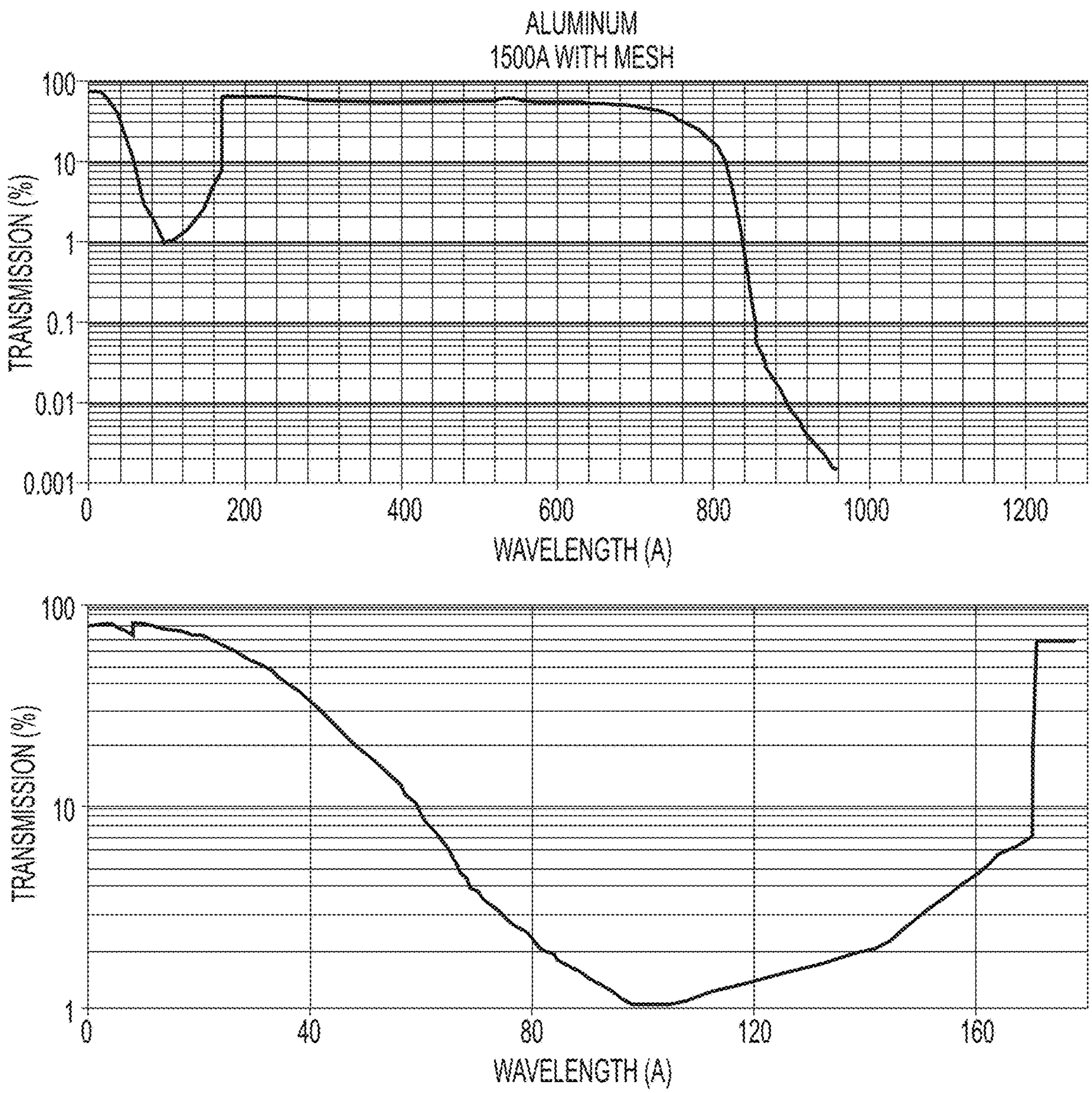
FIGS. 17A-B is the transmission curves of filters for EUV light that blocked visible light. (A) The Al filter (150 nm thickness) having a cutoff to short wavelengths at ~17 nm. (B) The Zr filter (150 nm thickness) having high transmission at the predicted H(1/4) transition cutoff 10.1 nm.
Figure 17B:
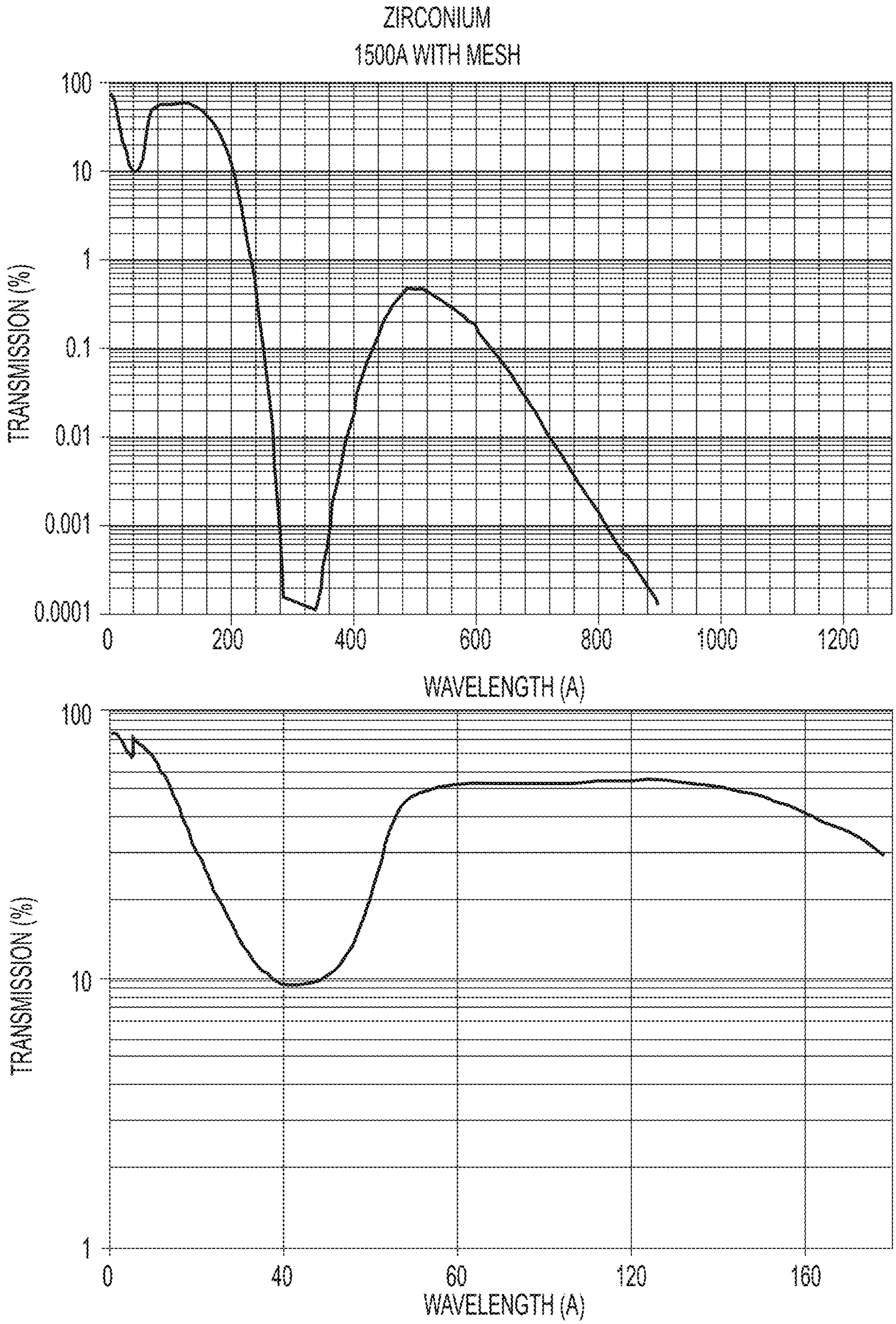

2. EUV Spectra of Ignited Solid Fuels and Spectroscopic Measurement of the EUV Optical Power Balance EUV spectroscopy (FIG. 16) was performed on solid fuel samples comprising (i) a 0.08 $cm^2$ nickel screen conductor coated with a thin (<1 mm thick) tape cast coating of NiOOH, 11 wt % carbon, and 27 wt % Ni powder, (ii) 40 mg of Ag (87 wt %)+$BaI_2$ $2H_2O$ (13 wt %), (iii) 5 mg energetic material $NH_4NO_3$ sealed in an aluminum DSC pan (75 mg) (aluminum crucible 30 μl, D: 6.7 mm×3 mm (Setaram, S08/HBB37408) and aluminum cover D: 6.7 mm, stamped, tight (Setaram, S08/HBB37409)) (DSC pan), (iv) 5 mg energetic material gun powder sealed in the Al DSC pan, and (v) 30 mg paraffin wax sealed in the DSC pan. Each sample was contained in a vacuum chamber evacuated to $5\times10^{-4}$ Torr. The material was confined between the two copper electrodes of a spot welder (Taylor-Winfield model ND-24-75 spot welder, 75 KVA) such that the horizontal plane of the sample was aligned with the optics of an EUV spectrometer as confirmed by an alignment laser. The electrodes were beveled to allow for a larger solid angle of light emission for the Ag (87 wt %)+$BaI_2$ $2H_2O$ pellet. The sample was subjected to a short burst of low voltage, high current electrical energy. The applied 60 Hz AC voltage was less than 15 V peak, and the peak current was about 10,000-25,000 A. The high current caused the sample to ignite as brilliant light-emitting expanding plasma of near atmospheric pressure. To cause the plasma to become optically thin such that EUV light could emerge, the ignition occurred in a 12 liter vacuum chamber that housed the ignited sample. The pressure in the chamber was $1\times10^{-4}$ Torr. The EUV spectrum was recorded using a McPherson grazing incidence EUV spectrometer (Model 248/310G) equipped with a platinum-coated 600 g/mm grating. The angle of incidence was 87°. The wavelength resolution with an entrance slit width of 100 μm was about 0.15 nm at the CCD center and 0.5 nm at the limits of the CCD wavelength range window of 50 nm. Two aluminum filters (Luxel Corporation) were placed in the light path to block the intense visible light and to prevent damage to the spectrometer from the blast debris. The transmittance of each Al filter has a transmission window in a range from 17 nm to 80 nm as shown in FIG. 17A. The first 800 nm thick Al filter was placed in front of the entrance slit of the spectrometer, and the second 150 nm thick Al filter was placed between the grating and CCD detector. To search for the 10.1 nm short wavelength cutoff of the H(¼) transition continuum radiation while selectively blocking visible light, a 150 nm thick Zr filter (Luxel Corporation) was placed in the light path between the grating and CCD detector. The transmittance of the Zr filter has a transmission window in the region of 10 nm as shown in FIG. 17B. The distance from ignited solid fuel sample plasma source to the spectrometer entrance was 75 cm. The EUV light was detected by a CCD detector (Andor iDus) cooled to −60° C. The CCD detector was centered at 20 nm, and the wavelength region covered was 0 to 45 nm. Known oxygen and nitrogen ion lines observed in a high voltage pulse discharge spectrum were used to calibrate the wavelengths of the 0 to 45 nm region. A calibration spectrum was obtained on a high voltage discharge in air plasma gas at 100 mTorr using W electrodes.

The hydrogen pinch plasma formed by the methods and systems of Sec. b.1 served as a standard light source of known incident radiation energy determined by an efficiency calculation of the energy stored in the capacitors to light with the emission treated as a point source. The incident energy was corrected for distance and solid angle to give the energy density of the $H_2$ pinch plasma at the slits. Using the slit dimensions, the photon energy passing through the 50 um slits was calculated. Correcting for the grating efficiency for EUV of 15%, the CCD quantum efficiency (QE) for EUV of 90%, the Al filter transmission rate (0.15 um Al foil) of 80%, and the Al filter transmission rate (0.8 um Al foil) of 15% gave the calculated detection energy. The total EUV photon counts of the calibration $H_2$ pinch plasma spectrum was measured (Sec. b.1). Using the average photon wavelength of 40 nm wherein the Al filter has a band pass from 17 to 80 nm, the corresponding measured or observed energy was calculated. The ratio of the calculated and observed energy gave the calibration factor that accounts for other inefficiencies in the detection. The reverse application of the photon energy at the average wavelength of 40 nm and the correction factors applied to the total EUV photon counts of the solid fuel allowed for the calculation of the corresponding incident radiation energy.

3. Ignition of $H_2O$-Based Solid Fuels with a Low Voltage, High Current and Plasma Duration Determination Test samples comprised (i) $H_2O$-based solid fuels 100 mg Cu[2]+30 mg $H_2O$ sealed in the DSC pan, 80 mg Ti+30 mg $H_2O$ sealed in the DSC pan, a 1 $cm^2$ nickel screen conductor coated with a thin (<1 mm thick) tape cast coating of NiOOH, 11 wt % carbon, and 27 wt % Ni powder, and 55.9 mg Ag (10 at %) coated on Cu (87 wt %)+$BaI_2$ $2H_2O$ (13 wt %), (ii) hydrocarbon-based solid fuel paraffin wax sealed in the DSC pan, (iii) control $H_2O$-based reaction mixtures 185 mg In+30 mg $CaCl_2$+15 mg $H_2O$, 185 mg In+30 mg $ZnCl_2$+15 mg $H_2O$, 185 mg Bi+30 mg $ZnCl_2$+5 mg $H_2O$, and 185 mg Sn+30 mg $ZnCl_2$+5 mg $H_2O$, that were not catalytic to form hydrinos, and (iv) control conductive materials not comprising $H_2O$ such as pre-dehydrated metal foils and a 0.0254 cm diameter gold wire loop and a 2.38 mm diameter InSn wire loop wherein each wire was oriented for axial current flow and was preheated in vacuum. The samples were loaded into the electrodes of the Acme 75 KVA welder that was activated to apply high current through each. The AC current was typically in the range of 10,000-30,000 A, and the peak voltage was typically less than 6 V with the exception of the wire samples having much lower current due to the low voltage and relatively high resistance.

[2]All metal samples comprised powder. $H_2O$ was deionzed.

The temporal evolution of the $H_2O$-based solid fuels such as Cu+$H_2O$ and Ti+$H_2O$, and hydrocarbon-based solid fuel paraffin wax, all sealed in the DSC pan was measured with a photodiode (Thorlabs, model SM05PD1A) having a spectral range of 350-1100 nm, a peak sensitive wavelength of 980 nm, an active area of 13 $mm^2$, a rise/fall time of 10 ns, and a junction capacitance of 24 pF at 20 V. The signal was amplified using an amplifier (Opto Diode model PA 100) with a gain of 1× and a 10 V bias and recorded with a 60 MHz scope (Pico Technology, Picoscope 5442B) at a scan interval of 25 ns. The measuring distance was 25 cm. The temporal resolution of the photodiode was confirmed to be within specification by recording the response to a light-emitting diode powered by pulses of 1 μs, 10 μs, and 1 ms that were generated by a function generator (Agilent 33220A 20 MHz Arbitrary Waveform Generator). In each case, a square wave of the width of the temporal width of the pulse was observed.

The expanding plasmas formed from solid fuel ignitions were recorded with a Phantom v7.3 high-speed video camera at a rate in a range from 6500 and 150,000 frames per second. Using a ruler in the video background, the expansion velocity of the plasma was determined from the increase in distance between the frames and the time interval between frames. The velocity of the expansion of the plasma front following ignition of the solid fuel 100 mg Cu+30 mg $H_2O$ sealed in the DSC pan was also measured with a pair of spatially separated conductivity probes. The first probe was 2.54 cm from the origin, and the second was 1.5875 cm more radial relative to the first. Each probe comprised two copper wires separated by 1.27 cm with a 300 V bias applied across the initially open circuit. The ground wire of the wire pair of each probe had a terminal 100 Ohm resistor. The resistor had floating 10× scope probes connected across it to measure the conductivity as a function of time using a scope that measured the voltage through the scope probes. A 10 ns time scale was achieved using a 60 MHz scope (Pico Technology, Picoscope 5442B) with 125 MS/s. The scope trigger voltage was 3 V.

The plasma emission of a solid fuel pellet comprising 55.9 mg of Ag(Cu) (87 wt %)+$BaI_2$ $2H_2O$ (13 wt %) was synchronously recorded at 17,791 frames per second with the corresponding power parameters as a function of time to determine the relationship of the optical power from the ignited fuel and the input power. The sample chamber was purged with argon and filled with an atmosphere of krypton. The camera used was a Color Edgertronic, and the current and voltage traces as a function of time were recorded at a time resolution of 12 microseconds per sample using a data acquisition system (DAS) comprising a PC with a National Instruments USB-6210 data acquisition module and Labview VI. A Rogowski coil (Model CWT600LF with a 700 mm cable) that was accurate to 0.3% was used as the current signal source, and a voltage attenuator was used to bring analog input voltage to within the +/−10V range of the USB-6210. Additionally, a Picoscope 5442B was used to also monitor the voltage signal at a time resolution of 208 nanoseconds per sample.

The visible spectrum over the wavelength region of 350 nm to 1000 nm was recorded using an Ocean Optics visible spectrometer coupled with a fiber optic cable (Ocean Optics Jaz, with ILX511b detector, OFLV-3 filter, L2 lens, 5 um slit, 350-1000 nm).

4. Spectroscopic Measurement of the Visible Optical Power Balance

The samples of solid fuel comprising 80 mg Ti+30 mg $H_2O$ sealed in the Al DSC pan, a 1 $cm^2$ nickel screen conductor coated with a thin (<1 mm thick) tape cast coating of NiOOH, 11 wt % carbon, and 27 wt % Ni powder, and 5 mg energetic material $NH_4NO_3$ sealed in the Al DSC pan were ignited with an applied peak 60 Hz voltage of 3-6 V and a peak current of about 10,000-25,000 A. The visible power density and energy density spectra were recorded with the Ocean Optics visible spectrometer. The spectrometer was calibrated for optical power density using a standard light source of an Ocean Optics HL-2000 and a radiometer (Dr. Meter Model SM206). To ensure that the short time duration light pulse of the solid fuel was recorded, the calibrated spectrometer was used to record and time-integrate the power density spectrum of the ignited solid fuel over a duration of 5 s, much longer than the light pulse duration of under 1 ms. Background lights were off during recording. Despite the actual acquisition time being short, the distance of recording was 353.6 cm from the origin of the blast to avoid saturation due to the orders of magnitude greater plasma emission intensity than that of a conventional lamp. The total energy density, determined by integrating the energy density spectrum over the wavelength range, was divided by the measured pulse duration time and corrected for the recording distance. The distance was taken as the average spherical radius due to expansion of the plasma calculated from the measured expansion velocity and the time duration of the light event, both measured by the methods of Sec. b.3.

5. Measurement of the Pressure Developed from the Detonation of Solid Fuels

The peak side-on overpressures developed with the detonation of solid fuels comprising 30 mg $H_2O$ sealed in the DSC pan, 100 mg Cu+30 mg $H_2O$ sealed in the DSC pan, and 80 mg Ti+30 mg $H_2O$ sealed in the DSC pan were measured using a PCB Piezotronics model 137B23B ICP quartz blast pressure sensor with a PCB Piezotronics model 482C05 four-channel ICP sensor signal conditioner. The full scale of the quartz sensor was 50 PSIg. The linearity was 0.10% full scale (0.05 PSIg). The uncertainty was +/−1% to within a 95% confidence level, and the resolution was 10 mPSIg. The sensor was NIST traceable calibrated. The signal was recorded by a data acquisition system such as a National Instruments USB-6210 module at a sample rate of up to 250 kS/s or a Picoscope 5442B digital oscilloscope at a sample rate of up to 125 MS/s. The quartz blast sensor was positioned at a distance of 13 inches away from the origin of the blast.

6. Balmer α Line Broadening Measurements

The width of the 656.3 nm Balmer α line emitted from plasmas of ignited solid fuels 100 mg Cu+30 mg $H_2O$ and 80 mg Ti+30 mg $H_2O$, both sealed in the DSC pan were recorded to determine the electron density. The plasma emission was fiber-optically coupled to a Jobin Yvon Horiba 1250 M spectrometer through a high quality UV (200-800 nm) fiber-optic cable. The spectrometer had a 1250 mm focal length with a 2400 g/mm grating and a detector comprising a Symphony model, liquid-nitrogen cooled, back illuminated 2048×512 CCD array with an element size of 13.5 μm×13.5 μm. The spectrometer resolution was determined by using the 632.8 nm HeNe laser line with the entrance and exit slits set to 20 μm. Background lights were off during recording.

7. LED Power Balance of SF-CIHT Cell Having Photovoltaic Conversion

A series of ignitions was performed on solid fuel pellets each comprising 80 mg Ti+30 mg $H_2O$ sealed in the DSC pan. The pellets were adhered to a copper metal strip at 1.9 cm spacing, and the strip was formed around the roller disk of a National Electric Welding Machines seam welder (100 kVA Model #100AOPT SPCT 24) and ignited with an applied peak 60 Hz AC voltage of about 4-8 V and a peak current of about 10,000-35,000 A. The rotation speed was adjusted such that the detonations occurred when the roller moved each pellet to the top-dead center position of the seam welder at a detonation frequency of about 1 Hz. The brilliant flashes of white light were converted into electricity with a photovoltaic converter, and the electricity was dissipated in a light-emitting diode (LED) array.

A three-sided metal frame with attached Lexan walls was setup around the seam welder disks such that the nearest separation of the walls of the rectangular enclosure from the welder disks was about 20 cm. A 30 W, 12 V solar panel was attached to each of the three walls of the enclosure. Each panel comprised high efficiency polycrystalline silicon cells, low iron tempered glass and EVA film with TPT back sheet to encapsulated cells with an anodized aluminum alloy frame (Type 6063-T5 UL Solar). Other solar panel specifications were: cell (polycrystalline silicon): 15.6 cm×3.9 cm; number of cells and connections: 36 (4×9); dimension of module: 66.6×41.1×2.50 cm; weight: 3.63 kg. The electrical characteristics were: power at STC: 30 W; maximum power voltage (Vpm): 17.3 V; maximum power current (Ipm): 1.77 A; open circuit voltage (Voc): 21.9 V; short circuit current (Isc): 1.93 A; tolerance: ±5%; standard test conditions: temperature 25° C., irradiance 1000 W/$m^2$, AM=1.5; maximum system voltage: 600 V DC; series fuse rating: 10 A; temperature coefficient Isc: 0.06%/K, Voc: −0.36%/K, Pmax: −0.5%/K; Operating Temperature: −40° C. to +85° C.; storage humidity: 90%; type of output terminal: junction box; cable: 300 cm.

The solar panels were connected to an LED array. The LED array comprised a Genssi LED Off Road 4×4 Work Light Waterproof 27 W, 12 V, 6000 K (30 Degree Spot), an LED wholesalers 5 m Flexible LED Light Strip with 300× SMD3528 and Adhesive Back, 12 V, White, 2026WH (24 W total), and a 9 W, 12 V Underwater LED Light Landscape Fountain Pond Lamp Bulb White. The total estimated power output at the rated voltage and wattage of the LEDs was 27 W+24 W+9 W=60 W. The collective output power of the three solar panels was 90 W under 1 Sun steady state conditions.

c. Basic Experimental Results and Discussion

1. EUV Pinch Plasma Spectra

The EUV emission spectra of electron-beam-initiated, pinch discharges in pure helium and hydrogen recorded by the EUV grazing incidence spectrometer with Mo, Ta, and W electrodes and different gratings, spectrometers, and numbers of CCD image superpositions are shown in FIGS. 18A-D. Prior spectra of discharges in high purity helium were measured as reference for validation of the continuum-free spectra in absence of hydrogen. The known helium ion lines were observed in the absence of any continuum radiation. Oxygen ion lines were also observed similarly in all spectra including those from hydrogen discharges due to the oxide layer on the metal electrodes. In contrast to the helium spectra, the continuum band was observed when pure hydrogen was discharged. Continuum radiation in the 10 to 30 nm region was observed from the hydrogen discharge regardless of the electrode material, spectrometer, or grating with the intensity proportional to the hydrogen partial pressure. This dependency of the continuum intensity on the $H_2$ pressure was also observed in helium-hydrogen mixtures as shown in FIG. 19. Conventional mechanisms of the continuum radiation unique to hydrogen in a region wherein hydrogen was previously not known to emit were sought. Considering the low energy of 5.2 J per pulse, the observed radiation in the energy range of about 120 eV to 40 eV, reference experiments and analysis of plasma gases, cryofiltration to remove contaminants, and spectra of the electrode metal, no conventional explanation was found in the prior work to be plausible including contaminants, thermal electrode metal emission, and Bremsstrahlung, ion recombination, molecular or molecular ion band radiation, and instrument artifacts involving radicals and energetic ions reacting at the CCD and $H_2$ re-radiation at the detector chamber.

Consider the potential catalysts and mechanisms of continuum emission. In H and mixed H plasmas maintained with metal electrodes each having an oxide coat, the primary catalyst candidates are mH and HOH, and both may be active. The energy released with HOH as catalyst is 122.4 eV from H*(¼) intermediate, and the energy including the HOH catalyst during the transition is 204 eV which could result in emission to 6 nm. Similarly, in hydrogen-helium microwave plasma, H undergoing catalysis with H (m=1) as the catalyst can give rise to a concerted energy exchange of the total energy of 40.8 eV with the excitation of the He ($1s^2$) to He ($1s^1 2p^1$) transition (58.5 nm, 21.21 eV) yielding broad continuum emission with $\lambda \leq 63.3$ nm ($\geq$19.59 eV). In independent replication experiments, broad 63.3 nm emission of this nature and the continuum radiation have been observed in helium-hydrogen microwave plasmas and in hydrogen pinch plasmas, respectively. But, $$H*\left[\frac{a_H}{m+1}\right]$$

should be the predominant source of continuum radiation since the plasma comprised hydrogen and some oxygen from the electrodes. With mH catalyst, the possibilities for continuum radiation in this range are the 10.1 nm continuum (m=3 in Eqs. (223-226) and (233)), and 22.8 nm continuum (m=2 in Eqs. (223-226) and (233)). One piece of evidence against mH as the catalyst is that any 10.1 nm continuum should be dramatically lower in intensity than the emission of the 22.8 nm continuum. In contrast, evidence for the HOH catalyst is that the intensity for the 10.1 nm continuum has been observed to be higher in H pinch plasmas with W and Ta electrodes. This is explained by HOH having a 10.1 nm continuum emission as the source of the 10-30 nm band. Solid fuels comprising metal oxides and hydroxides that undergo hydrogen reduction to form HOH show substantial excess energy. These results as well as those of electrochemical (CIHT) cells utilizing the HOH catalyst show that HOH catalyst has much higher kinetics than mH catalyst, and the reaction is favorable with metal oxides such as those of Mo, W, and Ta that favorably undergo hydrogen reduction to form HOH catalyst. The strong oxygen ion lines in the continuum from the H pinch plasma show the presence of metal oxide that is permissive of the HOH mechanism. Conversely, metal oxides that are not thermodynamically favorable towards the reaction to form HOH such as those of Al and Mg shown in FIGS. 20A-D do not show the continuum radiation under the low energy conditions of 5 J per pulse corresponding to an electron temperature estimated to be <10 eV of our pinch plasma source.

Figure 35:
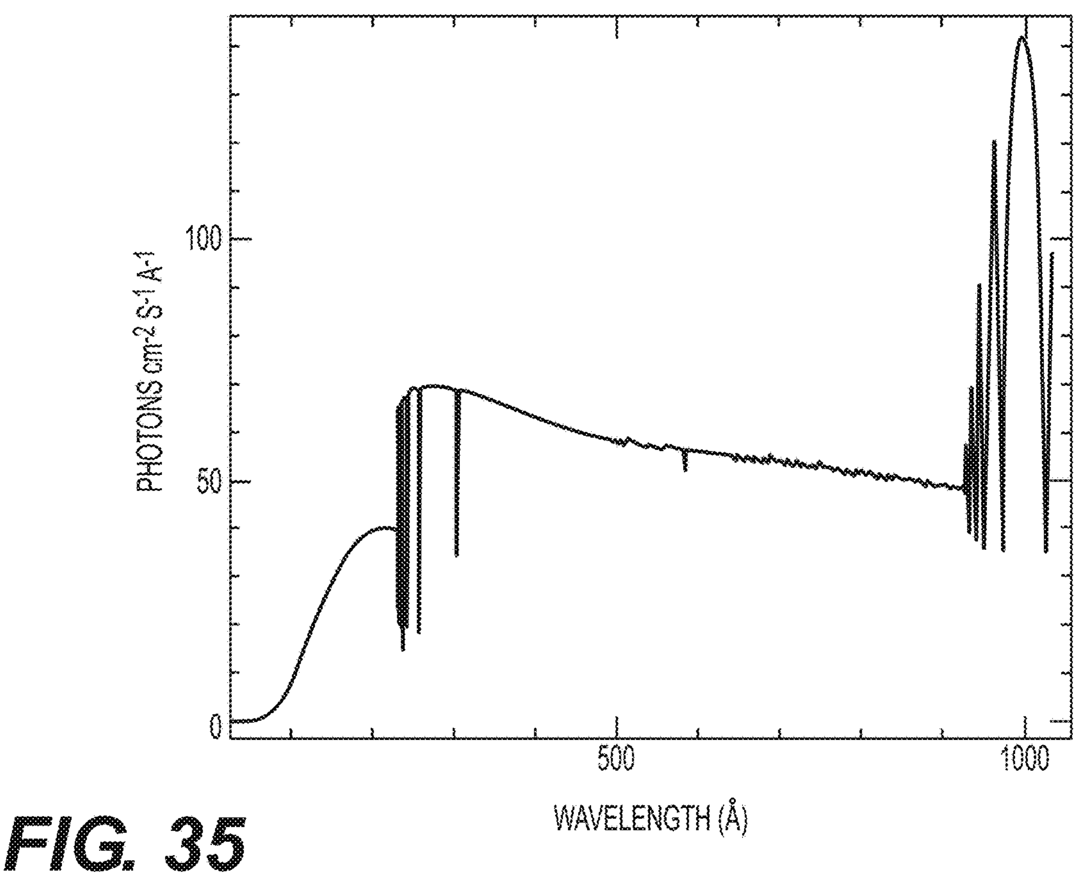
FIG. 35 shows an exemplary model of the EUV continuum spectrum of the photosphere of a white dwarf using a temperature of 50,000 K and a number abundance of $He/H=10^{-5}$ showing the He II and H I Lyman absorption series of lines at 22.8 nm (228 Å) and 91.2 nm (912 Å), respectively. From M. A. Barstow and J. B. Holberg, *Extreme Ultraviolet Astronomy*, Cambridge Astrophysics Series 37, Cambridge University Press, Cambridge, (2003).

All high Z metals emit continuum radiation at a sufficiently high electron temperature. Specifically, it is shown by Awe et al. that Al forms a strong metal ion continuum at much higher energies and electrons temperatures. Any coincidence between the continuum emission of our source and that achieved typically at an electron temperature of over two orders of magnitude higher by other much more powerful sources may be due to secondary emission from absorption of the high-energy continuum radiation by metal atoms to form highly ionized metal ions in the plasma or due to a significant increase the background emission of ambient species such as low abundance ions by the same mechanism. For example, an electron temperature of 163 eV is required to observe W continuum radiation in the EBIT source. At the very low electron temperature our hydrogen pinch source estimated to be <10 eV, any highly-ionized ion emission that would otherwise require a much higher electron temperature than the actual temperature must be due to the high energy provided according to Eqs. (223-230) and (233). This ion emission is of a nonthermal nature as confirmed by the absence of required emission of the lines of these ions and equilibrium species in the visible region. The same mechanism is shown in the solar corona as the basis of nonthermal highly-ionized ion emission as well as ion emission in white dwarf stars in Sec. c.9. In the latter case, the actual minority-species absorption lines in the continuum background are observed (FIG. 35). Thus, the emission is not consistent with the electron temperature in terms of the ions observed and line intensity ratios. Specifically, as in the case of a W anode, the very weak atomic W visible emission and low electron temperature do not support the short wavelength continuum being due to highly ionized W ions unless there is a continuum-emission energy source to excite these ions if they are otherwise present in low abundance. This assignment of highly-ionized ion emission is confirmed by the observation of the same type of ion emission from a plasma source that has no high electric field, namely an ignited solid fuel as shown in Sec. c.6.

Figure 18A:
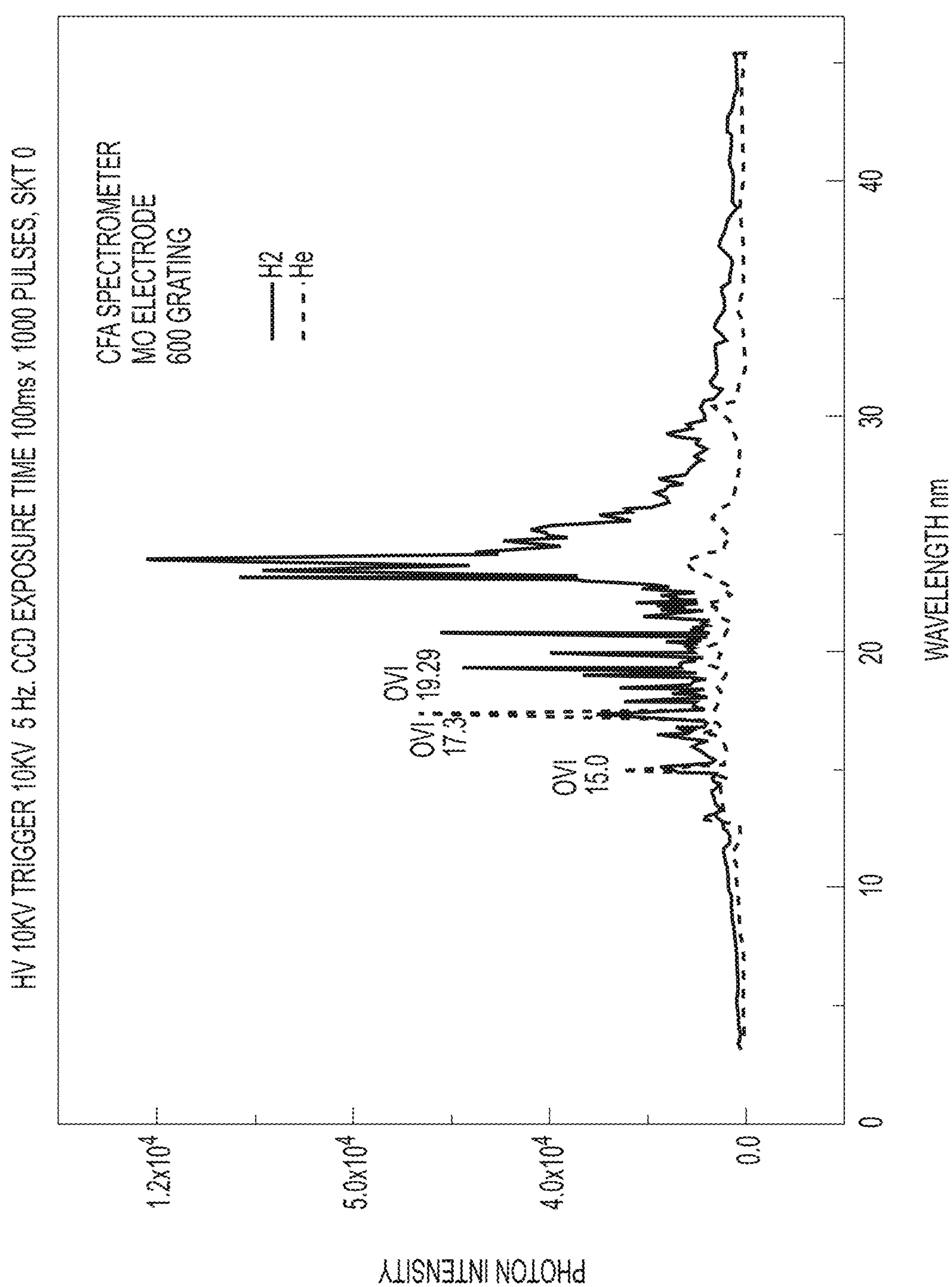
FIGS. 18A-D are the emission spectra (2.5-45 nm) comprising 1000 superpositions of electron-beam-initiated, high voltage pulsed gas discharges in helium or hydrogen. Only known helium and oxygen ion lines were observed with helium in the absence of a continuum. Continuum radiation was observed for hydrogen only independent of the electrode, grating, spectrometer, or number of CCD image superpositions. (A) Helium and hydrogen plasmas maintained with Mo electrodes and emission recorded using the CfA EUV grazing incidence spectrometer with the BLP 600 lines/mm grating. (B) Helium and hydrogen plasmas maintained with Ta electrodes and emission recorded using the CfA EUV grazing incidence spectrometer with the BLP 600 lines/mm grating. (C) Helium and hydrogen plasmas maintained with W electrodes and emission recorded using the CfA EUV grazing incidence spectrometer with the CfA 1200 lines/mm grating. (D) Helium and hydrogen plasmas maintained with W electrodes and emission recorded using the CfA EUV grazing incidence spectrometer with the BLP 600 lines/mm grating.
Figure 18B:
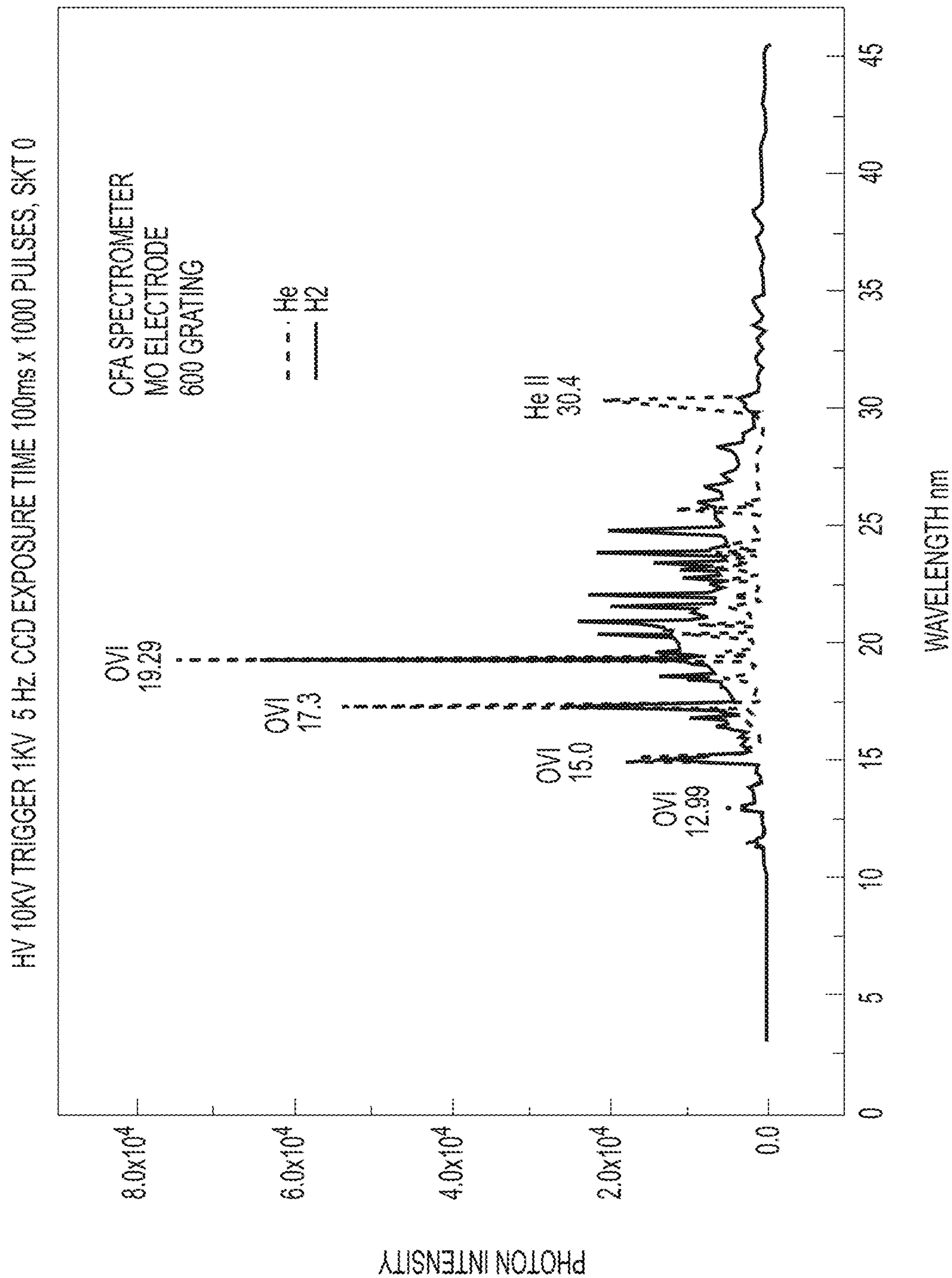
Figure 18C:
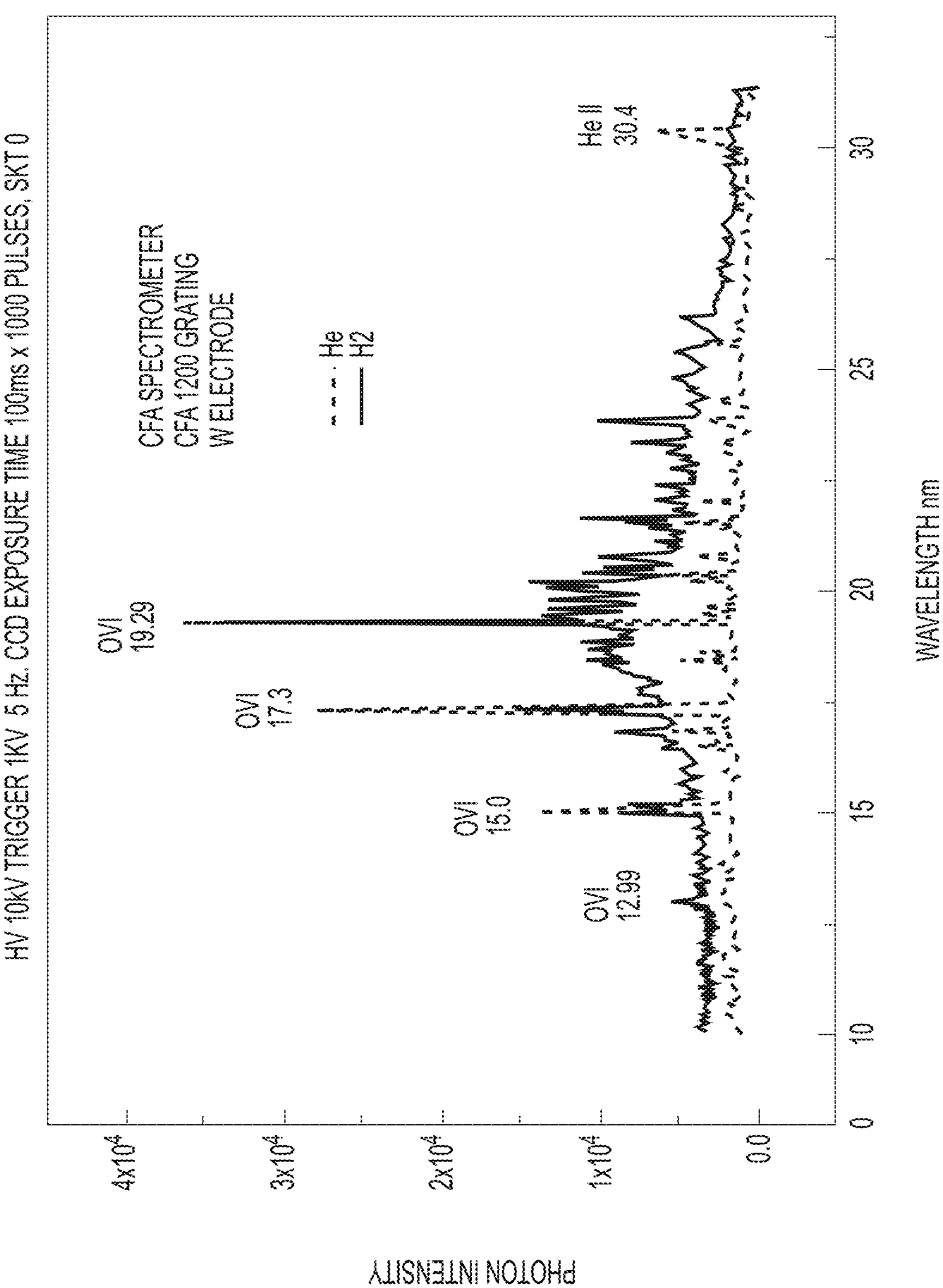
Figure 18D:
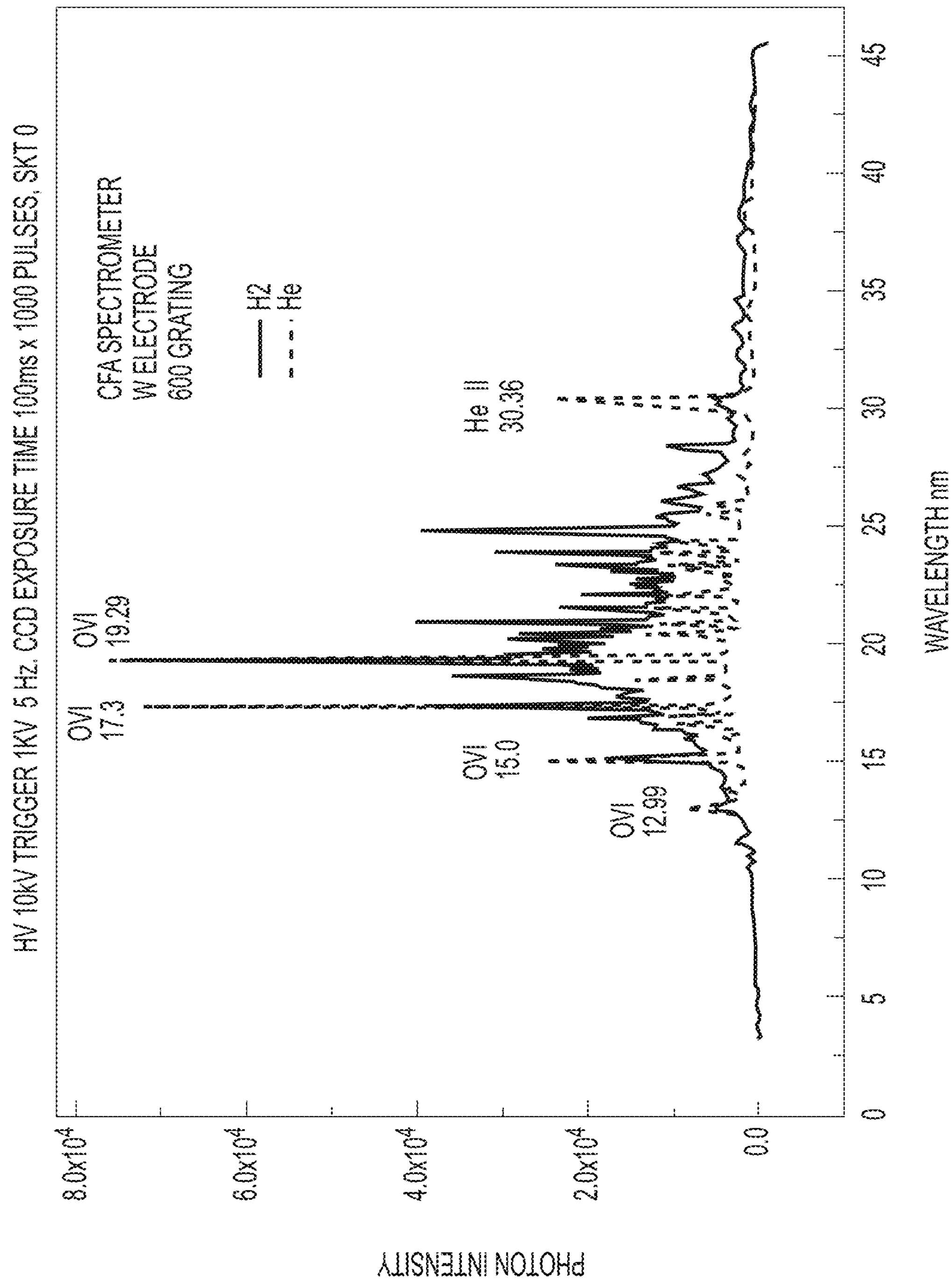
Figure 19:
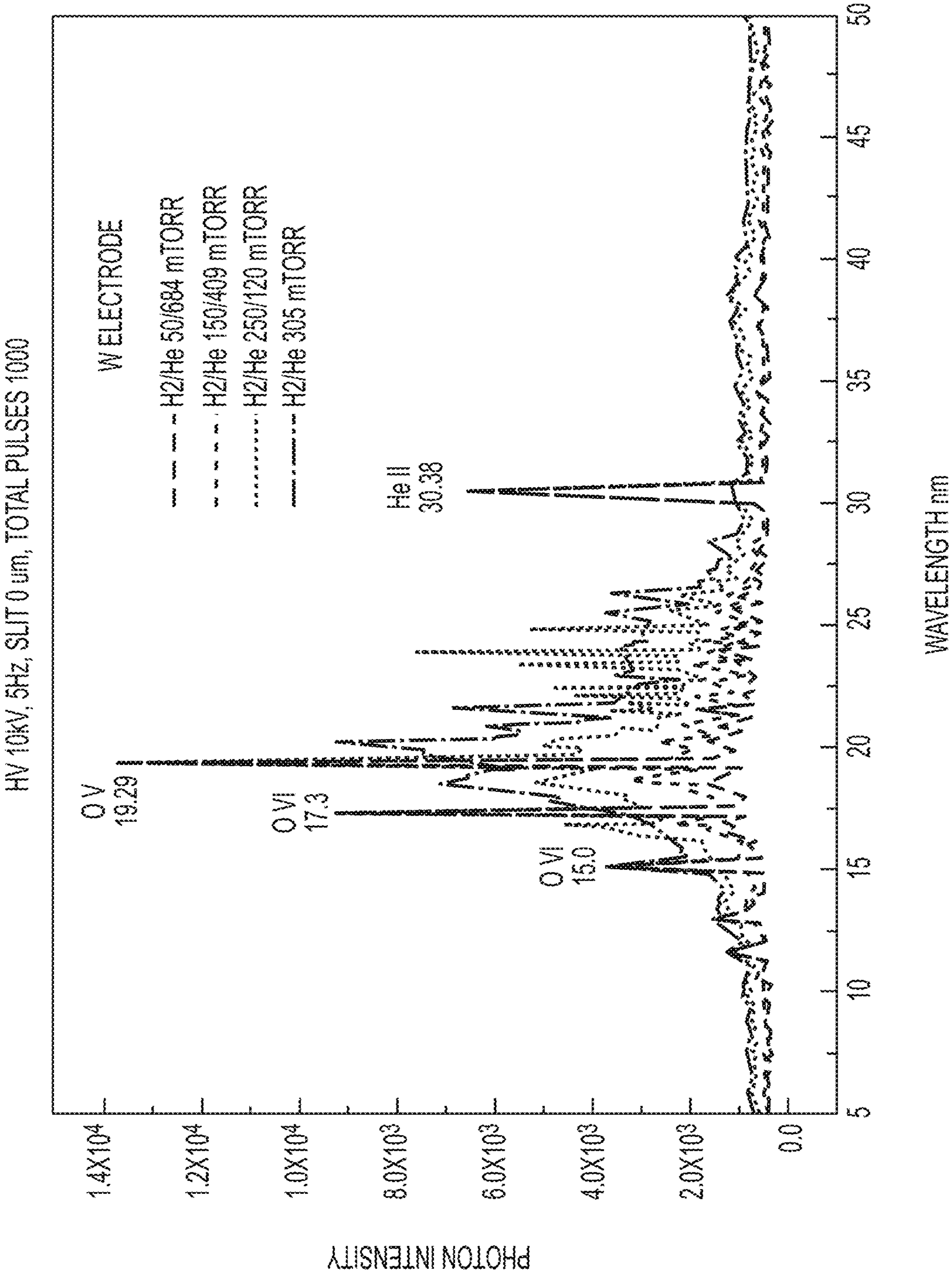
FIG. 19 is the emission spectra (5-50 nm) of electron-beam-initiated, high voltage pulsed discharges in helium-hydrogen mixtures with W electrodes recorded by the EUV grazing incidence spectrometer using the 600 lines/mm grating and 1000 superpositions showing that the continuum radiation increased in intensity with increasing hydrogen pressure.
Figure 20A:
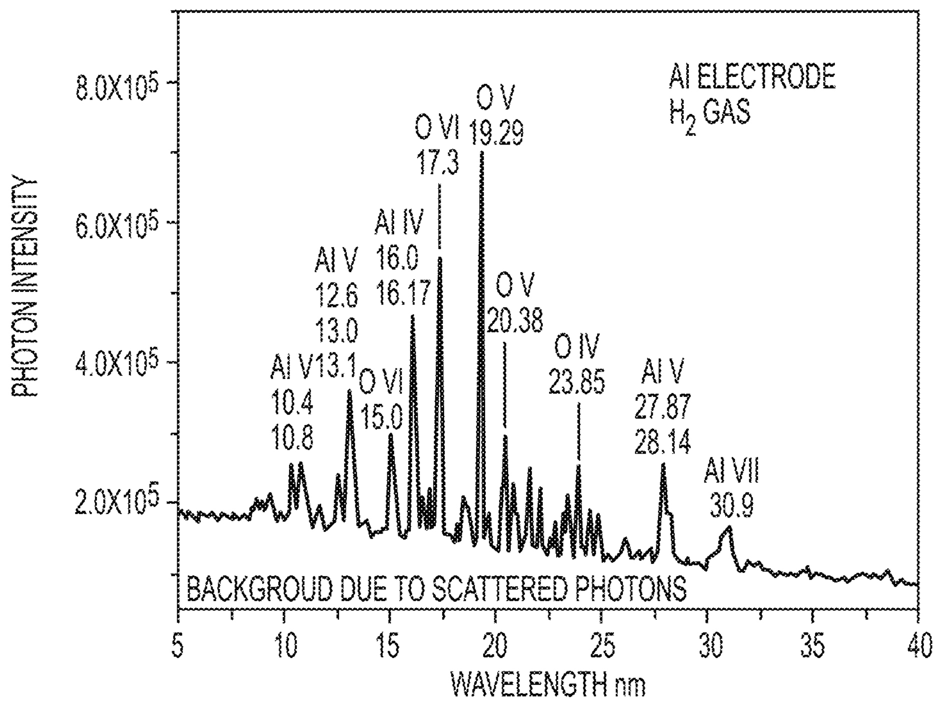
FIGS. 20A-D are the emission spectra (5-40 nm) comprising 1000 superpositions of electron-beam-initiated, high voltage pulsed gas discharges in hydrogen with and without an Al filter. No continuum radiation was observed from Al and Mg anodes. (A) Hydrogen plasmas maintained with an Al anode. (B) Hydrogen plasmas maintained with an Al anode with the spectrum recorded with an Al filter. (C) Hydrogen plasmas maintained with an Mg anode. (D) Hydrogen plasmas maintained with an Mg anode with the spectrum recorded with an Al filter.
Figure 20B:
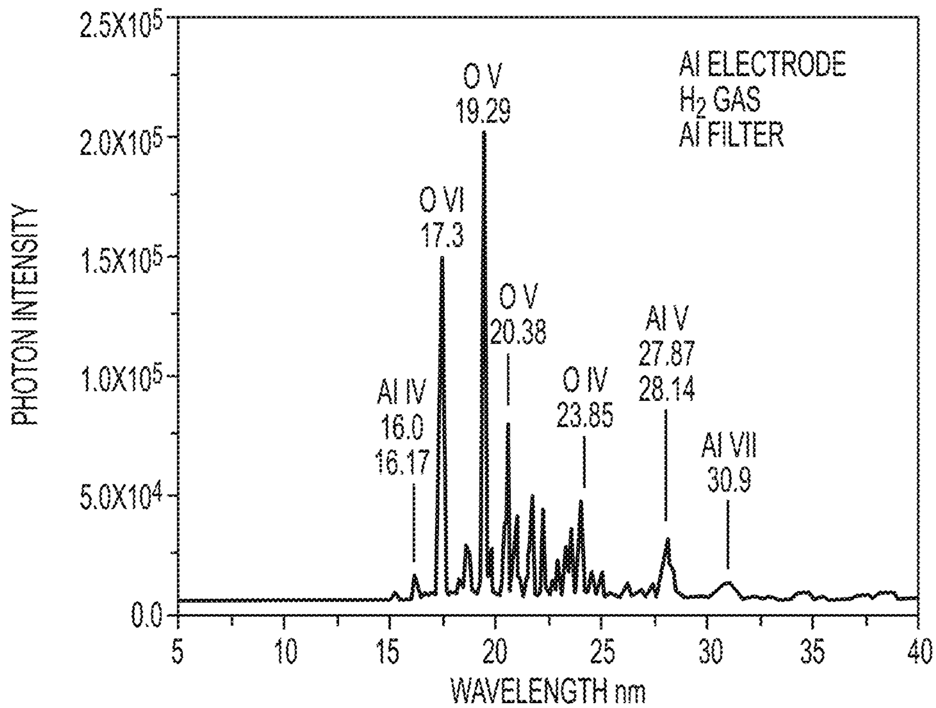
Figure 20C:
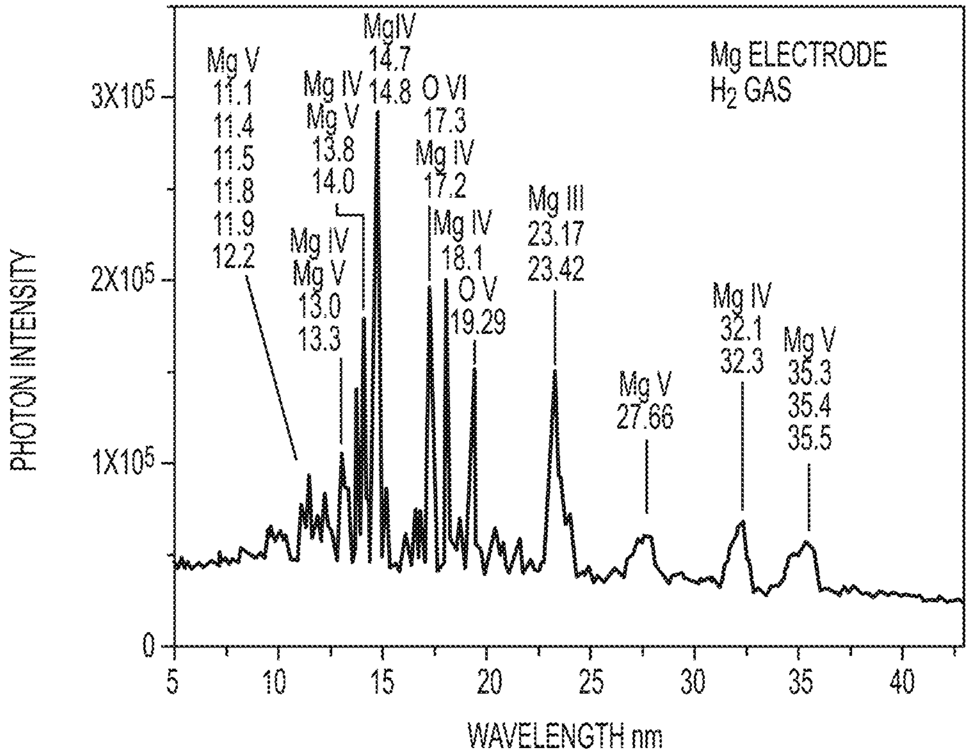
Figure 20D:
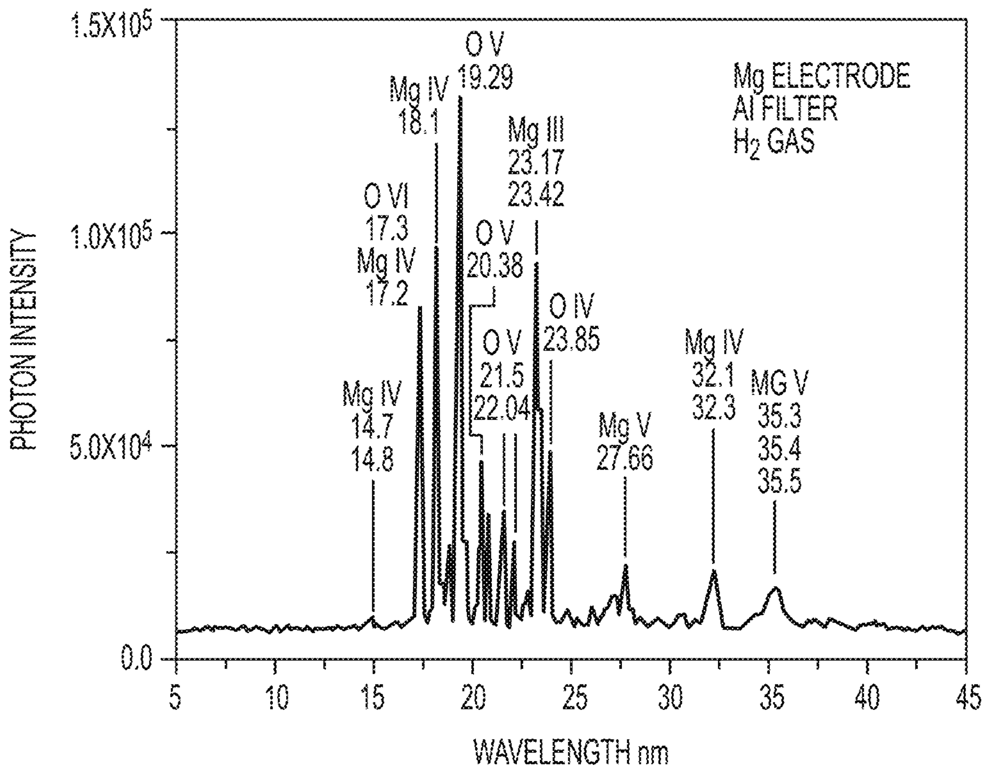

In the case that the medium is optically thick over certain wavelength regions, only parts of the broad emission may be observed (FIG. 18A versus FIGS. 18B-D). Consequently, the continuum radiation may be indirectly observed as highly-ionized ion emission not consistent with a thermal origin in terms of the ions and intensity ratios. The emission depends on atomic and ion cross sections for absorption and reemission of the continuum radiation as well as the incident continuum profile. The latter is dependent on the hydrino reactions that are in turn also depend on the medium wherein a species other than H may serve as the catalyst such as in the case of HOH being the catalyst. Ion emission due to the catalyst reaction such as given in Eqs. (223) and (227) may also be observed. For the involvement of HOH as the catalyst, O ion afterglow would be expected according to Eq. (227) wherein the 81.6 eV may give rise to highly ionized oxygen ions. In time-resolved studies using a channel electron multiplier detector and a multichannel scalar counter, the continuum emission was only observed during the short pulse; whereas, oxygen ions showed a long afterglow. For example, the continuum at 25.0 nm had a short lifetime of about 0.5 μs compared to a 4 μs lifetime of the $O^{3+}$ ion line at 23.9 nm. Thus, the observation of O ion lines in the absence of strong metal ion lines was deemed to be due to the long O-ion excited-state lifetimes, excited by the catalysis reaction in addition to absorption and reemission of the EUV continuum. This observation further supports HOH as active in the hydrogen pinch plasma emission. Similarly, helium emission was observed to have a long afterglow with $He^+$ acting as a catalyst of 54.4 eV (2·27.2 eV).

Uniquely only hydrogen addition creates or at least greatly enhances the continuum and plasma intensity in the cases wherein HOH catalyst formation is favorable. H addition to a helium pinch plasma decreases the helium ion lifetime; so, H addition should decrease any metal ion continuum; yet, the opposite is observed. The cooling effect by gas admixtures and impurities is reported by Trabert. In contrast, there is no continuum with oxygen, argon, helium, nitrogen, air, or mixtures, for example. The short wavelength radiation in the 10-22 nm region of a Mo anode $H_2$ pinch plasma did not match conventional plasma models as pointed out by Phelps and Clementson wherein they could not exclude a hydrino explanation. The continuum cannot be explained as due to H sputtering as suggested by Phelps and Clementson since $H^+$ is accelerated towards and bombards the cathode; yet, the continuum is independent of the cathode metal. Furthermore, the explanation of increased electron sputtering on the anode is eliminated since the continuum is observed with trace H present in non-hydrogen plasmas such as essentially pure helium plasma having indistinguishable plasma parameters from 100% helium plasma. This observation also removes an enhanced optical opacity argument regarding diminished transmission of the continuum in helium versus hydrogen. The further observation that there was no continuum from helium even when the light path length between the plasma and the detector was reduced by a factor of one half further eliminated the enhanced optical opacity argument. The hydrino transition is the only viable explanation for all of the results. Moreover, the power released by the hydrino reaction can account for the continuum emission power relative to the EUV emission from the input power based on the $H_2$ flow rate and availability, energy per transition, and quantum yield for EUV continuum.

Similarly, observed fast H may be due to the energy released in forming hydrinos by HOH catalyst, especially in cases such as water vapor plasma where the broadening is greater than 100 eV. HOH may be also be a significant contributor in addition to mH catalyst in hydrogen plasma wherein it has been observed that the fast H requires a surface to achieve a significant effect in terms of fractional population and energy. For, example, line broadening is not observed in hydrogen plasma unless a surface such as a metal is present that can support atomic H or HOH formation. Glow discharge and RF discharge cells comprising metal electrodes show a strong effect. Metals typically have an oxide coat, such that the catalyst mechanism may be HOH as well as mH. This could explain the large population at very high energies >100 eV in cases with H plasma after long duration running wherein slow accumulation of oxygen is required to yield similar broadening as $H_2O$ plasma. In addition to continuum radiation in the 10-30 nm region and extraordinary fast H, further confirmation that the energy released by forming hydrinos gives rise to high-kinetic energy H is the ToF-SIMS observation of ions arriving before m/e=1 confirming that the energy release of Eqs. (226) and (230) is manifest as high kinetic energy $H^-$ of about 204 eV.

2. Ignition of $H_2O$-Based Solid Fuels with a Low Voltage, High Current and Plasma Duration Determination The $H_2O$-based solid fuel samples such as $Cu+H_2O$ sealed in the DSC pan, $Ti+H_2O$ sealed in the DSC pan, and NiOOH+Ni+C as well as control conductive materials not comprising $H_2O$ such as a 0.010" diameter gold wire loop oriented for axial current flow and metal foils preheated in vacuum were loaded into the electrodes of the Acme 75 KVA welder that was activated to apply high current through each sample. Only resistive heating was observed for the controls. Additional $H_2O$-based reaction mixtures that were not catalytic to form hydrinos and served as controls such as 185 mg In+30 mg $CaCl_2$+15 mg $H_2O$, 185 mg In+30 mg $ZnCl_2$+15 mg $H_2O$, 185 mg Bi+30 mg $ZnCl_2$+5 mg $H_2O$, and 185 mg Sn+30 mg $ZnCl_2$+5 mg $H_2O$ showed just resistive heating behavior as well.

Figure 21A:
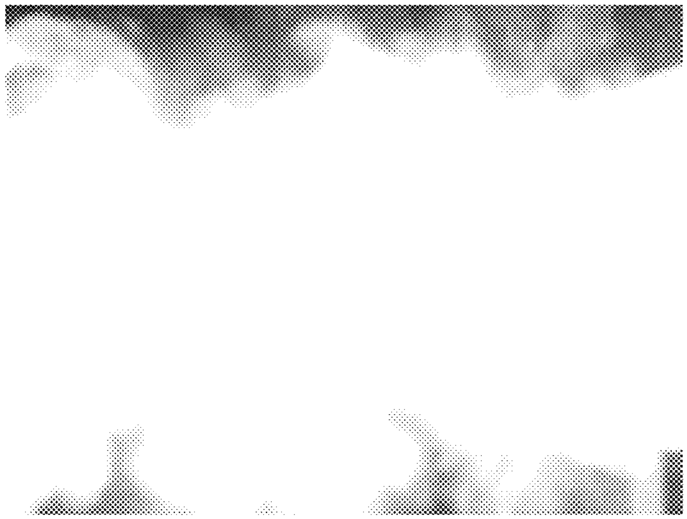
FIGS. 21A-B shows high-speed photography of brilliant light-emitting expanding plasma formed from the low voltage, high current detonation of the solid fuels. (A) $Cu+CuO+H_2O$ filmed at 6500 frames per second. The white-blue color indicates a large amount of UV emission from a blackbody with a temperature of 5500-6000 K, equivalent to the Sun's. (B) 55.9 mg Ag (10 at %) coated on Cu (87 wt %)+$BaI_2$ $2H_2O$ (13 wt %), filmed at 17,791 frames per second with a VI waveform that shows plasma at a time when there was no electrical input power (noted by the yellow vertical line), and no chemical reaction was possible. The plasma persisted for 21.9 ms while the input power was zero at 1.275 ms. The peak reactive voltage measured at the welder connection to the bus bar was about 20 V, and the corresponding voltage at the other end near the fuel was <15 V.

The active $H_2O$-based solid fuels underwent a detonation event with a loud blast, brilliant light emission, and a pressure shock wave. Each sample appeared to have been completely vaporized and atomized to form an ionized, expanding plasma as evidenced by high-speed video using a Phantom v7.3 camera at 6500 frames per second (FIG. 21A). With a synchronized recording of the plasma emission at 17,791 frames per second and the corresponding current and voltage as a function of time (FIG. 21B), the ignition of the solid fuel Ag(Cu)+$BaI_2$ $2H_2O$ showed that the plasma persisted for 21.9 ms while the input power was zero at 1.275 ms plasma. Plasma having about 100 kW power with no electrical input power and no chemical reaction possible proves the existence of a new energy source shown by EUV spectroscopy (Sec. c.6) and analytical characterization of the plasma product to be the due to the reaction H to H(1/4).

Figure 22:
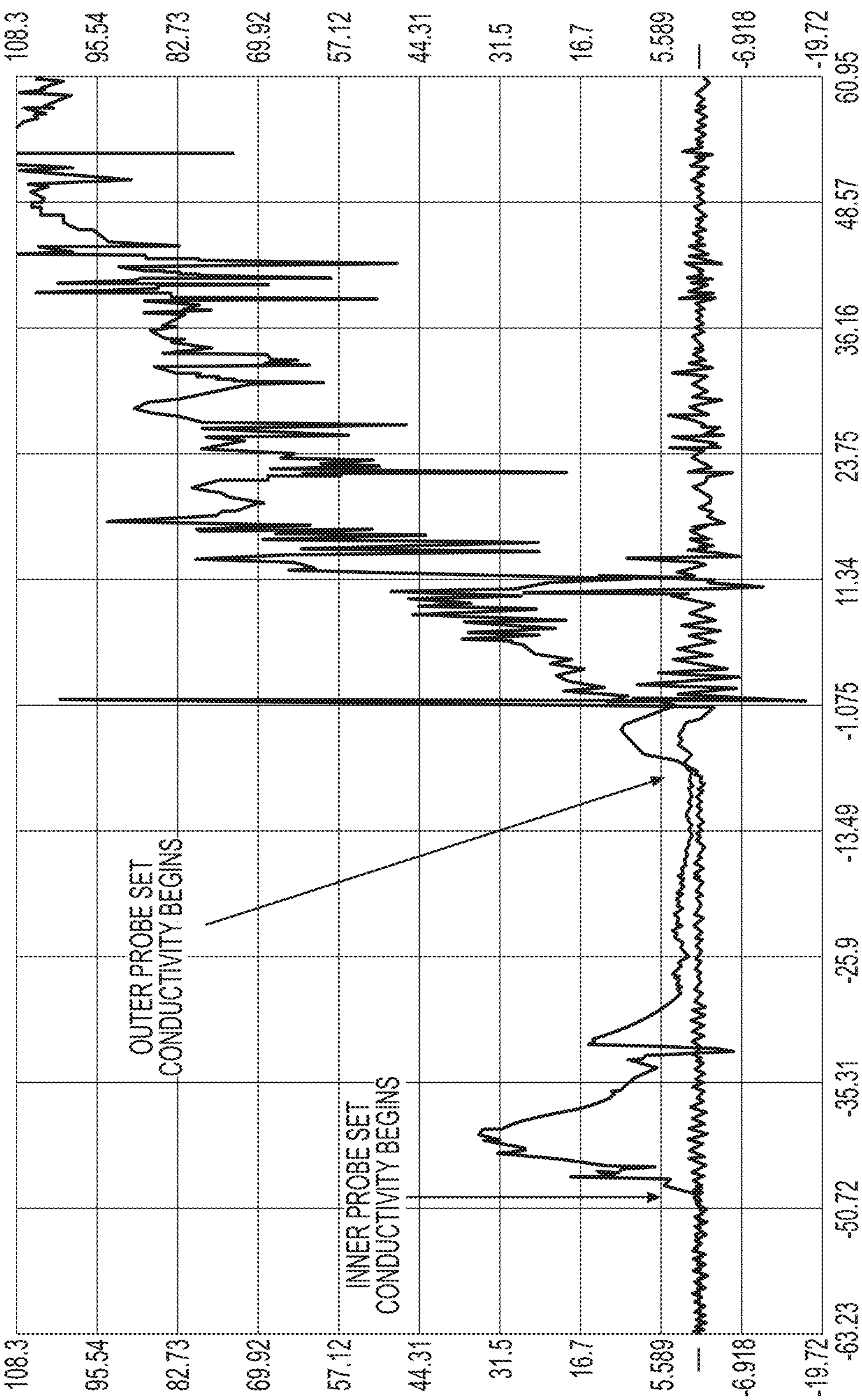
FIG. 22 shows the plasma conductivity as a function of time following detonation of the solid fuel 100 mg+30 mg $H_2O$ sealed in the DSC pan at a pair of conductivity probes spaced 1.5875 cm apart. The time delay between the pair of conductivity probes was measured to be 42 μs that corresponded to a plasma expansion velocity of 378 m/s which averaged to sound speed, 343 m/s, over multiple measurements.
Figure 23:
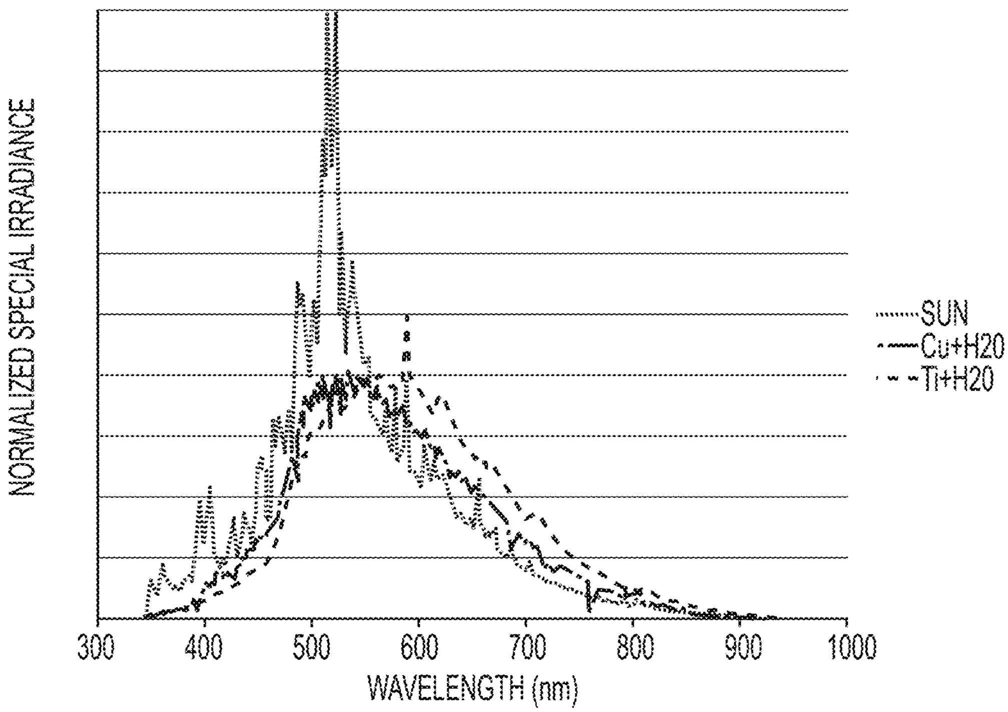
FIG. 23 shows the intensity-normalized, superposition of visible spectra of the plasmas formed by the low voltage, high current ignition of solid fuels 100 mg Ti+30 mg $H_2O$ and 100 mg Cu+30 mg $H_2O$ both sealed in the DSC pan, compared with the spectrum of the Sun's radiation at the Earth's surface. The overlay demonstrates that all the sources emit blackbody radiation of about 5000-6000 K, but the solid fuel blackbody emission (before normalization) is over 50,000 times more intense than sunlight at the Earth's surface.

The expansion velocity measured from the video at up to 150,000 frames per second was sound speed, 343 m/s, or greater such as 900 m/s. The expansion velocity of the plasma formed by the ignition of solid fuel 100 mg+30 mg $H_2O$ was also determined to be sound speed by measuring the plasma conductivity as a function of time following detonation of the solid fuel at two spatially separated conductivity probes as shown in FIG. 22. The brilliant light emission was white in color; the white light being characteristic of the 5000-6000 K blackbody emission of exemplary solid fuels Cu+$H_2O$ and Ti+$H_2O$ shown in FIG. 23 compared with the Sun's 5500-6000 K blackbody spectrum. The plasma was confirmed to be essentially 100% ionized by measuring the Stark broadening of the H Balmer α line (Sec. c.4).

Figure 24:
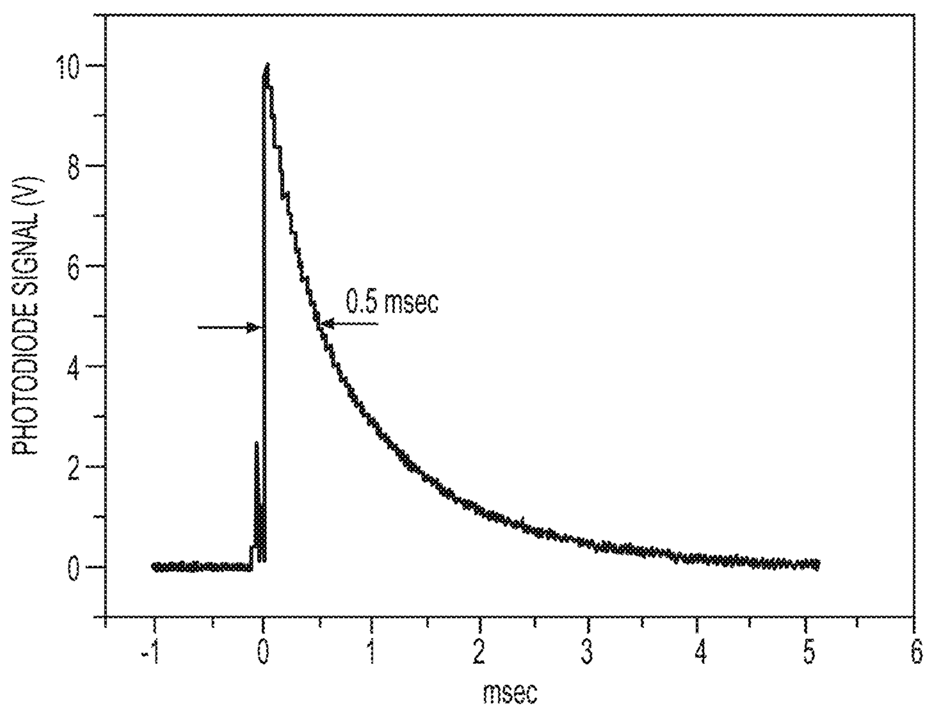
FIG. 24 shows the fast photodiode signal as a function of time capturing the evolution of the light emission following the ignition event of the solid fuel 100 mg Ti+30 mg $H_2O$ sealed in the DSC pan. The temporal full width half maximum light intensity measured with the fast photodiode was 0.5 ms.

The photodiode-measured temporal duration of the blast event of exemplary solid fuel 80 mg Ti+30 mg $H_2O$ sealed in the DSC pan was 0.5 ms (FIG. 24). It was observed that the length of the duration of the power generation based on the half-width of the light emission peak could be varied in the range of 25 μs to 40 ms by adjusting the pressure applied to the solid fuel sample by the confining electrodes, the nature of the solid fuel composition, and the waveform of the high current flow through the solid fuel.

Figure 25:
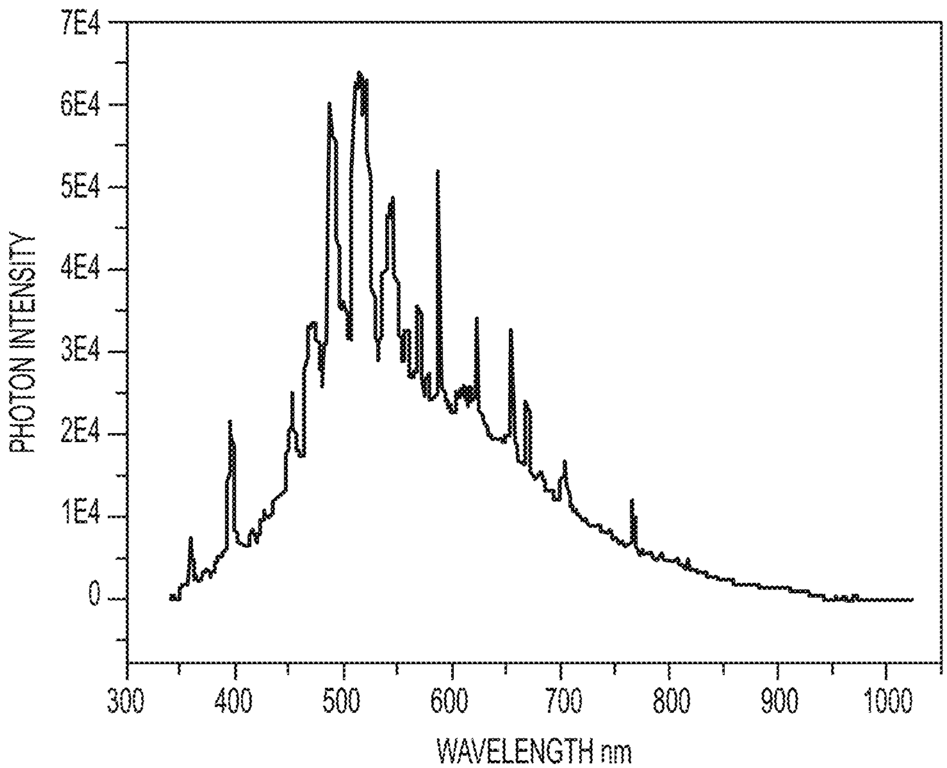
FIG. 25 shows the visible spectrum of the plasma formed by the low voltage, high current ignition of solid fuel paraffin wax sealed in the DSC pan taken at 427 cm from the blast. This source also emits blackbody radiation of about 5000-6000 K, similar to the spectra of the Sun and $H_2O$-based solid fuels shown in FIG. 23.

In addition to HOH, m H atom catalyst was found to be effective by demonstrating a brilliant light-emitting plasma and blast during the ignition of hydrocarbon-based solid fuel paraffin wax in the DSC pan. As in the case of the $H_2O$-based solid fuels, blackbody radiation with a temperature of about 5500-6000K (FIG. 25) was observed also matching the solar spectrum shown in FIG. 23. Using the fast photodiode, the ignition event was determined to be comprised of two distinct light-emissions, the first had duration of about 500 μs, and the duration of the second was about 750 μs.

3. Measurement of the Pressure Developed from the Detonation of Solid Fuels

With the quartz blast sensor positioned at a distance of 13 inches away from the origin of the blast, the peak side-on overpressures developed from the detonation of 30 mg $H_2O$ sealed in the DSC pan, 100 mg Cu+30 mg $H_2O$ sealed in the DSC pan, and 80 mg Ti+30 mg $H_2O$ sealed in the DSC pan were 0.8 PSIg, 1.3 PSIg, and 2.0 PSIg, respectively. The pressure developed by the solid fuels was low compared to that of an internal combustion engine, 735 PSIg and high explosives, $7.35\times10^5$ PSIg. Thus, the energy of the blast in the form of pressure-volume work is very low. This is consistent with the observation that the solid fuel plasma formed by the ignition event is essentially fully ionized comprising a blackbody of 5500-6000 K. The power is essentially all in the form of visible radiation.

4. Balmer α Line Broadening Measurements

Figure 26A:
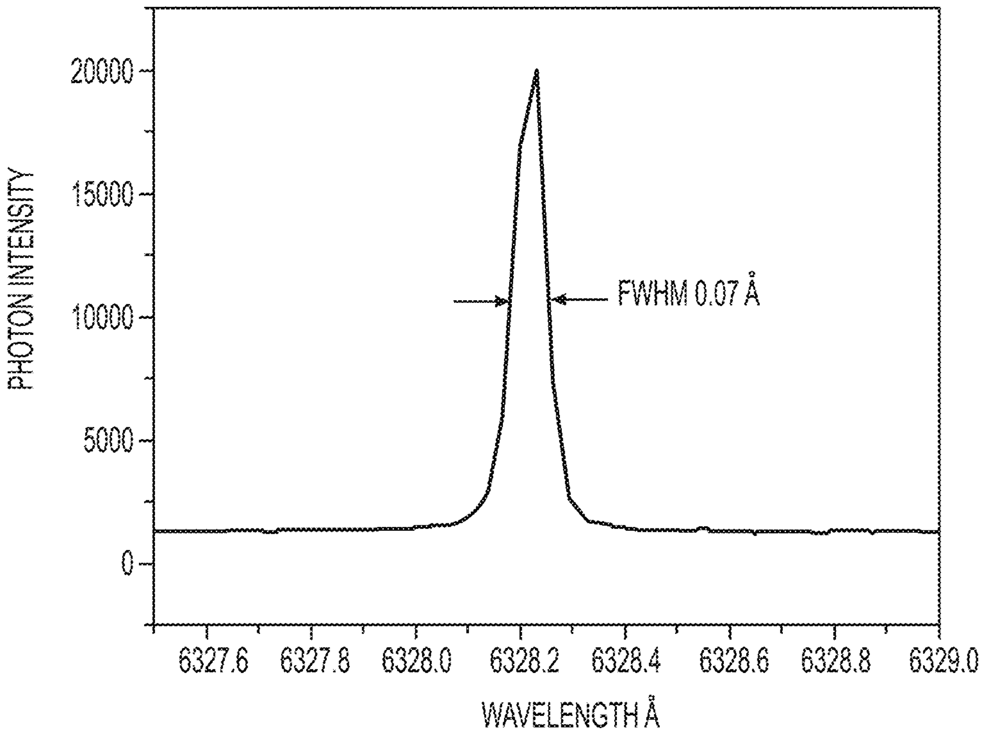
FIGS. 26A-B show the high resolution, visible spectra in the spectral region of the H Balmer α line measured using the Jobin Yvon Horiba 1250 M spectrometer with a 20 μm slit. (A) The full width half maximum (FWHM) of the 632.8 nm HeNe laser line was 0.07 Å that confirmed the high spectral resolution. (B) The FWHM of the Balmer α line from the emission of the ignited solid fuel 100 mg Cu+30 mg $H_2O$ sealed in the DSC pan was 22.6 Å corresponding to an electron density of $3.96\times10^{23}/m^3$. The line was shifted by +1.2 Å. The plasma was almost completely ionized at the blackbody temperature of 6000 K. The Balmer α line width from the emission of the ignited solid fuel 100 mg Ti+30 mg $H_2O$ sealed in the DSC pan could not be measured due to the excessive width, significantly greater than 24 Å corresponding to a 100% ionized plasma at a blackbody temperature of at least 5000 K.
Figure 26B:
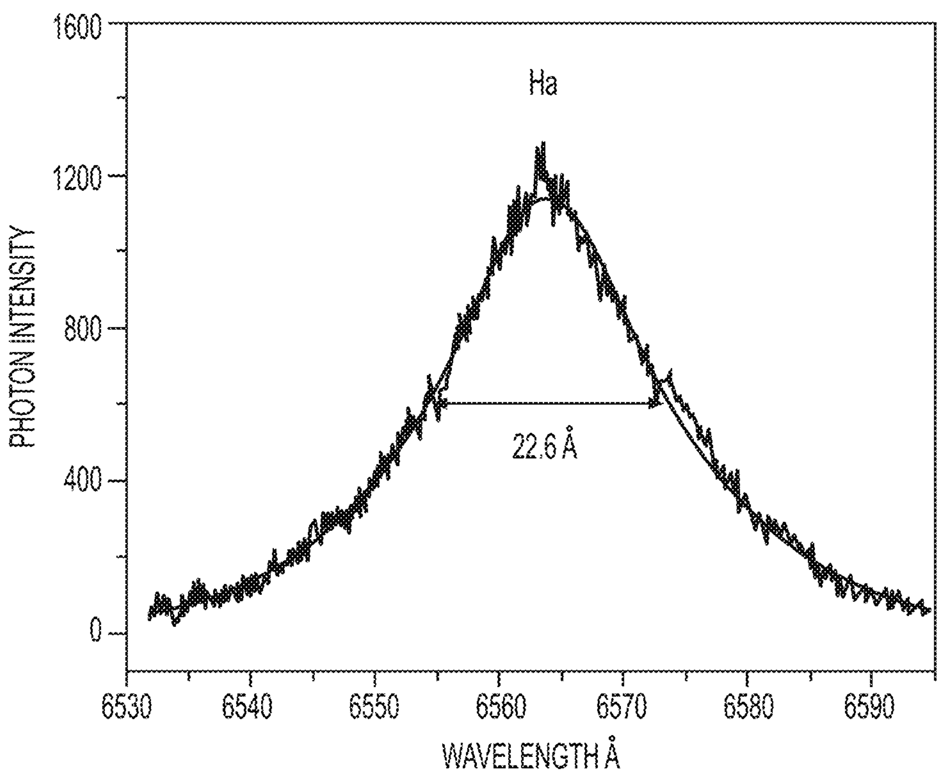

The high resolution, visible spectra in the spectral region of the H Balmer α line measured using the Jobin Yvon Horiba 1250 M spectrometer with 20 μm slits is shown in FIGS. 26A-B. The full width half maximum (FWHM) of the 632.8 nm HeNe laser line was 0.07 Å that confirmed the high spectral resolution. In contrast, the FWHM of the Balmer α line from the emission of the ignited solid fuel 100 mg Cu+30 mg $H_2O$ sealed in the DSC pan was massively broadened, and the line was shifted by +1.1 Å. The Voigt-fit to the spectral profile gave FWHM of 22.6 Å broadening that is far too excessive to comprise a significant Doppler or pressure broadening contribution. An electron density of $4\times10^{23}/m^3$ was determined from the Stark broadening using the formula of Gigosos et al. with the corresponding full width half area of 14 μl. The plasma was almost completely ionized at the blackbody temperature of 6000 K. The Balmer α line width from the emission of the ignited solid fuel 80 mg Ti+30 mg $H_2O$ sealed in the DSC pan could not be measured due to the excessive width, significantly greater than 24 Å, corresponding to a 100% ionized plasma at a blackbody temperature of at least 5000 K.

5. Spectroscopic Measurement of the Visible Optical Power Balance

Figure 27:
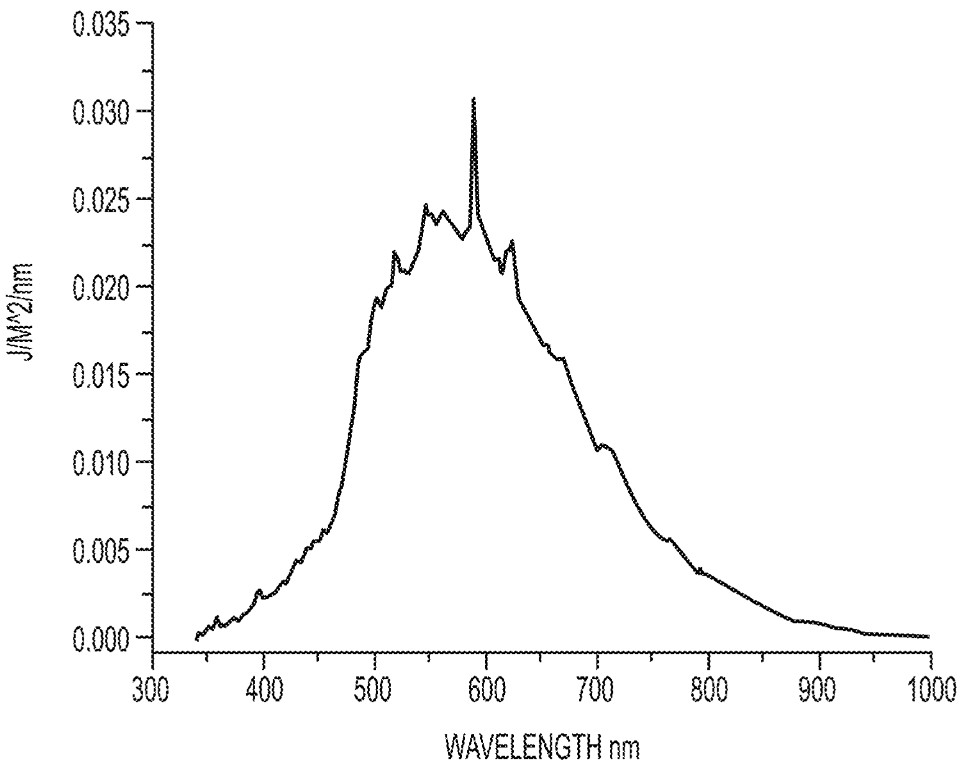
FIG. 27 shows the optical energy density spectrum (350 nm to 1000 nm) measured with the Ocean Optics spectrometer by temporal integration of the power density spectrum taken over a time span of 5 s to collect all of the optical energy from the 0.5 ms light emission pulse of the ignited solid fuel 100 mg Ti+30 mg $H_2O$ sealed in a DSC pan. The energy density obtained by integrating the energy density spectrum was 5.86 $J/m^2$ recorded at a distance of 353.6 cm.

The visible energy density spectrum of the plasma following ignition of the solid fuel 80 mg Ti+30 mg $H_2O$ sealed in the DSC pan recorded with the Ocean Optic spectrometer is shown in FIG. 27. As determined from the Stark broadening (Sec. c.4), the plasma is essentially 100% ionized; consequently, it is a blackbody radiator. The spectral profile closely matching that of the Sun (FIG. 23) corresponds to the blackbody temperature of about 5000 K. This temperature can be used to calculate the irradiance R or power per unit area that can be compared to the measured irradiance. In contrast, no blackbody emission was observed in the visible region when the Al pan alone was run in the absence of $H_2O$-based solid fuel. Only line emission was observed.

From Wien's displacement law, the wavelength $\lambda_{max}$ having the greatest energy density of a blackbody at T=5000 K is $$\lambda_{max} = \frac{hc}{4.965kT} = 580 \text{ nm} \tag{234}$$

The Stefan-Boltzmann law equates the power radiated by an object per unit area, R, to the emissivity, e, times the Stefan-Boltzmann constant, σ, times the fourth power of the temperature, $T^4$.

$$R = e\sigma T^4 \tag{235}$$

The emissivity e=1 for an optically thick plasma comprising a blackbody, $\sigma=5.67\times10^{-8}$ $Wm^{-2}K^{-4}$, and the measured blackbody temperature is 5000 K. Thus, the power radiated per unit area by the ignited solid fuel is $$R = (1)(\sigma = 5.67\times10^{-8}\ Wm^{-2}K^{-4})(5000\ \text{K}) = 35\times10^{6}\ Wm^{-2} \tag{236}$$

As reported in Sec. c.2, the measured propagation velocity of the expanding plasma is sound speed. The radius average $r_{ps}$ of the plasma sphere of 5000 K can be calculated from the sound speed propagation velocity and the temporal evolution of the light emission duration. Using the sound speed of 343 m/s (FIG. 22) and the 500 μs duration recorded with the fast photodiode (FIG. 24) on solid fuel 80 mg Ti+30 mg $H_2O$ sealed in the DSC pan, the average radius $r_{ps}$ of the plasma sphere is $$r_{ps} = \frac{1/2vt^2}{t} = 8.57 \text{ cm} \tag{237}$$

The optical energy density obtained by integrating the energy density spectrum measured with the Ocean Optic spectrometer was 5.86 J/m$^2$, recorded at a distance of 353.6 cm. Dividing the measured optical energy density by the pulse duration time of $5\times10^{-4}$ s gives the power density at the stand-off distance of 353.6 cm. The power density at the average radius of the plasma sphere is given by multiplying by the square of the ratio of the standoff radius and the average plasma sphere radius (353.6 cm/8.57 cm)$^2$. The resulting measured optical power is 21 MW/m$^2$ in good agreement with Eq. (236) considering that the signal increased by 70% with a back stream of gas flow to partially remove the optically thick metal powder dust created by the blast and further considering that some energy is outside of the wavelength region of the spectrometer.

6. EUV Spectra of Ignited Solid Fuels

Figure 28:
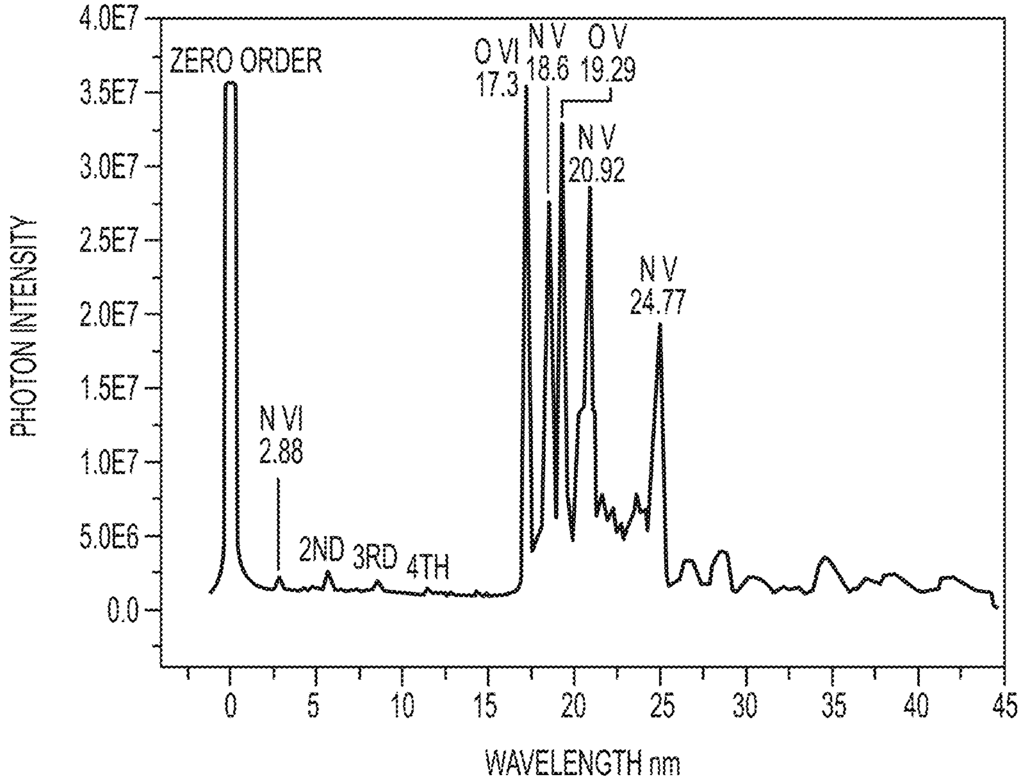
FIG. 28 shows the calibration emission spectrum (0-45 nm) of a high voltage pulsed discharge in air (100 mTorr) with W electrodes recorded using the EUV grazing incidence spectrometer with the 600 lines/mm grating and Al filters showing that only known oxygen and nitrogen lines and the zero order peak were observed in the absence of a continuum.
Figure 29:
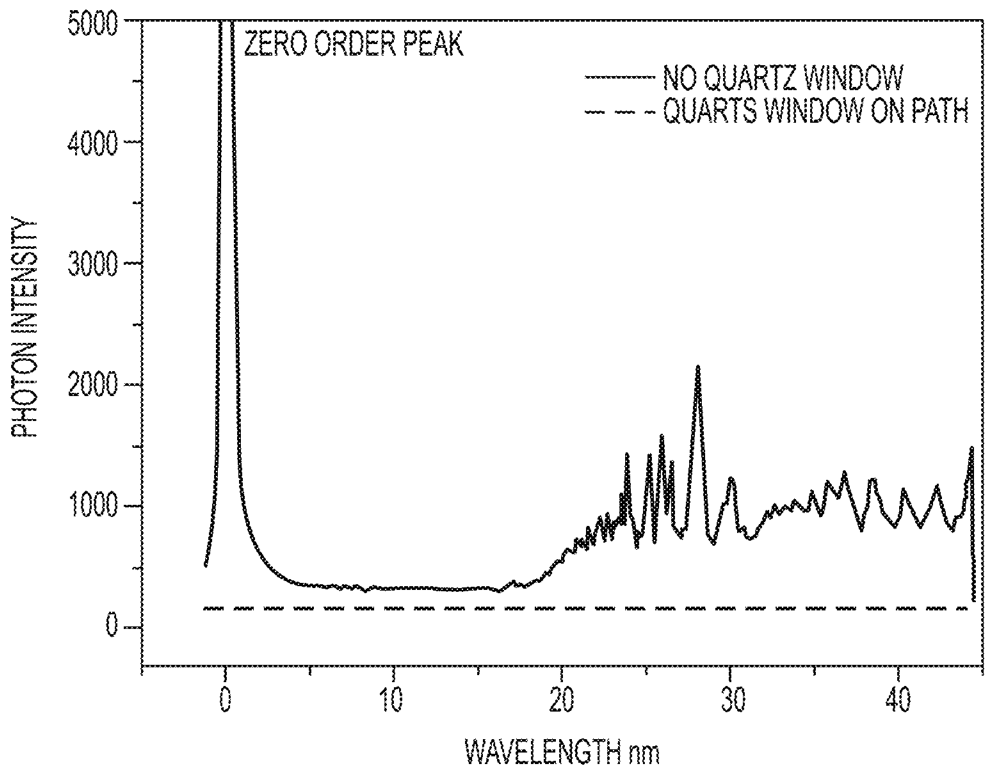
FIG. 29 shows the emission spectra (0-45 nm) of the plasma emission of the conductive NiOOH pellet ignited with a high current source having an AC peak voltage of less than 15 V recorded with two Al filters alone and additionally with a quartz filter. Only EUV passes the Al filters, and the EUV light is blocked by the quartz filter. A strong EUV continuum with secondary ion emission was observed in the region 17 to 45 nm with a characteristic Al filter notch at 10 to 17 nm as shown in FIG. 17A. The EUV spectrum (0-45 nm) and intense zero order peak were completely cut by the quartz filter confirming that the solid fuel plasma emission was EUV.
Figure 30:
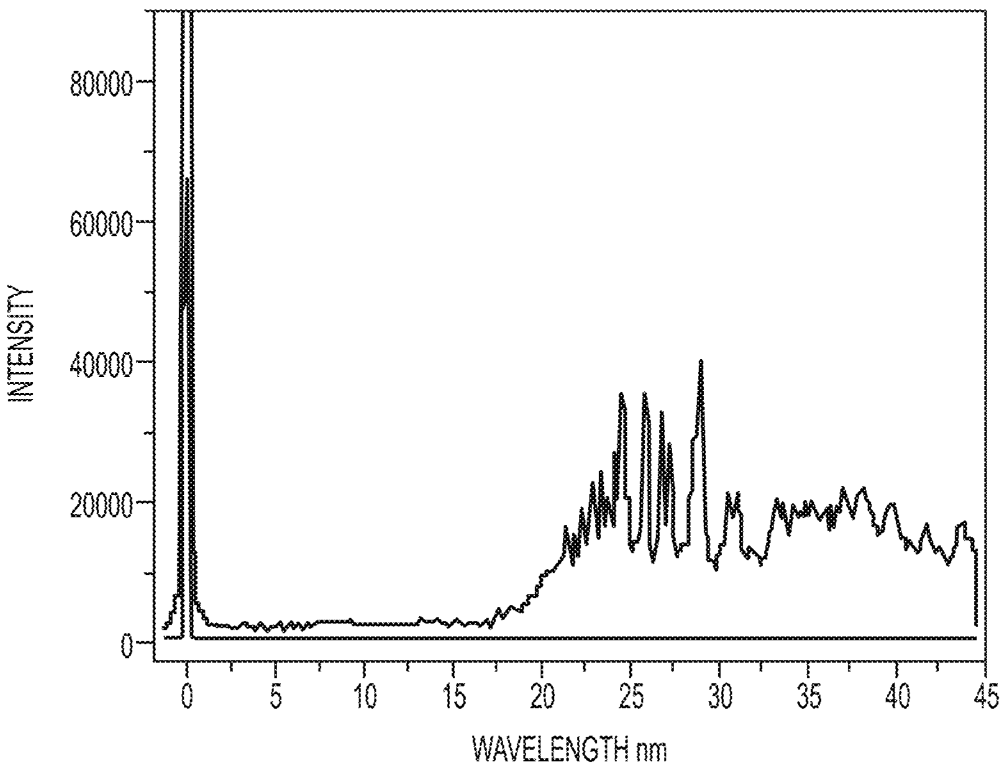
FIG. 30 shows the emission spectrum (0-45 nm) of the plasma emission of a 3 mm pellet of the conductive Ag (10%)-Cu/$BaI_2$ $2H_2O$ fuel ignited with a high current source having an AC peak voltage of less than 15 V recorded with two Al filters with a superimposed expansion to present details. A strong EUV continuum with secondary ion emission was observed in the region 17 to 45 nm with a characteristic Al filter notch at 10 to 17 nm as shown in FIG. 17A.
Figure 31:
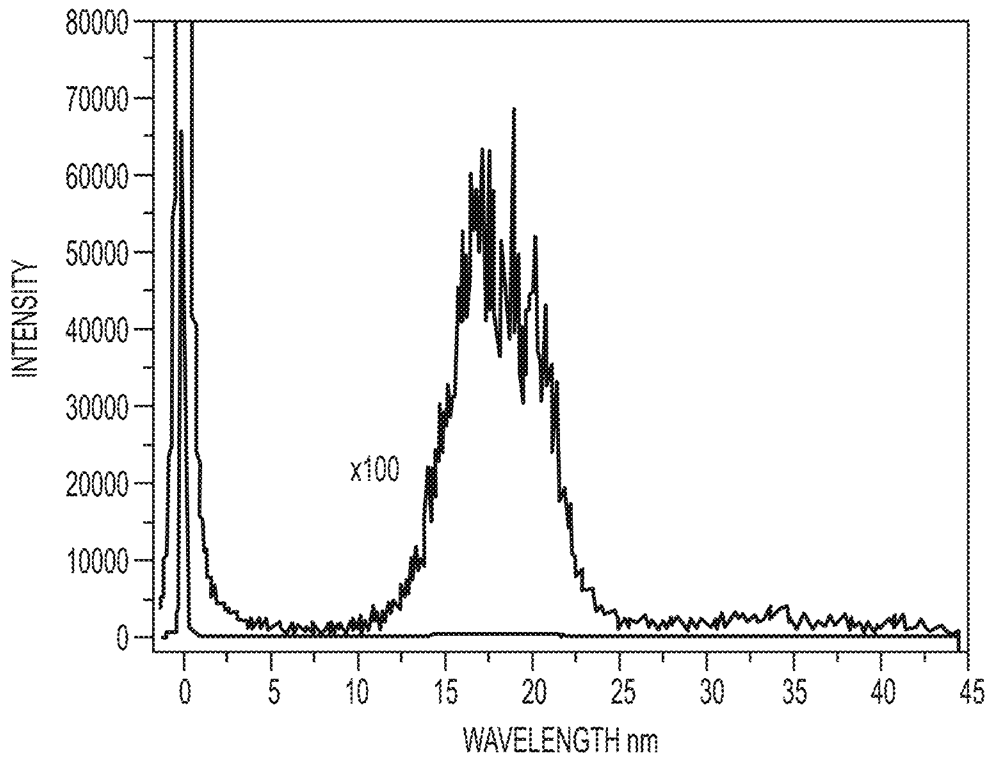
FIG. 31 shows the emission spectrum (0-45 nm) of the plasma emission of a 3 mm pellet of the conductive Ag (10%)-Cu/$BaI_2$ $2H_2O$ fuel ignited with a high current source having an AC peak voltage of less than 15 V recorded with two Al filters with a superimposed expansion to present details. A strong EUV continuum with secondary ion emission was observed having a 10.1 nm cutoff as predicted by Eqs. (230) and (233) that was transmitted by the zirconium filter as shown in FIG. 17B.

A wavelength calibration emission spectrum (0-45 nm) of a high voltage pulsed discharge in air (100 mTorr) with Al filters (FIG. 28) showed only known oxygen and nitrogen lines and the zero order peak in the absence of a continuum. Remarkably, a band of EUV emission was observed in the same region of 17 to 40 nm with an intense EUV zero order peak in the spectrum (FIG. 29) of the NiOOH solid fuel that was ignited to a plasma by high current in the absence of a high voltage. The Al filter was confirmed to be intact following the recording of the blast spectrum. A second spectrum recorded on another ignited solid fuel sample with a quartz window of ¼" thickness (that cuts any EUV light but passes visible light) placed in the light path showed a flat spectrum confirming that the short wavelength photon signal was not due to scattered visible light that passed the Al filters. The blast spectra showed a signal cut off below 17 nm that was due to Al filter transmittance notch (FIG. 17A). The radiation of energy greater than 70 eV (shorter wavelength than 17 nm photons) is not possible due to field acceleration since the maximum applied voltage of the power supply was less than 15 V. As confirmation, application of high current to a stand-alone sample of the solid fuel with the power source instrumented with fast parameter diagnostics showed the detonation occurred with a current of about 10,000 A, a voltage of about 5 V, and an input energy of less than 5 J. No EUV radiation was observed when the Al pan was run without the $H_2O$-based solid fuel. Moreover, no known chemical reaction can release more than a few eVs. To eliminate any possible chemical reaction as a source of plasma energy, a solid fuel comprising Ag and Cu metals and hydrated $BaI_2$ with no known exothermic chemistry was run. The emission spectrum (0-45 nm) of the plasma emission of a 3 mm pellet of the conductive Ag (10%)-Cu/$BaI_2$ $2H_2O$ fuel ignited with a high current source having an AC peak voltage of less than 15 V recorded with two Al filters showed strong EUV continuum with secondary ion emission in the region 17 to 45 nm with a characteristic Al filter notch at 10 to 17 nm (FIG. 30). The radiation band in the region of 40 nm to less than 17 nm with the shorter wavelengths cut by the Al filters matched the theoretically predicted transition of H to the hydrino state H(¼) according to Eqs. (227-230) and (233). To search for the 10.1 nm short wavelength cutoff of the H(¼) transition continuum radiation while selectively blocking visible light, a 150 nm thick Zr filter (Luxel Corporation) that has a transmission window in the region of 10 nm (FIG. 17B) was placed in the light path between the grating and CCD detector. The emission spectrum (0-45 nm) of the plasma emission of a 3 mm pellet of the conductive Ag (10%)-Cu/$BaI_2$ $2H_2O$ fuel ignited with the high current AC source showed strong EUV continuum having a 10.1 nm cutoff as predicted by Eqs. (230) and (233) as shown in FIG. 31. The lines observed in the high-energy EUV region (FIGS. 29-31) must be due to ion lines of the solid fuel material from the absorption of high-energy from a source other than the electric field. The emission lines are expected on top of the hydrino continuum radiation due to absorption of this background radiation and reemission as spectral lines. The same mechanism applies to H pinch plasma emission, and it explains the presence of highly ionized ions of nonthermal nature in the Sun and other astronomical sources as shown in Sec. c.9.

Figure 32:
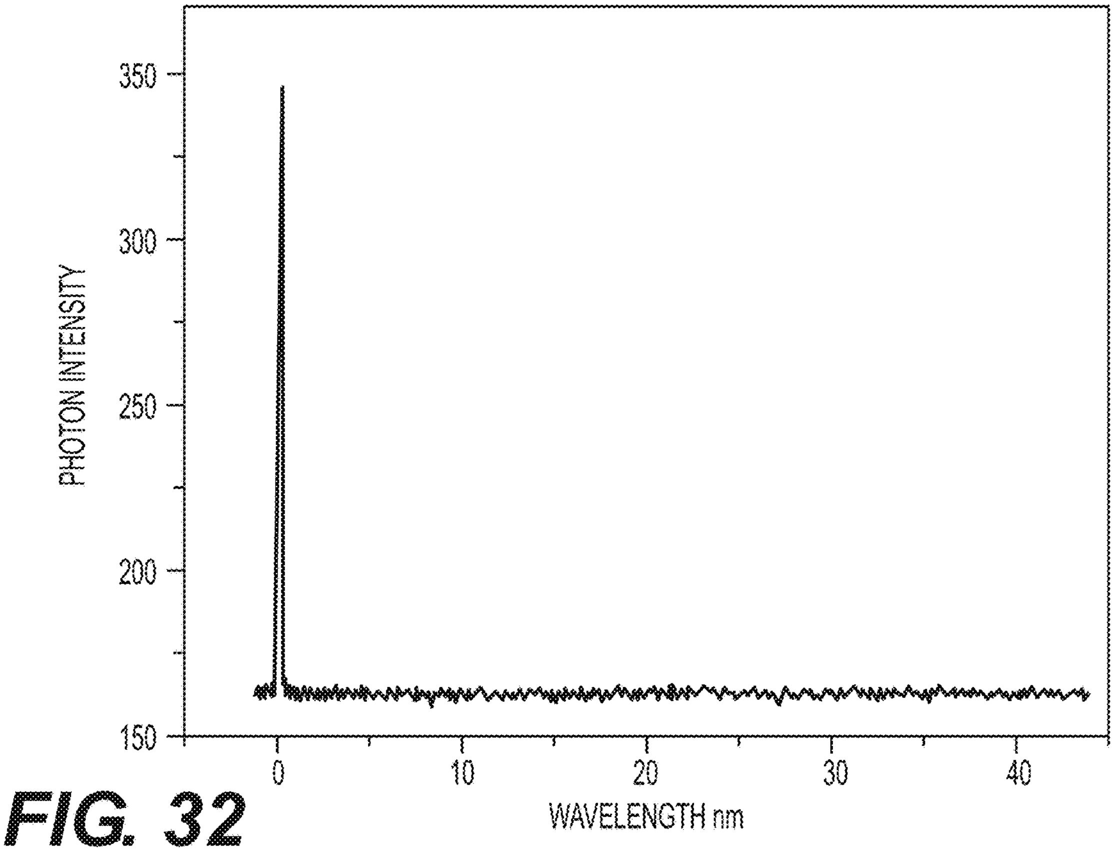
FIG. 32 shows the emission spectra (0-45 nm) of the plasma emission of paraffin wax sealed in the conductive DSC pan ignited with a high current source having an AC peak voltage of less than 15 V recorded with the two Al filters alone and additionally with a quartz filter. A zero order EUV peak was observed. The zero order peak was completely cut by the quartz filter confirming that the solid fuel plasma emission was EUV.

In addition to HOH, m H atom catalyst was tested as evidenced by the observation of EUV radiation from a solid fuel comprising a highly conductive material and a source of hydrogen such as a hydrocarbon. As in the case of $H_2O$-based solid fuels, paraffin wax in the DSC pan was detonated with a low voltage (<15 V), high current (10,000-30,000 A). No EUV light was observed from the Al DSC pan that was initially dehydrated by heating in vacuum or an inert atmosphere. However, the EUV spectrum (FIG. 32) of wax in the DSC pan showed EUV radiation in the zero order that was significant enough to be confirmatory of m H serving as a catalyst to form hydrinos. As in the case of HOH produced EUV, there is no conventional explanation. The EUV intensity may be less than proportional to heat that was observed calorimetrically due to the expanding plasma being optically thick. Moreover, ignition of a hydrocarbon-based solid fuel may produce some matching conditions as those that exist on the surface of the Sun and stars such as white dwarf stars, essentially liquid density of H atoms of a blackbody radiator at 5500-6000 K. So, the kinetics of hydrino formation should be appreciable with the high densities of H formed in the ignition plasma with the presence of the arc current condition. The most favorable transition based on the kinetics of multi-body reactions is H to H(½) that has continuum radiation with $\lambda \geq 91.2$ nm, outside the range of the grazing incidence EUV spectrometer and Al filter. The observation of the lower intensity zero order EUV is consistent with expectations.

7. Spectroscopic Measurement of the EUV Optical Power Balance

Figure 33:
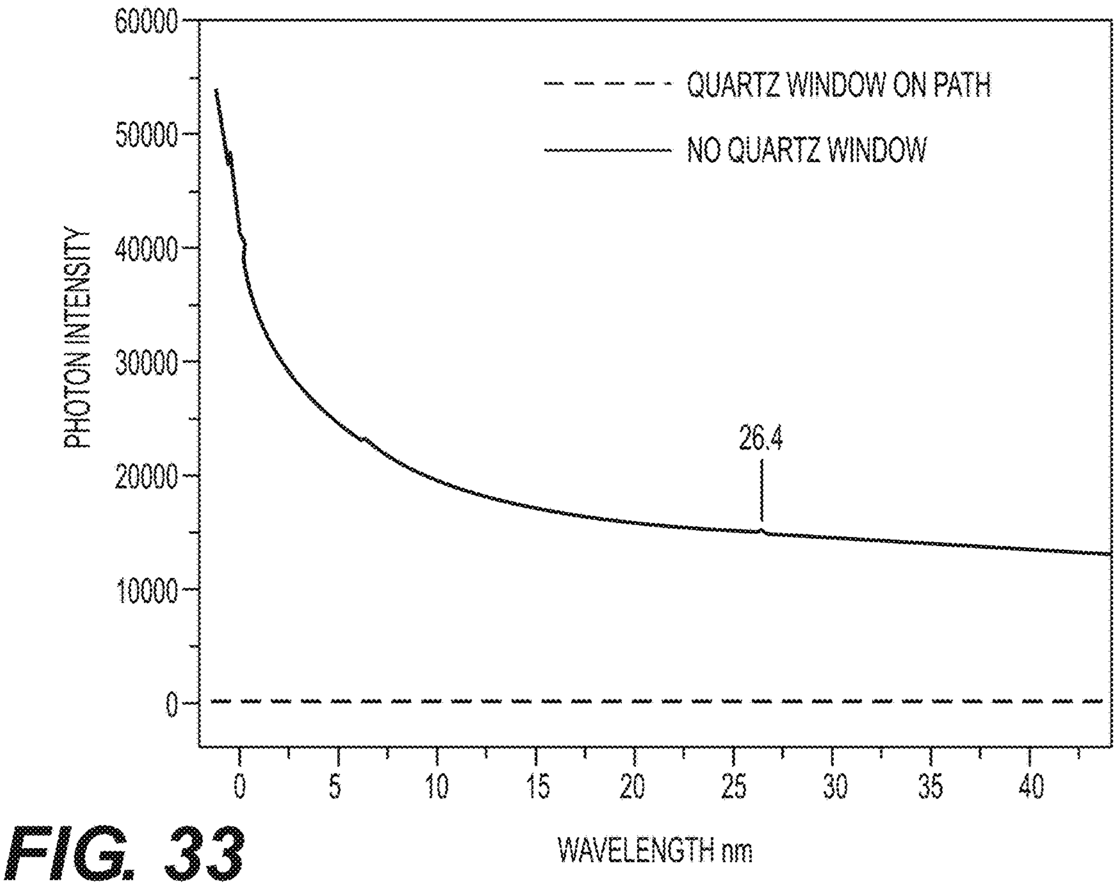
FIG. 33 shows the emission spectra (0-45 nm) of the plasma emission of conductive NiOOH pellet ignited with a high current source having an AC peak voltage of less than 15 V recorded with two Al filters alone and additionally with a quartz filter. An extraordinarily intense zero order peak and EUV continuum was observed due to EUV photon scattering of the massive emission and large slit width of 100 μm. The emission comprised $2.32\times10^7$ photon counts that corresponded to a total distance-and-solid-angle-corrected energy of 148 J of EUV radiation. The EUV spectrum (0-45 nm) and zero order peak were completely cut by the quartz filter confirming that the solid fuel plasma emission was EUV.

The emission spectra (0-45 nm) of the plasma emission of a second conductive NiOOH pellet ignited with a high current source having an AC peak voltage of less than 15 V recorded with two Al filters alone and additionally with a quartz filter are shown in FIG. 33. An extraordinarily intense zero order peak and EUV continuum was observed due to EUV photon scattering of the massive emission and large slit width of 100 μm. The EUV spectrum (0-45 nm) and zero order peak was completely cut by the quartz filter confirming that the solid fuel plasma emission was EUV. The emission comprised $2.32\times10^7$ photon counts. Using a standard energy light source, the total energy of the EUV emission can be determined.

In pinch plasma, the total energy $E_T$ is the sum of the joule heating energy $E_j$ and the radiation energy $E_r$ wherein the joule heating energy $E_j$ is about equivalent to the radiation energy $E_r$:

$$E_j \approx E_r \tag{238}$$

The energy stored in the capacitors $E_C$ having capacitance C=104 nF and voltage V=10,000 volts is $$E_c = \frac{1}{2}CV^2 = (0.5)(104\times 10^{-9})(1\times 10^4)^2 = 5.2 \text{ J} \tag{239}$$

From Eq. (238), $$E_r = \frac{5.2J}{2} = 2.6J \tag{240}$$

Based on the spectrum shown in Sec. c.1, the EUV radiation is more than 95% of the total radiation. Thus, $E_r$ becomes $$E_r = (0.95)(2.6J) = 2.5J \tag{241}$$

This energy is discharged into the hydrogen gas in a volume of about 14 μl such the emission can be treated as a point source. Next, the correction for distance and solid angle is calculated. The distance from plasma to spectrometer slits was 750 mm. Thus, using Eq. (241), the incident EUV energy density $E_i$ of the $H_2$ pinch plasma at the slits was $$E_i = \frac{E_r}{4\pi(750 \text{ mm})^2} = \frac{2.5 \text{ J}}{4\pi(750 \text{ mm})^2} = 3.54\times 10^{-7} \text{ J/mm}^2 \tag{242}$$

Using the slit dimensions, the photon energy $E_s$ passing through the 50 um slits was $$E_s = (2 \text{ mm})(50\times 10^{-3} \text{ mm})(3.54\times 10^{-7} \text{ J/mm}^2) = 3.54\times 10^{-8} \text{ J} \tag{243}$$

Correcting for the grating efficiency for EUV of 15%, the CCD quantum efficiency (QE) for EUV of 90%, the Al filter transmission rate (0.15 um Al foil) of 80%, and the Al filter transmission rate (0.8 um Al foil) of 15% gives a calculated detection energy $E_{cal}$ of $$E_{cal} = (0.15)(0.90)(0.80)(0.15)(3.54\times 10^{-8} \text{ J}) = 5.73\times 10^{-10} \text{ J} \tag{244}$$

The total EUV photon counts of the calibration $H_2$ pinch plasma spectrum was 391759. Using the average photon wavelength of 40 nm wherein the Al filter has a band pass from 17 to 80 nm, the corresponding measured or observed energy $E_{obs}$ was $$E_{obs} = (391759 \text{ photons})(4.97\times 10^{-8} \text{ J/photon}) = 1.95\times 10^{-12} \text{ J} \tag{245}$$

The ratio of the calculated ($E_{cal}$) and observed energy ($E_{obs}$) given by Eqs. (244) and (245) calibration factor $C_0$ is $$C_0 = \frac{E_{cal}}{E_{obs}} = \frac{5.73\times 10^{-10} J}{1.95\times 10^{-12} J} = 294 \tag{246}$$

This factor accounts for other inefficiencies in the detection.

The total EUV photon counts of the NiOOH ignition plasma spectrum (FIG. 33) was 23170428. Using Eq. (245) gives an observed energy $E_{obs}$ of $$E_{obs} = (23170428 \text{ photons})(4.97\times 10^{-18} J\text{/photon}) = 1.15\times 10^{-10} J \tag{247}$$

Correcting $E_{obs}$ of Eq. (247) by $C_0$ (Eq. (246)), and the efficiencies of the grating, CCD QE, and two Al foils (Eq. (244)), the photon energy $E_s$ passing through the slit was $$E_s = C_0\frac{E_{obs}}{(0.15)(0.90)(0.80)(0.15)} = (294)\frac{1.15\times 10^{-10} J}{(0.15)(0.90)(0.80)(0.15)} = 2.09\times 10^{-6} J \tag{248}$$

Using Eqs. (248) and (243), the EUV incident energy density $E_i$ of the ignition plasma at the 100 um slits was $$E_i = \frac{E_s}{(2 \text{ mm})(100\times 10^{-3} \text{ mm})} = \frac{2.09\times 10^{-6} J}{(2 \text{ mm})(100\times 10^{-3} \text{ mm})} = 1.05\times 10^{-5} J\text{/mm}^2 \tag{249}$$

In the case that the average radius of the plasma was 85.7 mm (Eq. (237)), the blast energy density at the radius of the emitting plasma $E_{r(ps)}$ was $$E_{r(ps)} = 1.05\times 10^{-5} J\text{/mm}^2\left(\frac{750 \text{ mm}}{85.7 \text{ mm}}\right)^2 = 8.04\times 10^{-4} J\text{/mm}^2 \tag{250}$$

Eq. (238) takes into consideration that about ½ of the energy input to a plasma such as the $H_2$ pinch plasma is dissipated in joule heating from plasma resistive power ($I^2R$). In the case of the ignition plasma there is no such resistive heating to diminish the radiative energy component of the total energy. However, there is loss of the radiative energy by absorption. The detonation plasma initiated at the optically thick condition of atmospheric pressure and expanded into vacuum in the chamber of the EUV spectroscopy setup to become optically thin. However, the EUV radiation was down-converted into visible radiation until the plasma became at least partially transparent to EUV. The total energy $E_T$ is given by integration of $E_{r(ps)}$ (Eq. (250)) over the solid angle at the radius $r_{ps}$ given by Eq. (237). Using Eq. (242) with Eq. (238), that reasonably corrects for counting only the transmitted EUV radiation energy, gives a total EUV energy $E_T$ of $$E_T=(2)(4\pi r_{ps}^2E_{r(ps)})=8\pi(85.7\text{ mm})^2 8.04\times10^{-4}\ J/\text{mm}^2=148\ J \quad (251)$$

As discussed in Sec. c.6, the electric field ionization of charged particles and subsequent recombination emission in the EUV energy region is not possible due to the low applied field and the high collisional nature of the atmospheric pressure conditions. Conventional reactions cannot produce light in this high-energy region. Moreover, the decomposition of 2NiOOH to $Ni_2O_3$+$H_2O$ is endothermic; so, no energy is even expected. The massive EUV emission is the source of ionization to form fully ionized plasma (Sec. c.2) and highly ionized ions as shown in FIGS. 29-31 that is extraordinary given the atmospheric pressure condition. Highly ionized ions are also formed by absorption of the continuum radiation background shown in FIGS. 18A-D and FIG. 19 wherein the plasma is optically thin with an otherwise insufficiently low electron temperature of <10 eV.

Figure 34:
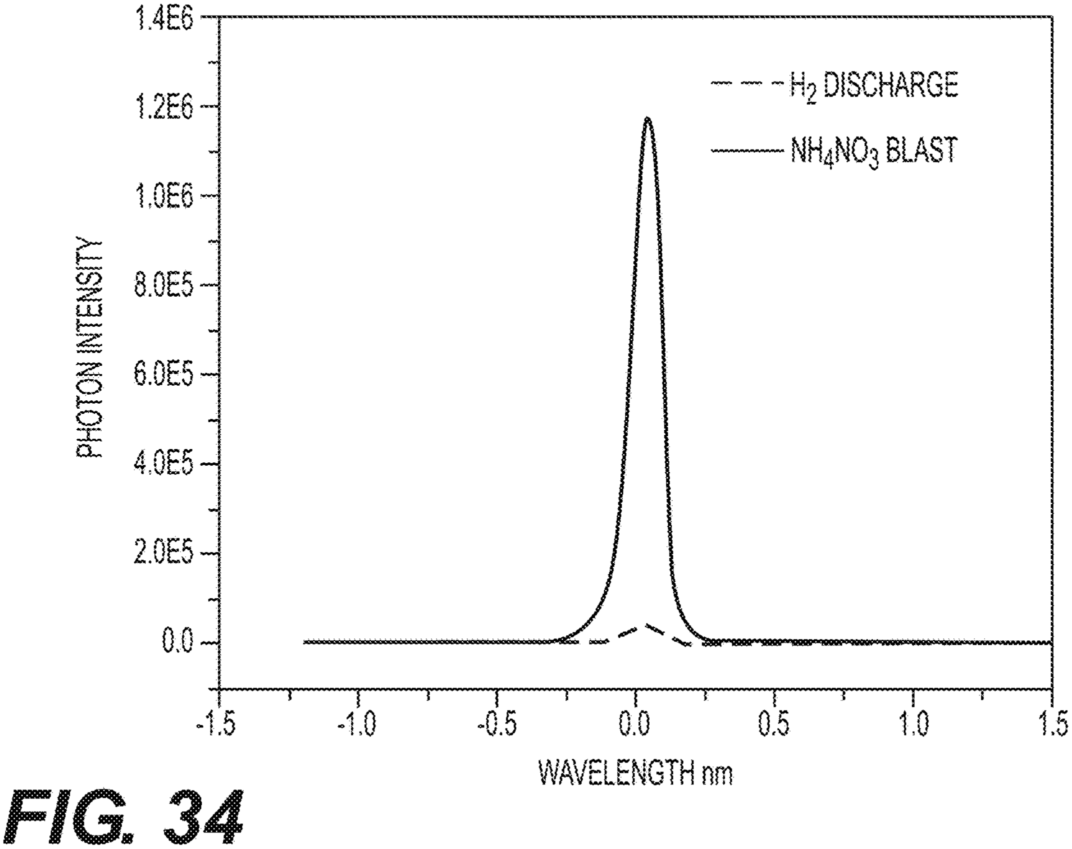
FIG. 34 shows the emission spectra (0-45 nm) of the plasma emission of 5 mg energetic material $NH_4NO_3$ sealed in the conductive Al DSC pan ignited with a high current source having an AC peak voltage of less than 15 V recorded with two Al filters alone and additionally with a quartz filter. An extraordinarily intense zero order peak was observed as shown by the comparison with $H_2$ pinch discharge emission (lower trace). The emission corresponded to a total distance-and-solid-angle-corrected energy of 125 J of EUV radiation. The EUV spectrum (0-45 nm) and zero order peak were completely cut by the quartz filter confirming that the solid fuel plasma emission was EUV.

The emission spectra (0-45 nm) of the plasma emission of 5 mg energetic material $NH_4NO_3$ sealed in the conductive Al DSC pan ignited with a high current source having an AC peak voltage of less than 15 V recorded with two Al filters alone and additionally with a quartz filter are shown in FIG. 34. An extraordinarily intense zero order peak was observed as shown by comparison with $H_2$ pinch discharge emission (lower trace) recorded using the methods of Sec. b. 1. The EUV spectrum (0-45 nm) and zero order peak was completely cut by the quartz filter confirming that the solid fuel plasma emission was EUV. The emission comprised 9.82×$10^6$ photon counts. Using the calibration factor $C_0$ (Eq. (246)) and efficiency and dimensional corrections, the total energy of the EUV emission can be determined.

The total EUV photon counts of the $NH_4NO_3$ ignition plasma spectrum (FIG. 34) is 9818041. Using Eq. (245) gives an observed energy $E_{obs}$ of $$E_{obs}=(9818041\text{ photons})(4.97\times10^{-18}\ J/\text{photon})=4.88\times10^{-11}\ J \quad (252)$$

Correcting $E_{obs}$ of Eq. (252) by $C_0$ (Eq. (246)), and the efficiencies of the grating, CCD QE, and two Al foils (Eq. (244)), the photon energy $E_s$ passing through the slit was $$E_s=C_0\frac{E_{obs}}{(0.15)(0.90)(0.80)(0.15)}=(294)\frac{4.48\times10^{-11}\ J}{(0.15)(0.90)(0.80)(0.15)}=8.86\times10^{-7}\ J \quad (253)$$

Using Eqs. (253) and (243), the EUV incident density $E_i$ of the ignition plasma at the 50 um slits was $$E_i=\frac{E_s}{(2\text{ mm})(50\times10^{-3}\text{ mm})}=\frac{8.86\times10^{-7}\ J}{(2\text{ mm})(50\times10^{-3}\text{ mm})}=8.86\times10^{-6}\ J/\text{mm}^2 \quad (254)$$

In the case that the average radius of the plasma was 85.7 mm (Eq. (237)), the blast energy density at the radius of the emitting plasma $E_{r(ps)}$ was $$E_{r(ps)}=8.86\times10^{-6}\ J/\text{mm}^2\left(\frac{750\text{ mm}}{85.7\text{ mm}}\right)^2=6.79\times10^{-4}\ J/\text{mm}^2 \quad (255)$$

The total energy $E_T$ is given by integration of $E_{r(ps)}$ (Eq. (255)) over the solid angle at the radius $r_{ps}$ given by Eq. (237). Using Eq. (242) with Eq. (238), that reasonably corrects for counting only the transmitted EUV radiation energy, gives a total EUV energy $E_T$ of $$E_T=(2)(4\pi r_{ps}^2E_{r(ps)})=8\pi(85.7\text{ mm})^2 6.79\times10^{-4}\ J/\text{mm}^2=125\ J \quad (256)$$

The solid fuel $NH_4NO_3$ is a well-known energetic material that does release energy upon thermal decomposition. The decomposition reaction of $NH_4NO_3$ to $N_2O$ and $H_2O$ calculated from the heats of formation is exothermic by ΔH=−124.4 kJ/mole $NH_4NO_3$:

$$NH_4NO_3\rightarrow N_2O+2H_2O \quad (257)$$

At elevated temperature, further decomposition occurs. The decomposition reaction energy of $NH_4NO_3$ to $N_2$, $O_2$, and $H_2O$ calculated from the heats of formation is exothermic by ΔH=−206 kJ/mole $NH_4NO_3$:

$$NH_4NO_3\rightarrow N_2+1/2O_2+2H_2O \quad (258)$$

For 5 mg $NH_4NO_3$, the theoretical energy release is 12.8 J (Eq. (258)). Assuming slow kinetics for the oxidation of Al metal pan, the experimental calorimetrically measured energy balance was measured to be 442.7 J, 34.6 times the most exothermic conventional chemistry reaction given by Eq. (234). The high excessive energy balance was confirmed by replacing the conductive Al matrix with non-reactive Ag. The soft X-ray emission energy of 125 J (Eq. (256)) is 10 times the theoretical energy considering this component alone. The additional energy is attributed to the formation of hydrino. The observation of massive soft X-ray confirms hydrogen has lower energy levels. The hydrino reaction produces 200 times the energy of the conventional chemistry of high explosives that have CHNO structures favorable for forming HOH and H (Eqs. (227-230)). The emission of soft X-rays from energetic material $NH_4NO_3$ is very strong evidence that the mechanism of shock wave production in high explosives comprising a source of H and HOH such as those having the elemental composition CHNO is based on the extraordinary energy released by the formation of $H_2$(¼). Indeed, $H_2$(¼) was observed spectroscopically as the product of the gun powder reaction and the reaction of $NH_4NO_3$, and EUV continuum radiation (1500 counts of zero order radiation) was observed from gun powder in the present studies. The extraordinary energy and hydrino product identification have ramifications for an approach to exploiting the hydrino mechanism of the shock wave of energetic materials to enhance this property. As given in Sec. c.2, all of the $H_2O$-based solid fuels ignited and produced a shock wave behaving as energetic materials with the exception that essentially all the power was in the form of visible radiation rather than pressure-volume.

8. LED Power Balance of SF-CIHT Cell Having Photovoltaic Conversion

The detonations of solid fuel 80 mg Ti+30 mg $H_2O$ produced brilliant flashes of light with white color consistent with the measured blackbody temperature being the same as the Sun, 5500-6000 K (Sec. c.2). The series of sequential detonations of the Ti+$H_2O$ pellets at 1 Hz maintained the LED array at essentially continuous operation at full light output. Consider the balance of the energy released by the solid-fuel-pellet detonations and the energy collected by the three solar panels. On average per fuel pellet, the LEDs output about 60 W for about 1 s even though the blast even was much shorter, 500 μs (Sec. c.2). The polycrystalline photovoltaic material had a response time and maximum power that was not well suited for a megawatt short burst. But, due to some capacitance, the solar cells served as a load leveler of the about 60 J energy over the 1 s time interval per pellet detonation. The reflection of the light at the Lexan was determined to be about 40% with a corresponding transmission of 60%, and the polycrystalline cells were rated to have a maximal efficiency of 12% at converting 5800 K light into electricity. Thus, the effective efficiency was about 7.2%. Not including the light lost from the back side, top, and bottom of the plasma, correcting the 60 J for the 7.2% efficiency corresponds to 833 J. This energy matches the measured calorimetric energy balance as well as the optical power balance given in Sec. c.5 wherein corresponding optical power incident on the solar panel over the 500 μs ignition event was 1.67 MW (833 J/500 μs). The typical energy to cause detonation was about 60 J for these DSC pellets that required melting followed by detonation. The corresponding energy gain was about 14×. Twenty-five year warranty, triple junction concentrator photovoltaics (PV) at high power irradiation have achieved 50% conversion efficiency at over 1 $MW/m^2$, and new generation PV cells are being developed with 10 times this intensity capability. Commercial viability is demonstrated by these results.

9. Astrophysical Data Supporting the m H Catalyst Mechanism

The EUV continuum results of the disclosure offer resolution to many otherwise inexplicable celestial observations with (a) the energy and radiation from the hydrino transitions being the source of extraordinary temperatures and power regarding the solar corona problem, the cause of sunspots and other solar activity, and why the Sun emits X-rays, (b) the hydrino-transition radiation being the radiation source heating the WHIM and behind the observation that diffuse H α emission is ubiquitous throughout the Galaxy requiring widespread sources of flux shortward of 912 Å, and (c) the identity of dark matter being hydrinos.

Stars also comprise plasmas of hydrogen with surfaces comprised of essentially dense atomic hydrogen permissive of multi-body H interactions to propagate transition of H to H(1/(m+1) wherein m H serves as the catalyst. Such transitions are predicted to emit EUV continuum radiation according to Eqs. (223-226) and (233). The emission from white dwarfs arising from an extremely high concentration of hydrogen is modeled as an optically thick blackbody of ~50,000 K gas comprising predominantly hydrogen and helium. A modeled composite spectrum of the full spectral range from 10 nm to >91.2 nm with an abundance $He/H=10^{-5}$ from Barstow and Holberg is shown in FIG. 35. Albeit, while white dwarf spectra can be curve fitted using stratification and adjustable He and H column densities and ionization fractions to remove some inconsistencies between optical and EUV spectra and independent measurements of the latter, matching the spectrum at the short-wavelengths is problematic. Alternatively, combining the emission shown in FIGS. 18A-D with the 91.2 nm continuum gives a spectrum with continua having edges at 10.1 nm, 22.8, nm, and 91.2 nm, a match to the white dwarf spectrum. However, the proposed nature of the plasmas and the mechanisms are very different. The emission in our studies is assigned to hydrino transitions in cold-gas, optically-thin plasmas absent any helium. White-dwarf and celestial models may need revision and benefit from our discovery of high-energy H continua emission.

Figure 36:
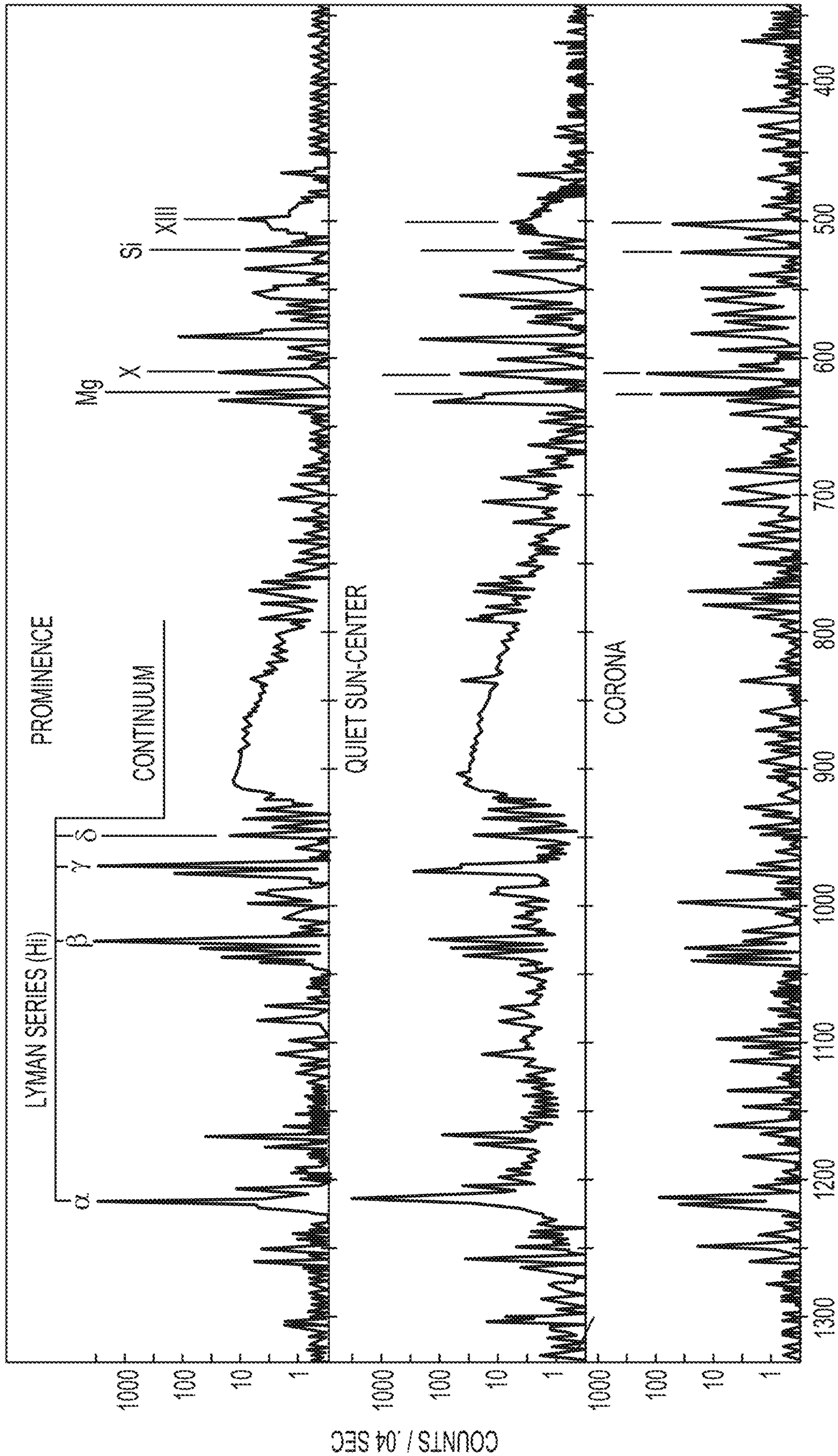
FIG. 36 shows the Skylab (Harvard College Observatory spectrometer) average extreme ultraviolet spectra of the Sun recorded on a prominence (Top), quiet Sun-center (Middle), and corona above the solar limb (Bottom) from M. Stix, *The Sun*, Springer-Verlag, Berlin, (1991), FIG. 9.5, p. 321. In the quiet Sun-center spectrum, the 91.2 nm continuum to longer wavelengths is expected to be prominent and is observed despite attenuation by the coronal gas. The continuum was greatly reduced in the prominence and the corona wherein the H concentration was much reduced and absent, respectively. The emission from chromospheric lines and the continuum was also severely attenuated in the corona. The strongest lines in the coronal spectrum and to a lesser extent the prominence are multiply ionized ions such as the doublets of Ne VIII, Mg X, or Si XII that could be due to absorption of high energy continuum radiation rather than thermal excitation. From E. M. Reeves, E. C. M. Huber, G. J. Timothy, "Extreme UV spectroheliometer on the Apollo telescope mount", Applied Optics, Vol. 16, (1977), pp. 837-848.

For example, there is no existing physical model that can couple the temperature and density conditions in different discrete regions of the outer atmosphere (chromosphere, transition region, and corona) of coronal/chromospheric sources. Typically the corona is modeled to be three orders of magnitude hotter than the surface that is the source of coronal heating seemingly in defiance of the second law of thermodynamics. Reconciliation is offered by the mechanism of line absorption and re-emission of the $m^2 \cdot 13.6$ eV (Eq. (233)) continuum radiation. The 91.2 nm continuum to longer wavelengths is expected to be prominent (less attenuated than the 10.1 nm and 22.8 nm bands) and is observed in the solar extreme ultraviolet spectrum as shown in FIG. 36 despite attenuation by the coronal gas. High-energy-photon excitation is more plausible than a thermal mechanism with $T \sim 10^6$ given the 4000 K surface temperature and the observation of the CO absorption band at 4.7 μm in the solar atmosphere wherein CO cannot exist above 4000 K. Considering the 10.1 nm band as a source, the upper limit of coronal temperature based on excitation of about $10^6$ K is an energy match. In addition to the temperature, another extraordinary observation is that although the total average energy output of the outer layers of the Sun is ≅0.01% of the photospheric radiation, local transient events can produce an energy flux that exceeds the photospheric flux. The energy source of the latter may be magnetic in nature, but the identity of the highly ionizing coronal source is not established. Nor, has the total energy balance of the Sun been reconciled. The possibility of a revolutionary discovery of a new source of energy in the Sun based on a prior undiscovered process is an open question as discussed by Bahcall in his Noble lecture. That m H catalyzed hydrino transitions occur in stars and the Sun [N. Craig, M. Abbott, D. Finley, H. Jessop, S. B. Howell, M. Mathioudakis, J. Sommers, J. V. Vallerga, R. F. Malina, "The Extreme Ultraviolet Explorer stellar spectral atlas", The Astrophysical Journal Supplement Series, Vol. 113, (1997), pp. 131-193] as evident by corresponding continua in its spectrum resolves the solar corona problem, the cause of sunspots and other solar activity, and why the Sun emits X-rays.

The EUV continuum results of the disclosure have further implications for the resolution of the identity of dark matter and the identity of the radiation source behind the observation that diffuse H α emission is ubiquitous throughout the Galaxy and widespread sources of flux shortward of 912 Å are required [S. Labov, S. Bowyer, "Spectral observations of the extreme ultraviolet background", The Astrophysical Journal, 371, (1991), pp. 810-819] as reported by Labov and Boywer. The identity of dark matter has been a cosmological mystery. It is anticipated that the emission spectrum of the extreme ultraviolet background of interstellar matter possesses the spectral signature of dark matter. Labov and Bowyer designed a grazing incidence spectrometer to measure and record the diffuse extreme ultraviolet background. The instrument was carried aboard a sounding rocket, and data were obtained between 80 Å and 650 Å (data points approximately every 1.5 Å). Several lines including an intense 635 Å emission associated with dark matter were observed which has considerable astrophysical importance as indicated by the authors:

Regardless of the origin, the 635 Å emission observed could be a major source of ionization. Reynolds (1983, 1984, 1985) has shown that diffuse H α emission is ubiquitous throughout the Galaxy, and widespread sources of flux shortward of 912 Å are required. Pulsar dispersion measures (Reynolds 1989) indicate a high scale height for the associated ionized material. Since the path length for radiation shortward of 912 Å is low, this implies that the ionizing source must also have a large scale height and be widespread. Transient heating appears unlikely, and the steady state ionization rate is more than can be provided by cosmic rays, the soft X-ray background, B stars, or hot white dwarfs (Reynolds 1986; Brushweiler & Cheng 1988). Sciama (1990) and Salucci & Sciama (1990) have argued that a variety of observations can be explained by the presence of dark matter in the galaxy which decays with the emission of radiation below 912 Å.

The flux of 635 Å radiation required to produce hydrogen ionization is given by $F=\zeta_H/\sigma_\lambda=4.3\times10^4\ \zeta_{-13}$ photons $cm^{-2}s^{-1}$, where $\zeta_{-13}$ is the ionizing rate in units of $10^{-13}s^{-1}$ per H atom. Reynolds (1986) estimates that in the immediate vicinity of the Sun, a steady state ionizing rate of $\zeta_{-13}$ between 0.4 and 3.0 is required. To produce this range of ionization, the 635 Å intensity we observe would have to be distributed over 7%-54% of the sky.

The 63.5±0.47 nm line matches a hydrino transition predicted for H undergoing catalysis with H (m=1) as the catalyst giving rise to a concerted energy exchange of the total energy of 40.8 eV with the excitation of the He $1s^2$ to $1s^12p^1$ transition. The predicted 63.3 nm emission associated with dark matter was observed with the addition of hydrogen to helium microwave plasma. An alternative assignment suggested by Labov and Bowyer is the 63.0 nm line of O V requiring a large-scale non-thermal source of ionization. Continuum radiation from transitions to low-level hydrino states can provide this radiation. Indeed, the observation of the 63.3 nm line is also associated with the presence of an interstellar X-ray background.

The first soft X-ray background was detected and reported [S. Bower, G. Field, and J. Mack, "Detection of an anisotrophic soft X-ray background flux," Nature, Vol. 217, (1968), p. 32] about 25 years ago. Quite naturally, it was assumed that these soft X-ray emissions were from ionized atoms within hot gases. Labov and Bowyer also interpreted the data as emissions from hot gases. However, the authors left the door open for some other interpretation with the following statement from their introduction:

It is now generally believed that this diffuse soft X-ray background is produced by a high-temperature component of the interstellar medium. However, evidence of the thermal nature of this emission is indirect in that it is based not on observations of line emission, but on indirect evidence that no plausible non-thermal mechanism has been suggested which does not conflict with some component of the observational evidence.

The authors also state "if this interpretation is correct, gas at several temperatures is present." Specifically, emissions were attributed to gases in three ranges: 5.5<log T<5.7; log T=6; 6.6<log T<6.8. Observations in the ultraviolet with HST and FUSE [C. W. Danforth, J. M. Shull, "The low-z intergalactic medium. III. H I and metal absorbers at z<0.4", The Astrophysical Journal, Vol. 679, (2008), pp. 194-219] and also XMM-Newton [N. Werner, A. Finoguenov, J. S. Kaastra, A. Simionescu, J. P. Dietrich, J Vink, H. Bohringer, "Detection of hot gas in the filament connecting the clusters of galaxies Abell 222 and Abell 223", Astronomy & Astrophysics Letters, Vol. 482, (2008), pp. L29-L33] confirm these extraordinary temperatures of diffuse intergalactic medium (IGM) and reveal that a large component of the baryonic matter of the universe is in the form of WHIM (warm-hot ionized media). The mysteries of the identity of dark matter, the observed dark interstellar medium spectrum, the source of the diffuse X-ray background, and the source of ionization of the IGM are resolved by the formation of hydrinos that emit EUV and X-ray continua depending on the state transition and conditions; the continua create highly ionized ions that emit ion radiation of non-thermal origin; the hydrino transition H to H(½) results in a 63.3 nm line, and $He^+$ acting as a catalyst of 54.4 eV (2·27.2 eV) pumps the intensity of helium ion lines such as the 30.4 nm line consistent with observations. In interstellar medium there is no required third body to collisionally take away the bond energy for the alternative process of 2H to $H_2$.

The products of the catalysis reactions have binding energies of m·27.2 eV, such that they may further serve as catalysts. Thus, further catalytic transitions may occur:

$$n=\frac{1}{3}\to\frac{1}{4},\frac{1}{4}\to\frac{1}{5},$$

and so on. Thus, lower-energy hydrogen atoms, hydrinos, can act as catalysts by resonantly and nonradiatively accepting energy of m·27.2 eV from another H or hydrino atom. Such disproportionation reactions of hydrinos are predicted to given rise to features in the X-ray region. As shown by Eq. (230) the reaction product of HOH catalyst is $$H\left[\frac{a_H}{4}\right].$$

A likely transition reaction in hydrogen clouds containing $H_2O$ gas is the transition of a H atom to $$H\left[\frac{a_H}{17}\right]$$

wherein $$H\left[\frac{a_H}{4}\right]$$

serves as a catalyst to give a broad peak having a short wavelength cutoff at E=3481.6 eV; 0.35625 nm. A broad X-ray peak with a 3.48 keV cutoff was recently observed in the Perseus Cluster by NASA's Chandra X-ray Observatory and by the XMM-Newton [E. Bulbul, M. Markevitch, A. Foster, R. K. Smith, M. Loewenstein, S. W. Randall, "Detection of an unidentified emission line in the stacked X-Ray spectrum of galaxy clusters," The Astrophysical Journal, Volume 789, Number 1, (2014); A. Boyarsky, O. Ruchayskiy, D. Iakubovskyi, J. Franse, "An unidentified line in X-ray spectra of the Andromeda galaxy and Perseus galaxy cluster," (2014), arXiv:1402.4119 [astro-ph.CO]] that has no match to any known atomic transition. The 3.48 keV feature assigned to dark matter of unknown identity by BulBul et al, matches the $$H\left[\frac{a_H}{4}\right]+H\left[\frac{a_H}{1}\right]\rightarrow H\left[\frac{a_H}{17}\right]$$

transition and further confirms hydrinos as the identity of dark matter.

Evidence for EUV emission from hydrino transitions also comes from interstellar medium (ISM) since it provides a source of the diffuse ubiquitous EUV cosmic background. Specifically, the 10.1 nm continuum matches the observed intense 11.0-16.0 nm band [M. A. Barstow and J. B. Holberg, Extreme Ultraviolet Astronomy, Cambridge Astrophysics Series 37, Cambridge University Press, Cambridge, (2003); R. Stern, S. Bowyer, "Apollo-Soyuz survey of the extreme-ultraviolet/soft X-ray background", Astrophys. J., Vol. 230, (1979), pp. 755-767]. Furthermore, it provides a mechanism for the high ionization of helium of the ISM and the excess EUV radiation from galaxy clusters that cannot be explained thermally [S. Bowyer, J. J. Drake, S. Vennes, "Extreme ultraviolet spectroscopy", Ann. Rev. Astron. Astrophys., Vol. 38, (2000), pp. 231-288]. Moreover, recent data reveals that X-rays from distant active galactic nuclei sources are absorbed selectively by oxygen ions in the vicinity of the galaxy [A. Gupta, S. Mathur, Y. Krongold, F. Nicastro, M. Galeazzi, "A huge reservoir of ionized gas around the Milky Way: Accounting for the missing mass?" The Astrophysical Journal Letters, Volume 756, Number 1, (2012), P. L8, doi:10.1088/2041-8205/756/1/L8]. The temperature of the absorbing halo is between 1 million and 2.5 million Kelvin, or a few hundred times hotter than the surface of the Sun. The corresponding energy range is 86 eV to 215 eV which is in the realm of the energy released for the transition of H to H(¼). Additional astrophysical evidence is the observation that a large component of the baryonic matter of the universe is in the form of WHIM (warm-hot ionized media) in the absence of a conventional ionizing energy source and the match of hydrinos to the identity of dark matter. The latter case is further supported by observations of signature electron-positron annihilation energy.

Dark matter comprises a majority of the mass of the universe as well as intra-galactic mass [F. Bournaud, P. A. Duc, E. Brinks, M. Boquien, P. Amram, U. Lisenfeld, B. Koribalski, F. Walter, V. Charmandaris, "Missing mass in collisional debris from galaxies", Science, Vol. 316, (2007), pp. 1166-1169; B. G. Elmegreen, "Dark matter in galactic collisional debris", Science, Vol. 316, (2007), pp. 32-33]. It would be anticipated to concentrate at the center of the Milky Way galaxy due to the high gravity from the presence of a super massive blackhole at the center that emits gamma rays as matter falls into it. Since hydrinos are each a state of hydrogen having a proton nucleus, high-energy gamma rays impinging on dark matter will result in pair production. The corresponding observed characteristic signature being the emission of the 511 keV annihilation energy of pair production identifies dark matter as hydrino [P. Jean, et al., "Early SPI/INTEGRAL measurements of 511 keV line emission from the $4^{th}$ quadrant of the Galaxy", Astron, Astrophys., Vol. 407, (2003), pp. L55-L58; M. Chown, "Astronomers claim dark matter breakthrough," NewScientist.com, Oct. 3, 2003, http://www.newscientist.com/article/dn4214-astronomers-claim-dark-matter-breakthrough.html; C. Boehm, D. Hooper, J. Silk, M. Casse, J. Paul, "MeV dark matter: Has it been detected," Phys. Rev. Lett., Vol. 92, (2004), p. 101301]. Interstellar medium, gamma-ray bursts, and solar flares also emit 511 keV line radiation. The dominant source of positrons in gamma-ray bursts is likely pair production by photon on photons or on strong magnetic fields. The solar-flare emission is likely due to production of radioactive positron emitters in accelerated charge interactions; whereas, the diffuse 511 keV radiation by interstellar medium is consistent with the role of hydrino as dark matter in pair production from incident cosmic radiation.

The characteristic spectral signatures and properties of hydrino match those attributed to the dark matter of the universe. The Universe is predominantly comprised of hydrogen and a small amount of helium. These elements exist in interstellar regions of space, and they are expected to comprise the majority of interstellar matter. However, the observed constant angular velocity of many galaxies as the distance from the luminous galactic center increases can only be accounted for by the existence of nonluminous weakly interacting matter, dark matter. It was previously accepted that dark matter exists at the cold fringes of galaxies and in cold interstellar space. This has since been disproved by the observation of Bournaud et al. [F. Bournaud, P. A. Duc, E. Brinks, M. Boquien, P. Amram, U. Lisenfeld, B. Koribalski, F. Walter, V. Charmandaris, "Missing mass in collisional debris from galaxies", Science, Vol. 316, (2007), pp. 1166-1169; B. G. Elmegreen, "Dark matter in galactic collisional debris", Science, Vol. 316, (2007), pp. 32-33] that demonstrated that galaxies are mostly comprised of dark matter, and the data persistently supports that dark matter probably accounts for the majority of the universal mass.

Figure 37:
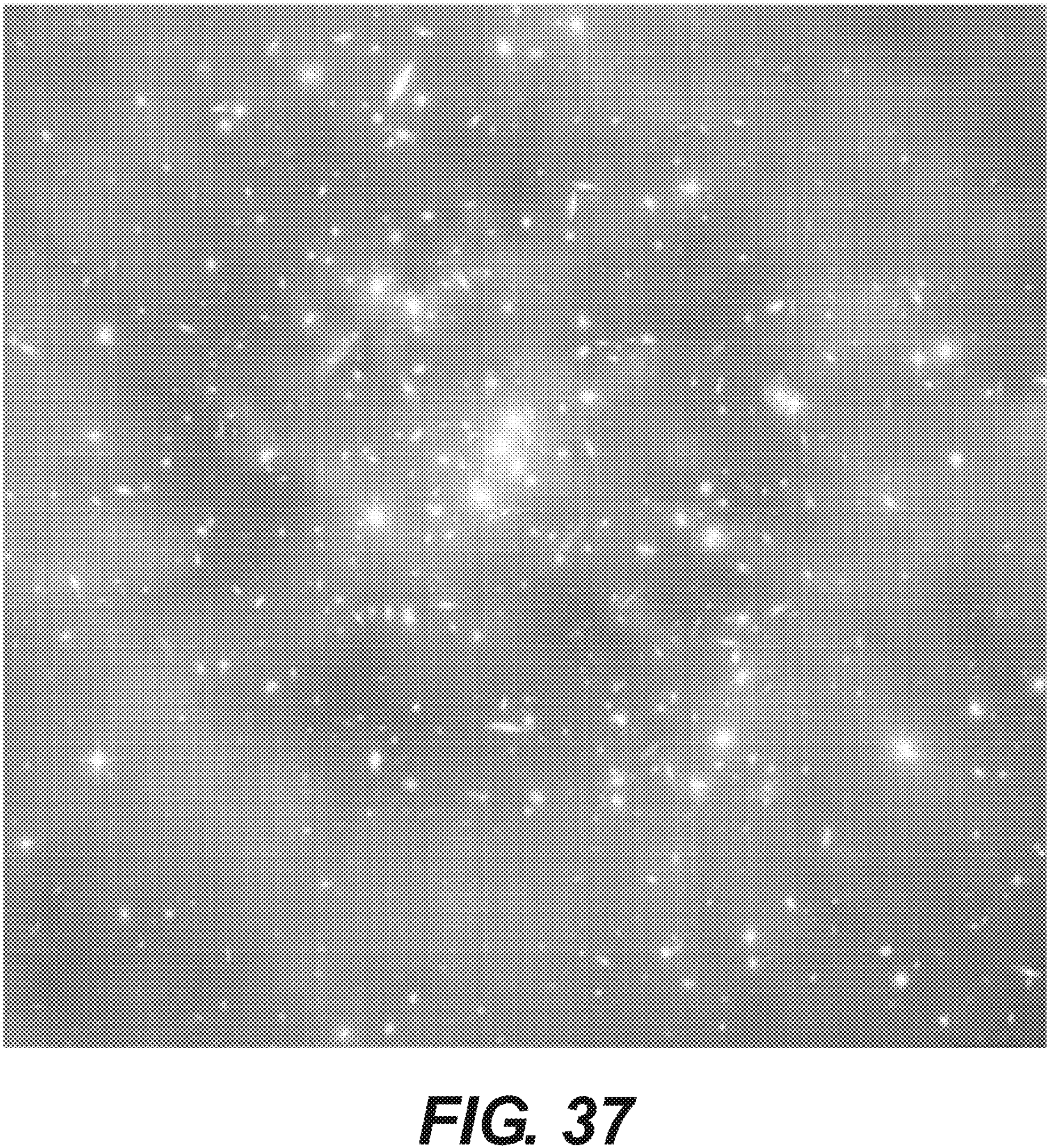
FIG. 37 shows the dark matter ring in galaxy cluster. This Hubble Space Telescope composite image shows a ghostly "ring" of dark matter in the galaxy cluster Cl 0024+17. The ring is one of the strongest pieces of evidence to date for the existence of dark matter, a prior unknown substance that pervades the universe. Courtesy of NASA/ESA, M. J. Jee and H. Ford (Johns Hopkins University), November 2004.

The best evidence yet for the existence of dark matter is its direct observation as a source of massive gravitational mass evidenced by gravitational lensing of background galaxies that does not emit or absorb light as shown in FIG. 37. There has been the announcement of some unexpected astrophysical results that support the existence of hydrinos. Bournaud et al. suggest that dark matter is hydrogen in dense molecular form that somehow behaves differently in terms of being unobservable except by its gravitational effects. Theoretical models predict that dwarfs formed from collisional debris of massive galaxies should be free of nonbaryonic dark matter. So, their gravity should tally with the stars and gas within them. By analyzing the observed gas kinematics of such recycled galaxies, Bournaud et al. have measured the gravitational masses of a series of dwarf galaxies lying in a ring around a massive galaxy that has recently experienced a collision. Contrary to the predictions of Cold-Dark-Matter (CDM) theories, their results demonstrate that they contain a massive dark component amounting to about twice the visible matter. This baryonic dark matter is argued to be cold molecular hydrogen, but it is distinguished from ordinary molecular hydrogen in that it is not traced at all by traditional methods. These results match the predictions of the dark matter being molecular hydrino.

Additionally, astronomers Jee at al. [M. J. Jee, A. Mandavi, H. Hoekstra, A. Babul, J. J. Dalcanton, P. Carroll, P. Capak, "A study of the dark core in A520 with the Hubble Space Telescope: The mystery deepens," Astrophys. J., Vol. 747, No. 96, (2012), pp. 96-103] using data from NASA's Hubble Telescope have mapped the distribution of dark matter, galaxies, and hot gas in the core of the merging galaxy cluster Abell 520 formed from a violent collision of massive galaxy clusters and have determined that the dark matter had collected in a dark core containing far fewer galaxies than would be expected if dark matter was collisionless with dark matter and galaxies anchored together. The collisional debris left behind by the galaxies departing the impact zone behaved as hydrogen did, another indication that the identity of dark matter is molecular hydrino.

Moreover, detection of alternative hypothesized identities for dark matter such as super-symmetry particles such as neutalinos has failed at the Large Hadron Collider; nor, has a single event been observed for weakly interacting massive particles or wimps at the Large Underground Xenon (LUX) experiment. The HADES search for dark matter eliminated the leading candidate, "Dark Photon" or U Boson, as a possibility.

d. Summary of the Results of the Embodiment

Continuum radiation in the 10 to 30 nm region that matched predicted transitions of H to hydrino state H(¼), was observed only arising from pulsed pinch hydrogen discharges with metal oxides that are thermodynamically favorable to undergo H reduction to form HOH catalyst; whereas, those that are unfavorable did not show any continuum even though the low-melting point metals tested are very favorable to forming metal ion plasmas with strong short-wavelength continua in significantly more powerful plasma sources. The plasmas showing no continuum demonstrate that the pinch source is too low energy to produce highly ionized metal continuum emission in agreement with the analysis by Bykanov. Any high-energy ion emission must be due to nonthermal secondary emission from the absorbed hydrino continuum. Of the two possible catalysts, m H and HOH, the latter is more likely on the behavior with oxide coated electrodes based on the intensity profile at short wavelengths and the dependency on a thermodynamically favorable reaction of metal oxide to HOH at the anode. A similar mechanism is functional in the CIHT cell. In addition to characteristic continuum radiation having a short-wavelength cutoff of $m^2 \cdot 13.6$ eV; m=3 for hydrino transition H to H(¼) catalyzed by HOH, the transition also produced predicted selective extraordinary high-kinetic energy H that was observed by the corresponding broadening of the Balmer α line.

The laboratory experiments have celestial implications. Hydrogen continua from transitions to form hydrinos matches the emission from white dwarfs, provides a possible mechanism of linking the temperature and density conditions of the different discrete layers of the coronal/chromospheric sources, and provides a source of the diffuse ubiquitous EUV cosmic background with the 10.1 nm continuum matching the observed intense 11.0-16.0 nm band in addition to resolving other cosmological mysteries. m H catalyst was shown to be active in astronomical sources. The discovery of high-energy continuum radiation from hydrogen as it forms a more stable state has astrophysical implications such as hydrino being a candidate for the identity of dark matter and the corresponding emission being the source of high-energy celestial and stellar continuum radiation. For example, the EUV spectra of white dwarfs matches the continua for H(½), H(⅓), and H(¼), and the 10.1 nm continuum of the transition of H to H(¼) is observed from interstellar medium. The hydrino continuum radiation matches the diffuse ubiquitous EUV and soft X-ray cosmic background, the radiation source behind the observation that diffuse Hα emission is ubiquitous throughout the Galaxy and widespread sources of flux shortward of 912 Å are required, and the source of ionization of the interstellar medium (ISM) wherein a large component of the baryonic matter of the universe is in the form of WHIM (warm-hot ionized media) in the absence of a conventional ionizing energy source. Moreover, recent X-ray absorption data reveals that the temperature of galactic halo gas is in the range of 86 eV to 215 eV which is in the realm of the energy released for the transition of H to H(¼). Indirect emission from ions of nonthermal origin is a feature of the continuum radiation emitted from hydrino transitions in celestial sources as well as hydrogen pinch plasmas at oxidized electrodes and solid fuel plasmas in our laboratory.

Rather than the mechanism of electric field acceleration of ions to cause dense emission of highly ionized ions as the source of the 10-30 nm continuum radiation of hydrogen plasmas, the ion line emission on top of the continuum was determined to be due to secondary emission of absorbed continuum radiation as in the case of astronomical sources. The emission in both cases was determined to be of nonthermal nature. Moreover, the 10-30 nm EUV continuum was observed in our laboratory from plasma having essentially no field. The HOH catalyst formed in the SF-CIHT cell was further shown to give 10.1 nm short-wavelength cutoff EUV continuum radiation of the same nature as in the pinch plasmas by igniting a solid fuel source of H and HOH catalyst by passing an ultra-low voltage, high current through the fuel to produce explosive plasma.

Figure 21B:
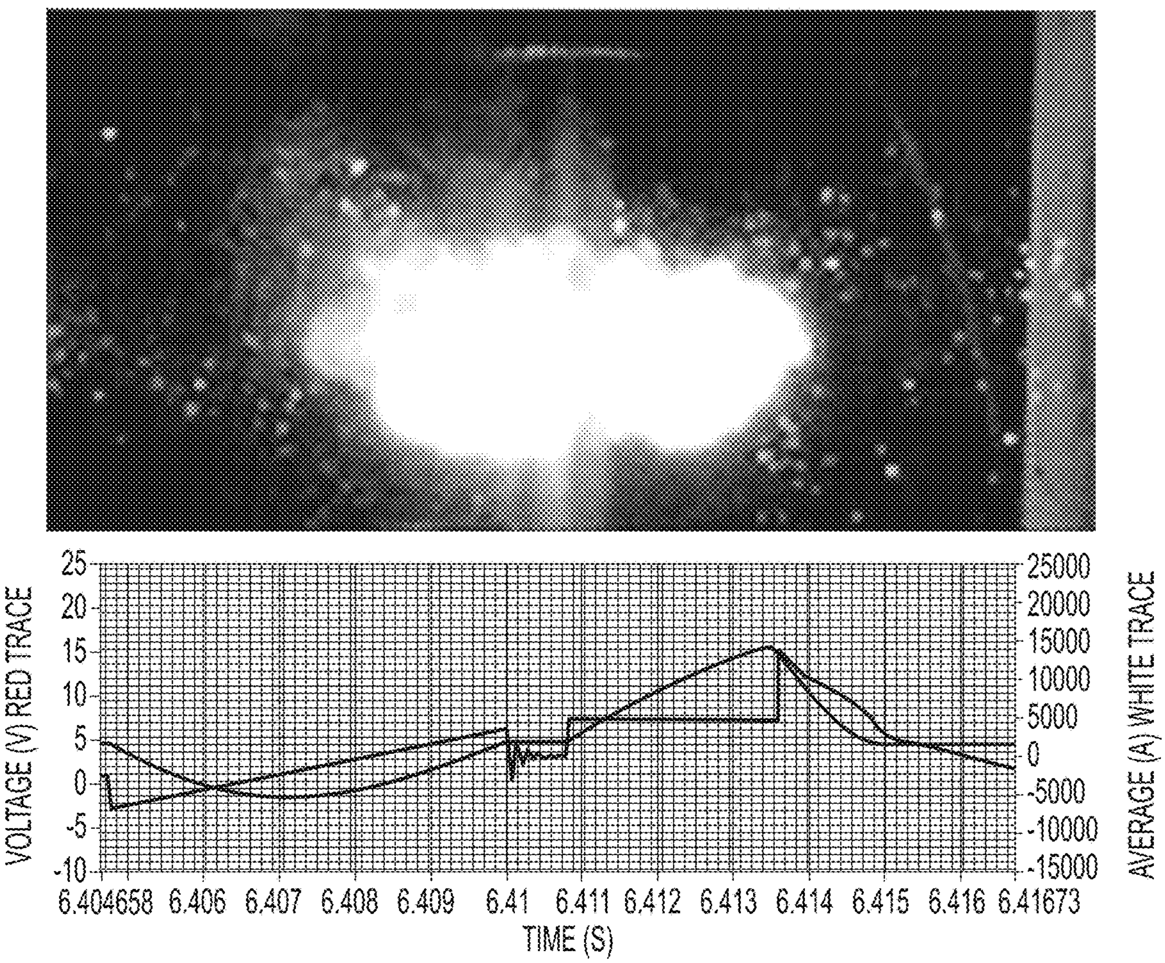

No chemical reaction can release such high-energy light, and the electric field corresponded to a voltage of less than 15 V for atmospheric-pressure collisional plasma. Any reactive voltage spike occurred within 1 us which was too short a time frame for the plasma to be optically thin wherein the plasma at this point was essentially at solid density. The electric field was confined between the electrodes, and the plasma expanded at sound speed or greater. The plasma had to expand into vacuum away from the electrodes to be sufficiently optical thin to observe soft X-ray emission. Thus, essentially all of the emission occurred outside of the electrode region. The electron temperature was consequently low, about 1 eV, a factor of 100 times less than required to support the observed >100 eV continuum radiation. It is difficult to achieve this high an electron temperature at low densities, and it is extremely improbable to be formed at solid to atmospheric high densities of the solid fuel plasmas by a conventional means. No high field existed to form highly ionized ions that could give radiation in this region. Moreover, as shown in FIG. 21B, following ignition, high-power plasma was observed with no power input. In cases, the amount of soft X-ray energy exceeded the total input energy to the plasma. The blackbody temperature of 3500 to 5500 K requires an ionization mechanism, a high energy source, other than the electrical input. Controls showed no soft X-ray emission. This plasma source serves as strong evidence for the existence of the transition of H to hydrino H(¼) by HOH as the catalyst as a new energy source. The $H_2O$-based solid fuels behave as energetic materials of extraordinarily high power density with most of the energy released as high energy light versus pressure-volume work. This aspect can be appreciated by comparison of high-speed video recordings of hydrino-based (FIGS. 21A-B) and conventional explosives that show billowing smoke and fire.

Based on a spectroscopically measured Stark line broadening, the $H_2O$-based fuel ignition produces brilliant light-emitting plasma, an essentially fully ionized gaseous physical state of the fuel comprising essentially positive ions and free electrons. The 5800 K blackbody temperature of the Sun and that of the ignition plasma are about the same because the heating mechanism is the same in both cases, the catalysis of H to hydrino. The temperature of high explosives is also as high as 5500 K. This is expected if the source of the high temperature is the formation of hydrinos as supported by the observed massive soft X-ray emission and excessive EUV energy balance (Sec. c.6), excessive calorimetrically measured energy balance having an ignition energy of about 5 J and a typical excess energy of about 200 to 300 J per 40 mg solid fuel, and spectroscopic signatures of hydrinos. Since solar cells have been optimized to convert blackbody radiation of 5800 K into electricity, photovoltaic conversion using solar cells is a suitable means of power conversion of the SF-CIHT generator as confirmed by these tests. Simply replacing the consumed $H_2O$ regenerated the fuel, and the fuel can be continuously fed into the electrodes to continuously output power.

SPECIFIC EMBODIMENTS

Non-limiting specific embodiments are described below each of which is considered to be within the present disclosure.

Specific Embodiment 1. A power system that generates at least one of electrical energy and thermal energy comprising:

at least one vessel;

shot comprising reactants, the reactants comprising:

a) at least one source of catalyst or a catalyst comprising nascent $H_2O$;

b) at least one source of $H_2O$ or H2O;

c) at east one source of atomic hydrogen or atomic hydrogen; and d) at least one of a conductor and a conductive matrix; at least one shot injection system;

at least one shot ignition system to cause the shot to form at least one of light-emitting plasma and thermal-emitting plasma;

a system to recover reaction products of the reactants;

at least one regeneration system to regenerate additional reactants from the reaction products and form additional shot, wherein the additional reactants comprise:

e) at least one source of catalyst or a catalyst comprising nascent $H_2O$;

f) at least one source of $H_2O$ or $H_2O$;

g) at least one source of atomic hydrogen or atomic hydrogen; and h) at least one of a conductor and a conductive matrix; and at least one power converter or output system of at least one of the light and thermal output to electrical power and/or thermal power.

Specific Embodiment 2. The power system of Specific Embodiment 1 wherein the vessel is capable of a pressure of below atmospheric.

Specific Embodiment 3. The power system of Specific Embodiment 1 wherein the shot ignition system comprises:

a) at least one set of electrodes to confine the shot; and b) a source of electrical power to deliver a short burst of high-current electrical energy.

Specific Embodiment 4. The power system of Specific Embodiment 3 wherein the short burst of high-current electrical energy is sufficient to cause the shot reactants to react to form plasma.

Specific Embodiment 5. The power system of Specific Embodiment 3 wherein the source of electrical power receives electrical power from the power converter.

Specific Embodiment 6. The power system of Specific Embodiment 3 wherein the shot ignition system comprises at least one set of electrodes that are separated to form an open circuit, wherein the open circuit is closed by the injection of the shot to cause the high current to flow to achieve ignition.

Specific Embodiment 7. The power system of Specific Embodiment 3 wherein the source of electrical power to deliver a short burst of high-current electrical energy comprises at least one of the following:

a voltage selected to cause a high AC, DC, or an AC-DC mixture of current that is in the range of at least one of 100 A to 1,000,000 A, 1 kA to 100,000 A, 10 kA to 50 kA;

a DC or peak AC current density in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$;

wherein the voltage is determined by the conductivity of the solid fuel or energetic material wherein the voltage is given by the desired current times the resistance of the solid fuel or energetic material sample;

the DC or peak AC voltage is in the range of at least one of 0.1 V to 500 kV, 0.1 V to 100 kV, and 1 V to 50 kV, and the AC frequency is in range of at least one of 0.1 Hz to 10 GHz, 1 Hz to 1 MHz, 10 Hz to 100 kHz, and 100 Hz to 10 kHz.

Specific Embodiment 8. The power system of Specific Embodiment 1 wherein the ignition system comprises a source of electrical power, bus bars, slip rings, shafts, shaft bearings, electrodes, bearing structural supports, a base support, roller drive pulleys, motor drive pulleys, belts, belt tensioners, motor shafts, roller pulley bearings, motor bearings, and at least one motor.

Specific Embodiment 9. The power system of Specific Embodiment 8 wherein the electrodes comprise a pair of rollers that are mounted on the shafts suspended by bearings attached to structural supports being mounted on a base support, wherein the shafts and attached electrodes are turned by roller drive pulleys that are driven by belts each having a belt tensioner, motor shafts and motor pulleys suspended on bearings, and motors.

Specific Embodiment 10. The power system of Specific Embodiment 9 wherein the motor is a computer controlled servomotors.

Specific Embodiment 11. The power system of Specific Embodiment 1 wherein the shot comprises at least one of silver, copper, and a hydrate.

Specific Embodiment 12. The power system of Specific Embodiment 11 wherein the hydrate comprises at least one of an alkali hydrate, an alkaline earth hydrate, and a transition metal hydrate.

Specific Embodiment 13. The power system of Specific Embodiment 12 wherein the hydrate comprises at least one of $MgCl_2.6H_2O$, $BaI_2.2H_2O$, and $ZnCl_2.4H_2O$.

Specific Embodiment 14. The power system of Specific Embodiment 1 wherein the shot comprises at least one of silver, copper, absorbed hydrogen, and water.

Specific Embodiment 15. The power system of Specific Embodiment 1 wherein the injection system comprises at least one of an augmented railgun and a pneumatic injector, wherein the pneumatic injector comprises a source of high pressure flowing gas to propel the shot.

Specific Embodiment 16. The power system of Specific Embodiment 15 wherein the augmented railgun comprises separated electrified rails and magnets that produce a magnetic field perpendicular to the plane of the rails, and the circuit between the rails is open until closed by the contact of the shot with the rails.

Specific Embodiment 17. The power system of Specific Embodiment 16 wherein the contact of the shot with the rails causes a current to flow through the shot, and the resulting current interacts with the magnetic field to produce a Lorentz force that causes the shot to be propelled along the rails.

Specific Embodiment 18. The power system of Specific Embodiment 16 wherein the injection system further comprises at least one transporter to feed shot into the at least one of the augmented railgun and the pneumatic injector.

Specific Embodiment 19. The power system of Specific Embodiment 18 wherein transporter comprises at least one auger.

Specific Embodiment 20. The power system of Specific Embodiment 17 wherein the applied magnetic field of the augmented railgun injector comprises a component parallel to the direction of pellet motion and transverse to the current through the shot.

Specific Embodiment 21. The power system of Specific Embodiment 20 wherein the current interacts with the magnetic field to produce a Lorentz force that causes the shot to be forced down on the rails to make and maintain good electrical contact between the shot and the rails.

Specific Embodiment 22. The power system of Specific Embodiments 16 and 20 wherein the magnetic field perpendicular to the plane of the rails and the motion-parallel magnetic field is provided by at least one of permanent magnets and electromagnets.

Specific Embodiment 23. The power system of Specific Embodiment 1 wherein the system to recover the products of the reactants comprises at least one of gravity and a system to produce a Lorentz force on the plasma and direct the recovered products to a collection region.

Specific Embodiment 24. The power system of Specific Embodiment 23 wherein the system to produce a Lorentz force on the plasma and direct the recovered products to a collection region comprises an augmented plasma railgun recovery system.

Specific Embodiment 25. The power system of Specific Embodiment 24 wherein the augmented plasma railgun recovery system comprises at least one magnet providing a magnetic field and a vector-crossed current component.

Specific Embodiment 26. The power system of Specific Embodiment 25 wherein the at least one magnet comprises at least one of Helmholtz coils and permanent magnets.

Specific Embodiment 27. The power system of Specific Embodiment 26 wherein the augmented plasma railgun recovery system further comprises at least one additional set of electrodes peripheral to the ignition electrodes wherein the current source comprises at least one of the current flow between the ignition electrodes and current between the at least one additional set of electrodes.

Specific Embodiment 28. The power system of Specific Embodiment 1 wherein the system to recover the products of the reactants comprises at least one of a light transparent baffle and a light transparent window, wherein the light transparent window may comprise a coating on the power converter.

Specific Embodiment 29. The power system of Specific Embodiment 28 wherein the light transparent baffle and the window are transparent to ultraviolet light.

Specific Embodiment 30. The power system of Specific Embodiment 29 wherein the light transparent baffle and the window comprise at least one of the group chosen from sapphire, LiF, $MgF_2$, and $CaF_2$, other alkaline earth halides, alkaline earth fluorides, $BaF_2$, $CdF_2$, quartz, fused quartz, UV glass, borosilicate, and Infrasil (ThorLabs).

Specific Embodiment 31. The power system of Specific Embodiment 28 wherein at least one of the light transparent baffle and the window comprises a lens to focus the light emitted by the ignition of the shot onto the power converter.

Specific Embodiment 32. The power system of Specific Embodiment 28 further comprising a removal system to remove ignition product from the surface of the light transparent baffle and a light transparent window, wherein the light transparent window may comprise a coating on the power converter comprising an ion-sputtering beam or a knife or razor blade mechanical scraper.

Specific Embodiment 33. The power system of Specific Embodiment 1 wherein the system comprises a regeneration system to regenerate the initial reactants from the reaction products and form shot.

Specific Embodiment 34. The power system of Specific Embodiment 1 wherein the regeneration system comprises a pelletizer comprising a smelter to form molten reactants, a system to add $H_2$ and $H_2O$ to the molten reactants, a melt dripper, and a coolant to form shot.

Specific Embodiment 35. The power system of Specific Embodiment 34 wherein the coolant to form shot comprises a water reservoir and/or bath.

Specific Embodiment 36. The power system of Specific Embodiment 1 further comprising a system that maintains a vacuum.

Specific Embodiment 37. The power system of Specific Embodiments 35 and 36 wherein the system that maintains a vacuum comprises at least one of a vacuum pump and a chiller of the water reservoir and/or bath.

Specific Embodiment 38. The power system of Specific Embodiment 34 wherein the smelter comprises an insulated vessel and a heater.

Specific Embodiment 39. The power system of Specific Embodiment 38 wherein the heater comprises at least one of an inductively coupled heater, a heat exchanger to transfer thermal power sourced from the reaction of the reactants, and at least one optical element to transfer optical power sourced from the reaction of the reactants.

Specific Embodiment 40. The power system of Specific Embodiment 39 wherein the pelletizer comprises a first insulated vessel heated by the inductively coupled heater, a second insulated vessel to receive the melt for the first insulated vessel, a dripper, and a water reservoir to form shot.

Specific Embodiment 41. The power system of Specific Embodiment 40 wherein the second vessel comprises melted ignition products, hydrogen and steam lines that enter the inside of the second vessel, hydrogen and steam bubblers of the melt connected to the hydrogen and steam lines, at least one gas exit line that connects to a pump to recirculate the hydrogen and steam.

Specific Embodiment 42. The power system of Specific Embodiment 41 wherein the hydrogen and steam lines that enter the inside of the second vessel carry the hydrogen and steam that bubbles through the melt to be incorporated into the melt with excess gas existing through the at least one exit line to be recirculated through the second vessel by at least one pump, and the gas-treated melt flows to the dripper to drip into the water reservoir to form shot.

Specific Embodiment 43. The power system of Specific Embodiment 42 wherein the pelletizer comprises a heat recuperator.

Specific Embodiment 44. The power system of Specific Embodiment 43 wherein the heat recuperator recovers or reSpecific Embodiments at least some heat from the cooling shot and transfers it to incoming ignition product to preheat it as it enters the smelter or first vessel.

Specific Embodiment 45. The power system of Specific Embodiment 41 wherein the hydrogen is supplied from a tank refilled by the electrolysis of water, and the water is supplied from a water tank, wherein the water in both cases is periodically refilled as water is consumed.

Specific Embodiment 46. The power system of Specific Embodiment 35 wherein the water reservoir comprises an agitator to feed shot into the injection system.

Specific Embodiment 47. The power system of Specific Embodiment 15 wherein the injection system further comprises at least one agitator to feed shot into the augmented railgun injector.

Specific Embodiment 48. The power system of Specific Embodiments 46 and 47 wherein the agitator comprises at least one of an auger and a water jet.

Specific Embodiment 49. The power system of Specific Embodiment 48 wherein the water reservoir comprises a transporter to feed shot into the injection system.

Specific Embodiment 50. The power system of Specific Embodiment 49 wherein the transporter comprises a first auger that transports the shot from the water bath to a shot hopper, wherein a second auger, a shot auger, feeds shot into the injection system.

Specific Embodiment 51. The power system of Specific Embodiment 50 wherein the injection system comprises at least one of an augmented railgun and a pneumatic injector.

Specific Embodiment 52. The power system of Specific Embodiment 42 comprising a roller electrode regeneration system comprising: (1) at least one of recovered ignition products and at least one of a hydrogen and $H_2O$ deficient shot, (2) the injection system, (3) the ignition system, and (4) a milling system to regenerate the electrodes to their original form.

Specific Embodiment 53. The power system of Specific Embodiment 52 wherein the hydrogen and $H_2O$ deficient shot comprises shot formed from the ignition product melt by the pelletizer without treatment of the melt with hydrogen or steam;

wherein at least one of the $H_2O$ deficient shot and recovered ignition products is injected into the roller electrodes by the injection system;

wherein the flow of high current of the ignition system causes the hydrogen deficient shot or powder to weld or bond to the roller electrode surfaces, and the milling system removes excess bonded material to regenerate the electrodes to their original form.

Specific Embodiment 54. The power system of Specific Embodiment 53 wherein the milling system comprises at least one of a dressing wheel, a grinder, a lathe, a mill, and an electrical discharge machining tool.

Specific Embodiment 55. The power system of Specific Embodiment 1 wherein the at least one power converter of the reaction power output comprises at least one of the group of a photovoltaic converter, a photoelectronic converter, a plasmadynamic converter, a thermionic converter, a thermoelectric converter, a Sterling engine, a Brayton cycle engine, a Rankine cycle engine, and a heat engine, and a heater.

Specific Embodiment 56. The power system of Specific Embodiment 1 wherein the vessel comprises walls reflective of at least one of the ultraviolet, visible, and near infrared light emitted by the plasma.

Specific Embodiment 57. The power system of Specific Embodiment 55 wherein the photovoltaic converter comprises a light transparent window.

Specific Embodiment 58. The power system of Specific Embodiment 55 wherein photovoltaic cells are coated with a light transparent window.

Specific Embodiment 59. The power system of Specific Embodiment 1 wherein the light emitted by the cell is predominantly ultraviolet light.

Specific Embodiment 60. The power system of Specific Embodiments 57 and 58 wherein the window comprises a phosphor to shift the spectrum of the cell-emitted light to one to which the photovoltaic cells of the photovoltaic converter are selectively responsive.

Specific Embodiment 61. The power system of Specific Embodiment 60 wherein the photovoltaic cells comprises visible and infrared concentrator photovoltaic cells.

Specific Embodiment 62. The power system of Specific Embodiment 59 wherein the power converter comprises a photovoltaic converter, and the photovoltaic cells comprises ultraviolet concentrator photovoltaic cells.

Specific Embodiment 63. The power system of Specific Embodiment 62 wherein the photovoltaic cells comprise at least one compound chosen from a Group III nitride, GaAlN, GaN, and InGaN.

Specific Embodiment 64. The power system of Specific Embodiment 63 wherein the photovoltaic cells are multi junction cells comprising a plurality of junctions, that may be layered in series, or the junctions are independent or electrically parallel, wherein the independent junctions may be mechanically stacked or wafer bonded; a substrate, grid connections, and a cooling system.

Specific Embodiment 65. The power system of Specific Embodiment 64 wherein the multi-junction photovoltaic cells comprise at least one of two junctions, three junctions, and greater than three junctions, each comprising n-p doped semiconductors from the group of InGaN, GaN, and AlGaN, wherein the n dopant of GaN may comprise oxygen, and the p dopant may comprise Mg;

the multi junction photovoltaic cells may comprise InGaN//GaN//AlGaN wherein // refers to an isolating transparent wafer bond layer or mechanical stacking;

the substrate of the multifunction cell may comprise at least one of sapphire, Si, SiC, and GaN wherein the latter two may provide the best lattice matching for concentrator photovoltaic applications;

the layers may be deposited using metalorganic vapor phase epitaxy (MOVPE) methods;

the coolant system may comprise by cold plates, and heat exchanger, and a chiller, and the grid contacts may comprise fine wires be mounted on the front and back surfaces of the cells.

Specific Embodiment 66. The power system of Specific Embodiment 55 wherein the photovoltaic converter comprises a light distribution system comprising a stacked series of semi-transparent and semi-reflective mirrors which direct a portion of the incident light on each mirror of the stack to a corresponding photovoltaic cell while the balance of light is transmitted to the next mirror in the stack.

Specific Embodiment 67. The power system of Specific Embodiment 66 wherein each of the semi-transparent and semi-reflective mirrors comprises a window that is transparent to the incident light, and the window is partially mirrored to reflect a portion of the incident light.

Specific Embodiment 68. The power system of Specific Embodiment 67 wherein each of the semi-transparent and semi-reflective mirrors comprises dichroic mirrors or beam splitters.

Specific Embodiment 69. The power system of Specific Embodiment 68 wherein each of the semi-transparent and semi-reflective mirrors comprises a window that is transparent to the incident light, and the window is partially mirrored with a dichroic film to selectively reflect a portion of the incident light onto a photovoltaic cell that is selectively responsive to the reflected wavelengths.

Specific Embodiment 70. The power system of Specific Embodiment 69 wherein each of dichroic mirrors and corresponding photovoltaic cells are arranged to increase the power conversion efficiency while distributing the light over the photovoltaic converter surface area.

Specific Embodiment 71. The power system of Specific Embodiment 70 wherein the semi-transparent and semi-reflective mirrors comprise UV transparent and UV reflective materials.

Specific Embodiment 72. The power system of Specific Embodiments 57, 58, and 71 wherein at least one of the UV transparent window, the UV transparent window coating of the photovoltaic cells, and the UV transparent mirror material comprises at least one compound of the group of sapphire, LiF, $MgF_2$, and $CaF_2$, other alkaline earth halides, alkaline earth fluorides, $BaF_2$, $CdF_2$, quartz, fused quartz, UV glass, borosilicate, and Infrasil (ThorLabs), Specific Embodiment 73. The power system of Specific Embodiments 56 and 71 wherein at least one of the UV reflective wall coating and the UV reflective mirror materials comprises one of group of Ag, Al, a thin coat of Ag on Al, a material capable of high reflectivity at UV wavelengths, thin fluoride films, $MgF_2$-coated Al, $MgF_2$ films on Al, LiF films on Al, and SiC films on Al.

Specific Embodiment 74. The power system of Specific Embodiment 55 wherein the photovoltaic converter further comprises a heat exchanger and a chiller.

Specific Embodiment 75. The power system of Specific Embodiment 55 wherein the photoelectric converter comprises a plurality of photoelectric cells, where each photoelectric cell comprises a photocathode having a work function greater than 1.8 eV, an anode, a vacuum space between the electrodes, and a window.

Specific Embodiment 76. The power system of Specific Embodiment 75 wherein the photoelectric cell comprises at least one of the group of the transmission or semitransparent type, or the opaque or reflective type photoelectronic cell.

Specific Embodiment 77. The power system of Specific Embodiment 76 wherein the transmission or semitransparent type photoelectric cell comprises a photocathode, an anode, and a separating gap between the electrodes.

Specific Embodiment 78. The power system of Specific Embodiment 76 wherein the opaque or reflective photoelectronic cell comprises one of the group a cells having a photocathode material formed on an opaque metal electrode base, where the light enters and the electrons exit from the same side, and a double reflection type wherein a metal base is mirror-like, causing light that passed through the photocathode without causing emission to be bounced back for a second pass at absorption and photoemission.

Specific Embodiment 79. The power system of Specific Embodiment 78 wherein the opaque or reflective photoelectronic cell comprises a transparent casing, a photocathode, a transparent anode, a separating space or an evacuated inter-electrode space, and external electrical connections between the cathode and anode through a load wherein radiation enters the cell and is directly incident on the photocathode; radiation enters the cathode at the gap interface, and electrons are emitted from the same interface.

Specific Embodiment 80. The power system of Specific Embodiments 77 and 79 wherein the gap between the electrodes is in the range of at least one of 0.1 um to 1000 um, 1 um to 100 um, 1 um to 10 um, and 1 to 5 um.

Specific Embodiment 81. The power system of Specific Embodiment 79 wherein the opaque or reflective photoelectronic cell comprises a transparent window wherein the light enters the cell through the transparent window having a grid anode on the interior side of the window.

Specific Embodiment 82. The power system of Specific Embodiments 77 and 79 wherein the window comprises at least one of sapphire, LiF, $MgF_2$, and $CaF_2$, other alkaline earth halides, other alkaline earth fluorides, $BaF_2$, $CdF_2$, quartz, fused quartz, UV glass, borosilicate, and Infrasil (ThorLabs).

Specific Embodiment 83. The power system of Specific Embodiment 75 wherein the photocathode work function may be at least one of the group of greater than 1.8 eV for radiation of shorter wavelength than 690 nm, greater than 3.5 eV for radiation of shorter wavelength than 350 nm, and within the range of at least one of 0.1 V to 100 V, 0.5 V to 10 V, 1 V to 6 V, and 1.85 eV to 6 V.

Specific Embodiment 84. The power system of Specific Embodiment 83 wherein the photocathode of the photoelectric cell comprises one of the group of GaN, GaN alloys, $Al_xGa_{1-x}N$, $In_xGa_{1-x}N$, alkali halides, KI, KBr, CsI, multi-alkali, S20 Hamamatsu comprising Na—K—Sb—Cs, GaAs, CsTe, diamond, Sb—Cs, Au, Ag—O—Cs, bi-alkali, Sb—Rb—Cs, Sb—K—Cs, Na—K—Sb, InGaAs, an opaque photocathode comprising at least one of GaN, CsI, and SbCs, a semitransparent photocathode comprising CsTe, type III-V material UV photocathode having suitable large bandgaps in the range of 3.5 eV for GaN and 6.2 eV for AlN, a photocathode having an energy or wavelength responsive region fine tuned by changing the material composition of the photocathode, a photocathode having an energy or wavelength responsive region fine tuned by changing the ratio of GaN to AlN in $Al_xGa_{1-x}N$, thin films of p-doped material activated into negative electron affinity by proper surface treatments, thin films of p-doped material activated into negative electron affinity by proper surface treatments with cesium or Mg and oxygen, photocathodes comprising MgO thin-film on Ag, $MgF_2$, MgO, $CuI_2$, metal photocathodes, metal photocathodes comprising at least one of Cu, Mg, Pb, Y, and Nb, coated metal photocathodes, coated metal photocathodes comprising at least one of Cu—CsBr, Cu—$MgF_2$, Cu—Cs, and Cu—CsI, metal alloy photocathodes, coated metal alloy photocathodes, metal alloy photocathodes comprising CsAu, photocathodes comprising alloys of pure metals Al, Mg, and Cu, photocathodes comprising alloys of pure metals of Al, Mg, and Cu with small amounts of Li, Ba, and BaO, respectively, semiconductor photocathodes, semiconductor photocathodes comprising CsTe, RbTe, alkali antimonides, $Cs_3Sb$, $K_2CsSb$, $Na_2KSb$, $NaK_2Sb$, $CsK_2Sb$, $Cs_2Te$, superalkalies, positive election affinity (PEA) type photocathodes; Cs:GaAs, Cs:GaN, Cs:InGaN, Cs:GaAsP, graded doping photocathodes, tertiary structure photocathode, and a photocathode comprising a negative electron affinity (NEA) type.

Specific Embodiment 85. The power system of Specific Embodiment 84 wherein semiconductor photocathodes may be maintained in high vacuum in the range of at least one of less than $10^{-9}$ Pa, $10^{-7}$ Pa, $10^{-5}$ Pa, $10^{-3}$ Pa, and $10^{-1}$ Pa.

Specific Embodiment 86. A power system that generates at least one of electrical energy and thermal energy comprising:

at least one vessel;

slurry comprising reactants, the reactants comprising:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix;

at least one slurry injection system comprising rotating roller electrodes comprising a rotary slurry pump;

at least one slurry ignition system to cause the shot to form light-emitting plasma; a system to recover reaction products of the reactants;

at least one regeneration system to regenerate additional reactants from the reaction products and form additional slurry, wherein the additional reactants comprise:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix; and at least one power converter or output system of at least one of the light and thermal output to electrical power and/or thermal power.

Specific Embodiment 87. The power system of Specific Embodiment 86 wherein the ignition system to cause the shot to form light-emitting plasma comprises a source of electrical power to deliver a short burst of high-current electrical energy.

Specific Embodiment 88. The power system of Specific Embodiment 87 wherein the source of electrical power to deliver a short burst of high-current electrical energy comprises at least one of the following:

a voltage selected to cause a high AC, DC, or an AC-DC mixture of current that is in the range of at least one of 100 A to 1,000,000 A, 1 kA to 100,000 A, 10 kA to 50 kA;

a DC or peak AC current density that is in the range of at least one of 100 $A/cm^2$ to 1,000,000 $A/cm^2$, 1000 $A/cm^2$ to 100,000 $A/cm^2$, and 2000 $A/cm^2$ to 50,000 $A/cm^2$;

the voltage is determined by the conductivity of the solid fuel or energetic material wherein the voltage is given by the desired current times the resistance of the solid fuel or energetic material sample;

the DC or peak AC voltage that is in the range of at least one of 0.1 V to 500 kV, 0.1 V to 100 kV, and 1 V to 50 kV, and the AC frequency that is in the range of at least one of 0.1 Hz to 10 GHz, 1 Hz to 1 MHz, 10 Hz to 100 kHz, and 100 Hz to 10 kHz.

Specific Embodiment 89. The power system of Specific Embodiment 86 wherein the ignition system comprises a source of electrical power, bus bars, slip rings, shafts, shaft bearings, electrodes, bearing structural supports, a base support, roller drive pulleys, motor drive pulleys, belts, belt tensioners, motor shafts, roller pulley bearings, motor bearings, and at least one motor.

Specific Embodiment 90. The power system of Specific Embodiment 89 wherein the electrodes comprise a pair of rollers that are mounted on the shafts suspended by bearings attached to structural supports being mounted on a base support, wherein the shafts and attached electrodes are turned by roller drive pulleys that are driven by belts each having a belt tensioner, motor shafts and motor pulleys suspended on bearings, and motors.

Specific Embodiment 91. The power system of Specific Embodiment 86 wherein the slurry comprises at least one of a metal and a hydrate.

Specific Embodiment 92. The power system of Specific Embodiment 91 wherein the hydrate comprises at least one of an alkali hydrate, an alkaline earth hydrate, and a transition metal hydrate.

Specific Embodiment 93. The power system of Specific Embodiment 92 wherein the hydrate comprises at least one of $MgCl_2.6H_2O$, $BaI_2.2H_2O$, and $ZnCl_2.4H_2O$, and the metal comprises at least one of a transition metal, Ti, Cu, and Ag.

Specific Embodiment 94. The power system of Specific Embodiment 86 wherein the at least one power converter of the reaction power output comprises at least one or more of the group of a photovoltaic converter, a photoelectronic converter, a plasmadynamic converter, a thermionic converter, a thermoelectric converter, a Sterling engine, a Brayton cycle engine, a Rankine cycle engine, and a heat engine.

Specific Embodiment 95. The power system of Specific Embodiment 86 wherein the system to recover the products of the reactants comprises water jets and a slurry trough.

Specific Embodiment 96. The power system of Specific Embodiment 86 wherein the system to regenerate the initial reactants from the reaction products and form slurry comprises at least one sieve, mesh, or filter and at least one water suction pump in the walls of the slurry trough, and a rotary pump delivery auger.

Specific Embodiment 97. A power system that generates at least one of electrical energy and thermal energy comprising:

at least one vessel capable of a pressure of below atmospheric; shot comprising reactants, the reactants comprising:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix;

at least one shot injection system comprising at least one augmented railgun, wherein the augmented railgun comprises separated electrified rails and magnets that produce a magnetic field perpendicular to the plane of the rails, and the circuit between the rails is open until closed by the contact of the shot with the rails;

at least one ignition system to cause the shot to form at least one of light-emitting plasma and thermal-emitting plasma, at least one ignition system comprising:

a) at least one set of electrodes to confine the shot; and b) a source of electrical power to deliver a short burst of high-current electrical energy;

wherein the at least one set of electrodes form an open circuit, wherein the open circuit is closed by the injection of the shot to cause the high current to flow to achieve ignition, and the source of electrical power to deliver a short burst of high-current electrical energy comprises at least one of the following:

a voltage selected to cause a high AC, DC, or an AC-DC mixture of current that is in the range of at least one of 100 A to 1,000,000 A, 1 kA to 100,000 A, 10 kA to 50 kA;

a DC or peak AC current density in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$;

the voltage is determined by the conductivity of the solid fuel or energetic material wherein the voltage is given by the desired current times the resistance of the solid fuel or energetic material sample;

the DC or peak AC voltage is in the range of at least one of 0.1 V to 500 kV, 0.1 V to 100 kV, and 1 V to 50 kV, and the AC frequency is in range of at least one of 0.1 Hz to 10 GHz, 1 Hz to 1 MHz, 10 Hz to 100 kHz, and 100 Hz to 10 kHz.

a system to recover reaction products of the reactants comprising at least one of gravity and an augmented plasma railgun recovery system comprising at least one magnet providing a magnetic field and a vector-crossed current component of the ignition electrodes;

at least one regeneration system to regenerate additional reactants from the reaction products and form additional shot comprising a pelletizer comprising a smelter to form molten reactants, a system to add $H_2$ and $H_2O$ to the molten reactants, a melt dripper, and a water reservoir to form shot, wherein the additional reactants comprise:

a) at least one source of catalyst or a catalyst comprising nascent $H_2O$;

b) at least one source of $H_2O$ or $H_2O$;

c) at least one source of atomic hydrogen or atomic hydrogen; and d) at least one of a conductor and a conductive matrix; and at least one power converter or output system of at least one of the light and thermal output to electrical power and/or thermal power comprising at least one or more of the group of a photovoltaic converter, a photoelectronic converter, a plasmadynamic converter, a thermionic converter, a thermoelectric converter, a Sterling engine, a Brayton cycle engine, a Rankine cycle engine, and a heat engine, and a heater.

Specific Embodiment 98. A power system that generates at least one of electrical energy and thermal energy comprising:

at least one vessel capable of a pressure of below atmospheric;

shot comprising reactants, the reactants comprising at least one of silver, copper, absorbed hydrogen, and water;

at least one shot injection system comprising at least one augmented railgun wherein the augmented railgun comprises separated electrified rails and magnets that produce a magnetic field perpendicular to the plane of the rails, and the circuit between the rails is open until closed by the contact of the shot with the rails;

at least one ignition system to cause the shot to form at least one of light-emitting plasma and thermal-emitting plasma, at least one ignition system comprising:

a) at least one set of electrodes to confine the shot; and b) a source of electrical power to deliver a short burst of high-current electrical energy;

wherein the at least one set of electrodes that are separated to form an open circuit, wherein the open circuit is closed by the injection of the shot to cause the high current to flow to achieve ignition, and he source of electrical power to deliver a short burst of high-current electrical energy comprises at least one of the following:

a voltage selected to cause a high AC, DC, or an AC-DC mixture of current that is in the range of at least one of 100 A to 1,000,000 A, 1 kA to 100,000 A, 10 kA to 50 kA;

a DC or peak AC current density in the range of at least one of 100 A/cm$^2$ to 1,000,000 A/cm$^2$, 1000 A/cm$^2$ to 100,000 A/cm$^2$, and 2000 A/cm$^2$ to 50,000 A/cm$^2$;

the voltage is determined by the conductivity of the solid fuel or energetic material wherein the voltage is given by the desired current times the resistance of the solid fuel or energetic material sample;

the DC or peak AC voltage is in the range of at least one of 0.1 V to 500 kV, 0.1 V to 100 kV, and 1 V to 50 kV, and the AC frequency is in range of at least one of 0.1 Hz to 10 GHz, 1 Hz to 1 MHz, 10 Hz to 100 kHz, and 100 Hz to 10 kHz.

a system to recover reaction products of the reactants comprising at least one of gravity and a augmented plasma railgun recovery system comprising at least one magnet providing a magnetic field and a vector-crossed current component of the ignition electrodes; at least one regeneration system to regenerate additional reactants from the reaction products and form additional shot comprising a pelletizer comprising a smelter to form molten reactants, a system to add $H_2$ and $H_2O$ to the molten reactants, a melt dripper, and a water reservoir to form shot, wherein the additional reactants comprise at least one of silver, copper, absorbed hydrogen, and water;

at least one power converter or output system comprising a concentrator ultraviolet photovoltaic converter wherein the photovoltaic cells comprise at least one compound chosen from a Group III nitride, GaAlN, GaN, and InGaN.

The invention claimed is:

1. A system comprising:

a) a set of electrodes separated to form an open circuit;

b) an injection system to inject a conductive material and $H_2O$ between said electrodes to form a closed circuit; wherein said conductive material comprises a metal and a metal oxide;

c) a source of electrical power connected to said set electrodes to form a current and voltage in said closed circuit; and wherein the current and voltage in said closed circuit and conductive material is capable of initiating a plasma forming reaction when $H_2O$ is present as nascent molecules;

d) a regeneration system to regenerate the conductive material from products of said plasma forming reaction; wherein said regenerated conductive material is provided to said injection system loading between said electrodes after said plasma forming reaction; and e) a power converter to convert light and/or thermal output from the plasma to electrical and/or thermal power.

2. The system according to claim 1, wherein the metal is Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, or In.

3. A system comprising:

a) a set of electrodes separated to form an open circuit;

b) an injection system to inject a conductive material and $H_2O$ between said electrodes to form a closed circuit; wherein said conductive material comprises a metal and a metal halide;

c) a source of electrical power connected to said set electrodes to form a current and voltage in said closed circuit; and wherein the current and voltage in said closed circuit and conductive material is capable of initiating a plasma forming reaction when $H_2O$ is present as nascent molecules;

d) a regeneration system to regenerate the conductive material from products of said plasma forming reaction; wherein said regenerated conductive material is provided to said injection system loading between said electrodes after said plasma forming reaction; and e) a power converter to convert light and/or thermal output from the plasma to electrical and/or thermal power.

4. The system according to claim 3, wherein the metal is Cu, Ni, Pb, Sb, Bi, Co, Cd, Ge, Au, Ir, Fe, Hg, Mo, Os, Pd, Re, Rh, Ru, Se, Ag, Tc, Te, Tl, Sn, W, Al, V, Zr, Ti, Mn, Zn, Cr, or In.

* * * * *